US012278702B2

(12) United States Patent
Wang et al.

(10) Patent No.: US 12,278,702 B2
(45) Date of Patent: *Apr. 15, 2025

(54) POLAR CODE ENCODING METHOD AND APPARATUS IN WIRELESS COMMUNICATIONS

(71) Applicant: HUAWEI TECHNOLOGIES CO., LTD., Guangdong (CN)

(72) Inventors: Jun Wang, Hangzhou (CN); Gongzheng Zhang, Hangzhou (CN); Huazi Zhang, Hangzhou (CN); Chen Xu, Hangzhou (CN); Lingchen Huang, Hangzhou (CN); Shengchen Dai, Hangzhou (CN); Hejia Luo, Hangzhou (CN); Yunfei Qiao, Hangzhou (CN); Rong Li, Boulogne Billancourt (FR); Jian Wang, Hangzhou (CN); Ying Chen, Hangzhou (CN); Nikita Andreevich Polianskii, Moscow (RU); Mikhail Sergeevich Kamenev, Moscow (RU); Zukang Shen, Beijing (CN); Yourui HuangFu, Hangzhou (CN); Yinggang Du, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/485,303

(22) Filed: Oct. 11, 2023

(65) Prior Publication Data

US 2024/0146455 A1 May 2, 2024

Related U.S. Application Data

(63) Continuation of application No. 17/491,529, filed on Oct. 1, 2021, now Pat. No. 11,811,528, which is a
(Continued)

(30) Foreign Application Priority Data

Aug. 2, 2017 (CN) ......................... 201710653644.4

(51) Int. Cl.
*H04L 1/00* (2006.01)
*H03M 13/13* (2006.01)
(Continued)

(52) U.S. Cl.
CPC .......... *H04L 1/0058* (2013.01); *H03M 13/13* (2013.01); *H04L 1/0043* (2013.01);
(Continued)

(58) Field of Classification Search
CPC .. H03M 13/13; H03M 13/09; H03M 13/2906; H03M 13/00; H03M 13/353;
(Continued)

(56) References Cited

U.S. PATENT DOCUMENTS 10,659,194 B2 5/2020 Wang et al.
11,165,535 B2 11/2021 Wang et al.
(Continued)

FOREIGN PATENT DOCUMENTS

CN 102577559 A 7/2012
CN 102694625 A 9/2012
(Continued)

OTHER PUBLICATIONS

3GPP TS 36.101 V10.9.0 (Dec. 2012), 3rd Generation Partnership Project; Technical Specification Group Radio Access Network; Evolved Universal Terrestrial Radio Access (E-UTRA); User Equipment (UE) radio transmission and reception(Release 10), 361 pages.
(Continued)

*Primary Examiner* — April Y Blair
*Assistant Examiner* — Sazzad Hossain

(57) ABSTRACT

This application relates to the field of wireless communications technologies, and discloses an encoding method and
(Continued)

apparatus, to improve accuracy of reliability calculation and ordering for polarized channels. The method includes: obtaining a first sequence used to encode K to-be-encoded bits, where the first sequence includes sequence numbers of N polarized channels, the first sequence is same as a second sequence or a subset of the second sequence, the second sequence comprises sequence numbers of $N_{max}$ polarized channels, and the second sequence is the sequence shown in Sequence Q11 or Table Q11, K is a positive integer, N is a positive integer power of 2, n is equal to or greater than 5, K≤N, $N_{max}$=1024; selecting sequence numbers of K polarized channels from the first sequence; and performing polar code encoding on K the to-be-encoded bits based on the selected sequence numbers of the K polarized channels.

18 Claims, 3 Drawing Sheets

Related U.S. Application Data continuation of application No. 16/838,945, filed on Apr. 2, 2020, now Pat. No. 11,165,535, which is a continuation of application No. 16/145,850, filed on Sep. 28, 2018, now Pat. No. 10,659,194, which is a continuation of application No. PCT/CN2018/085567, filed on May 4, 2018.

(51) Int. Cl.
*H03M 13/00* (2006.01)
*H03M 13/09* (2006.01)
*H03M 13/29* (2006.01)

(52) U.S. Cl.
CPC .......... *H04L 1/0057* (2013.01); *H04L 1/0061* (2013.01); *H03M 13/00* (2013.01); *H03M 13/09* (2013.01); *H03M 13/134* (2013.01); *H03M 13/2906* (2013.01)

(58) Field of Classification Search
CPC .. H03M 13/134; H04L 1/0057; H04L 1/0058; H04L 1/0061
See application file for complete search history.

(56) References Cited

U.S. PATENT DOCUMENTS

| | | | | |
|---|---|---|---|---|
| 2004/0186809 | A1 | 9/2004 | Schlesinger et al. | |
| 2008/0209286 | A1 | 8/2008 | Hamada | |
| 2014/0169492 | A1 | 6/2014 | Mahdavifar et al. | |
| 2014/0331083 | A1 | 11/2014 | Aliev et al. | |
| 2015/0103947 | A1 | 4/2015 | Shen et al. | |
| 2015/0194987 | A1 | 7/2015 | Li et al. | |
| 2016/0013810 | A1 | 1/2016 | Gross et al. | |
| 2017/0077954 | A1 | 3/2017 | Shen et al. | |
| 2017/0111060 | A1 | 4/2017 | Huang et al. | |
| 2017/0213047 | A1 | 7/2017 | Huang et al. | |
| 2018/0026663 | A1* | 1/2018 | Wu .................... | H03M 13/618 714/776 |
| 2018/0331697 | A1 | 11/2018 | Lin et al. | |

FOREIGN PATENT DOCUMENTS

| | | | |
|---|---|---|---|
| CN | 103023518 | A | 4/2013 |
| CN | 103281166 | A | 9/2013 |
| CN | 103684477 | A | 3/2014 |
| CN | 103733560 | A | 4/2014 |
| CN | 103746708 | A | 4/2014 |
| CN | 103959826 | A | 7/2014 |
| CN | 104539393 | A | 4/2015 |
| CN | 105009541 | A | 10/2015 |
| CN | 105099622 | A | 11/2015 |
| CN | 105743621 | A | 7/2016 |
| CN | 106506079 | A | 3/2017 |
| CN | 106877973 | A | 6/2017 |
| CN | 106899379 | A | 6/2017 |
| CN | 107592181 | A | 1/2018 |
| CN | 108347300 | A | 7/2018 |
| CN | 108390740 | A | 8/2018 |
| CN | 108631942 | A | 10/2018 |
| CN | 108667568 | A | 10/2018 |
| CN | 108809333 | A | 11/2018 |
| CN | 108880743 | A | 11/2018 |
| CN | 109150384 | A | 1/2019 |
| CN | 109257140 | A | 1/2019 |
| CN | 109286402 | A | 1/2019 |
| CN | 109286403 | A | 1/2019 |
| CN | 109286404 | A | 1/2019 |
| CN | 109347488 | A | 2/2019 |
| CN | 109391343 | A | 2/2019 |
| CN | 104685923 | B | 7/2019 |
| EP | 2899911 | A1 | 7/2015 |
| GB | 2563568 | A | 12/2018 |
| KR | 20110060635 | A | 6/2011 |
| KR | 20180108373 | A | 10/2018 |
| KR | 20180137356 | A | 12/2018 |
| RU | 2571587 | C2 | 12/2015 |
| WO | 2012149559 | A1 | 11/2012 |
| WO | 2013025547 | A2 | 2/2013 |
| WO | 2014000532 | A1 | 1/2014 |
| WO | 2015000511 | A1 | 1/2015 |
| WO | 2015006947 | A1 | 1/2015 |
| WO | 2016082142 | A1 | 6/2016 |
| WO | 2016101089 | A1 | 6/2016 |
| WO | 2017092693 | A1 | 6/2017 |
| WO | 2017097098 | A1 | 6/2017 |
| WO | 2017101631 | A1 | 6/2017 |
| WO | 2017197358 | A1 | 11/2017 |
| WO | 2018120734 | A1 | 7/2018 |
| WO | 2019024555 | A1 | 2/2019 |

OTHER PUBLICATIONS

Huawei, HiSilicon, Summary of polar code design for control channels[online], 3GPP TSG RAN WG1 Ad-Hoc Meeting R1-1700088, Jan. 20, 2017,total 12 pages.
Intel Corporation, Polar code design. 3GPP TSG RAN WG1 Ad hoc, Spokane, USA, Jan. 16-20, 2017, R1-1700386, 12 pages.
Bo Yuan el aL,"Successive Cancellation Decoding of Polar Codes using Stochastic Computing",2015 IEEE Intemational Symposium on Circuits and Systems (ISCAS),total 4 pages.
3GPP TS 36.211 V10.1.0 (Mar. 2011), 3rd Generation Partnership Project; Technical Specification Group Radio Access Network; Evolved Universal Terrestrial Radio Access (E-UTRA); Physical Channels and Modulation(Release 10), 103 pages.
Kai Niu et al., Polar codes: Primary concepts and practical decoding algorithms. IEEE Communications Magazine ( vol. 52, Issue: 7, Jul. 2014), Jul. 15, 2014, 12 pages.
Huawei et al,"Channel coding chain for control channel", 3GPP TSG RAN WG1 RAN1#89 Meeting R 1-1706968, Hangzhou, China, May 15-19, 2017,total 4 pages.
3GPP TS 36.211 V10.6.0 (Dec. 2012), 3rd Generation Partnership Project; Technical Specification Group Radio Access Network; Evolved Universal Terrestrial Radio Access (E-UTRA); Physical Channels and Modulation(Release 10), 101 pages.
Huawei et al,"Channel coding chain for control channel",3GPP TSG RAN WG1 NR Ad-Hoc#2, R1-1710003, Qingdao, China, Jun. 27-30, 2017,total 4 pages.
3GPP TS 36.212 V10.7.0 (Dec. 2012), 3rd Generation Partnership Project; Technical Specification Group Radio Access Network; Evolved Universal Terrestrial Radio Access (E-UTRA); Multiplexing and channel coding(Release 10), 79 pages.
NTT DOCOMO,"Discussion on construction of Polar codes",3GPP TSG RAN WG1 Meeting#88, R1-1702850, Athens, Greece, Feb. 13-17, 2017,total 9 pages.

(56) References Cited

OTHER PUBLICATIONS

3GPP TS 36.213 V10.1.0 (Mar. 2011), 3rd Generation Partnership Project; Technical Specification Group Radio Access Network; Evolved Universal Terrestrial Radio Access (E-UTRA); Physical layer procedures(Release 10), 115 pages.
Samsung,"Design of a Nested Sequence for Polar Codes",3GPP TSG RAN WG1#8Bbis, R1-1705425, Spokane, WA, Apr. 3-7, 2017,total 8 pages.
3GPP TS 36.213 V10.8.0 (Dec. 2012), 3rd Generation Partnership Project; Technical Specification Group Radio Access Network; Evolved Universal Terrestrial Radio Access (E-UTRA); Physical layer procedures(Release 10), 126 pages.
Qualcomm Incorporated,"FRANK polar construction: nested extension design of polar codes based on mutual information",3GPP TSG-RAN WG1#88b, R1-1705633, Apr. 3 7, 2017, Spokane, USA. total 21 pages.
3GPP TS 36.213 V11.2.0 (Feb. 2013), 3rd Generation Partnership Project; Technical Specification Group Radio Access Network; Evolved Universal Terrestrial Radio Access (E-UTRA); Physical layer procedures(Release 11), 173 pages.
Ntt Docomo,"Sequence design of Polar codes", 3GPP TSG RAN WG1 Meeting #88bis, R1-1705758, Spokane, USA, Apr. 3-7, 2017, total 5 pages.
3GPP TS 36.321 V10.8.0 (Mar. 2013), 3rd Generation Partnership Project; Technical Specification Group Radio Access Network; Evolved Universal Terrestrial Radio Access (E-UTRA); Medium Access Control (MAC) protocol specification (Release 10), 54 pages.
Samsung,"Design of rate-matching polar code",3GPP TSG RAN WG1 Meeting#88bis, R1-1706814, Spokane, WA, Apr. 3-7, 2017, total 10 pages.
3GPP TS 36.331 V10.1.0 (Mar. 2011), 3rd Generation Partnership Project; Technical Specification Group Radio Access Network; Evolved Universal Terrestrial Radio Access (E-UTRA); Radio Resource Control (RRC); Protocol specification (Release 10), 290 pages.
NEC,"Evaluation of sequence design for polar codes",3GPP TSG RAN WG1 Meeting #89, R1-1707059, Hangzhou, China, May 15-2o, 2017, total 5 pages.
3GPP TS 36.331 V10.8.0 (Dec. 2012), 3rd Generation Partnership Project; Technical Specification Group Radio Access Network; Evolved Universal Terrestrial Radio Access (E-UTRA); Radio Resource Control (RRC); Protocol specification (Release 10), 305 pages.
LG Electronics,"Information bit allocation of Polar codes",3GPP TSG RAN WG1 Meeting#89, R1-1707674, Hangzhou, China, May 15-19, 2017, total 5 pages.
3GPP TS 36.331 V11.3.0 (Mar. 2013), 3rd Generation Partnership Project; Technical Specification Group Radio Access Network; Evolved Universal Terrestrial Radio Access (E-UTRA); Radio Resource Control (RRC); Protocol specification (Release 11), 343 pages.
LG Electronics,"Discussion of rate matching for Polar codes",3GPP TSG RAN WG1 Meeting#88bis, R1-1707675, Hangzhou, China, May 15-19, 2017, total 5 pages.
Shenzukang,[NRAH2-11]Polar code sequence. Jul. 12, 2017, 110 pages.
Samsung,"Design of a Nested polar code sequences", 3GPP TSG RAN WG1 Meeting#89, R1-1708051, Hangzhou, P.R. China May 15-19, 2017, total 3 pages.
NTT DOCOMO,"Sequence design of Polar codes", 3GPP TSG RAN WG1 Meeting #89, R1-1708489, Hangzhou, China, May 15-19, 2017, total 6 pages.
Qualcomm Incorporated,"FRANK polar construction for NR control channel and performance comparison",3GPP TSG-RAN WG1#89, R1-1708646, May 15-19, 2017,Hangzhou, P. R China, total 22 pages.
Nokia et al.,"Sequence design for Polar codes", 3GPP TSG RAN WG1 Meeting #89, R1-1708834, Hangzhou, P.R, China May 15-19, 2017,total 13 pages.
Samsung,"Design of Combined-and-Nested Polar Code Sequences",3GPP TSG RAN WG1 NR Ad-Hoc #2, R1-1710749, Qingdao, P.R. China, Jun. 27-30, 2017,total 18 pages.
NTT DOCOMO,"Sequence design of Polar codes",3GPP TSG RAN WG1 NR Ad-Hoc#2, R1-1711126, Qingdao, China, Jun. 27-30, 2017, total 6 pages.
Qualcomm Incorporated,"Sequence construction of Polar codes for control channel",3GPP TSG-RAN WG1 NR Ad-Hoc#2, R1-1711218, Jun. 27-3o, 2017, Qingdao, P. R China ,total 17 pages.
Nokia et al.,"Sequence design for Polar codes", 3GPP TSG RAN WG1 NR Ad-Hoc #2, R1-1711542, Qingdao, P.R. China Jun. 27-30, 2017, total 13 pages.
3GPP TSG-RAN WG1 NR AdHoc, R1-1700832, Qualcomm Incorporated:"Design of Polar codes for control channel", Jan. 16-2o, 2017, Spokane, USA, 5 pages. XP51208351.
3GPP TSG RAN WG1#8Bbis, R1-1705425, Samsung:"Design of a Nested Sequence for Polar Codes", Spokane, WA, Apr. 3-7, 2017. 8 pages. XP51243555.
3GPP TSG RAN WG1 NR Ad-Hoc# 2, R1-1710003, Huawei, HiSilicon:"Channel coding chain for control channel", Qingdao, China, Jun. 27-30, 2017, 4 pages, XP51299228.
3GPP TSG RAN WG1 Meeting #89, R1-1708489, NTT DOCOMO:"Sequence design of Polar codes", Hangzhou, China May 15-19, 2017. 6 pages. XP51273681.
3GPP TS 38.212 V15.0.0 (Dec. 2017), 3rd Generation Partnership Project; Technical Specification Group Radio Access Network; NR; Multiplexing and channel coding(Release 15), total 23 pages.
Huawei, HiSilicon, Polar code design and rate matching . 3GPP TSG RAN WG1 Meeting #86, Gothenburg, Sweden, Aug. 22-26, 2016, R1-167209, 5 pages.
Huawei, HiSilicon, Construction schemes for polar codes. 3GPP TSG RAN WG1 Meeting #88, Athens, Greece, Feb. 13-17, 2017, R1-1701702, 7 pages.
Huawei, HiSilicon, Overview of Polar Codes. 3GPP TSG RAN WG1 Meeting #84bis, Busan, Korea, Apr. 11-15, 2016, R1-162161, 7 pages.
Huawei, HiSilicon: "Details of the Polar code design", 3GPP TSG RAN WG1 Meeting #87, Reno, USA, Nov. 10-14, 2016, R1-1611254, total 15 pages.
NEC Corporation:"Polar code construction for NR control channel", 3GPP TSG-RAN WG1 NR Ad-hoc#2, Jun. 27-30, 2017, Qingdao, P. R. China, R1-1710587, total 8 pages.
Huawei, Summary of email discussion [NRAH2-11] Polar code sequence, 3GPP TSG RAN WG1 Meeting #90 Prague; Czech Repubiic, Aug. 21-25, 2017, R1-1712174, total 3 pages.
MCC Support, Final Report of 3GPP TSG RAN WG1 #90 v1.0.0 (Prague, Czech Rep, Aug. 21-25, 2017), 3GPP TSG RAN WG1 Meeting #90bis, Prague, Czech Rep, Oct. 9-13, 2017, R1-1716941, total 172 pages.
Email "(NRAH2-11) Polar code sequence" and therein attached sequence listing example" (NRAH2-11) Polar sequence templatc. xls"and first page of reporting template (NRAH2-11) resulttemplate. xls as received at the 3GPP email reflector on Dec. 7, 2017 as partof3GPP RAN WG1 standardisation.
Emaill chain up to a contribute by Huawei by an email to 3GPP server on Apr. 8, 2017.
Polar coding sequence proposal attached as (NRAH2-II) Polar sequence (64 kB) to the Huawei email of D6 and published on Aug. 4, 2017 together with the email.
A screen print of emails received by the 3GPP server on Aug. 4, 2017 around time the time of receipt of the email of D6 and the attachment of D7.
Comparison of the second sequence of Claim 1 to the 1024 long sequence.
A screen print of the 3GPP for WG1 documents recieved around time the time of receipt of D10.
Comparison second sequence of the claim with prior art and sequences proposed with the standarisation process.
Communication pursuant to Art 94(3) EPC in the application for the Patent in suit of Oct. 19, 2020.
Statement by certified translator Li Boxuan on the priority document translation /D13.

(56) References Cited

OTHER PUBLICATIONS

Statement by certified translator Li Boxuan on the PCT application translation /D12.
Relevant pages of Oxford Dictionary in view of difference in the meaning of terms “based on and according to”.

* cited by examiner

POLAR CODE ENCODING METHOD AND APPARATUS IN WIRELESS COMMUNICATIONS

CROSS-REFERENCE TO RELATED APPLICATIONS

This application is a continuation of U.S. patent application Ser. No. 17/491,529, filed on Oct. 1, 2021, which is a continuation of U.S. patent application Ser. No. 16/838,945, filed on Apr. 2, 2020, now U.S. Pat. No. 11,165,535, which is a continuation of U.S. patent application Ser. No. 16/145,850, filed on Sep. 28, 2018, now U.S. Pat. No. 10,659,194, which is a continuation of International Application No. PCT/CN2018/085567, filed on May 4, 2018. The International Application claims priority to Chinese Patent Application No. 201710653644.4, filed on Aug. 2, 2017. All of the afore-mentioned patent applications are hereby incorporated by reference in their entireties.

TECHNICAL FIELD

Embodiments of this application relate to the field of communications technologies, and in particular, to a polar code encoding method and apparatus.

BACKGROUND

As the most fundamental wireless access technology, channel coding plays a key role in ensuring reliable transmission of data. In an existing wireless communications system, channel coding is usually performed by using a turbo code, a low-density parity-check (LDPC) code, and a polar code. The turbo code cannot support information transmission at an excessively low or excessively high bit rate. For medium/short packet transmission, due to encoding/decoding characteristics of the turbo code and the LDPC code, it is very difficult for the turbo code and the LDPC code to achieve ideal performance in a case of a limited code length. In terms of implementation, the turbo code and the LDPC code have relatively high computational complexity in an encoding/decoding implementation process. The polar code is a good code that has been theoretically proved to be able to achieve the Shannon capacity and has relatively low encoding/decoding complexity, and therefore is more widely applied.

However, with rapid evolution of wireless communications systems, future communications systems such as 5th generation (5G) communications systems will have some new characteristics. For example, three most typical communication scenarios include enhanced mobile broadband (eMBB), massive machine type communications (mMTC), and ultra-reliable and low-latency communications (URLLC). The communications scenarios have higher requirements on encoding/decoding performance of the polar code.

Reliability ordering for polarized channels plays a key role in the encoding/decoding performance of the polar code. However, at present, accuracy of reliability ordering for polarized channels is not desirable, hindering further improvement of the encoding/decoding performance of the polar code during application.

SUMMARY

Embodiments of this application provide a polar code encoding method and apparatus, to improve accuracy of reliability ordering for polarized channels.

Specific technical solutions provided in the embodiments of this application are as follows:

According to a first aspect, a polar code encoding method is provided. The method includes: obtaining, by an encoding apparatus, to-be-encoded bits, where a length of the to-be-encoded bits is K, and K is a positive integer; obtaining a sequence used to encode the K to-be-encoded bits, where the sequence is denoted as a first sequence, the first sequence is used to represent an order of reliability of N polarized channels, the first sequence includes sequence numbers of the N polarized channels, the sequence numbers of the N polarized channels are arranged in the first sequence based on the reliability of the N polarized channels, N is a mother code length of a polar code, N is a positive integer power of 2, and K≤N; selecting, in descending order of the reliability, the first K sequence numbers whose reliability rank relatively high in the first sequence; and mapping to-be-encoded information bits to polarized channels corresponding to the first K sequence numbers, and performing polar code encoding on the to-be-encoded bits. Therefore, positions of the information bits and fixed bits are determined by calculating reliability of polarized channels of a polar code without considering a channel parameter and a bit rate. In this way, computational complexity of polar code encoding may be reduced.

In a possible design, the first sequence is all of or a subset of a second sequence, where the second sequence includes sequence numbers of $N_{max}$ polarized channels, the sequence numbers of the $N_{max}$ polarized channels are arranged in the second sequence based on reliability of the $N_{max}$ polarized channels, $N_{max}$ is a positive integer, $N_{max}$≥N, and an order in which the sequence numbers of the polarized channels in the first sequence are arranged is consistent with an order in which sequence numbers less than N in the sequence numbers of the polarized channels in the second sequence are arranged.

In a possible design, the second sequence may be part or all of any sequence shown in Sequence Q1 to Sequence Q30 in the specification, the sequence numbers of the N polarized channels in the second sequence are arranged in ascending order of the reliability of the N polarized channels, and a minimum value of the sequence number of the polarized channel is 0.

In a possible design, the second sequence is part or all of any sequence shown in Table Q1 to Table Q30 in the specification the sequence numbers of the N polarized channels in the second sequence are arranged in ascending order of the reliability of the N polarized channels, and a minimum value of the sequence number of the polarized channel is 0.

In a possible design, the second sequence may be part or all of any sequence shown in Sequence Z1 to Sequence Z30 in the specification, each of the sequence numbers of the N polarized channels in the second sequence corresponds to the order of the reliability of the sequence number in the entire sequence, and a minimum value of the sequence number of the polarized channel is 0.

In a possible design, the second sequence is part or all of any sequence shown in Table Z1 to Table Z30 in the specification, each of the sequence numbers of the N polarized channels in the second sequence corresponds to the order of the reliability of the sequence number in the entire sequence, and a minimum value of the sequence number of the polarized channel is 0.

According to a second aspect, a polar code encoding apparatus is provided. The apparatus has a function of implementing the method according to any one of the first aspect and the possible designs of the first aspect. The function may be implemented by using hardware, or may be implemented by using hardware to execute corresponding software. The hardware or the software includes one or more modules corresponding to the foregoing function.

In a possible design, when part or all of the function is implemented by using hardware, the polar code encoding apparatus includes: an input interface circuit, configured to obtain to-be-encoded bits; a logic circuit, configured to perform the method according to any one of the first aspect and the possible designs of the first aspect; and an output interface circuit, configured to output a bit sequence after encoding.

Optionally, the polar code encoding apparatus may be a chip or an integrated circuit.

In a possible design, when part or all of the function is implemented by using software, the polar code encoding apparatus includes: a memory, configured to store a program; and a processor, configured to execute the program stored in the memory. When the program is executed, the polar code encoding apparatus may implement the method according to any one of the first aspect and the possible designs of the first aspect.

Optionally, the memory may be a physically independent unit. Alternatively, the memory is integrated with a processor.

In a possible design, when part or all of the function is implemented by using software, the polar code encoding apparatus includes a processor. The memory configured to store the program is located outside the encoding apparatus. The processor is connected to the memory by using a circuit/wire and is configured to read and execute the program stored in the memory.

According to a third aspect, a communications system is provided. The communications system includes a network device and a terminal. The network device or the terminal may perform the method according to any one of the first aspect and the possible designs of the first aspect.

According to a fourth aspect, a computer storage medium storing a computer program is provided. The computer program includes an instruction used to perform the method according to any one of the first aspect and the possible designs of the first aspect.

According to a fifth aspect, a computer program product including an instruction is provided. When run on a computer, the instruction causes the computer to perform the methods according to the foregoing aspects.

According to a sixth aspect, a wireless device is provided. The wireless device includes an encoding apparatus configured to implement the method described in any one of the first aspect and the possible designs of the first aspect, a modulator, and a transceiver, where the modulator is configured to modulate a bit sequence after encoding, to obtain a modulated sequence; and the transceiver is configured to send the modulated sequence.

In a possible design, the wireless device is a terminal or a network device.

DESCRIPTION OF EMBODIMENTS

Figure 1:
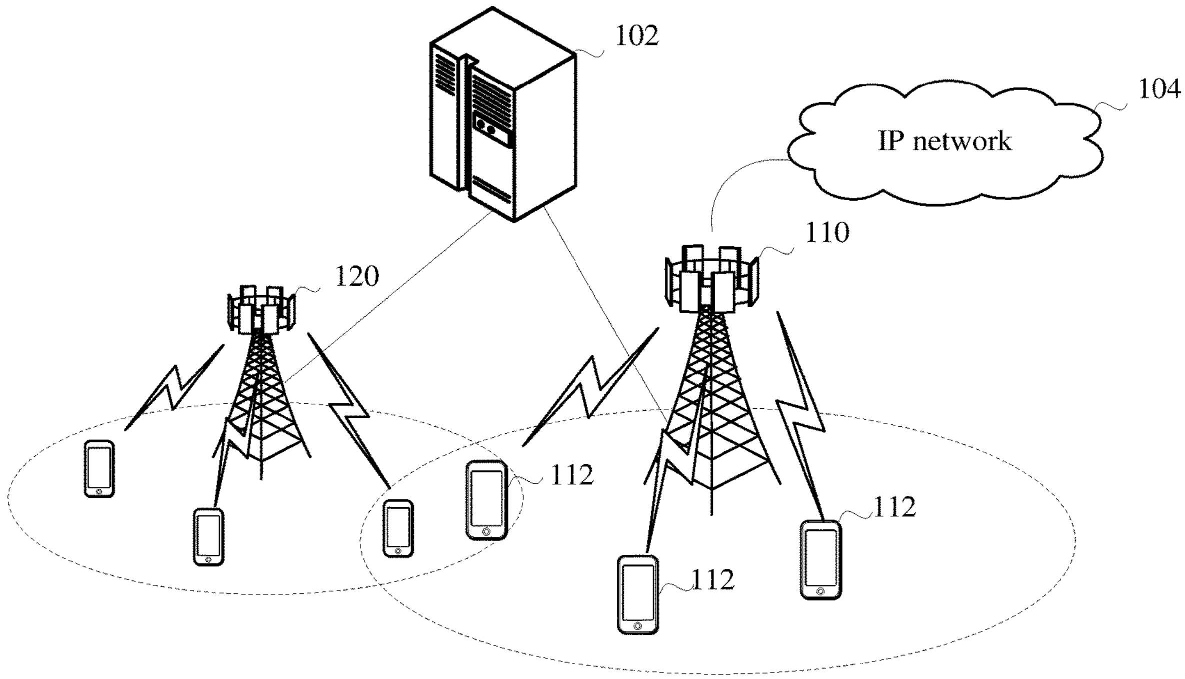
FIG. 1 is a schematic architectural diagram of a communications system applied in an embodiment of this application.

The following describes in detail the embodiments of this application with reference to accompanying drawings.

The embodiments of this application provide a polar code encoding method and apparatus. A reliability order is obtained based on reliability of polarized channels, sequence numbers of polarized channels used to send information bits are selected based on the reliability order, and polar code encoding is performed based on the sequence numbers selected for the information bits. In the embodiments of this application, a reliability of each subchannel of a polar code can be calculated more accurately. The encoding method and apparatus provided in the embodiments of the present invention are described below in detail with reference to the accompanying drawings.

To facilitate understanding of the embodiments of this application, the following describes the polar code briefly.

In an encoding scheme of the polar code, a noiseless channel is used to transmit information useful for a user, and a pure noisy channel is used to transmit agreed information or is not used to transmit information. The polar code is a linear block code, with its encoding matrix being $G_N$ and its encoding process being $x_1^N=u_1^N G_N$, where $u_1^N=u_1, u_2, \ldots, u_N)$ is a binary row vector having a length of N (that is, code length), $G_N$ is an N×N matrix, and $G_N=F_2^{\otimes(log_2(N))}$. $F_2^{\otimes(log_2(N))}$ is defined as a Kronecker (Kronecker) product of $\log_2$ N matrices $F_2$. The foregoing matrix $$F_2=\begin{bmatrix}1 & 0\\ 1 & 1\end{bmatrix}.$$

In the encoding process of the polar code, some bits in $u_1^N$ are used to carry information and are referred to as an information bit set, and an index set of the bits is denoted as $\mathcal{A}$. Other bits are set to fixed values pre-agreed on by a receive end and a transmit end and are referred to as a fixed bit set or a frozen bit set (frozen bits), and an index set of the other bits is represented by a complementary set $\mathcal{A}^c$ of $\mathcal{A}$. The encoding process of the polar code is equivalent to $x_1^N=u_A G_{N.}(A)\oplus u_{A^c} G_{N.}(A^C)$, where $G_N(A)$ is a sub-matrix obtained from rows that correspond to the indexes in the set A in $G_N$, and $G_N(A^C)$ is a sub-matrix obtained from rows that correspond to the indexes in the set $A^c$ in $G_N$. $u_A$ is the information bit set in $u_1^N$, and includes K information bits. Usually, various check bits including but not limited to a cyclic redundancy check (Cyclic Redundancy Check, CRC for short) bit and a parity check (Parity Check, PC for short) bit are also included in the information bit set. $u_{A^c}$ is the fixed bit set in $u_1^N$, and includes N−K fixed bits, which are known bits. The fixed bits are usually set to 0. However, the fixed bits may be set arbitrarily provided that the receive end and the transmit end pre-agree. Therefore, an encoding output of the polar code may be simplified to: $x_1^N = u_{\mathcal{A}} G_N(\mathcal{A})$. Herein, $u_{\mathcal{A}}$ is an information bit set in $u_1^N$, and $u_{\mathcal{A}}$ is a row vector of a length K, that is, $|\mathcal{A}|=K$, where $|\cdot|$ represents a quantity of elements in a set, and K is a size of an information block; $G_N(\mathcal{A})$ is a sub-matrix obtained by using rows that correspond to the indexes in the set $\mathcal{A}$ in the matrix $G_N$, and $G_N(\mathcal{A})$ is a K×N matrix.

A process of constructing the polar code, that is, a process of selecting the set $\mathcal{A}$, determines performance of the polar code. Usually, the process of constructing the polar code is: determining, based on a mother code length N, that there are a total of N polarized channels that respectively correspond to N rows of the encoding matrix, calculating reliability of the polarized channels, and using indexes of the first K polarized channels having relatively high reliability as elements of the set $\mathcal{A}$, and indexes that correspond to the remaining N-K polarized channels are used as elements of the index set $\mathcal{A}^c$ of the fixed bits. The set $\mathcal{A}$ determines positions of the information bits, and the set $\mathcal{A}^c$ determines positions of the fixed bits. A sequence number of a polarized channel is an index of the position of an information bit or a fixed bit, that is, an index of a position in $u_1^N$.

The solutions provided in the embodiments of this application relate to how to determine reliability of a polarized channel. A basic invention idea of the embodiments of this application is that reliability of the polarized channel may be represented by using a reliability. From a perspective of spectral analysis of signals, an approximation of an existing reliability to the polarized channel reliability may be understood as domain transform of a signal. Similar to Fourier transform in which transformation between a time domain and a frequency domain of a signal is implemented by using a kernel $e^{jw}$, in this method, a signal is transformed from a channel sequence number domain to a reliability weight domain by using a β kernel. In the signal time-frequency analysis field, Fourier transform and wavelet transform are most commonly used. For the Fourier transform, limited by a form of the trigonometric function kernel $e^{jw}$, high time domain resolution and high frequency domain resolution cannot be achieved at the same time in a signal time-frequency analysis process. For the wavelet transform, because a wavelet kernel is used and there are various forms of functions, an instantaneous change of a signal in time domain can be captured when domain transform is performed, so that both high time domain resolution and high frequency domain resolution can be achieved. In the embodiments of this application, the polarized channel reliability is estimated by using a changeable transform kernel, so that accuracy of sequence reliability estimation is improved.

FIG. 1 is a schematic structural diagram of a wireless communications network according to an embodiment of the present invention. FIG. 1 is merely an example. Other wireless networks to which the encoding method or apparatus of the embodiments of the present invention can be applied shall all fall within the protection scope of the present invention.

As shown in FIG. 1, a wireless communications network 100 includes a network device 110 and a terminal 112. When the wireless communications network 100 includes a core network 102, the network device 110 may further be connected to the core network 102. The network device 110 may further communicate with an IP network 104, for example, an Internet, a private IP network, or another data network. The network device provides a service for a terminal within coverage of the network device. For example, as shown in FIG. 1, the network device 110 provides wireless access for one or more terminals 112 within coverage of the network device 110. In addition, there may be an overlapping area between coverage of network devices, for example, the network device 110 and a network device 120. The network devices may further communicate with each other, for example, the network device 110 may communicate with the network device 120.

The foregoing network device may be a device configured to communicate with a terminal device. For example, the network device may be a base transceiver station (BTS) in a GSM system or a CDMA system, or may be a NodeB (NB) in a WCDMA system, or may further be an evolved NodeB (eNB or eNodeB) in an LTE system or a network side device in a future 5G network. Alternatively, the network device may be a relay station, an access point, an in-vehicle device, or the like. In a device to device (D2D) communications system, the network device may alternatively be a terminal that plays a role of a base station.

The foregoing terminal may refer to user equipment (UE), an access terminal, a user unit, a mobile station, a remote station, a remote terminal, a mobile device, a user terminal, a wireless communications device, a user agent, or a user apparatus. The access terminal may be a cellular phone, a cordless phone, a Session Initiation Protocol (SIP) phone, a wireless local loop (WLL) station, a personal digital assistant (PDA), a handheld device having a wireless communication function, a computing device, another processing device connected to a wireless modem, an in-vehicle device, a wearable device, a terminal device in a future 5G network, or the like. Based on a communications system architecture shown in FIG. 1, in this embodiment of this application, the polar code encoding method may be executed by the foregoing network device or terminal. The polar code encoding method may be used when the network device or the terminal serves as a transmit end to send data or information. Correspondingly, when the network device or the terminal serves as a receive end to receive data or information, a subchannel sequence needs to be determined first based on the method of the present invention. The following describes in detail the polar code encoding method provided in the embodiments of this application.

Figure 2:
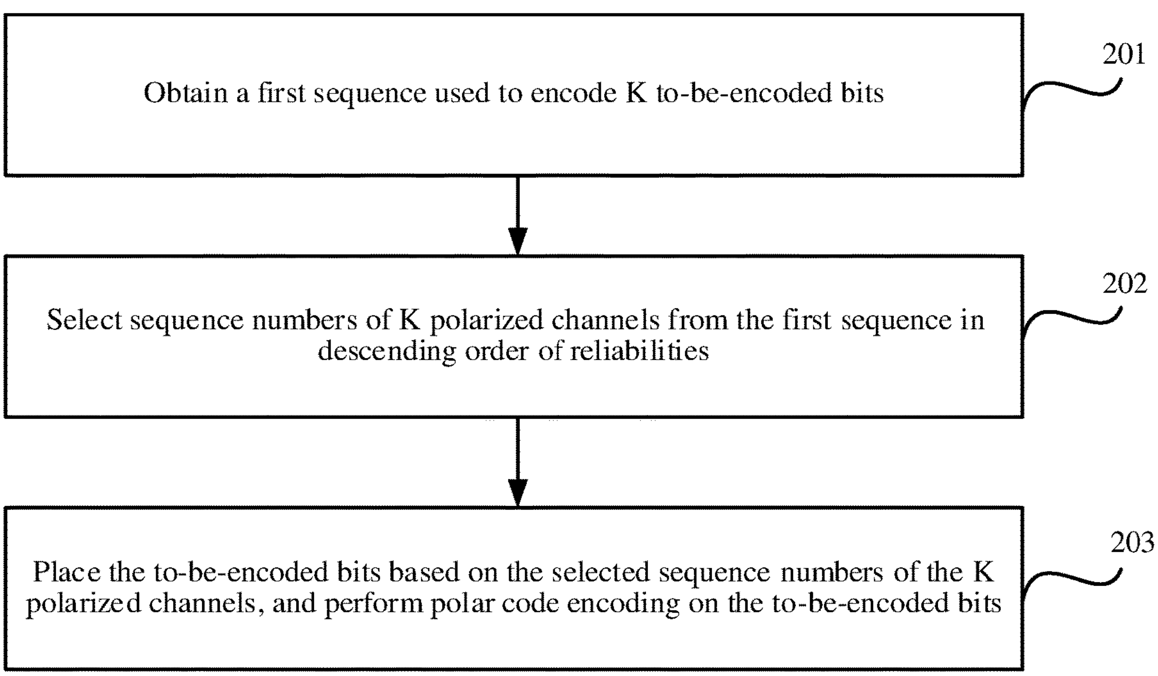
FIG. 2 is a schematic flowchart of a polar code encoding method according to an embodiment of this application.

Based on the communications system architecture shown in FIG. 1, as shown in FIG. 2, a specific procedure of a polar code encoding method provided in an embodiment of this application is as follows.

Step 201. Obtain a first sequence used to encode K to-be-encoded bits.

The first sequence includes sequence numbers of N polarized channels, the sequence numbers of the N polarized channels are arranged in the first sequence based on reliability of the N polarized channels, K is a positive integer, N is a mother code length of a polar code, and N is a positive integer power of 2.

Step 202. Sequence numbers of K polarized channels are selected from the first sequence in descending order of reliability.

Step 203. Place the to-be-encoded bits based on the selected sequence numbers of the K polarized channels, and perform polar code encoding on the to-be-encoded bits.

The K to-be-encoded bits are mapped to the K polarized channels in the N polarized channels. The reliability of the K polarized channels is higher than reliability of the remaining N-K polarized channels.

Optionally, the first sequence is all of or a subset of a second sequence, the second sequence includes sequence numbers of $N_{max}$ polarized channels, the sequence numbers of the $N_{max}$ polarized channels are arranged in the second sequence based on reliability of the $N_{max}$ polarized channels, that is, an order in which the sequence numbers of the polarized channels in the first sequence are arranged is consistent with an order in which sequence numbers less than N in the sequence numbers of the polarized channels in the second sequence are arranged. $N_{max}$ may be a positive integer power of 2 or may not be a positive integer power of 2, and $N_{max} \geq N$. A manner for calculating the reliability of the $N_{max}$ polarized channels is similar to that for calculating the reliability of the N polarized channels. The arrangement based on the reliability herein may be arrangement performed in ascending order of the reliability, or may be arrangement performed in descending order of the reliability. Alternatively, the sequence numbers of the polarized channels are grouped into two or more groups, and the sequence numbers in each group are arranged in descending order or ascending order of the reliability. A specific grouping manner may be grouping based on values of sequence numbers of polarized channels or grouping based on congruent sequence numbers (for example, three groups are divided, and sequence numbers that are congruent modulo 3 are grouped into one group). This is not specifically limited herein.

Optionally, rate matching is performed, based on a target code length, on a sequence obtained after the polar code encoding.

According to the encoding method provided in this embodiment, after input information bits are received, a quantity K of to-be-encoded bits is determined based on a target code length N of a polar code. Regardless of online calculation or a manner in which calculation and storage are performed in advance, if a second sequence is known, a first sequence may be obtained from the second sequence, and when $N_{max}=N$, the second sequence is the first sequence. The second sequence includes an order of reliability of $N_{max}$ polarized channels, where $N_{max}$ is a maximum code length supported by a communications system. Optionally, the first sequence may be obtained from a pre-stored second sequence, then information bits are determined based on the first sequence, and finally polar encoding is performed on the K to-be-encoded bits, to obtain a bit sequence obtained after the polar encoding. Therefore, positions of the information bits and fixed bits are determined by obtaining a reliability of a polarized channel of a polar code through a combination of online calculation and offline storage.

The following specifically describes a sequence of sequence numbers of polarized channels that is obtained through arrangement based on a reliability of an $i^{th}$ polarized channel in N (or $N_{max}$) polarized channels. The sequence numbers of the N polarized channels may be 0 to N−1, or may be 1 to N. In this embodiment of this application, when the reliability of the $i^{th}$ polarized channel of the N polarized channels is determined, a value of i may be 1, 2, . . . , and N, or may be 0, 1, . . . , and N−1.

It may be understood that formulas used in the embodiments of this application are merely examples. Any solution that may be obtained by persons skilled in the art by making simple variations to the formulas without affecting performance of the formulas shall fall within the protection scope of the embodiments of this application.

For specific sequence examples, refer to the following six groups of sequences found based on different criteria. The second sequence may be part or all of any sequence shown in Sequence Q1 to Sequence Q30. These sequences may also be represented by using corresponding tables Table Q1 to Table Q30. "Reliability or sequence number of reliability" is a natural sequence of reliability in ascending order, and "polarized channel sequence number" is polarized channel sequence numbers in corresponding sequences. Herein, "part of" has three different meanings:

(1) $N_{max}$ is not a positive integer power of 2, but code lengths in the given examples are all positive integer powers of 2; therefore the second sequence can only be part of any sequence shown in Sequence Q1 to Sequence Q30; or (2) $N_{max\_encoding\_device}$ supported by an encoding device is less than $N_{max\_protocol}$ regulated by a protocol, and therefore only $N_{max\_encoding\_device}$ in any sequence shown in Sequence Q1 to Sequence Q30 needs to be selected; or (3) Part of an actually used sequence having a length of $N_{max}$ is completely consistent with part of any sequence shown in Sequence Q1 to Sequence Q30.

These sequences may also be represented by using Z sequences, that is, an order of reliability of polarized channels that corresponds to a natural order of polarized channel sequence number is used as a Z sequence. To be specific, the second sequence may be part or all of any sequence shown in Sequence Z1 to Sequence Z30. Likewise, the Z sequences may also be represented by using corresponding tables Table Z1 to Table Z30, where the polarized channel sequence numbers are sequentially arranged in ascending order, and "reliability or sequence number of reliability" is a sequence number of ordering of a reliability of a polarized channel that corresponds to the polarized channel sequence number.

For example, an $x^{th}$ Q sequence is Sequence Qx and Table Qx, and Sequence Qx is equivalent to Table Qx. Corresponding Z sequences are Sequence Zx and Table Zx, and Sequence Zx is equivalent to Table Zx, where x=1, 2, . . . , and 30.

First group of sequences (obtained by using a criterion that comprehensively considers performance of code length of 64, 128, 256, 512, and 1024, and preferentially considers performance of a mother code length of 256).

Sequence Q1, having a sequence length of 1024:

[0, 1, 4, 8, 2, 16, 32, 6, 64, 512, 3, 12, 5, 18, 128, 9, 33, 17, 10, 256, 20, 34, 24, 65, 7, 36, 66, 129, 11, 40, 19, 132, 513, 13, 68, 48, 14, 72, 257, 21, 130, 26, 35, 80, 258, 136, 38, 22, 260, 516, 37, 25, 96, 67, 264, 41, 144, 28, 69, 49, 74, 160, 42, 520, 272, 192, 70, 44, 131, 81, 15, 288, 50, 134, 73, 514, 23, 52, 320, 133, 76, 82, 137, 56, 27, 259, 528, 97, 39, 384, 138, 84, 29, 261, 145, 544, 43, 98, 140, 30, 88, 262, 146, 71, 518, 265, 161, 45, 100, 148, 51, 46, 576, 75, 266, 104, 273, 164, 193, 53, 515, 162, 268, 77, 152, 274, 54, 524, 83, 57, 112, 85, 135, 289, 517, 194, 78, 290, 58, 276, 168, 530, 99, 139, 196, 86, 176, 640, 60, 89, 280, 101, 147, 292, 521, 141, 321, 142, 90, 200, 545, 31, 102, 263, 105, 529, 322, 149, 296, 47, 522, 92, 208, 267, 385, 324, 304, 536, 768, 532, 163, 153, 150, 106, 55, 165, 386, 577, 328, 548, 269, 113, 154, 79, 224, 166, 275, 108, 578, 270, 59, 114, 195, 169, 156, 87, 546, 61, 277, 291, 519, 278, 116, 170, 197, 641, 177, 281, 91, 552, 201, 388, 293, 198, 523, 62, 143, 336, 584, 172, 282, 120, 644, 103, 178, 294, 531, 202, 93, 323, 560, 392, 297, 151, 580, 209, 284, 180, 525, 107, 94, 204, 769, 298, 352, 325, 526, 155, 109, 533, 400, 305, 300, 642, 210, 184, 326, 538, 115, 167, 592, 157, 225, 306, 547, 329, 110, 770, 212, 117, 171, 550, 330, 226, 648, 387, 308, 158, 608, 416, 337, 534, 216, 271, 549, 118, 279, 537, 332, 389, 173, 579, 121, 199, 776, 179, 228, 553, 338, 656, 312, 540, 390, 174, 581, 393, 283, 772, 122, 672, 554, 784, 63, 340, 704, 448, 561, 353, 800, 394, 232, 203, 527, 582, 556, 295, 285, 181, 124, 205, 240, 643, 585, 562, 286, 299, 354, 182, 401, 211, 396, 344, 586, 832, 564, 95, 185, 206, 327, 645, 535, 402, 593, 186, 356, 588, 568, 307, 646, 418, 213, 301, 227, 302, 896, 594, 360, 111, 649, 771, 417, 539, 214, 404, 309, 188, 449, 331, 217, 159, 609, 596, 551, 650, 119, 229, 333, 408, 541, 773, 610, 657, 310, 420, 600, 218, 368, 230, 652, 391, 175, 313, 339, 542, 334, 123, 555, 774, 233, 314, 658, 612, 341, 777, 450, 220, 424, 355, 673, 583, 125, 234, 183, 395, 241, 557, 660, 616, 316, 342, 345, 778, 563, 403, 287, 397, 452, 674, 558, 785, 432, 187, 357, 207, 664, 587, 780, 705, 676, 236, 346, 565, 361, 126, 242, 589, 405, 215, 398, 566, 303, 597, 358, 801, 419, 624, 456, 786, 348, 244, 569, 189, 590, 219, 647, 311, 706, 362, 595, 464, 802, 406, 680, 421, 788, 248, 598, 190, 570, 369, 651, 409, 834, 410, 708, 480, 613, 231, 572, 315, 659, 364, 422, 335, 688, 370, 792, 221, 611, 451, 601, 425, 804, 412, 653, 453, 833, 317, 712, 235, 602, 343, 543, 372, 654, 222, 614, 426, 775, 433, 559, 237, 898, 617, 347, 808, 243, 720, 454, 665, 318, 604, 376, 661, 428, 779, 238, 675, 359, 836, 458, 625, 399, 662, 677, 434, 567, 457, 816, 245, 618, 349, 787, 127, 781, 897, 407, 666, 436, 591, 363, 620, 465, 736, 350, 678, 571, 246, 681, 249, 626, 460, 707, 840, 411, 782, 365, 789, 440, 599, 374, 668, 628, 423, 900, 466, 848, 803, 250, 790, 371, 709, 191, 573, 689, 481, 682, 413, 603, 793, 366, 713, 468, 710, 373, 574, 655, 427, 806, 414, 684, 904, 252, 615, 482, 632, 805, 429, 794, 864, 223, 690, 455, 714, 835, 472, 809, 377, 605, 619, 435, 663, 721, 319, 796, 484, 692, 912, 430, 606, 716, 488, 810, 459, 838, 667, 239, 817, 621, 378, 837, 722, 437, 696, 461, 737, 679, 380, 812, 627, 247, 899, 841, 441, 622, 928, 351, 724, 783, 469, 629, 818, 438, 669, 462, 738, 683, 251, 842, 849, 496, 901, 820, 728, 467, 633, 902, 367, 670, 791, 442, 844, 630, 474, 685, 850, 483, 691, 711, 379, 865, 795, 415, 824, 960, 740, 253, 905, 634, 444, 693, 744, 485, 807, 686, 906, 470, 575, 715, 375, 866, 913, 473, 852, 636, 797, 431, 694, 811, 486, 752, 723, 798, 489, 856, 908, 254, 717, 607, 930, 476, 697, 725, 914, 439, 819, 839, 868, 492, 718, 698, 381, 813, 623, 814, 498, 872, 739, 929, 671, 916, 821, 463, 726, 961, 843, 490, 631, 729, 700, 382, 741, 845, 920, 471, 822, 851, 730, 497, 880, 742, 443, 903, 687, 825, 500, 445, 932, 846, 635, 745, 826, 732, 446, 962, 936, 475, 853, 867, 637, 907, 487, 695, 746, 828, 753, 854, 857, 915, 964, 477, 909, 719, 799, 699, 493, 504, 748, 944, 858, 873, 638, 754, 255, 968, 869, 491, 478, 383, 910, 815, 917, 727, 870, 701, 931, 860, 499, 756, 731, 823, 922, 874, 976, 918, 502, 933, 743, 760, 881, 494, 702, 921, 876, 501, 847, 992, 447, 733, 827, 882, 934, 963, 505, 937, 747, 855, 924, 734, 829, 965, 938, 884, 506, 749, 945, 859, 755, 479, 966, 830, 888, 940, 750, 871, 970, 911, 757, 946, 969, 861, 977, 875, 919, 639, 758, 948, 862, 761, 508, 972, 923, 877, 952, 886, 935, 978, 762, 503, 883, 703, 993, 925, 878, 980, 941, 764, 495, 926, 885, 994, 735, 939, 984, 967, 889, 947, 831, 507, 942, 751, 973, 996, 890, 949, 759, 892, 971, 1000, 953, 509, 863, 981, 950, 974, 763, 1008, 979, 879, 954, 986, 995, 891, 927, 510, 765, 956, 997, 982, 887, 985, 943, 998, 1001, 766, 988, 951, 1004, 893, 1010, 957, 975, 511, 1002, 894, 983, 1009, 955, 987, 1012, 958, 999, 1005, 989, 1016, 990, 1011, 767, 1003, 1014, 1006, 1017, 895, 1013, 991, 1018, 959, 1020, 1015, 1007, 1019, 1021, 1022, 1023]

Table Q1, having a sequence length of 1024:

| Reliability or sequence number of reliability | Polarized channel sequence number |
|---|---|
| 1 | 1 |
| 2 | 4 |
| 3 | 8 |
| 4 | 2 |
| 5 | 16 |
| 6 | 32 |
| 7 | 6 |
| 8 | 64 |
| 9 | 512 |
| 10 | 3 |
| 11 | 12 |
| 12 | 5 |
| 13 | 18 |
| 14 | 128 |
| 15 | 9 |
| 16 | 33 |
| 17 | 17 |
| 18 | 10 |
| 19 | 256 |
| 20 | 20 |
| 21 | 34 |
| 22 | 24 |
| 23 | 65 |
| 24 | 7 |
| 25 | 36 |
| 26 | 66 |
| 27 | 129 |
| 28 | 11 |
| 29 | 40 |
| 30 | 19 |
| 31 | 132 |
| 32 | 513 |
| 33 | 13 |
| 34 | 68 |
| 35 | 48 |
| 36 | 14 |
| 37 | 72 |
| 38 | 257 |
| 39 | 21 |
| 40 | 130 |
| 41 | 26 |
| 42 | 35 |
| 43 | 80 |
| 44 | 258 |
| 45 | 136 |
| 46 | 38 |
| 47 | 22 |
| 48 | 260 |
| 49 | 516 |
| 50 | 37 |
| 51 | 25 |
| 52 | 96 |
| 53 | 67 |
| 54 | 264 |
| 55 | 41 |
| 56 | 144 |
| 57 | 28 |
| 58 | 69 |
| 59 | 49 |
| 60 | 74 |
| 61 | 160 |
| 62 | 42 |
| 63 | 520 |
| 64 | 272 |
| 65 | 192 |
| 66 | 70 |
| 67 | 44 |
| 68 | 131 |
| 69 | 81 |
| 70 | 15 |
| 71 | 288 |
| 72 | 50 |
| 73 | 134 |
| 74 | 73 |
| 75 | 514 |
| 76 | 23 |
| 77 | 52 |

-continued

| Table Q1, having a sequence length of 1024: | |
|---|---|
| Reliability or sequence number of reliability | Polarized channel sequence number |
| 78 | 320 |
| 79 | 133 |
| 80 | 76 |
| 81 | 82 |
| 82 | 137 |
| 83 | 56 |
| 84 | 27 |
| 85 | 259 |
| 86 | 528 |
| 87 | 97 |
| 88 | 39 |
| 89 | 384 |
| 90 | 138 |
| 91 | 84 |
| 92 | 29 |
| 93 | 261 |
| 94 | 145 |
| 95 | 544 |
| 96 | 43 |
| 97 | 98 |
| 98 | 140 |
| 99 | 30 |
| 100 | 88 |
| 101 | 262 |
| 102 | 146 |
| 103 | 71 |
| 104 | 518 |
| 105 | 265 |
| 106 | 161 |
| 107 | 45 |
| 108 | 100 |
| 109 | 148 |
| 110 | 51 |
| 111 | 46 |
| 112 | 576 |
| 113 | 75 |
| 114 | 266 |
| 115 | 104 |
| 116 | 273 |
| 117 | 164 |
| 118 | 193 |
| 119 | 53 |
| 120 | 515 |
| 121 | 162 |
| 122 | 268 |
| 123 | 77 |
| 124 | 152 |
| 125 | 274 |
| 126 | 54 |
| 127 | 524 |
| 128 | 83 |
| 129 | 57 |
| 130 | 112 |
| 131 | 85 |
| 132 | 135 |
| 133 | 289 |
| 134 | 517 |
| 135 | 194 |
| 136 | 78 |
| 137 | 290 |
| 138 | 58 |
| 139 | 276 |
| 140 | 168 |
| 141 | 530 |
| 142 | 99 |
| 143 | 139 |
| 144 | 196 |
| 145 | 86 |
| 146 | 176 |
| 147 | 640 |
| 148 | 60 |
| 149 | 89 |
| 150 | 280 |
| 151 | 101 |

-continued

| Table Q1, having a sequence length of 1024: | |
|---|---|
| Reliability or sequence number of reliability | Polarized channel sequence number |
| 152 | 147 |
| 153 | 292 |
| 154 | 521 |
| 155 | 141 |
| 156 | 321 |
| 157 | 142 |
| 158 | 90 |
| 159 | 200 |
| 160 | 545 |
| 161 | 31 |
| 162 | 102 |
| 163 | 263 |
| 164 | 105 |
| 165 | 529 |
| 166 | 322 |
| 167 | 149 |
| 168 | 296 |
| 169 | 47 |
| 170 | 522 |
| 171 | 92 |
| 172 | 208 |
| 173 | 267 |
| 174 | 385 |
| 175 | 324 |
| 176 | 304 |
| 177 | 536 |
| 178 | 768 |
| 179 | 532 |
| 180 | 163 |
| 181 | 153 |
| 182 | 150 |
| 183 | 106 |
| 184 | 55 |
| 185 | 165 |
| 186 | 386 |
| 187 | 577 |
| 188 | 328 |
| 189 | 548 |
| 190 | 269 |
| 191 | 113 |
| 192 | 154 |
| 193 | 79 |
| 194 | 224 |
| 195 | 166 |
| 196 | 275 |
| 197 | 108 |
| 198 | 578 |
| 199 | 270 |
| 200 | 59 |
| 201 | 114 |
| 202 | 195 |
| 203 | 169 |
| 204 | 156 |
| 205 | 87 |
| 206 | 546 |
| 207 | 61 |
| 208 | 277 |
| 209 | 291 |
| 210 | 519 |
| 211 | 278 |
| 212 | 116 |
| 213 | 170 |
| 214 | 197 |
| 215 | 641 |
| 216 | 177 |
| 217 | 281 |
| 218 | 91 |
| 219 | 552 |
| 220 | 201 |
| 221 | 388 |
| 222 | 293 |
| 223 | 198 |
| 224 | 523 |
| 225 | 62 |

-continued

| Table Q1, having a sequence length of 1024: | |
|---|---|
| Reliability or sequence number of reliability | Polarized channel sequence number |
| 226 | 143 |
| 227 | 336 |
| 228 | 584 |
| 229 | 172 |
| 230 | 282 |
| 231 | 120 |
| 232 | 644 |
| 233 | 103 |
| 234 | 178 |
| 235 | 294 |
| 236 | 531 |
| 237 | 202 |
| 238 | 93 |
| 239 | 323 |
| 240 | 560 |
| 241 | 392 |
| 242 | 297 |
| 243 | 151 |
| 244 | 580 |
| 245 | 209 |
| 246 | 284 |
| 247 | 180 |
| 248 | 525 |
| 249 | 107 |
| 250 | 94 |
| 251 | 204 |
| 252 | 769 |
| 253 | 298 |
| 254 | 352 |
| 255 | 325 |
| 256 | 526 |
| 257 | 155 |
| 258 | 109 |
| 259 | 533 |
| 260 | 400 |
| 261 | 305 |
| 262 | 300 |
| 263 | 642 |
| 264 | 210 |
| 265 | 184 |
| 266 | 326 |
| 267 | 538 |
| 268 | 115 |
| 269 | 167 |
| 270 | 592 |
| 271 | 157 |
| 272 | 225 |
| 273 | 306 |
| 274 | 547 |
| 275 | 329 |
| 276 | 110 |
| 277 | 770 |
| 278 | 212 |
| 279 | 117 |
| 280 | 171 |
| 281 | 550 |
| 282 | 330 |
| 283 | 226 |
| 284 | 648 |
| 285 | 387 |
| 286 | 308 |
| 287 | 158 |
| 288 | 608 |
| 289 | 416 |
| 290 | 337 |
| 291 | 534 |
| 292 | 216 |
| 293 | 271 |
| 294 | 549 |
| 295 | 118 |
| 296 | 279 |
| 297 | 537 |
| 298 | 332 |
| 299 | 389 |

-continued

| Table Q1, having a sequence length of 1024: | |
|---|---|
| Reliability or sequence number of reliability | Polarized channel sequence number |
| 300 | 173 |
| 301 | 579 |
| 302 | 121 |
| 303 | 199 |
| 304 | 776 |
| 305 | 179 |
| 306 | 228 |
| 307 | 553 |
| 308 | 338 |
| 309 | 656 |
| 310 | 312 |
| 311 | 540 |
| 312 | 390 |
| 313 | 174 |
| 314 | 581 |
| 315 | 393 |
| 316 | 283 |
| 317 | 772 |
| 318 | 122 |
| 319 | 672 |
| 320 | 554 |
| 321 | 784 |
| 322 | 63 |
| 323 | 340 |
| 324 | 704 |
| 325 | 448 |
| 326 | 561 |
| 327 | 353 |
| 328 | 800 |
| 329 | 394 |
| 330 | 232 |
| 331 | 203 |
| 332 | 527 |
| 333 | 582 |
| 334 | 556 |
| 335 | 295 |
| 336 | 285 |
| 337 | 181 |
| 338 | 124 |
| 339 | 205 |
| 340 | 240 |
| 341 | 643 |
| 342 | 585 |
| 343 | 562 |
| 344 | 286 |
| 345 | 299 |
| 346 | 354 |
| 347 | 182 |
| 348 | 401 |
| 349 | 211 |
| 350 | 396 |
| 351 | 344 |
| 352 | 586 |
| 353 | 832 |
| 354 | 564 |
| 355 | 95 |
| 356 | 185 |
| 357 | 206 |
| 358 | 327 |
| 359 | 645 |
| 360 | 535 |
| 361 | 402 |
| 362 | 593 |
| 363 | 186 |
| 364 | 356 |
| 365 | 588 |
| 366 | 568 |
| 367 | 307 |
| 368 | 646 |
| 369 | 418 |
| 370 | 213 |
| 371 | 301 |
| 372 | 227 |
| 373 | 302 |

-continued

Table Q1, having a sequence length of 1024:

| Reliability or sequence number of reliability | Polarized channel sequence number |
|---|---|
| 374 | 896 |
| 375 | 594 |
| 376 | 360 |
| 377 | 111 |
| 378 | 649 |
| 379 | 771 |
| 380 | 417 |
| 381 | 539 |
| 382 | 214 |
| 383 | 404 |
| 384 | 309 |
| 385 | 188 |
| 386 | 449 |
| 387 | 331 |
| 388 | 217 |
| 389 | 159 |
| 390 | 609 |
| 391 | 596 |
| 392 | 551 |
| 393 | 650 |
| 394 | 119 |
| 395 | 229 |
| 396 | 333 |
| 397 | 408 |
| 398 | 541 |
| 399 | 773 |
| 400 | 610 |
| 401 | 657 |
| 402 | 310 |
| 403 | 420 |
| 404 | 600 |
| 405 | 218 |
| 406 | 368 |
| 407 | 230 |
| 408 | 652 |
| 409 | 391 |
| 410 | 175 |
| 411 | 313 |
| 412 | 339 |
| 413 | 542 |
| 414 | 334 |
| 415 | 123 |
| 416 | 555 |
| 417 | 774 |
| 418 | 233 |
| 419 | 314 |
| 420 | 658 |
| 421 | 612 |
| 422 | 341 |
| 423 | 777 |
| 424 | 450 |
| 425 | 220 |
| 426 | 424 |
| 427 | 355 |
| 428 | 673 |
| 429 | 583 |
| 430 | 125 |
| 431 | 234 |
| 432 | 183 |
| 433 | 395 |
| 434 | 241 |
| 435 | 557 |
| 436 | 660 |
| 437 | 616 |
| 438 | 316 |
| 439 | 342 |
| 440 | 345 |
| 441 | 778 |
| 442 | 563 |
| 443 | 403 |
| 444 | 287 |
| 445 | 397 |
| 446 | 452 |
| 447 | 674 |

-continued

Table Q1, having a sequence length of 1024:

| Reliability or sequence number of reliability | Polarized channel sequence number |
|---|---|
| 448 | 558 |
| 449 | 785 |
| 450 | 432 |
| 451 | 187 |
| 452 | 357 |
| 453 | 207 |
| 454 | 664 |
| 455 | 587 |
| 456 | 780 |
| 457 | 705 |
| 458 | 676 |
| 459 | 236 |
| 460 | 346 |
| 461 | 565 |
| 462 | 361 |
| 463 | 126 |
| 464 | 242 |
| 465 | 589 |
| 466 | 405 |
| 467 | 215 |
| 468 | 398 |
| 469 | 566 |
| 470 | 303 |
| 471 | 597 |
| 472 | 358 |
| 473 | 801 |
| 474 | 419 |
| 475 | 624 |
| 476 | 456 |
| 477 | 786 |
| 478 | 348 |
| 479 | 244 |
| 480 | 569 |
| 481 | 189 |
| 482 | 590 |
| 483 | 219 |
| 484 | 647 |
| 485 | 311 |
| 486 | 706 |
| 487 | 362 |
| 488 | 595 |
| 489 | 464 |
| 490 | 802 |
| 491 | 406 |
| 492 | 680 |
| 493 | 421 |
| 494 | 788 |
| 495 | 248 |
| 496 | 598 |
| 497 | 190 |
| 498 | 570 |
| 499 | 369 |
| 500 | 651 |
| 501 | 409 |
| 502 | 834 |
| 503 | 410 |
| 504 | 708 |
| 505 | 480 |
| 506 | 613 |
| 507 | 231 |
| 508 | 572 |
| 509 | 315 |
| 510 | 659 |
| 511 | 364 |
| 512 | 422 |
| 513 | 335 |
| 514 | 688 |
| 515 | 370 |
| 516 | 792 |
| 517 | 221 |
| 518 | 611 |
| 519 | 451 |
| 520 | 601 |
| 521 | 425 |

-continued

Table Q1, having a sequence length of 1024:

| Reliability or sequence number of reliability | Polarized channel sequence number |
|---|---|
| 522 | 804 |
| 523 | 412 |
| 524 | 653 |
| 525 | 453 |
| 526 | 833 |
| 527 | 317 |
| 528 | 712 |
| 529 | 235 |
| 530 | 602 |
| 531 | 343 |
| 532 | 543 |
| 533 | 372 |
| 534 | 654 |
| 535 | 222 |
| 536 | 614 |
| 537 | 426 |
| 538 | 775 |
| 539 | 433 |
| 540 | 559 |
| 541 | 237 |
| 542 | 898 |
| 543 | 617 |
| 544 | 347 |
| 545 | 808 |
| 546 | 243 |
| 547 | 720 |
| 548 | 454 |
| 549 | 665 |
| 550 | 318 |
| 551 | 604 |
| 552 | 376 |
| 553 | 661 |
| 554 | 428 |
| 555 | 779 |
| 556 | 238 |
| 557 | 675 |
| 558 | 359 |
| 559 | 836 |
| 560 | 458 |
| 561 | 625 |
| 562 | 399 |
| 563 | 662 |
| 564 | 677 |
| 565 | 434 |
| 566 | 567 |
| 567 | 457 |
| 568 | 816 |
| 569 | 245 |
| 570 | 618 |
| 571 | 349 |
| 572 | 787 |
| 573 | 127 |
| 574 | 781 |
| 575 | 897 |
| 576 | 407 |
| 577 | 666 |
| 578 | 436 |
| 579 | 591 |
| 580 | 363 |
| 581 | 620 |
| 582 | 465 |
| 583 | 736 |
| 584 | 350 |
| 585 | 678 |
| 586 | 571 |
| 587 | 246 |
| 588 | 681 |
| 589 | 249 |
| 590 | 626 |
| 591 | 460 |
| 592 | 707 |
| 593 | 840 |
| 594 | 411 |
| 595 | 782 |

-continued

Table Q1, having a sequence length of 1024:

| Reliability or sequence number of reliability | Polarized channel sequence number |
|---|---|
| 596 | 365 |
| 597 | 789 |
| 598 | 440 |
| 599 | 599 |
| 600 | 374 |
| 601 | 668 |
| 602 | 628 |
| 603 | 423 |
| 604 | 900 |
| 605 | 466 |
| 606 | 848 |
| 607 | 803 |
| 608 | 250 |
| 609 | 790 |
| 610 | 371 |
| 611 | 709 |
| 612 | 191 |
| 613 | 573 |
| 614 | 689 |
| 615 | 481 |
| 616 | 682 |
| 617 | 413 |
| 618 | 603 |
| 619 | 793 |
| 620 | 366 |
| 621 | 713 |
| 622 | 468 |
| 623 | 710 |
| 624 | 373 |
| 625 | 574 |
| 626 | 655 |
| 627 | 427 |
| 628 | 806 |
| 629 | 414 |
| 630 | 684 |
| 631 | 904 |
| 632 | 252 |
| 633 | 615 |
| 634 | 482 |
| 635 | 632 |
| 636 | 805 |
| 637 | 429 |
| 638 | 794 |
| 639 | 864 |
| 640 | 223 |
| 641 | 690 |
| 642 | 455 |
| 643 | 714 |
| 644 | 835 |
| 645 | 472 |
| 646 | 809 |
| 647 | 377 |
| 648 | 605 |
| 649 | 619 |
| 650 | 435 |
| 651 | 663 |
| 652 | 721 |
| 653 | 319 |
| 654 | 796 |
| 655 | 484 |
| 656 | 692 |
| 657 | 912 |
| 658 | 430 |
| 659 | 606 |
| 660 | 716 |
| 661 | 488 |
| 662 | 810 |
| 663 | 459 |
| 664 | 838 |
| 665 | 667 |
| 666 | 239 |
| 667 | 817 |
| 668 | 621 |
| 669 | 378 |

-continued

Table Q1, having a sequence length of 1024:

| Reliability or sequence number of reliability | Polarized channel sequence number |
|---|---|
| 670 | 837 |
| 671 | 722 |
| 672 | 437 |
| 673 | 696 |
| 674 | 461 |
| 675 | 737 |
| 676 | 679 |
| 677 | 380 |
| 678 | 812 |
| 679 | 627 |
| 680 | 247 |
| 681 | 899 |
| 682 | 841 |
| 683 | 441 |
| 684 | 622 |
| 685 | 928 |
| 686 | 351 |
| 687 | 724 |
| 688 | 783 |
| 689 | 469 |
| 690 | 629 |
| 691 | 818 |
| 692 | 438 |
| 693 | 669 |
| 694 | 462 |
| 695 | 738 |
| 696 | 683 |
| 697 | 251 |
| 698 | 842 |
| 699 | 849 |
| 700 | 496 |
| 701 | 901 |
| 702 | 820 |
| 703 | 728 |
| 704 | 467 |
| 705 | 633 |
| 706 | 902 |
| 707 | 367 |
| 708 | 670 |
| 709 | 791 |
| 710 | 442 |
| 711 | 844 |
| 712 | 630 |
| 713 | 474 |
| 714 | 685 |
| 715 | 850 |
| 716 | 483 |
| 717 | 691 |
| 718 | 711 |
| 719 | 379 |
| 720 | 865 |
| 721 | 795 |
| 722 | 415 |
| 723 | 824 |
| 724 | 960 |
| 725 | 740 |
| 726 | 253 |
| 727 | 905 |
| 728 | 634 |
| 729 | 444 |
| 730 | 693 |
| 731 | 744 |
| 732 | 485 |
| 733 | 807 |
| 734 | 686 |
| 735 | 906 |
| 736 | 470 |
| 737 | 575 |
| 738 | 715 |
| 739 | 375 |
| 740 | 866 |
| 741 | 913 |
| 742 | 473 |
| 743 | 852 |

-continued

Table Q1, having a sequence length of 1024:

| Reliability or sequence number of reliability | Polarized channel sequence number |
|---|---|
| 744 | 636 |
| 745 | 797 |
| 746 | 431 |
| 747 | 694 |
| 748 | 811 |
| 749 | 486 |
| 750 | 752 |
| 751 | 723 |
| 752 | 798 |
| 753 | 489 |
| 754 | 856 |
| 755 | 908 |
| 756 | 254 |
| 757 | 717 |
| 758 | 607 |
| 759 | 930 |
| 760 | 476 |
| 761 | 697 |
| 762 | 725 |
| 763 | 914 |
| 764 | 439 |
| 765 | 819 |
| 766 | 839 |
| 767 | 868 |
| 768 | 492 |
| 769 | 718 |
| 770 | 698 |
| 771 | 381 |
| 772 | 813 |
| 773 | 623 |
| 774 | 814 |
| 775 | 498 |
| 776 | 872 |
| 777 | 739 |
| 778 | 929 |
| 779 | 671 |
| 780 | 916 |
| 781 | 821 |
| 782 | 463 |
| 783 | 726 |
| 784 | 961 |
| 785 | 843 |
| 786 | 490 |
| 787 | 631 |
| 788 | 729 |
| 789 | 700 |
| 790 | 382 |
| 791 | 741 |
| 792 | 845 |
| 793 | 920 |
| 794 | 471 |
| 795 | 822 |
| 796 | 851 |
| 797 | 730 |
| 798 | 497 |
| 799 | 880 |
| 800 | 742 |
| 801 | 443 |
| 802 | 903 |
| 803 | 687 |
| 804 | 825 |
| 805 | 500 |
| 806 | 445 |
| 807 | 932 |
| 808 | 846 |
| 809 | 635 |
| 810 | 745 |
| 811 | 826 |
| 812 | 732 |
| 813 | 446 |
| 814 | 962 |
| 815 | 936 |
| 816 | 475 |
| 817 | 853 |

-continued

Table Q1, having a sequence length of 1024:

| Reliability or sequence number of reliability | Polarized channel sequence number |
|---|---|
| 818 | 867 |
| 819 | 637 |
| 820 | 907 |
| 821 | 487 |
| 822 | 695 |
| 823 | 746 |
| 824 | 828 |
| 825 | 753 |
| 826 | 854 |
| 827 | 857 |
| 828 | 915 |
| 829 | 964 |
| 830 | 477 |
| 831 | 909 |
| 832 | 719 |
| 833 | 799 |
| 834 | 699 |
| 835 | 493 |
| 836 | 504 |
| 837 | 748 |
| 838 | 944 |
| 839 | 858 |
| 840 | 873 |
| 841 | 638 |
| 842 | 754 |
| 843 | 255 |
| 844 | 968 |
| 845 | 869 |
| 846 | 491 |
| 847 | 478 |
| 848 | 383 |
| 849 | 910 |
| 850 | 815 |
| 851 | 917 |
| 852 | 727 |
| 853 | 870 |
| 854 | 701 |
| 855 | 931 |
| 856 | 860 |
| 857 | 499 |
| 858 | 756 |
| 859 | 731 |
| 860 | 823 |
| 861 | 922 |
| 862 | 874 |
| 863 | 976 |
| 864 | 918 |
| 865 | 502 |
| 866 | 933 |
| 867 | 743 |
| 868 | 760 |
| 869 | 881 |
| 870 | 494 |
| 871 | 702 |
| 872 | 921 |
| 873 | 876 |
| 874 | 501 |
| 875 | 847 |
| 876 | 992 |
| 877 | 447 |
| 878 | 733 |
| 879 | 827 |
| 880 | 882 |
| 881 | 934 |
| 882 | 963 |
| 883 | 505 |
| 884 | 937 |
| 885 | 747 |
| 886 | 855 |
| 887 | 924 |
| 888 | 734 |
| 889 | 829 |
| 890 | 965 |
| 891 | 938 |

-continued

Table Q1, having a sequence length of 1024:

| Reliability or sequence number of reliability | Polarized channel sequence number |
|---|---|
| 892 | 884 |
| 893 | 506 |
| 894 | 749 |
| 895 | 945 |
| 896 | 859 |
| 897 | 755 |
| 898 | 479 |
| 899 | 966 |
| 900 | 830 |
| 901 | 888 |
| 902 | 940 |
| 903 | 750 |
| 904 | 871 |
| 905 | 970 |
| 906 | 911 |
| 907 | 757 |
| 908 | 946 |
| 909 | 969 |
| 910 | 861 |
| 911 | 977 |
| 912 | 875 |
| 913 | 919 |
| 914 | 639 |
| 915 | 758 |
| 916 | 948 |
| 917 | 862 |
| 918 | 761 |
| 919 | 508 |
| 920 | 972 |
| 921 | 923 |
| 922 | 877 |
| 923 | 952 |
| 924 | 886 |
| 925 | 935 |
| 926 | 978 |
| 927 | 762 |
| 928 | 503 |
| 929 | 883 |
| 930 | 703 |
| 931 | 993 |
| 932 | 925 |
| 933 | 878 |
| 934 | 980 |
| 935 | 941 |
| 936 | 764 |
| 937 | 495 |
| 938 | 926 |
| 939 | 885 |
| 940 | 994 |
| 941 | 735 |
| 942 | 939 |
| 943 | 984 |
| 944 | 967 |
| 945 | 889 |
| 946 | 947 |
| 947 | 831 |
| 948 | 507 |
| 949 | 942 |
| 950 | 751 |
| 951 | 973 |
| 952 | 996 |
| 953 | 890 |
| 954 | 949 |
| 955 | 759 |
| 956 | 892 |
| 957 | 971 |
| 958 | 1000 |
| 959 | 953 |
| 960 | 509 |
| 961 | 863 |
| 962 | 981 |
| 963 | 950 |
| 964 | 974 |
| 965 | 763 |

-continued

Table Q1, having a sequence length of 1024:

| Reliability or sequence number of reliability | Polarized channel sequence number |
|---|---|
| 966 | 1008 |
| 967 | 979 |
| 968 | 879 |
| 969 | 954 |
| 970 | 986 |
| 971 | 995 |
| 972 | 891 |
| 973 | 927 |
| 974 | 510 |
| 975 | 765 |
| 976 | 956 |
| 977 | 997 |
| 978 | 982 |
| 979 | 887 |
| 980 | 985 |
| 981 | 943 |
| 982 | 998 |
| 983 | 1001 |
| 984 | 766 |
| 985 | 988 |
| 986 | 951 |
| 987 | 1004 |
| 988 | 893 |
| 989 | 1010 |
| 990 | 957 |
| 991 | 975 |
| 992 | 511 |
| 993 | 1002 |
| 994 | 894 |
| 995 | 983 |
| 996 | 1009 |
| 997 | 955 |
| 998 | 987 |
| 999 | 1012 |
| 1000 | 958 |
| 1001 | 999 |
| 1002 | 1005 |
| 1003 | 989 |
| 1004 | 1016 |
| 1005 | 990 |
| 1006 | 1011 |
| 1007 | 767 |
| 1008 | 1003 |
| 1009 | 1014 |
| 1010 | 1006 |
| 1011 | 1017 |
| 1012 | 895 |
| 1013 | 1013 |
| 1014 | 991 |
| 1015 | 1018 |
| 1016 | 959 |
| 1017 | 1020 |
| 1018 | 1015 |
| 1019 | 1007 |
| 1020 | 1019 |
| 1021 | 1021 |
| 1022 | 1022 |
| 1023 | 1023 |

Sequence Q2, having a sequence length of 512:

[0, 1, 4, 8, 2, 16, 32, 6, 64, 3, 12, 5, 18, 128, 9, 33, 17, 10, 256, 20, 34, 24, 65, 7, 36, 66, 129, 11, 40, 19, 132, 13, 68, 48, 14, 72, 257, 21, 130, 26, 35, 80, 258, 136, 38, 22, 260, 37, 25, 96, 67, 264, 41, 144, 28, 69, 49, 74, 160, 42, 272, 192, 70, 44, 131, 81, 15, 288, 50, 134, 73, 23, 52, 320, 133, 76, 82, 137, 56, 27, 259, 97, 39, 384, 138, 84, 29, 261, 145, 43, 98, 140, 30, 88, 262, 146, 71, 265, 161, 45, 100, 148, 51, 46, 75, 266, 104, 273, 164, 193, 53, 162, 268, 77, 152, 274, 54, 83, 57, 112, 85, 135, 289, 194, 78, 290, 58, 276, 168, 99, 139, 196, 86, 176, 60, 89, 280, 101, 147, 292, 141, 321, 142, 90, 200, 31, 102, 263, 105, 322, 149, 296, 47, 92, 208, 267, 385, 324, 304, 163, 153, 150, 106, 55, 165, 386, 328, 269, 113, 154, 79, 224, 166, 275, 108, 270, 59, 114, 195, 169, 156, 87, 61, 277, 291, 278, 116, 170, 197, 177, 281, 91, 201, 388, 293, 198, 62, 143, 336, 172, 282, 120, 103, 178, 294, 202, 93, 323, 392, 297, 151, 209, 284, 180, 107, 94, 204, 298, 352, 325, 155, 109, 400, 305, 300, 210, 184, 326, 115, 167, 157, 225, 306, 329, 110, 212, 117, 171, 330, 226, 387, 308, 158, 416, 337, 216, 271, 118, 279, 332, 389, 173, 121, 199, 179, 228, 338, 312, 390, 174, 393, 283, 122, 63, 340, 448, 353, 394, 232, 203, 295, 285, 181, 124, 205, 240, 286, 299, 354, 182, 401, 211, 396, 344, 95, 185, 206, 327, 402, 186, 356, 307, 418, 213, 301, 227, 302, 360, 111, 417, 214, 404, 309, 188, 449, 331, 217, 159, 119, 229, 333, 408, 310, 420, 218, 368, 230, 391, 175, 313, 339, 334, 123, 233, 314, 341, 450, 220, 424, 355, 125, 234, 183, 395, 241, 316, 342, 345, 403, 287, 397, 452, 432, 187, 357, 207, 236, 346, 361, 126, 242, 405, 215, 398, 303, 358, 419, 456, 348, 244, 189, 219, 311, 362, 464, 406, 421, 248, 190, 369, 409, 410, 480, 231, 315, 364, 422, 335, 370, 221, 451, 425, 412, 453, 317, 235, 343, 372, 222, 426, 433, 237, 347, 243, 454, 318, 376, 428, 238, 359, 458, 399, 434, 457, 245, 349, 127, 407, 436, 363, 465, 350, 246, 249, 460, 411, 365, 440, 374, 423, 466, 250, 371, 191, 481, 413, 366, 468, 373, 427, 414, 252, 482, 429, 223, 455, 472, 377, 435, 319, 484, 430, 488, 459, 239, 378, 437, 461, 380, 247, 441, 351, 469, 438, 462, 251, 496, 467, 367, 442, 474, 483, 379, 415, 253, 444, 485, 470, 375, 473, 431, 486, 489, 254, 476, 439, 492, 381, 498, 463, 490, 382, 471, 497, 443, 500, 445, 446, 475, 487, 477, 493, 504, 255, 491, 478, 383, 499, 502, 494, 501, 447, 505, 506, 479, 508, 503, 495, 507, 509, 510, 511]

Table Q2, having a sequence length of 512:

| Reliability or sequence number of reliability | Polarized channel sequence number |
|---|---|
| 0 | 0 |
| 1 | 1 |
| 2 | 4 |
| 3 | 8 |
| 4 | 2 |
| 5 | 16 |
| 6 | 32 |
| 7 | 6 |
| 8 | 64 |
| 9 | 3 |
| 10 | 12 |
| 11 | 5 |
| 12 | 18 |
| 13 | 128 |
| 14 | 9 |
| 15 | 33 |
| 16 | 17 |
| 17 | 10 |
| 18 | 256 |
| 19 | 20 |
| 20 | 34 |
| 21 | 24 |
| 22 | 65 |
| 23 | 7 |
| 24 | 36 |
| 25 | 66 |
| 26 | 129 |
| 27 | 11 |
| 28 | 40 |
| 29 | 19 |
| 30 | 132 |
| 31 | 13 |
| 32 | 68 |
| 33 | 48 |
| 34 | 14 |
| 35 | 72 |
| 36 | 257 |
| 37 | 21 |

-continued

| Table Q2, having a sequence length of 512: | |
|---|---|
| Reliability or sequence number of reliability | Polarized channel sequence number |
| 38 | 130 |
| 39 | 26 |
| 40 | 35 |
| 41 | 80 |
| 42 | 258 |
| 43 | 136 |
| 44 | 38 |
| 45 | 22 |
| 46 | 260 |
| 47 | 37 |
| 48 | 25 |
| 49 | 96 |
| 50 | 67 |
| 51 | 264 |
| 52 | 41 |
| 53 | 144 |
| 54 | 28 |
| 55 | 69 |
| 56 | 49 |
| 57 | 74 |
| 58 | 160 |
| 59 | 42 |
| 60 | 272 |
| 61 | 192 |
| 62 | 70 |
| 63 | 44 |
| 64 | 131 |
| 65 | 81 |
| 66 | 15 |
| 67 | 288 |
| 68 | 50 |
| 69 | 134 |
| 70 | 73 |
| 71 | 23 |
| 72 | 52 |
| 73 | 320 |
| 74 | 133 |
| 75 | 76 |
| 76 | 82 |
| 77 | 137 |
| 78 | 56 |
| 79 | 27 |
| 80 | 259 |
| 81 | 97 |
| 82 | 39 |
| 83 | 384 |
| 84 | 138 |
| 85 | 84 |
| 86 | 29 |
| 87 | 261 |
| 88 | 145 |
| 89 | 43 |
| 90 | 98 |
| 91 | 140 |
| 92 | 30 |
| 93 | 88 |
| 94 | 262 |
| 95 | 146 |
| 96 | 71 |
| 97 | 265 |
| 98 | 161 |
| 99 | 45 |
| 100 | 100 |
| 101 | 148 |
| 102 | 51 |
| 103 | 46 |
| 104 | 75 |
| 105 | 266 |
| 106 | 104 |
| 107 | 273 |
| 108 | 164 |
| 109 | 193 |
| 110 | 53 |
| 111 | 162 |

-continued

| Table Q2, having a sequence length of 512: | |
|---|---|
| Reliability or sequence number of reliability | Polarized channel sequence number |
| 112 | 268 |
| 113 | 77 |
| 114 | 152 |
| 115 | 274 |
| 116 | 54 |
| 117 | 83 |
| 118 | 57 |
| 119 | 112 |
| 120 | 85 |
| 121 | 135 |
| 122 | 289 |
| 123 | 194 |
| 124 | 78 |
| 125 | 290 |
| 126 | 58 |
| 127 | 276 |
| 128 | 168 |
| 129 | 99 |
| 130 | 139 |
| 131 | 196 |
| 132 | 86 |
| 133 | 176 |
| 134 | 60 |
| 135 | 89 |
| 136 | 280 |
| 137 | 101 |
| 138 | 147 |
| 139 | 292 |
| 140 | 141 |
| 141 | 321 |
| 142 | 142 |
| 143 | 90 |
| 144 | 200 |
| 145 | 31 |
| 146 | 102 |
| 147 | 263 |
| 148 | 105 |
| 149 | 322 |
| 150 | 149 |
| 151 | 296 |
| 152 | 47 |
| 153 | 92 |
| 154 | 208 |
| 155 | 267 |
| 156 | 385 |
| 157 | 324 |
| 158 | 304 |
| 159 | 163 |
| 160 | 153 |
| 161 | 150 |
| 162 | 106 |
| 163 | 55 |
| 164 | 165 |
| 165 | 386 |
| 166 | 328 |
| 167 | 269 |
| 168 | 113 |
| 169 | 154 |
| 170 | 79 |
| 171 | 224 |
| 172 | 166 |
| 173 | 275 |
| 174 | 108 |
| 175 | 270 |
| 176 | 59 |
| 177 | 114 |
| 178 | 195 |
| 179 | 169 |
| 180 | 156 |
| 181 | 87 |
| 182 | 61 |
| 183 | 277 |
| 184 | 291 |
| 185 | 278 |

-continued

| Table Q2, having a sequence length of 512: | |
|---|---|
| Reliability or sequence number of reliability | Polarized channel sequence number |
| 186 | 116 |
| 187 | 170 |
| 188 | 197 |
| 189 | 177 |
| 190 | 281 |
| 191 | 91 |
| 192 | 201 |
| 193 | 388 |
| 194 | 293 |
| 195 | 198 |
| 196 | 62 |
| 197 | 143 |
| 198 | 336 |
| 199 | 172 |
| 200 | 282 |
| 201 | 120 |
| 202 | 103 |
| 203 | 178 |
| 204 | 294 |
| 205 | 202 |
| 206 | 93 |
| 207 | 323 |
| 208 | 392 |
| 209 | 297 |
| 210 | 151 |
| 211 | 209 |
| 212 | 284 |
| 213 | 180 |
| 214 | 107 |
| 215 | 94 |
| 216 | 204 |
| 217 | 298 |
| 218 | 352 |
| 219 | 325 |
| 220 | 155 |
| 221 | 109 |
| 222 | 400 |
| 223 | 305 |
| 224 | 300 |
| 225 | 210 |
| 226 | 184 |
| 227 | 326 |
| 228 | 115 |
| 229 | 167 |
| 230 | 157 |
| 231 | 225 |
| 232 | 306 |
| 233 | 329 |
| 234 | 110 |
| 235 | 212 |
| 236 | 117 |
| 237 | 171 |
| 238 | 330 |
| 239 | 226 |
| 240 | 387 |
| 241 | 308 |
| 242 | 158 |
| 243 | 416 |
| 244 | 337 |
| 245 | 216 |
| 246 | 271 |
| 247 | 118 |
| 248 | 279 |
| 249 | 332 |
| 250 | 389 |
| 251 | 173 |
| 252 | 121 |
| 253 | 199 |
| 254 | 179 |
| 255 | 228 |
| 256 | 338 |
| 257 | 312 |
| 258 | 390 |
| 259 | 174 |

-continued

| Table Q2, having a sequence length of 512: | |
|---|---|
| Reliability or sequence number of reliability | Polarized channel sequence number |
| 260 | 393 |
| 261 | 283 |
| 262 | 122 |
| 263 | 63 |
| 264 | 340 |
| 265 | 448 |
| 266 | 353 |
| 267 | 394 |
| 268 | 232 |
| 269 | 203 |
| 270 | 295 |
| 271 | 285 |
| 272 | 181 |
| 273 | 124 |
| 274 | 205 |
| 275 | 240 |
| 276 | 286 |
| 277 | 299 |
| 278 | 354 |
| 279 | 182 |
| 280 | 401 |
| 281 | 211 |
| 282 | 396 |
| 283 | 344 |
| 284 | 95 |
| 285 | 185 |
| 286 | 206 |
| 287 | 327 |
| 288 | 402 |
| 289 | 186 |
| 290 | 356 |
| 291 | 307 |
| 292 | 418 |
| 293 | 213 |
| 294 | 301 |
| 295 | 227 |
| 296 | 302 |
| 297 | 360 |
| 298 | 111 |
| 299 | 417 |
| 300 | 214 |
| 301 | 404 |
| 302 | 309 |
| 303 | 188 |
| 304 | 449 |
| 305 | 331 |
| 306 | 217 |
| 307 | 159 |
| 308 | 119 |
| 309 | 229 |
| 310 | 333 |
| 311 | 408 |
| 312 | 310 |
| 313 | 420 |
| 314 | 218 |
| 315 | 368 |
| 316 | 230 |
| 317 | 391 |
| 318 | 175 |
| 319 | 313 |
| 320 | 339 |
| 321 | 334 |
| 322 | 123 |
| 323 | 233 |
| 324 | 314 |
| 325 | 341 |
| 326 | 450 |
| 327 | 220 |
| 328 | 424 |
| 329 | 355 |
| 330 | 125 |
| 331 | 234 |
| 332 | 183 |
| 333 | 395 |

-continued

Table Q2, having a sequence length of 512:

| Reliability or sequence number of reliability | Polarized channel sequence number |
|---|---|
| 334 | 241 |
| 335 | 316 |
| 336 | 342 |
| 337 | 345 |
| 338 | 403 |
| 339 | 287 |
| 340 | 397 |
| 341 | 452 |
| 342 | 432 |
| 343 | 187 |
| 344 | 357 |
| 345 | 207 |
| 346 | 236 |
| 347 | 346 |
| 348 | 361 |
| 349 | 126 |
| 350 | 242 |
| 351 | 405 |
| 352 | 215 |
| 353 | 398 |
| 354 | 303 |
| 355 | 358 |
| 356 | 419 |
| 357 | 456 |
| 358 | 348 |
| 359 | 244 |
| 360 | 189 |
| 361 | 219 |
| 362 | 311 |
| 363 | 362 |
| 364 | 464 |
| 365 | 406 |
| 366 | 421 |
| 367 | 248 |
| 368 | 190 |
| 369 | 369 |
| 370 | 409 |
| 371 | 410 |
| 372 | 480 |
| 373 | 231 |
| 374 | 315 |
| 375 | 364 |
| 376 | 422 |
| 377 | 335 |
| 378 | 370 |
| 379 | 221 |
| 380 | 451 |
| 381 | 425 |
| 382 | 412 |
| 383 | 453 |
| 384 | 317 |
| 385 | 235 |
| 386 | 343 |
| 387 | 372 |
| 388 | 222 |
| 389 | 426 |
| 390 | 433 |
| 391 | 237 |
| 392 | 347 |
| 393 | 243 |
| 394 | 454 |
| 395 | 318 |
| 396 | 376 |
| 397 | 428 |
| 398 | 238 |
| 399 | 359 |
| 400 | 458 |
| 401 | 399 |
| 402 | 434 |
| 403 | 457 |
| 404 | 245 |
| 405 | 349 |
| 406 | 127 |
| 407 | 407 |

-continued

Table Q2, having a sequence length of 512:

| Reliability or sequence number of reliability | Polarized channel sequence number |
|---|---|
| 408 | 436 |
| 409 | 363 |
| 410 | 465 |
| 411 | 350 |
| 412 | 246 |
| 413 | 249 |
| 414 | 460 |
| 415 | 411 |
| 416 | 365 |
| 417 | 440 |
| 418 | 374 |
| 419 | 423 |
| 420 | 466 |
| 421 | 250 |
| 422 | 371 |
| 423 | 191 |
| 424 | 481 |
| 425 | 413 |
| 426 | 366 |
| 427 | 468 |
| 428 | 373 |
| 429 | 427 |
| 430 | 414 |
| 431 | 252 |
| 432 | 482 |
| 433 | 429 |
| 434 | 223 |
| 435 | 455 |
| 436 | 472 |
| 437 | 377 |
| 438 | 435 |
| 439 | 319 |
| 440 | 484 |
| 441 | 430 |
| 442 | 488 |
| 443 | 459 |
| 444 | 239 |
| 445 | 378 |
| 446 | 437 |
| 447 | 461 |
| 448 | 380 |
| 449 | 247 |
| 450 | 441 |
| 451 | 351 |
| 452 | 469 |
| 453 | 438 |
| 454 | 462 |
| 455 | 251 |
| 456 | 496 |
| 457 | 467 |
| 458 | 367 |
| 459 | 442 |
| 460 | 474 |
| 461 | 483 |
| 462 | 379 |
| 463 | 415 |
| 464 | 253 |
| 465 | 444 |
| 466 | 485 |
| 467 | 470 |
| 468 | 375 |
| 469 | 473 |
| 470 | 431 |
| 471 | 486 |
| 472 | 489 |
| 473 | 254 |
| 474 | 476 |
| 475 | 439 |
| 476 | 492 |
| 477 | 381 |
| 478 | 498 |
| 479 | 463 |
| 480 | 490 |
| 481 | 382 |

-continued

| Table Q2, having a sequence length of 512: | |
|---|---|
| Reliability or sequence number of reliability | Polarized channel sequence number |
| 482 | 471 |
| 483 | 497 |
| 484 | 443 |
| 485 | 500 |
| 486 | 445 |
| 487 | 446 |
| 488 | 475 |
| 489 | 487 |
| 490 | 477 |
| 491 | 493 |
| 492 | 504 |
| 493 | 255 |
| 494 | 491 |
| 495 | 478 |
| 496 | 383 |
| 497 | 499 |
| 498 | 502 |
| 499 | 494 |
| 500 | 501 |
| 501 | 447 |
| 502 | 505 |
| 503 | 506 |
| 504 | 479 |
| 505 | 508 |
| 506 | 503 |
| 507 | 495 |
| 508 | 507 |
| 509 | 509 |
| 510 | 510 |
| 511 | 511 |

Sequence Q3, having a sequence length of 256:

[0, 1, 4, 8, 2, 16, 32, 6, 64, 3, 12, 5, 18, 128, 9, 33, 17, 10, 20, 34, 24, 65, 7, 36, 66, 129, 11, 40, 19, 132, 13, 68, 48, 14, 72, 21, 130, 26, 35, 80, 136, 38, 22, 37, 25, 96, 67, 41, 144, 28, 69, 49, 74, 160, 42, 192, 70, 44, 131, 81, 15, 50, 134, 73, 23, 52, 133, 76, 82, 137, 56, 27, 97, 39, 138, 84, 29, 145, 43, 98, 140, 30, 88, 146, 71, 161, 45, 100, 148, 51, 46, 75, 104, 164, 193, 53, 162, 77, 152, 54, 83, 57, 112, 85, 135, 194, 78, 58, 168, 99, 139, 196, 86, 176, 60, 89, 101, 147, 141, 142, 90, 200, 31, 102, 105, 149, 47, 92, 208, 163, 153, 150, 106, 55, 165, 113, 154, 79, 224, 166, 108, 59, 114, 195, 169, 156, 87, 61, 116, 170, 197, 177, 91, 201, 198, 62, 143, 172, 120, 103, 178, 202, 93, 151, 209, 180, 107, 94, 204, 155, 109, 210, 184, 115, 167, 157, 225, 110, 212, 117, 171, 226, 158, 216, 118, 173, 121, 199, 179, 228, 174, 122, 63, 232, 203, 181, 124, 205, 240, 182, 211, 95, 185, 206, 186, 213, 227, 111, 214, 188, 217, 159, 119, 229, 218, 230, 175, 123, 233, 220, 125, 234, 183, 241, 187, 207, 236, 126, 242, 215, 244, 189, 219, 248, 190, 231, 221, 235, 222, 237, 243, 238, 245, 127, 246, 249, 250, 191, 252, 223, 239, 247, 251, 253, 254, 255]

| Table Q3, having a sequence length of 256: | |
|---|---|
| Reliability or sequence number of reliability | Polarized channel sequence number |
| 0 | 0 |
| 1 | 1 |
| 2 | 4 |
| 3 | 8 |
| 4 | 2 |
| 5 | 16 |
| 6 | 32 |

-continued

| Table Q3, having a sequence length of 256: | |
|---|---|
| Reliability or sequence number of reliability | Polarized channel sequence number |
| 7 | 6 |
| 8 | 64 |
| 9 | 3 |
| 10 | 12 |
| 11 | 5 |
| 12 | 18 |
| 13 | 128 |
| 14 | 9 |
| 15 | 33 |
| 16 | 17 |
| 17 | 10 |
| 18 | 20 |
| 19 | 34 |
| 20 | 24 |
| 21 | 65 |
| 22 | 7 |
| 23 | 36 |
| 24 | 66 |
| 25 | 129 |
| 26 | 11 |
| 27 | 40 |
| 28 | 19 |
| 29 | 132 |
| 30 | 13 |
| 31 | 68 |
| 32 | 48 |
| 33 | 14 |
| 34 | 72 |
| 35 | 21 |
| 36 | 130 |
| 37 | 26 |
| 38 | 35 |
| 39 | 80 |
| 40 | 136 |
| 41 | 38 |
| 42 | 22 |
| 43 | 37 |
| 44 | 25 |
| 45 | 96 |
| 46 | 67 |
| 47 | 41 |
| 48 | 144 |
| 49 | 28 |
| 50 | 69 |
| 51 | 49 |
| 52 | 74 |
| 53 | 160 |
| 54 | 42 |
| 55 | 192 |
| 56 | 70 |
| 57 | 44 |
| 58 | 131 |
| 59 | 81 |
| 60 | 15 |
| 61 | 50 |
| 62 | 134 |
| 63 | 73 |
| 64 | 23 |
| 65 | 52 |
| 66 | 133 |
| 67 | 76 |
| 68 | 82 |
| 69 | 137 |
| 70 | 56 |
| 71 | 27 |
| 72 | 97 |
| 73 | 39 |
| 74 | 138 |
| 75 | 84 |
| 76 | 29 |
| 77 | 145 |
| 78 | 43 |

-continued

Table Q3, having a sequence length of 256:

| Reliability or sequence number of reliability | Polarized channel sequence number |
|---|---|
| 79 | 98 |
| 80 | 140 |
| 81 | 30 |
| 82 | 88 |
| 83 | 146 |
| 84 | 71 |
| 85 | 161 |
| 86 | 45 |
| 87 | 100 |
| 88 | 148 |
| 89 | 51 |
| 90 | 46 |
| 91 | 75 |
| 92 | 104 |
| 93 | 164 |
| 94 | 193 |
| 95 | 53 |
| 96 | 162 |
| 97 | 77 |
| 98 | 152 |
| 99 | 54 |
| 100 | 83 |
| 101 | 57 |
| 102 | 112 |
| 103 | 85 |
| 104 | 135 |
| 105 | 194 |
| 106 | 78 |
| 107 | 58 |
| 108 | 168 |
| 109 | 99 |
| 110 | 139 |
| 111 | 196 |
| 112 | 86 |
| 113 | 176 |
| 114 | 60 |
| 115 | 89 |
| 116 | 101 |
| 117 | 147 |
| 118 | 141 |
| 119 | 142 |
| 120 | 90 |
| 121 | 200 |
| 122 | 31 |
| 123 | 102 |
| 124 | 105 |
| 125 | 149 |
| 126 | 47 |
| 127 | 92 |
| 128 | 208 |
| 129 | 163 |
| 130 | 153 |
| 131 | 150 |
| 132 | 106 |
| 133 | 55 |
| 134 | 165 |
| 135 | 113 |
| 136 | 154 |
| 137 | 79 |
| 138 | 224 |
| 139 | 166 |
| 140 | 108 |
| 141 | 59 |
| 142 | 114 |
| 143 | 195 |
| 144 | 169 |
| 145 | 156 |
| 146 | 87 |
| 147 | 61 |
| 148 | 116 |
| 149 | 170 |
| 150 | 197 |

-continued

Table Q3, having a sequence length of 256:

| Reliability or sequence number of reliability | Polarized channel sequence number |
|---|---|
| 151 | 177 |
| 152 | 91 |
| 153 | 201 |
| 154 | 198 |
| 155 | 62 |
| 156 | 143 |
| 157 | 172 |
| 158 | 120 |
| 159 | 103 |
| 160 | 178 |
| 161 | 202 |
| 162 | 93 |
| 163 | 151 |
| 164 | 209 |
| 165 | 180 |
| 166 | 107 |
| 167 | 94 |
| 168 | 204 |
| 169 | 155 |
| 170 | 109 |
| 171 | 210 |
| 172 | 184 |
| 173 | 115 |
| 174 | 167 |
| 175 | 157 |
| 176 | 225 |
| 177 | 110 |
| 178 | 212 |
| 179 | 117 |
| 180 | 171 |
| 181 | 226 |
| 182 | 158 |
| 183 | 216 |
| 184 | 118 |
| 185 | 173 |
| 186 | 121 |
| 187 | 199 |
| 188 | 179 |
| 189 | 228 |
| 190 | 174 |
| 191 | 122 |
| 192 | 63 |
| 193 | 232 |
| 194 | 203 |
| 195 | 181 |
| 196 | 124 |
| 197 | 205 |
| 198 | 240 |
| 199 | 182 |
| 200 | 211 |
| 201 | 95 |
| 202 | 185 |
| 203 | 206 |
| 204 | 186 |
| 205 | 213 |
| 206 | 227 |
| 207 | 111 |
| 208 | 214 |
| 209 | 188 |
| 210 | 217 |
| 211 | 159 |
| 212 | 119 |
| 213 | 229 |
| 214 | 218 |
| 215 | 230 |
| 216 | 175 |
| 217 | 123 |
| 218 | 233 |
| 219 | 220 |
| 220 | 125 |
| 221 | 234 |
| 222 | 183 |

-continued

Table Q3, having a sequence length of 256:

| Reliability or sequence number of reliability | Polarized channel sequence number |
|---|---|
| 223 | 241 |
| 224 | 187 |
| 225 | 207 |
| 226 | 236 |
| 227 | 126 |
| 228 | 242 |
| 229 | 215 |
| 230 | 244 |
| 231 | 189 |
| 232 | 219 |
| 233 | 248 |
| 234 | 190 |
| 235 | 231 |
| 236 | 221 |
| 237 | 235 |
| 238 | 222 |
| 239 | 237 |
| 240 | 243 |
| 241 | 238 |
| 242 | 245 |
| 243 | 127 |
| 244 | 246 |
| 245 | 249 |
| 246 | 250 |
| 247 | 191 |
| 248 | 252 |
| 249 | 223 |
| 250 | 239 |
| 251 | 247 |
| 252 | 251 |
| 253 | 253 |
| 254 | 254 |
| 255 | 255 |

Sequence Q4, having a sequence length of 128:

[0, 1, 4, 8, 2, 16, 32, 6, 64, 3, 12, 5, 18, 9, 33, 17, 10, 20, 34, 24, 65, 7, 36, 66, 11, 40, 19, 13, 68, 48, 14, 72, 21, 26, 35, 80, 38, 22, 37, 25, 96, 67, 41, 28, 69, 49, 74, 42, 70, 44, 81, 15, 50, 73, 23, 52, 76, 82, 56, 27, 97, 39, 84, 29, 43, 98, 30, 88, 71, 45, 100, 51, 46, 75, 104, 53, 77, 54, 83, 57, 112, 85, 78, 58, 99, 86, 60, 89, 101, 90, 31, 102, 105, 47, 92, 106, 55, 113, 79, 108, 59, 114, 87, 61, 116, 91, 62, 120, 103, 93, 107, 94, 109, 115, 110, 117, 118, 121, 122, 63, 124, 95, 111, 119, 123, 125,

Table Q4, having a sequence length of 128:

| Reliability or sequence number of reliability | Polarized channel sequence number |
|---|---|
| 0 | 0 |
| 1 | 1 |
| 2 | 4 |
| 3 | 8 |
| 4 | 2 |
| 5 | 16 |
| 6 | 32 |
| 7 | 6 |
| 8 | 64 |
| 9 | 3 |
| 10 | 12 |
| 11 | 5 |
| 12 | 18 |
| 13 | 9 |
| 14 | 33 |
| 15 | 17 |
| 16 | 10 |
| 17 | 20 |
| 18 | 34 |
| 19 | 24 |
| 20 | 65 |
| 21 | 7 |
| 22 | 36 |
| 23 | 66 |
| 24 | 11 |
| 25 | 40 |
| 26 | 19 |
| 27 | 13 |
| 28 | 68 |
| 29 | 48 |
| 30 | 14 |
| 31 | 72 |
| 32 | 21 |
| 33 | 26 |
| 34 | 35 |
| 35 | 80 |
| 36 | 38 |
| 37 | 22 |
| 38 | 37 |
| 39 | 25 |
| 40 | 96 |
| 41 | 67 |
| 42 | 41 |
| 43 | 28 |
| 44 | 69 |
| 45 | 49 |
| 46 | 74 |
| 47 | 42 |
| 48 | 70 |
| 49 | 44 |
| 50 | 81 |
| 51 | 15 |
| 52 | 50 |
| 53 | 73 |
| 54 | 23 |
| 55 | 52 |
| 56 | 76 |
| 57 | 82 |
| 58 | 56 |
| 59 | 27 |
| 60 | 97 |
| 61 | 39 |
| 62 | 84 |
| 63 | 29 |
| 64 | 43 |
| 65 | 98 |
| 66 | 30 |
| 67 | 88 |
| 68 | 71 |
| 69 | 45 |
| 70 | 100 |
| 71 | 51 |
| 72 | 46 |
| 73 | 75 |
| 74 | 104 |
| 75 | 53 |
| 76 | 77 |
| 77 | 54 |
| 78 | 83 |
| 79 | 57 |
| 80 | 112 |
| 81 | 85 |
| 82 | 78 |
| 83 | 58 |
| 84 | 99 |
| 85 | 86 |
| 86 | 60 |
| 87 | 89 |

-continued

| Table Q4, having a sequence length of 128: | |
|---|---|
| Reliability or sequence number of reliability | Polarized channel sequence number |
| 88 | 101 |
| 89 | 90 |
| 90 | 31 |
| 91 | 102 |
| 92 | 105 |
| 93 | 47 |
| 94 | 92 |
| 95 | 106 |
| 96 | 55 |
| 97 | 113 |
| 98 | 79 |
| 99 | 108 |
| 100 | 59 |
| 101 | 114 |
| 102 | 87 |
| 103 | 61 |
| 104 | 116 |
| 105 | 91 |
| 106 | 62 |
| 107 | 120 |
| 108 | 103 |
| 109 | 93 |
| 110 | 107 |
| 111 | 94 |
| 112 | 109 |
| 113 | 115 |
| 114 | 110 |
| 115 | 117 |
| 116 | 118 |
| 117 | 121 |
| 118 | 122 |
| 119 | 63 |
| 120 | 124 |
| 121 | 95 |
| 122 | 111 |
| 123 | 119 |
| 124 | 123 |
| 125 | 125 |
| 126 | 126 |
| 127 | 127 |

Sequence Q5, having a sequence length of 64:

[0, 1, 4, 8, 2, 16, 32, 6, 3, 12, 5, 18, 9, 33, 17, 10, 20, 34, 24, 7, 36, 11, 40, 19, 13, 48, 14, 21, 26, 35, 38, 22, 37, 25, 41, 28, 49, 42, 44, 15, 50, 23, 52, 56, 27, 39, 29, 43, 30, 45, 51, 46, 53, 54, 57, 58, 60, 31, 47, 55, 59, 61, 62, 63]

| Table Q5, having a sequence length of 64: | |
|---|---|
| Reliability or sequence number of relability | Polarized channel sequence number |
| 0 | 0 |
| 1 | 1 |
| 2 | 4 |
| 3 | 8 |
| 4 | 2 |
| 5 | 16 |
| 6 | 32 |
| 7 | 6 |
| 8 | 3 |
| 9 | 12 |
| 10 | 5 |
| 11 | 18 |
| 12 | 9 |
| 13 | 33 |
| 14 | 17 |
| 15 | 10 |
| 16 | 20 |
| 17 | 34 |
| 18 | 24 |
| 19 | 7 |
| 20 | 36 |
| 21 | 11 |
| 22 | 40 |
| 23 | 19 |
| 24 | 13 |
| 25 | 48 |
| 26 | 14 |
| 27 | 21 |
| 28 | 26 |
| 29 | 35 |
| 30 | 38 |
| 31 | 22 |
| 32 | 37 |
| 33 | 25 |
| 34 | 41 |
| 35 | 28 |
| 36 | 49 |
| 37 | 42 |
| 38 | 44 |
| 39 | 15 |
| 40 | 50 |
| 41 | 23 |
| 42 | 52 |
| 43 | 56 |
| 44 | 27 |
| 45 | 39 |
| 46 | 29 |
| 47 | 43 |
| 48 | 30 |
| 49 | 45 |
| 50 | 51 |
| 51 | 46 |
| 52 | 53 |
| 53 | 54 |
| 54 | 57 |
| 55 | 58 |
| 56 | 60 |
| 57 | 31 |
| 58 | 47 |
| 59 | 55 |
| 60 | 59 |
| 61 | 61 |
| 62 | 62 |
| 63 | 63 |

Sequence Z1, having a sequence length of 1024:

[0, 1, 4, 10, 2, 12, 7, 24, 3, 15, 18, 28, 11, 33, 36, 70, 5, 17, 13, 30, 20, 39, 47, 76, 22, 51, 41, 84, 57, 92, 99, 161, 6, 16, 21, 42, 25, 50, 46, 88, 29, 55, 62, 96, 67, 107, 111, 169, 35, 59, 72, 110, 77, 119, 126, 184, 83, 129, 138, 200, 148, 207, 225, 322, 8, 23, 26, 53, 34, 58, 66, 103, 37, 74, 60, 113, 80, 123, 136, 193, 43, 69, 81, 128, 91, 131, 145, 205, 100, 149, 158, 218, 171, 238, 250, 355, 52, 87, 97, 142, 108, 151, 162, 233, 115, 164, 183, 249, 197, 258, 276, 377, 130, 191, 201, 268, 212,279, 295, 394, 231, 302, 318, 415, 338, 430, 463, 573, 14, 27, 40, 68, 31, 79, 73, 132, 45, 82, 90, 143, 98, 155, 157, 226, 56, 94, 102, 152, 109, 167, 182, 243, 124, 181, 192, 257, 204, 271, 287, 389, 61, 106, 121, 180, 117, 185, 195, 269, 140, 203, 213, 280, 229, 300, 313, 410, 146, 216, 234, 305, 247, 337, 347, 432, 265, 356, 363, 451, 385, 481, 497, 612, 65, 118, 135, 202, 144, 214, 223, 303, 159, 220, 237, 331, 251, 339, 357, 453, 172, 245, 264, 349, 278, 370, 382, 467, 292, 388, 405, 483, 425, 517, 535, 640, 194, 272, 283, 372, 306, 395, 407, 507, 330, 418, 431, 529, 459, 541, 556, 666, 340, 434, 464, 546, 479, 569, 587, 680, 495, 589, 608, 697, 632, 726, 756, 843, 19, 38, 44, 85, 48, 93, 101, 163, 54, 105, 114, 173, 122, 190, 199, 293, 64, 116, 125, 196, 139, 208, 211, 296, 150, 217, 230, 316, 246, 336, 344, 444, 71, 133, 137, 209, 153, 222, 235, 335, 168, 242, 253, 345, 262, 371, 373, 470, 176, 261, 273, 367, 286, 384, 402, 485, 310, 411, 419, 509, 438, 527, 550, 653, 78, 156, 166, 239, 175, 255, 266, 358, 188, 275, 282, 387, 298, 396, 414, 513, 227, 290, 308, 412, 323, 422, 439, 531, 351, 440, 460, 544, 478, 571, 584, 686, 254, 327, 346, 427, 364, 452, 472, 558, 376, 462, 487, 580, 511, 596, 620, 707, 406, 499, 515, 610, 533, 624, 600, 739, 552, 647, 669, 719, 677, 771, 790, 848, 89, 174, 186, 285, 221, 299, 312, 409, 241, 315, 329, 433, 350, 445, 468, 562, 260, 348, 361, 443, 383, 466, 491, 576, 397, 501, 503, 594, 523, 617, 629, 722, 289, 380, 369, 474, 403, 493, 512, 603, 426, 521, 537, 627, 554, 637, 658, 746, 450, 539, 565, 650, 578, 672, 692, 764, 598, 683, 710, 801, 729, 806, 813, 877, 325, 386, 424, 519, 446, 525, 548, 642, 476, 567, 560, 663, 591, 674, 694, 782, 489, 582, 605, 704, 622, 689, 736, 794, 645, 742, 713, 816, 760, 830, 847, 898, 505, 615, 634, 716, 655, 732, 749, 821, 661, 753, 786, 846, 768, 835, 870, 937, 700, 798, 775, 857, 805, 874, 865, 928, 836, 883, 893, 948, 919, 960, 974, 992, 9, 32, 75, 120, 49, 134, 104, 210, 63, 154, 170, 224, 127, 248, 256, 332, 86, 165, 141, 236, 179, 259, 291, 360, 177, 297, 267, 381, 311, 398, 413, 532, 95, 160, 206, 274, 189, 294, 281, 392, 219, 307, 320, 416, 334, 435, 448, 540, 240, 326, 343, 442, 354, 461, 469, 566, 366, 480, 498, 586, 508, 613, 625, 737, 112, 187, 198, 301, 244, 314, 333, 429, 228, 342, 352, 455, 365, 465, 482, 579, 270, 362, 375, 488, 391, 471, 496, 599, 404, 520, 530, 618, 551, 648, 659, 758, 288, 390, 400, 518, 421, 506, 536, 633, 437, 543, 570, 649, 581, 668, 684, 773, 475, 561, 590, 679, 602, 690, 712, 787, 635, 705, 728, 809, 744, 819, 841, 914, 147, 215, 263, 341, 232, 359, 368, 484, 284, 378, 393, 500, 408, 524, 534, 626, 309, 401, 420, 510, 436, 553, 563, 651, 454, 549, 577, 665, 601, 693, 708, 779, 319, 428, 447, 557, 458, 564, 585, 676, 492, 588, 616, 696, 630, 714, 734, 803, 514, 614, 641, 717, 656, 730, 747, 822, 673, 761, 770, 834, 789, 854, 871, 930, 324, 457, 486, 592, 504, 611, 623, 718, 528, 621, 643, 738, 660, 757, 769, 832, 547, 652, 671, 751, 687, 762, 783, 852, 703, 788, 797, 859, 812, 878, 888, 941, 583, 675, 695, 777, 725, 791, 800, 867, 731, 810, 823, 885, 837, 894, 903, 950, 750, 825, 842, 897, 858, 907, 915, 955, 868, 918, 927, 965, 936, 975, 984, 1007, 178, 252, 277, 379, 317, 399, 417, 538, 304, 423, 441, 555, 456, 574, 595, 688, 321, 449, 477, 572, 494, 597, 609, 709, 516, 619, 638, 721, 654, 745, 752, 833, 328, 473, 490, 607, 522, 636, 628, 733, 545, 646, 662, 748, 678, 772, 774, 850, 568, 667, 691, 765, 702, 781, 795, 860, 723, 804, 811, 879, 824, 889, 900, 947, 353, 526, 502, 644, 559, 670, 664, 766, 593, 682, 698, 785, 711, 792, 808, 875, 606, 699, 715, 796, 743, 817, 826, 886, 754, 827, 839, 896, 856, 910, 917, 961, 639, 720, 740, 818, 767, 845, 853, 904, 776, 840, 862, 912, 873, 922, 933, 968, 799, 869, 880, 929, 892, 939, 924, 979, 901, 945, 953, 972, 956, 988, 994, 1012, 374, 575, 542, 681, 604, 701, 706, 802, 631, 727, 735, 820, 755, 831, 849, 906, 657, 741, 763, 828, 780, 851, 864, 913, 793, 872, 861, 921, 887, 932, 938, 973, 685, 778, 759, 855, 807, 866, 881, 925, 815, 884, 891, 942, 902, 935, 949, 981, 838, 895, 908, 946, 916, 954, 963, 986, 923, 959, 969, 997, 976, 990, 1000, 1016, 724, 784, 814, 882, 829, 890, 899, 944, 844, 909, 905, 957, 920, 951, 964, 991, 863, 911, 926, 967, 934, 962, 978, 995, 943, 980, 970, 998, 985, 1003, 1005, 1014, 876, 931, 940, 971, 952, 977, 982, 1001, 958, 983, 993, 1008, 987, 1002, 1010, 1019, 966, 996, 989, 1006, 999, 1013, 1009, 1018, 1004, 1011, 1015, 1020, 1017, 1021, 1022,

Table Z1, having a sequence length of 1024:

| Polarized channel sequence number | Reliability or sequence number of reliability |
|---|---|
| 0 | 0 |
| 1 | 1 |
| 2 | 4 |
| 3 | 10 |
| 4 | 2 |
| 5 | 12 |
| 6 | 7 |
| 7 | 24 |
| 8 | 3 |
| 9 | 15 |
| 10 | 18 |
| 11 | 28 |
| 12 | 11 |
| 13 | 33 |
| 14 | 36 |
| 15 | 70 |
| 16 | 5 |
| 17 | 17 |
| 18 | 13 |
| 19 | 30 |
| 20 | 20 |
| 21 | 39 |
| 22 | 47 |
| 23 | 76 |
| 24 | 22 |
| 25 | 51 |
| 26 | 41 |
| 27 | 84 |
| 28 | 57 |
| 29 | 92 |
| 30 | 99 |
| 31 | 161 |
| 32 | 6 |
| 33 | 16 |
| 34 | 21 |
| 35 | 42 |
| 36 | 25 |
| 37 | 50 |
| 38 | 46 |
| 39 | 88 |
| 40 | 29 |
| 41 | 55 |
| 42 | 62 |
| 43 | 96 |
| 44 | 67 |
| 45 | 107 |
| 46 | 111 |
| 47 | 169 |
| 48 | 35 |
| 49 | 59 |
| 50 | 72 |
| 51 | 110 |
| 52 | 77 |
| 53 | 119 |
| 54 | 126 |
| 55 | 184 |
| 56 | 83 |
| 57 | 129 |
| 58 | 138 |
| 59 | 200 |
| 60 | 148 |
| 61 | 207 |
| 62 | 225 |
| 63 | 322 |
| 64 | 8 |
| 65 | 23 |
| 66 | 26 |
| 67 | 53 |
| 68 | 34 |
| 69 | 58 |
| 70 | 66 |
| 71 | 103 |
| 72 | 37 |
| 73 | 74 |
| 74 | 60 |
| 75 | 113 |

-continued

| Table Z1, having a sequence length of 1024: | |
|---|---|
| Polarized channel sequence number | Reliability or sequence number of reliability |
| 76 | 80 |
| 77 | 123 |
| 78 | 136 |
| 79 | 193 |
| 80 | 43 |
| 81 | 69 |
| 82 | 81 |
| 83 | 128 |
| 84 | 91 |
| 85 | 131 |
| 86 | 145 |
| 87 | 205 |
| 88 | 100 |
| 89 | 149 |
| 90 | 158 |
| 91 | 218 |
| 92 | 171 |
| 93 | 238 |
| 94 | 250 |
| 95 | 355 |
| 96 | 52 |
| 97 | 87 |
| 98 | 97 |
| 99 | 142 |
| 100 | 108 |
| 101 | 151 |
| 102 | 162 |
| 103 | 233 |
| 104 | 115 |
| 105 | 164 |
| 106 | 183 |
| 107 | 249 |
| 108 | 197 |
| 109 | 258 |
| 110 | 276 |
| 111 | 377 |
| 112 | 130 |
| 113 | 191 |
| 114 | 201 |
| 115 | 268 |
| 116 | 212 |
| 117 | 279 |
| 118 | 295 |
| 119 | 394 |
| 120 | 231 |
| 121 | 302 |
| 122 | 318 |
| 123 | 415 |
| 124 | 338 |
| 125 | 430 |
| 126 | 463 |
| 127 | 573 |
| 128 | 14 |
| 129 | 27 |
| 130 | 40 |
| 131 | 68 |
| 132 | 31 |
| 133 | 79 |
| 134 | 73 |
| 135 | 132 |
| 136 | 45 |
| 137 | 82 |
| 138 | 90 |
| 139 | 143 |
| 140 | 98 |
| 141 | 155 |
| 142 | 157 |
| 143 | 226 |
| 144 | 56 |
| 145 | 94 |
| 146 | 102 |
| 147 | 152 |
| 148 | 109 |
| 149 | 167 |

-continued

| Table Z1, having a sequence length of 1024: | |
|---|---|
| Polarized channel sequence number | Reliability or sequence number of reliability |
| 150 | 182 |
| 151 | 243 |
| 152 | 124 |
| 153 | 181 |
| 154 | 192 |
| 155 | 257 |
| 156 | 204 |
| 157 | 271 |
| 158 | 287 |
| 159 | 389 |
| 160 | 61 |
| 161 | 106 |
| 162 | 121 |
| 163 | 180 |
| 164 | 117 |
| 165 | 185 |
| 166 | 195 |
| 167 | 269 |
| 168 | 140 |
| 169 | 203 |
| 170 | 213 |
| 171 | 280 |
| 172 | 229 |
| 173 | 300 |
| 174 | 313 |
| 175 | 410 |
| 176 | 146 |
| 177 | 216 |
| 178 | 234 |
| 179 | 305 |
| 180 | 247 |
| 181 | 337 |
| 182 | 347 |
| 183 | 432 |
| 184 | 265 |
| 185 | 356 |
| 186 | 363 |
| 187 | 451 |
| 188 | 385 |
| 189 | 481 |
| 190 | 497 |
| 191 | 612 |
| 192 | 65 |
| 193 | 118 |
| 194 | 135 |
| 195 | 202 |
| 196 | 144 |
| 197 | 214 |
| 198 | 223 |
| 199 | 303 |
| 200 | 159 |
| 201 | 220 |
| 202 | 237 |
| 203 | 331 |
| 204 | 251 |
| 205 | 339 |
| 206 | 357 |
| 207 | 453 |
| 208 | 172 |
| 209 | 245 |
| 210 | 264 |
| 211 | 349 |
| 212 | 278 |
| 213 | 370 |
| 214 | 382 |
| 215 | 467 |
| 216 | 292 |
| 217 | 388 |
| 218 | 405 |
| 219 | 483 |
| 220 | 425 |
| 221 | 517 |
| 222 | 535 |
| 223 | 640 |

-continued

Table Z1, having a sequence length of 1024:

| Polarized channel sequence number | Reliability or sequence number of reliability |
|---|---|
| 224 | 194 |
| 225 | 272 |
| 226 | 283 |
| 227 | 372 |
| 228 | 306 |
| 229 | 395 |
| 230 | 407 |
| 231 | 507 |
| 232 | 330 |
| 233 | 418 |
| 234 | 431 |
| 235 | 529 |
| 236 | 459 |
| 237 | 541 |
| 238 | 556 |
| 239 | 666 |
| 240 | 340 |
| 241 | 434 |
| 242 | 464 |
| 243 | 546 |
| 244 | 479 |
| 245 | 569 |
| 246 | 587 |
| 247 | 680 |
| 248 | 495 |
| 249 | 589 |
| 250 | 608 |
| 251 | 697 |
| 252 | 632 |
| 253 | 726 |
| 254 | 756 |
| 255 | 843 |
| 256 | 19 |
| 257 | 38 |
| 258 | 44 |
| 259 | 85 |
| 260 | 48 |
| 261 | 93 |
| 262 | 101 |
| 263 | 163 |
| 264 | 54 |
| 265 | 105 |
| 266 | 114 |
| 267 | 173 |
| 268 | 122 |
| 269 | 190 |
| 270 | 199 |
| 271 | 293 |
| 272 | 64 |
| 273 | 116 |
| 274 | 125 |
| 275 | 196 |
| 276 | 139 |
| 277 | 208 |
| 278 | 211 |
| 279 | 296 |
| 280 | 150 |
| 281 | 217 |
| 282 | 230 |
| 283 | 316 |
| 284 | 246 |
| 285 | 336 |
| 286 | 344 |
| 287 | 444 |
| 288 | 71 |
| 289 | 133 |
| 290 | 137 |
| 291 | 209 |
| 292 | 153 |
| 293 | 222 |
| 294 | 235 |
| 295 | 335 |
| 296 | 168 |
| 297 | 242 |
| 298 | 253 |
| 299 | 345 |
| 300 | 262 |
| 301 | 371 |
| 302 | 373 |
| 303 | 470 |
| 304 | 176 |
| 305 | 261 |
| 306 | 273 |
| 307 | 367 |
| 308 | 286 |
| 309 | 384 |
| 310 | 402 |
| 311 | 485 |
| 312 | 310 |
| 313 | 411 |
| 314 | 419 |
| 315 | 509 |
| 316 | 438 |
| 317 | 527 |
| 318 | 550 |
| 319 | 653 |
| 320 | 78 |
| 321 | 156 |
| 322 | 166 |
| 323 | 239 |
| 324 | 175 |
| 325 | 255 |
| 326 | 266 |
| 327 | 358 |
| 328 | 188 |
| 329 | 275 |
| 330 | 282 |
| 331 | 387 |
| 332 | 298 |
| 333 | 396 |
| 334 | 414 |
| 335 | 513 |
| 336 | 227 |
| 337 | 290 |
| 338 | 308 |
| 339 | 412 |
| 340 | 323 |
| 341 | 422 |
| 342 | 439 |
| 343 | 531 |
| 344 | 351 |
| 345 | 440 |
| 346 | 460 |
| 347 | 544 |
| 348 | 478 |
| 349 | 571 |
| 350 | 584 |
| 351 | 686 |
| 352 | 254 |
| 353 | 327 |
| 354 | 346 |
| 355 | 427 |
| 356 | 364 |
| 357 | 452 |
| 358 | 472 |
| 359 | 558 |
| 360 | 376 |
| 361 | 462 |
| 362 | 487 |
| 363 | 580 |
| 364 | 511 |
| 365 | 596 |
| 366 | 620 |
| 367 | 707 |
| 368 | 406 |
| 369 | 499 |
| 370 | 515 |
| 371 | 610 |

-continued

Table Z1, having a sequence length of 1024:

| Polarized channel sequence number | Reliability or sequence number of reliability |
|---|---|
| 372 | 533 |
| 373 | 624 |
| 374 | 600 |
| 375 | 739 |
| 376 | 552 |
| 377 | 647 |
| 378 | 669 |
| 379 | 719 |
| 380 | 677 |
| 381 | 771 |
| 382 | 790 |
| 383 | 848 |
| 384 | 89 |
| 385 | 174 |
| 386 | 186 |
| 387 | 285 |
| 388 | 221 |
| 389 | 299 |
| 390 | 312 |
| 391 | 409 |
| 392 | 241 |
| 393 | 315 |
| 394 | 329 |
| 395 | 433 |
| 396 | 350 |
| 397 | 445 |
| 398 | 468 |
| 399 | 562 |
| 400 | 260 |
| 401 | 348 |
| 402 | 361 |
| 403 | 443 |
| 404 | 383 |
| 405 | 466 |
| 406 | 491 |
| 407 | 576 |
| 408 | 397 |
| 409 | 501 |
| 410 | 503 |
| 411 | 594 |
| 412 | 523 |
| 413 | 617 |
| 414 | 629 |
| 415 | 722 |
| 416 | 289 |
| 417 | 380 |
| 418 | 369 |
| 419 | 474 |
| 420 | 403 |
| 421 | 493 |
| 422 | 512 |
| 423 | 603 |
| 424 | 426 |
| 425 | 521 |
| 426 | 537 |
| 427 | 627 |
| 428 | 554 |
| 429 | 637 |
| 430 | 658 |
| 431 | 746 |
| 432 | 450 |
| 433 | 539 |
| 434 | 565 |
| 435 | 650 |
| 436 | 578 |
| 437 | 672 |
| 438 | 692 |
| 439 | 764 |
| 440 | 598 |
| 441 | 683 |
| 442 | 710 |
| 443 | 801 |
| 444 | 729 |
| 445 | 806 |

-continued

Table Z1, having a sequence length of 1024:

| Polarized channel sequence number | Reliability or sequence number of reliability |
|---|---|
| 446 | 813 |
| 447 | 877 |
| 448 | 325 |
| 449 | 386 |
| 450 | 424 |
| 451 | 519 |
| 452 | 446 |
| 453 | 525 |
| 454 | 548 |
| 455 | 642 |
| 456 | 476 |
| 457 | 567 |
| 458 | 560 |
| 459 | 663 |
| 460 | 591 |
| 461 | 674 |
| 462 | 694 |
| 463 | 782 |
| 464 | 489 |
| 465 | 582 |
| 466 | 605 |
| 467 | 704 |
| 468 | 622 |
| 469 | 689 |
| 470 | 736 |
| 471 | 794 |
| 472 | 645 |
| 473 | 742 |
| 474 | 713 |
| 475 | 816 |
| 476 | 760 |
| 477 | 830 |
| 478 | 847 |
| 479 | 898 |
| 480 | 505 |
| 481 | 615 |
| 482 | 634 |
| 483 | 716 |
| 484 | 655 |
| 485 | 732 |
| 486 | 749 |
| 487 | 821 |
| 488 | 661 |
| 489 | 753 |
| 490 | 786 |
| 491 | 846 |
| 492 | 768 |
| 493 | 835 |
| 494 | 870 |
| 495 | 937 |
| 496 | 700 |
| 497 | 798 |
| 498 | 775 |
| 499 | 857 |
| 500 | 805 |
| 501 | 874 |
| 502 | 865 |
| 503 | 928 |
| 504 | 836 |
| 505 | 883 |
| 506 | 893 |
| 507 | 948 |
| 508 | 919 |
| 509 | 960 |
| 510 | 974 |
| 511 | 992 |
| 512 | 9 |
| 513 | 32 |
| 514 | 75 |
| 515 | 120 |
| 516 | 49 |
| 517 | 134 |
| 518 | 104 |
| 519 | 210 |

-continued

| Table Z1, having a sequence length of 1024: | |
|---|---|
| Polarized channel sequence number | Reliability or sequence number of reliability |
| 520 | 63 |
| 521 | 154 |
| 522 | 170 |
| 523 | 224 |
| 524 | 127 |
| 525 | 248 |
| 526 | 256 |
| 527 | 332 |
| 528 | 86 |
| 529 | 165 |
| 530 | 141 |
| 531 | 236 |
| 532 | 179 |
| 533 | 259 |
| 534 | 291 |
| 535 | 360 |
| 536 | 177 |
| 537 | 297 |
| 538 | 267 |
| 539 | 381 |
| 540 | 311 |
| 541 | 398 |
| 542 | 413 |
| 543 | 532 |
| 544 | 95 |
| 545 | 160 |
| 546 | 206 |
| 547 | 274 |
| 548 | 189 |
| 549 | 294 |
| 550 | 281 |
| 551 | 392 |
| 552 | 219 |
| 553 | 307 |
| 554 | 320 |
| 555 | 416 |
| 556 | 334 |
| 557 | 435 |
| 558 | 448 |
| 559 | 540 |
| 560 | 240 |
| 561 | 326 |
| 562 | 343 |
| 563 | 442 |
| 564 | 354 |
| 565 | 461 |
| 566 | 469 |
| 567 | 566 |
| 568 | 366 |
| 569 | 480 |
| 570 | 498 |
| 571 | 586 |
| 572 | 508 |
| 573 | 613 |
| 574 | 625 |
| 575 | 737 |
| 576 | 112 |
| 577 | 187 |
| 578 | 198 |
| 579 | 301 |
| 580 | 244 |
| 581 | 314 |
| 582 | 333 |
| 583 | 429 |
| 584 | 228 |
| 585 | 342 |
| 586 | 352 |
| 587 | 455 |
| 588 | 365 |
| 589 | 465 |
| 590 | 482 |
| 591 | 579 |
| 592 | 270 |
| 593 | 362 |

-continued

| Table Z1, having a sequence length of 1024: | |
|---|---|
| Polarized channel sequence number | Reliability or sequence number of reliability |
| 594 | 375 |
| 595 | 488 |
| 596 | 391 |
| 597 | 471 |
| 598 | 496 |
| 599 | 599 |
| 600 | 404 |
| 601 | 520 |
| 602 | 530 |
| 603 | 618 |
| 604 | 551 |
| 605 | 648 |
| 606 | 659 |
| 607 | 758 |
| 608 | 288 |
| 609 | 390 |
| 610 | 400 |
| 611 | 518 |
| 612 | 421 |
| 613 | 506 |
| 614 | 536 |
| 615 | 633 |
| 616 | 437 |
| 617 | 543 |
| 618 | 570 |
| 619 | 649 |
| 620 | 581 |
| 621 | 668 |
| 622 | 684 |
| 623 | 773 |
| 624 | 475 |
| 625 | 561 |
| 626 | 590 |
| 627 | 679 |
| 628 | 602 |
| 629 | 690 |
| 630 | 712 |
| 631 | 787 |
| 632 | 635 |
| 633 | 705 |
| 634 | 728 |
| 635 | 809 |
| 636 | 744 |
| 637 | 819 |
| 638 | 841 |
| 639 | 914 |
| 640 | 147 |
| 641 | 215 |
| 642 | 263 |
| 643 | 341 |
| 644 | 232 |
| 645 | 359 |
| 646 | 368 |
| 647 | 484 |
| 648 | 284 |
| 649 | 378 |
| 650 | 393 |
| 651 | 500 |
| 652 | 408 |
| 653 | 524 |
| 654 | 534 |
| 655 | 626 |
| 656 | 309 |
| 657 | 401 |
| 658 | 420 |
| 659 | 510 |
| 660 | 436 |
| 661 | 553 |
| 662 | 563 |
| 663 | 651 |
| 664 | 454 |
| 665 | 549 |
| 666 | 577 |
| 667 | 665 |

-continued

Table Z1, having a sequence length of 1024:

| Polarized channel sequence number | Reliability or sequence number of reliability |
|---|---|
| 668 | 601 |
| 669 | 693 |
| 670 | 708 |
| 671 | 779 |
| 672 | 319 |
| 673 | 428 |
| 674 | 447 |
| 675 | 557 |
| 676 | 458 |
| 677 | 564 |
| 678 | 585 |
| 679 | 676 |
| 680 | 492 |
| 681 | 588 |
| 682 | 616 |
| 683 | 696 |
| 684 | 630 |
| 685 | 714 |
| 686 | 734 |
| 687 | 803 |
| 688 | 514 |
| 689 | 614 |
| 690 | 641 |
| 691 | 717 |
| 692 | 656 |
| 693 | 730 |
| 694 | 747 |
| 695 | 822 |
| 696 | 673 |
| 697 | 761 |
| 698 | 770 |
| 699 | 834 |
| 700 | 789 |
| 701 | 854 |
| 702 | 871 |
| 703 | 930 |
| 704 | 324 |
| 705 | 457 |
| 706 | 486 |
| 707 | 592 |
| 708 | 504 |
| 709 | 611 |
| 710 | 623 |
| 711 | 718 |
| 712 | 528 |
| 713 | 621 |
| 714 | 643 |
| 715 | 738 |
| 716 | 660 |
| 717 | 757 |
| 718 | 769 |
| 719 | 832 |
| 720 | 547 |
| 721 | 652 |
| 722 | 671 |
| 723 | 751 |
| 724 | 687 |
| 725 | 762 |
| 726 | 783 |
| 727 | 852 |
| 728 | 703 |
| 729 | 788 |
| 730 | 797 |
| 731 | 859 |
| 732 | 812 |
| 733 | 878 |
| 734 | 888 |
| 735 | 941 |
| 736 | 583 |
| 737 | 675 |
| 738 | 695 |
| 739 | 777 |
| 740 | 725 |
| 741 | 791 |

-continued

Table Z1, having a sequence length of 1024:

| Polarized channel sequence number | Reliability or sequence number of reliability |
|---|---|
| 742 | 800 |
| 743 | 867 |
| 744 | 731 |
| 745 | 810 |
| 746 | 823 |
| 747 | 885 |
| 748 | 837 |
| 749 | 894 |
| 750 | 903 |
| 751 | 950 |
| 752 | 750 |
| 753 | 825 |
| 754 | 842 |
| 755 | 897 |
| 756 | 858 |
| 757 | 907 |
| 758 | 915 |
| 759 | 955 |
| 760 | 868 |
| 761 | 918 |
| 762 | 927 |
| 763 | 965 |
| 764 | 936 |
| 765 | 975 |
| 766 | 984 |
| 767 | 1007 |
| 768 | 178 |
| 769 | 252 |
| 770 | 277 |
| 771 | 379 |
| 772 | 317 |
| 773 | 399 |
| 774 | 417 |
| 775 | 538 |
| 776 | 304 |
| 777 | 423 |
| 778 | 441 |
| 779 | 555 |
| 780 | 456 |
| 781 | 574 |
| 782 | 595 |
| 783 | 688 |
| 784 | 321 |
| 785 | 449 |
| 786 | 477 |
| 787 | 572 |
| 788 | 494 |
| 789 | 597 |
| 790 | 609 |
| 791 | 709 |
| 792 | 516 |
| 793 | 619 |
| 794 | 638 |
| 795 | 721 |
| 796 | 654 |
| 797 | 745 |
| 798 | 752 |
| 799 | 833 |
| 800 | 328 |
| 801 | 473 |
| 802 | 490 |
| 803 | 607 |
| 804 | 522 |
| 805 | 636 |
| 806 | 628 |
| 807 | 733 |
| 808 | 545 |
| 809 | 646 |
| 810 | 662 |
| 811 | 748 |
| 812 | 678 |
| 813 | 772 |
| 814 | 774 |
| 815 | 850 |

-continued

| Table Z1, having a sequence length of 1024: | |
|---|---|
| Polarized channel sequence number | Reliability or sequence number of reliability |
| 816 | 568 |
| 817 | 667 |
| 818 | 691 |
| 819 | 765 |
| 820 | 702 |
| 821 | 781 |
| 822 | 795 |
| 823 | 860 |
| 824 | 723 |
| 825 | 804 |
| 826 | 811 |
| 827 | 879 |
| 828 | 824 |
| 829 | 889 |
| 830 | 900 |
| 831 | 947 |
| 832 | 353 |
| 833 | 526 |
| 834 | 502 |
| 835 | 644 |
| 836 | 559 |
| 837 | 670 |
| 838 | 664 |
| 839 | 766 |
| 840 | 593 |
| 841 | 682 |
| 842 | 698 |
| 843 | 785 |
| 844 | 711 |
| 845 | 792 |
| 846 | 808 |
| 847 | 875 |
| 848 | 606 |
| 849 | 699 |
| 850 | 715 |
| 851 | 796 |
| 852 | 743 |
| 853 | 817 |
| 854 | 826 |
| 855 | 886 |
| 856 | 754 |
| 857 | 827 |
| 858 | 839 |
| 859 | 896 |
| 860 | 856 |
| 861 | 910 |
| 862 | 917 |
| 863 | 961 |
| 864 | 639 |
| 865 | 720 |
| 866 | 740 |
| 867 | 818 |
| 868 | 767 |
| 869 | 845 |
| 870 | 853 |
| 871 | 904 |
| 872 | 776 |
| 873 | 840 |
| 874 | 862 |
| 875 | 912 |
| 876 | 873 |
| 877 | 922 |
| 878 | 933 |
| 879 | 968 |
| 880 | 799 |
| 881 | 869 |
| 882 | 880 |
| 883 | 929 |
| 884 | 892 |
| 885 | 939 |
| 886 | 924 |
| 887 | 979 |
| 888 | 901 |
| 889 | 945 |

-continued

| Table Z1, having a sequence length of 1024: | |
|---|---|
| Polarized channel sequence number | Reliability or sequence number of reliability |
| 890 | 953 |
| 891 | 972 |
| 892 | 956 |
| 893 | 988 |
| 894 | 994 |
| 895 | 1012 |
| 896 | 374 |
| 897 | 575 |
| 898 | 542 |
| 899 | 681 |
| 900 | 604 |
| 901 | 701 |
| 902 | 706 |
| 903 | 802 |
| 904 | 631 |
| 905 | 727 |
| 906 | 735 |
| 907 | 820 |
| 908 | 755 |
| 909 | 831 |
| 910 | 849 |
| 911 | 906 |
| 912 | 657 |
| 913 | 741 |
| 914 | 763 |
| 915 | 828 |
| 916 | 780 |
| 917 | 851 |
| 918 | 864 |
| 919 | 913 |
| 920 | 793 |
| 921 | 872 |
| 922 | 861 |
| 923 | 921 |
| 924 | 887 |
| 925 | 932 |
| 926 | 938 |
| 927 | 973 |
| 928 | 685 |
| 929 | 778 |
| 930 | 759 |
| 931 | 855 |
| 932 | 807 |
| 933 | 866 |
| 934 | 881 |
| 935 | 925 |
| 936 | 815 |
| 937 | 884 |
| 938 | 891 |
| 939 | 942 |
| 940 | 902 |
| 941 | 935 |
| 942 | 949 |
| 943 | 981 |
| 944 | 838 |
| 945 | 895 |
| 946 | 908 |
| 947 | 946 |
| 948 | 916 |
| 949 | 954 |
| 950 | 963 |
| 951 | 986 |
| 952 | 923 |
| 953 | 959 |
| 954 | 969 |
| 955 | 997 |
| 956 | 976 |
| 957 | 990 |
| 958 | 1000 |
| 959 | 1016 |
| 960 | 724 |
| 961 | 784 |
| 962 | 814 |
| 963 | 882 |

-continued

Table Z1, having a sequence length of 1024:

| Polarized channel sequence number | Reliability or sequence number of reliability |
|---|---|
| 964 | 829 |
| 965 | 890 |
| 966 | 899 |
| 967 | 944 |
| 968 | 844 |
| 969 | 909 |
| 970 | 905 |
| 971 | 957 |
| 972 | 920 |
| 973 | 951 |
| 974 | 964 |
| 975 | 991 |
| 976 | 863 |
| 977 | 911 |
| 978 | 926 |
| 979 | 967 |
| 980 | 934 |
| 981 | 962 |
| 982 | 978 |
| 983 | 995 |
| 984 | 943 |
| 985 | 980 |
| 986 | 970 |
| 987 | 998 |
| 988 | 985 |
| 989 | 1003 |
| 990 | 1005 |
| 991 | 1014 |
| 992 | 876 |
| 993 | 931 |
| 994 | 940 |
| 995 | 971 |
| 996 | 952 |
| 997 | 977 |
| 998 | 982 |
| 999 | 1001 |
| 1000 | 958 |
| 1001 | 983 |
| 1002 | 993 |
| 1003 | 1008 |
| 1004 | 987 |
| 1005 | 1002 |
| 1006 | 1010 |
| 1007 | 1019 |
| 1008 | 966 |
| 1009 | 996 |
| 1010 | 989 |
| 1011 | 1006 |
| 1012 | 999 |
| 1013 | 1013 |
| 1014 | 1009 |
| 1015 | 1018 |
| 1016 | 1004 |
| 1017 | 1011 |
| 1018 | 1015 |
| 1019 | 1020 |
| 1020 | 1017 |
| 1021 | 1021 |
| 1022 | 1022 |
| 1023 | 1023 |

Sequence Z2, having a sequence length of 512:

[0, 1, 4, 9, 2, 11, 7, 23, 3, 14, 17, 27, 10, 31, 34, 66, 5, 16, 12, 29, 19, 37, 45, 71, 21, 48, 39, 79, 54, 86, 92, 145, 6, 15, 20, 40, 24, 47, 44, 82, 28, 52, 59, 89, 63, 99, 103, 152, 33, 56, 68, 102, 72, 110, 116, 163, 78, 118, 126, 176, 134, 182, 196, 263, 8, 22, 25, 50, 32, 55, 62, 96, 35, 70, 57, 104, 75, 113, 124, 170, 41, 65, 76, 117, 85, 120, 132, 181, 93, 135, 143, 191, 153, 206, 215, 284, 49, 81, 90, 129, 100, 137, 146, 202, 106, 148, 162, 214, 174, 221, 234, 298, 119, 168, 177, 228, 186, 236, 247, 308, 201, 252, 262, 322, 273, 330, 349, 406, 13, 26, 38, 64, 30, 74, 69, 121, 43, 77, 84, 130, 91, 140, 142, 197, 53, 88, 95, 138, 101, 150, 161, 210, 114, 160, 169, 220, 180, 230, 242, 307, 58, 98, 111, 159, 108, 164, 172, 229, 128, 179, 187, 237, 199, 251, 259, 318, 133, 189, 203, 254, 213, 272, 279, 332, 226, 285, 289, 343, 303, 360, 368, 423, 61, 109, 123, 178, 131, 188, 195, 253, 144, 192, 205, 269, 216, 274, 286, 345, 154, 211, 225, 281, 235, 293, 300, 352, 245, 306, 314, 361, 327, 379, 388, 434, 171, 231, 239, 295, 255, 309, 316, 373, 268, 323, 331, 385, 346, 391, 398, 444, 275, 334, 350, 393, 359, 404, 412, 449, 367, 413, 421, 455, 431, 464, 473, 493, 18, 36, 42, 80, 46, 87, 94, 147, 51, 97, 105, 155, 112, 167, 175, 246, 60, 107, 115, 173, 127, 183, 185, 248, 136, 190, 200, 261, 212, 271, 276, 339, 67, 122, 125, 184, 139, 194, 204, 270, 151, 209, 217, 277, 224, 294, 296, 354, 158, 223, 232, 291, 241, 302, 312, 362, 257, 319, 324, 374, 335, 384, 395, 439, 73, 141, 149, 207, 157, 219, 227, 287, 166, 233, 238, 305, 249, 310, 321, 377, 198, 244, 256, 320, 264, 325, 336, 386, 283, 337, 347, 392, 358, 405, 411, 451, 218, 266, 278, 329, 290, 344, 355, 399, 297, 348, 363, 409, 375, 416, 426, 458, 315, 369, 378, 422, 387, 428, 418, 468, 396, 437, 445, 462, 448, 477, 481, 496, 83, 156, 165, 240, 193, 250, 258, 317, 208, 260, 267, 333, 282, 340, 353, 401, 222, 280, 288, 338, 301, 351, 365, 407, 311, 370, 371, 415, 382, 425, 430, 463, 243, 299, 292, 356, 313, 366, 376, 419, 328, 381, 389, 429, 397, 433, 441, 470, 342, 390, 402, 438, 408, 446, 453, 475, 417, 450, 459, 484, 465, 486, 487, 501, 265, 304, 326, 380, 341, 383, 394, 435, 357, 403, 400, 443, 414, 447, 454, 479, 364, 410, 420, 457, 427, 452, 467, 482, 436, 469, 460, 488, 474, 490, 495, 504, 372, 424, 432, 461, 440, 466, 471, 489, 442, 472, 480, 494, 476, 491, 499, 507, 456, 483, 478, 497, 485, 500, 498, 506, 492, 502, 503, 508, 505, 509, 510, 511]

Table Z2, having a sequence length of 512:

| Polarized channel sequence number | Reliability or sequence number of reliability |
|---|---|
| 0 | 0 |
| 1 | 1 |
| 2 | 4 |
| 3 | 9 |
| 4 | 2 |
| 5 | 11 |
| 6 | 7 |
| 7 | 23 |
| 8 | 3 |
| 9 | 14 |
| 10 | 17 |
| 11 | 27 |
| 12 | 10 |
| 13 | 31 |
| 14 | 34 |
| 15 | 66 |
| 16 | 5 |
| 17 | 16 |
| 18 | 12 |
| 19 | 29 |
| 20 | 19 |
| 21 | 37 |
| 22 | 45 |
| 23 | 71 |
| 24 | 21 |
| 25 | 48 |
| 26 | 39 |
| 27 | 79 |
| 28 | 54 |
| 29 | 86 |
| 30 | 92 |
| 31 | 145 |
| 32 | 6 |
| 33 | 15 |
| 34 | 20 |
| 35 | 40 |

-continued

Table Z2, having a sequence length of 512:

| Polarized channel sequence number | Reliability or sequence number of reliability |
|---|---|
| 36 | 24 |
| 37 | 47 |
| 38 | 44 |
| 39 | 82 |
| 40 | 28 |
| 41 | 52 |
| 42 | 59 |
| 43 | 89 |
| 44 | 63 |
| 45 | 99 |
| 46 | 103 |
| 47 | 152 |
| 48 | 33 |
| 49 | 56 |
| 50 | 68 |
| 51 | 102 |
| 52 | 72 |
| 53 | 110 |
| 54 | 116 |
| 55 | 163 |
| 56 | 78 |
| 57 | 118 |
| 58 | 126 |
| 59 | 176 |
| 60 | 134 |
| 61 | 182 |
| 62 | 196 |
| 63 | 263 |
| 64 | 8 |
| 65 | 22 |
| 66 | 25 |
| 67 | 50 |
| 68 | 32 |
| 69 | 55 |
| 70 | 62 |
| 71 | 96 |
| 72 | 35 |
| 73 | 70 |
| 74 | 57 |
| 75 | 104 |
| 76 | 75 |
| 77 | 113 |
| 78 | 124 |
| 79 | 170 |
| 80 | 41 |
| 81 | 65 |
| 82 | 76 |
| 83 | 117 |
| 84 | 85 |
| 85 | 120 |
| 86 | 132 |
| 87 | 181 |
| 88 | 93 |
| 89 | 135 |
| 90 | 143 |
| 91 | 191 |
| 92 | 153 |
| 93 | 206 |
| 94 | 215 |
| 95 | 284 |
| 96 | 49 |
| 97 | 81 |
| 98 | 90 |
| 99 | 129 |
| 100 | 100 |
| 101 | 137 |
| 102 | 146 |
| 103 | 202 |
| 104 | 106 |
| 105 | 148 |
| 106 | 162 |
| 107 | 214 |
| 108 | 174 |
| 109 | 221 |
| 110 | 234 |
| 111 | 298 |
| 112 | 119 |
| 113 | 168 |
| 114 | 177 |
| 115 | 228 |
| 116 | 186 |
| 117 | 236 |
| 118 | 247 |
| 119 | 308 |
| 120 | 201 |
| 121 | 252 |
| 122 | 262 |
| 123 | 322 |
| 124 | 273 |
| 125 | 330 |
| 126 | 349 |
| 127 | 406 |
| 128 | 13 |
| 129 | 26 |
| 130 | 38 |
| 131 | 64 |
| 132 | 30 |
| 133 | 74 |
| 134 | 69 |
| 135 | 121 |
| 136 | 43 |
| 137 | 77 |
| 138 | 84 |
| 139 | 130 |
| 140 | 91 |
| 141 | 140 |
| 142 | 142 |
| 143 | 197 |
| 144 | 53 |
| 145 | 88 |
| 146 | 95 |
| 147 | 138 |
| 148 | 101 |
| 149 | 150 |
| 150 | 161 |
| 151 | 210 |
| 152 | 114 |
| 153 | 160 |
| 154 | 169 |
| 155 | 220 |
| 156 | 180 |
| 157 | 230 |
| 158 | 242 |
| 159 | 307 |
| 160 | 58 |
| 161 | 98 |
| 162 | 111 |
| 163 | 159 |
| 164 | 108 |
| 165 | 164 |
| 166 | 172 |
| 167 | 229 |
| 168 | 128 |
| 169 | 179 |
| 170 | 187 |
| 171 | 237 |
| 172 | 199 |
| 173 | 251 |
| 174 | 259 |
| 175 | 318 |
| 176 | 133 |
| 177 | 189 |
| 178 | 203 |
| 179 | 254 |
| 180 | 213 |
| 181 | 272 |
| 182 | 279 |
| 183 | 332 |

-continued

| Table Z2, having a sequence length of 512: | |
|---|---|
| Polarized channel sequence number | Reliability or sequence number of reliability |
| 184 | 226 |
| 185 | 285 |
| 186 | 289 |
| 187 | 343 |
| 188 | 303 |
| 189 | 360 |
| 190 | 368 |
| 191 | 423 |
| 192 | 61 |
| 193 | 109 |
| 194 | 123 |
| 195 | 178 |
| 196 | 131 |
| 197 | 188 |
| 198 | 195 |
| 199 | 253 |
| 200 | 144 |
| 201 | 192 |
| 202 | 205 |
| 203 | 269 |
| 204 | 216 |
| 205 | 274 |
| 206 | 286 |
| 207 | 345 |
| 208 | 154 |
| 209 | 211 |
| 210 | 225 |
| 211 | 281 |
| 212 | 235 |
| 213 | 293 |
| 214 | 300 |
| 215 | 352 |
| 216 | 245 |
| 217 | 306 |
| 218 | 314 |
| 219 | 361 |
| 220 | 327 |
| 221 | 379 |
| 222 | 388 |
| 223 | 434 |
| 224 | 171 |
| 225 | 231 |
| 226 | 239 |
| 227 | 295 |
| 228 | 255 |
| 229 | 309 |
| 230 | 316 |
| 231 | 373 |
| 232 | 268 |
| 233 | 323 |
| 234 | 331 |
| 235 | 385 |
| 236 | 346 |
| 237 | 391 |
| 238 | 398 |
| 239 | 444 |
| 240 | 275 |
| 241 | 334 |
| 242 | 350 |
| 243 | 393 |
| 244 | 359 |
| 245 | 404 |
| 246 | 412 |
| 247 | 449 |
| 248 | 367 |
| 249 | 413 |
| 250 | 421 |
| 251 | 455 |
| 252 | 431 |
| 253 | 464 |
| 254 | 473 |
| 255 | 493 |
| 256 | 18 |
| 257 | 36 |

-continued

| Table Z2, having a sequence length of 512: | |
|---|---|
| Polarized channel sequence number | Reliability or sequence number of reliability |
| 258 | 42 |
| 259 | 80 |
| 260 | 46 |
| 261 | 87 |
| 262 | 94 |
| 263 | 147 |
| 264 | 51 |
| 265 | 97 |
| 266 | 105 |
| 267 | 155 |
| 268 | 112 |
| 269 | 167 |
| 270 | 175 |
| 271 | 246 |
| 272 | 60 |
| 273 | 107 |
| 274 | 115 |
| 275 | 173 |
| 276 | 127 |
| 277 | 183 |
| 278 | 185 |
| 279 | 248 |
| 280 | 136 |
| 281 | 190 |
| 282 | 200 |
| 283 | 261 |
| 284 | 212 |
| 285 | 271 |
| 286 | 276 |
| 287 | 339 |
| 288 | 67 |
| 289 | 122 |
| 290 | 125 |
| 291 | 184 |
| 292 | 139 |
| 293 | 194 |
| 294 | 204 |
| 295 | 270 |
| 296 | 151 |
| 297 | 209 |
| 298 | 217 |
| 299 | 277 |
| 300 | 224 |
| 301 | 294 |
| 302 | 296 |
| 303 | 354 |
| 304 | 158 |
| 305 | 223 |
| 306 | 232 |
| 307 | 291 |
| 308 | 241 |
| 309 | 302 |
| 310 | 312 |
| 311 | 362 |
| 312 | 257 |
| 313 | 319 |
| 314 | 324 |
| 315 | 374 |
| 316 | 335 |
| 317 | 384 |
| 318 | 395 |
| 319 | 439 |
| 320 | 73 |
| 321 | 141 |
| 322 | 149 |
| 323 | 207 |
| 324 | 157 |
| 325 | 219 |
| 326 | 227 |
| 327 | 287 |
| 328 | 166 |
| 329 | 233 |
| 330 | 238 |
| 331 | 305 |

-continued

| Table Z2, having a sequence length of 512: | |
|---|---|
| Polarized channel sequence number | Reliability or sequence number of reliability |
| 332 | 249 |
| 333 | 310 |
| 334 | 321 |
| 335 | 377 |
| 336 | 198 |
| 337 | 244 |
| 338 | 256 |
| 339 | 320 |
| 340 | 264 |
| 341 | 325 |
| 342 | 336 |
| 343 | 386 |
| 344 | 283 |
| 345 | 337 |
| 346 | 347 |
| 347 | 392 |
| 348 | 358 |
| 349 | 405 |
| 350 | 411 |
| 351 | 451 |
| 352 | 218 |
| 353 | 266 |
| 354 | 278 |
| 355 | 329 |
| 356 | 290 |
| 357 | 344 |
| 358 | 355 |
| 359 | 399 |
| 360 | 297 |
| 361 | 348 |
| 362 | 363 |
| 363 | 409 |
| 364 | 375 |
| 365 | 416 |
| 366 | 426 |
| 367 | 458 |
| 368 | 315 |
| 369 | 369 |
| 370 | 378 |
| 371 | 422 |
| 372 | 387 |
| 373 | 428 |
| 374 | 418 |
| 375 | 468 |
| 376 | 396 |
| 377 | 437 |
| 378 | 445 |
| 379 | 462 |
| 380 | 448 |
| 381 | 477 |
| 382 | 481 |
| 383 | 496 |
| 384 | 83 |
| 385 | 156 |
| 386 | 165 |
| 387 | 240 |
| 388 | 193 |
| 389 | 250 |
| 390 | 258 |
| 391 | 317 |
| 392 | 208 |
| 393 | 260 |
| 394 | 267 |
| 395 | 333 |
| 396 | 282 |
| 397 | 340 |
| 398 | 353 |
| 399 | 401 |
| 400 | 222 |
| 401 | 280 |
| 402 | 288 |
| 403 | 338 |
| 404 | 301 |
| 405 | 351 |

-continued

| Table Z2, having a sequence length of 512: | |
|---|---|
| Polarized channel sequence number | Reliability or sequence number of reliability |
| 406 | 365 |
| 407 | 407 |
| 408 | 311 |
| 409 | 370 |
| 410 | 371 |
| 411 | 415 |
| 412 | 382 |
| 413 | 425 |
| 414 | 430 |
| 415 | 463 |
| 416 | 243 |
| 417 | 299 |
| 418 | 292 |
| 419 | 356 |
| 420 | 313 |
| 421 | 366 |
| 422 | 376 |
| 423 | 419 |
| 424 | 328 |
| 425 | 381 |
| 426 | 389 |
| 427 | 429 |
| 428 | 397 |
| 429 | 433 |
| 430 | 441 |
| 431 | 470 |
| 432 | 342 |
| 433 | 390 |
| 434 | 402 |
| 435 | 438 |
| 436 | 408 |
| 437 | 446 |
| 438 | 453 |
| 439 | 475 |
| 440 | 417 |
| 441 | 450 |
| 442 | 459 |
| 443 | 484 |
| 444 | 465 |
| 445 | 486 |
| 446 | 487 |
| 447 | 501 |
| 448 | 265 |
| 449 | 304 |
| 450 | 326 |
| 451 | 380 |
| 452 | 341 |
| 453 | 383 |
| 454 | 394 |
| 455 | 435 |
| 456 | 357 |
| 457 | 403 |
| 458 | 400 |
| 459 | 443 |
| 460 | 414 |
| 461 | 447 |
| 462 | 454 |
| 463 | 479 |
| 464 | 364 |
| 465 | 410 |
| 466 | 420 |
| 467 | 457 |
| 468 | 427 |
| 469 | 452 |
| 470 | 467 |
| 471 | 482 |
| 472 | 436 |
| 473 | 469 |
| 474 | 460 |
| 475 | 488 |
| 476 | 474 |
| 477 | 490 |
| 478 | 495 |
| 479 | 504 |

-continued

| Table Z2, having a sequence length of 512: | |
|---|---|
| Polarized channel sequence number | Reliability or sequence number of reliability |
| 480 | 372 |
| 481 | 424 |
| 482 | 432 |
| 483 | 461 |
| 484 | 440 |
| 485 | 466 |
| 486 | 471 |
| 487 | 489 |
| 488 | 442 |
| 489 | 472 |
| 490 | 480 |
| 491 | 494 |
| 492 | 476 |
| 493 | 491 |
| 494 | 499 |
| 495 | 507 |
| 496 | 456 |
| 497 | 483 |
| 498 | 478 |
| 499 | 497 |
| 500 | 485 |
| 501 | 500 |
| 502 | 498 |
| 503 | 506 |
| 504 | 492 |
| 505 | 502 |
| 506 | 503 |
| 507 | 508 |
| 508 | 505 |
| 509 | 509 |
| 510 | 510 |
| 511 | 511 |

Sequence Z3, having a sequence length of 256:

[0, 1, 4, 9, 2, 11, 7, 22, 3, 14, 17, 26, 10, 30, 33, 60, 5, 16, 12, 28, 18, 35, 42, 64, 20, 44, 37, 71, 49, 76, 81, 122, 6, 15, 19, 38, 23, 43, 41, 73, 27, 47, 54, 78, 57, 86, 90, 126, 32, 51, 61, 89, 65, 95, 99, 133, 70, 101, 107, 141, 114, 147, 155, 192, 8, 21, 24, 46, 31, 50, 56, 84, 34, 63, 52, 91, 67, 97, 106, 137, 39, 59, 68, 100, 75, 103, 112, 146, 82, 115, 120, 152, 127, 162, 167, 201, 45, 72, 79, 109, 87, 116, 123, 159, 92, 124, 132, 166, 140, 170, 177, 207, 102, 135, 142, 173, 148, 179, 184, 212, 158, 186, 191, 217, 196, 220, 227, 243, 13, 25, 36, 58, 29, 66, 62, 104, 40, 69, 74, 110, 80, 118, 119, 156, 48, 77, 83, 117, 88, 125, 131, 163, 98, 130, 136, 169, 145, 175, 182, 211, 53, 85, 96, 129, 93, 134, 139, 174, 108, 144, 149, 180, 157, 185, 190, 216, 113, 151, 160, 188, 165, 195, 199, 222, 172, 202, 204,224, 209, 231, 234, 247, 55, 94, 105, 143, 111, 150, 154, 187, 121, 153, 161, 194, 168, 197, 203, 225, 128, 164, 171, 200, 178, 205, 208, 229, 183, 210, 214, 232, 219, 236, 238, 249, 138, 176, 181, 206, 189, 213, 215, 235, 193, 218, 221, 237, 226, 239, 241, 250, 198, 223, 228, 240, 230, 242, 244, 251, 233, 245, 246, 252, 248, 253, 254, 255]

| Table Z3, having a sequence length of 256: | |
|---|---|
| Polarized channel sequence number | Reliability or sequence number of reliability |
| 0 | 0 |
| 1 | 1 |
| 2 | 4 |
| 3 | 9 |
| 4 | 2 |
| 5 | 11 |
| 6 | 7 |

-continued

| Table Z3, having a sequence length of 256: | |
|---|---|
| Polarized channel sequence number | Reliability or sequence number of reliability |
| 7 | 22 |
| 8 | 3 |
| 9 | 14 |
| 10 | 17 |
| 11 | 26 |
| 12 | 10 |
| 13 | 30 |
| 14 | 33 |
| 15 | 60 |
| 16 | 5 |
| 17 | 16 |
| 18 | 12 |
| 19 | 28 |
| 20 | 18 |
| 21 | 35 |
| 22 | 42 |
| 23 | 64 |
| 24 | 20 |
| 25 | 44 |
| 26 | 37 |
| 27 | 71 |
| 28 | 49 |
| 29 | 76 |
| 30 | 81 |
| 31 | 122 |
| 32 | 6 |
| 33 | 15 |
| 34 | 19 |
| 35 | 38 |
| 36 | 23 |
| 37 | 43 |
| 38 | 41 |
| 39 | 73 |
| 40 | 27 |
| 41 | 47 |
| 42 | 54 |
| 43 | 78 |
| 44 | 57 |
| 45 | 86 |
| 46 | 90 |
| 47 | 126 |
| 48 | 32 |
| 49 | 51 |
| 50 | 61 |
| 51 | 89 |
| 52 | 65 |
| 53 | 95 |
| 54 | 99 |
| 55 | 133 |
| 56 | 70 |
| 57 | 101 |
| 58 | 107 |
| 59 | 141 |
| 60 | 114 |
| 61 | 147 |
| 62 | 155 |
| 63 | 192 |
| 64 | 8 |
| 65 | 21 |
| 66 | 24 |
| 67 | 46 |
| 68 | 31 |
| 69 | 50 |
| 70 | 56 |
| 71 | 84 |
| 72 | 34 |
| 73 | 63 |
| 74 | 52 |
| 75 | 91 |
| 76 | 67 |
| 77 | 97 |
| 78 | 106 |
| 79 | 137 |
| 80 | 39 |

-continued

| Table Z3, having a sequence length of 256: | |
|---|---|
| Polarized channel sequence number | Reliability or sequence number of reliability |
| 81 | 59 |
| 82 | 68 |
| 83 | 100 |
| 84 | 75 |
| 85 | 103 |
| 86 | 112 |
| 87 | 146 |
| 88 | 82 |
| 89 | 115 |
| 90 | 120 |
| 91 | 152 |
| 92 | 127 |
| 93 | 162 |
| 94 | 167 |
| 95 | 201 |
| 96 | 45 |
| 97 | 72 |
| 98 | 79 |
| 99 | 109 |
| 100 | 87 |
| 101 | 116 |
| 102 | 123 |
| 103 | 159 |
| 104 | 92 |
| 105 | 124 |
| 106 | 132 |
| 107 | 166 |
| 108 | 140 |
| 109 | 170 |
| 110 | 177 |
| 111 | 207 |
| 112 | 102 |
| 113 | 135 |
| 114 | 142 |
| 115 | 173 |
| 116 | 148 |
| 117 | 179 |
| 118 | 184 |
| 119 | 212 |
| 120 | 158 |
| 121 | 186 |
| 122 | 191 |
| 123 | 217 |
| 124 | 196 |
| 125 | 220 |
| 126 | 227 |
| 127 | 243 |
| 128 | 13 |
| 129 | 25 |
| 130 | 36 |
| 131 | 58 |
| 132 | 29 |
| 133 | 66 |
| 134 | 62 |
| 135 | 104 |
| 136 | 40 |
| 137 | 69 |
| 138 | 74 |
| 139 | 110 |
| 140 | 80 |
| 141 | 118 |
| 142 | 119 |
| 143 | 156 |
| 144 | 48 |
| 145 | 77 |
| 146 | 83 |
| 147 | 117 |
| 148 | 88 |
| 149 | 125 |
| 150 | 131 |
| 151 | 163 |
| 152 | 98 |
| 153 | 130 |
| 154 | 136 |

-continued

| Table Z3, having a sequence length of 256: | |
|---|---|
| Polarized channel sequence number | Reliability or sequence number of reliability |
| 155 | 169 |
| 156 | 145 |
| 157 | 175 |
| 158 | 182 |
| 159 | 211 |
| 160 | 53 |
| 161 | 85 |
| 162 | 96 |
| 163 | 129 |
| 164 | 93 |
| 165 | 134 |
| 166 | 139 |
| 167 | 174 |
| 168 | 108 |
| 169 | 144 |
| 170 | 149 |
| 171 | 180 |
| 172 | 157 |
| 173 | 185 |
| 174 | 190 |
| 175 | 216 |
| 176 | 113 |
| 177 | 151 |
| 178 | 160 |
| 179 | 188 |
| 180 | 165 |
| 181 | 195 |
| 182 | 199 |
| 183 | 222 |
| 184 | 172 |
| 185 | 202 |
| 186 | 204 |
| 187 | 224 |
| 188 | 209 |
| 189 | 231 |
| 190 | 234 |
| 191 | 247 |
| 192 | 55 |
| 193 | 94 |
| 194 | 105 |
| 195 | 143 |
| 196 | 111 |
| 197 | 150 |
| 198 | 154 |
| 199 | 187 |
| 200 | 121 |
| 201 | 153 |
| 202 | 161 |
| 203 | 194 |
| 204 | 168 |
| 205 | 197 |
| 206 | 203 |
| 207 | 225 |
| 208 | 128 |
| 209 | 164 |
| 210 | 171 |
| 211 | 200 |
| 212 | 178 |
| 213 | 205 |
| 214 | 208 |
| 215 | 229 |
| 216 | 183 |
| 217 | 210 |
| 218 | 214 |
| 219 | 232 |
| 220 | 219 |
| 221 | 236 |
| 222 | 238 |
| 223 | 249 |
| 224 | 138 |
| 225 | 176 |
| 226 | 181 |
| 227 | 206 |
| 228 | 189 |

-continued

| Table Z3, having a sequence length of 256: | |
|---|---|
| Polarized channel sequence number | Reliability or sequence number of reliability |
| 229 | 213 |
| 230 | 215 |
| 231 | 235 |
| 232 | 193 |
| 233 | 218 |
| 234 | 221 |
| 235 | 237 |
| 236 | 226 |
| 237 | 239 |
| 238 | 241 |
| 239 | 250 |
| 240 | 198 |
| 241 | 223 |
| 242 | 228 |
| 243 | 240 |
| 244 | 230 |
| 245 | 242 |
| 246 | 244 |
| 247 | 251 |
| 248 | 233 |
| 249 | 245 |
| 250 | 246 |
| 251 | 252 |
| 252 | 248 |
| 253 | 253 |
| 254 | 254 |
| 255 | 255 |

Sequence Z4, having a sequence length of 128:

[0, 1, 4, 9, 2, 11, 7, 21, 3, 13, 16, 24, 10, 27, 30, 51, 5, 15, 12, 26, 17, 32, 37, 54, 19, 39, 33, 59, 43, 63, 66, 90, 6, 14, 18, 34, 22, 38, 36, 61, 25, 42, 47, 64, 49, 69, 72, 93, 29, 45, 52, 71, 55, 75, 77, 96, 58, 79, 83, 100, 86, 103, 106, 119, 8, 20, 23, 41, 28, 44, 48, 68, 31, 53, 46, 73, 56, 76, 82, 98, 35, 50, 57, 78, 62, 81, 85, 102, 67, 87, 89, 105, 94, 109, 111, 121, 40, 60, 65, 84, 70, 88, 91, 108, 74, 92, 95, 110, 99, 112, 114, 122, 80, 97, 101, 113, 104, 115, 116, 123, 107, 117, 118, 124, 120, 125,

| Table Z4, having a sequence length of 128: | |
|---|---|
| Polarized channel sequence number | Reliability or sequence number of reliability |
| 0 | 0 |
| 1 | 1 |
| 2 | 4 |
| 3 | 9 |
| 4 | 2 |
| 5 | 11 |
| 6 | 7 |
| 7 | 21 |
| 8 | 3 |
| 9 | 13 |
| 10 | 16 |
| 11 | 24 |
| 12 | 10 |
| 13 | 27 |
| 14 | 30 |
| 15 | 51 |
| 16 | 5 |
| 17 | 15 |
| 18 | 12 |
| 19 | 26 |
| 20 | 17 |
| 21 | 32 |
| 22 | 37 |
| 23 | 54 |
| 24 | 19 |
| 25 | 39 |

-continued

| Table Z4, having a sequence length of 128: | |
|---|---|
| Polarized channel sequence number | Reliability or sequence number of reliability |
| 26 | 33 |
| 27 | 59 |
| 28 | 43 |
| 29 | 63 |
| 30 | 66 |
| 31 | 90 |
| 32 | 6 |
| 33 | 14 |
| 34 | 18 |
| 35 | 34 |
| 36 | 22 |
| 37 | 38 |
| 38 | 36 |
| 39 | 61 |
| 40 | 25 |
| 41 | 42 |
| 42 | 47 |
| 43 | 64 |
| 44 | 49 |
| 45 | 69 |
| 46 | 72 |
| 47 | 93 |
| 48 | 29 |
| 49 | 45 |
| 50 | 52 |
| 51 | 71 |
| 52 | 55 |
| 53 | 75 |
| 54 | 77 |
| 55 | 96 |
| 56 | 58 |
| 57 | 79 |
| 58 | 83 |
| 59 | 100 |
| 60 | 86 |
| 61 | 103 |
| 62 | 106 |
| 63 | 119 |
| 64 | 8 |
| 65 | 20 |
| 66 | 23 |
| 67 | 41 |
| 68 | 28 |
| 69 | 44 |
| 70 | 48 |
| 71 | 68 |
| 72 | 31 |
| 73 | 53 |
| 74 | 46 |
| 75 | 73 |
| 76 | 56 |
| 77 | 76 |
| 78 | 82 |
| 79 | 98 |
| 80 | 35 |
| 81 | 50 |
| 82 | 57 |
| 83 | 78 |
| 84 | 62 |
| 85 | 81 |
| 86 | 85 |
| 87 | 102 |
| 88 | 67 |
| 89 | 87 |
| 90 | 89 |
| 91 | 105 |
| 92 | 94 |
| 93 | 109 |
| 94 | 111 |
| 95 | 121 |
| 96 | 40 |
| 97 | 60 |
| 98 | 65 |
| 99 | 84 |

-continued

| Table Z4, having a sequence length of 128: | |
|---|---|
| Polarized channel sequence number | Reliability or sequence number of reliability |
| 100 | 70 |
| 101 | 88 |
| 102 | 91 |
| 103 | 108 |
| 104 | 74 |
| 105 | 92 |
| 106 | 95 |
| 107 | 110 |
| 108 | 99 |
| 109 | 112 |
| 110 | 114 |
| 111 | 122 |
| 112 | 80 |
| 113 | 97 |
| 114 | 101 |
| 115 | 113 |
| 116 | 104 |
| 117 | 115 |
| 118 | 116 |
| 119 | 123 |
| 120 | 107 |
| 121 | 117 |
| 122 | 118 |
| 123 | 124 |
| 124 | 120 |
| 125 | 125 |
| 126 | 126 |
| 127 | 127 |

Sequence Z5, having a sequence length of 64:

[0, 1, 4, 8, 2, 10, 7, 19, 3, 12, 15, 21, 9, 24, 26, 39, 5, 14, 11, 23, 16, 27, 31, 41, 18, 33, 28, 44, 35, 46, 48, 57, 6, 13, 17, 29, 20, 32, 30, 45, 22, 34, 37, 47, 38, 49, 51, 58, 25, 36, 40, 50, 42, 52, 53, 59, 43, 54, 55, 60, 56, 61, 62, 63]

| Table Z5, having a sequence length of 64: | |
|---|---|
| Polarized channel sequence number | Reliability or sequence number of reliability |
| 0 | 0 |
| 1 | 1 |
| 2 | 4 |
| 3 | 8 |
| 4 | 2 |
| 5 | 10 |
| 6 | 7 |
| 7 | 19 |
| 8 | 3 |
| 9 | 12 |
| 10 | 15 |
| 11 | 21 |
| 12 | 9 |
| 13 | 24 |
| 14 | 26 |
| 15 | 39 |
| 16 | 5 |
| 17 | 14 |
| 18 | 11 |
| 19 | 23 |
| 20 | 16 |
| 21 | 27 |
| 22 | 31 |
| 23 | 41 |
| 24 | 18 |
| 25 | 33 |
| 26 | 28 |
| 27 | 44 |
| 28 | 35 |
| 29 | 46 |
| 30 | 48 |

-continued

| Table Z5, having a sequence length of 64: | |
|---|---|
| Polarized channel sequence number | Reliability or sequence number of reliability |
| 31 | 57 |
| 32 | 6 |
| 33 | 13 |
| 34 | 17 |
| 35 | 29 |
| 36 | 20 |
| 37 | 32 |
| 38 | 30 |
| 39 | 45 |
| 40 | 22 |
| 41 | 34 |
| 42 | 37 |
| 43 | 47 |
| 44 | 38 |
| 45 | 49 |
| 46 | 51 |
| 47 | 58 |
| 48 | 25 |
| 49 | 36 |
| 50 | 40 |
| 51 | 50 |
| 52 | 42 |
| 53 | 52 |
| 54 | 53 |
| 55 | 59 |
| 56 | 43 |
| 57 | 54 |
| 58 | 55 |
| 59 | 60 |
| 60 | 56 |
| 61 | 61 |
| 62 | 62 |
| 63 | 63 |

Second group of sequences (obtained by using a criterion that comprehensively considers performance obtained by List (list) whose sizes are respectively 1, 2, 4, 8, and 16, and preferentially considers performance of Lists 1 and 16).

Sequence Q6, having a sequence length of 1024:

[0, 1, 2, 4, 8, 16, 32, 3, 5, 64, 9, 6, 17, 10, 18, 128, 12, 33, 256, 36, 24, 20, 65, 34, 7, 129, 66, 512, 11, 40, 68, 13, 19, 130, 48, 14, 72, 257, 21, 132, 35, 258, 26, 513, 80, 37, 25, 22, 136, 38, 260, 96, 514, 264, 67, 41, 144, 28, 69, 42, 516, 49, 74, 272, 160, 520, 288, 528, 70, 131, 544, 192, 44, 81, 50, 73, 133, 15, 52, 320, 23, 134, 76, 82, 56, 384, 137, 97, 27, 39, 259, 84, 138, 145, 261, 29, 43, 98, 515, 88, 140, 30, 146, 71, 262, 265, 161, 576, 45, 100, 640, 51, 148, 46, 75, 266, 273, 517, 104, 162, 53, 193, 152, 77, 164, 768, 268, 274, 518, 54, 83, 57, 521, 112, 135, 78, 289, 194, 85, 276, 522, 58, 168, 139, 99, 86, 60, 280, 89, 290, 529, 524, 196, 141, 101, 147, 176, 142, 530, 31, 292, 200, 263, 90, 149, 321, 322, 102, 545, 105, 532, 92, 47, 296, 163, 150, 546, 208, 385, 267, 304, 324, 153, 165, 536, 386, 106, 55, 328, 577, 548, 113, 154, 79, 224, 108, 269, 166, 578, 519, 552, 195, 270, 641, 523, 580, 560, 275, 59, 169, 156, 291, 277, 114, 87, 197, 116, 170, 61, 531, 525, 642, 281, 278, 526, 177, 293, 388, 91, 584, 769, 198, 172, 120, 201, 336, 62, 282, 143, 103, 178, 294, 93, 644, 202, 592, 323, 392, 297, 151, 209, 284, 180, 107, 94, 204, 770, 648, 298, 352, 533, 325, 608, 155, 210, 400, 305, 547, 300, 109, 184, 534, 772, 326, 656, 115, 167, 157, 537, 225, 306, 329, 110, 117, 212, 171, 330, 226, 549, 776, 538, 387, 308, 216, 416, 672, 337, 158, 271, 118, 279, 550, 332, 579, 540, 389, 173, 121, 553, 199, 784, 179, 228, 338, 312, 704, 390, 122, 554, 581, 393, 283, 174, 203, 340, 448, 561, 353, 394, 181, 527, 582, 556, 63, 295, 285, 232, 124, 643, 585, 562, 205, 182, 286, 299, 354, 211, 401, 185, 396, 344, 586, 645, 593, 535, 240, 206, 95, 327, 564, 800, 402, 356, 307, 301, 417, 186, 404, 213, 418, 539, 568, 594, 649, 771, 227, 832, 588, 646, 302, 111, 360, 214, 551, 609, 896, 188, 309, 449, 331, 217, 408, 229, 541, 159, 420, 596, 650, 773, 310, 333, 119, 339, 218, 368, 657, 230, 391, 542, 610, 233, 313, 334, 774, 658, 612, 175, 123, 314, 555, 600, 583, 341, 450, 652, 220, 557, 424, 395, 777, 673, 355, 287, 183, 234, 125, 241, 563, 660, 558, 616, 778, 674, 316, 342, 345, 397, 452, 432, 207, 785, 403, 357, 187, 587, 565, 664, 624, 780, 236, 126, 242, 398, 705, 346, 456, 358, 405, 303, 569, 595, 244, 786, 189, 676, 589, 566, 647, 361, 706, 215, 348, 419, 406, 464, 801, 590, 409, 680, 788, 362, 570, 597, 572, 311, 708, 219, 598, 601, 651, 611, 410, 802, 421, 792, 231, 602, 653, 248, 688, 369, 190, 480, 335, 364, 613, 659, 654, 422, 315, 221, 370, 425, 235, 451, 412, 343, 372, 317, 614, 775, 222, 543, 426, 453, 237, 559, 833, 804, 712, 834, 661, 808, 779, 617, 604, 433, 720, 816, 836, 347, 897, 243, 662, 454, 318, 675, 376, 567, 618, 665, 736, 898, 840, 781, 428, 625, 238, 359, 458, 399, 245, 434, 677, 457, 591, 349, 127, 666, 787, 678, 620, 782, 626, 571, 191, 407, 350, 436, 465, 246, 460, 363, 681, 599, 249, 411, 668, 707, 573, 789, 803, 790, 682, 365, 440, 628, 709, 374, 423, 466, 250, 371, 689, 793, 481, 413, 603, 574, 366, 468, 655, 900, 805, 429, 615, 710, 252, 373, 848, 684, 713, 605, 690, 632, 482, 794, 806, 427, 414, 663, 835, 904, 809, 714, 619, 796, 472, 223, 455, 692, 721, 837, 716, 864, 810, 606, 912, 722, 696, 377, 817, 435, 812, 319, 484, 430, 621, 838, 667, 239, 461, 378, 459, 627, 622, 437, 488, 380, 818, 496, 669, 679, 724, 841, 629, 351, 467, 438, 737, 251, 462, 442, 441, 469, 247, 683, 842, 738, 899, 670, 783, 849, 820, 728, 928, 791, 367, 901, 630, 685, 844, 633, 711, 253, 691, 824, 902, 686, 740, 850, 375, 444, 470, 483, 415, 485, 905, 795, 473, 634, 744, 852, 960, 865, 693, 797, 906, 715, 807, 474, 636, 694, 254, 717, 575, 811, 697, 866, 798, 379, 431, 913, 607, 489, 723, 486, 908, 718, 813, 476, 856, 839, 725, 698, 914, 752, 868, 819, 814, 439, 929, 490, 623, 671, 739, 916, 872, 381, 930, 497, 821, 463, 726, 961, 843, 492, 631, 729, 700, 443, 741, 845, 920, 382, 822, 851, 730, 498, 880, 742, 445, 903, 687, 825, 932, 471, 635, 846, 500, 745, 962, 826, 732, 446, 936, 255, 853, 475, 753, 695, 867, 637, 907, 487, 746, 828, 854, 504, 799, 909, 857, 964, 719, 477, 915, 699, 493, 748, 944, 858, 873, 638, 968, 478, 383, 754, 869, 491, 910, 815, 917, 727, 870, 701, 931, 499, 860, 756, 922, 731, 976, 918, 874, 823, 502, 933, 743, 760, 881, 494, 702, 921, 827, 876, 501, 847, 992, 934, 447, 733, 882, 937, 963, 747, 505, 855, 924, 734, 829, 965, 884, 938, 506, 749, 945, 966, 755, 859, 940, 830, 911, 871, 639, 888, 479, 946, 750, 969, 508, 861, 757, 970, 919, 875, 862, 758, 948, 977, 923, 972, 761, 877, 952, 495, 703, 935, 978, 883, 762, 503, 925, 878, 735, 993, 885, 939, 994, 980, 926, 764, 941, 967, 886, 831, 947, 507, 889, 984, 751, 942, 996, 971, 890, 509, 949, 973, 1000, 892, 950, 863, 759, 1008, 510, 979, 953, 763, 974, 954, 879, 981, 982, 927, 995, 765, 956, 887, 985, 997, 986, 943, 891, 998, 766, 511, 988, 1001, 951, 1002, 893, 975, 894, 1009, 955, 1004, 1010, 957, 983, 958, 987, 1012, 999, 1016, 767, 989, 1003, 990, 1005, 959, 1011, 1013, 895, 1006, 1014, 1017, 1018, 991, 1020, 1007, 1015, 1019, 1021, 1022, 1023]

Table Q6, having a sequence length of 1024:

| Reliability or sequence number of reliability | Polarized channel sequence number |
|---|---|
| 0 | 0 |
| 1 | 1 |
| 2 | 2 |
| 3 | 4 |
| 4 | 8 |
| 5 | 16 |
| 6 | 32 |
| 7 | 3 |
| 8 | 5 |
| 9 | 64 |
| 10 | 9 |
| 11 | 6 |
| 12 | 17 |
| 13 | 10 |
| 14 | 18 |
| 15 | 128 |
| 16 | 12 |
| 17 | 33 |
| 18 | 256 |
| 19 | 36 |
| 20 | 24 |
| 21 | 20 |
| 22 | 65 |
| 23 | 34 |
| 24 | 7 |
| 25 | 129 |
| 26 | 66 |
| 27 | 512 |
| 28 | 11 |
| 29 | 40 |
| 30 | 68 |
| 31 | 13 |
| 32 | 19 |
| 33 | 130 |
| 34 | 48 |
| 35 | 14 |
| 36 | 72 |
| 37 | 257 |
| 38 | 21 |
| 39 | 132 |
| 40 | 35 |
| 41 | 258 |
| 42 | 26 |
| 43 | 513 |
| 44 | 80 |
| 45 | 37 |
| 46 | 25 |
| 47 | 22 |
| 48 | 136 |
| 49 | 38 |
| 50 | 260 |
| 51 | 96 |
| 52 | 514 |
| 53 | 264 |
| 54 | 67 |
| 55 | 41 |
| 56 | 144 |
| 57 | 28 |
| 58 | 69 |
| 59 | 42 |
| 60 | 516 |
| 61 | 49 |
| 62 | 74 |
| 63 | 272 |
| 64 | 160 |
| 65 | 520 |
| 66 | 288 |
| 67 | 528 |
| 68 | 70 |
| 69 | 131 |
| 70 | 544 |
| 71 | 192 |
| 72 | 44 |
| 73 | 81 |
| 74 | 50 |
| 75 | 73 |
| 76 | 133 |

-continued

| Table Q6, having a sequence length of 1024: | |
|---|---|
| Reliability or sequence number of reliability | Polarized channel sequence number |
| 77 | 15 |
| 78 | 52 |
| 79 | 320 |
| 80 | 23 |
| 81 | 134 |
| 82 | 76 |
| 83 | 82 |
| 84 | 56 |
| 85 | 384 |
| 86 | 137 |
| 87 | 97 |
| 88 | 27 |
| 89 | 39 |
| 90 | 259 |
| 91 | 84 |
| 92 | 138 |
| 93 | 145 |
| 94 | 261 |
| 95 | 29 |
| 96 | 43 |
| 97 | 98 |
| 98 | 515 |
| 99 | 88 |
| 100 | 140 |
| 101 | 30 |
| 102 | 146 |
| 103 | 71 |
| 104 | 262 |
| 105 | 265 |
| 106 | 161 |
| 107 | 576 |
| 108 | 45 |
| 109 | 100 |
| 110 | 640 |
| 111 | 51 |
| 112 | 148 |
| 113 | 46 |
| 114 | 75 |
| 115 | 266 |
| 116 | 273 |
| 117 | 517 |
| 118 | 104 |
| 119 | 162 |
| 120 | 53 |
| 121 | 193 |
| 122 | 152 |
| 123 | 77 |
| 124 | 164 |
| 125 | 768 |
| 126 | 268 |
| 127 | 274 |
| 128 | 518 |
| 129 | 54 |
| 130 | 83 |
| 131 | 57 |
| 132 | 521 |
| 133 | 112 |
| 134 | 135 |
| 135 | 78 |
| 136 | 289 |
| 137 | 194 |
| 138 | 85 |
| 139 | 276 |
| 140 | 522 |
| 141 | 58 |
| 142 | 168 |
| 143 | 139 |
| 144 | 99 |
| 145 | 86 |
| 146 | 60 |
| 147 | 280 |
| 148 | 89 |
| 149 | 290 |
| 150 | 529 |

-continued

| Table Q6, having a sequence length of 1024: | |
|---|---|
| Reliability or sequence number of reliability | Polarized channel sequence number |
| 151 | 524 |
| 152 | 196 |
| 153 | 141 |
| 154 | 101 |
| 155 | 147 |
| 156 | 176 |
| 157 | 142 |
| 158 | 530 |
| 159 | 31 |
| 160 | 292 |
| 161 | 200 |
| 162 | 263 |
| 163 | 90 |
| 164 | 149 |
| 165 | 321 |
| 166 | 322 |
| 167 | 102 |
| 168 | 545 |
| 169 | 105 |
| 170 | 532 |
| 171 | 92 |
| 172 | 47 |
| 173 | 296 |
| 174 | 163 |
| 175 | 150 |
| 176 | 546 |
| 177 | 208 |
| 178 | 385 |
| 179 | 267 |
| 180 | 304 |
| 181 | 324 |
| 182 | 153 |
| 183 | 165 |
| 184 | 536 |
| 185 | 386 |
| 186 | 106 |
| 187 | 55 |
| 188 | 328 |
| 189 | 577 |
| 190 | 548 |
| 191 | 113 |
| 192 | 154 |
| 193 | 79 |
| 194 | 224 |
| 195 | 108 |
| 196 | 269 |
| 197 | 166 |
| 198 | 578 |
| 199 | 519 |
| 200 | 552 |
| 201 | 195 |
| 202 | 270 |
| 203 | 641 |
| 204 | 523 |
| 205 | 580 |
| 206 | 560 |
| 207 | 275 |
| 208 | 59 |
| 209 | 169 |
| 210 | 156 |
| 211 | 291 |
| 212 | 277 |
| 213 | 114 |
| 214 | 87 |
| 215 | 197 |
| 216 | 116 |
| 217 | 170 |
| 218 | 61 |
| 219 | 531 |
| 220 | 525 |
| 221 | 642 |
| 222 | 281 |
| 223 | 278 |
| 224 | 526 |

-continued

Table Q6, having a sequence length of 1024:

| Reliability or sequence number of reliability | Polarized channel sequence number |
|---|---|
| 225 | 177 |
| 226 | 293 |
| 227 | 388 |
| 228 | 91 |
| 229 | 584 |
| 230 | 769 |
| 231 | 198 |
| 232 | 172 |
| 233 | 120 |
| 234 | 201 |
| 235 | 336 |
| 236 | 62 |
| 237 | 282 |
| 238 | 143 |
| 239 | 103 |
| 240 | 178 |
| 241 | 294 |
| 242 | 93 |
| 243 | 644 |
| 244 | 202 |
| 245 | 592 |
| 246 | 323 |
| 247 | 392 |
| 248 | 297 |
| 249 | 151 |
| 250 | 209 |
| 251 | 284 |
| 252 | 180 |
| 253 | 107 |
| 254 | 94 |
| 255 | 204 |
| 256 | 770 |
| 257 | 648 |
| 258 | 298 |
| 259 | 352 |
| 260 | 533 |
| 261 | 325 |
| 262 | 608 |
| 263 | 155 |
| 264 | 210 |
| 265 | 400 |
| 266 | 305 |
| 267 | 547 |
| 268 | 300 |
| 269 | 109 |
| 270 | 184 |
| 271 | 534 |
| 272 | 772 |
| 273 | 326 |
| 274 | 656 |
| 275 | 115 |
| 276 | 167 |
| 277 | 157 |
| 278 | 537 |
| 279 | 225 |
| 280 | 306 |
| 281 | 329 |
| 282 | 110 |
| 283 | 117 |
| 284 | 212 |
| 285 | 171 |
| 286 | 330 |
| 287 | 226 |
| 288 | 549 |
| 289 | 776 |
| 290 | 538 |
| 291 | 387 |
| 292 | 308 |
| 293 | 216 |
| 294 | 416 |
| 295 | 672 |
| 296 | 337 |
| 297 | 158 |
| 298 | 271 |

-continued

Table Q6, having a sequence length of 1024:

| Reliability or sequence number of reliability | Polarized channel sequence number |
|---|---|
| 299 | 118 |
| 300 | 279 |
| 301 | 550 |
| 302 | 332 |
| 303 | 579 |
| 304 | 540 |
| 305 | 389 |
| 306 | 173 |
| 307 | 121 |
| 308 | 553 |
| 309 | 199 |
| 310 | 784 |
| 311 | 179 |
| 312 | 228 |
| 313 | 338 |
| 314 | 312 |
| 315 | 704 |
| 316 | 390 |
| 317 | 122 |
| 318 | 554 |
| 319 | 581 |
| 320 | 393 |
| 321 | 283 |
| 322 | 174 |
| 323 | 203 |
| 324 | 340 |
| 325 | 448 |
| 326 | 561 |
| 327 | 353 |
| 328 | 394 |
| 329 | 181 |
| 330 | 527 |
| 331 | 582 |
| 332 | 556 |
| 333 | 63 |
| 334 | 295 |
| 335 | 285 |
| 336 | 232 |
| 337 | 124 |
| 338 | 643 |
| 339 | 585 |
| 340 | 562 |
| 341 | 205 |
| 342 | 182 |
| 343 | 286 |
| 344 | 299 |
| 345 | 354 |
| 346 | 211 |
| 347 | 401 |
| 348 | 185 |
| 349 | 396 |
| 350 | 344 |
| 351 | 586 |
| 352 | 645 |
| 353 | 593 |
| 354 | 535 |
| 355 | 240 |
| 356 | 206 |
| 357 | 95 |
| 358 | 327 |
| 359 | 564 |
| 360 | 800 |
| 361 | 402 |
| 362 | 356 |
| 363 | 307 |
| 364 | 301 |
| 365 | 417 |
| 366 | 186 |
| 367 | 404 |
| 368 | 213 |
| 369 | 418 |
| 370 | 539 |
| 371 | 568 |
| 372 | 594 |

-continued

Table Q6, having a sequence length of 1024:

| Reliability or sequence number of reliability | Polarized channel sequence number |
|---|---|
| 373 | 649 |
| 374 | 771 |
| 375 | 227 |
| 376 | 832 |
| 377 | 588 |
| 378 | 646 |
| 379 | 302 |
| 380 | 111 |
| 381 | 360 |
| 382 | 214 |
| 383 | 551 |
| 384 | 609 |
| 385 | 896 |
| 386 | 188 |
| 387 | 309 |
| 388 | 449 |
| 389 | 331 |
| 390 | 217 |
| 391 | 408 |
| 392 | 229 |
| 393 | 541 |
| 394 | 159 |
| 395 | 420 |
| 396 | 596 |
| 397 | 650 |
| 398 | 773 |
| 399 | 310 |
| 400 | 333 |
| 401 | 119 |
| 402 | 339 |
| 403 | 218 |
| 404 | 368 |
| 405 | 657 |
| 406 | 230 |
| 407 | 391 |
| 408 | 542 |
| 409 | 610 |
| 410 | 233 |
| 411 | 313 |
| 412 | 334 |
| 413 | 774 |
| 414 | 658 |
| 415 | 612 |
| 416 | 175 |
| 417 | 123 |
| 418 | 314 |
| 419 | 555 |
| 420 | 600 |
| 421 | 583 |
| 422 | 341 |
| 423 | 450 |
| 424 | 652 |
| 425 | 220 |
| 426 | 557 |
| 427 | 424 |
| 428 | 395 |
| 429 | 777 |
| 430 | 673 |
| 431 | 355 |
| 432 | 287 |
| 433 | 183 |
| 434 | 234 |
| 435 | 125 |
| 436 | 241 |
| 437 | 563 |
| 438 | 660 |
| 439 | 558 |
| 440 | 616 |
| 441 | 778 |
| 442 | 674 |
| 443 | 316 |
| 444 | 342 |
| 445 | 345 |
| 446 | 397 |

-continued

Table Q6, having a sequence length of 1024:

| Reliability or sequence number of reliability | Polarized channel sequence number |
|---|---|
| 447 | 452 |
| 448 | 432 |
| 449 | 207 |
| 450 | 785 |
| 451 | 403 |
| 452 | 357 |
| 453 | 187 |
| 454 | 587 |
| 455 | 565 |
| 456 | 664 |
| 457 | 624 |
| 458 | 780 |
| 459 | 236 |
| 460 | 126 |
| 461 | 242 |
| 462 | 398 |
| 463 | 705 |
| 464 | 346 |
| 465 | 456 |
| 466 | 358 |
| 467 | 405 |
| 468 | 303 |
| 469 | 569 |
| 470 | 595 |
| 471 | 244 |
| 472 | 786 |
| 473 | 189 |
| 474 | 676 |
| 475 | 589 |
| 476 | 566 |
| 477 | 647 |
| 478 | 361 |
| 479 | 706 |
| 480 | 215 |
| 481 | 348 |
| 482 | 419 |
| 483 | 406 |
| 484 | 464 |
| 485 | 801 |
| 486 | 590 |
| 487 | 409 |
| 488 | 680 |
| 489 | 788 |
| 490 | 362 |
| 491 | 570 |
| 492 | 597 |
| 493 | 572 |
| 494 | 311 |
| 495 | 708 |
| 496 | 219 |
| 497 | 598 |
| 498 | 601 |
| 499 | 651 |
| 500 | 611 |
| 501 | 410 |
| 502 | 802 |
| 503 | 421 |
| 504 | 792 |
| 505 | 231 |
| 506 | 602 |
| 507 | 653 |
| 508 | 248 |
| 509 | 688 |
| 510 | 369 |
| 511 | 190 |
| 512 | 480 |
| 513 | 335 |
| 514 | 364 |
| 515 | 613 |
| 516 | 659 |
| 517 | 654 |
| 518 | 422 |
| 519 | 315 |
| 520 | 221 |

-continued

Table Q6, having a sequence length of 1024:

| Reliability or sequence number of reliability | Polarized channel sequence number |
|---|---|
| 521 | 370 |
| 522 | 425 |
| 523 | 235 |
| 524 | 451 |
| 525 | 412 |
| 526 | 343 |
| 527 | 372 |
| 528 | 317 |
| 529 | 614 |
| 530 | 775 |
| 531 | 222 |
| 532 | 543 |
| 533 | 426 |
| 534 | 453 |
| 535 | 237 |
| 536 | 559 |
| 537 | 833 |
| 538 | 804 |
| 539 | 712 |
| 540 | 834 |
| 541 | 661 |
| 542 | 808 |
| 543 | 779 |
| 544 | 617 |
| 545 | 604 |
| 546 | 433 |
| 547 | 720 |
| 548 | 816 |
| 549 | 836 |
| 550 | 347 |
| 551 | 897 |
| 552 | 243 |
| 553 | 662 |
| 554 | 454 |
| 555 | 318 |
| 556 | 675 |
| 557 | 376 |
| 558 | 567 |
| 559 | 618 |
| 560 | 665 |
| 561 | 736 |
| 562 | 898 |
| 563 | 840 |
| 564 | 781 |
| 565 | 428 |
| 566 | 625 |
| 567 | 238 |
| 568 | 359 |
| 569 | 458 |
| 570 | 399 |
| 571 | 245 |
| 572 | 434 |
| 573 | 677 |
| 574 | 457 |
| 575 | 591 |
| 576 | 349 |
| 577 | 127 |
| 578 | 666 |
| 579 | 787 |
| 580 | 678 |
| 581 | 620 |
| 582 | 782 |
| 583 | 626 |
| 584 | 571 |
| 585 | 191 |
| 586 | 407 |
| 587 | 350 |
| 588 | 436 |
| 589 | 465 |
| 590 | 246 |
| 591 | 460 |
| 592 | 363 |
| 593 | 681 |
| 594 | 599 |

-continued

Table Q6, having a sequence length of 1024:

| Reliability or sequence number of reliability | Polarized channel sequence number |
|---|---|
| 595 | 249 |
| 596 | 411 |
| 597 | 668 |
| 598 | 707 |
| 599 | 573 |
| 600 | 789 |
| 601 | 803 |
| 602 | 790 |
| 603 | 682 |
| 604 | 365 |
| 605 | 440 |
| 606 | 628 |
| 607 | 709 |
| 608 | 374 |
| 609 | 423 |
| 610 | 466 |
| 611 | 250 |
| 612 | 371 |
| 613 | 689 |
| 614 | 793 |
| 615 | 481 |
| 616 | 413 |
| 617 | 603 |
| 618 | 574 |
| 619 | 366 |
| 620 | 468 |
| 621 | 655 |
| 622 | 900 |
| 623 | 805 |
| 624 | 429 |
| 625 | 615 |
| 626 | 710 |
| 627 | 252 |
| 628 | 373 |
| 629 | 848 |
| 630 | 684 |
| 631 | 713 |
| 632 | 605 |
| 633 | 690 |
| 634 | 632 |
| 635 | 482 |
| 636 | 794 |
| 637 | 806 |
| 638 | 427 |
| 639 | 414 |
| 640 | 663 |
| 641 | 835 |
| 642 | 904 |
| 643 | 809 |
| 644 | 714 |
| 645 | 619 |
| 646 | 796 |
| 647 | 472 |
| 648 | 223 |
| 649 | 455 |
| 650 | 692 |
| 651 | 721 |
| 652 | 837 |
| 653 | 716 |
| 654 | 864 |
| 655 | 810 |
| 656 | 606 |
| 657 | 912 |
| 658 | 722 |
| 659 | 696 |
| 660 | 377 |
| 661 | 817 |
| 662 | 435 |
| 663 | 812 |
| 664 | 319 |
| 665 | 484 |
| 666 | 430 |
| 667 | 621 |
| 668 | 838 |

-continued

Table Q6, having a sequence length of 1024:

| Reliability or sequence number of reliability | Polarized channel sequence number |
|---|---|
| 669 | 667 |
| 670 | 239 |
| 671 | 461 |
| 672 | 378 |
| 673 | 459 |
| 674 | 627 |
| 675 | 622 |
| 676 | 437 |
| 677 | 488 |
| 678 | 380 |
| 679 | 818 |
| 680 | 496 |
| 681 | 669 |
| 682 | 679 |
| 683 | 724 |
| 684 | 841 |
| 685 | 629 |
| 686 | 351 |
| 687 | 467 |
| 688 | 438 |
| 689 | 737 |
| 690 | 251 |
| 691 | 462 |
| 692 | 442 |
| 693 | 441 |
| 694 | 469 |
| 695 | 247 |
| 696 | 683 |
| 697 | 842 |
| 698 | 738 |
| 699 | 899 |
| 700 | 670 |
| 701 | 783 |
| 702 | 849 |
| 703 | 820 |
| 704 | 728 |
| 705 | 928 |
| 706 | 791 |
| 707 | 367 |
| 708 | 901 |
| 709 | 630 |
| 710 | 685 |
| 711 | 844 |
| 712 | 633 |
| 713 | 711 |
| 714 | 253 |
| 715 | 691 |
| 716 | 824 |
| 717 | 902 |
| 718 | 686 |
| 719 | 740 |
| 720 | 850 |
| 721 | 375 |
| 722 | 444 |
| 723 | 470 |
| 724 | 483 |
| 725 | 415 |
| 726 | 485 |
| 727 | 905 |
| 728 | 795 |
| 729 | 473 |
| 730 | 634 |
| 731 | 744 |
| 732 | 852 |
| 733 | 960 |
| 734 | 865 |
| 735 | 693 |
| 736 | 797 |
| 737 | 906 |
| 738 | 715 |
| 739 | 807 |
| 740 | 474 |
| 741 | 636 |
| 742 | 694 |

-continued

Table Q6, having a sequence length of 1024:

| Reliability or sequence number of reliability | Polarized channel sequence number |
|---|---|
| 743 | 254 |
| 744 | 717 |
| 745 | 575 |
| 746 | 811 |
| 747 | 697 |
| 748 | 866 |
| 749 | 798 |
| 750 | 379 |
| 751 | 431 |
| 752 | 913 |
| 753 | 607 |
| 754 | 489 |
| 755 | 723 |
| 756 | 486 |
| 757 | 908 |
| 758 | 718 |
| 759 | 813 |
| 760 | 476 |
| 761 | 856 |
| 762 | 839 |
| 763 | 725 |
| 764 | 698 |
| 765 | 914 |
| 766 | 752 |
| 767 | 868 |
| 768 | 819 |
| 769 | 814 |
| 770 | 439 |
| 771 | 929 |
| 772 | 490 |
| 773 | 623 |
| 774 | 671 |
| 775 | 739 |
| 776 | 916 |
| 777 | 872 |
| 778 | 381 |
| 779 | 930 |
| 780 | 497 |
| 781 | 821 |
| 782 | 463 |
| 783 | 726 |
| 784 | 961 |
| 785 | 843 |
| 786 | 492 |
| 787 | 631 |
| 788 | 729 |
| 789 | 700 |
| 790 | 443 |
| 791 | 741 |
| 792 | 845 |
| 793 | 920 |
| 794 | 382 |
| 795 | 822 |
| 796 | 851 |
| 797 | 730 |
| 798 | 498 |
| 799 | 880 |
| 800 | 742 |
| 801 | 445 |
| 802 | 903 |
| 803 | 687 |
| 804 | 825 |
| 805 | 932 |
| 806 | 471 |
| 807 | 635 |
| 808 | 846 |
| 809 | 500 |
| 810 | 745 |
| 811 | 962 |
| 812 | 826 |
| 813 | 732 |
| 814 | 446 |
| 815 | 936 |
| 816 | 255 |

-continued

Table Q6, having a sequence length of 1024:

| Reliability or sequence number of reliability | Polarized channel sequence number |
|---|---|
| 817 | 853 |
| 818 | 475 |
| 819 | 753 |
| 820 | 695 |
| 821 | 867 |
| 822 | 637 |
| 823 | 907 |
| 824 | 487 |
| 825 | 746 |
| 826 | 828 |
| 827 | 854 |
| 828 | 504 |
| 829 | 799 |
| 830 | 909 |
| 831 | 857 |
| 832 | 964 |
| 833 | 719 |
| 834 | 477 |
| 835 | 915 |
| 836 | 699 |
| 837 | 493 |
| 838 | 748 |
| 839 | 944 |
| 840 | 858 |
| 841 | 873 |
| 842 | 638 |
| 843 | 968 |
| 844 | 478 |
| 845 | 383 |
| 846 | 754 |
| 847 | 869 |
| 848 | 491 |
| 849 | 910 |
| 850 | 815 |
| 851 | 917 |
| 852 | 727 |
| 853 | 870 |
| 854 | 701 |
| 855 | 931 |
| 856 | 499 |
| 857 | 860 |
| 858 | 756 |
| 859 | 922 |
| 860 | 731 |
| 861 | 976 |
| 862 | 918 |
| 863 | 874 |
| 864 | 823 |
| 865 | 502 |
| 866 | 933 |
| 867 | 743 |
| 868 | 760 |
| 869 | 881 |
| 870 | 494 |
| 871 | 702 |
| 872 | 921 |
| 873 | 827 |
| 874 | 876 |
| 875 | 501 |
| 876 | 847 |
| 877 | 992 |
| 878 | 934 |
| 879 | 447 |
| 880 | 733 |
| 881 | 882 |
| 882 | 937 |
| 883 | 963 |
| 884 | 747 |
| 885 | 505 |
| 886 | 855 |
| 887 | 924 |
| 888 | 734 |
| 889 | 829 |
| 890 | 965 |

-continued

Table Q6, having a sequence length of 1024:

| Reliability or sequence number of reliability | Polarized channel sequence number |
|---|---|
| 891 | 884 |
| 892 | 938 |
| 893 | 506 |
| 894 | 749 |
| 895 | 945 |
| 896 | 966 |
| 897 | 755 |
| 898 | 859 |
| 899 | 940 |
| 900 | 830 |
| 901 | 911 |
| 902 | 871 |
| 903 | 639 |
| 904 | 888 |
| 905 | 479 |
| 906 | 946 |
| 907 | 750 |
| 908 | 969 |
| 909 | 508 |
| 910 | 861 |
| 911 | 757 |
| 912 | 970 |
| 913 | 919 |
| 914 | 875 |
| 915 | 862 |
| 916 | 758 |
| 917 | 948 |
| 918 | 977 |
| 919 | 923 |
| 920 | 972 |
| 921 | 761 |
| 922 | 877 |
| 923 | 952 |
| 924 | 495 |
| 925 | 703 |
| 926 | 935 |
| 927 | 978 |
| 928 | 883 |
| 929 | 762 |
| 930 | 503 |
| 931 | 925 |
| 932 | 878 |
| 933 | 735 |
| 934 | 993 |
| 935 | 885 |
| 936 | 939 |
| 937 | 994 |
| 938 | 980 |
| 939 | 926 |
| 940 | 764 |
| 941 | 941 |
| 942 | 967 |
| 943 | 886 |
| 944 | 831 |
| 945 | 947 |
| 946 | 507 |
| 947 | 889 |
| 948 | 984 |
| 949 | 751 |
| 950 | 942 |
| 951 | 996 |
| 952 | 971 |
| 953 | 890 |
| 954 | 509 |
| 955 | 949 |
| 956 | 973 |
| 957 | 1000 |
| 958 | 892 |
| 959 | 950 |
| 960 | 863 |
| 961 | 759 |
| 962 | 1008 |
| 963 | 510 |
| 964 | 979 |

-continued

| Table Q6, having a sequence length of 1024: | |
|---|---|
| Reliability or sequence number of reliability | Polarized channel sequence number |
| 965 | 953 |
| 966 | 763 |
| 967 | 974 |
| 968 | 954 |
| 969 | 879 |
| 970 | 981 |
| 971 | 982 |
| 972 | 927 |
| 973 | 995 |
| 974 | 765 |
| 975 | 956 |
| 976 | 887 |
| 977 | 985 |
| 978 | 997 |
| 979 | 986 |
| 980 | 943 |
| 981 | 891 |
| 982 | 998 |
| 983 | 766 |
| 984 | 511 |
| 985 | 988 |
| 986 | 1001 |
| 987 | 951 |
| 988 | 1002 |
| 989 | 893 |
| 990 | 975 |
| 991 | 894 |
| 992 | 1009 |
| 993 | 955 |
| 994 | 1004 |
| 995 | 1010 |
| 996 | 957 |
| 997 | 983 |
| 998 | 958 |
| 999 | 987 |
| 1000 | 1012 |
| 1001 | 999 |
| 1002 | 1016 |
| 1003 | 767 |
| 1004 | 989 |
| 1005 | 1003 |
| 1006 | 990 |
| 1007 | 1005 |
| 1008 | 959 |
| 1009 | 1011 |
| 1010 | 1013 |
| 1011 | 895 |
| 1012 | 1006 |
| 1013 | 1014 |
| 1014 | 1017 |
| 1015 | 1018 |
| 1016 | 991 |
| 1017 | 1020 |
| 1018 | 1007 |
| 1019 | 1015 |
| 1020 | 1019 |
| 1021 | 1021 |
| 1022 | 1022 |
| 1023 | 1023 |

Sequence Q7, having a sequence length of 512:

[0, 1, 2, 4, 8, 16, 32, 3, 5, 64, 9, 6, 17, 10, 18, 128, 12, 33, 256, 36, 24, 20, 65, 34, 7, 129, 66, 11, 40, 68, 13, 19, 130, 48, 14, 72, 257, 21, 132, 35, 258, 26, 80, 37, 25, 22, 136, 38, 260, 96, 264, 67, 41, 144, 28, 69, 42, 49, 74, 272, 160, 288, 70, 131, 192, 44, 81, 50, 73, 133, 15, 52, 320, 23, 134, 76, 82, 56, 384, 137, 97, 27, 39, 259, 84, 138, 145, 261, 29, 43, 98, 88, 140, 30, 146, 71, 262, 265, 161, 45, 100, 51, 148, 46, 75, 266, 273, 104, 162, 53, 193, 152, 77, 164, 268, 274, 54, 83, 57, 112, 135, 78, 289, 194, 85, 276, 58, 168, 139, 99, 86, 60, 280, 89, 290, 196, 141, 101, 147, 176, 142, 31, 292, 200, 263, 90, 149, 321, 322, 102, 105, 92, 47, 296, 163, 150, 208, 385, 267, 304, 324, 153, 165, 386, 106, 55, 328, 113, 154, 79, 224, 108, 269, 166, 195, 270, 275, 59, 169, 156, 291, 277, 114, 87, 197, 116, 170, 61, 281, 278, 177, 293, 388, 91, 198, 172, 120, 201, 336, 62, 282, 143, 103, 178, 294, 93, 202, 323, 392, 297, 151, 209, 284, 180, 107, 94, 204, 298, 352, 325, 155, 210, 400, 305, 300, 109, 184, 326, 115, 167, 157, 225, 306, 329, 110, 117, 212, 171, 330, 226, 387, 308, 216, 416, 337, 158, 271, 118, 279, 332, 389, 173, 121, 199, 179, 228, 338, 312, 390, 122, 393, 283, 174, 203, 340, 448, 353, 394, 181, 63, 295, 285, 232, 124, 205, 182, 286, 299, 354, 211, 401, 185, 396, 344, 240, 206, 95, 327, 402, 356, 307, 301, 417, 186, 404, 213, 418, 227, 302, 111, 360, 214, 188, 309, 449, 331, 217, 408, 229, 159, 420, 310, 333, 119, 339, 218, 368, 230, 391, 233, 313, 334, 175, 123, 314, 341, 450, 220, 424, 395, 355, 287, 183, 234, 125, 241, 316, 342, 345, 397, 452, 432, 207, 403, 357, 187, 236, 126, 242, 398, 346, 456, 358, 405, 303, 244, 189, 361, 215, 348, 419, 406, 464, 409, 362, 311, 219, 410, 421, 231, 248, 369, 190, 480, 335, 364, 422, 315, 221, 370, 425, 235, 451, 412, 343, 372, 317, 222, 426, 453, 237, 433, 347, 243, 454, 318, 376, 428, 238, 359, 458, 399, 245, 434, 457, 349, 127, 191, 407, 350, 436, 465, 246, 460, 363, 249, 411, 365, 440, 374, 423, 466, 250, 371, 481, 413, 366, 468, 429, 252, 373, 482, 427, 414, 472, 223, 455, 377, 435, 319, 484, 430, 239, 461, 378, 459, 437, 488, 380, 496, 351, 467, 438, 251, 462, 442, 441, 469, 247, 367, 253, 375, 444, 470, 483, 415, 485, 473, 474, 254, 379, 431, 489, 486, 476, 439, 490, 381, 497, 463, 492, 443, 382, 498, 445, 471, 500, 446, 255, 475, 487, 504, 477, 493, 478, 383, 491, 499, 502, 494, 501, 447, 505, 506, 479, 508, 495, 503, 507, 509, 510, 511]

| Table Q7, having a sequence length of 512: | |
|---|---|
| Reliability or sequence number of reliability | Polarized channel sequence number |
| 0 | 0 |
| 1 | 1 |
| 2 | 2 |
| 3 | 4 |
| 4 | 8 |
| 5 | 16 |
| 6 | 32 |
| 7 | 3 |
| 8 | 5 |
| 9 | 64 |
| 10 | 9 |
| 11 | 6 |
| 12 | 17 |
| 13 | 10 |
| 14 | 18 |
| 15 | 128 |
| 16 | 12 |
| 17 | 33 |
| 18 | 256 |
| 19 | 36 |
| 20 | 24 |
| 21 | 20 |
| 22 | 65 |
| 23 | 34 |
| 24 | 7 |
| 25 | 129 |
| 26 | 66 |
| 27 | 11 |
| 28 | 40 |
| 29 | 68 |
| 30 | 13 |
| 31 | 19 |
| 32 | 130 |
| 33 | 48 |
| 34 | 14 |
| 35 | 72 |
| 36 | 257 |

-continued

| Table Q7, having a sequence length of 512: | |
|---|---|
| Reliability or sequence number of reliability | Polarized channel sequence number |
| 37 | 21 |
| 38 | 132 |
| 39 | 35 |
| 40 | 258 |
| 41 | 26 |
| 42 | 80 |
| 43 | 37 |
| 44 | 25 |
| 45 | 22 |
| 46 | 136 |
| 47 | 38 |
| 48 | 260 |
| 49 | 96 |
| 50 | 264 |
| 51 | 67 |
| 52 | 41 |
| 53 | 144 |
| 54 | 28 |
| 55 | 69 |
| 56 | 42 |
| 57 | 49 |
| 58 | 74 |
| 59 | 272 |
| 60 | 160 |
| 61 | 288 |
| 62 | 70 |
| 63 | 131 |
| 64 | 192 |
| 65 | 44 |
| 66 | 81 |
| 67 | 50 |
| 68 | 73 |
| 69 | 133 |
| 70 | 15 |
| 71 | 52 |
| 72 | 320 |
| 73 | 23 |
| 74 | 134 |
| 75 | 76 |
| 76 | 82 |
| 77 | 56 |
| 78 | 384 |
| 79 | 137 |
| 80 | 97 |
| 81 | 27 |
| 82 | 39 |
| 83 | 259 |
| 84 | 84 |
| 85 | 138 |
| 86 | 145 |
| 87 | 261 |
| 88 | 29 |
| 89 | 43 |
| 90 | 98 |
| 91 | 88 |
| 92 | 140 |
| 93 | 30 |
| 94 | 146 |
| 95 | 71 |
| 96 | 262 |
| 97 | 265 |
| 98 | 161 |
| 99 | 45 |
| 100 | 100 |
| 101 | 51 |
| 102 | 148 |
| 103 | 46 |
| 104 | 75 |
| 105 | 266 |
| 106 | 273 |
| 107 | 104 |
| 108 | 162 |
| 109 | 53 |
| 110 | 193 |

-continued

| Table Q7, having a sequence length of 512: | |
|---|---|
| Reliability or sequence number of reliability | Polarized channel sequence number |
| 111 | 152 |
| 112 | 77 |
| 113 | 164 |
| 114 | 268 |
| 115 | 274 |
| 116 | 54 |
| 117 | 83 |
| 118 | 57 |
| 119 | 112 |
| 120 | 135 |
| 121 | 78 |
| 122 | 289 |
| 123 | 194 |
| 124 | 85 |
| 125 | 276 |
| 126 | 58 |
| 127 | 168 |
| 128 | 139 |
| 129 | 99 |
| 130 | 86 |
| 131 | 60 |
| 132 | 280 |
| 133 | 89 |
| 134 | 290 |
| 135 | 196 |
| 136 | 141 |
| 137 | 101 |
| 138 | 147 |
| 139 | 176 |
| 140 | 142 |
| 141 | 31 |
| 142 | 292 |
| 143 | 200 |
| 144 | 263 |
| 145 | 90 |
| 146 | 149 |
| 147 | 321 |
| 148 | 322 |
| 149 | 102 |
| 150 | 105 |
| 151 | 92 |
| 152 | 47 |
| 153 | 296 |
| 154 | 163 |
| 155 | 150 |
| 156 | 208 |
| 157 | 385 |
| 158 | 267 |
| 159 | 304 |
| 160 | 324 |
| 161 | 153 |
| 162 | 165 |
| 163 | 386 |
| 164 | 106 |
| 165 | 55 |
| 166 | 328 |
| 167 | 113 |
| 168 | 154 |
| 169 | 79 |
| 170 | 224 |
| 171 | 108 |
| 172 | 269 |
| 173 | 166 |
| 174 | 195 |
| 175 | 270 |
| 176 | 275 |
| 177 | 59 |
| 178 | 169 |
| 179 | 156 |
| 180 | 291 |
| 181 | 277 |
| 182 | 114 |
| 183 | 87 |
| 184 | 197 |

-continued

Table Q7, having a sequence length of 512:

| Reliability or sequence number of reliability | Polarized channel sequence number |
|---|---|
| 185 | 116 |
| 186 | 170 |
| 187 | 61 |
| 188 | 281 |
| 189 | 278 |
| 190 | 177 |
| 191 | 293 |
| 192 | 388 |
| 193 | 91 |
| 194 | 198 |
| 195 | 172 |
| 196 | 120 |
| 197 | 201 |
| 198 | 336 |
| 199 | 62 |
| 200 | 282 |
| 201 | 143 |
| 202 | 103 |
| 203 | 178 |
| 204 | 294 |
| 205 | 93 |
| 206 | 202 |
| 207 | 323 |
| 208 | 392 |
| 209 | 297 |
| 210 | 151 |
| 211 | 209 |
| 212 | 284 |
| 213 | 180 |
| 214 | 107 |
| 215 | 94 |
| 216 | 204 |
| 217 | 298 |
| 218 | 352 |
| 219 | 325 |
| 220 | 155 |
| 221 | 210 |
| 222 | 400 |
| 223 | 305 |
| 224 | 300 |
| 225 | 109 |
| 226 | 184 |
| 227 | 326 |
| 228 | 115 |
| 229 | 167 |
| 230 | 157 |
| 231 | 225 |
| 232 | 306 |
| 233 | 329 |
| 234 | 110 |
| 235 | 117 |
| 236 | 212 |
| 237 | 171 |
| 238 | 330 |
| 239 | 226 |
| 240 | 387 |
| 241 | 308 |
| 242 | 216 |
| 243 | 416 |
| 244 | 337 |
| 245 | 158 |
| 246 | 271 |
| 247 | 118 |
| 248 | 279 |
| 249 | 332 |
| 250 | 389 |
| 251 | 173 |
| 252 | 121 |
| 253 | 199 |
| 254 | 179 |
| 255 | 228 |
| 256 | 338 |
| 257 | 312 |
| 258 | 390 |
| 259 | 122 |
| 260 | 393 |
| 261 | 283 |
| 262 | 174 |
| 263 | 203 |
| 264 | 340 |
| 265 | 448 |
| 266 | 353 |
| 267 | 394 |
| 268 | 181 |
| 269 | 63 |
| 270 | 295 |
| 271 | 285 |
| 272 | 232 |
| 273 | 124 |
| 274 | 205 |
| 275 | 182 |
| 276 | 286 |
| 277 | 299 |
| 278 | 354 |
| 279 | 211 |
| 280 | 401 |
| 281 | 185 |
| 282 | 396 |
| 283 | 344 |
| 284 | 240 |
| 285 | 206 |
| 286 | 95 |
| 287 | 327 |
| 288 | 402 |
| 289 | 356 |
| 290 | 307 |
| 291 | 301 |
| 292 | 417 |
| 293 | 186 |
| 294 | 404 |
| 295 | 213 |
| 296 | 418 |
| 297 | 227 |
| 298 | 302 |
| 299 | 111 |
| 300 | 360 |
| 301 | 214 |
| 302 | 188 |
| 303 | 309 |
| 304 | 449 |
| 305 | 331 |
| 306 | 217 |
| 307 | 408 |
| 308 | 229 |
| 309 | 159 |
| 310 | 420 |
| 311 | 310 |
| 312 | 333 |
| 313 | 119 |
| 314 | 339 |
| 315 | 218 |
| 316 | 368 |
| 317 | 230 |
| 318 | 391 |
| 319 | 233 |
| 320 | 313 |
| 321 | 334 |
| 322 | 175 |
| 323 | 123 |
| 324 | 314 |
| 325 | 341 |
| 326 | 450 |
| 327 | 220 |
| 328 | 424 |
| 329 | 395 |
| 330 | 355 |
| 331 | 287 |
| 332 | 183 |

-continued

Table Q7, having a sequence length of 512:

| Reliability or sequence number of reliability | Polarized channel sequence number |
|---|---|
| 333 | 234 |
| 334 | 125 |
| 335 | 241 |
| 336 | 316 |
| 337 | 342 |
| 338 | 345 |
| 339 | 397 |
| 340 | 452 |
| 341 | 432 |
| 342 | 207 |
| 343 | 403 |
| 344 | 357 |
| 345 | 187 |
| 346 | 236 |
| 347 | 126 |
| 348 | 242 |
| 349 | 398 |
| 350 | 346 |
| 351 | 456 |
| 352 | 358 |
| 353 | 405 |
| 354 | 303 |
| 355 | 244 |
| 356 | 189 |
| 357 | 361 |
| 358 | 215 |
| 359 | 348 |
| 360 | 419 |
| 361 | 406 |
| 362 | 464 |
| 363 | 409 |
| 364 | 362 |
| 365 | 311 |
| 366 | 219 |
| 367 | 410 |
| 368 | 421 |
| 369 | 231 |
| 370 | 248 |
| 371 | 369 |
| 372 | 190 |
| 373 | 480 |
| 374 | 335 |
| 375 | 364 |
| 376 | 422 |
| 377 | 315 |
| 378 | 221 |
| 379 | 370 |
| 380 | 425 |
| 381 | 235 |
| 382 | 451 |
| 383 | 412 |
| 384 | 343 |
| 385 | 372 |
| 386 | 317 |
| 387 | 222 |
| 388 | 426 |
| 389 | 453 |
| 390 | 237 |
| 391 | 433 |
| 392 | 347 |
| 393 | 243 |
| 394 | 454 |
| 395 | 318 |
| 396 | 376 |
| 397 | 428 |
| 398 | 238 |
| 399 | 359 |
| 400 | 458 |
| 401 | 399 |
| 402 | 245 |
| 403 | 434 |
| 404 | 457 |
| 405 | 349 |
| 406 | 127 |
| 407 | 191 |
| 408 | 407 |
| 409 | 350 |
| 410 | 436 |
| 411 | 465 |
| 412 | 246 |
| 413 | 460 |
| 414 | 363 |
| 415 | 249 |
| 416 | 411 |
| 417 | 365 |
| 418 | 440 |
| 419 | 374 |
| 420 | 423 |
| 421 | 466 |
| 422 | 250 |
| 423 | 371 |
| 424 | 481 |
| 425 | 413 |
| 426 | 366 |
| 427 | 468 |
| 428 | 429 |
| 429 | 252 |
| 430 | 373 |
| 431 | 482 |
| 432 | 427 |
| 433 | 414 |
| 434 | 472 |
| 435 | 223 |
| 436 | 455 |
| 437 | 377 |
| 438 | 435 |
| 439 | 319 |
| 440 | 484 |
| 441 | 430 |
| 442 | 239 |
| 443 | 461 |
| 444 | 378 |
| 445 | 459 |
| 446 | 437 |
| 447 | 488 |
| 448 | 380 |
| 449 | 496 |
| 450 | 351 |
| 451 | 467 |
| 452 | 438 |
| 453 | 251 |
| 454 | 462 |
| 455 | 442 |
| 456 | 441 |
| 457 | 469 |
| 458 | 247 |
| 459 | 367 |
| 460 | 253 |
| 461 | 375 |
| 462 | 444 |
| 463 | 470 |
| 464 | 483 |
| 465 | 415 |
| 466 | 485 |
| 467 | 473 |
| 468 | 474 |
| 469 | 254 |
| 470 | 379 |
| 471 | 431 |
| 472 | 489 |
| 473 | 486 |
| 474 | 476 |
| 475 | 439 |
| 476 | 490 |
| 477 | 381 |
| 478 | 497 |
| 479 | 463 |
| 480 | 492 |

-continued

| Table Q7, having a sequence length of 512: | |
|---|---|
| Reliability or sequence number of reliability | Polarized channel sequence number |
| 481 | 443 |
| 482 | 382 |
| 483 | 498 |
| 484 | 445 |
| 485 | 471 |
| 486 | 500 |
| 487 | 446 |
| 488 | 255 |
| 489 | 475 |
| 490 | 487 |
| 491 | 504 |
| 492 | 477 |
| 493 | 493 |
| 494 | 478 |
| 495 | 383 |
| 496 | 491 |
| 497 | 499 |
| 498 | 502 |
| 499 | 494 |
| 500 | 501 |
| 501 | 447 |
| 502 | 505 |
| 503 | 506 |
| 504 | 479 |
| 505 | 508 |
| 506 | 495 |
| 507 | 503 |
| 508 | 507 |
| 509 | 509 |
| 510 | 510 |
| 511 | 511 |

Sequence Q8, having a sequence length of 256:

[0, 1, 2, 4, 8, 16, 32, 3, 5, 64, 9, 6, 17, 10, 18, 128, 12, 33, 36, 24, 20, 65, 34, 7, 129, 66, 11, 40, 68, 13, 19, 130, 48, 14, 72, 21, 132, 35, 26, 80, 37, 25, 22, 136, 38, 96, 67, 41, 144, 28, 69, 42, 49, 74, 160, 70, 131, 192, 44, 81, 50, 73, 133, 15, 52, 23, 134, 76, 82, 56, 137, 97, 27, 39, 84, 138, 145, 29, 43, 98, 88, 140, 30, 146, 71, 161, 45, 100, 51, 148, 46, 75, 104, 162, 53, 193, 152, 77, 164, 54, 83, 57, 112, 135, 78, 194, 85, 58, 168, 139, 99, 86, 60, 89, 196, 141, 101, 147, 176, 142, 31, 200, 90, 149, 102, 105, 92, 47, 163, 150, 208, 153, 165, 106, 55, 113, 154, 79, 224, 108, 166, 195, 59, 169, 156, 114, 87, 197, 116, 170, 61, 177, 91, 198, 172, 120, 201, 62, 143, 103, 178, 93, 202, 151, 209, 180, 107, 94, 204, 155, 210, 109, 184, 115, 167, 157, 225, 110, 117, 212, 171, 226, 216, 158, 118, 173, 121, 199, 179, 228, 122, 174, 203, 181, 63, 232, 124, 205, 182, 211, 185, 240, 206, 95, 186, 213, 227, 111, 214, 188, 217, 229, 159, 119, 218, 230, 233, 175, 123, 220, 183, 234, 125, 241, 207, 187, 236, 126, 242, 244, 189, 215, 219, 231, 248, 190, 221, 235, 222, 237, 243, 238, 245, 127, 191, 246, 249, 250, 252, 223, 239, 251, 247, 253, 254, 255]

| Table Q8, having a sequence length of 256: | |
|---|---|
| Reliability or sequence number of reliability | Polarized channel sequence number |
| 0 | 0 |
| 1 | 1 |
| 2 | 2 |
| 3 | 4 |
| 4 | 8 |
| 5 | 16 |
| 6 | 32 |
| 7 | 3 |

-continued

| Table Q8, having a sequence length of 256: | |
|---|---|
| Reliability or sequence number of reliability | Polarized channel sequence number |
| 8 | 5 |
| 9 | 64 |
| 10 | 9 |
| 11 | 6 |
| 12 | 17 |
| 13 | 10 |
| 14 | 18 |
| 15 | 128 |
| 16 | 12 |
| 17 | 33 |
| 18 | 36 |
| 19 | 24 |
| 20 | 20 |
| 21 | 65 |
| 22 | 34 |
| 23 | 7 |
| 24 | 129 |
| 25 | 66 |
| 26 | 11 |
| 27 | 40 |
| 28 | 68 |
| 29 | 13 |
| 30 | 19 |
| 31 | 130 |
| 32 | 48 |
| 33 | 14 |
| 34 | 72 |
| 35 | 21 |
| 36 | 132 |
| 37 | 35 |
| 38 | 26 |
| 39 | 80 |
| 40 | 37 |
| 41 | 25 |
| 42 | 22 |
| 43 | 136 |
| 44 | 38 |
| 45 | 96 |
| 46 | 67 |
| 47 | 41 |
| 48 | 144 |
| 49 | 28 |
| 50 | 69 |
| 51 | 42 |
| 52 | 49 |
| 53 | 74 |
| 54 | 160 |
| 55 | 70 |
| 56 | 131 |
| 57 | 192 |
| 58 | 44 |
| 59 | 81 |
| 60 | 50 |
| 61 | 73 |
| 62 | 133 |
| 63 | 15 |
| 64 | 52 |
| 65 | 23 |
| 66 | 134 |
| 67 | 76 |
| 68 | 82 |
| 69 | 56 |
| 70 | 137 |
| 71 | 97 |
| 72 | 27 |
| 73 | 39 |
| 74 | 84 |
| 75 | 138 |
| 76 | 145 |
| 77 | 29 |
| 78 | 43 |
| 79 | 98 |
| 80 | 88 |
| 81 | 140 |

-continued

Table Q8, having a sequence length of 256:

| Reliability or sequence number of reliability | Polarized channel sequence number |
|---|---|
| 82 | 30 |
| 83 | 146 |
| 84 | 71 |
| 85 | 161 |
| 86 | 45 |
| 87 | 100 |
| 88 | 51 |
| 89 | 148 |
| 90 | 46 |
| 91 | 75 |
| 92 | 104 |
| 93 | 162 |
| 94 | 53 |
| 95 | 193 |
| 96 | 152 |
| 97 | 77 |
| 98 | 164 |
| 99 | 54 |
| 100 | 83 |
| 101 | 57 |
| 102 | 112 |
| 103 | 135 |
| 104 | 78 |
| 105 | 194 |
| 106 | 85 |
| 107 | 58 |
| 108 | 168 |
| 109 | 139 |
| 110 | 99 |
| 111 | 86 |
| 112 | 60 |
| 113 | 89 |
| 114 | 196 |
| 115 | 141 |
| 116 | 101 |
| 117 | 147 |
| 118 | 176 |
| 119 | 142 |
| 120 | 31 |
| 121 | 200 |
| 122 | 90 |
| 123 | 149 |
| 124 | 102 |
| 125 | 105 |
| 126 | 92 |
| 127 | 47 |
| 128 | 163 |
| 129 | 150 |
| 130 | 208 |
| 131 | 153 |
| 132 | 165 |
| 133 | 106 |
| 134 | 55 |
| 135 | 113 |
| 136 | 154 |
| 137 | 79 |
| 138 | 224 |
| 139 | 108 |
| 140 | 166 |
| 141 | 195 |
| 142 | 59 |
| 143 | 169 |
| 144 | 156 |
| 145 | 114 |
| 146 | 87 |
| 147 | 197 |
| 148 | 116 |
| 149 | 170 |
| 150 | 61 |
| 151 | 177 |
| 152 | 91 |
| 153 | 198 |
| 154 | 172 |
| 155 | 120 |
| 156 | 201 |
| 157 | 62 |
| 158 | 143 |
| 159 | 103 |
| 160 | 178 |
| 161 | 93 |
| 162 | 202 |
| 163 | 151 |
| 164 | 209 |
| 165 | 180 |
| 166 | 107 |
| 167 | 94 |
| 168 | 204 |
| 169 | 155 |
| 170 | 210 |
| 171 | 109 |
| 172 | 184 |
| 173 | 115 |
| 174 | 167 |
| 175 | 157 |
| 176 | 225 |
| 177 | 110 |
| 178 | 117 |
| 179 | 212 |
| 180 | 171 |
| 181 | 226 |
| 182 | 216 |
| 183 | 158 |
| 184 | 118 |
| 185 | 173 |
| 186 | 121 |
| 187 | 199 |
| 188 | 179 |
| 189 | 228 |
| 190 | 122 |
| 191 | 174 |
| 192 | 203 |
| 193 | 181 |
| 194 | 63 |
| 195 | 232 |
| 196 | 124 |
| 197 | 205 |
| 198 | 182 |
| 199 | 211 |
| 200 | 185 |
| 201 | 240 |
| 202 | 206 |
| 203 | 95 |
| 204 | 186 |
| 205 | 213 |
| 206 | 227 |
| 207 | 111 |
| 208 | 214 |
| 209 | 188 |
| 210 | 217 |
| 211 | 229 |
| 212 | 159 |
| 213 | 119 |
| 214 | 218 |
| 215 | 230 |
| 216 | 233 |
| 217 | 175 |
| 218 | 123 |
| 219 | 220 |
| 220 | 183 |
| 221 | 234 |
| 222 | 125 |
| 223 | 241 |
| 224 | 207 |
| 225 | 187 |
| 226 | 236 |
| 227 | 126 |
| 228 | 242 |
| 229 | 244 |

-continued

Table Q8, having a sequence length of 256:

| Reliability or sequence number of reliability | Polarized channel sequence number |
|---|---|
| 230 | 189 |
| 231 | 215 |
| 232 | 219 |
| 233 | 231 |
| 234 | 248 |
| 235 | 190 |
| 236 | 221 |
| 237 | 235 |
| 238 | 222 |
| 239 | 237 |
| 240 | 243 |
| 241 | 238 |
| 242 | 245 |
| 243 | 127 |
| 244 | 191 |
| 245 | 246 |
| 246 | 249 |
| 247 | 250 |
| 248 | 252 |
| 249 | 223 |
| 250 | 239 |
| 251 | 251 |
| 252 | 247 |
| 253 | 253 |
| 254 | 254 |
| 255 | 255 |

Sequence Q9, having a sequence length of 128:

[0, 1, 2, 4, 8, 16, 32, 3, 5, 64, 9, 6, 17, 10, 18, 12, 33, 36, 24, 20, 65, 34, 7, 66, 11, 40, 68, 13, 19, 48, 14, 72, 21, 35, 26, 80, 37, 25, 22, 38, 96, 67, 41, 28, 69, 42, 49, 74, 70, 44, 81, 50, 73, 15, 52, 23, 76, 82, 56, 97, 27, 39, 84, 29, 43, 98, 88, 30, 71, 45, 100, 51, 46, 75, 104, 53, 77, 54, 83, 57, 112, 78, 85, 58, 99, 86, 60, 89, 101, 31, 90, 102, 105, 92, 47, 106, 55, 113, 79, 108, 59, 114, 87, 116, 61, 91, 120, 62, 103, 93, 107, 94, 109, 115, 110, 117, 118, 121, 122, 63, 124, 95, 111, 119, 123, 125, 126, 127]

Table Q9, having a sequence length of 128:

| Reliability or sequence number of reliability | Polarized channel sequence number |
|---|---|
| 0 | 0 |
| 1 | 1 |
| 2 | 2 |
| 3 | 4 |
| 4 | 8 |
| 5 | 16 |
| 6 | 32 |
| 7 | 3 |
| 8 | 5 |
| 9 | 64 |
| 10 | 9 |
| 11 | 6 |
| 12 | 17 |
| 13 | 10 |
| 14 | 18 |
| 15 | 12 |
| 16 | 33 |
| 17 | 36 |
| 18 | 24 |
| 19 | 20 |
| 20 | 65 |
| 21 | 34 |
| 22 | 7 |
| 23 | 66 |
| 24 | 11 |
| 25 | 40 |
| 26 | 68 |
| 27 | 13 |
| 28 | 19 |
| 29 | 48 |
| 30 | 14 |
| 31 | 72 |
| 32 | 21 |
| 33 | 35 |
| 34 | 26 |
| 35 | 80 |
| 36 | 37 |
| 37 | 25 |
| 38 | 22 |
| 39 | 38 |
| 40 | 96 |
| 41 | 67 |
| 42 | 41 |
| 43 | 28 |
| 44 | 69 |
| 45 | 42 |
| 46 | 49 |
| 47 | 74 |
| 48 | 70 |
| 49 | 44 |
| 50 | 81 |
| 51 | 50 |
| 52 | 73 |
| 53 | 15 |
| 54 | 52 |
| 55 | 23 |
| 56 | 76 |
| 57 | 82 |
| 58 | 56 |
| 59 | 97 |
| 60 | 27 |
| 61 | 39 |
| 62 | 84 |
| 63 | 29 |
| 64 | 43 |
| 65 | 98 |
| 66 | 88 |
| 67 | 30 |
| 68 | 71 |
| 69 | 45 |
| 70 | 100 |
| 71 | 51 |
| 72 | 46 |
| 73 | 75 |
| 74 | 104 |
| 75 | 53 |
| 76 | 77 |
| 77 | 54 |
| 78 | 83 |
| 79 | 57 |
| 80 | 112 |
| 81 | 78 |
| 82 | 85 |
| 83 | 58 |
| 84 | 99 |
| 85 | 86 |
| 86 | 60 |
| 87 | 89 |
| 88 | 101 |
| 89 | 31 |
| 90 | 90 |
| 91 | 102 |
| 92 | 105 |
| 93 | 92 |
| 94 | 47 |
| 95 | 106 |
| 96 | 55 |
| 97 | 113 |
| 98 | 79 |
| 99 | 108 |
| 100 | 59 |

-continued

Table Q9, having a sequence length of 128:

| Reliability or sequence number of reliability | Polarized channel sequence number |
|---|---|
| 101 | 114 |
| 102 | 87 |
| 103 | 116 |
| 104 | 61 |
| 105 | 91 |
| 106 | 120 |
| 107 | 62 |
| 108 | 103 |
| 109 | 93 |
| 110 | 107 |
| 111 | 94 |
| 112 | 109 |
| 113 | 115 |
| 114 | 110 |
| 115 | 117 |
| 116 | 118 |
| 117 | 121 |
| 118 | 122 |
| 119 | 63 |
| 120 | 124 |
| 121 | 95 |
| 122 | 111 |
| 123 | 119 |
| 124 | 123 |
| 125 | 125 |
| 126 | 126 |
| 127 | 127 |

Sequence Q10, having a sequence length of 64:

[0, 1, 2, 4, 8, 16, 32, 3, 5, 9, 6, 17, 10, 18, 12, 33, 36, 24, 20, 34, 7, 11, 40, 13, 19, 48, 14, 21, 35, 26, 37, 25, 22, 38, 41, 28, 42, 49, 44, 50, 15, 52, 23, 56, 27, 39, 29, 43, 30, 45, 51, 46, 53, 54, 57, 58, 60, 31, 47, 55, 59, 61, 62, 63]

Table Q10, having a sequence length of 64:

| Reliability or sequence number of reliability | Polarized channel sequence number |
|---|---|
| 0 | 0 |
| 1 | 1 |
| 2 | 2 |
| 3 | 4 |
| 4 | 8 |
| 5 | 16 |
| 6 | 32 |
| 7 | 3 |
| 8 | 5 |
| 9 | 9 |
| 10 | 6 |
| 11 | 17 |
| 12 | 10 |
| 13 | 18 |
| 14 | 12 |
| 15 | 33 |
| 16 | 36 |
| 17 | 24 |
| 18 | 20 |
| 19 | 34 |
| 20 | 7 |
| 21 | 11 |
| 22 | 40 |
| 23 | 13 |
| 24 | 19 |
| 25 | 48 |
| 26 | 14 |
| 27 | 21 |
| 28 | 35 |
| 29 | 26 |
| 30 | 37 |
| 31 | 25 |
| 32 | 22 |
| 33 | 38 |
| 34 | 41 |
| 35 | 28 |
| 36 | 42 |
| 37 | 49 |
| 38 | 44 |
| 39 | 50 |
| 40 | 15 |
| 41 | 52 |
| 42 | 23 |
| 43 | 56 |
| 44 | 27 |
| 45 | 39 |
| 46 | 29 |
| 47 | 43 |
| 48 | 30 |
| 49 | 45 |
| 50 | 51 |
| 51 | 46 |
| 52 | 53 |
| 53 | 54 |
| 54 | 57 |
| 55 | 58 |
| 56 | 60 |
| 57 | 31 |
| 58 | 47 |
| 59 | 55 |
| 60 | 59 |
| 61 | 61 |
| 62 | 62 |
| 63 | 63 |

Sequence Z6, having a sequence length of 1024:

[0, 1, 2, 7, 3, 8, 11, 24, 4, 10, 13, 28, 16, 31, 35, 77, 5, 12, 14, 32, 21, 38, 47, 80, 20, 46, 42, 88, 57, 95, 101, 159, 6, 17, 23, 40, 19, 45, 49, 89, 29, 55, 59, 96, 72, 108, 113, 172, 34, 61, 74, 111, 78, 120, 129, 187, 84, 131, 141, 208, 146, 218, 236, 333, 9, 22, 26, 54, 30, 58, 68, 103, 36, 75, 62, 114, 82, 123, 135, 193, 44, 73, 83, 130, 91, 138, 145, 214, 99, 148, 163, 228, 171, 242, 254, 357, 51, 87, 97, 144, 109, 154, 167, 239, 118, 169, 186, 253, 195, 269, 282, 380, 133, 191, 213, 275, 216, 283, 299, 401, 233, 307, 317, 417, 337, 435, 460, 577, 15, 25, 33, 69, 39, 76, 81, 134, 48, 86, 92, 143, 100, 153, 157, 238, 56, 93, 102, 155, 112, 164, 175, 249, 122, 182, 192, 263, 210, 277, 297, 394, 64, 106, 119, 174, 124, 183, 197, 276, 142, 209, 217, 285, 232, 306, 322, 416, 156, 225, 240, 311, 252, 329, 342, 433, 270, 348, 366, 453, 386, 473, 511, 585, 71, 121, 137, 201, 152, 215, 231, 309, 161, 234, 244, 323, 255, 341, 356, 449, 177, 250, 264, 346, 284, 368, 382, 480, 293, 390, 403, 496, 425, 520, 531, 648, 194, 279, 287, 375, 312, 392, 406, 505, 336, 410, 434, 523, 459, 535, 567, 670, 355, 436, 461, 552, 471, 571, 590, 695, 508, 595, 611, 690, 627, 714, 743, 816, 18, 37, 41, 90, 50, 94, 104, 162, 53, 105, 115, 179, 126, 196, 202, 298, 63, 116, 127, 207, 139, 212, 223, 300, 147, 222, 237, 321, 251, 335, 343, 432, 66, 136, 149, 211, 160, 226, 241, 334, 173, 248, 258, 344, 268, 364, 379, 468, 180, 266, 280, 363, 292, 387, 399, 494, 314, 411, 418, 519, 443, 528, 555, 664, 79, 165, 166, 246, 181, 261, 273, 358, 188, 281, 286, 389, 302, 400, 412, 513, 235, 296, 313, 402, 324, 422, 444, 526, 350, 445, 464, 550, 481, 576, 587, 686, 259, 327, 345, 431, 362, 452, 466, 568, 381, 478, 490, 592, 514, 604, 619, 707, 404, 510, 521, 612, 527, 628, 608, 721, 557, 660, 672, 750, 678, 778, 794, 845, 85, 178, 185, 291, 227, 305, 316, 407, 247, 320, 328, 428, 349, 446, 462, 570, 265, 347, 361, 451, 367, 467, 483, 586, 391, 487, 501, 596, 525, 616, 639, 725, 294, 365, 369, 482, 395, 503, 518, 609, 427, 522, 533, 638, 565, 624, 666, 751, 448, 546, 572, 662, 588, 676, 688, 770, 605, 693, 692, 790, 722, 801, 814, 879, 325, 388, 423, 524, 447, 534, 554, 649, 465, 574, 569, 673, 591, 671, 691, 782, 484, 589, 610, 687, 620, 694, 723, 806, 647, 729, 740, 818, 760, 834, 844, 905, 512, 615, 635, 724, 665, 726, 756, 824, 677, 754, 772, 848, 786, 837, 870, 924, 680, 780, 798, 856, 809, 875, 865, 930, 828, 885, 893, 946, 909, 954, 963, 984, 27, 43, 52, 98, 60, 117, 128, 199, 65, 132, 140, 204, 151, 220, 224, 330, 67, 150, 158, 219, 170, 260, 271, 354, 184, 278, 290, 370, 304, 393, 408, 532, 70, 168, 176, 267, 190, 288, 301, 383, 200, 308, 318, 419, 332, 426, 439, 536, 206, 326, 340, 437, 359, 455, 476, 558, 371, 469, 491, 584, 493, 599, 618, 745, 107, 189, 198, 303, 205, 319, 331, 421, 229, 339, 351, 454, 377, 475, 486, 575, 245, 353, 372, 470, 396, 492, 497, 594, 420, 498, 506, 617, 545, 632, 656, 753, 262, 384, 409, 500, 415, 515, 529, 625, 440, 544, 559, 645, 581, 667, 675, 773, 457, 566, 583, 674, 606, 685, 709, 787, 634, 712, 730, 807, 741, 822, 842, 903, 110, 203, 221, 338, 243, 352, 378, 477, 257, 373, 397, 499, 424, 507, 517, 621, 274, 405, 414, 516, 438, 541, 553, 640, 456, 560, 578, 669, 597, 681, 700, 774, 295, 430, 442, 556, 474, 573, 580, 682, 488, 593, 603, 696, 630, 710, 718, 803, 509, 613, 633, 715, 650, 735, 742, 820, 659, 747, 764, 836, 789, 854, 871, 925, 315, 463, 479, 598, 495, 607, 626, 713, 539, 631, 644, 738, 653, 744, 758, 833, 547, 651, 658, 755, 683, 763, 783, 852, 704, 788, 797, 860, 813, 880, 888, 933, 561, 689, 698, 775, 719, 791, 800, 867, 731, 810, 825, 884, 838, 894, 907, 949, 766, 819, 846, 897, 858, 911, 916, 961, 868, 921, 929, 966, 940, 974, 983, 1003, 125, 230, 256, 374, 272, 398, 413, 530, 289, 429, 441, 543, 458, 564, 582, 701, 310, 450, 472, 579, 489, 600, 602, 706, 504, 614, 636, 728, 646, 736, 749, 829, 360, 485, 502, 601, 538, 623, 637, 739, 542, 643, 655, 746, 663, 759, 769, 850, 548, 661, 679, 768, 703, 781, 795, 864, 716, 804, 812, 873, 826, 889, 900, 944, 376, 537, 540, 641, 549, 652, 668, 762, 563, 684, 697, 785, 711, 792, 808, 876, 629, 702, 720, 796, 732, 817, 827, 886, 761, 831, 840, 898, 857, 910, 915, 960, 654, 734, 748, 821, 767, 847, 853, 902, 777, 841, 863, 914, 874, 922, 932, 969, 799, 869, 881, 928, 891, 935, 943, 976, 904, 947, 953, 981, 958, 989, 991, 1011, 385, 551, 562, 699, 622, 708, 717, 802, 642, 727, 737, 823, 757, 830, 849, 901, 657, 752, 765, 835, 776, 851, 862, 913, 793, 872, 859, 919, 887, 931, 939, 972, 705, 771, 779, 855, 805, 866, 878, 926, 815, 882, 892, 936, 899, 941, 950, 980, 839, 895, 906, 945, 917, 955, 959, 987, 923, 965, 968, 993, 975, 996, 998, 1008, 733, 784, 811, 883, 832, 890, 896, 942, 843, 908, 912, 952, 920, 956, 967, 990, 861, 918, 927, 964, 938, 970, 971, 997, 948, 977, 979, 999, 985, 1004, 1006, 1016, 877, 934, 937, 973, 951, 978, 982, 1001, 957, 986, 988, 1005, 994, 1007, 1012, 1018, 962, 992, 995, 1009, 1000, 1010, 1013, 1019, 1002, 1014, 1015, 1020, 1017, 1021, 1022, 1023]

Table Z6, having a sequence length of 1024:

Table Z6, having a sequence length of 1024:

| Polarized channel sequence number | Reliability or sequence number of reliability |
|---|---|
| 0 | 0 |
| 1 | 1 |
| 2 | 2 |
| 3 | 7 |
| 4 | 3 |
| 5 | 8 |
| 6 | 11 |
| 7 | 24 |

-continued

Table Z6, having a sequence length of 1024:

| Polarized channel sequence number | Reliability or sequence number of reliability |
|---|---|
| 8 | 4 |
| 9 | 10 |
| 10 | 13 |
| 11 | 28 |
| 12 | 16 |
| 13 | 31 |
| 14 | 35 |
| 15 | 77 |
| 16 | 5 |
| 17 | 12 |
| 18 | 14 |
| 19 | 32 |
| 20 | 21 |
| 21 | 38 |
| 22 | 47 |
| 23 | 80 |
| 24 | 20 |
| 25 | 46 |
| 26 | 42 |
| 27 | 88 |
| 28 | 57 |
| 29 | 95 |
| 30 | 101 |
| 31 | 159 |
| 32 | 6 |
| 33 | 17 |
| 34 | 23 |
| 35 | 40 |
| 36 | 19 |
| 37 | 45 |
| 38 | 49 |
| 39 | 89 |
| 40 | 29 |
| 41 | 55 |
| 42 | 59 |
| 43 | 96 |
| 44 | 72 |
| 45 | 108 |
| 46 | 113 |
| 47 | 172 |
| 48 | 34 |
| 49 | 61 |
| 50 | 74 |
| 51 | 111 |
| 52 | 78 |
| 53 | 120 |
| 54 | 129 |
| 55 | 187 |
| 56 | 84 |
| 57 | 131 |
| 58 | 141 |
| 59 | 208 |
| 60 | 146 |
| 61 | 218 |
| 62 | 236 |
| 63 | 333 |
| 64 | 9 |
| 65 | 22 |
| 66 | 26 |
| 67 | 54 |
| 68 | 30 |
| 69 | 58 |
| 70 | 68 |
| 71 | 103 |
| 72 | 36 |
| 73 | 75 |
| 74 | 62 |
| 75 | 114 |
| 76 | 82 |
| 77 | 123 |
| 78 | 135 |
| 79 | 193 |
| 80 | 44 |
| 81 | 73 |

-continued

Table Z6, having a sequence length of 1024:

| Polarized channel sequence number | Reliability or sequence number of reliability |
|---|---|
| 82 | 83 |
| 83 | 130 |
| 84 | 91 |
| 85 | 138 |
| 86 | 145 |
| 87 | 214 |
| 88 | 99 |
| 89 | 148 |
| 90 | 163 |
| 91 | 228 |
| 92 | 171 |
| 93 | 242 |
| 94 | 254 |
| 95 | 357 |
| 96 | 51 |
| 97 | 87 |
| 98 | 97 |
| 99 | 144 |
| 100 | 109 |
| 101 | 154 |
| 102 | 167 |
| 103 | 239 |
| 104 | 118 |
| 105 | 169 |
| 106 | 186 |
| 107 | 253 |
| 108 | 195 |
| 109 | 269 |
| 110 | 282 |
| 111 | 380 |
| 112 | 133 |
| 113 | 191 |
| 114 | 213 |
| 115 | 275 |
| 116 | 216 |
| 117 | 283 |
| 118 | 299 |
| 119 | 401 |
| 120 | 233 |
| 121 | 307 |
| 122 | 317 |
| 123 | 417 |
| 124 | 337 |
| 125 | 435 |
| 126 | 460 |
| 127 | 577 |
| 128 | 15 |
| 129 | 25 |
| 130 | 33 |
| 131 | 69 |
| 132 | 39 |
| 133 | 76 |
| 134 | 81 |
| 135 | 134 |
| 136 | 48 |
| 137 | 86 |
| 138 | 92 |
| 139 | 143 |
| 140 | 100 |
| 141 | 153 |
| 142 | 157 |
| 143 | 238 |
| 144 | 56 |
| 145 | 93 |
| 146 | 102 |
| 147 | 155 |
| 148 | 112 |
| 149 | 164 |
| 150 | 175 |
| 151 | 249 |
| 152 | 122 |
| 153 | 182 |
| 154 | 192 |
| 155 | 263 |

-continued

Table Z6, having a sequence length of 1024:

| Polarized channel sequence number | Reliability or sequence number of reliability |
|---|---|
| 156 | 210 |
| 157 | 277 |
| 158 | 297 |
| 159 | 394 |
| 160 | 64 |
| 161 | 106 |
| 162 | 119 |
| 163 | 174 |
| 164 | 124 |
| 165 | 183 |
| 166 | 197 |
| 167 | 276 |
| 168 | 142 |
| 169 | 209 |
| 170 | 217 |
| 171 | 285 |
| 172 | 232 |
| 173 | 306 |
| 174 | 322 |
| 175 | 416 |
| 176 | 156 |
| 177 | 225 |
| 178 | 240 |
| 179 | 311 |
| 180 | 252 |
| 181 | 329 |
| 182 | 342 |
| 183 | 433 |
| 184 | 270 |
| 185 | 348 |
| 186 | 366 |
| 187 | 453 |
| 188 | 386 |
| 189 | 473 |
| 190 | 511 |
| 191 | 585 |
| 192 | 71 |
| 193 | 121 |
| 194 | 137 |
| 195 | 201 |
| 196 | 152 |
| 197 | 215 |
| 198 | 231 |
| 199 | 309 |
| 200 | 161 |
| 201 | 234 |
| 202 | 244 |
| 203 | 323 |
| 204 | 255 |
| 205 | 341 |
| 206 | 356 |
| 207 | 449 |
| 208 | 177 |
| 209 | 250 |
| 210 | 264 |
| 211 | 346 |
| 212 | 284 |
| 213 | 368 |
| 214 | 382 |
| 215 | 480 |
| 216 | 293 |
| 217 | 390 |
| 218 | 403 |
| 219 | 496 |
| 220 | 425 |
| 221 | 520 |
| 222 | 531 |
| 223 | 648 |
| 224 | 194 |
| 225 | 279 |
| 226 | 287 |
| 227 | 375 |
| 228 | 312 |
| 229 | 392 |

-continued

Table Z6, having a sequence length of 1024:

| Polarized channel sequence number | Reliability or sequence number of reliability |
|---|---|
| 230 | 406 |
| 231 | 505 |
| 232 | 336 |
| 233 | 410 |
| 234 | 434 |
| 235 | 523 |
| 236 | 459 |
| 237 | 535 |
| 238 | 567 |
| 239 | 670 |
| 240 | 355 |
| 241 | 436 |
| 242 | 461 |
| 243 | 552 |
| 244 | 471 |
| 245 | 571 |
| 246 | 590 |
| 247 | 695 |
| 248 | 508 |
| 249 | 595 |
| 250 | 611 |
| 251 | 690 |
| 252 | 627 |
| 253 | 714 |
| 254 | 743 |
| 255 | 816 |
| 256 | 18 |
| 257 | 37 |
| 258 | 41 |
| 259 | 90 |
| 260 | 50 |
| 261 | 94 |
| 262 | 104 |
| 263 | 162 |
| 264 | 53 |
| 265 | 105 |
| 266 | 115 |
| 267 | 179 |
| 268 | 126 |
| 269 | 196 |
| 270 | 202 |
| 271 | 298 |
| 272 | 63 |
| 273 | 116 |
| 274 | 127 |
| 275 | 207 |
| 276 | 139 |
| 277 | 212 |
| 278 | 223 |
| 279 | 300 |
| 280 | 147 |
| 281 | 222 |
| 282 | 237 |
| 283 | 321 |
| 284 | 251 |
| 285 | 335 |
| 286 | 343 |
| 287 | 432 |
| 288 | 66 |
| 289 | 136 |
| 290 | 149 |
| 291 | 211 |
| 292 | 160 |
| 293 | 226 |
| 294 | 241 |
| 295 | 334 |
| 296 | 173 |
| 297 | 248 |
| 298 | 258 |
| 299 | 344 |
| 300 | 268 |
| 301 | 364 |
| 302 | 379 |
| 303 | 468 |

-continued

Table Z6, having a sequence length of 1024:

| Polarized channel sequence number | Reliability or sequence number of reliability |
|---|---|
| 304 | 180 |
| 305 | 266 |
| 306 | 280 |
| 307 | 363 |
| 308 | 292 |
| 309 | 387 |
| 310 | 399 |
| 311 | 494 |
| 312 | 314 |
| 313 | 411 |
| 314 | 418 |
| 315 | 519 |
| 316 | 443 |
| 317 | 528 |
| 318 | 555 |
| 319 | 664 |
| 320 | 79 |
| 321 | 165 |
| 322 | 166 |
| 323 | 246 |
| 324 | 181 |
| 325 | 261 |
| 326 | 273 |
| 327 | 358 |
| 328 | 188 |
| 329 | 281 |
| 330 | 286 |
| 331 | 389 |
| 332 | 302 |
| 333 | 400 |
| 334 | 412 |
| 335 | 513 |
| 336 | 235 |
| 337 | 296 |
| 338 | 313 |
| 339 | 402 |
| 340 | 324 |
| 341 | 422 |
| 342 | 444 |
| 343 | 526 |
| 344 | 350 |
| 345 | 445 |
| 346 | 464 |
| 347 | 550 |
| 348 | 481 |
| 349 | 576 |
| 350 | 587 |
| 351 | 686 |
| 352 | 259 |
| 353 | 327 |
| 354 | 345 |
| 355 | 431 |
| 356 | 362 |
| 357 | 452 |
| 358 | 466 |
| 359 | 568 |
| 360 | 381 |
| 361 | 478 |
| 362 | 490 |
| 363 | 592 |
| 364 | 514 |
| 365 | 604 |
| 366 | 619 |
| 367 | 707 |
| 368 | 404 |
| 369 | 510 |
| 370 | 521 |
| 371 | 612 |
| 372 | 527 |
| 373 | 628 |
| 374 | 608 |
| 375 | 721 |
| 376 | 557 |
| 377 | 660 |

-continued

| Table Z6, having a sequence length of 1024: | |
| --- | --- |
| Polarized channel sequence number | Reliability or sequence number of reliability |
| 378 | 672 |
| 379 | 750 |
| 380 | 678 |
| 381 | 778 |
| 382 | 794 |
| 383 | 845 |
| 384 | 85 |
| 385 | 178 |
| 386 | 185 |
| 387 | 291 |
| 388 | 227 |
| 389 | 305 |
| 390 | 316 |
| 391 | 407 |
| 392 | 247 |
| 393 | 320 |
| 394 | 328 |
| 395 | 428 |
| 396 | 349 |
| 397 | 446 |
| 398 | 462 |
| 399 | 570 |
| 400 | 265 |
| 401 | 347 |
| 402 | 361 |
| 403 | 451 |
| 404 | 367 |
| 405 | 467 |
| 406 | 483 |
| 407 | 586 |
| 408 | 391 |
| 409 | 487 |
| 410 | 501 |
| 411 | 596 |
| 412 | 525 |
| 413 | 616 |
| 414 | 639 |
| 415 | 725 |
| 416 | 294 |
| 417 | 365 |
| 418 | 369 |
| 419 | 482 |
| 420 | 395 |
| 421 | 503 |
| 422 | 518 |
| 423 | 609 |
| 424 | 427 |
| 425 | 522 |
| 426 | 533 |
| 427 | 638 |
| 428 | 565 |
| 429 | 624 |
| 430 | 666 |
| 431 | 751 |
| 432 | 448 |
| 433 | 546 |
| 434 | 572 |
| 435 | 662 |
| 436 | 588 |
| 437 | 676 |
| 438 | 688 |
| 439 | 770 |
| 440 | 605 |
| 441 | 693 |
| 442 | 692 |
| 443 | 790 |
| 444 | 722 |
| 445 | 801 |
| 446 | 814 |
| 447 | 879 |
| 448 | 325 |
| 449 | 388 |
| 450 | 423 |
| 451 | 524 |

-continued

| Table Z6, having a sequence length of 1024: | |
| --- | --- |
| Polarized channel sequence number | Reliability or sequence number of reliability |
| 452 | 447 |
| 453 | 534 |
| 454 | 554 |
| 455 | 649 |
| 456 | 465 |
| 457 | 574 |
| 458 | 569 |
| 459 | 673 |
| 460 | 591 |
| 461 | 671 |
| 462 | 691 |
| 463 | 782 |
| 464 | 484 |
| 465 | 589 |
| 466 | 610 |
| 467 | 687 |
| 468 | 620 |
| 469 | 694 |
| 470 | 723 |
| 471 | 806 |
| 472 | 647 |
| 473 | 729 |
| 474 | 740 |
| 475 | 818 |
| 476 | 760 |
| 477 | 834 |
| 478 | 844 |
| 479 | 905 |
| 480 | 512 |
| 481 | 615 |
| 482 | 635 |
| 483 | 724 |
| 484 | 665 |
| 485 | 726 |
| 486 | 756 |
| 487 | 824 |
| 488 | 677 |
| 489 | 754 |
| 490 | 772 |
| 491 | 848 |
| 492 | 786 |
| 493 | 837 |
| 494 | 870 |
| 495 | 924 |
| 496 | 680 |
| 497 | 780 |
| 498 | 798 |
| 499 | 856 |
| 500 | 809 |
| 501 | 875 |
| 502 | 865 |
| 503 | 930 |
| 504 | 828 |
| 505 | 885 |
| 506 | 893 |
| 507 | 946 |
| 508 | 909 |
| 509 | 954 |
| 510 | 963 |
| 511 | 984 |
| 512 | 27 |
| 513 | 43 |
| 514 | 52 |
| 515 | 98 |
| 516 | 60 |
| 517 | 117 |
| 518 | 128 |
| 519 | 199 |
| 520 | 65 |
| 521 | 132 |
| 522 | 140 |
| 523 | 204 |
| 524 | 151 |
| 525 | 220 |

-continued

Table Z6, having a sequence length of 1024:

| Polarized channel sequence number | Reliability or sequence number of reliability |
|---|---|
| 526 | 224 |
| 527 | 330 |
| 528 | 67 |
| 529 | 150 |
| 530 | 158 |
| 531 | 219 |
| 532 | 170 |
| 533 | 260 |
| 534 | 271 |
| 535 | 354 |
| 536 | 184 |
| 537 | 278 |
| 538 | 290 |
| 539 | 370 |
| 540 | 304 |
| 541 | 393 |
| 542 | 408 |
| 543 | 532 |
| 544 | 70 |
| 545 | 168 |
| 546 | 176 |
| 547 | 267 |
| 548 | 190 |
| 549 | 288 |
| 550 | 301 |
| 551 | 383 |
| 552 | 200 |
| 553 | 308 |
| 554 | 318 |
| 555 | 419 |
| 556 | 332 |
| 557 | 426 |
| 558 | 439 |
| 559 | 536 |
| 560 | 206 |
| 561 | 326 |
| 562 | 340 |
| 563 | 437 |
| 564 | 359 |
| 565 | 455 |
| 566 | 476 |
| 567 | 558 |
| 568 | 371 |
| 569 | 469 |
| 570 | 491 |
| 571 | 584 |
| 572 | 493 |
| 573 | 599 |
| 574 | 618 |
| 575 | 745 |
| 576 | 107 |
| 577 | 189 |
| 578 | 198 |
| 579 | 303 |
| 580 | 205 |
| 581 | 319 |
| 582 | 331 |
| 583 | 421 |
| 584 | 229 |
| 585 | 339 |
| 586 | 351 |
| 587 | 454 |
| 588 | 377 |
| 589 | 475 |
| 590 | 486 |
| 591 | 575 |
| 592 | 245 |
| 593 | 353 |
| 594 | 372 |
| 595 | 470 |
| 596 | 396 |
| 597 | 492 |
| 598 | 497 |
| 599 | 594 |

-continued

Table Z6, having a sequence length of 1024:

| Polarized channel sequence number | Reliability or sequence number of reliability |
|---|---|
| 600 | 420 |
| 601 | 498 |
| 602 | 506 |
| 603 | 617 |
| 604 | 545 |
| 605 | 632 |
| 606 | 656 |
| 607 | 753 |
| 608 | 262 |
| 609 | 384 |
| 610 | 409 |
| 611 | 500 |
| 612 | 415 |
| 613 | 515 |
| 614 | 529 |
| 615 | 625 |
| 616 | 440 |
| 617 | 544 |
| 618 | 559 |
| 619 | 645 |
| 620 | 581 |
| 621 | 667 |
| 622 | 675 |
| 623 | 773 |
| 624 | 457 |
| 625 | 566 |
| 626 | 583 |
| 627 | 674 |
| 628 | 606 |
| 629 | 685 |
| 630 | 709 |
| 631 | 787 |
| 632 | 634 |
| 633 | 712 |
| 634 | 730 |
| 635 | 807 |
| 636 | 741 |
| 637 | 822 |
| 638 | 842 |
| 639 | 903 |
| 640 | 110 |
| 641 | 203 |
| 642 | 221 |
| 643 | 338 |
| 644 | 243 |
| 645 | 352 |
| 646 | 378 |
| 647 | 477 |
| 648 | 257 |
| 649 | 373 |
| 650 | 397 |
| 651 | 499 |
| 652 | 424 |
| 653 | 507 |
| 654 | 517 |
| 655 | 621 |
| 656 | 274 |
| 657 | 405 |
| 658 | 414 |
| 659 | 516 |
| 660 | 438 |
| 661 | 541 |
| 662 | 553 |
| 663 | 640 |
| 664 | 456 |
| 665 | 560 |
| 666 | 578 |
| 667 | 669 |
| 668 | 597 |
| 669 | 681 |
| 670 | 700 |
| 671 | 774 |
| 672 | 295 |
| 673 | 430 |

-continued

| Table Z6, having a sequence length of 1024: | |
|---|---|
| Polarized channel sequence number | Reliability or sequence number of reliability |
| 674 | 442 |
| 675 | 556 |
| 676 | 474 |
| 677 | 573 |
| 678 | 580 |
| 679 | 682 |
| 680 | 488 |
| 681 | 593 |
| 682 | 603 |
| 683 | 696 |
| 684 | 630 |
| 685 | 710 |
| 686 | 718 |
| 687 | 803 |
| 688 | 509 |
| 689 | 613 |
| 690 | 633 |
| 691 | 715 |
| 692 | 650 |
| 693 | 735 |
| 694 | 742 |
| 695 | 820 |
| 696 | 659 |
| 697 | 747 |
| 698 | 764 |
| 699 | 836 |
| 700 | 789 |
| 701 | 854 |
| 702 | 871 |
| 703 | 925 |
| 704 | 315 |
| 705 | 463 |
| 706 | 479 |
| 707 | 598 |
| 708 | 495 |
| 709 | 607 |
| 710 | 626 |
| 711 | 713 |
| 712 | 539 |
| 713 | 631 |
| 714 | 644 |
| 715 | 738 |
| 716 | 653 |
| 717 | 744 |
| 718 | 758 |
| 719 | 833 |
| 720 | 547 |
| 721 | 651 |
| 722 | 658 |
| 723 | 755 |
| 724 | 683 |
| 725 | 763 |
| 726 | 783 |
| 727 | 852 |
| 728 | 704 |
| 729 | 788 |
| 730 | 797 |
| 731 | 860 |
| 732 | 813 |
| 733 | 880 |
| 734 | 888 |
| 735 | 933 |
| 736 | 561 |
| 737 | 689 |
| 738 | 698 |
| 739 | 775 |
| 740 | 719 |
| 741 | 791 |
| 742 | 800 |
| 743 | 867 |
| 744 | 731 |
| 745 | 810 |
| 746 | 825 |
| 747 | 884 |

-continued

| Table Z6, having a sequence length of 1024: | |
|---|---|
| Polarized channel sequence number | Reliability or sequence number of reliability |
| 748 | 838 |
| 749 | 894 |
| 750 | 907 |
| 751 | 949 |
| 752 | 766 |
| 753 | 819 |
| 754 | 846 |
| 755 | 897 |
| 756 | 858 |
| 757 | 911 |
| 758 | 916 |
| 759 | 961 |
| 760 | 868 |
| 761 | 921 |
| 762 | 929 |
| 763 | 966 |
| 764 | 940 |
| 765 | 974 |
| 766 | 983 |
| 767 | 1003 |
| 768 | 125 |
| 769 | 230 |
| 770 | 256 |
| 771 | 374 |
| 772 | 272 |
| 773 | 398 |
| 774 | 413 |
| 775 | 530 |
| 776 | 289 |
| 777 | 429 |
| 778 | 441 |
| 779 | 543 |
| 780 | 458 |
| 781 | 564 |
| 782 | 582 |
| 783 | 701 |
| 784 | 310 |
| 785 | 450 |
| 786 | 472 |
| 787 | 579 |
| 788 | 489 |
| 789 | 600 |
| 790 | 602 |
| 791 | 706 |
| 792 | 504 |
| 793 | 614 |
| 794 | 636 |
| 795 | 728 |
| 796 | 646 |
| 797 | 736 |
| 798 | 749 |
| 799 | 829 |
| 800 | 360 |
| 801 | 485 |
| 802 | 502 |
| 803 | 601 |
| 804 | 538 |
| 805 | 623 |
| 806 | 637 |
| 807 | 739 |
| 808 | 542 |
| 809 | 643 |
| 810 | 655 |
| 811 | 746 |
| 812 | 663 |
| 813 | 759 |
| 814 | 769 |
| 815 | 850 |
| 816 | 548 |
| 817 | 661 |
| 818 | 679 |
| 819 | 768 |
| 820 | 703 |
| 821 | 781 |

-continued

Table Z6, having a sequence length of 1024:

| Polarized channel sequence number | Reliability or sequence number of reliability |
|---|---|
| 822 | 795 |
| 823 | 864 |
| 824 | 716 |
| 825 | 804 |
| 826 | 812 |
| 827 | 873 |
| 828 | 826 |
| 829 | 889 |
| 830 | 900 |
| 831 | 944 |
| 832 | 376 |
| 833 | 537 |
| 834 | 540 |
| 835 | 641 |
| 836 | 549 |
| 837 | 652 |
| 838 | 668 |
| 839 | 762 |
| 840 | 563 |
| 841 | 684 |
| 842 | 697 |
| 843 | 785 |
| 844 | 711 |
| 845 | 792 |
| 846 | 808 |
| 847 | 876 |
| 848 | 629 |
| 849 | 702 |
| 850 | 720 |
| 851 | 796 |
| 852 | 732 |
| 853 | 817 |
| 854 | 827 |
| 855 | 886 |
| 856 | 761 |
| 857 | 831 |
| 858 | 840 |
| 859 | 898 |
| 860 | 857 |
| 861 | 910 |
| 862 | 915 |
| 863 | 960 |
| 864 | 654 |
| 865 | 734 |
| 866 | 748 |
| 867 | 821 |
| 868 | 767 |
| 869 | 847 |
| 870 | 853 |
| 871 | 902 |
| 872 | 777 |
| 873 | 841 |
| 874 | 863 |
| 875 | 914 |
| 876 | 874 |
| 877 | 922 |
| 878 | 932 |
| 879 | 969 |
| 880 | 799 |
| 881 | 869 |
| 882 | 881 |
| 883 | 928 |
| 884 | 891 |
| 885 | 935 |
| 886 | 943 |
| 887 | 976 |
| 888 | 904 |
| 889 | 947 |
| 890 | 953 |
| 891 | 981 |
| 892 | 958 |
| 893 | 989 |
| 894 | 991 |
| 895 | 1011 |
| 896 | 385 |
| 897 | 551 |
| 898 | 562 |
| 899 | 699 |
| 900 | 622 |
| 901 | 708 |
| 902 | 717 |
| 903 | 802 |
| 904 | 642 |
| 905 | 727 |
| 906 | 737 |
| 907 | 823 |
| 908 | 757 |
| 909 | 830 |
| 910 | 849 |
| 911 | 901 |
| 912 | 657 |
| 913 | 752 |
| 914 | 765 |
| 915 | 835 |
| 916 | 776 |
| 917 | 851 |
| 918 | 862 |
| 919 | 913 |
| 920 | 793 |
| 921 | 872 |
| 922 | 859 |
| 923 | 919 |
| 924 | 887 |
| 925 | 931 |
| 926 | 939 |
| 927 | 972 |
| 928 | 705 |
| 929 | 771 |
| 930 | 779 |
| 931 | 855 |
| 932 | 805 |
| 933 | 866 |
| 934 | 878 |
| 935 | 926 |
| 936 | 815 |
| 937 | 882 |
| 938 | 892 |
| 939 | 936 |
| 940 | 899 |
| 941 | 941 |
| 942 | 950 |
| 943 | 980 |
| 944 | 839 |
| 945 | 895 |
| 946 | 906 |
| 947 | 945 |
| 948 | 917 |
| 949 | 955 |
| 950 | 959 |
| 951 | 987 |
| 952 | 923 |
| 953 | 965 |
| 954 | 968 |
| 955 | 993 |
| 956 | 975 |
| 957 | 996 |
| 958 | 998 |
| 959 | 1008 |
| 960 | 733 |
| 961 | 784 |
| 962 | 811 |
| 963 | 883 |
| 964 | 832 |
| 965 | 890 |
| 966 | 896 |
| 967 | 942 |
| 968 | 843 |
| 969 | 908 |

-continued

Table Z6, having a sequence length of 1024:

| Polarized channel sequence number | Reliability or sequence number of reliability |
|---|---|
| 970 | 912 |
| 971 | 952 |
| 972 | 920 |
| 973 | 956 |
| 974 | 967 |
| 975 | 990 |
| 976 | 861 |
| 977 | 918 |
| 978 | 927 |
| 979 | 964 |
| 980 | 938 |
| 981 | 970 |
| 982 | 971 |
| 983 | 997 |
| 984 | 948 |
| 985 | 977 |
| 986 | 979 |
| 987 | 999 |
| 988 | 985 |
| 989 | 1004 |
| 990 | 1006 |
| 991 | 1016 |
| 992 | 877 |
| 993 | 934 |
| 994 | 937 |
| 995 | 973 |
| 996 | 951 |
| 997 | 978 |
| 998 | 982 |
| 999 | 1001 |
| 1000 | 957 |
| 1001 | 986 |
| 1002 | 988 |
| 1003 | 1005 |
| 1004 | 994 |
| 1005 | 1007 |
| 1006 | 1012 |
| 1007 | 1018 |
| 1008 | 962 |
| 1009 | 992 |
| 1010 | 995 |
| 1011 | 1009 |
| 1012 | 1000 |
| 1013 | 1010 |
| 1014 | 1013 |
| 1015 | 1019 |
| 1016 | 1002 |
| 1017 | 1014 |
| 1018 | 1015 |
| 1019 | 1020 |
| 1020 | 1017 |
| 1021 | 1021 |
| 1022 | 1022 |
| 1023 | 1023 |

Sequence Z7, having a sequence length of 512:

[0, 1, 2, 7, 3, 8, 11, 24, 4, 10, 13, 27, 16, 30, 34, 70, 5, 12, 14, 31, 21, 37, 45, 73, 20, 44, 41, 81, 54, 88, 93, 141, 6, 17, 23, 39, 19, 43, 47, 82, 28, 52, 56, 89, 65, 99, 103, 152, 33, 57, 67, 101, 71, 109, 116, 165, 77, 118, 126, 177, 131, 187, 199, 269, 9, 22, 26, 51, 29, 55, 62, 95, 35, 68, 58, 104, 75, 112, 121, 169, 42, 66, 76, 117, 84, 124, 130, 183, 91, 133, 145, 193, 151, 205, 215, 286, 49, 80, 90, 129, 100, 137, 149, 202, 107, 150, 164, 214, 171, 225, 234, 299, 119, 167, 182, 228, 185, 235, 247, 313, 196, 252, 259, 323, 273, 334, 347, 406, 15, 25, 32, 63, 38, 69, 74, 120, 46, 79, 85, 128, 92, 136, 140, 201, 53, 86, 94, 138, 102, 146, 155, 210, 111, 161, 168, 220, 179, 230, 245, 309, 60, 98, 108, 154, 113, 162, 173, 229, 127, 178, 186, 237, 195, 251, 262, 322, 139, 190, 203, 254, 213, 268, 275, 332, 226, 281, 293, 345, 302, 356, 372, 407, 64, 110, 123, 174, 135, 184, 194, 253, 143, 197, 206, 263, 216, 274, 285, 342, 156, 211, 221, 279, 236, 295, 301, 358, 242, 306, 315, 366, 327, 378, 387, 435, 170, 231, 239, 297, 255, 308, 317, 369, 272, 319, 333, 381, 346, 390, 398, 442, 284, 335, 348, 393, 355, 402, 412, 458, 370, 415, 422, 453, 429, 460, 469, 488, 18, 36, 40, 83, 48, 87, 96, 144, 50, 97, 105, 158, 114, 172, 175, 246, 59, 106, 115, 176, 125, 181, 189, 248, 132, 188, 200, 261, 212, 271, 276, 331, 61, 122, 134, 180, 142, 191, 204, 270, 153, 209, 217, 277, 224, 291, 298, 354, 159, 223, 232, 290, 241, 303, 311, 365, 257, 320, 324, 377, 336, 386, 395, 439, 72, 147, 148, 207, 160, 219, 227, 287, 166, 233, 238, 305, 249, 312, 321, 374, 198, 244, 256, 314, 264, 325, 337, 384, 283, 338, 350, 392, 359, 405, 409, 450, 218, 266, 278, 330, 289, 344, 352, 399, 300, 357, 364, 414, 375, 417, 426, 459, 316, 371, 379, 423, 385, 430, 419, 461, 396, 437, 444, 470, 448, 477, 482, 495, 78, 157, 163, 240, 192, 250, 258, 318, 208, 260, 267, 329, 282, 339, 349, 401, 222, 280, 288, 343, 294, 353, 361, 408, 307, 363, 367, 416, 383, 425, 433, 465, 243, 292, 296, 360, 310, 368, 376, 420, 328, 380, 388, 432, 397, 428, 441, 471, 341, 391, 403, 438, 410, 446, 452, 475, 418, 456, 455, 481, 462, 484, 487, 501, 265, 304, 326, 382, 340, 389, 394, 436, 351, 404, 400, 445, 413, 443, 454, 479, 362, 411, 421, 451, 427, 457, 463, 485, 434, 467, 468, 489, 474, 492, 494, 504, 373, 424, 431, 464, 440, 466, 473, 490, 447, 472, 476, 496, 480, 493, 499, 506, 449, 478, 483, 497, 486, 500, 498, 507, 491, 502, 503, 508, 505, 509, 510, 511]

Table Z7, having a sequence length of 512:

| Polarized channel sequence number | Reliability or sequence number of reliability |
|---|---|
| 0 | 0 |
| 1 | 1 |
| 2 | 2 |
| 3 | 7 |
| 4 | 3 |
| 5 | 8 |
| 6 | 11 |
| 7 | 24 |
| 8 | 4 |
| 9 | 10 |
| 10 | 13 |
| 11 | 27 |
| 12 | 16 |
| 13 | 30 |
| 14 | 34 |
| 15 | 70 |
| 16 | 5 |
| 17 | 12 |
| 18 | 14 |
| 19 | 31 |
| 20 | 21 |
| 21 | 37 |
| 22 | 45 |
| 23 | 73 |
| 24 | 20 |
| 25 | 44 |
| 26 | 41 |
| 27 | 81 |
| 28 | 54 |
| 29 | 88 |
| 30 | 93 |
| 31 | 141 |
| 32 | 6 |
| 33 | 17 |
| 34 | 23 |
| 35 | 39 |
| 36 | 19 |
| 37 | 43 |
| 38 | 47 |
| 39 | 82 |
| 40 | 28 |
| 41 | 52 |

-continued

Table Z7, having a sequence length of 512:

| Polarized channel sequence number | Reliability or sequence number of reliability |
|---|---|
| 42 | 56 |
| 43 | 89 |
| 44 | 65 |
| 45 | 99 |
| 46 | 103 |
| 47 | 152 |
| 48 | 33 |
| 49 | 57 |
| 50 | 67 |
| 51 | 101 |
| 52 | 71 |
| 53 | 109 |
| 54 | 116 |
| 55 | 165 |
| 56 | 77 |
| 57 | 118 |
| 58 | 126 |
| 59 | 177 |
| 60 | 131 |
| 61 | 187 |
| 62 | 199 |
| 63 | 269 |
| 64 | 9 |
| 65 | 22 |
| 66 | 26 |
| 67 | 51 |
| 68 | 29 |
| 69 | 55 |
| 70 | 62 |
| 71 | 95 |
| 72 | 35 |
| 73 | 68 |
| 74 | 58 |
| 75 | 104 |
| 76 | 75 |
| 77 | 112 |
| 78 | 121 |
| 79 | 169 |
| 80 | 42 |
| 81 | 66 |
| 82 | 76 |
| 83 | 117 |
| 84 | 84 |
| 85 | 124 |
| 86 | 130 |
| 87 | 183 |
| 88 | 91 |
| 89 | 133 |
| 90 | 145 |
| 91 | 193 |
| 92 | 151 |
| 93 | 205 |
| 94 | 215 |
| 95 | 286 |
| 96 | 49 |
| 97 | 80 |
| 98 | 90 |
| 99 | 129 |
| 100 | 100 |
| 101 | 137 |
| 102 | 149 |
| 103 | 202 |
| 104 | 107 |
| 105 | 150 |
| 106 | 164 |
| 107 | 214 |
| 108 | 171 |
| 109 | 225 |
| 110 | 234 |
| 111 | 299 |
| 112 | 119 |
| 113 | 167 |
| 114 | 182 |
| 115 | 228 |

-continued

Table Z7, having a sequence length of 512:

| Polarized channel sequence number | Reliability or sequence number of reliability |
|---|---|
| 116 | 185 |
| 117 | 235 |
| 118 | 247 |
| 119 | 313 |
| 120 | 196 |
| 121 | 252 |
| 122 | 259 |
| 123 | 323 |
| 124 | 273 |
| 125 | 334 |
| 126 | 347 |
| 127 | 406 |
| 128 | 15 |
| 129 | 25 |
| 130 | 32 |
| 131 | 63 |
| 132 | 38 |
| 133 | 69 |
| 134 | 74 |
| 135 | 120 |
| 136 | 46 |
| 137 | 79 |
| 138 | 85 |
| 139 | 128 |
| 140 | 92 |
| 141 | 136 |
| 142 | 140 |
| 143 | 201 |
| 144 | 53 |
| 145 | 86 |
| 146 | 94 |
| 147 | 138 |
| 148 | 102 |
| 149 | 146 |
| 150 | 155 |
| 151 | 210 |
| 152 | 111 |
| 153 | 161 |
| 154 | 168 |
| 155 | 220 |
| 156 | 179 |
| 157 | 230 |
| 158 | 245 |
| 159 | 309 |
| 160 | 60 |
| 161 | 98 |
| 162 | 108 |
| 163 | 154 |
| 164 | 113 |
| 165 | 162 |
| 166 | 173 |
| 167 | 229 |
| 168 | 127 |
| 169 | 178 |
| 170 | 186 |
| 171 | 237 |
| 172 | 195 |
| 173 | 251 |
| 174 | 262 |
| 175 | 322 |
| 176 | 139 |
| 177 | 190 |
| 178 | 203 |
| 179 | 254 |
| 180 | 213 |
| 181 | 268 |
| 182 | 275 |
| 183 | 332 |
| 184 | 226 |
| 185 | 281 |
| 186 | 293 |
| 187 | 345 |
| 188 | 302 |
| 189 | 356 |

-continued

Table Z7, having a sequence length of 512:

| Polarized channel sequence number | Reliability or sequence number of reliability |
|---|---|
| 190 | 372 |
| 191 | 407 |
| 192 | 64 |
| 193 | 110 |
| 194 | 123 |
| 195 | 174 |
| 196 | 135 |
| 197 | 184 |
| 198 | 194 |
| 199 | 253 |
| 200 | 143 |
| 201 | 197 |
| 202 | 206 |
| 203 | 263 |
| 204 | 216 |
| 205 | 274 |
| 206 | 285 |
| 207 | 342 |
| 208 | 156 |
| 209 | 211 |
| 210 | 221 |
| 211 | 279 |
| 212 | 236 |
| 213 | 295 |
| 214 | 301 |
| 215 | 358 |
| 216 | 242 |
| 217 | 306 |
| 218 | 315 |
| 219 | 366 |
| 220 | 327 |
| 221 | 378 |
| 222 | 387 |
| 223 | 435 |
| 224 | 170 |
| 225 | 231 |
| 226 | 239 |
| 227 | 297 |
| 228 | 255 |
| 229 | 308 |
| 230 | 317 |
| 231 | 369 |
| 232 | 272 |
| 233 | 319 |
| 234 | 333 |
| 235 | 381 |
| 236 | 346 |
| 237 | 390 |
| 238 | 398 |
| 239 | 442 |
| 240 | 284 |
| 241 | 335 |
| 242 | 348 |
| 243 | 393 |
| 244 | 355 |
| 245 | 402 |
| 246 | 412 |
| 247 | 458 |
| 248 | 370 |
| 249 | 415 |
| 250 | 422 |
| 251 | 453 |
| 252 | 429 |
| 253 | 460 |
| 254 | 469 |
| 255 | 488 |
| 256 | 18 |
| 257 | 36 |
| 258 | 40 |
| 259 | 83 |
| 260 | 48 |
| 261 | 87 |
| 262 | 96 |
| 263 | 144 |

-continued

Table Z7, having a sequence length of 512:

| Polarized channel sequence number | Reliability or sequence number of reliability |
|---|---|
| 264 | 50 |
| 265 | 97 |
| 266 | 105 |
| 267 | 158 |
| 268 | 114 |
| 269 | 172 |
| 270 | 175 |
| 271 | 246 |
| 272 | 59 |
| 273 | 106 |
| 274 | 115 |
| 275 | 176 |
| 276 | 125 |
| 277 | 181 |
| 278 | 189 |
| 279 | 248 |
| 280 | 132 |
| 281 | 188 |
| 282 | 200 |
| 283 | 261 |
| 284 | 212 |
| 285 | 271 |
| 286 | 276 |
| 287 | 331 |
| 288 | 61 |
| 289 | 122 |
| 290 | 134 |
| 291 | 180 |
| 292 | 142 |
| 293 | 191 |
| 294 | 204 |
| 295 | 270 |
| 296 | 153 |
| 297 | 209 |
| 298 | 217 |
| 299 | 277 |
| 300 | 224 |
| 301 | 291 |
| 302 | 298 |
| 303 | 354 |
| 304 | 159 |
| 305 | 223 |
| 306 | 232 |
| 307 | 290 |
| 308 | 241 |
| 309 | 303 |
| 310 | 311 |
| 311 | 365 |
| 312 | 257 |
| 313 | 320 |
| 314 | 324 |
| 315 | 377 |
| 316 | 336 |
| 317 | 386 |
| 318 | 395 |
| 319 | 439 |
| 320 | 72 |
| 321 | 147 |
| 322 | 148 |
| 323 | 207 |
| 324 | 160 |
| 325 | 219 |
| 326 | 227 |
| 327 | 287 |
| 328 | 166 |
| 329 | 233 |
| 330 | 238 |
| 331 | 305 |
| 332 | 249 |
| 333 | 312 |
| 334 | 321 |
| 335 | 374 |
| 336 | 198 |
| 337 | 244 |

-continued

Table Z7, having a sequence length of 512:

| Polarized channel sequence number | Reliability or sequence number of reliability |
|---|---|
| 338 | 256 |
| 339 | 314 |
| 340 | 264 |
| 341 | 325 |
| 342 | 337 |
| 343 | 384 |
| 344 | 283 |
| 345 | 338 |
| 346 | 350 |
| 347 | 392 |
| 348 | 359 |
| 349 | 405 |
| 350 | 409 |
| 351 | 450 |
| 352 | 218 |
| 353 | 266 |
| 354 | 278 |
| 355 | 330 |
| 356 | 289 |
| 357 | 344 |
| 358 | 352 |
| 359 | 399 |
| 360 | 300 |
| 361 | 357 |
| 362 | 364 |
| 363 | 414 |
| 364 | 375 |
| 365 | 417 |
| 366 | 426 |
| 367 | 459 |
| 368 | 316 |
| 369 | 371 |
| 370 | 379 |
| 371 | 423 |
| 372 | 385 |
| 373 | 430 |
| 374 | 419 |
| 375 | 461 |
| 376 | 396 |
| 377 | 437 |
| 378 | 444 |
| 379 | 470 |
| 380 | 448 |
| 381 | 477 |
| 382 | 482 |
| 383 | 495 |
| 384 | 78 |
| 385 | 157 |
| 386 | 163 |
| 387 | 240 |
| 388 | 192 |
| 389 | 250 |
| 390 | 258 |
| 391 | 318 |
| 392 | 208 |
| 393 | 260 |
| 394 | 267 |
| 395 | 329 |
| 396 | 282 |
| 397 | 339 |
| 398 | 349 |
| 399 | 401 |
| 400 | 222 |
| 401 | 280 |
| 402 | 288 |
| 403 | 343 |
| 404 | 294 |
| 405 | 353 |
| 406 | 361 |
| 407 | 408 |
| 408 | 307 |
| 409 | 363 |
| 410 | 367 |
| 411 | 416 |

-continued

Table Z7, having a sequence length of 512:

| Polarized channel sequence number | Reliability or sequence number of reliability |
|---|---|
| 412 | 383 |
| 413 | 425 |
| 414 | 433 |
| 415 | 465 |
| 416 | 243 |
| 417 | 292 |
| 418 | 296 |
| 419 | 360 |
| 420 | 310 |
| 421 | 368 |
| 422 | 376 |
| 423 | 420 |
| 424 | 328 |
| 425 | 380 |
| 426 | 388 |
| 427 | 432 |
| 428 | 397 |
| 429 | 428 |
| 430 | 441 |
| 431 | 471 |
| 432 | 341 |
| 433 | 391 |
| 434 | 403 |
| 435 | 438 |
| 436 | 410 |
| 437 | 446 |
| 438 | 452 |
| 439 | 475 |
| 440 | 418 |
| 441 | 456 |
| 442 | 455 |
| 443 | 481 |
| 444 | 462 |
| 445 | 484 |
| 446 | 487 |
| 447 | 501 |
| 448 | 265 |
| 449 | 304 |
| 450 | 326 |
| 451 | 382 |
| 452 | 340 |
| 453 | 389 |
| 454 | 394 |
| 455 | 436 |
| 456 | 351 |
| 457 | 404 |
| 458 | 400 |
| 459 | 445 |
| 460 | 413 |
| 461 | 443 |
| 462 | 454 |
| 463 | 479 |
| 464 | 362 |
| 465 | 411 |
| 466 | 421 |
| 467 | 451 |
| 468 | 427 |
| 469 | 457 |
| 470 | 463 |
| 471 | 485 |
| 472 | 434 |
| 473 | 467 |
| 474 | 468 |
| 475 | 489 |
| 476 | 474 |
| 477 | 492 |
| 478 | 494 |
| 479 | 504 |
| 480 | 373 |
| 481 | 424 |
| 482 | 431 |
| 483 | 464 |
| 484 | 440 |
| 485 | 466 |

-continued

| Table Z7, having a sequence length of 512: | |
|---|---|
| Polarized channel sequence number | Reliability or sequence number of reliability |
| 486 | 473 |
| 487 | 490 |
| 488 | 447 |
| 489 | 472 |
| 490 | 476 |
| 491 | 496 |
| 492 | 480 |
| 493 | 493 |
| 494 | 499 |
| 495 | 506 |
| 496 | 449 |
| 497 | 478 |
| 498 | 483 |
| 499 | 497 |
| 500 | 486 |
| 501 | 500 |
| 502 | 498 |
| 503 | 507 |
| 504 | 491 |
| 505 | 502 |
| 506 | 503 |
| 507 | 508 |
| 508 | 505 |
| 509 | 509 |
| 510 | 510 |
| 511 | 511 |

Sequence Z8, having a sequence length of 256:

[0, 1, 2, 7, 3, 8, 11, 23, 4, 10, 13, 26, 16, 29, 33, 63, 5, 12, 14, 30, 20, 35, 42, 65, 19, 41, 38, 72, 49, 77, 82, 120, 6, 17, 22, 37, 18, 40, 44, 73, 27, 47, 51, 78, 58, 86, 90, 127, 32, 52, 60, 88, 64, 94, 99, 134, 69, 101, 107, 142, 112, 150, 157, 194, 9, 21, 25, 46, 28, 50, 55, 84, 34, 61, 53, 91, 67, 97, 104, 137, 39, 59, 68, 100, 74, 106, 111, 146, 80, 113, 122, 152, 126, 161, 167, 203, 45, 71, 79, 110, 87, 116, 124, 159, 92, 125, 133, 166, 139, 171, 177, 207, 102, 135, 145, 173, 148, 178, 184, 213, 155, 186, 190, 218, 196, 222, 227, 243, 15, 24, 31, 56, 36, 62, 66, 103, 43, 70, 75, 109, 81, 115, 119, 158, 48, 76, 83, 117, 89, 123, 129, 163, 96, 131, 136, 169, 144, 175, 183, 212, 54, 85, 93, 128, 98, 132, 140, 174, 108, 143, 149, 180, 154, 185, 191, 217, 118, 151, 160, 188, 165, 193, 198, 220, 172, 200, 204, 225, 209, 230, 235, 244, 57, 95, 105, 141, 114, 147, 153, 187, 121, 156, 162, 192, 168, 197, 202, 224, 130, 164, 170, 199, 179, 205, 208, 231, 182, 210, 214, 232, 219, 236, 238, 249, 138, 176, 181, 206, 189, 211, 215, 233, 195, 216, 221, 237, 226, 239, 241, 250, 201, 223, 228, 240, 229, 242, 245, 252, 234, 246, 247, 251, 248, 253, 254, 255]

| Table Z8, having a sequence length of 256: | |
|---|---|
| Polarized channel sequence number | Reliability or sequence number of reliability |
| 0 | 0 |
| 1 | 1 |
| 2 | 2 |
| 3 | 7 |
| 4 | 3 |
| 5 | 8 |
| 6 | 11 |
| 7 | 23 |
| 8 | 4 |
| 9 | 10 |
| 10 | 13 |
| 11 | 26 |
| 12 | 16 |

-continued

| Table Z8, having a sequence length of 256: | |
|---|---|
| Polarized channel sequence number | Reliability or sequence number of reliability |
| 13 | 29 |
| 14 | 33 |
| 15 | 63 |
| 16 | 5 |
| 17 | 12 |
| 18 | 14 |
| 19 | 30 |
| 20 | 20 |
| 21 | 35 |
| 22 | 42 |
| 23 | 65 |
| 24 | 19 |
| 25 | 41 |
| 26 | 38 |
| 27 | 72 |
| 28 | 49 |
| 29 | 77 |
| 30 | 82 |
| 31 | 120 |
| 32 | 6 |
| 33 | 17 |
| 34 | 22 |
| 35 | 37 |
| 36 | 18 |
| 37 | 40 |
| 38 | 44 |
| 39 | 73 |
| 40 | 27 |
| 41 | 47 |
| 42 | 51 |
| 43 | 78 |
| 44 | 58 |
| 45 | 86 |
| 46 | 90 |
| 47 | 127 |
| 48 | 32 |
| 49 | 52 |
| 50 | 60 |
| 51 | 88 |
| 52 | 64 |
| 53 | 94 |
| 54 | 99 |
| 55 | 134 |
| 56 | 69 |
| 57 | 101 |
| 58 | 107 |
| 59 | 142 |
| 60 | 112 |
| 61 | 150 |
| 62 | 157 |
| 63 | 194 |
| 64 | 9 |
| 65 | 21 |
| 66 | 25 |
| 67 | 46 |
| 68 | 28 |
| 69 | 50 |
| 70 | 55 |
| 71 | 84 |
| 72 | 34 |
| 73 | 61 |
| 74 | 53 |
| 75 | 91 |
| 76 | 67 |
| 77 | 97 |
| 78 | 104 |
| 79 | 137 |
| 80 | 39 |
| 81 | 59 |
| 82 | 68 |
| 83 | 100 |
| 84 | 74 |
| 85 | 106 |
| 86 | 111 |

-continued

| Table Z8, having a sequence length of 256: | |
|---|---|
| Polarized channel sequence number | Reliability or sequence number of reliability |
| 87 | 146 |
| 88 | 80 |
| 89 | 113 |
| 90 | 122 |
| 91 | 152 |
| 92 | 126 |
| 93 | 161 |
| 94 | 167 |
| 95 | 203 |
| 96 | 45 |
| 97 | 71 |
| 98 | 79 |
| 99 | 110 |
| 100 | 87 |
| 101 | 116 |
| 102 | 124 |
| 103 | 159 |
| 104 | 92 |
| 105 | 125 |
| 106 | 133 |
| 107 | 166 |
| 108 | 139 |
| 109 | 171 |
| 110 | 177 |
| 111 | 207 |
| 112 | 102 |
| 113 | 135 |
| 114 | 145 |
| 115 | 173 |
| 116 | 148 |
| 117 | 178 |
| 118 | 184 |
| 119 | 213 |
| 120 | 155 |
| 121 | 186 |
| 122 | 190 |
| 123 | 218 |
| 124 | 196 |
| 125 | 222 |
| 126 | 227 |
| 127 | 243 |
| 128 | 15 |
| 129 | 24 |
| 130 | 31 |
| 131 | 56 |
| 132 | 36 |
| 133 | 62 |
| 134 | 66 |
| 135 | 103 |
| 136 | 43 |
| 137 | 70 |
| 138 | 75 |
| 139 | 109 |
| 140 | 81 |
| 141 | 115 |
| 142 | 119 |
| 143 | 158 |
| 144 | 48 |
| 145 | 76 |
| 146 | 83 |
| 147 | 117 |
| 148 | 89 |
| 149 | 123 |
| 150 | 129 |
| 151 | 163 |
| 152 | 96 |
| 153 | 131 |
| 154 | 136 |
| 155 | 169 |
| 156 | 144 |
| 157 | 175 |
| 158 | 183 |
| 159 | 212 |
| 160 | 54 |

-continued

| Table Z8, having a sequence length of 256: | |
|---|---|
| Polarized channel sequence number | Reliability or sequence number of reliability |
| 161 | 85 |
| 162 | 93 |
| 163 | 128 |
| 164 | 98 |
| 165 | 132 |
| 166 | 140 |
| 167 | 174 |
| 168 | 108 |
| 169 | 143 |
| 170 | 149 |
| 171 | 180 |
| 172 | 154 |
| 173 | 185 |
| 174 | 191 |
| 175 | 217 |
| 176 | 118 |
| 177 | 151 |
| 178 | 160 |
| 179 | 188 |
| 180 | 165 |
| 181 | 193 |
| 182 | 198 |
| 183 | 220 |
| 184 | 172 |
| 185 | 200 |
| 186 | 204 |
| 187 | 225 |
| 188 | 209 |
| 189 | 230 |
| 190 | 235 |
| 191 | 244 |
| 192 | 57 |
| 193 | 95 |
| 194 | 105 |
| 195 | 141 |
| 196 | 114 |
| 197 | 147 |
| 198 | 153 |
| 199 | 187 |
| 200 | 121 |
| 201 | 156 |
| 202 | 162 |
| 203 | 192 |
| 204 | 168 |
| 205 | 197 |
| 206 | 202 |
| 207 | 224 |
| 208 | 130 |
| 209 | 164 |
| 210 | 170 |
| 211 | 199 |
| 212 | 179 |
| 213 | 205 |
| 214 | 208 |
| 215 | 231 |
| 216 | 182 |
| 217 | 210 |
| 218 | 214 |
| 219 | 232 |
| 220 | 219 |
| 221 | 236 |
| 222 | 238 |
| 223 | 249 |
| 224 | 138 |
| 225 | 176 |
| 226 | 181 |
| 227 | 206 |
| 228 | 189 |
| 229 | 211 |
| 230 | 215 |
| 231 | 233 |
| 232 | 195 |
| 233 | 216 |
| 234 | 221 |

-continued

| Table Z8, having a sequence length of 256: | |
|---|---|
| Polarized channel sequence number | Reliability or sequence number of reliability |
| 235 | 237 |
| 236 | 226 |
| 237 | 239 |
| 238 | 241 |
| 239 | 250 |
| 240 | 201 |
| 241 | 223 |
| 242 | 228 |
| 243 | 240 |
| 244 | 229 |
| 245 | 242 |
| 246 | 245 |
| 247 | 252 |
| 248 | 234 |
| 249 | 246 |
| 250 | 247 |
| 251 | 251 |
| 252 | 248 |
| 253 | 253 |
| 254 | 254 |
| 255 | 255 |

Sequence Z9, having a sequence length of 128:

[0, 1, 2, 7, 3, 8, 11, 22, 4, 10, 13, 24, 15, 27, 30, 53, 5, 12, 14, 28, 19, 32, 38, 55, 18, 37, 34, 60, 43, 63, 67, 89, 6, 16, 21, 33, 17, 36, 39, 61, 25, 42, 45, 64, 49, 69, 72, 94, 29, 46, 51, 71, 54, 75, 77, 96, 58, 79, 83, 100, 86, 104, 107, 119, 9, 20, 23, 41, 26, 44, 48, 68, 31, 52, 47, 73, 56, 76, 81, 98, 35, 50, 57, 78, 62, 82, 85, 102, 66, 87, 90, 105, 93, 109, 111, 121, 40, 59, 65, 84, 70, 88, 91, 108, 74, 92, 95, 110, 99, 112, 114, 122, 80, 97, 101, 113, 103, 115, 116, 123, 106, 117, 118, 124, 120, 125,

| Table Z9, having a sequence length of 128: | |
|---|---|
| Polarized channel sequence number | Reliability or sequence number of reliability |
| 0 | 0 |
| 1 | 1 |
| 2 | 2 |
| 3 | 7 |
| 4 | 3 |
| 5 | 8 |
| 6 | 11 |
| 7 | 22 |
| 8 | 4 |
| 9 | 10 |
| 10 | 13 |
| 11 | 24 |
| 12 | 15 |
| 13 | 27 |
| 14 | 30 |
| 15 | 53 |
| 16 | 5 |
| 17 | 12 |
| 18 | 14 |
| 19 | 28 |
| 20 | 19 |
| 21 | 32 |
| 22 | 38 |
| 23 | 55 |
| 24 | 18 |
| 25 | 37 |
| 26 | 34 |
| 27 | 60 |
| 28 | 43 |
| 29 | 63 |
| 30 | 67 |
| 31 | 89 |
| 32 | 6 |
| 33 | 16 |
| 34 | 21 |
| 35 | 33 |
| 36 | 17 |
| 37 | 36 |
| 38 | 39 |
| 39 | 61 |
| 40 | 25 |
| 41 | 42 |
| 42 | 45 |
| 43 | 64 |
| 44 | 49 |
| 45 | 69 |
| 46 | 72 |
| 47 | 94 |
| 48 | 29 |
| 49 | 46 |
| 50 | 51 |
| 51 | 71 |
| 52 | 54 |
| 53 | 75 |
| 54 | 77 |
| 55 | 96 |
| 56 | 58 |
| 57 | 79 |
| 58 | 83 |
| 59 | 100 |
| 60 | 86 |
| 61 | 104 |
| 62 | 107 |
| 63 | 119 |
| 64 | 9 |
| 65 | 20 |
| 66 | 23 |
| 67 | 41 |
| 68 | 26 |
| 69 | 44 |
| 70 | 48 |
| 71 | 68 |
| 72 | 31 |
| 73 | 52 |
| 74 | 47 |
| 75 | 73 |
| 76 | 56 |
| 77 | 76 |
| 78 | 81 |
| 79 | 98 |
| 80 | 35 |
| 81 | 50 |
| 82 | 57 |
| 83 | 78 |
| 84 | 62 |
| 85 | 82 |
| 86 | 85 |
| 87 | 102 |
| 88 | 66 |
| 89 | 87 |
| 90 | 90 |
| 91 | 105 |
| 92 | 93 |
| 93 | 109 |
| 94 | 111 |
| 95 | 121 |
| 96 | 40 |
| 97 | 59 |
| 98 | 65 |
| 99 | 84 |
| 100 | 70 |
| 101 | 88 |
| 102 | 91 |
| 103 | 108 |
| 104 | 74 |
| 105 | 92 |

-continued

| Table Z9, having a sequence length of 128: | |
|---|---|
| Polarized channel sequence number | Reliability or sequence number of reliability |
| 106 | 95 |
| 107 | 110 |
| 108 | 99 |
| 109 | 112 |
| 110 | 114 |
| 111 | 122 |
| 112 | 80 |
| 113 | 97 |
| 114 | 101 |
| 115 | 113 |
| 116 | 103 |
| 117 | 115 |
| 118 | 116 |
| 119 | 123 |
| 120 | 106 |
| 121 | 117 |
| 122 | 118 |
| 123 | 124 |
| 124 | 120 |
| 125 | 125 |
| 126 | 126 |
| 127 | 127 |

Sequence Z10, having a sequence length of 64:

[0, 1, 2, 7, 3, 8, 10, 20, 4, 9, 12, 21, 14, 23, 26, 40, 5, 11, 13, 24, 18, 27, 32, 42, 17, 31, 29, 44, 35, 46, 48, 57, 6, 15, 19, 28, 16, 30, 33, 45, 22, 34, 36, 47, 38, 49, 51, 58, 25, 37, 39, 50, 41, 52, 53, 59, 43, 54, 55, 60, 56, 61, 62, 63]

| Table Z10, having a sequence length of 64: | |
|---|---|
| Polarized channel sequence number | Reliability or sequence number of reliability |
| 0 | 0 |
| 1 | 1 |
| 2 | 2 |
| 3 | 7 |
| 4 | 3 |
| 5 | 8 |
| 6 | 10 |
| 7 | 20 |
| 8 | 4 |
| 9 | 9 |
| 10 | 12 |
| 11 | 21 |
| 12 | 14 |
| 13 | 23 |
| 14 | 26 |
| 15 | 40 |
| 16 | 5 |
| 17 | 11 |
| 18 | 13 |
| 19 | 24 |
| 20 | 18 |
| 21 | 27 |
| 22 | 32 |
| 23 | 42 |
| 24 | 17 |
| 25 | 31 |
| 26 | 29 |
| 27 | 44 |
| 28 | 35 |
| 29 | 46 |
| 30 | 48 |
| 31 | 57 |
| 32 | 6 |
| 33 | 15 |
| 34 | 19 |
| 35 | 28 |
| 36 | 16 |
| 37 | 30 |
| 38 | 33 |
| 39 | 45 |
| 40 | 22 |
| 41 | 34 |
| 42 | 36 |
| 43 | 47 |
| 44 | 38 |
| 45 | 49 |
| 46 | 51 |
| 47 | 58 |
| 48 | 25 |
| 49 | 37 |
| 50 | 39 |
| 51 | 50 |
| 52 | 41 |
| 53 | 52 |
| 54 | 53 |
| 55 | 59 |
| 56 | 43 |
| 57 | 54 |
| 58 | 55 |
| 59 | 60 |
| 60 | 56 |
| 61 | 61 |
| 62 | 62 |
| 63 | 63 |

Third group of sequences (a criterion that comprehensively considers performance obtained by List (list) whose sizes are respectively 1, 2, 4, 8, and 16, and preferentially considers performance of Lists 2, 4, and 8).

Sequence Q11, having a sequence length of 1024:

[0, 1, 2, 4, 8, 16, 32, 3, 5, 64, 9, 6, 17, 10, 18, 128, 12, 33, 65, 20, 256, 34, 24, 36, 7, 129, 66, 512, 11, 40, 68, 130, 19, 13, 48, 14, 72, 257, 21, 132, 35, 258, 26, 513, 80, 37, 25, 22, 136, 260, 264, 38, 514, 96, 67, 41, 144, 28, 69, 42, 516, 49, 74, 272, 160, 520, 288, 528, 192, 544, 70, 44, 131, 81, 50, 73, 15, 320, 133, 52, 23, 134, 384, 76, 137, 82, 56, 27, 97, 39, 259, 84, 138, 145, 261, 29, 43, 98, 515, 88, 140, 30, 146, 71, 262, 265, 161, 576, 45, 100, 640, 51, 148, 46, 75, 266, 273, 517, 104, 162, 53, 193, 152, 77, 164, 768, 268, 274, 518, 54, 83, 57, 521, 112, 135, 78, 289, 194, 85, 276, 522, 58, 168, 139, 99, 86, 60, 280, 89, 290, 529, 524, 196, 141, 101, 147, 176, 142, 530, 321, 31, 200, 90, 545, 292, 322, 532, 263, 149, 102, 105, 304, 296, 163, 92, 47, 267, 385, 546, 324, 208, 386, 150, 153, 165, 106, 55, 328, 536, 577, 548, 113, 154, 79, 269, 108, 578, 224, 166, 519, 552, 195, 270, 641, 523, 275, 580, 291, 59, 169, 560, 114, 277, 156, 87, 197, 116, 170, 61, 531, 525, 642, 281, 278, 526, 177, 293, 388, 91, 584, 769, 198, 172, 120, 201, 336, 62, 282, 143, 103, 178, 294, 93, 644, 202, 592, 323, 392, 297, 770, 107, 180, 151, 209, 284, 648, 94, 204, 298, 400, 608, 352, 325, 533, 155, 210, 305, 547, 300, 109, 184, 534, 537, 115, 167, 225, 326, 306, 772, 157, 656, 329, 110, 117, 212, 171, 776, 330, 226, 549, 538, 387, 308, 216, 416, 271, 279, 158, 337, 550, 672, 118, 332, 579, 540, 389, 173, 121, 553, 199, 784, 179, 228, 338, 312, 704, 390, 174, 554, 581, 393, 283, 122, 448, 353, 561, 203, 63, 340, 394, 527, 582, 556, 181, 295, 285, 232, 124, 205, 182, 643, 562, 286, 585, 299, 354, 211, 401, 185, 396, 344, 586, 645, 593, 535, 240, 206, 95, 327, 564, 800, 402, 356, 307, 301, 417, 213, 568, 832, 588, 186, 646, 404, 227, 896, 594, 418, 302, 649, 771, 360, 539, 111, 331, 214, 309, 188, 449, 217, 408, 609, 596, 551, 650, 229, 159, 420, 310, 541, 773, 610, 657, 333, 119, 600, 339, 218, 368, 652, 230, 391, 313, 450, 542, 334, 233, 555, 774, 175, 123, 658, 612, 341, 777, 220, 314, 424, 395, 673, 583, 355, 287, 183, 234, 125, 557, 660, 616, 342, 316, 241, 778, 563, 345, 452, 397, 403, 207, 674, 558, 785, 432, 357, 187, 236, 664, 624, 587, 780, 705, 126, 242, 565, 398, 346, 456, 358, 405, 303, 569, 244, 595, 189, 566, 676, 361, 706, 589, 215, 786, 647, 348, 419, 406, 464, 680, 801, 362, 590, 409, 570, 788, 597, 572, 219, 311, 708, 598, 601, 651, 421, 792, 802, 611, 602, 410, 231, 688, 653, 248, 369, 190, 364, 654, 659, 335, 480, 315, 221, 370, 613, 422, 425, 451, 614, 543, 235, 412, 343, 372, 775, 317, 222, 426, 453, 237, 559, 833, 804, 712, 834, 661, 808, 779, 617, 604, 433, 720, 816, 836, 347, 897, 243, 662, 454, 318, 675, 618, 898, 781, 376, 428, 665, 736, 567, 840, 625, 238, 359, 457, 399, 787, 591, 678, 434, 677, 349, 245, 458, 666, 620, 363, 127, 191, 782, 407, 436, 626, 571, 465, 681, 246, 707, 350, 599, 668, 790, 460, 249, 682, 573, 411, 803, 789, 709, 365, 440, 628, 689, 374, 423, 466, 793, 250, 371, 481, 574, 413, 603, 366, 468, 655, 900, 805, 615, 684, 710, 429, 794, 252, 373, 605, 848, 690, 713, 632, 482, 806, 427, 904, 414, 223, 663, 692, 835, 619, 472, 455, 796, 809, 714, 721, 837, 716, 864, 810, 606, 912, 722, 696, 377, 435, 817, 319, 621, 812, 484, 430, 838, 667, 488, 239, 378, 459, 622, 627, 437, 380, 818, 461, 496, 669, 679, 724, 841, 629, 351, 467, 438, 737, 251, 462, 442, 441, 469, 247, 683, 842, 738, 899, 670, 783, 849, 820, 728, 928, 791, 367, 901, 630, 685, 844, 633, 711, 253, 691, 824, 902, 686, 740, 850, 375, 444, 470, 483, 415, 485, 905, 795, 473, 634, 744, 852, 960, 865, 693, 797, 906, 715, 807, 474, 636, 694, 254, 717, 575, 913, 798, 811, 379, 697, 431, 607, 489, 866, 723, 486, 908, 718, 813, 476, 856, 839, 725, 698, 914, 752, 868, 819, 814, 439, 929, 490, 623, 671, 739, 916, 463, 843, 381, 497, 930, 821, 726, 961, 872, 492, 631, 729, 700, 443, 741, 845, 920, 382, 822, 851, 730, 498, 880, 742, 445, 471, 635, 932, 687, 903, 825, 500, 846, 745, 826, 732, 446, 962, 936, 475, 853, 867, 637, 907, 487, 695, 746, 828, 753, 854, 857, 504, 799, 255, 964, 909, 719, 477, 915, 638, 748, 944, 869, 491, 699, 754, 858, 478, 968, 383, 910, 815, 976, 870, 917, 727, 493, 873, 701, 931, 756, 860, 499, 731, 823, 922, 874, 918, 502, 933, 743, 760, 881, 494, 702, 921, 501, 876, 847, 992, 447, 733, 827, 934, 882, 937, 963, 747, 505, 855, 924, 734, 829, 965, 938, 884, 506, 749, 945, 966, 755, 859, 940, 830, 911, 871, 639, 888, 479, 946, 750, 969, 508, 861, 757, 970, 919, 875, 862, 758, 948, 977, 923, 972, 761, 877, 952, 495, 703, 935, 978, 883, 762, 503, 925, 878, 735, 993, 885, 939, 994, 980, 926, 764, 941, 967, 886, 831, 947, 507, 889, 984, 751, 942, 996, 971, 890, 509, 949, 973, 1000, 892, 950, 863, 759, 1008, 510, 979, 953, 763, 974, 954, 879, 981, 982, 927, 995, 765, 956, 887, 985, 997, 986, 943, 891, 998, 766, 511, 988, 1001, 951, 1002, 893, 975, 894, 1009, 955, 1004, 1010, 957, 983, 958, 987, 1012, 999, 1016, 767, 989, 1003, 990, 1005, 959, 1011, 1013, 895, 1006, 1014, 1017, 1018, 991, 1020, 1007, 1015, 1019, 1021, 1022, 10231

Table Q11, having a sequence length of 1024:

| Reliability or sequence number of reliability | Polarized channel sequence number |
|---|---|
| 0 | 0 |
| 1 | 1 |
| 2 | 2 |
| 3 | 4 |
| 4 | 8 |
| 5 | 16 |
| 6 | 32 |
| 7 | 3 |
| 8 | 5 |
| 9 | 64 |
| 10 | 9 |
| 11 | 6 |
| 12 | 17 |
| 13 | 10 |
| 14 | 18 |
| 15 | 128 |
| 16 | 12 |
| 17 | 33 |
| 18 | 65 |
| 19 | 20 |
| 20 | 256 |
| 21 | 34 |
| 22 | 24 |
| 23 | 36 |
| 24 | 7 |
| 25 | 129 |
| 26 | 66 |
| 27 | 512 |
| 28 | 11 |
| 29 | 40 |
| 30 | 68 |
| 31 | 130 |
| 32 | 19 |
| 33 | 13 |
| 34 | 48 |
| 35 | 14 |
| 36 | 72 |
| 37 | 257 |
| 38 | 21 |
| 39 | 132 |
| 40 | 35 |
| 41 | 258 |
| 42 | 26 |
| 43 | 513 |
| 44 | 80 |
| 45 | 37 |
| 46 | 25 |
| 47 | 22 |
| 48 | 136 |
| 49 | 260 |
| 50 | 264 |
| 51 | 38 |
| 52 | 514 |
| 53 | 96 |
| 54 | 67 |
| 55 | 41 |
| 56 | 144 |
| 57 | 28 |
| 58 | 69 |
| 59 | 42 |
| 60 | 516 |
| 61 | 49 |
| 62 | 74 |
| 63 | 272 |
| 64 | 160 |
| 65 | 520 |
| 66 | 288 |
| 67 | 528 |
| 68 | 192 |
| 69 | 544 |
| 70 | 70 |
| 71 | 44 |
| 72 | 131 |
| 73 | 81 |
| 74 | 50 |
| 75 | 73 |
| 76 | 15 |
| 77 | 320 |

-continued

| Table Q11, having a sequence length of 1024: | |
|---|---|
| Reliability or sequence number of reliability | Polarized channel sequence number |
| 78 | 133 |
| 79 | 52 |
| 80 | 23 |
| 81 | 134 |
| 82 | 384 |
| 83 | 76 |
| 84 | 137 |
| 85 | 82 |
| 86 | 56 |
| 87 | 27 |
| 88 | 97 |
| 89 | 39 |
| 90 | 259 |
| 91 | 84 |
| 92 | 138 |
| 93 | 145 |
| 94 | 261 |
| 95 | 29 |
| 96 | 43 |
| 97 | 98 |
| 98 | 515 |
| 99 | 88 |
| 100 | 140 |
| 101 | 30 |
| 102 | 146 |
| 103 | 71 |
| 104 | 262 |
| 105 | 265 |
| 106 | 161 |
| 107 | 576 |
| 108 | 45 |
| 109 | 100 |
| 110 | 640 |
| 111 | 51 |
| 112 | 148 |
| 113 | 46 |
| 114 | 75 |
| 115 | 266 |
| 116 | 273 |
| 117 | 517 |
| 118 | 104 |
| 119 | 162 |
| 120 | 53 |
| 121 | 193 |
| 122 | 152 |
| 123 | 77 |
| 124 | 164 |
| 125 | 768 |
| 126 | 268 |
| 127 | 274 |
| 128 | 518 |
| 129 | 54 |
| 130 | 83 |
| 131 | 57 |
| 132 | 521 |
| 133 | 112 |
| 134 | 135 |
| 135 | 78 |
| 136 | 289 |
| 137 | 194 |
| 138 | 85 |
| 139 | 276 |
| 140 | 522 |
| 141 | 58 |
| 142 | 168 |
| 143 | 139 |
| 144 | 99 |
| 145 | 86 |
| 146 | 60 |
| 147 | 280 |
| 148 | 89 |
| 149 | 290 |

-continued

| Table Q11, having a sequence length of 1024: | |
|---|---|
| Reliability or sequence number of reliability | Polarized channel sequence number |
| 150 | 529 |
| 151 | 524 |
| 152 | 196 |
| 153 | 141 |
| 154 | 101 |
| 155 | 147 |
| 156 | 176 |
| 157 | 142 |
| 158 | 530 |
| 159 | 321 |
| 160 | 31 |
| 161 | 200 |
| 162 | 90 |
| 163 | 545 |
| 164 | 292 |
| 165 | 322 |
| 166 | 532 |
| 167 | 263 |
| 168 | 149 |
| 169 | 102 |
| 170 | 105 |
| 171 | 304 |
| 172 | 296 |
| 173 | 163 |
| 174 | 92 |
| 175 | 47 |
| 176 | 267 |
| 177 | 385 |
| 178 | 546 |
| 179 | 324 |
| 180 | 208 |
| 181 | 386 |
| 182 | 150 |
| 183 | 153 |
| 184 | 165 |
| 185 | 106 |
| 186 | 55 |
| 187 | 328 |
| 188 | 536 |
| 189 | 577 |
| 190 | 548 |
| 191 | 113 |
| 192 | 154 |
| 193 | 79 |
| 194 | 269 |
| 195 | 108 |
| 196 | 578 |
| 197 | 224 |
| 198 | 166 |
| 199 | 519 |
| 200 | 552 |
| 201 | 195 |
| 202 | 270 |
| 203 | 641 |
| 204 | 523 |
| 205 | 275 |
| 206 | 580 |
| 207 | 291 |
| 208 | 59 |
| 209 | 169 |
| 210 | 560 |
| 211 | 114 |
| 212 | 277 |
| 213 | 156 |
| 214 | 87 |
| 215 | 197 |
| 216 | 116 |
| 217 | 170 |
| 218 | 61 |
| 219 | 531 |
| 220 | 525 |
| 221 | 642 |

-continued

Table Q11, having a sequence length of 1024:

| Reliability or sequence number of reliability | Polarized channel sequence number |
|---|---|
| 222 | 281 |
| 223 | 278 |
| 224 | 526 |
| 225 | 177 |
| 226 | 293 |
| 227 | 388 |
| 228 | 91 |
| 229 | 584 |
| 230 | 769 |
| 231 | 198 |
| 232 | 172 |
| 233 | 120 |
| 234 | 201 |
| 235 | 336 |
| 236 | 62 |
| 237 | 282 |
| 238 | 143 |
| 239 | 103 |
| 240 | 178 |
| 241 | 294 |
| 242 | 93 |
| 243 | 644 |
| 244 | 202 |
| 245 | 592 |
| 246 | 323 |
| 247 | 392 |
| 248 | 297 |
| 249 | 770 |
| 250 | 107 |
| 251 | 180 |
| 252 | 151 |
| 253 | 209 |
| 254 | 284 |
| 255 | 648 |
| 256 | 94 |
| 257 | 204 |
| 258 | 298 |
| 259 | 400 |
| 260 | 608 |
| 261 | 352 |
| 262 | 325 |
| 263 | 533 |
| 264 | 155 |
| 265 | 210 |
| 266 | 305 |
| 267 | 547 |
| 268 | 300 |
| 269 | 109 |
| 270 | 184 |
| 271 | 534 |
| 272 | 537 |
| 273 | 115 |
| 274 | 167 |
| 275 | 225 |
| 276 | 326 |
| 277 | 306 |
| 278 | 772 |
| 279 | 157 |
| 280 | 656 |
| 281 | 329 |
| 282 | 110 |
| 283 | 117 |
| 284 | 212 |
| 285 | 171 |
| 286 | 776 |
| 287 | 330 |
| 288 | 226 |
| 289 | 549 |
| 290 | 538 |
| 291 | 387 |
| 292 | 308 |
| 293 | 216 |

-continued

Table Q11, having a sequence length of 1024:

| Reliability or sequence number of reliability | Polarized channel sequence number |
|---|---|
| 294 | 416 |
| 295 | 271 |
| 296 | 279 |
| 297 | 158 |
| 298 | 337 |
| 299 | 550 |
| 300 | 672 |
| 301 | 118 |
| 302 | 332 |
| 303 | 579 |
| 304 | 540 |
| 305 | 389 |
| 306 | 173 |
| 307 | 121 |
| 308 | 553 |
| 309 | 199 |
| 310 | 784 |
| 311 | 179 |
| 312 | 228 |
| 313 | 338 |
| 314 | 312 |
| 315 | 704 |
| 316 | 390 |
| 317 | 174 |
| 318 | 554 |
| 319 | 581 |
| 320 | 393 |
| 321 | 283 |
| 322 | 122 |
| 323 | 448 |
| 324 | 353 |
| 325 | 561 |
| 326 | 203 |
| 327 | 63 |
| 328 | 340 |
| 329 | 394 |
| 330 | 527 |
| 331 | 582 |
| 332 | 556 |
| 333 | 181 |
| 334 | 295 |
| 335 | 285 |
| 336 | 232 |
| 337 | 124 |
| 338 | 205 |
| 339 | 182 |
| 340 | 643 |
| 341 | 562 |
| 342 | 286 |
| 343 | 585 |
| 344 | 299 |
| 345 | 354 |
| 346 | 211 |
| 347 | 401 |
| 348 | 185 |
| 349 | 396 |
| 350 | 344 |
| 351 | 586 |
| 352 | 645 |
| 353 | 593 |
| 354 | 535 |
| 355 | 240 |
| 356 | 206 |
| 357 | 95 |
| 358 | 327 |
| 359 | 564 |
| 360 | 800 |
| 361 | 402 |
| 362 | 356 |
| 363 | 307 |
| 364 | 301 |
| 365 | 417 |

-continued

Table Q11, having a sequence length of 1024:

| Reliability or sequence number of reliability | Polarized channel sequence number |
|---|---|
| 366 | 213 |
| 367 | 568 |
| 368 | 832 |
| 369 | 588 |
| 370 | 186 |
| 371 | 646 |
| 372 | 404 |
| 373 | 227 |
| 374 | 896 |
| 375 | 594 |
| 376 | 418 |
| 377 | 302 |
| 378 | 649 |
| 379 | 771 |
| 380 | 360 |
| 381 | 539 |
| 382 | 111 |
| 383 | 331 |
| 384 | 214 |
| 385 | 309 |
| 386 | 188 |
| 387 | 449 |
| 388 | 217 |
| 389 | 408 |
| 390 | 609 |
| 391 | 596 |
| 392 | 551 |
| 393 | 650 |
| 394 | 229 |
| 395 | 159 |
| 396 | 420 |
| 397 | 310 |
| 398 | 541 |
| 399 | 773 |
| 400 | 610 |
| 401 | 657 |
| 402 | 333 |
| 403 | 119 |
| 404 | 600 |
| 405 | 339 |
| 406 | 218 |
| 407 | 368 |
| 408 | 652 |
| 409 | 230 |
| 410 | 391 |
| 411 | 313 |
| 412 | 450 |
| 413 | 542 |
| 414 | 334 |
| 415 | 233 |
| 416 | 555 |
| 417 | 774 |
| 418 | 175 |
| 419 | 123 |
| 420 | 658 |
| 421 | 612 |
| 422 | 341 |
| 423 | 777 |
| 424 | 220 |
| 425 | 314 |
| 426 | 424 |
| 427 | 395 |
| 428 | 673 |
| 429 | 583 |
| 430 | 355 |
| 431 | 287 |
| 432 | 183 |
| 433 | 234 |
| 434 | 125 |
| 435 | 557 |
| 436 | 660 |
| 437 | 616 |

-continued

Table Q11, having a sequence length of 1024:

| Reliability or sequence number of reliability | Polarized channel sequence number |
|---|---|
| 438 | 342 |
| 439 | 316 |
| 440 | 241 |
| 441 | 778 |
| 442 | 563 |
| 443 | 345 |
| 444 | 452 |
| 445 | 397 |
| 446 | 403 |
| 447 | 207 |
| 448 | 674 |
| 449 | 558 |
| 450 | 785 |
| 451 | 432 |
| 452 | 357 |
| 453 | 187 |
| 454 | 236 |
| 455 | 664 |
| 456 | 624 |
| 457 | 587 |
| 458 | 780 |
| 459 | 705 |
| 460 | 126 |
| 461 | 242 |
| 462 | 565 |
| 463 | 398 |
| 464 | 346 |
| 465 | 456 |
| 466 | 358 |
| 467 | 405 |
| 468 | 303 |
| 469 | 569 |
| 470 | 244 |
| 471 | 595 |
| 472 | 189 |
| 473 | 566 |
| 474 | 676 |
| 475 | 361 |
| 476 | 706 |
| 477 | 589 |
| 478 | 215 |
| 479 | 786 |
| 480 | 647 |
| 481 | 348 |
| 482 | 419 |
| 483 | 406 |
| 484 | 464 |
| 485 | 680 |
| 486 | 801 |
| 487 | 362 |
| 488 | 590 |
| 489 | 409 |
| 490 | 570 |
| 491 | 788 |
| 492 | 597 |
| 493 | 572 |
| 494 | 219 |
| 495 | 311 |
| 496 | 708 |
| 497 | 598 |
| 498 | 601 |
| 499 | 651 |
| 500 | 421 |
| 501 | 792 |
| 502 | 802 |
| 503 | 611 |
| 504 | 602 |
| 505 | 410 |
| 506 | 231 |
| 507 | 688 |
| 508 | 653 |
| 509 | 248 |

-continued

Table Q11, having a sequence length of 1024:

| Reliability or sequence number of reliability | Polarized channel sequence number |
|---|---|
| 510 | 369 |
| 511 | 190 |
| 512 | 364 |
| 513 | 654 |
| 514 | 659 |
| 515 | 335 |
| 516 | 480 |
| 517 | 315 |
| 518 | 221 |
| 519 | 370 |
| 520 | 613 |
| 521 | 422 |
| 522 | 425 |
| 523 | 451 |
| 524 | 614 |
| 525 | 543 |
| 526 | 235 |
| 527 | 412 |
| 528 | 343 |
| 529 | 372 |
| 530 | 775 |
| 531 | 317 |
| 532 | 222 |
| 533 | 426 |
| 534 | 453 |
| 535 | 237 |
| 536 | 559 |
| 537 | 833 |
| 538 | 804 |
| 539 | 712 |
| 540 | 834 |
| 541 | 661 |
| 542 | 808 |
| 543 | 779 |
| 544 | 617 |
| 545 | 604 |
| 546 | 433 |
| 547 | 720 |
| 548 | 816 |
| 549 | 836 |
| 550 | 347 |
| 551 | 897 |
| 552 | 243 |
| 553 | 662 |
| 554 | 454 |
| 555 | 318 |
| 556 | 675 |
| 557 | 618 |
| 558 | 898 |
| 559 | 781 |
| 560 | 376 |
| 561 | 428 |
| 562 | 665 |
| 563 | 736 |
| 564 | 567 |
| 565 | 840 |
| 566 | 625 |
| 567 | 238 |
| 568 | 359 |
| 569 | 457 |
| 570 | 399 |
| 571 | 787 |
| 572 | 591 |
| 573 | 678 |
| 574 | 434 |
| 575 | 677 |
| 576 | 349 |
| 577 | 245 |
| 578 | 458 |
| 579 | 666 |
| 580 | 620 |
| 581 | 363 |

-continued

Table Q11, having a sequence length of 1024:

| Reliability or sequence number of reliability | Polarized channel sequence number |
|---|---|
| 582 | 127 |
| 583 | 191 |
| 584 | 782 |
| 585 | 407 |
| 586 | 436 |
| 587 | 626 |
| 588 | 571 |
| 589 | 465 |
| 590 | 681 |
| 591 | 246 |
| 592 | 707 |
| 593 | 350 |
| 594 | 599 |
| 595 | 668 |
| 596 | 790 |
| 597 | 460 |
| 598 | 249 |
| 599 | 682 |
| 600 | 573 |
| 601 | 411 |
| 602 | 803 |
| 603 | 789 |
| 604 | 709 |
| 605 | 365 |
| 606 | 440 |
| 607 | 628 |
| 608 | 689 |
| 609 | 374 |
| 610 | 423 |
| 611 | 466 |
| 612 | 793 |
| 613 | 250 |
| 614 | 371 |
| 615 | 481 |
| 616 | 574 |
| 617 | 413 |
| 618 | 603 |
| 619 | 366 |
| 620 | 468 |
| 621 | 655 |
| 622 | 900 |
| 623 | 805 |
| 624 | 615 |
| 625 | 684 |
| 626 | 710 |
| 627 | 429 |
| 628 | 794 |
| 629 | 252 |
| 630 | 373 |
| 631 | 605 |
| 632 | 848 |
| 633 | 690 |
| 634 | 713 |
| 635 | 632 |
| 636 | 482 |
| 637 | 806 |
| 638 | 427 |
| 639 | 904 |
| 640 | 414 |
| 641 | 223 |
| 642 | 663 |
| 643 | 692 |
| 644 | 835 |
| 645 | 619 |
| 646 | 472 |
| 647 | 455 |
| 648 | 796 |
| 649 | 809 |
| 650 | 714 |
| 651 | 721 |
| 652 | 837 |
| 653 | 716 |

-continued

Table Q11, having a sequence length of 1024:

| Reliability or sequence number of reliability | Polarized channel sequence number |
|---|---|
| 654 | 864 |
| 655 | 810 |
| 656 | 606 |
| 657 | 912 |
| 658 | 722 |
| 659 | 696 |
| 660 | 377 |
| 661 | 435 |
| 662 | 817 |
| 663 | 319 |
| 664 | 621 |
| 665 | 812 |
| 666 | 484 |
| 667 | 430 |
| 668 | 838 |
| 669 | 667 |
| 670 | 488 |
| 671 | 239 |
| 672 | 378 |
| 673 | 459 |
| 674 | 622 |
| 675 | 627 |
| 676 | 437 |
| 677 | 380 |
| 678 | 818 |
| 679 | 461 |
| 680 | 496 |
| 681 | 669 |
| 682 | 679 |
| 683 | 724 |
| 684 | 841 |
| 685 | 629 |
| 686 | 351 |
| 687 | 467 |
| 688 | 438 |
| 689 | 737 |
| 690 | 251 |
| 691 | 462 |
| 692 | 442 |
| 693 | 441 |
| 694 | 469 |
| 695 | 247 |
| 696 | 683 |
| 697 | 842 |
| 698 | 738 |
| 699 | 899 |
| 700 | 670 |
| 701 | 783 |
| 702 | 849 |
| 703 | 820 |
| 704 | 728 |
| 705 | 928 |
| 706 | 791 |
| 707 | 367 |
| 708 | 901 |
| 709 | 630 |
| 710 | 685 |
| 711 | 844 |
| 712 | 633 |
| 713 | 711 |
| 714 | 253 |
| 715 | 691 |
| 716 | 824 |
| 717 | 902 |
| 718 | 686 |
| 719 | 740 |
| 720 | 850 |
| 721 | 375 |
| 722 | 444 |
| 723 | 470 |
| 724 | 483 |
| 725 | 415 |

-continued

Table Q11, having a sequence length of 1024:

| Reliability or sequence number of reliability | Polarized channel sequence number |
|---|---|
| 726 | 485 |
| 727 | 905 |
| 728 | 795 |
| 729 | 473 |
| 730 | 634 |
| 731 | 744 |
| 732 | 852 |
| 733 | 960 |
| 734 | 865 |
| 735 | 693 |
| 736 | 797 |
| 737 | 906 |
| 738 | 715 |
| 739 | 807 |
| 740 | 474 |
| 741 | 636 |
| 742 | 694 |
| 743 | 254 |
| 744 | 717 |
| 745 | 575 |
| 746 | 913 |
| 747 | 798 |
| 748 | 811 |
| 749 | 379 |
| 750 | 697 |
| 751 | 431 |
| 752 | 607 |
| 753 | 489 |
| 754 | 866 |
| 755 | 723 |
| 756 | 486 |
| 757 | 908 |
| 758 | 718 |
| 759 | 813 |
| 760 | 476 |
| 761 | 856 |
| 762 | 839 |
| 763 | 725 |
| 764 | 698 |
| 765 | 914 |
| 766 | 752 |
| 767 | 868 |
| 768 | 819 |
| 769 | 814 |
| 770 | 439 |
| 771 | 929 |
| 772 | 490 |
| 773 | 623 |
| 774 | 671 |
| 775 | 739 |
| 776 | 916 |
| 777 | 463 |
| 778 | 843 |
| 779 | 381 |
| 780 | 497 |
| 781 | 930 |
| 782 | 821 |
| 783 | 726 |
| 784 | 961 |
| 785 | 872 |
| 786 | 492 |
| 787 | 631 |
| 788 | 729 |
| 789 | 700 |
| 790 | 443 |
| 791 | 741 |
| 792 | 845 |
| 793 | 920 |
| 794 | 382 |
| 795 | 822 |
| 796 | 851 |
| 797 | 730 |

-continued

Table Q11, having a sequence length of 1024:

| Reliability or sequence number of reliability | Polarized channel sequence number |
|---|---|
| 798 | 498 |
| 799 | 880 |
| 800 | 742 |
| 801 | 445 |
| 802 | 471 |
| 803 | 635 |
| 804 | 932 |
| 805 | 687 |
| 806 | 903 |
| 807 | 825 |
| 808 | 500 |
| 809 | 846 |
| 810 | 745 |
| 811 | 826 |
| 812 | 732 |
| 813 | 446 |
| 814 | 962 |
| 815 | 936 |
| 816 | 475 |
| 817 | 853 |
| 818 | 867 |
| 819 | 637 |
| 820 | 907 |
| 821 | 487 |
| 822 | 695 |
| 823 | 746 |
| 824 | 828 |
| 825 | 753 |
| 826 | 854 |
| 827 | 857 |
| 828 | 504 |
| 829 | 799 |
| 830 | 255 |
| 831 | 964 |
| 832 | 909 |
| 833 | 719 |
| 834 | 477 |
| 835 | 915 |
| 836 | 638 |
| 837 | 748 |
| 838 | 944 |
| 839 | 869 |
| 840 | 491 |
| 841 | 699 |
| 842 | 754 |
| 843 | 858 |
| 844 | 478 |
| 845 | 968 |
| 846 | 383 |
| 847 | 910 |
| 848 | 815 |
| 849 | 976 |
| 850 | 870 |
| 851 | 917 |
| 852 | 727 |
| 853 | 493 |
| 854 | 873 |
| 855 | 701 |
| 856 | 931 |
| 857 | 756 |
| 858 | 860 |
| 859 | 499 |
| 860 | 731 |
| 861 | 823 |
| 862 | 922 |
| 863 | 874 |
| 864 | 918 |
| 865 | 502 |
| 866 | 933 |
| 867 | 743 |
| 868 | 760 |
| 869 | 881 |

-continued

Table Q11, having a sequence length of 1024:

| Reliability or sequence number of reliability | Polarized channel sequence number |
|---|---|
| 870 | 494 |
| 871 | 702 |
| 872 | 921 |
| 873 | 501 |
| 874 | 876 |
| 875 | 847 |
| 876 | 992 |
| 877 | 447 |
| 878 | 733 |
| 879 | 827 |
| 880 | 934 |
| 881 | 882 |
| 882 | 937 |
| 883 | 963 |
| 884 | 747 |
| 885 | 505 |
| 886 | 855 |
| 887 | 924 |
| 888 | 734 |
| 889 | 829 |
| 890 | 965 |
| 891 | 938 |
| 892 | 884 |
| 893 | 506 |
| 894 | 749 |
| 895 | 945 |
| 896 | 966 |
| 897 | 755 |
| 898 | 859 |
| 899 | 940 |
| 900 | 830 |
| 901 | 911 |
| 902 | 871 |
| 903 | 639 |
| 904 | 888 |
| 905 | 479 |
| 906 | 946 |
| 907 | 750 |
| 908 | 969 |
| 909 | 508 |
| 910 | 861 |
| 911 | 757 |
| 912 | 970 |
| 913 | 919 |
| 914 | 875 |
| 915 | 862 |
| 916 | 758 |
| 917 | 948 |
| 918 | 977 |
| 919 | 923 |
| 920 | 972 |
| 921 | 761 |
| 922 | 877 |
| 923 | 952 |
| 924 | 495 |
| 925 | 703 |
| 926 | 935 |
| 927 | 978 |
| 928 | 883 |
| 929 | 762 |
| 930 | 503 |
| 931 | 925 |
| 932 | 878 |
| 933 | 735 |
| 934 | 993 |
| 935 | 885 |
| 936 | 939 |
| 937 | 994 |
| 938 | 980 |
| 939 | 926 |
| 940 | 764 |
| 941 | 941 |

-continued

Table Q11, having a sequence length of 1024:

| Reliability or sequence number of reliability | Polarized channel sequence number |
|---|---|
| 942 | 967 |
| 943 | 886 |
| 944 | 831 |
| 945 | 947 |
| 946 | 507 |
| 947 | 889 |
| 948 | 984 |
| 949 | 751 |
| 950 | 942 |
| 951 | 996 |
| 952 | 971 |
| 953 | 890 |
| 954 | 509 |
| 955 | 949 |
| 956 | 973 |
| 957 | 1000 |
| 958 | 892 |
| 959 | 950 |
| 960 | 863 |
| 961 | 759 |
| 962 | 1008 |
| 963 | 510 |
| 964 | 979 |
| 965 | 953 |
| 966 | 763 |
| 967 | 974 |
| 968 | 954 |
| 969 | 879 |
| 970 | 981 |
| 971 | 982 |
| 972 | 927 |
| 973 | 995 |
| 974 | 765 |
| 975 | 956 |
| 976 | 887 |
| 977 | 985 |
| 978 | 997 |
| 979 | 986 |
| 980 | 943 |
| 981 | 891 |
| 982 | 998 |
| 983 | 766 |
| 984 | 511 |
| 985 | 988 |
| 986 | 1001 |
| 987 | 951 |
| 988 | 1002 |
| 989 | 893 |
| 990 | 975 |
| 991 | 894 |
| 992 | 1009 |
| 993 | 955 |
| 994 | 1004 |
| 995 | 1010 |
| 996 | 957 |
| 997 | 983 |
| 998 | 958 |
| 999 | 987 |
| 1000 | 1012 |
| 1001 | 999 |
| 1002 | 1016 |
| 1003 | 767 |
| 1004 | 989 |
| 1005 | 1003 |
| 1006 | 990 |
| 1007 | 1005 |
| 1008 | 959 |
| 1009 | 1011 |
| 1010 | 1013 |
| 1011 | 895 |
| 1012 | 1006 |
| 1013 | 1014 |
| 1014 | 1017 |
| 1015 | 1018 |
| 1016 | 991 |
| 1017 | 1020 |
| 1018 | 1007 |
| 1019 | 1015 |
| 1020 | 1019 |
| 1021 | 1021 |
| 1022 | 1022 |
| 1023 | 1023 |

Sequence Q12, having a sequence length of 512:

[0, 1, 2, 4, 8, 16, 32, 3, 5, 64, 9, 6, 17, 10, 18, 128, 12, 33, 65, 20, 256, 34, 24, 36, 7, 129, 66, 11, 40, 68, 130, 19, 13, 48, 14, 72, 257, 21, 132, 35, 258, 26, 80, 37, 25, 22, 136, 260, 264, 38, 96, 67, 41, 144, 28, 69, 42, 49, 74, 272, 160, 288, 192, 70, 44, 131, 81, 50, 73, 15, 320, 133, 52, 23, 134, 384, 76, 137, 82, 56, 27, 97, 39, 259, 84, 138, 145, 261, 29, 43, 98, 88, 140, 30, 146, 71, 262, 265, 161, 45, 100, 51, 148, 46, 75, 266, 273, 104, 162, 53, 193, 152, 77, 164, 268, 274, 54, 83, 57, 112, 135, 78, 289, 194, 85, 276, 58, 168, 139, 99, 86, 60, 280, 89, 290, 196, 141, 101, 147, 176, 142, 321, 31, 200, 90, 292, 322, 263, 149, 102, 105, 304, 296, 163, 92, 47, 267, 385, 324, 208, 386, 150, 153, 165, 106, 55, 328, 113, 154, 79, 269, 108, 224, 166, 195, 270, 275, 291, 59, 169, 114, 277, 156, 87, 197, 116, 170, 61, 281, 278, 177, 293, 388, 91, 198, 172, 120, 201, 336, 62, 282, 143, 103, 178, 294, 93, 202, 323, 392, 297, 107, 180, 151, 209, 284, 94, 204, 298, 400, 352, 325, 155, 210, 305, 300, 109, 184, 115, 167, 225, 326, 306, 157, 329, 110, 117, 212, 171, 330, 226, 387, 308, 216, 416, 271, 279, 158, 337, 118, 332, 389, 173, 121, 199, 179, 228, 338, 312, 390, 174, 393, 283, 122, 448, 353, 203, 63, 340, 394, 181, 295, 285, 232, 124, 205, 182, 286, 299, 354, 211, 401, 185, 396, 344, 240, 206, 95, 327, 402, 356, 307, 301, 417, 213, 186, 404, 227, 418, 302, 360, 111, 331, 214, 309, 188, 449, 217, 408, 229, 159, 420, 310, 333, 119, 339, 218, 368, 230, 391, 313, 450, 334, 233, 175, 123, 341, 220, 314, 424, 395, 355, 287, 183, 234, 125, 342, 316, 241, 345, 452, 397, 403, 207, 432, 357, 187, 236, 126, 242, 398, 346, 456, 358, 405, 303, 244, 189, 361, 215, 348, 419, 406, 464, 362, 409, 219, 311, 421, 410, 231, 248, 369, 190, 364, 335, 480, 315, 221, 370, 422, 425, 451, 235, 412, 343, 372, 317, 222, 426, 453, 237, 433, 347, 243, 454, 318, 376, 428, 238, 359, 457, 399, 434, 349, 245, 458, 363, 127, 191, 407, 436, 465, 246, 350, 460, 249, 411, 365, 440, 374, 423, 466, 250, 371, 481, 413, 366, 468, 429, 252, 373, 482, 427, 414, 223, 472, 455, 377, 435, 319, 484, 430, 488, 239, 378, 459, 437, 380, 461, 496, 351, 467, 438, 251, 462, 442, 441, 469, 247, 367, 253, 375, 444, 470, 483, 415, 485, 473, 474, 254, 379, 431, 489, 486, 476, 439, 490, 463, 381, 497, 492, 443, 382, 498, 445, 471, 500, 446, 475, 487, 504, 255, 477, 491, 478, 383, 493, 499, 502, 494, 501, 447, 505, 506, 479, 508, 495, 503, 507, 509, 510, 511]

Table Q12, having a sequence length of 512:

| Reliability or sequence number of reliability | Polarized channel sequence number | Reliability or sequence number of reliability | Polarized channel sequence number | Reliability or sequence number of reliability | Polarized channel sequence number | Reliability or sequence number of reliability | Polarized channel sequence number | Reliability or sequence number of reliability | Polarized channel sequence number | Reliability or sequence number of reliability | Polarized channel sequence number | Reliability or sequence number of reliability | Polarized channel sequence number | Reliability or sequence number of reliability | Polarized channel sequence number |
|---|---|---|---|---|---|---|---|---|---|---|---|---|---|---|---|
| 0 | 0 | 64 | 44 | 128 | 139 | 192 | 388 | 256 | 338 | 320 | 450 | 384 | 343 | 448 | 461 |
| 1 | 1 | 65 | 131 | 129 | 99 | 193 | 91 | 257 | 312 | 321 | 334 | 385 | 372 | 449 | 496 |
| 2 | 2 | 66 | 81 | 130 | 86 | 194 | 198 | 258 | 390 | 322 | 233 | 386 | 317 | 450 | 351 |
| 3 | 4 | 67 | 50 | 131 | 60 | 195 | 172 | 259 | 174 | 323 | 175 | 387 | 222 | 451 | 467 |
| 4 | 8 | 68 | 73 | 132 | 280 | 196 | 120 | 260 | 393 | 324 | 123 | 388 | 426 | 452 | 438 |
| 5 | 16 | 69 | 15 | 133 | 89 | 197 | 201 | 261 | 283 | 325 | 341 | 389 | 453 | 453 | 251 |
| 6 | 32 | 70 | 320 | 134 | 290 | 198 | 336 | 262 | 122 | 326 | 220 | 390 | 237 | 454 | 462 |
| 7 | 3 | 71 | 133 | 135 | 196 | 199 | 62 | 263 | 448 | 327 | 314 | 391 | 433 | 455 | 442 |
| 8 | 5 | 72 | 52 | 136 | 141 | 200 | 282 | 264 | 353 | 328 | 424 | 392 | 347 | 456 | 441 |
| 9 | 64 | 73 | 23 | 137 | 101 | 201 | 143 | 265 | 203 | 329 | 395 | 393 | 243 | 457 | 469 |
| 10 | 9 | 74 | 134 | 138 | 147 | 202 | 103 | 266 | 63 | 330 | 355 | 394 | 454 | 458 | 247 |
| 11 | 6 | 75 | 384 | 139 | 176 | 203 | 178 | 267 | 340 | 331 | 287 | 395 | 318 | 459 | 367 |
| 12 | 17 | 76 | 76 | 140 | 142 | 204 | 294 | 268 | 394 | 332 | 183 | 396 | 376 | 460 | 253 |
| 13 | 10 | 77 | 137 | 141 | 321 | 205 | 93 | 269 | 181 | 333 | 234 | 397 | 428 | 461 | 375 |
| 14 | 18 | 78 | 82 | 142 | 31 | 206 | 202 | 270 | 295 | 334 | 125 | 398 | 238 | 462 | 444 |
| 15 | 128 | 79 | 56 | 143 | 200 | 207 | 323 | 271 | 285 | 335 | 342 | 399 | 359 | 463 | 470 |
| 16 | 12 | 80 | 27 | 144 | 90 | 208 | 392 | 272 | 232 | 336 | 316 | 400 | 457 | 464 | 483 |
| 17 | 33 | 81 | 97 | 145 | 292 | 209 | 297 | 273 | 124 | 337 | 241 | 401 | 399 | 465 | 415 |
| 18 | 65 | 82 | 39 | 146 | 322 | 210 | 107 | 274 | 205 | 338 | 345 | 402 | 434 | 466 | 485 |
| 19 | 20 | 83 | 259 | 147 | 263 | 211 | 180 | 275 | 182 | 339 | 452 | 403 | 349 | 467 | 473 |
| 20 | 256 | 84 | 84 | 148 | 149 | 212 | 151 | 276 | 286 | 340 | 397 | 404 | 245 | 468 | 474 |
| 21 | 34 | 85 | 138 | 149 | 102 | 213 | 209 | 277 | 299 | 341 | 403 | 405 | 458 | 469 | 254 |
| 22 | 24 | 86 | 145 | 150 | 105 | 214 | 284 | 278 | 354 | 342 | 207 | 406 | 363 | 470 | 379 |
| 23 | 36 | 87 | 261 | 151 | 304 | 215 | 94 | 279 | 211 | 343 | 432 | 407 | 127 | 471 | 431 |
| 24 | 7 | 88 | 29 | 152 | 296 | 216 | 204 | 280 | 401 | 344 | 357 | 408 | 191 | 472 | 489 |
| 25 | 129 | 89 | 43 | 153 | 163 | 217 | 298 | 281 | 185 | 345 | 187 | 409 | 407 | 473 | 486 |
| 26 | 66 | 90 | 98 | 154 | 92 | 218 | 400 | 282 | 396 | 346 | 236 | 410 | 436 | 474 | 476 |
| 27 | 11 | 91 | 88 | 155 | 47 | 219 | 352 | 283 | 344 | 347 | 126 | 411 | 465 | 475 | 439 |
| 28 | 40 | 92 | 140 | 156 | 267 | 220 | 325 | 284 | 240 | 348 | 242 | 412 | 246 | 476 | 490 |
| 29 | 68 | 93 | 30 | 157 | 385 | 221 | 155 | 285 | 206 | 349 | 398 | 413 | 350 | 477 | 463 |
| 30 | 130 | 94 | 146 | 158 | 324 | 222 | 210 | 286 | 95 | 350 | 346 | 414 | 460 | 478 | 381 |
| 31 | 19 | 95 | 71 | 159 | 208 | 223 | 305 | 287 | 327 | 351 | 456 | 415 | 249 | 479 | 497 |
| 32 | 13 | 96 | 262 | 160 | 386 | 224 | 300 | 288 | 402 | 352 | 358 | 416 | 411 | 480 | 492 |
| 33 | 48 | 97 | 265 | 161 | 150 | 225 | 109 | 289 | 356 | 353 | 405 | 417 | 365 | 481 | 443 |
| 34 | 14 | 98 | 161 | 162 | 153 | 226 | 184 | 290 | 307 | 354 | 303 | 418 | 440 | 482 | 382 |
| 35 | 72 | 99 | 45 | 163 | 165 | 227 | 115 | 291 | 301 | 355 | 244 | 419 | 374 | 483 | 498 |
| 36 | 257 | 100 | 100 | 164 | 106 | 228 | 167 | 292 | 417 | 356 | 189 | 420 | 423 | 484 | 445 |
| 37 | 21 | 101 | 51 | 165 | 55 | 229 | 225 | 293 | 213 | 357 | 361 | 421 | 466 | 485 | 471 |
| 38 | 132 | 102 | 148 | 166 | 328 | 230 | 326 | 294 | 186 | 358 | 215 | 422 | 250 | 486 | 500 |
| 39 | 35 | 103 | 46 | 167 | 113 | 231 | 306 | 295 | 404 | 359 | 348 | 423 | 371 | 487 | 446 |
| 43 | 37 | 107 | 104 | 171 | 108 | 235 | 117 | 299 | 360 | 363 | 362 | 427 | 468 | 491 | 255 |
| 44 | 25 | 108 | 162 | 172 | 224 | 236 | 212 | 300 | 111 | 364 | 409 | 428 | 429 | 492 | 477 |
| 45 | 22 | 109 | 53 | 173 | 166 | 237 | 171 | 301 | 331 | 365 | 219 | 429 | 252 | 493 | 491 |
| 46 | 136 | 110 | 193 | 174 | 195 | 238 | 330 | 302 | 214 | 366 | 311 | 430 | 373 | 494 | 478 |
| 47 | 260 | 111 | 152 | 175 | 270 | 239 | 226 | 303 | 309 | 367 | 421 | 431 | 482 | 495 | 383 |

-continued

| Table Q12, having a sequence length of 512: | | | | | | | | | | | | | | | |
|---|---|---|---|---|---|---|---|---|---|---|---|---|---|---|---|
| Reliability or sequence number of reliability | Polarized channel sequence number | Reliability or sequence number of reliability | Polarized channel sequence number | Reliability or sequence number of reliability | Polarized channel sequence number | Reliability or sequence number of reliability | Polarized channel sequence number | Reliability or sequence number of reliability | Polarized channel sequence number | Reliability or sequence number of reliability | Polarized channel sequence number | Reliability or sequence number of reliability | Polarized channel sequence number | Reliability or sequence number of reliability | Polarized channel sequence number |
| 48 | 264 | 112 | 77 | 176 | 275 | 240 | 387 | 304 | 188 | 368 | 410 | 432 | 427 | 496 | 493 |
| 49 | 38 | 113 | 164 | 177 | 291 | 241 | 308 | 305 | 449 | 369 | 231 | 433 | 414 | 497 | 499 |
| 50 | 96 | 114 | 268 | 178 | 59 | 242 | 216 | 306 | 217 | 370 | 248 | 434 | 223 | 498 | 502 |
| 51 | 67 | 115 | 274 | 179 | 169 | 243 | 416 | 307 | 408 | 371 | 369 | 435 | 472 | 499 | 494 |
| 52 | 41 | 116 | 54 | 180 | 114 | 244 | 271 | 308 | 229 | 372 | 190 | 436 | 455 | 500 | 501 |
| 53 | 144 | 117 | 83 | 181 | 277 | 245 | 279 | 309 | 159 | 373 | 364 | 437 | 377 | 501 | 447 |
| 54 | 28 | 118 | 57 | 182 | 156 | 246 | 158 | 310 | 420 | 374 | 335 | 438 | 435 | 502 | 505 |
| 55 | 69 | 119 | 112 | 183 | 87 | 247 | 337 | 311 | 310 | 375 | 480 | 439 | 319 | 503 | 506 |
| 56 | 42 | 120 | 135 | 184 | 197 | 248 | 118 | 312 | 333 | 376 | 315 | 440 | 484 | 504 | 479 |
| 57 | 49 | 121 | 78 | 185 | 116 | 249 | 332 | 313 | 119 | 377 | 221 | 441 | 430 | 505 | 508 |
| 58 | 74 | 122 | 289 | 186 | 170 | 250 | 389 | 314 | 339 | 378 | 370 | 442 | 488 | 506 | 495 |
| 59 | 272 | 123 | 194 | 187 | 61 | 251 | 173 | 315 | 218 | 379 | 422 | 443 | 239 | 507 | 503 |
| 60 | 160 | 124 | 85 | 188 | 281 | 252 | 121 | 316 | 368 | 380 | 425 | 444 | 378 | 508 | 507 |
| 61 | 288 | 125 | 276 | 189 | 278 | 253 | 199 | 317 | 230 | 381 | 451 | 445 | 459 | 509 | 509 |
| 62 | 192 | 126 | 58 | 190 | 177 | 254 | 179 | 318 | 391 | 382 | 235 | 446 | 437 | 510 | 510 |
| 63 | 70 | 127 | 168 | 191 | 293 | 255 | 228 | 319 | 313 | 383 | 412 | 447 | 380 | 511 | 511 |

Sequence Q13, having a sequence length of 256:

[0, 1, 2, 4, 8, 16, 32, 3, 5, 64, 9, 6, 17, 10, 18, 128, 12, 33, 65, 20, 34, 24, 36, 7, 129, 66, 11, 40, 68, 130, 19, 13, 48, 14, 72, 21, 132, 35, 26, 80, 37, 25, 22, 136, 38, 96, 67, 41, 144, 28, 69, 42, 49, 74, 160, 192, 70, 44, 131, 81, 50, 73, 15, 133, 52, 23, 134, 76, 137, 82, 56, 27, 97, 39, 84, 138, 145, 29, 43, 98, 88, 140, 30, 146, 71, 161, 45, 100, 51, 148, 46, 75, 104, 162, 53, 193, 152, 77, 164, 54, 83, 57, 112, 135, 78, 194, 85, 58, 168, 139, 99, 86, 60, 89, 196, 141, 101, 147, 176, 142, 31, 200, 90, 149, 102, 105, 163, 92, 47, 208, 150, 153, 165, 106, 55, 113, 154, 79, 108, 224, 166, 195, 59, 169, 114, 156, 87, 197, 116, 170, 61, 177, 91, 198, 172, 120, 201, 62, 143, 103, 178, 93, 202, 107, 180, 151, 209, 94, 204, 155, 210, 109, 184, 115, 167, 225, 157, 110, 117, 212, 171, 226, 216, 158, 118, 173, 121, 199, 179, 228, 174, 122, 203, 63, 181, 232, 124, 205, 182, 211, 185, 240,206, 95, 213, 186, 227, 111, 214, 188, 217, 229, 159, 119, 218, 230, 233, 175, 123, 220, 183, 234, 125, 241, 207, 187, 236, 126, 242, 244, 189, 215, 219, 231, 248, 190, 221, 235, 222, 237, 243, 238, 245, 127, 191, 246, 249, 250, 252, 223, 239, 251, 247, 253, 254, 255]

Table Q13, having a sequence length of 256:

| Reliability or sequence number of reliability | Polarized channel sequence number |
|---|---|
| 0 | 0 |
| 1 | 1 |
| 2 | 2 |
| 3 | 4 |
| 4 | 8 |
| 5 | 16 |
| 6 | 32 |
| 7 | 3 |
| 8 | 5 |
| 9 | 64 |
| 10 | 9 |
| 11 | 6 |
| 12 | 17 |
| 13 | 10 |
| 14 | 18 |
| 15 | 128 |
| 16 | 12 |
| 17 | 33 |
| 18 | 65 |
| 19 | 20 |
| 20 | 34 |
| 21 | 24 |
| 22 | 36 |
| 23 | 7 |
| 24 | 129 |
| 25 | 66 |
| 26 | 11 |
| 27 | 40 |
| 28 | 68 |
| 29 | 130 |
| 30 | 19 |
| 31 | 13 |
| 32 | 48 |
| 33 | 14 |
| 34 | 72 |
| 35 | 21 |
| 36 | 132 |
| 37 | 35 |
| 38 | 26 |
| 39 | 80 |
| 40 | 37 |
| 41 | 25 |
| 42 | 22 |
| 43 | 136 |
| 44 | 38 |
| 45 | 96 |
| 46 | 67 |
| 47 | 41 |

-continued

Table Q13, having a sequence length of 256:

| Reliability or sequence number of reliability | Polarized channel sequence number |
|---|---|
| 48 | 144 |
| 49 | 28 |
| 50 | 69 |
| 51 | 42 |
| 52 | 49 |
| 53 | 74 |
| 54 | 160 |
| 55 | 192 |
| 56 | 70 |
| 57 | 44 |
| 58 | 131 |
| 59 | 81 |
| 60 | 50 |
| 61 | 73 |
| 62 | 15 |
| 63 | 133 |
| 64 | 52 |
| 65 | 23 |
| 66 | 134 |
| 67 | 76 |
| 68 | 137 |
| 69 | 82 |
| 70 | 56 |
| 71 | 27 |
| 72 | 97 |
| 73 | 39 |
| 74 | 84 |
| 75 | 138 |
| 76 | 145 |
| 77 | 29 |
| 78 | 43 |
| 79 | 98 |
| 80 | 88 |
| 81 | 140 |
| 82 | 30 |
| 83 | 146 |
| 84 | 71 |
| 85 | 161 |
| 86 | 45 |
| 87 | 100 |
| 88 | 51 |
| 89 | 148 |
| 90 | 46 |
| 91 | 75 |
| 92 | 104 |
| 93 | 162 |
| 94 | 53 |
| 95 | 193 |
| 96 | 152 |
| 97 | 77 |
| 98 | 164 |
| 99 | 54 |
| 100 | 83 |
| 101 | 57 |
| 102 | 112 |
| 103 | 135 |
| 104 | 78 |
| 105 | 194 |
| 106 | 85 |
| 107 | 58 |
| 108 | 168 |
| 109 | 139 |
| 110 | 99 |
| 111 | 86 |
| 112 | 60 |
| 113 | 89 |
| 114 | 196 |
| 115 | 141 |
| 116 | 101 |
| 117 | 147 |
| 118 | 176 |
| 119 | 142 |
| 120 | 31 |
| 121 | 200 |

-continued

| Table Q13, having a sequence length of 256: | |
|---|---|
| Reliability or sequence number of reliability | Polarized channel sequence number |
| 122 | 90 |
| 123 | 149 |
| 124 | 102 |
| 125 | 105 |
| 126 | 163 |
| 127 | 92 |
| 128 | 47 |
| 129 | 208 |
| 130 | 150 |
| 131 | 153 |
| 132 | 165 |
| 133 | 106 |
| 134 | 55 |
| 135 | 113 |
| 136 | 154 |
| 137 | 79 |
| 138 | 108 |
| 139 | 224 |
| 140 | 166 |
| 141 | 195 |
| 142 | 59 |
| 143 | 169 |
| 144 | 114 |
| 145 | 156 |
| 146 | 87 |
| 147 | 197 |
| 148 | 116 |
| 149 | 170 |
| 150 | 61 |
| 151 | 177 |
| 152 | 91 |
| 153 | 198 |
| 154 | 172 |
| 155 | 120 |
| 156 | 201 |
| 157 | 62 |
| 158 | 143 |
| 159 | 103 |
| 160 | 178 |
| 161 | 93 |
| 162 | 202 |
| 163 | 107 |
| 164 | 180 |
| 165 | 151 |
| 166 | 209 |
| 167 | 94 |
| 168 | 204 |
| 169 | 155 |
| 170 | 210 |
| 171 | 109 |
| 172 | 184 |
| 173 | 115 |
| 174 | 167 |
| 175 | 225 |
| 176 | 157 |
| 177 | 110 |
| 178 | 117 |
| 179 | 212 |
| 180 | 171 |
| 181 | 226 |
| 182 | 216 |
| 183 | 158 |
| 184 | 118 |
| 185 | 173 |
| 186 | 121 |
| 187 | 199 |
| 188 | 179 |
| 189 | 228 |
| 190 | 174 |
| 191 | 122 |
| 192 | 203 |
| 193 | 63 |
| 194 | 181 |
| 195 | 232 |

-continued

| Table Q13, having a sequence length of 256: | |
|---|---|
| Reliability or sequence number of reliability | Polarized channel sequence number |
| 196 | 124 |
| 197 | 205 |
| 198 | 182 |
| 199 | 211 |
| 200 | 185 |
| 201 | 240 |
| 202 | 206 |
| 203 | 95 |
| 204 | 213 |
| 205 | 186 |
| 206 | 227 |
| 207 | 111 |
| 208 | 214 |
| 209 | 188 |
| 210 | 217 |
| 211 | 229 |
| 212 | 159 |
| 213 | 119 |
| 214 | 218 |
| 215 | 230 |
| 216 | 233 |
| 217 | 175 |
| 218 | 123 |
| 219 | 220 |
| 220 | 183 |
| 221 | 234 |
| 222 | 125 |
| 223 | 241 |
| 224 | 207 |
| 225 | 187 |
| 226 | 236 |
| 227 | 126 |
| 228 | 242 |
| 229 | 244 |
| 230 | 189 |
| 231 | 215 |
| 232 | 219 |
| 233 | 231 |
| 234 | 248 |
| 235 | 190 |
| 236 | 221 |
| 237 | 235 |
| 238 | 222 |
| 239 | 237 |
| 240 | 243 |
| 241 | 238 |
| 242 | 245 |
| 243 | 127 |
| 244 | 191 |
| 245 | 246 |
| 246 | 249 |
| 247 | 250 |
| 248 | 252 |
| 249 | 223 |
| 250 | 239 |
| 251 | 251 |
| 252 | 247 |
| 253 | 253 |
| 254 | 254 |
| 255 | 255 |

Sequence Q14, having a sequence length of 128:

[0, 1, 2, 4, 8, 16, 32, 3, 5, 64, 9, 6, 17, 10, 18, 12, 33, 65, 20, 34, 24, 36, 7, 66, 11, 40, 68, 19, 13, 48, 14, 72, 21, 35, 26, 80, 37, 25, 22, 38, 96, 67, 41, 28, 69, 42, 49, 74, 70, 44, 81, 50, 73, 15, 52, 23, 76, 82, 56, 27, 97, 39, 84, 29, 43, 98, 88, 30, 71, 45, 100, 51, 46, 75, 104, 53, 77, 54, 83, 57, 112, 78, 85, 58, 99, 86, 60, 89, 101, 31, 90, 102, 105, 92, 47, 106, 55, 113, 79, 108, 59, 114, 87, 116, 61, 91, 120, 62, 103, 93, 107, 94, 109, 115, 110, 117, 118, 121, 122, 63, 124, 95, 111, 119, 123, 125, 126, 127]

Table Q14, having a sequence length of 128:

| Reliability or sequence number of reliability | Polarized channel sequence number |
|---|---|
| 0 | 0 |
| 1 | 1 |
| 2 | 2 |
| 3 | 4 |
| 4 | 8 |
| 5 | 16 |
| 6 | 32 |
| 7 | 3 |
| 8 | 5 |
| 9 | 64 |
| 10 | 9 |
| 11 | 6 |
| 12 | 17 |
| 13 | 10 |
| 14 | 18 |
| 15 | 12 |
| 16 | 33 |
| 17 | 65 |
| 18 | 20 |
| 19 | 34 |
| 20 | 24 |
| 21 | 36 |
| 22 | 7 |
| 23 | 66 |
| 24 | 11 |
| 25 | 40 |
| 26 | 68 |
| 27 | 19 |
| 28 | 13 |
| 29 | 48 |
| 30 | 14 |
| 31 | 72 |
| 32 | 21 |
| 33 | 35 |
| 34 | 26 |
| 35 | 80 |
| 36 | 37 |
| 37 | 25 |
| 38 | 22 |
| 39 | 38 |
| 40 | 96 |
| 41 | 67 |
| 42 | 41 |
| 43 | 28 |
| 44 | 69 |
| 45 | 42 |
| 46 | 49 |
| 47 | 74 |
| 48 | 70 |
| 49 | 44 |
| 50 | 81 |
| 51 | 50 |
| 52 | 73 |
| 53 | 15 |
| 54 | 52 |
| 55 | 23 |
| 56 | 76 |
| 57 | 82 |
| 58 | 56 |
| 59 | 27 |
| 60 | 97 |
| 61 | 39 |
| 62 | 84 |
| 63 | 29 |
| 64 | 43 |
| 65 | 98 |
| 66 | 88 |
| 67 | 30 |
| 68 | 71 |
| 69 | 45 |
| 70 | 100 |
| 71 | 51 |
| 72 | 46 |
| 73 | 75 |
| 74 | 104 |
| 75 | 53 |

-continued

Table Q14, having a sequence length of 128:

| Reliability or sequence number of reliability | Polarized channel sequence number |
|---|---|
| 76 | 77 |
| 77 | 54 |
| 78 | 83 |
| 79 | 57 |
| 80 | 112 |
| 81 | 78 |
| 82 | 85 |
| 83 | 58 |
| 84 | 99 |
| 85 | 86 |
| 86 | 60 |
| 87 | 89 |
| 88 | 101 |
| 89 | 31 |
| 90 | 90 |
| 91 | 102 |
| 92 | 105 |
| 93 | 92 |
| 94 | 47 |
| 95 | 106 |
| 96 | 55 |
| 97 | 113 |
| 98 | 79 |
| 99 | 108 |
| 100 | 59 |
| 101 | 114 |
| 102 | 87 |
| 103 | 116 |
| 104 | 61 |
| 105 | 91 |
| 106 | 120 |
| 107 | 62 |
| 108 | 103 |
| 109 | 93 |
| 110 | 107 |
| 111 | 94 |
| 112 | 109 |
| 113 | 115 |
| 114 | 110 |
| 115 | 117 |
| 116 | 118 |
| 117 | 121 |
| 118 | 122 |
| 119 | 63 |
| 120 | 124 |
| 121 | 95 |
| 122 | 111 |
| 123 | 119 |
| 124 | 123 |
| 125 | 125 |
| 126 | 126 |
| 127 | 127 |

Sequence Q15, having a sequence length of 64:

[0, 1, 2, 4, 8, 16, 32, 3, 5, 9, 6, 17, 10, 18, 12, 33, 20, 34, 24, 36, 7, 11, 40, 19, 13, 48, 14, 21, 35, 26, 37, 25, 22, 38, 41, 28, 42, 49, 44, 50, 15, 52, 23, 56, 27, 39, 29, 43, 30, 45, 51, 46, 53, 54, 57, 58, 60, 31, 47, 55, 59, 61, 62, 63]

Table Q15, having a sequence length of 64:

| Reliability or sequence number of reliability | Polarized channel sequence number |
|---|---|
| 0 | 0 |
| 1 | 1 |
| 2 | 2 |
| 3 | 4 |
| 4 | 8 |
| 5 | 16 |
| 6 | 32 |

-continued

| Table Q15, having a sequence length of 64: | |
|---|---|
| Reliability or sequence number of reliability | Polarized channel sequence number |
| 7 | 3 |
| 8 | 5 |
| 9 | 9 |
| 10 | 6 |
| 11 | 17 |
| 12 | 10 |
| 13 | 18 |
| 14 | 12 |
| 15 | 33 |
| 16 | 20 |
| 17 | 34 |
| 18 | 24 |
| 19 | 36 |
| 20 | 7 |
| 21 | 11 |
| 22 | 40 |
| 23 | 19 |
| 24 | 13 |
| 25 | 48 |
| 26 | 14 |
| 27 | 21 |
| 28 | 35 |
| 29 | 26 |
| 30 | 37 |
| 31 | 25 |
| 32 | 22 |
| 33 | 38 |
| 34 | 41 |
| 35 | 28 |
| 36 | 42 |
| 37 | 49 |
| 38 | 44 |
| 39 | 50 |
| 40 | 15 |
| 41 | 52 |
| 42 | 23 |
| 43 | 56 |
| 44 | 27 |
| 45 | 39 |
| 46 | 29 |
| 47 | 43 |
| 48 | 30 |
| 49 | 45 |
| 50 | 51 |
| 51 | 46 |
| 52 | 53 |
| 53 | 54 |
| 54 | 57 |
| 55 | 58 |
| 56 | 60 |
| 57 | 31 |
| 58 | 47 |
| 59 | 55 |
| 60 | 59 |
| 61 | 61 |
| 62 | 62 |
| 63 | 63 |

Sequence Z11, having a sequence length of 1024:

[0, 1, 2, 7, 3, 8, 11, 24, 4, 10, 13, 28, 16, 33, 35, 76, 5, 12, 14, 32, 19, 38, 47, 80, 22, 46, 42, 87, 57, 95, 101, 160, 6, 17, 21, 40, 23, 45, 51, 89, 29, 55, 59, 96, 71, 108, 113, 175, 34, 61, 74, 111, 79, 120, 129, 186, 86, 131, 141, 208, 146, 218, 236, 327, 9, 18, 26, 54, 30, 58, 70, 103, 36, 75, 62, 114, 83, 123, 135, 193, 44, 73, 85, 130, 91, 138, 145, 214, 99, 148, 162, 228, 174, 242, 256, 357, 53, 88, 97, 144, 109, 154, 169, 239, 118, 170, 185, 250, 195, 269, 282, 382, 133, 191, 211, 273, 216, 283, 301, 403, 233, 307, 322, 419, 337, 434, 460, 582, 15, 25, 31, 72, 39, 78, 81, 134, 48, 84, 92, 143, 100, 153, 157, 238, 56, 93, 102, 155, 112, 168, 182, 252, 122, 183, 192, 264, 213, 279, 297, 395, 64, 106, 119, 173, 124, 184, 198, 274, 142, 209, 217, 285, 232, 306, 317, 418, 156, 225, 240, 311, 251, 333, 339, 432, 270, 348, 370, 453, 386, 472, 511, 583, 68, 121, 137, 201, 152, 215, 231, 309, 161, 234, 244, 326, 257, 338, 356, 447, 180, 253, 265, 346, 284, 366, 384, 478, 293, 388, 406, 494, 424, 518, 532, 641, 197, 275, 288, 373, 312, 394, 409, 506, 336, 415, 433, 526, 454, 535, 567, 671, 355, 440, 461, 552, 470, 577, 591, 695, 509, 598, 613, 690, 629, 714, 743, 830, 20, 37, 41, 90, 49, 94, 104, 167, 50, 105, 115, 176, 126, 194, 202, 295, 63, 116, 127, 205, 139, 212, 223, 296, 147, 222, 237, 321, 254, 335, 342, 431, 66, 136, 149, 207, 164, 226, 241, 334, 172, 248, 258, 344, 268, 364, 377, 468, 171, 266, 277, 363, 292, 385, 397, 495, 314, 411, 425, 517, 439, 531, 555, 663, 77, 159, 165, 246, 179, 262, 276, 358, 187, 281, 287, 383, 302, 402, 414, 515, 235, 298, 313, 405, 328, 422, 438, 528, 350, 443, 464, 550, 481, 576, 593, 686, 261, 324, 345, 430, 362, 452, 466, 568, 380, 475, 487, 581, 512, 605, 619, 707, 407, 510, 519, 614, 529, 630, 609, 721, 560, 660, 672, 749, 677, 779, 794, 846, 82, 177, 181, 291, 227, 305, 316, 410, 247, 320, 329, 427, 349, 445, 463, 570, 259, 347, 361, 446, 372, 467, 483, 585, 389, 489, 505, 601, 527, 617, 640, 725, 294, 365, 376, 482, 396, 500, 521, 610, 426, 522, 533, 638, 561, 627, 667, 751, 451, 546, 574, 661, 586, 676, 688, 770, 606, 693, 692, 790, 722, 801, 813, 877, 323, 387, 412, 523, 444, 534, 554, 647, 465, 569, 578, 673, 597, 679, 691, 777, 484, 589, 611, 687, 620, 694, 723, 802, 646, 729, 740, 816, 760, 834, 844, 905, 516, 615, 636, 724, 666, 726, 756, 821, 670, 753, 772, 840, 786, 853, 870, 924, 680, 780, 798, 859, 808, 873, 865, 930, 828, 885, 893, 946, 909, 954, 963, 984, 27, 43, 52, 98, 60, 117, 128, 199, 65, 132, 140, 204, 151, 220, 224, 330, 67, 150, 158, 219, 166, 263, 271, 354, 188, 272, 290, 381, 304, 398, 413, 525, 69, 163, 178, 267, 190, 289, 299, 392, 200, 308, 318, 416, 332, 435, 449, 536, 210, 325, 341, 442, 359, 462, 473, 564, 367, 469, 490, 588, 493, 600, 616, 745, 107, 189, 196, 303, 206, 319, 331, 429, 229, 343, 351, 457, 369, 477, 488, 572, 245, 353, 375, 471, 391, 492, 497, 594, 404, 498, 504, 618, 545, 631, 656, 752, 260, 390, 400, 503, 421, 520, 524, 624, 437, 544, 557, 645, 580, 664, 674, 773, 456, 566, 587, 675, 607, 685, 709, 787, 635, 712, 730, 803, 741, 819, 836, 903, 110, 203, 221, 340, 243, 352, 371, 480, 255, 378, 393, 499, 408, 508, 513, 621, 280, 401, 420, 514, 436, 541, 553, 642, 455, 562, 579, 669, 595, 681, 700, 774, 300, 428, 448, 556, 474, 575, 573, 682, 485, 590, 599, 696, 625, 710, 718, 805, 507, 608, 633, 715, 643, 735, 742, 822, 659, 750, 764, 841, 789, 855, 871, 925, 315, 459, 476, 592, 496, 604, 626, 713, 539, 634, 650, 738, 653, 744, 758, 833, 547, 651, 658, 755, 683, 763, 783, 852, 704, 788, 797, 860, 812, 878, 888, 933, 563, 689, 698, 775, 719, 791, 800, 867, 731, 810, 823, 884, 837, 894, 907, 949, 766, 825, 842, 897, 857, 911, 916, 961, 868, 921, 929, 966, 940, 974, 983, 1003, 125, 230, 249, 379, 278, 399, 417, 530, 286, 423, 441, 543, 458, 559, 584, 701, 310, 450, 479, 571, 491, 603, 596, 706, 501, 612, 628, 728, 648, 736, 747, 829, 360, 486, 502, 602, 538, 623, 637, 739, 542, 649, 655, 748, 665, 759, 769, 848, 548, 662, 678, 768, 703, 782, 795, 861, 716, 807, 811, 879, 824, 889, 900, 944, 368, 537, 540, 644, 549, 652, 668, 762, 565, 684, 697, 778, 711, 792, 809, 875, 632, 702, 720, 796, 732, 817, 826, 886, 761, 827, 843, 898, 858, 910, 915, 960, 654, 734, 754, 818, 767, 839, 850, 902, 785, 854, 863, 914, 874, 922, 932, 969, 799, 869, 881, 928, 892, 935, 943, 976, 904, 947, 953, 981, 958, 989, 991, 1011, 374, 551, 558, 699, 622, 708, 717, 806, 639, 727, 737, 820, 757, 832, 847, 901, 657, 746, 765, 835, 776, 851, 864, 913, 793, 872, 862, 919, 887, 931, 939, 972, 705, 771, 781, 856, 804, 866, 880, 926, 815, 882, 891, 936, 899, 941, 950, 980, 838, 895, 906, 945, 917, 955, 959, 987, 923, 965, 968, 993, 975, 996, 998, 1008, 733, 784, 814, 883, 831, 890, 896, 942, 845, 908, 912, 952, 920, 956, 967, 990, 849, 918, 927, 964, 938, 970, 971, 997, 948, 977, 979, 999, 985, 1004, 1006, 1016, 876, 934, 937, 973, 951, 978, 982, 1001, 957, 986, 988, 1005, 994, 1007, 1012, 1018, 962, 992, 995, 1009, 1000, 1010, 1013, 1019, 1002, 1014, 1015, 1020, 1017, 1021, 1022, 1023]

Table Z11, having a sequence length of 1024:

| Polarized channel sequence number | Reliability or sequence number of reliability |
|---|---|
| 0 | 0 |
| 1 | 1 |
| 2 | 2 |
| 3 | 7 |
| 4 | 3 |
| 5 | 8 |
| 6 | 11 |
| 7 | 24 |
| 8 | 4 |
| 9 | 10 |
| 10 | 13 |
| 11 | 28 |
| 12 | 16 |
| 13 | 33 |
| 14 | 35 |
| 15 | 76 |
| 16 | 5 |
| 17 | 12 |
| 18 | 14 |
| 19 | 32 |
| 20 | 19 |
| 21 | 38 |
| 22 | 47 |
| 23 | 80 |
| 24 | 22 |
| 25 | 46 |
| 26 | 42 |
| 27 | 87 |
| 28 | 57 |
| 29 | 95 |
| 30 | 101 |
| 31 | 160 |
| 32 | 6 |
| 33 | 17 |
| 34 | 21 |
| 35 | 40 |
| 36 | 23 |
| 37 | 45 |
| 38 | 51 |
| 39 | 89 |
| 40 | 29 |
| 41 | 55 |
| 42 | 59 |
| 43 | 96 |
| 44 | 71 |
| 45 | 108 |
| 46 | 113 |
| 47 | 175 |
| 48 | 34 |
| 49 | 61 |
| 50 | 74 |
| 51 | 111 |
| 52 | 79 |
| 53 | 120 |
| 54 | 129 |
| 55 | 186 |
| 56 | 86 |
| 57 | 131 |
| 58 | 141 |
| 59 | 208 |
| 60 | 146 |
| 61 | 218 |
| 62 | 236 |
| 63 | 327 |
| 64 | 9 |
| 65 | 18 |
| 66 | 26 |
| 67 | 54 |
| 68 | 30 |
| 69 | 58 |

-continued

Table Z11, having a sequence length of 1024:

| Polarized channel sequence number | Reliability or sequence number of reliability |
|---|---|
| 70 | 70 |
| 71 | 103 |
| 72 | 36 |
| 73 | 75 |
| 74 | 62 |
| 75 | 114 |
| 76 | 83 |
| 77 | 123 |
| 78 | 135 |
| 79 | 193 |
| 80 | 44 |
| 81 | 73 |
| 82 | 85 |
| 83 | 130 |
| 84 | 91 |
| 85 | 138 |
| 86 | 145 |
| 87 | 214 |
| 88 | 99 |
| 89 | 148 |
| 90 | 162 |
| 91 | 228 |
| 92 | 174 |
| 93 | 242 |
| 94 | 256 |
| 95 | 357 |
| 96 | 53 |
| 97 | 88 |
| 98 | 97 |
| 99 | 144 |
| 100 | 109 |
| 101 | 154 |
| 102 | 169 |
| 103 | 239 |
| 104 | 118 |
| 105 | 170 |
| 106 | 185 |
| 107 | 250 |
| 108 | 195 |
| 109 | 269 |
| 110 | 282 |
| 111 | 382 |
| 112 | 133 |
| 113 | 191 |
| 114 | 211 |
| 115 | 273 |
| 116 | 216 |
| 117 | 283 |
| 118 | 301 |
| 119 | 403 |
| 120 | 233 |
| 121 | 307 |
| 122 | 322 |
| 123 | 419 |
| 124 | 337 |
| 125 | 434 |
| 126 | 460 |
| 127 | 582 |
| 128 | 15 |
| 129 | 25 |
| 130 | 31 |
| 131 | 72 |
| 132 | 39 |
| 133 | 78 |
| 134 | 81 |
| 135 | 134 |
| 136 | 48 |
| 137 | 84 |
| 138 | 92 |
| 139 | 143 |
| 140 | 100 |
| 141 | 153 |
| 142 | 157 |
| 143 | 238 |

-continued

Table Z11, having a sequence length of 1024:

| Polarized channel sequence number | Reliability or sequence number of reliability |
|---|---|
| 144 | 56 |
| 145 | 93 |
| 146 | 102 |
| 147 | 155 |
| 148 | 112 |
| 149 | 168 |
| 150 | 182 |
| 151 | 252 |
| 152 | 122 |
| 153 | 183 |
| 154 | 192 |
| 155 | 264 |
| 156 | 213 |
| 157 | 279 |
| 158 | 297 |
| 159 | 395 |
| 160 | 64 |
| 161 | 106 |
| 162 | 119 |
| 163 | 173 |
| 164 | 124 |
| 165 | 184 |
| 166 | 198 |
| 167 | 274 |
| 168 | 142 |
| 169 | 209 |
| 170 | 217 |
| 171 | 285 |
| 172 | 232 |
| 173 | 306 |
| 174 | 317 |
| 175 | 418 |
| 176 | 156 |
| 177 | 225 |
| 178 | 240 |
| 179 | 311 |
| 180 | 251 |
| 181 | 333 |
| 182 | 339 |
| 183 | 432 |
| 184 | 270 |
| 185 | 348 |
| 186 | 370 |
| 187 | 453 |
| 188 | 386 |
| 189 | 472 |
| 190 | 511 |
| 191 | 583 |
| 192 | 68 |
| 193 | 121 |
| 194 | 137 |
| 195 | 201 |
| 196 | 152 |
| 197 | 215 |
| 198 | 231 |
| 199 | 309 |
| 200 | 161 |
| 201 | 234 |
| 202 | 244 |
| 203 | 326 |
| 204 | 257 |
| 205 | 338 |
| 206 | 356 |
| 207 | 447 |
| 208 | 180 |
| 209 | 253 |
| 210 | 265 |
| 211 | 346 |
| 212 | 284 |
| 213 | 366 |
| 214 | 384 |
| 215 | 478 |
| 216 | 293 |
| 217 | 388 |

-continued

Table Z11, having a sequence length of 1024:

| Polarized channel sequence number | Reliability or sequence number of reliability |
|---|---|
| 218 | 406 |
| 219 | 494 |
| 220 | 424 |
| 221 | 518 |
| 222 | 532 |
| 223 | 641 |
| 224 | 197 |
| 225 | 275 |
| 226 | 288 |
| 227 | 373 |
| 228 | 312 |
| 229 | 394 |
| 230 | 409 |
| 231 | 506 |
| 232 | 336 |
| 233 | 415 |
| 234 | 433 |
| 235 | 526 |
| 236 | 454 |
| 237 | 535 |
| 238 | 567 |
| 239 | 671 |
| 240 | 355 |
| 241 | 440 |
| 242 | 461 |
| 243 | 552 |
| 244 | 470 |
| 245 | 577 |
| 246 | 591 |
| 247 | 695 |
| 248 | 509 |
| 249 | 598 |
| 250 | 613 |
| 251 | 690 |
| 252 | 629 |
| 253 | 714 |
| 254 | 743 |
| 255 | 830 |
| 256 | 20 |
| 257 | 37 |
| 258 | 41 |
| 259 | 90 |
| 260 | 49 |
| 261 | 94 |
| 262 | 104 |
| 263 | 167 |
| 264 | 50 |
| 265 | 105 |
| 266 | 115 |
| 267 | 176 |
| 268 | 126 |
| 269 | 194 |
| 270 | 202 |
| 271 | 295 |
| 272 | 63 |
| 273 | 116 |
| 274 | 127 |
| 275 | 205 |
| 276 | 139 |
| 277 | 212 |
| 278 | 223 |
| 279 | 296 |
| 280 | 147 |
| 281 | 222 |
| 282 | 237 |
| 283 | 321 |
| 284 | 254 |
| 285 | 335 |
| 286 | 342 |
| 287 | 431 |
| 288 | 66 |
| 289 | 136 |
| 290 | 149 |
| 291 | 207 |

-continued

Table Z11, having a sequence length of 1024:

| Polarized channel sequence number | Reliability or sequence number of reliability |
|---|---|
| 292 | 164 |
| 293 | 226 |
| 294 | 241 |
| 295 | 334 |
| 296 | 172 |
| 297 | 248 |
| 298 | 258 |
| 299 | 344 |
| 300 | 268 |
| 301 | 364 |
| 302 | 377 |
| 303 | 468 |
| 304 | 171 |
| 305 | 266 |
| 306 | 277 |
| 307 | 363 |
| 308 | 292 |
| 309 | 385 |
| 310 | 397 |
| 311 | 495 |
| 312 | 314 |
| 313 | 411 |
| 314 | 425 |
| 315 | 517 |
| 316 | 439 |
| 317 | 531 |
| 318 | 555 |
| 319 | 663 |
| 320 | 77 |
| 321 | 159 |
| 322 | 165 |
| 323 | 246 |
| 324 | 179 |
| 325 | 262 |
| 326 | 276 |
| 327 | 358 |
| 328 | 187 |
| 329 | 281 |
| 330 | 287 |
| 331 | 383 |
| 332 | 302 |
| 333 | 402 |
| 334 | 414 |
| 335 | 515 |
| 336 | 235 |
| 337 | 298 |
| 338 | 313 |
| 339 | 405 |
| 340 | 328 |
| 341 | 422 |
| 342 | 438 |
| 343 | 528 |
| 344 | 350 |
| 345 | 443 |
| 346 | 464 |
| 347 | 550 |
| 348 | 481 |
| 349 | 576 |
| 350 | 593 |
| 351 | 686 |
| 352 | 261 |
| 353 | 324 |
| 354 | 345 |
| 355 | 430 |
| 356 | 362 |
| 357 | 452 |
| 358 | 466 |
| 359 | 568 |
| 360 | 380 |
| 361 | 475 |
| 362 | 487 |
| 363 | 581 |
| 364 | 512 |
| 365 | 605 |

-continued

Table Z11, having a sequence length of 1024:

| Polarized channel sequence number | Reliability or sequence number of reliability |
|---|---|
| 366 | 619 |
| 367 | 707 |
| 368 | 407 |
| 369 | 510 |
| 370 | 519 |
| 371 | 614 |
| 372 | 529 |
| 373 | 630 |
| 374 | 609 |
| 375 | 721 |
| 376 | 560 |
| 377 | 660 |
| 378 | 672 |
| 379 | 749 |
| 380 | 677 |
| 381 | 779 |
| 382 | 794 |
| 383 | 846 |
| 384 | 82 |
| 385 | 177 |
| 386 | 181 |
| 387 | 291 |
| 388 | 227 |
| 389 | 305 |
| 390 | 316 |
| 391 | 410 |
| 392 | 247 |
| 393 | 320 |
| 394 | 329 |
| 395 | 427 |
| 396 | 349 |
| 397 | 445 |
| 398 | 463 |
| 399 | 570 |
| 400 | 259 |
| 401 | 347 |
| 402 | 361 |
| 403 | 446 |
| 404 | 372 |
| 405 | 467 |
| 406 | 483 |
| 407 | 585 |
| 408 | 389 |
| 409 | 489 |
| 410 | 505 |
| 411 | 601 |
| 412 | 527 |
| 413 | 617 |
| 414 | 640 |
| 415 | 725 |
| 416 | 294 |
| 417 | 365 |
| 418 | 376 |
| 419 | 482 |
| 420 | 396 |
| 421 | 500 |
| 422 | 521 |
| 423 | 610 |
| 424 | 426 |
| 425 | 522 |
| 426 | 533 |
| 427 | 638 |
| 428 | 561 |
| 429 | 627 |
| 430 | 667 |
| 431 | 751 |
| 432 | 451 |
| 433 | 546 |
| 434 | 574 |
| 435 | 661 |
| 436 | 586 |
| 437 | 676 |
| 438 | 688 |
| 439 | 770 |

-continued

Table Z11, having a sequence length of 1024:

| Polarized channel sequence number | Reliability or sequence number of reliability |
|---|---|
| 440 | 606 |
| 441 | 693 |
| 442 | 692 |
| 443 | 790 |
| 444 | 722 |
| 445 | 801 |
| 446 | 813 |
| 447 | 877 |
| 448 | 323 |
| 449 | 387 |
| 450 | 412 |
| 451 | 523 |
| 452 | 444 |
| 453 | 534 |
| 454 | 554 |
| 455 | 647 |
| 456 | 465 |
| 457 | 569 |
| 458 | 578 |
| 459 | 673 |
| 460 | 597 |
| 461 | 679 |
| 462 | 691 |
| 463 | 777 |
| 464 | 484 |
| 465 | 589 |
| 466 | 611 |
| 467 | 687 |
| 468 | 620 |
| 469 | 694 |
| 470 | 723 |
| 471 | 802 |
| 472 | 646 |
| 473 | 729 |
| 474 | 740 |
| 475 | 816 |
| 476 | 760 |
| 477 | 834 |
| 478 | 844 |
| 479 | 905 |
| 480 | 516 |
| 481 | 615 |
| 482 | 636 |
| 483 | 724 |
| 484 | 666 |
| 485 | 726 |
| 486 | 756 |
| 487 | 821 |
| 488 | 670 |
| 489 | 753 |
| 490 | 772 |
| 491 | 840 |
| 492 | 786 |
| 493 | 853 |
| 494 | 870 |
| 495 | 924 |
| 496 | 680 |
| 497 | 780 |
| 498 | 798 |
| 499 | 859 |
| 500 | 808 |
| 501 | 873 |
| 502 | 865 |
| 503 | 930 |
| 504 | 828 |
| 505 | 885 |
| 506 | 893 |
| 507 | 946 |
| 508 | 909 |
| 509 | 954 |
| 510 | 963 |
| 511 | 984 |
| 512 | 27 |
| 513 | 43 |

-continued

Table Z11, having a sequence length of 1024:

| Polarized channel sequence number | Reliability or sequence number of reliability |
|---|---|
| 514 | 52 |
| 515 | 98 |
| 516 | 60 |
| 517 | 117 |
| 518 | 128 |
| 519 | 199 |
| 520 | 65 |
| 521 | 132 |
| 522 | 140 |
| 523 | 204 |
| 524 | 151 |
| 525 | 220 |
| 526 | 224 |
| 527 | 330 |
| 528 | 67 |
| 529 | 150 |
| 530 | 158 |
| 531 | 219 |
| 532 | 166 |
| 533 | 263 |
| 534 | 271 |
| 535 | 354 |
| 536 | 188 |
| 537 | 272 |
| 538 | 290 |
| 539 | 381 |
| 540 | 304 |
| 541 | 398 |
| 542 | 413 |
| 543 | 525 |
| 544 | 69 |
| 545 | 163 |
| 546 | 178 |
| 547 | 267 |
| 548 | 190 |
| 549 | 289 |
| 550 | 299 |
| 551 | 392 |
| 552 | 200 |
| 553 | 308 |
| 554 | 318 |
| 555 | 416 |
| 556 | 332 |
| 557 | 435 |
| 558 | 449 |
| 559 | 536 |
| 560 | 210 |
| 561 | 325 |
| 562 | 341 |
| 563 | 442 |
| 564 | 359 |
| 565 | 462 |
| 566 | 473 |
| 567 | 564 |
| 568 | 367 |
| 569 | 469 |
| 570 | 490 |
| 571 | 588 |
| 572 | 493 |
| 573 | 600 |
| 574 | 616 |
| 575 | 745 |
| 576 | 107 |
| 577 | 189 |
| 578 | 196 |
| 579 | 303 |
| 580 | 206 |
| 581 | 319 |
| 582 | 331 |
| 583 | 429 |
| 584 | 229 |
| 585 | 343 |
| 586 | 351 |
| 587 | 457 |

-continued

Table Z11, having a sequence length of 1024:

| Polarized channel sequence number | Reliability or sequence number of reliability |
|---|---|
| 588 | 369 |
| 589 | 477 |
| 590 | 488 |
| 591 | 572 |
| 592 | 245 |
| 593 | 353 |
| 594 | 375 |
| 595 | 471 |
| 596 | 391 |
| 597 | 492 |
| 598 | 497 |
| 599 | 594 |
| 600 | 404 |
| 601 | 498 |
| 602 | 504 |
| 603 | 618 |
| 604 | 545 |
| 605 | 631 |
| 606 | 656 |
| 607 | 752 |
| 608 | 260 |
| 609 | 390 |
| 610 | 400 |
| 611 | 503 |
| 612 | 421 |
| 613 | 520 |
| 614 | 524 |
| 615 | 624 |
| 616 | 437 |
| 617 | 544 |
| 618 | 557 |
| 619 | 645 |
| 620 | 580 |
| 621 | 664 |
| 622 | 674 |
| 623 | 773 |
| 624 | 456 |
| 625 | 566 |
| 626 | 587 |
| 627 | 675 |
| 628 | 607 |
| 629 | 685 |
| 630 | 709 |
| 631 | 787 |
| 632 | 635 |
| 633 | 712 |
| 634 | 730 |
| 635 | 803 |
| 636 | 741 |
| 637 | 819 |
| 638 | 836 |
| 639 | 903 |
| 640 | 110 |
| 641 | 203 |
| 642 | 221 |
| 643 | 340 |
| 644 | 243 |
| 645 | 352 |
| 646 | 371 |
| 647 | 480 |
| 648 | 255 |
| 649 | 378 |
| 650 | 393 |
| 651 | 499 |
| 652 | 408 |
| 653 | 508 |
| 654 | 513 |
| 655 | 621 |
| 656 | 280 |
| 657 | 401 |
| 658 | 420 |
| 659 | 514 |
| 660 | 436 |
| 661 | 541 |

-continued

Table Z11, having a sequence length of 1024:

| Polarized channel sequence number | Reliability or sequence number of reliability |
|---|---|
| 662 | 553 |
| 663 | 642 |
| 664 | 455 |
| 665 | 562 |
| 666 | 579 |
| 667 | 669 |
| 668 | 595 |
| 669 | 681 |
| 670 | 700 |
| 671 | 774 |
| 672 | 300 |
| 673 | 428 |
| 674 | 448 |
| 675 | 556 |
| 676 | 474 |
| 677 | 575 |
| 678 | 573 |
| 679 | 682 |
| 680 | 485 |
| 681 | 590 |
| 682 | 599 |
| 683 | 696 |
| 684 | 625 |
| 685 | 710 |
| 686 | 718 |
| 687 | 805 |
| 688 | 507 |
| 689 | 608 |
| 690 | 633 |
| 691 | 715 |
| 692 | 643 |
| 693 | 735 |
| 694 | 742 |
| 695 | 822 |
| 696 | 659 |
| 697 | 750 |
| 698 | 764 |
| 699 | 841 |
| 700 | 789 |
| 701 | 855 |
| 702 | 871 |
| 703 | 925 |
| 704 | 315 |
| 705 | 459 |
| 706 | 476 |
| 707 | 592 |
| 708 | 496 |
| 709 | 604 |
| 710 | 626 |
| 711 | 713 |
| 712 | 539 |
| 713 | 634 |
| 714 | 650 |
| 715 | 738 |
| 716 | 653 |
| 717 | 744 |
| 718 | 758 |
| 719 | 833 |
| 720 | 547 |
| 721 | 651 |
| 722 | 658 |
| 723 | 755 |
| 724 | 683 |
| 725 | 763 |
| 726 | 783 |
| 727 | 852 |
| 728 | 704 |
| 729 | 788 |
| 730 | 797 |
| 731 | 860 |
| 732 | 812 |
| 733 | 878 |
| 734 | 888 |
| 735 | 933 |

-continued

Table Z11, having a sequence length of 1024:

| Polarized channel sequence number | Reliability or sequence number of reliability |
|---|---|
| 736 | 563 |
| 737 | 689 |
| 738 | 698 |
| 739 | 775 |
| 740 | 719 |
| 741 | 791 |
| 742 | 800 |
| 743 | 867 |
| 744 | 731 |
| 745 | 810 |
| 746 | 823 |
| 747 | 884 |
| 748 | 837 |
| 749 | 894 |
| 750 | 907 |
| 751 | 949 |
| 752 | 766 |
| 753 | 825 |
| 754 | 842 |
| 755 | 897 |
| 756 | 857 |
| 757 | 911 |
| 758 | 916 |
| 759 | 961 |
| 760 | 868 |
| 761 | 921 |
| 762 | 929 |
| 763 | 966 |
| 764 | 940 |
| 765 | 974 |
| 766 | 983 |
| 767 | 1003 |
| 768 | 125 |
| 769 | 230 |
| 770 | 249 |
| 771 | 379 |
| 772 | 278 |
| 773 | 399 |
| 774 | 417 |
| 775 | 530 |
| 776 | 286 |
| 777 | 423 |
| 778 | 441 |
| 779 | 543 |
| 780 | 458 |
| 781 | 559 |
| 782 | 584 |
| 783 | 701 |
| 784 | 310 |
| 785 | 450 |
| 786 | 479 |
| 787 | 571 |
| 788 | 491 |
| 789 | 603 |
| 790 | 596 |
| 791 | 706 |
| 792 | 501 |
| 793 | 612 |
| 794 | 628 |
| 795 | 728 |
| 796 | 648 |
| 797 | 736 |
| 798 | 747 |
| 799 | 829 |
| 800 | 360 |
| 801 | 486 |
| 802 | 502 |
| 803 | 602 |
| 804 | 538 |
| 805 | 623 |
| 806 | 637 |
| 807 | 739 |
| 808 | 542 |
| 809 | 649 |

-continued

Table Z11, having a sequence length of 1024:

| Polarized channel sequence number | Reliability or sequence number of reliability |
|---|---|
| 810 | 655 |
| 811 | 748 |
| 812 | 665 |
| 813 | 759 |
| 814 | 769 |
| 815 | 848 |
| 816 | 548 |
| 817 | 662 |
| 818 | 678 |
| 819 | 768 |
| 820 | 703 |
| 821 | 782 |
| 822 | 795 |
| 823 | 861 |
| 824 | 716 |
| 825 | 807 |
| 826 | 811 |
| 827 | 879 |
| 828 | 824 |
| 829 | 889 |
| 830 | 900 |
| 831 | 944 |
| 832 | 368 |
| 833 | 537 |
| 834 | 540 |
| 835 | 644 |
| 836 | 549 |
| 837 | 652 |
| 838 | 668 |
| 839 | 762 |
| 840 | 565 |
| 841 | 684 |
| 842 | 697 |
| 843 | 778 |
| 844 | 711 |
| 845 | 792 |
| 846 | 809 |
| 847 | 875 |
| 848 | 632 |
| 849 | 702 |
| 850 | 720 |
| 851 | 796 |
| 852 | 732 |
| 853 | 817 |
| 854 | 826 |
| 855 | 886 |
| 856 | 761 |
| 857 | 827 |
| 858 | 843 |
| 859 | 898 |
| 860 | 858 |
| 861 | 910 |
| 862 | 915 |
| 863 | 960 |
| 864 | 654 |
| 865 | 734 |
| 866 | 754 |
| 867 | 818 |
| 868 | 767 |
| 869 | 839 |
| 870 | 850 |
| 871 | 902 |
| 872 | 785 |
| 873 | 854 |
| 874 | 863 |
| 875 | 914 |
| 876 | 874 |
| 877 | 922 |
| 878 | 932 |
| 879 | 969 |
| 880 | 799 |
| 881 | 869 |
| 882 | 881 |
| 883 | 928 |

-continued

Table Z11, having a sequence length of 1024:

| Polarized channel sequence number | Reliability or sequence number of reliability |
|---|---|
| 884 | 892 |
| 885 | 935 |
| 886 | 943 |
| 887 | 976 |
| 888 | 904 |
| 889 | 947 |
| 890 | 953 |
| 891 | 981 |
| 892 | 958 |
| 893 | 989 |
| 894 | 991 |
| 895 | 1011 |
| 896 | 374 |
| 897 | 551 |
| 898 | 558 |
| 899 | 699 |
| 900 | 622 |
| 901 | 708 |
| 902 | 717 |
| 903 | 806 |
| 904 | 639 |
| 905 | 727 |
| 906 | 737 |
| 907 | 820 |
| 908 | 757 |
| 909 | 832 |
| 910 | 847 |
| 911 | 901 |
| 912 | 657 |
| 913 | 746 |
| 914 | 765 |
| 915 | 835 |
| 916 | 776 |
| 917 | 851 |
| 918 | 864 |
| 919 | 913 |
| 920 | 793 |
| 921 | 872 |
| 922 | 862 |
| 923 | 919 |
| 924 | 887 |
| 925 | 931 |
| 926 | 939 |
| 927 | 972 |
| 928 | 705 |
| 929 | 771 |
| 930 | 781 |
| 931 | 856 |
| 932 | 804 |
| 933 | 866 |
| 934 | 880 |
| 935 | 926 |
| 936 | 815 |
| 937 | 882 |
| 938 | 891 |
| 939 | 936 |
| 940 | 899 |
| 941 | 941 |
| 942 | 950 |
| 943 | 980 |
| 944 | 838 |
| 945 | 895 |
| 946 | 906 |
| 947 | 945 |
| 948 | 917 |
| 949 | 955 |
| 950 | 959 |
| 951 | 987 |
| 952 | 923 |
| 953 | 965 |
| 954 | 968 |
| 955 | 993 |
| 956 | 975 |
| 957 | 996 |

-continued

Table Z11, having a sequence length of 1024:

| Polarized channel sequence number | Reliability or sequence number of reliability |
|---|---|
| 958 | 998 |
| 959 | 1008 |
| 960 | 733 |
| 961 | 784 |
| 962 | 814 |
| 963 | 883 |
| 964 | 831 |
| 965 | 890 |
| 966 | 896 |
| 967 | 942 |
| 968 | 845 |
| 969 | 908 |
| 970 | 912 |
| 971 | 952 |
| 972 | 920 |
| 973 | 956 |
| 974 | 967 |
| 975 | 990 |
| 976 | 849 |
| 977 | 918 |
| 978 | 927 |
| 979 | 964 |
| 980 | 938 |
| 981 | 970 |
| 982 | 971 |
| 983 | 997 |
| 984 | 948 |
| 985 | 977 |
| 986 | 979 |
| 987 | 999 |
| 988 | 985 |
| 989 | 1004 |
| 990 | 1006 |
| 991 | 1016 |
| 992 | 876 |
| 993 | 934 |
| 994 | 937 |
| 995 | 973 |
| 996 | 951 |
| 997 | 978 |
| 998 | 982 |
| 999 | 1001 |
| 1000 | 957 |
| 1001 | 986 |
| 1002 | 988 |
| 1003 | 1005 |
| 1004 | 994 |
| 1005 | 1007 |
| 1006 | 1012 |
| 1007 | 1018 |
| 1008 | 962 |
| 1009 | 992 |
| 1010 | 995 |
| 1011 | 1009 |
| 1012 | 1000 |
| 1013 | 1010 |
| 1014 | 1013 |
| 1015 | 1019 |
| 1016 | 1002 |
| 1017 | 1014 |
| 1018 | 1015 |
| 1019 | 1020 |
| 1020 | 1017 |
| 1021 | 1021 |
| 1022 | 1022 |
| 1023 | 1023 |

Sequence Z12, having a sequence length of 512:

[0, 1, 2, 7, 3, 8, 11, 24, 4, 10, 13, 27, 16, 32, 34, 69, 5, 12, 14, 31, 19, 37, 45, 73, 22, 44, 41, 80, 54, 88, 93, 142, 6, 17, 21, 39, 23, 43, 49, 82, 28, 52, 56, 89, 64, 99, 103, 155, 33, 57, 67, 101, 72, 109, 116, 165, 79, 118, 126, 178, 131, 187, 199, 266, 9, 18, 26, 51, 29, 55, 63, 95, 35, 68, 58, 104, 76, 112, 121, 169, 42, 66, 78, 117, 84, 124, 130, 183, 91, 133, 144, 193, 154, 205, 215, 286, 50, 81, 90, 129, 100, 137, 149, 202, 107, 150, 164, 210, 171, 225, 234, 300, 119, 167, 180, 227, 185, 235, 248, 313, 196, 252, 262, 324, 273, 334, 347, 407, 15, 25, 30, 65, 38, 71, 74, 120, 46, 77, 85, 128, 92, 136, 140, 201, 53, 86, 94, 138, 102, 148, 161, 212, 111, 162, 168, 221, 182, 232, 246, 309, 60, 98, 108, 153, 113, 163, 173, 228, 127, 179, 186, 237, 195, 251, 259, 323, 139, 190, 203, 254, 211, 269, 275, 332, 226, 281, 294, 345, 304, 356, 372, 408, 62, 110, 123, 174, 135, 184, 194, 253, 143, 197, 206, 265, 216, 274, 285, 342, 159, 213, 222, 279, 236, 293, 302, 358, 242, 306, 315, 365, 326, 377, 387, 434, 172, 229, 239, 296, 255, 308, 317, 369, 272, 322, 333, 382, 346, 390, 398, 443, 284, 337, 348, 393, 355, 404, 412, 458, 370, 415, 422, 453, 429, 460, 469, 491, 20, 36, 40, 83, 47, 87, 96, 147, 48, 97, 105, 156, 114, 170, 175, 244, 59, 106, 115, 176, 125, 181, 189, 245, 132, 188, 200, 261, 214, 271, 276, 331, 61, 122, 134, 177, 145, 191, 204, 270, 152, 209, 217, 277, 224, 291, 298, 354, 151, 223, 231, 290, 241, 303, 311, 366, 257, 319, 327, 376, 336, 386, 395, 439, 70, 141, 146, 207, 158, 220, 230, 287, 166, 233, 238, 301, 249, 312, 321, 374, 198, 247, 256, 314, 267, 325, 335, 384, 283, 338, 350, 392, 359, 403, 413, 450, 219, 264, 278, 330, 289, 344, 352, 399, 299, 357, 363, 406, 373, 417, 426, 459, 316, 371, 378, 423, 385, 430, 419, 461, 396, 437, 444, 470, 447, 478, 482, 495, 75, 157, 160, 240, 192, 250, 258, 318, 208, 260, 268, 329, 282, 340, 349, 401, 218, 280, 288, 341, 295, 353, 361, 409, 307, 364, 368, 416, 383, 425, 433, 465, 243, 292, 297, 360, 310, 367, 379, 420, 328, 380, 388, 432, 397, 428, 441, 471, 343, 391, 402, 438, 410, 446, 452, 475, 418, 456, 455, 481, 462, 484, 487, 501, 263, 305, 320, 381, 339, 389, 394, 436, 351, 400, 405, 445, 414, 448, 454, 477, 362, 411, 421, 451, 427, 457, 463, 485, 435, 467, 468, 488, 474, 492, 494, 504, 375, 424, 431, 464, 440, 466, 473, 489, 442, 472, 476, 493, 480, 496, 499, 506, 449, 479, 483, 497, 486, 500, 498, 507, 490, 502, 503, 508, 505, 509, 510, 511]

Table Z12, having a sequence length of 512:

| Polarized channel sequence number | Reliability or sequence number of reliability |
|---|---|
| 0 | 0 |
| 1 | 1 |
| 2 | 2 |
| 3 | 7 |
| 4 | 3 |
| 5 | 8 |
| 6 | 11 |
| 7 | 24 |
| 8 | 4 |
| 9 | 10 |
| 10 | 13 |
| 11 | 27 |
| 12 | 16 |
| 13 | 32 |
| 14 | 34 |
| 15 | 69 |
| 16 | 5 |
| 17 | 12 |
| 18 | 14 |
| 19 | 31 |
| 20 | 19 |
| 21 | 37 |
| 22 | 45 |
| 23 | 73 |
| 24 | 22 |
| 25 | 44 |
| 26 | 41 |
| 27 | 80 |
| 28 | 54 |
| 29 | 88 |
| 30 | 93 |
| 31 | 142 |
| 32 | 6 |
| 33 | 17 |
| 34 | 21 |
| 35 | 39 |
| 36 | 23 |
| 37 | 43 |
| 38 | 49 |
| 39 | 82 |
| 40 | 28 |
| 41 | 52 |
| 42 | 56 |
| 43 | 89 |
| 44 | 64 |
| 45 | 99 |
| 46 | 103 |
| 47 | 155 |
| 48 | 33 |
| 49 | 57 |
| 50 | 67 |
| 51 | 101 |
| 52 | 72 |
| 53 | 109 |
| 54 | 116 |
| 55 | 165 |
| 56 | 79 |
| 57 | 118 |
| 58 | 126 |
| 59 | 178 |
| 60 | 131 |
| 61 | 187 |
| 62 | 199 |
| 63 | 266 |
| 64 | 9 |
| 65 | 18 |
| 66 | 26 |
| 67 | 51 |
| 68 | 29 |
| 69 | 55 |
| 70 | 63 |
| 71 | 95 |
| 72 | 35 |
| 73 | 68 |
| 74 | 58 |
| 75 | 104 |
| 76 | 76 |
| 77 | 112 |
| 78 | 121 |
| 79 | 169 |
| 80 | 42 |
| 81 | 66 |
| 82 | 78 |
| 83 | 117 |
| 84 | 84 |
| 85 | 124 |
| 86 | 130 |
| 87 | 183 |
| 88 | 91 |
| 89 | 133 |
| 90 | 144 |
| 91 | 193 |
| 92 | 154 |
| 93 | 205 |
| 94 | 215 |
| 95 | 286 |
| 96 | 50 |
| 97 | 81 |
| 98 | 90 |
| 99 | 129 |
| 100 | 100 |
| 101 | 137 |
| 102 | 149 |
| 103 | 202 |
| 104 | 107 |

-continued

Table Z12, having a sequence length of 512:

| Polarized channel sequence number | Reliability or sequence number of reliability |
|---|---|
| 105 | 150 |
| 106 | 164 |
| 107 | 210 |
| 108 | 171 |
| 109 | 225 |
| 110 | 234 |
| 111 | 300 |
| 112 | 119 |
| 113 | 167 |
| 114 | 180 |
| 115 | 227 |
| 116 | 185 |
| 117 | 235 |
| 118 | 248 |
| 119 | 313 |
| 120 | 196 |
| 121 | 252 |
| 122 | 262 |
| 123 | 324 |
| 124 | 273 |
| 125 | 334 |
| 126 | 347 |
| 127 | 407 |
| 128 | 15 |
| 129 | 25 |
| 130 | 30 |
| 131 | 65 |
| 132 | 38 |
| 133 | 71 |
| 134 | 74 |
| 135 | 120 |
| 136 | 46 |
| 137 | 77 |
| 138 | 85 |
| 139 | 128 |
| 140 | 92 |
| 141 | 136 |
| 142 | 140 |
| 143 | 201 |
| 144 | 53 |
| 145 | 86 |
| 146 | 94 |
| 147 | 138 |
| 148 | 102 |
| 149 | 148 |
| 150 | 161 |
| 151 | 212 |
| 152 | 111 |
| 153 | 162 |
| 154 | 168 |
| 155 | 221 |
| 156 | 182 |
| 157 | 232 |
| 158 | 246 |
| 159 | 309 |
| 160 | 60 |
| 161 | 98 |
| 162 | 108 |
| 163 | 153 |
| 164 | 113 |
| 165 | 163 |
| 166 | 173 |
| 167 | 228 |
| 168 | 127 |
| 169 | 179 |
| 170 | 186 |
| 171 | 237 |
| 172 | 195 |
| 173 | 251 |
| 174 | 259 |
| 175 | 323 |
| 176 | 139 |
| 177 | 190 |
| 178 | 203 |

-continued

Table Z12, having a sequence length of 512:

| Polarized channel sequence number | Reliability or sequence number of reliability |
|---|---|
| 179 | 254 |
| 180 | 211 |
| 181 | 269 |
| 182 | 275 |
| 183 | 332 |
| 184 | 226 |
| 185 | 281 |
| 186 | 294 |
| 187 | 345 |
| 188 | 304 |
| 189 | 356 |
| 190 | 372 |
| 191 | 408 |
| 192 | 62 |
| 193 | 110 |
| 194 | 123 |
| 195 | 174 |
| 196 | 135 |
| 197 | 184 |
| 198 | 194 |
| 199 | 253 |
| 200 | 143 |
| 201 | 197 |
| 202 | 206 |
| 203 | 265 |
| 204 | 216 |
| 205 | 274 |
| 206 | 285 |
| 207 | 342 |
| 208 | 159 |
| 209 | 213 |
| 210 | 222 |
| 211 | 279 |
| 212 | 236 |
| 213 | 293 |
| 214 | 302 |
| 215 | 358 |
| 216 | 242 |
| 217 | 306 |
| 218 | 315 |
| 219 | 365 |
| 220 | 326 |
| 221 | 377 |
| 222 | 387 |
| 223 | 434 |
| 224 | 172 |
| 225 | 229 |
| 226 | 239 |
| 227 | 296 |
| 228 | 255 |
| 229 | 308 |
| 230 | 317 |
| 231 | 369 |
| 232 | 272 |
| 233 | 322 |
| 234 | 333 |
| 235 | 382 |
| 236 | 346 |
| 237 | 390 |
| 238 | 398 |
| 239 | 443 |
| 240 | 284 |
| 241 | 337 |
| 242 | 348 |
| 243 | 393 |
| 244 | 355 |
| 245 | 404 |
| 246 | 412 |
| 247 | 458 |
| 248 | 370 |
| 249 | 415 |
| 250 | 422 |
| 251 | 453 |
| 252 | 429 |

Table Z12, having a sequence length of 512:

| Polarized channel sequence number | Reliability or sequence number of reliability |
|---|---|
| 253 | 460 |
| 254 | 469 |
| 255 | 491 |
| 256 | 20 |
| 257 | 36 |
| 258 | 40 |
| 259 | 83 |
| 260 | 47 |
| 261 | 87 |
| 262 | 96 |
| 263 | 147 |
| 264 | 48 |
| 265 | 97 |
| 266 | 105 |
| 267 | 156 |
| 268 | 114 |
| 269 | 170 |
| 270 | 175 |
| 271 | 244 |
| 272 | 59 |
| 273 | 106 |
| 274 | 115 |
| 275 | 176 |
| 276 | 125 |
| 277 | 181 |
| 278 | 189 |
| 279 | 245 |
| 280 | 132 |
| 281 | 188 |
| 282 | 200 |
| 283 | 261 |
| 284 | 214 |
| 285 | 271 |
| 286 | 276 |
| 287 | 331 |
| 288 | 61 |
| 289 | 122 |
| 290 | 134 |
| 291 | 177 |
| 292 | 145 |
| 293 | 191 |
| 294 | 204 |
| 295 | 270 |
| 296 | 152 |
| 297 | 209 |
| 298 | 217 |
| 299 | 277 |
| 300 | 224 |
| 301 | 291 |
| 302 | 298 |
| 303 | 354 |
| 304 | 151 |
| 305 | 223 |
| 306 | 231 |
| 307 | 290 |
| 308 | 241 |
| 309 | 303 |
| 310 | 311 |
| 311 | 366 |
| 312 | 257 |
| 313 | 319 |
| 314 | 327 |
| 315 | 376 |
| 316 | 336 |
| 317 | 386 |
| 318 | 395 |
| 319 | 439 |
| 320 | 70 |
| 321 | 141 |
| 322 | 146 |
| 323 | 207 |
| 324 | 158 |
| 325 | 220 |
| 326 | 230 |

Table Z12, having a sequence length of 512:

| Polarized channel sequence number | Reliability or sequence number of reliability |
|---|---|
| 327 | 287 |
| 328 | 166 |
| 329 | 233 |
| 330 | 238 |
| 331 | 301 |
| 332 | 249 |
| 333 | 312 |
| 334 | 321 |
| 335 | 374 |
| 336 | 198 |
| 337 | 247 |
| 338 | 256 |
| 339 | 314 |
| 340 | 267 |
| 341 | 325 |
| 342 | 335 |
| 343 | 384 |
| 344 | 283 |
| 345 | 338 |
| 346 | 350 |
| 347 | 392 |
| 348 | 359 |
| 349 | 403 |
| 350 | 413 |
| 351 | 450 |
| 352 | 219 |
| 353 | 264 |
| 354 | 278 |
| 355 | 330 |
| 356 | 289 |
| 357 | 344 |
| 358 | 352 |
| 359 | 399 |
| 360 | 299 |
| 361 | 357 |
| 362 | 363 |
| 363 | 406 |
| 364 | 373 |
| 365 | 417 |
| 366 | 426 |
| 367 | 459 |
| 368 | 316 |
| 369 | 371 |
| 370 | 378 |
| 371 | 423 |
| 372 | 385 |
| 373 | 430 |
| 374 | 419 |
| 375 | 461 |
| 376 | 396 |
| 377 | 437 |
| 378 | 444 |
| 379 | 470 |
| 380 | 447 |
| 381 | 478 |
| 382 | 482 |
| 383 | 495 |
| 384 | 75 |
| 385 | 157 |
| 386 | 160 |
| 387 | 240 |
| 388 | 192 |
| 389 | 250 |
| 390 | 258 |
| 391 | 318 |
| 392 | 208 |
| 393 | 260 |
| 394 | 268 |
| 395 | 329 |
| 396 | 282 |
| 397 | 340 |
| 398 | 349 |
| 399 | 401 |
| 400 | 218 |

-continued

| Table Z12, having a sequence length of 512: | |
|---|---|
| Polarized channel sequence number | Reliability or sequence number of reliability |
| 401 | 280 |
| 402 | 288 |
| 403 | 341 |
| 404 | 295 |
| 405 | 353 |
| 406 | 361 |
| 407 | 409 |
| 408 | 307 |
| 409 | 364 |
| 410 | 368 |
| 411 | 416 |
| 412 | 383 |
| 413 | 425 |
| 414 | 433 |
| 415 | 465 |
| 416 | 243 |
| 417 | 292 |
| 418 | 297 |
| 419 | 360 |
| 420 | 310 |
| 421 | 367 |
| 422 | 379 |
| 423 | 420 |
| 424 | 328 |
| 425 | 380 |
| 426 | 388 |
| 427 | 432 |
| 428 | 397 |
| 429 | 428 |
| 430 | 441 |
| 431 | 471 |
| 432 | 343 |
| 433 | 391 |
| 434 | 402 |
| 435 | 438 |
| 436 | 410 |
| 437 | 446 |
| 438 | 452 |
| 439 | 475 |
| 440 | 418 |
| 441 | 456 |
| 442 | 455 |
| 443 | 481 |
| 444 | 462 |
| 445 | 484 |
| 446 | 487 |
| 447 | 501 |
| 448 | 263 |
| 449 | 305 |
| 450 | 320 |
| 451 | 381 |
| 452 | 339 |
| 453 | 389 |
| 454 | 394 |
| 455 | 436 |
| 456 | 351 |
| 457 | 400 |
| 458 | 405 |
| 459 | 445 |
| 460 | 414 |
| 461 | 448 |
| 462 | 454 |
| 463 | 477 |
| 464 | 362 |
| 465 | 411 |
| 466 | 421 |
| 467 | 451 |
| 468 | 427 |
| 469 | 457 |
| 470 | 463 |
| 471 | 485 |
| 472 | 435 |
| 473 | 467 |
| 474 | 468 |

-continued

| Table Z12, having a sequence length of 512: | |
|---|---|
| Polarized channel sequence number | Reliability or sequence number of reliability |
| 475 | 488 |
| 476 | 474 |
| 477 | 492 |
| 478 | 494 |
| 479 | 504 |
| 480 | 375 |
| 481 | 424 |
| 482 | 431 |
| 483 | 464 |
| 484 | 440 |
| 485 | 466 |
| 486 | 473 |
| 487 | 489 |
| 488 | 442 |
| 489 | 472 |
| 490 | 476 |
| 491 | 493 |
| 492 | 480 |
| 493 | 496 |
| 494 | 499 |
| 495 | 506 |
| 496 | 449 |
| 497 | 479 |
| 498 | 483 |
| 499 | 497 |
| 500 | 486 |
| 501 | 500 |
| 502 | 498 |
| 503 | 507 |
| 504 | 490 |
| 505 | 502 |
| 506 | 503 |
| 507 | 508 |
| 508 | 505 |
| 509 | 509 |
| 510 | 510 |
| 511 | 511 |

Sequence Z13, having a sequence length of 256:

[0, 1, 2, 7, 3, 8, 11, 23, 4, 10, 13, 26, 16, 31, 33, 62, 5, 12, 14, 30, 19, 35, 42, 65, 21, 41, 38, 71, 49, 77, 82, 120, 6, 17, 20, 37, 22, 40, 44, 73, 27, 47, 51, 78, 57, 86, 90, 128, 32, 52, 60, 88, 64, 94, 99, 134, 70, 101, 107, 142, 112, 150, 157, 193, 9, 18, 25, 46, 28, 50, 56, 84, 34, 61, 53, 91, 67, 97, 104, 137, 39, 59, 69, 100, 74, 106, 111, 146, 80, 113, 122, 152, 127, 161, 167, 203, 45, 72, 79, 110, 87, 116, 124, 159, 92, 125, 133, 163, 138, 171, 177, 207, 102, 135, 144, 173, 148, 178, 184, 213, 155, 186, 191, 218, 196, 222, 227, 243, 15, 24, 29, 58, 36, 63, 66, 103, 43, 68, 75, 109, 81, 115, 119, 158, 48, 76, 83, 117, 89, 123, 130, 165, 96, 131, 136, 169, 145, 176, 183, 212, 54, 85, 93, 126, 98, 132, 140, 174, 108, 143, 149, 180, 154, 185, 190, 217, 118, 151, 160, 188, 164, 194, 198, 220, 172, 200, 205, 225, 209, 230, 235, 244, 55, 95, 105, 141, 114, 147, 153, 187, 121, 156, 162, 192, 168, 197, 202, 224, 129, 166, 170, 199, 179, 204, 208, 231, 182, 210, 214, 232, 219, 236, 238, 249, 139, 175, 181, 206, 189, 211, 215, 233, 195, 216, 221, 237, 226, 239, 241, 250, 201, 223, 228, 240, 229, 242, 245, 252, 234, 246, 247, 251, 248, 253, 254, 255]

| Table Z13, having a sequence length of 256: | |
|---|---|
| Polarized channel sequence number | Reliability or sequence number of reliability |
| 0 | 0 |
| 1 | 1 |

-continued

Table Z13, having a sequence length of 256:

| Polarized channel sequence number | Reliability or sequence number of reliability |
|---|---|
| 2 | 2 |
| 3 | 7 |
| 4 | 3 |
| 5 | 8 |
| 6 | 11 |
| 7 | 23 |
| 8 | 4 |
| 9 | 10 |
| 10 | 13 |
| 11 | 26 |
| 12 | 16 |
| 13 | 31 |
| 14 | 33 |
| 15 | 62 |
| 16 | 5 |
| 17 | 12 |
| 18 | 14 |
| 19 | 30 |
| 20 | 19 |
| 21 | 35 |
| 22 | 42 |
| 23 | 65 |
| 24 | 21 |
| 25 | 41 |
| 26 | 38 |
| 27 | 71 |
| 28 | 49 |
| 29 | 77 |
| 30 | 82 |
| 31 | 120 |
| 32 | 6 |
| 33 | 17 |
| 34 | 20 |
| 35 | 37 |
| 36 | 22 |
| 37 | 40 |
| 38 | 44 |
| 39 | 73 |
| 40 | 27 |
| 41 | 47 |
| 42 | 51 |
| 43 | 78 |
| 44 | 57 |
| 45 | 86 |
| 46 | 90 |
| 47 | 128 |
| 48 | 32 |
| 49 | 52 |
| 50 | 60 |
| 51 | 88 |
| 52 | 64 |
| 53 | 94 |
| 54 | 99 |
| 55 | 134 |
| 56 | 70 |
| 57 | 101 |
| 58 | 107 |
| 59 | 142 |
| 60 | 112 |
| 61 | 150 |
| 62 | 157 |
| 63 | 193 |
| 64 | 9 |
| 65 | 18 |
| 66 | 25 |
| 67 | 46 |
| 68 | 28 |
| 69 | 50 |
| 70 | 56 |
| 71 | 84 |
| 72 | 34 |
| 73 | 61 |

-continued

Table Z13, having a sequence length of 256:

| Polarized channel sequence number | Reliability or sequence number of reliability |
|---|---|
| 74 | 53 |
| 75 | 91 |
| 76 | 67 |
| 77 | 97 |
| 78 | 104 |
| 79 | 137 |
| 80 | 39 |
| 81 | 59 |
| 82 | 69 |
| 83 | 100 |
| 84 | 74 |
| 85 | 106 |
| 86 | 111 |
| 87 | 146 |
| 88 | 80 |
| 89 | 113 |
| 90 | 122 |
| 91 | 152 |
| 92 | 127 |
| 93 | 161 |
| 94 | 167 |
| 95 | 203 |
| 96 | 45 |
| 97 | 72 |
| 98 | 79 |
| 99 | 110 |
| 100 | 87 |
| 101 | 116 |
| 102 | 124 |
| 103 | 159 |
| 104 | 92 |
| 105 | 125 |
| 106 | 133 |
| 107 | 163 |
| 108 | 138 |
| 109 | 171 |
| 110 | 177 |
| 111 | 207 |
| 112 | 102 |
| 113 | 135 |
| 114 | 144 |
| 115 | 173 |
| 116 | 148 |
| 117 | 178 |
| 118 | 184 |
| 119 | 213 |
| 120 | 155 |
| 121 | 186 |
| 122 | 191 |
| 123 | 218 |
| 124 | 196 |
| 125 | 222 |
| 126 | 227 |
| 127 | 243 |
| 128 | 15 |
| 129 | 24 |
| 130 | 29 |
| 131 | 58 |
| 132 | 36 |
| 133 | 63 |
| 134 | 66 |
| 135 | 103 |
| 136 | 43 |
| 137 | 68 |
| 138 | 75 |
| 139 | 109 |
| 140 | 81 |
| 141 | 115 |
| 142 | 119 |
| 143 | 158 |
| 144 | 48 |
| 145 | 76 |

-continued

Table Z13, having a sequence length of 256:

| Polarized channel sequence number | Reliability or sequence number of reliability |
|---|---|
| 146 | 83 |
| 147 | 117 |
| 148 | 89 |
| 149 | 123 |
| 150 | 130 |
| 151 | 165 |
| 152 | 96 |
| 153 | 131 |
| 154 | 136 |
| 155 | 169 |
| 156 | 145 |
| 157 | 176 |
| 158 | 183 |
| 159 | 212 |
| 160 | 54 |
| 161 | 85 |
| 162 | 93 |
| 163 | 126 |
| 164 | 98 |
| 165 | 132 |
| 166 | 140 |
| 167 | 174 |
| 168 | 108 |
| 169 | 143 |
| 170 | 149 |
| 171 | 180 |
| 172 | 154 |
| 173 | 185 |
| 174 | 190 |
| 175 | 217 |
| 176 | 118 |
| 177 | 151 |
| 178 | 160 |
| 179 | 188 |
| 180 | 164 |
| 181 | 194 |
| 182 | 198 |
| 183 | 220 |
| 184 | 172 |
| 185 | 200 |
| 186 | 205 |
| 187 | 225 |
| 188 | 209 |
| 189 | 230 |
| 190 | 235 |
| 191 | 244 |
| 192 | 55 |
| 193 | 95 |
| 194 | 105 |
| 195 | 141 |
| 196 | 114 |
| 197 | 147 |
| 198 | 153 |
| 199 | 187 |
| 200 | 121 |
| 201 | 156 |
| 202 | 162 |
| 203 | 192 |
| 204 | 168 |
| 205 | 197 |
| 206 | 202 |
| 207 | 224 |
| 208 | 129 |
| 209 | 166 |
| 210 | 170 |
| 211 | 199 |
| 212 | 179 |
| 213 | 204 |
| 214 | 208 |
| 215 | 231 |
| 216 | 182 |
| 217 | 210 |

-continued

Table Z13, having a sequence length of 256:

| Polarized channel sequence number | Reliability or sequence number of reliability |
|---|---|
| 218 | 214 |
| 219 | 232 |
| 220 | 219 |
| 221 | 236 |
| 222 | 238 |
| 223 | 249 |
| 224 | 139 |
| 225 | 175 |
| 226 | 181 |
| 227 | 206 |
| 228 | 189 |
| 229 | 211 |
| 230 | 215 |
| 231 | 233 |
| 232 | 195 |
| 233 | 216 |
| 234 | 221 |
| 235 | 237 |
| 236 | 226 |
| 237 | 239 |
| 238 | 241 |
| 239 | 250 |
| 240 | 201 |
| 241 | 223 |
| 242 | 228 |
| 243 | 240 |
| 244 | 229 |
| 245 | 242 |
| 246 | 245 |
| 247 | 252 |
| 248 | 234 |
| 249 | 246 |
| 250 | 247 |
| 251 | 251 |
| 252 | 248 |
| 253 | 253 |
| 254 | 254 |
| 255 | 255 |

Sequence Z14, having a sequence length of 128:

[0, 1, 2, 7, 3, 8, 11, 22, 4, 10, 13, 24, 15, 28, 30, 53, 5, 12, 14, 27, 18, 32, 38, 55, 20, 37, 34, 59, 43, 63, 67, 89, 6, 16, 19, 33, 21, 36, 39, 61, 25, 42, 45, 64, 49, 69, 72, 94, 29, 46, 51, 71, 54, 75, 77, 96, 58, 79, 83, 100, 86, 104, 107, 119, 9, 17, 23, 41, 26, 44, 48, 68, 31, 52, 47, 73, 56, 76, 81, 98, 35, 50, 57, 78, 62, 82, 85, 102, 66, 87, 90, 105, 93, 109, 111, 121, 40, 60, 65, 84, 70, 88, 91, 108, 74, 92, 95, 110, 99, 112, 114, 122, 80, 97, 101, 113, 103, 115, 116, 123, 106, 117, 118, 124, 120, 125, 126, 127]

Table Z14, having a sequence length of 128:

| Polarized channel sequence number | Reliability or sequence number of reliability |
|---|---|
| 0 | 0 |
| 1 | 1 |
| 2 | 2 |
| 3 | 7 |
| 4 | 3 |
| 5 | 8 |
| 6 | 11 |
| 7 | 22 |
| 8 | 4 |
| 9 | 10 |
| 10 | 13 |

-continued

Table Z14, having a sequence length of 128:

| Polarized channel sequence number | Reliability or sequence number of reliability |
|---|---|
| 11 | 24 |
| 12 | 15 |
| 13 | 28 |
| 14 | 30 |
| 15 | 53 |
| 16 | 5 |
| 17 | 12 |
| 18 | 14 |
| 19 | 27 |
| 20 | 18 |
| 21 | 32 |
| 22 | 38 |
| 23 | 55 |
| 24 | 20 |
| 25 | 37 |
| 26 | 34 |
| 27 | 59 |
| 28 | 43 |
| 29 | 63 |
| 30 | 67 |
| 31 | 89 |
| 32 | 6 |
| 33 | 16 |
| 34 | 19 |
| 35 | 33 |
| 36 | 21 |
| 37 | 36 |
| 38 | 39 |
| 39 | 61 |
| 40 | 25 |
| 41 | 42 |
| 42 | 45 |
| 43 | 64 |
| 44 | 49 |
| 45 | 69 |
| 46 | 72 |
| 47 | 94 |
| 48 | 29 |
| 49 | 46 |
| 50 | 51 |
| 51 | 71 |
| 52 | 54 |
| 53 | 75 |
| 54 | 77 |
| 55 | 96 |
| 56 | 58 |
| 57 | 79 |
| 58 | 83 |
| 59 | 100 |
| 60 | 86 |
| 61 | 104 |
| 62 | 107 |
| 63 | 119 |
| 64 | 9 |
| 65 | 17 |
| 66 | 23 |
| 67 | 41 |
| 68 | 26 |
| 69 | 44 |
| 70 | 48 |
| 71 | 68 |
| 72 | 31 |
| 73 | 52 |
| 74 | 47 |
| 75 | 73 |
| 76 | 56 |
| 77 | 76 |
| 78 | 81 |
| 79 | 98 |
| 80 | 35 |
| 81 | 50 |
| 82 | 57 |
| 83 | 78 |
| 84 | 62 |
| 85 | 82 |
| 86 | 85 |
| 87 | 102 |
| 88 | 66 |
| 89 | 87 |
| 90 | 90 |
| 91 | 105 |
| 92 | 93 |
| 93 | 109 |
| 94 | 111 |
| 95 | 121 |
| 96 | 40 |
| 97 | 60 |
| 98 | 65 |
| 99 | 84 |
| 100 | 70 |
| 101 | 88 |
| 102 | 91 |
| 103 | 108 |
| 104 | 74 |
| 105 | 92 |
| 106 | 95 |
| 107 | 110 |
| 108 | 99 |
| 109 | 112 |
| 110 | 114 |
| 111 | 122 |
| 112 | 80 |
| 113 | 97 |
| 114 | 101 |
| 115 | 113 |
| 116 | 103 |
| 117 | 115 |
| 118 | 116 |
| 119 | 123 |
| 120 | 106 |
| 121 | 117 |
| 122 | 118 |
| 123 | 124 |
| 124 | 120 |
| 125 | 125 |
| 126 | 126 |
| 127 | 127 |

Sequence Z15, having a sequence length of 64:

[0, 1, 2, 7, 3, 8, 10, 20, 4, 9, 12, 21, 14, 24, 26, 40, 5, 11, 13, 23, 16, 27, 32, 42, 18, 31, 29, 44, 35, 46, 48, 57, 6, 15, 17, 28, 19, 30, 33, 45, 22, 34, 36, 47, 38, 49, 51, 58, 25, 37, 39, 50, 41, 52, 53, 59, 43, 54, 55, 60, 56, 61, 62, 63]

Table Z15, having a sequence length of 64:

| Polarized channel sequence number | Reliability or sequence number of reliability |
|---|---|
| 0 | 0 |
| 1 | 1 |
| 2 | 2 |
| 3 | 7 |
| 4 | 3 |
| 5 | 8 |
| 6 | 10 |
| 7 | 20 |
| 8 | 4 |
| 9 | 9 |
| 10 | 12 |
| 11 | 21 |

-continued

| Table Z15, having a sequence length of 64: | |
|---|---|
| Polarized channel sequence number | Reliability or sequence number of reliability |
| 12 | 14 |
| 13 | 24 |
| 14 | 26 |
| 15 | 40 |
| 16 | 5 |
| 17 | 11 |
| 18 | 13 |
| 19 | 23 |
| 20 | 16 |
| 21 | 27 |
| 22 | 32 |
| 23 | 42 |
| 24 | 18 |
| 25 | 31 |
| 26 | 29 |
| 27 | 44 |
| 28 | 35 |
| 29 | 46 |
| 30 | 48 |
| 31 | 57 |
| 32 | 6 |
| 33 | 15 |
| 34 | 17 |
| 35 | 28 |
| 36 | 19 |
| 37 | 30 |
| 38 | 33 |
| 39 | 45 |
| 40 | 22 |
| 41 | 34 |
| 42 | 36 |
| 43 | 47 |
| 44 | 38 |
| 45 | 49 |
| 46 | 51 |
| 47 | 58 |
| 48 | 25 |
| 49 | 37 |
| 50 | 39 |
| 51 | 50 |
| 52 | 41 |
| 53 | 52 |
| 54 | 53 |
| 55 | 59 |
| 56 | 43 |
| 57 | 54 |
| 58 | 55 |
| 59 | 60 |
| 60 | 56 |
| 61 | 61 |
| 62 | 62 |
| 63 | 63 |

Fourth group of sequences (a criterion that considers a performance balance under partial-order (partial-order) constraints).

Sequence Q16, having a sequence length of 1024:

[0, 1, 2, 4, 8, 16, 32, 3, 5, 64, 9, 6, 17, 10, 18, 128, 12, 33, 65, 20, 256, 34, 24, 36, 7, 129, 66, 512, 11, 40, 68, 130, 19, 13, 48, 14, 72, 257, 21, 132, 35, 258, 22, 80, 136, 513, 25, 37, 260, 264, 26, 96, 514, 38, 67, 41, 144, 28, 69, 516, 42, 272, 49, 70, 520, 160, 44, 131, 73, 288, 528, 192, 50, 74, 544, 52, 15, 133, 320, 81, 23, 134, 384, 76, 56, 259, 82, 137, 27, 97, 39, 84, 138, 145, 261, 29, 43, 98, 515, 88, 140, 30, 146, 71, 262, 265, 161, 576, 45, 100, 640, 51, 148, 46, 75, 266, 273, 517, 104, 162, 53, 193, 152, 77, 164, 768, 268, 274, 518, 54, 83, 57, 521, 112, 135, 78, 289, 194, 85, 276, 522, 58, 168, 139, 99, 86, 60, 280, 89, 290, 529, 524, 196, 141, 101, 147, 176, 142, 530, 321, 90, 200, 31, 545, 292, 322, 532, 263, 149, 102, 105, 296, 304, 163, 92, 47, 267, 150, 208, 385, 546, 386, 324, 106, 153, 165, 55, 328, 536, 577, 548, 113, 154, 79, 269, 108, 578, 224, 166, 519, 552, 195, 270, 641, 523, 275, 580, 291, 169, 59, 560, 114, 277, 156, 87, 197, 116, 170, 61, 531, 525, 642, 281, 278, 526, 177, 293, 388, 91, 584, 769, 198, 172, 120, 201, 336, 62, 282, 143, 103, 178, 294, 93, 644, 202, 592, 323, 392, 297, 770, 107, 180, 151, 209, 284, 648, 94, 204, 298, 400, 352, 608, 325, 533, 155, 210, 305, 547, 300, 109, 184, 115, 534, 167, 225, 537, 326, 306, 772, 157, 656, 329, 110, 117, 212, 171, 330, 226, 549, 776, 538, 387, 308, 216, 416, 271, 279, 158, 337, 550, 672, 118, 332, 579, 540, 389, 173, 121, 553, 199, 784, 179, 228, 338, 390, 122, 554, 448, 312, 581, 393, 283, 704, 174, 394, 181, 340, 203, 353, 561, 527, 582, 556, 63, 295, 285, 232, 124, 286, 562, 205, 182, 643, 585, 299, 354, 211, 401, 185, 396, 344, 586, 645, 593, 535, 240, 206, 95, 327, 564, 800, 402, 356, 307, 301, 417, 213, 186, 539, 404, 227, 594, 568, 771, 418, 649, 302, 832, 551, 111, 896, 360, 588, 609, 331, 214, 309, 188, 449, 217, 646, 408, 229, 541, 159, 420, 596, 650, 773, 310, 333, 119, 657, 658, 610, 368, 339, 391, 313, 218, 334, 542, 230, 233, 774, 612, 175, 123, 652, 600, 450, 583, 341, 220, 555, 314, 557, 424, 395, 777, 673, 355, 287, 183, 234, 125, 616, 342, 563, 778, 660, 558, 452, 674, 397, 785, 432, 316, 345, 241, 207, 403, 357, 187, 587, 565, 664, 624, 780, 236, 126, 242, 398, 705, 346, 456, 358, 405, 303, 569, 189, 595, 215, 566, 676, 361, 706, 589, 244, 786, 647, 348, 419, 406, 464, 801, 590, 362, 570, 409, 680, 597, 788, 572, 219, 311, 708, 598, 601, 651, 421, 792, 802, 611, 602, 369, 190, 688, 653, 248, 231, 410, 364, 654, 659, 335, 480, 315, 221, 613, 422, 370, 425, 235, 451, 543, 614, 412, 343, 222, 775, 317, 372, 426, 453, 237, 559, 833, 804, 712, 834, 661, 808, 779, 617, 604, 433, 720, 816, 836, 347, 897, 243, 662, 454, 318, 675, 618, 898, 781, 376, 428, 665, 736, 567, 840, 625, 238, 359, 457, 399, 787, 677, 434, 349, 458, 678, 245, 666, 363, 591, 127, 620, 407, 782, 436, 465, 626, 571, 246, 681, 350, 707, 460, 599, 668, 789, 249, 411, 682, 573, 365, 803, 790, 709, 440, 466, 793, 574, 371, 423, 689, 603, 366, 628, 250, 413, 468, 655, 481, 900, 805, 191, 373, 615, 684, 427, 710, 794, 605, 414, 252, 713, 374, 848, 690, 632, 806, 482, 429, 904, 809, 455, 223, 663, 835, 692, 619, 472, 714, 796, 721, 837, 716, 864, 810, 606, 912, 722, 696, 377, 817, 435, 484, 621, 812, 319, 430, 838, 667, 239, 378, 459, 437, 622, 627, 488, 380, 818, 461, 496, 669, 679, 724, 841, 629, 351, 467, 438, 737, 247, 462, 441, 442, 469, 251, 683, 842, 738, 899, 670, 783, 849, 820, 728, 928, 791, 367, 901, 630, 685, 844, 633, 711, 253, 691, 824, 902, 686, 740, 850, 375, 444, 470, 483, 905, 415, 485, 795, 473, 634, 744, 852, 960, 865, 693, 797, 906, 715, 807, 474, 636, 694, 254, 717, 575, 811, 697, 866, 798, 379, 431, 913, 607, 489, 723, 486, 908, 718, 813, 476, 856, 839, 725, 698, 914, 752, 868, 819, 814, 439, 929, 490, 623, 671, 739, 916, 463, 843, 381, 497, 930, 821, 726, 961, 872, 492, 631, 729, 700, 443, 741, 845, 920, 382, 822, 851, 730, 498, 880, 742, 445, 471, 635, 932, 687, 903, 825, 500, 846, 745, 826, 732, 446, 962, 936, 475, 853, 867, 637, 907, 487, 695, 746, 828, 753, 854, 857, 504, 799, 909, 719, 638, 915, 477, 255, 964, 699, 748, 869, 944, 491, 754, 910, 858, 917, 478, 968, 870, 815, 383, 727, 493, 873, 701, 931, 756, 860, 499, 731, 823, 702, 918, 921, 874, 494, 976, 760, 933, 881, 501, 743, 922, 876, 847, 934, 827, 733, 882, 502, 447, 992, 937, 963, 747, 505, 855, 924, 734, 829, 938, 884, 506, 965, 749, 945, 966, 755, 859, 940, 830, 911, 871, 888, 479, 946, 750, 969, 861, 757, 970, 919, 875, 758, 508, 862, 639, 948, 977, 923, 972, 761, 877, 952, 495, 703, 935, 978, 883, 762, 503, 925, 878, 735, 993, 885, 939, 994, 980, 926, 764, 941, 967, 886, 831, 947, 507, 889, 984, 751, 942, 996, 971, 890, 509, 949, 973, 1000, 892, 950, 863, 759, 1008, 510, 979, 953, 763, 974, 954, 879, 981, 982, 927, 995, 765, 956, 887, 985, 997, 986, 943, 891, 998, 766, 511, 988, 1001, 951, 1002, 893, 975, 894, 1009, 955, 1004, 1010, 957, 983, 958, 987, 1012, 999, 1016, 767, 989, 1003, 990, 1005, 895, 1011, 1013, 959, 1006, 1014, 1017, 1018, 991, 1020, 1007, 1015, 1019, 1021, 1022, 1023]

Table Q16, having a sequence length of 1024:

| Reliability or sequence number of reliability | Polarized channel sequence number |
|---|---|
| 0 | 0 |
| 1 | 1 |
| 2 | 2 |
| 3 | 4 |
| 4 | 8 |
| 5 | 16 |
| 6 | 32 |
| 7 | 3 |
| 8 | 5 |
| 9 | 64 |
| 10 | 9 |
| 11 | 6 |
| 12 | 17 |
| 13 | 10 |
| 14 | 18 |
| 15 | 128 |
| 16 | 12 |
| 17 | 33 |
| 18 | 65 |
| 19 | 20 |
| 20 | 256 |
| 21 | 34 |
| 22 | 24 |
| 23 | 36 |
| 24 | 7 |
| 25 | 129 |
| 26 | 66 |
| 27 | 512 |
| 28 | 11 |
| 29 | 40 |
| 30 | 68 |
| 31 | 130 |
| 32 | 19 |
| 33 | 13 |
| 34 | 48 |
| 35 | 14 |
| 36 | 72 |
| 37 | 257 |
| 38 | 21 |
| 39 | 132 |
| 40 | 35 |
| 41 | 258 |
| 42 | 22 |
| 43 | 80 |
| 44 | 136 |
| 45 | 513 |
| 46 | 25 |
| 47 | 37 |
| 48 | 260 |
| 49 | 264 |
| 50 | 26 |
| 51 | 96 |
| 52 | 514 |
| 53 | 38 |
| 54 | 67 |
| 55 | 41 |
| 56 | 144 |
| 57 | 28 |
| 58 | 69 |
| 59 | 516 |
| 60 | 42 |
| 61 | 272 |
| 62 | 49 |
| 63 | 70 |
| 64 | 520 |
| 65 | 160 |
| 66 | 44 |
| 67 | 131 |
| 68 | 73 |
| 69 | 288 |

-continued

Table Q16, having a sequence length of 1024:

| Reliability or sequence number of reliability | Polarized channel sequence number |
|---|---|
| 70 | 528 |
| 71 | 192 |
| 72 | 50 |
| 73 | 74 |
| 74 | 544 |
| 75 | 52 |
| 76 | 15 |
| 77 | 133 |
| 78 | 320 |
| 79 | 81 |
| 80 | 23 |
| 81 | 134 |
| 82 | 384 |
| 83 | 76 |
| 84 | 56 |
| 85 | 259 |
| 86 | 82 |
| 87 | 137 |
| 88 | 27 |
| 89 | 97 |
| 90 | 39 |
| 91 | 84 |
| 92 | 138 |
| 93 | 145 |
| 94 | 261 |
| 95 | 29 |
| 96 | 43 |
| 97 | 98 |
| 98 | 515 |
| 99 | 88 |
| 100 | 140 |
| 101 | 30 |
| 102 | 146 |
| 103 | 71 |
| 104 | 262 |
| 105 | 265 |
| 106 | 161 |
| 107 | 576 |
| 108 | 45 |
| 109 | 100 |
| 110 | 640 |
| 111 | 51 |
| 112 | 148 |
| 113 | 46 |
| 114 | 75 |
| 115 | 266 |
| 116 | 273 |
| 117 | 517 |
| 118 | 104 |
| 119 | 162 |
| 120 | 53 |
| 121 | 193 |
| 122 | 152 |
| 123 | 77 |
| 124 | 164 |
| 125 | 768 |
| 126 | 268 |
| 127 | 274 |
| 128 | 518 |
| 129 | 54 |
| 130 | 83 |
| 131 | 57 |
| 132 | 521 |
| 133 | 112 |
| 134 | 135 |
| 135 | 78 |
| 136 | 289 |
| 137 | 194 |
| 138 | 85 |
| 139 | 276 |
| 140 | 522 |
| 141 | 58 |
| 142 | 168 |
| 143 | 139 |

-continued

Table Q16, having a sequence length of 1024:

| Reliability or sequence number of reliability | Polarized channel sequence number |
|---|---|
| 144 | 99 |
| 145 | 86 |
| 146 | 60 |
| 147 | 280 |
| 148 | 89 |
| 149 | 290 |
| 150 | 529 |
| 151 | 524 |
| 152 | 196 |
| 153 | 141 |
| 154 | 101 |
| 155 | 147 |
| 156 | 176 |
| 157 | 142 |
| 158 | 530 |
| 159 | 321 |
| 160 | 90 |
| 161 | 200 |
| 162 | 31 |
| 163 | 545 |
| 164 | 292 |
| 165 | 322 |
| 166 | 532 |
| 167 | 263 |
| 168 | 149 |
| 169 | 102 |
| 170 | 105 |
| 171 | 296 |
| 172 | 304 |
| 173 | 163 |
| 174 | 92 |
| 175 | 47 |
| 176 | 267 |
| 177 | 150 |
| 178 | 208 |
| 179 | 385 |
| 180 | 546 |
| 181 | 386 |
| 182 | 324 |
| 183 | 106 |
| 184 | 153 |
| 185 | 165 |
| 186 | 55 |
| 187 | 328 |
| 188 | 536 |
| 189 | 577 |
| 190 | 548 |
| 191 | 113 |
| 192 | 154 |
| 193 | 79 |
| 194 | 269 |
| 195 | 108 |
| 196 | 578 |
| 197 | 224 |
| 198 | 166 |
| 199 | 519 |
| 200 | 552 |
| 201 | 195 |
| 202 | 270 |
| 203 | 641 |
| 204 | 523 |
| 205 | 275 |
| 206 | 580 |
| 207 | 291 |
| 208 | 169 |
| 209 | 59 |
| 210 | 560 |
| 211 | 114 |
| 212 | 277 |
| 213 | 156 |
| 214 | 87 |
| 215 | 197 |
| 216 | 116 |
| 217 | 170 |

-continued

Table Q16, having a sequence length of 1024:

| Reliability or sequence number of reliability | Polarized channel sequence number |
|---|---|
| 218 | 61 |
| 219 | 531 |
| 220 | 525 |
| 221 | 642 |
| 222 | 281 |
| 223 | 278 |
| 224 | 526 |
| 225 | 177 |
| 226 | 293 |
| 227 | 388 |
| 228 | 91 |
| 229 | 584 |
| 230 | 769 |
| 231 | 198 |
| 232 | 172 |
| 233 | 120 |
| 234 | 201 |
| 235 | 336 |
| 236 | 62 |
| 237 | 282 |
| 238 | 143 |
| 239 | 103 |
| 240 | 178 |
| 241 | 294 |
| 242 | 93 |
| 243 | 644 |
| 244 | 202 |
| 245 | 592 |
| 246 | 323 |
| 247 | 392 |
| 248 | 297 |
| 249 | 770 |
| 250 | 107 |
| 251 | 180 |
| 252 | 151 |
| 253 | 209 |
| 254 | 284 |
| 255 | 648 |
| 256 | 94 |
| 257 | 204 |
| 258 | 298 |
| 259 | 400 |
| 260 | 352 |
| 261 | 608 |
| 262 | 325 |
| 263 | 533 |
| 264 | 155 |
| 265 | 210 |
| 266 | 305 |
| 267 | 547 |
| 268 | 300 |
| 269 | 109 |
| 270 | 184 |
| 271 | 115 |
| 272 | 534 |
| 273 | 167 |
| 274 | 225 |
| 275 | 537 |
| 276 | 326 |
| 277 | 306 |
| 278 | 772 |
| 279 | 157 |
| 280 | 656 |
| 281 | 329 |
| 282 | 110 |
| 283 | 117 |
| 284 | 212 |
| 285 | 171 |
| 286 | 330 |
| 287 | 226 |
| 288 | 549 |
| 289 | 776 |
| 290 | 538 |
| 291 | 387 |

-continued

Table Q16, having a sequence length of 1024:

| Reliability or sequence number of reliability | Polarized channel sequence number |
|---|---|
| 292 | 308 |
| 293 | 216 |
| 294 | 416 |
| 295 | 271 |
| 296 | 279 |
| 297 | 158 |
| 298 | 337 |
| 299 | 550 |
| 300 | 672 |
| 301 | 118 |
| 302 | 332 |
| 303 | 579 |
| 304 | 540 |
| 305 | 389 |
| 306 | 173 |
| 307 | 121 |
| 308 | 553 |
| 309 | 199 |
| 310 | 784 |
| 311 | 179 |
| 312 | 228 |
| 313 | 338 |
| 314 | 390 |
| 315 | 122 |
| 316 | 554 |
| 317 | 448 |
| 318 | 312 |
| 319 | 581 |
| 320 | 393 |
| 321 | 283 |
| 322 | 704 |
| 323 | 174 |
| 324 | 394 |
| 325 | 181 |
| 326 | 340 |
| 327 | 203 |
| 328 | 353 |
| 329 | 561 |
| 330 | 527 |
| 331 | 582 |
| 332 | 556 |
| 333 | 63 |
| 334 | 295 |
| 335 | 285 |
| 336 | 232 |
| 337 | 124 |
| 338 | 286 |
| 339 | 562 |
| 340 | 205 |
| 341 | 182 |
| 342 | 643 |
| 343 | 585 |
| 344 | 299 |
| 345 | 354 |
| 346 | 211 |
| 347 | 401 |
| 348 | 185 |
| 349 | 396 |
| 350 | 344 |
| 351 | 586 |
| 352 | 645 |
| 353 | 593 |
| 354 | 535 |
| 355 | 240 |
| 356 | 206 |
| 357 | 95 |
| 358 | 327 |
| 359 | 564 |
| 360 | 800 |
| 361 | 402 |
| 362 | 356 |
| 363 | 307 |
| 364 | 301 |
| 365 | 417 |

-continued

Table Q16, having a sequence length of 1024:

| Reliability or sequence number of reliability | Polarized channel sequence number |
|---|---|
| 366 | 213 |
| 367 | 186 |
| 368 | 539 |
| 369 | 404 |
| 370 | 227 |
| 371 | 594 |
| 372 | 568 |
| 373 | 771 |
| 374 | 418 |
| 375 | 649 |
| 376 | 302 |
| 377 | 832 |
| 378 | 551 |
| 379 | 111 |
| 380 | 896 |
| 381 | 360 |
| 382 | 588 |
| 383 | 609 |
| 384 | 331 |
| 385 | 214 |
| 386 | 309 |
| 387 | 188 |
| 388 | 449 |
| 389 | 217 |
| 390 | 646 |
| 391 | 408 |
| 392 | 229 |
| 393 | 541 |
| 394 | 159 |
| 395 | 420 |
| 396 | 596 |
| 397 | 650 |
| 398 | 773 |
| 399 | 310 |
| 400 | 333 |
| 401 | 119 |
| 402 | 657 |
| 403 | 658 |
| 404 | 610 |
| 405 | 368 |
| 406 | 339 |
| 407 | 391 |
| 408 | 313 |
| 409 | 218 |
| 410 | 334 |
| 411 | 542 |
| 412 | 230 |
| 413 | 233 |
| 414 | 774 |
| 415 | 612 |
| 416 | 175 |
| 417 | 123 |
| 418 | 652 |
| 419 | 600 |
| 420 | 450 |
| 421 | 583 |
| 422 | 341 |
| 423 | 220 |
| 424 | 555 |
| 425 | 314 |
| 426 | 557 |
| 427 | 424 |
| 428 | 395 |
| 429 | 777 |
| 430 | 673 |
| 431 | 355 |
| 432 | 287 |
| 433 | 183 |
| 434 | 234 |
| 435 | 125 |
| 436 | 616 |
| 437 | 342 |
| 438 | 563 |
| 439 | 778 |

-continued

Table Q16, having a sequence length of 1024:

| Reliability or sequence number of reliability | Polarized channel sequence number |
|---|---|
| 440 | 660 |
| 441 | 558 |
| 442 | 452 |
| 443 | 674 |
| 444 | 397 |
| 445 | 785 |
| 446 | 432 |
| 447 | 316 |
| 448 | 345 |
| 449 | 241 |
| 450 | 207 |
| 451 | 403 |
| 452 | 357 |
| 453 | 187 |
| 454 | 587 |
| 455 | 565 |
| 456 | 664 |
| 457 | 624 |
| 458 | 780 |
| 459 | 236 |
| 460 | 126 |
| 461 | 242 |
| 462 | 398 |
| 463 | 705 |
| 464 | 346 |
| 465 | 456 |
| 466 | 358 |
| 467 | 405 |
| 468 | 303 |
| 469 | 569 |
| 470 | 189 |
| 471 | 595 |
| 472 | 215 |
| 473 | 566 |
| 474 | 676 |
| 475 | 361 |
| 476 | 706 |
| 477 | 589 |
| 478 | 244 |
| 479 | 786 |
| 480 | 647 |
| 481 | 348 |
| 482 | 419 |
| 483 | 406 |
| 484 | 464 |
| 485 | 801 |
| 486 | 590 |
| 487 | 362 |
| 488 | 570 |
| 489 | 409 |
| 490 | 680 |
| 491 | 597 |
| 492 | 788 |
| 493 | 572 |
| 494 | 219 |
| 495 | 311 |
| 496 | 708 |
| 497 | 598 |
| 498 | 601 |
| 499 | 651 |
| 500 | 421 |
| 501 | 792 |
| 502 | 802 |
| 503 | 611 |
| 504 | 602 |
| 505 | 369 |
| 506 | 190 |
| 507 | 688 |
| 508 | 653 |
| 509 | 248 |
| 510 | 231 |
| 511 | 410 |
| 512 | 364 |
| 513 | 654 |

-continued

Table Q16, having a sequence length of 1024:

| Reliability or sequence number of reliability | Polarized channel sequence number |
|---|---|
| 514 | 659 |
| 515 | 335 |
| 516 | 480 |
| 517 | 315 |
| 518 | 221 |
| 519 | 613 |
| 520 | 422 |
| 521 | 370 |
| 522 | 425 |
| 523 | 235 |
| 524 | 451 |
| 525 | 543 |
| 526 | 614 |
| 527 | 412 |
| 528 | 343 |
| 529 | 222 |
| 530 | 775 |
| 531 | 317 |
| 532 | 372 |
| 533 | 426 |
| 534 | 453 |
| 535 | 237 |
| 536 | 559 |
| 537 | 833 |
| 538 | 804 |
| 539 | 712 |
| 540 | 834 |
| 541 | 661 |
| 542 | 808 |
| 543 | 779 |
| 544 | 617 |
| 545 | 604 |
| 546 | 433 |
| 547 | 720 |
| 548 | 816 |
| 549 | 836 |
| 550 | 347 |
| 551 | 897 |
| 552 | 243 |
| 553 | 662 |
| 554 | 454 |
| 555 | 318 |
| 556 | 675 |
| 557 | 618 |
| 558 | 898 |
| 559 | 781 |
| 560 | 376 |
| 561 | 428 |
| 562 | 665 |
| 563 | 736 |
| 564 | 567 |
| 565 | 840 |
| 566 | 625 |
| 567 | 238 |
| 568 | 359 |
| 569 | 457 |
| 570 | 399 |
| 571 | 787 |
| 572 | 677 |
| 573 | 434 |
| 574 | 349 |
| 575 | 458 |
| 576 | 678 |
| 577 | 245 |
| 578 | 666 |
| 579 | 363 |
| 580 | 591 |
| 581 | 127 |
| 582 | 620 |
| 583 | 407 |
| 584 | 782 |
| 585 | 436 |
| 586 | 465 |
| 587 | 626 |

-continued

Table Q16, having a sequence length of 1024:

| Reliability or sequence number of reliability | Polarized channel sequence number |
|---|---|
| 588 | 571 |
| 589 | 246 |
| 590 | 681 |
| 591 | 350 |
| 592 | 707 |
| 593 | 460 |
| 594 | 599 |
| 595 | 668 |
| 596 | 789 |
| 597 | 249 |
| 598 | 411 |
| 599 | 682 |
| 600 | 573 |
| 601 | 365 |
| 602 | 803 |
| 603 | 790 |
| 604 | 709 |
| 605 | 440 |
| 606 | 466 |
| 607 | 793 |
| 608 | 574 |
| 609 | 371 |
| 610 | 423 |
| 611 | 689 |
| 612 | 603 |
| 613 | 366 |
| 614 | 628 |
| 615 | 250 |
| 616 | 413 |
| 617 | 468 |
| 618 | 655 |
| 619 | 481 |
| 620 | 900 |
| 621 | 805 |
| 622 | 191 |
| 623 | 373 |
| 624 | 615 |
| 625 | 684 |
| 626 | 427 |
| 627 | 710 |
| 628 | 794 |
| 629 | 605 |
| 630 | 414 |
| 631 | 252 |
| 632 | 713 |
| 633 | 374 |
| 634 | 848 |
| 635 | 690 |
| 636 | 632 |
| 637 | 806 |
| 638 | 482 |
| 639 | 429 |
| 640 | 904 |
| 641 | 809 |
| 642 | 455 |
| 643 | 223 |
| 644 | 663 |
| 645 | 835 |
| 646 | 692 |
| 647 | 619 |
| 648 | 472 |
| 649 | 714 |
| 650 | 796 |
| 651 | 721 |
| 652 | 837 |
| 653 | 716 |
| 654 | 864 |
| 655 | 810 |
| 656 | 606 |
| 657 | 912 |
| 658 | 722 |
| 659 | 696 |
| 660 | 377 |
| 661 | 817 |

-continued

Table Q16, having a sequence length of 1024:

| Reliability or sequence number of reliability | Polarized channel sequence number |
|---|---|
| 662 | 435 |
| 663 | 484 |
| 664 | 621 |
| 665 | 812 |
| 666 | 319 |
| 667 | 430 |
| 668 | 838 |
| 669 | 667 |
| 670 | 239 |
| 671 | 378 |
| 672 | 459 |
| 673 | 437 |
| 674 | 622 |
| 675 | 627 |
| 676 | 488 |
| 677 | 380 |
| 678 | 818 |
| 679 | 461 |
| 680 | 496 |
| 681 | 669 |
| 682 | 679 |
| 683 | 724 |
| 684 | 841 |
| 685 | 629 |
| 686 | 351 |
| 687 | 467 |
| 688 | 438 |
| 689 | 737 |
| 690 | 247 |
| 691 | 462 |
| 692 | 441 |
| 693 | 442 |
| 694 | 469 |
| 695 | 251 |
| 696 | 683 |
| 697 | 842 |
| 698 | 738 |
| 699 | 899 |
| 700 | 670 |
| 701 | 783 |
| 702 | 849 |
| 703 | 820 |
| 704 | 728 |
| 705 | 928 |
| 706 | 791 |
| 707 | 367 |
| 708 | 901 |
| 709 | 630 |
| 710 | 685 |
| 711 | 844 |
| 712 | 633 |
| 713 | 711 |
| 714 | 253 |
| 715 | 691 |
| 716 | 824 |
| 717 | 902 |
| 718 | 686 |
| 719 | 740 |
| 720 | 850 |
| 721 | 375 |
| 722 | 444 |
| 723 | 470 |
| 724 | 483 |
| 725 | 905 |
| 726 | 415 |
| 727 | 485 |
| 728 | 795 |
| 729 | 473 |
| 730 | 634 |
| 731 | 744 |
| 732 | 852 |
| 733 | 960 |
| 734 | 865 |
| 735 | 693 |

-continued

Table Q16, having a sequence length of 1024:

| Reliability or sequence number of reliability | Polarized channel sequence number |
|---|---|
| 736 | 797 |
| 737 | 906 |
| 738 | 715 |
| 739 | 807 |
| 740 | 474 |
| 741 | 636 |
| 742 | 694 |
| 743 | 254 |
| 744 | 717 |
| 745 | 575 |
| 746 | 811 |
| 747 | 697 |
| 748 | 866 |
| 749 | 798 |
| 750 | 379 |
| 751 | 431 |
| 752 | 913 |
| 753 | 607 |
| 754 | 489 |
| 755 | 723 |
| 756 | 486 |
| 757 | 908 |
| 758 | 718 |
| 759 | 813 |
| 760 | 476 |
| 761 | 856 |
| 762 | 839 |
| 763 | 725 |
| 764 | 698 |
| 765 | 914 |
| 766 | 752 |
| 767 | 868 |
| 768 | 819 |
| 769 | 814 |
| 770 | 439 |
| 771 | 929 |
| 772 | 490 |
| 773 | 623 |
| 774 | 671 |
| 775 | 739 |
| 776 | 916 |
| 777 | 463 |
| 778 | 843 |
| 779 | 381 |
| 780 | 497 |
| 781 | 930 |
| 782 | 821 |
| 783 | 726 |
| 784 | 961 |
| 785 | 872 |
| 786 | 492 |
| 787 | 631 |
| 788 | 729 |
| 789 | 700 |
| 790 | 443 |
| 791 | 741 |
| 792 | 845 |
| 793 | 920 |
| 794 | 382 |
| 795 | 822 |
| 796 | 851 |
| 797 | 730 |
| 798 | 498 |
| 799 | 880 |
| 800 | 742 |
| 801 | 445 |
| 802 | 471 |
| 803 | 635 |
| 804 | 932 |
| 805 | 687 |
| 806 | 903 |
| 807 | 825 |
| 808 | 500 |
| 809 | 846 |

-continued

Table Q16, having a sequence length of 1024:

| Reliability or sequence number of reliability | Polarized channel sequence number |
|---|---|
| 810 | 745 |
| 811 | 826 |
| 812 | 732 |
| 813 | 446 |
| 814 | 962 |
| 815 | 936 |
| 816 | 475 |
| 817 | 853 |
| 818 | 867 |
| 819 | 637 |
| 820 | 907 |
| 821 | 487 |
| 822 | 695 |
| 823 | 746 |
| 824 | 828 |
| 825 | 753 |
| 826 | 854 |
| 827 | 857 |
| 828 | 504 |
| 829 | 799 |
| 830 | 909 |
| 831 | 719 |
| 832 | 638 |
| 833 | 915 |
| 834 | 477 |
| 835 | 255 |
| 836 | 964 |
| 837 | 699 |
| 838 | 748 |
| 839 | 869 |
| 840 | 944 |
| 841 | 491 |
| 842 | 754 |
| 843 | 910 |
| 844 | 858 |
| 845 | 917 |
| 846 | 478 |
| 847 | 968 |
| 848 | 870 |
| 849 | 815 |
| 850 | 383 |
| 851 | 727 |
| 852 | 493 |
| 853 | 873 |
| 854 | 701 |
| 855 | 931 |
| 856 | 756 |
| 857 | 860 |
| 858 | 499 |
| 859 | 731 |
| 860 | 823 |
| 861 | 702 |
| 862 | 918 |
| 863 | 921 |
| 864 | 874 |
| 865 | 494 |
| 866 | 976 |
| 867 | 760 |
| 868 | 933 |
| 869 | 881 |
| 870 | 501 |
| 871 | 743 |
| 872 | 922 |
| 873 | 876 |
| 874 | 847 |
| 875 | 934 |
| 876 | 827 |
| 877 | 733 |
| 878 | 882 |
| 879 | 502 |
| 880 | 447 |
| 881 | 992 |
| 882 | 937 |
| 883 | 963 |

-continued

| Table Q16, having a sequence length of 1024: | |
|---|---|
| Reliability or sequence number of reliability | Polarized channel sequence number |
| 884 | 747 |
| 885 | 505 |
| 886 | 855 |
| 887 | 924 |
| 888 | 734 |
| 889 | 829 |
| 890 | 938 |
| 891 | 884 |
| 892 | 506 |
| 893 | 965 |
| 894 | 749 |
| 895 | 945 |
| 896 | 966 |
| 897 | 755 |
| 898 | 859 |
| 899 | 940 |
| 900 | 830 |
| 901 | 911 |
| 902 | 871 |
| 903 | 888 |
| 904 | 479 |
| 905 | 946 |
| 906 | 750 |
| 907 | 969 |
| 908 | 861 |
| 909 | 757 |
| 910 | 970 |
| 911 | 919 |
| 912 | 875 |
| 913 | 758 |
| 914 | 508 |
| 915 | 862 |
| 916 | 639 |
| 917 | 948 |
| 918 | 977 |
| 919 | 923 |
| 920 | 972 |
| 921 | 761 |
| 922 | 877 |
| 923 | 952 |
| 924 | 495 |
| 925 | 703 |
| 926 | 935 |
| 927 | 978 |
| 928 | 883 |
| 929 | 762 |
| 930 | 503 |
| 931 | 925 |
| 932 | 878 |
| 933 | 735 |
| 934 | 993 |
| 935 | 885 |
| 936 | 939 |
| 937 | 994 |
| 938 | 980 |
| 939 | 926 |
| 940 | 764 |
| 941 | 941 |
| 942 | 967 |
| 943 | 886 |
| 944 | 831 |
| 945 | 947 |
| 946 | 507 |
| 947 | 889 |
| 948 | 984 |
| 949 | 751 |
| 950 | 942 |
| 951 | 996 |
| 952 | 971 |
| 953 | 890 |
| 954 | 509 |
| 955 | 949 |
| 956 | 973 |
| 957 | 1000 |

-continued

| Table Q16, having a sequence length of 1024: | |
|---|---|
| Reliability or sequence number of reliability | Polarized channel sequence number |
| 958 | 892 |
| 959 | 950 |
| 960 | 863 |
| 961 | 759 |
| 962 | 1008 |
| 963 | 510 |
| 964 | 979 |
| 965 | 953 |
| 966 | 763 |
| 967 | 974 |
| 968 | 954 |
| 969 | 879 |
| 970 | 981 |
| 971 | 982 |
| 972 | 927 |
| 973 | 995 |
| 974 | 765 |
| 975 | 956 |
| 976 | 887 |
| 977 | 985 |
| 978 | 997 |
| 979 | 986 |
| 980 | 943 |
| 981 | 891 |
| 982 | 998 |
| 983 | 766 |
| 984 | 511 |
| 985 | 988 |
| 986 | 1001 |
| 987 | 951 |
| 988 | 1002 |
| 989 | 893 |
| 990 | 975 |
| 991 | 894 |
| 992 | 1009 |
| 993 | 955 |
| 994 | 1004 |
| 995 | 1010 |
| 996 | 957 |
| 997 | 983 |
| 998 | 958 |
| 999 | 987 |
| 1000 | 1012 |
| 1001 | 999 |
| 1002 | 1016 |
| 1003 | 767 |
| 1004 | 989 |
| 1005 | 1003 |
| 1006 | 990 |
| 1007 | 1005 |
| 1008 | 895 |
| 1009 | 1011 |
| 1010 | 1013 |
| 1011 | 959 |
| 1012 | 1006 |
| 1013 | 1014 |
| 1014 | 1017 |
| 1015 | 1018 |
| 1016 | 991 |
| 1017 | 1020 |
| 1018 | 1007 |
| 1019 | 1015 |
| 1020 | 1019 |
| 1021 | 1021 |
| 1022 | 1022 |
| 1023 | 1023 |

Sequence Q17, having a sequence length of 512:

[0, 1, 2, 4, 8, 16, 32, 3, 5, 64, 9, 6, 17, 10, 18, 128, 12, 33, 65, 20, 256, 34, 24, 36, 7, 129, 66, 11, 40, 68, 130, 19, 13, 48, 14, 72, 257, 21, 132, 35, 258, 22, 80, 136, 25, 37, 260, 264, 26, 96, 38, 67, 41, 144, 28, 69, 42, 272, 49, 70, 160, 44, 131, 73, 288, 192, 50, 74, 52, 15, 133, 320, 81, 23, 134, 384, 76, 56, 259, 82, 137, 27, 97, 39, 84, 138, 145, 261, 29, 43, 98, 88, 140, 30, 146, 71, 262, 265, 161, 45, 100, 51, 148, 46, 75, 266, 273, 104, 162, 53, 193, 152, 77, 164, 268, 274, 54, 83, 57, 112, 135, 78, 289, 194, 85, 276, 58, 168, 139, 99, 86, 60, 280, 89, 290, 196, 141, 101, 147, 176, 142, 321, 90, 200, 31, 292, 322, 263, 149, 102, 105, 296, 304, 163, 92, 47, 267, 150, 208, 385, 386, 324, 106, 153, 165, 55, 328, 113, 154, 79, 269, 108, 224, 166, 195, 270, 275, 291, 169, 59, 114, 277, 156, 87, 197, 116, 170, 61, 281, 278, 177, 293, 388, 91, 198, 172, 120, 201, 336, 62, 282, 143, 103, 178, 294, 93, 202, 323, 392, 297, 107, 180, 151, 209, 284, 94, 204, 298, 400, 352, 325, 155, 210, 305, 300, 109, 184, 115, 167, 225, 326, 306, 157, 329, 110, 117, 212, 171, 330, 226, 387, 308, 216, 416, 271, 279, 158, 337, 118, 332, 389, 173, 121, 199, 179, 228, 338, 390, 122, 448, 312, 393, 283, 174, 394, 181, 340, 203, 353, 63, 295, 285, 232, 124, 286, 205, 182, 299, 354, 211, 401, 185, 396, 344, 240, 206, 95, 327, 402, 356, 307, 301, 417, 213, 186, 404, 227, 418, 302, 111, 360, 331, 214, 309, 188, 449, 217, 408, 229, 159, 420, 310, 333, 119, 368, 339, 391, 313, 218, 334, 230, 233, 175, 123, 450, 341, 220, 314, 424, 395, 355, 287, 183, 234, 125, 342, 452, 397, 432, 316, 345, 241, 207, 403, 357, 187, 236, 126, 242, 398, 346, 456, 358, 405, 303, 189, 215, 361, 244, 348, 419, 406, 464, 362, 409, 219, 311, 421, 369, 190, 248, 231, 410, 364, 335, 480, 315, 221, 422, 370, 425, 235, 451, 412, 343, 222, 317, 372, 426, 453, 237, 433, 347, 243, 454, 318, 376, 428, 238, 359, 457, 399, 434, 349, 458, 245, 363, 127, 407, 436, 465, 246, 350, 460, 249, 411, 365, 440, 466, 371, 423, 366, 250, 413, 468, 481, 191, 373, 427, 414, 252, 374, 482, 429, 455, 223, 472, 377, 435, 484, 319, 430, 239, 378, 459, 437, 488, 380, 461, 496, 351, 467, 438, 247, 462, 441, 442, 469, 251, 367, 253, 375, 444, 470, 483, 415, 485, 473, 474, 254, 379, 431, 489, 486, 476, 439, 490, 463, 381, 497, 492, 443, 382, 498, 445, 471, 500, 446, 475, 487, 504, 477, 255, 491, 478, 383, 493, 499, 494, 501, 502, 447, 505, 506, 479, 508, 495, 503, 507, 509, 510, 511]

Table Q17, having a sequence length of 512:

| Reliability or sequence number of reliability | Polarized channel sequence number |
|---|---|
| 0 | 0 |
| 1 | 1 |
| 2 | 2 |
| 3 | 4 |
| 4 | 8 |
| 5 | 16 |
| 6 | 32 |
| 7 | 3 |
| 8 | 5 |
| 9 | 64 |
| 10 | 9 |
| 11 | 6 |
| 12 | 17 |
| 13 | 10 |
| 14 | 18 |
| 15 | 128 |
| 16 | 12 |
| 17 | 33 |
| 18 | 65 |
| 19 | 20 |
| 20 | 256 |
| 21 | 34 |
| 22 | 24 |
| 23 | 36 |
| 24 | 7 |
| 25 | 129 |
| 26 | 66 |
| 27 | 11 |
| 28 | 40 |
| 29 | 68 |
| 30 | 130 |

-continued

Table Q17, having a sequence length of 512:

| Reliability or sequence number of reliability | Polarized channel sequence number |
|---|---|
| 31 | 19 |
| 32 | 13 |
| 33 | 48 |
| 34 | 14 |
| 35 | 72 |
| 36 | 257 |
| 37 | 21 |
| 38 | 132 |
| 39 | 35 |
| 40 | 258 |
| 41 | 22 |
| 42 | 80 |
| 43 | 136 |
| 44 | 25 |
| 45 | 37 |
| 46 | 260 |
| 47 | 264 |
| 48 | 26 |
| 49 | 96 |
| 50 | 38 |
| 51 | 67 |
| 52 | 41 |
| 53 | 144 |
| 54 | 28 |
| 55 | 69 |
| 56 | 42 |
| 57 | 272 |
| 58 | 49 |
| 59 | 70 |
| 60 | 160 |
| 61 | 44 |
| 62 | 131 |
| 63 | 73 |
| 64 | 288 |
| 65 | 192 |
| 66 | 50 |
| 67 | 74 |
| 68 | 52 |
| 69 | 15 |
| 70 | 133 |
| 71 | 320 |
| 72 | 81 |
| 73 | 23 |
| 74 | 134 |
| 75 | 384 |
| 76 | 76 |
| 77 | 56 |
| 78 | 259 |
| 79 | 82 |
| 80 | 137 |
| 81 | 27 |
| 82 | 97 |
| 83 | 39 |
| 84 | 84 |
| 85 | 138 |
| 86 | 145 |
| 87 | 261 |
| 88 | 29 |
| 89 | 43 |
| 90 | 98 |
| 91 | 88 |
| 92 | 140 |
| 93 | 30 |
| 94 | 146 |
| 95 | 71 |
| 96 | 262 |
| 97 | 265 |
| 98 | 161 |
| 99 | 45 |
| 100 | 100 |
| 101 | 51 |
| 102 | 148 |
| 103 | 46 |
| 104 | 75 |

-continued

| Table Q17, having a sequence length of 512: | |
|---|---|
| Reliability or sequence number of reliability | Polarized channel sequence number |
| 105 | 266 |
| 106 | 273 |
| 107 | 104 |
| 108 | 162 |
| 109 | 53 |
| 110 | 193 |
| 111 | 152 |
| 112 | 77 |
| 113 | 164 |
| 114 | 268 |
| 115 | 274 |
| 116 | 54 |
| 117 | 83 |
| 118 | 57 |
| 119 | 112 |
| 120 | 135 |
| 121 | 78 |
| 122 | 289 |
| 123 | 194 |
| 124 | 85 |
| 125 | 276 |
| 126 | 58 |
| 127 | 168 |
| 128 | 139 |
| 129 | 99 |
| 130 | 86 |
| 131 | 60 |
| 132 | 280 |
| 133 | 89 |
| 134 | 290 |
| 135 | 196 |
| 136 | 141 |
| 137 | 101 |
| 138 | 147 |
| 139 | 176 |
| 140 | 142 |
| 141 | 321 |
| 142 | 90 |
| 143 | 200 |
| 144 | 31 |
| 145 | 292 |
| 146 | 322 |
| 147 | 263 |
| 148 | 149 |
| 149 | 102 |
| 150 | 105 |
| 151 | 296 |
| 152 | 304 |
| 153 | 163 |
| 154 | 92 |
| 155 | 47 |
| 156 | 267 |
| 157 | 150 |
| 158 | 208 |
| 159 | 385 |
| 160 | 386 |
| 161 | 324 |
| 162 | 106 |
| 163 | 153 |
| 164 | 165 |
| 165 | 55 |
| 166 | 328 |
| 167 | 113 |
| 168 | 154 |
| 169 | 79 |
| 170 | 269 |
| 171 | 108 |
| 172 | 224 |
| 173 | 166 |
| 174 | 195 |
| 175 | 270 |
| 176 | 275 |
| 177 | 291 |
| 178 | 169 |

-continued

| Table Q17, having a sequence length of 512: | |
|---|---|
| Reliability or sequence number of reliability | Polarized channel sequence number |
| 179 | 59 |
| 180 | 114 |
| 181 | 277 |
| 182 | 156 |
| 183 | 87 |
| 184 | 197 |
| 185 | 116 |
| 186 | 170 |
| 187 | 61 |
| 188 | 281 |
| 189 | 278 |
| 190 | 177 |
| 191 | 293 |
| 192 | 388 |
| 193 | 91 |
| 194 | 198 |
| 195 | 172 |
| 196 | 120 |
| 197 | 201 |
| 198 | 336 |
| 199 | 62 |
| 200 | 282 |
| 201 | 143 |
| 202 | 103 |
| 203 | 178 |
| 204 | 294 |
| 205 | 93 |
| 206 | 202 |
| 207 | 323 |
| 208 | 392 |
| 209 | 297 |
| 210 | 107 |
| 211 | 180 |
| 212 | 151 |
| 213 | 209 |
| 214 | 284 |
| 215 | 94 |
| 216 | 204 |
| 217 | 298 |
| 218 | 400 |
| 219 | 352 |
| 220 | 325 |
| 221 | 155 |
| 222 | 210 |
| 223 | 305 |
| 224 | 300 |
| 225 | 109 |
| 226 | 184 |
| 227 | 115 |
| 228 | 167 |
| 229 | 225 |
| 230 | 326 |
| 231 | 306 |
| 232 | 157 |
| 233 | 329 |
| 234 | 110 |
| 235 | 117 |
| 236 | 212 |
| 237 | 171 |
| 238 | 330 |
| 239 | 226 |
| 240 | 387 |
| 241 | 308 |
| 242 | 216 |
| 243 | 416 |
| 244 | 271 |
| 245 | 279 |
| 246 | 158 |
| 247 | 337 |
| 248 | 118 |
| 249 | 332 |
| 250 | 389 |
| 251 | 173 |
| 252 | 121 |

-continued

Table Q17, having a sequence length of 512:

| Reliability or sequence number of reliability | Polarized channel sequence number |
|---|---|
| 253 | 199 |
| 254 | 179 |
| 255 | 228 |
| 256 | 338 |
| 257 | 390 |
| 258 | 122 |
| 259 | 448 |
| 260 | 312 |
| 261 | 393 |
| 262 | 283 |
| 263 | 174 |
| 264 | 394 |
| 265 | 181 |
| 266 | 340 |
| 267 | 203 |
| 268 | 353 |
| 269 | 63 |
| 270 | 295 |
| 271 | 285 |
| 272 | 232 |
| 273 | 124 |
| 274 | 286 |
| 275 | 205 |
| 276 | 182 |
| 277 | 299 |
| 278 | 354 |
| 279 | 211 |
| 280 | 401 |
| 281 | 185 |
| 282 | 396 |
| 283 | 344 |
| 284 | 240 |
| 285 | 206 |
| 286 | 95 |
| 287 | 327 |
| 288 | 402 |
| 289 | 356 |
| 290 | 307 |
| 291 | 301 |
| 292 | 417 |
| 293 | 213 |
| 294 | 186 |
| 295 | 404 |
| 296 | 227 |
| 297 | 418 |
| 298 | 302 |
| 299 | 111 |
| 300 | 360 |
| 301 | 331 |
| 302 | 214 |
| 303 | 309 |
| 304 | 188 |
| 305 | 449 |
| 306 | 217 |
| 307 | 408 |
| 308 | 229 |
| 309 | 159 |
| 310 | 420 |
| 311 | 310 |
| 312 | 333 |
| 313 | 119 |
| 314 | 368 |
| 315 | 339 |
| 316 | 391 |
| 317 | 313 |
| 318 | 218 |
| 319 | 334 |
| 320 | 230 |
| 321 | 233 |
| 322 | 175 |
| 323 | 123 |
| 324 | 450 |
| 325 | 341 |
| 326 | 220 |

-continued

Table Q17, having a sequence length of 512:

| Reliability or sequence number of reliability | Polarized channel sequence number |
|---|---|
| 327 | 314 |
| 328 | 424 |
| 329 | 395 |
| 330 | 355 |
| 331 | 287 |
| 332 | 183 |
| 333 | 234 |
| 334 | 125 |
| 335 | 342 |
| 336 | 452 |
| 337 | 397 |
| 338 | 432 |
| 339 | 316 |
| 340 | 345 |
| 341 | 241 |
| 342 | 207 |
| 343 | 403 |
| 344 | 357 |
| 345 | 187 |
| 346 | 236 |
| 347 | 126 |
| 348 | 242 |
| 349 | 398 |
| 350 | 346 |
| 351 | 456 |
| 352 | 358 |
| 353 | 405 |
| 354 | 303 |
| 355 | 189 |
| 356 | 215 |
| 357 | 361 |
| 358 | 244 |
| 359 | 348 |
| 360 | 419 |
| 361 | 406 |
| 362 | 464 |
| 363 | 362 |
| 364 | 409 |
| 365 | 219 |
| 366 | 311 |
| 367 | 421 |
| 368 | 369 |
| 369 | 190 |
| 370 | 248 |
| 371 | 231 |
| 372 | 410 |
| 373 | 364 |
| 374 | 335 |
| 375 | 480 |
| 376 | 315 |
| 377 | 221 |
| 378 | 422 |
| 379 | 370 |
| 380 | 425 |
| 381 | 235 |
| 382 | 451 |
| 383 | 412 |
| 384 | 343 |
| 385 | 222 |
| 386 | 317 |
| 387 | 372 |
| 388 | 426 |
| 389 | 453 |
| 390 | 237 |
| 391 | 433 |
| 392 | 347 |
| 393 | 243 |
| 394 | 454 |
| 395 | 318 |
| 396 | 376 |
| 397 | 428 |
| 398 | 238 |
| 399 | 359 |
| 400 | 457 |

-continued

| Table Q17, having a sequence length of 512: | |
|---|---|
| Reliability or sequence number of reliability | Polarized channel sequence number |
| 401 | 399 |
| 402 | 434 |
| 403 | 349 |
| 404 | 458 |
| 405 | 245 |
| 406 | 363 |
| 407 | 127 |
| 408 | 407 |
| 409 | 436 |
| 410 | 465 |
| 411 | 246 |
| 412 | 350 |
| 413 | 460 |
| 414 | 249 |
| 415 | 411 |
| 416 | 365 |
| 417 | 440 |
| 418 | 466 |
| 419 | 371 |
| 420 | 423 |
| 421 | 366 |
| 422 | 250 |
| 423 | 413 |
| 424 | 468 |
| 425 | 481 |
| 426 | 191 |
| 427 | 373 |
| 428 | 427 |
| 429 | 414 |
| 430 | 252 |
| 431 | 374 |
| 432 | 482 |
| 433 | 429 |
| 434 | 455 |
| 435 | 223 |
| 436 | 472 |
| 437 | 377 |
| 438 | 435 |
| 439 | 484 |
| 440 | 319 |
| 441 | 430 |
| 442 | 239 |
| 443 | 378 |
| 444 | 459 |
| 445 | 437 |
| 446 | 488 |
| 447 | 380 |
| 448 | 461 |
| 449 | 496 |
| 450 | 351 |
| 451 | 467 |
| 452 | 438 |
| 453 | 247 |
| 454 | 462 |
| 455 | 441 |
| 456 | 442 |
| 457 | 469 |
| 458 | 251 |
| 459 | 367 |
| 460 | 253 |
| 461 | 375 |
| 462 | 444 |
| 463 | 470 |
| 464 | 483 |
| 465 | 415 |
| 466 | 485 |
| 467 | 473 |
| 468 | 474 |
| 469 | 254 |
| 470 | 379 |
| 471 | 431 |
| 472 | 489 |
| 473 | 486 |
| 474 | 476 |
| 475 | 439 |
| 476 | 490 |
| 477 | 463 |
| 478 | 381 |
| 479 | 497 |
| 480 | 492 |
| 481 | 443 |
| 482 | 382 |
| 483 | 498 |
| 484 | 445 |
| 485 | 471 |
| 486 | 500 |
| 487 | 446 |
| 488 | 475 |
| 489 | 487 |
| 490 | 504 |
| 491 | 477 |
| 492 | 255 |
| 493 | 491 |
| 494 | 478 |
| 495 | 383 |
| 496 | 493 |
| 497 | 499 |
| 498 | 494 |
| 499 | 501 |
| 500 | 502 |
| 501 | 447 |
| 502 | 505 |
| 503 | 506 |
| 504 | 479 |
| 505 | 508 |
| 506 | 495 |
| 507 | 503 |
| 508 | 507 |
| 509 | 509 |
| 510 | 510 |
| 511 | 511 |

Sequence Q18, having a sequence length of 256:

[0, 1, 2, 4, 8, 16, 32, 3, 5, 64, 9, 6, 17, 10, 18, 128, 12, 33, 65, 20, 34, 24, 36, 7, 129, 66, 11, 40, 68, 130, 19, 13, 48, 14, 72, 21, 132, 35, 22, 80, 136, 25, 37, 26, 96, 38, 67, 41, 144, 28, 69, 42, 49, 70, 160, 44, 131, 73, 192, 50, 74, 52, 15, 133, 81, 23, 134, 76, 56, 82, 137, 27, 97, 39, 84, 138, 145, 29, 43, 98, 88, 140, 30, 146, 71, 161, 45, 100, 51, 148, 46, 75, 104, 162, 53, 193, 152, 77, 164, 54, 83, 57, 112, 135, 78, 194, 85, 58, 168, 139, 99, 86, 60, 89, 196, 141, 101, 147, 176, 142, 90, 200, 31, 149, 102, 105, 163, 92, 47, 150, 208, 106, 153, 165, 55, 113, 154, 79, 108, 224, 166, 195, 169, 59, 114, 156, 87, 197, 116, 170, 61, 177, 91, 198, 172, 120, 201, 62, 143, 103, 178, 93, 202, 107, 180, 151, 209, 94, 204, 155, 210, 109, 184, 115, 167, 225, 157, 110, 117, 212, 171, 226, 216, 158, 118, 173, 121, 199, 179, 228, 122, 174, 181, 203, 63, 232, 124, 205, 182, 211, 185, 240, 206, 95, 213, 186, 227, 111, 214, 188, 217, 229, 159, 119, 218, 230, 233, 175, 123, 220, 183, 234, 125, 241, 207, 187, 236, 126, 242, 189, 215, 244, 219, 190, 248, 231, 221, 235, 222, 237, 243, 238, 245, 127, 246, 249, 250, 191, 252, 223, 239, 247, 251, 253, 254, 255]

| Table Q18, having a sequence length of 256: | |
|---|---|
| Reliability or sequence number of reliability | Polarized channel sequence number |
| 0 | 0 |
| 1 | 1 |

-continued

Table Q18, having a sequence length of 256:

| Reliability or sequence number of reliability | Polarized channel sequence number |
|---|---|
| 2 | 2 |
| 3 | 4 |
| 4 | 8 |
| 5 | 16 |
| 6 | 32 |
| 7 | 3 |
| 8 | 5 |
| 9 | 64 |
| 10 | 9 |
| 11 | 6 |
| 12 | 17 |
| 13 | 10 |
| 14 | 18 |
| 15 | 128 |
| 16 | 12 |
| 17 | 33 |
| 18 | 65 |
| 19 | 20 |
| 20 | 34 |
| 21 | 24 |
| 22 | 36 |
| 23 | 7 |
| 24 | 129 |
| 25 | 66 |
| 26 | 11 |
| 27 | 40 |
| 28 | 68 |
| 29 | 130 |
| 30 | 19 |
| 31 | 13 |
| 32 | 48 |
| 33 | 14 |
| 34 | 72 |
| 35 | 21 |
| 36 | 132 |
| 37 | 35 |
| 38 | 22 |
| 39 | 80 |
| 40 | 136 |
| 41 | 25 |
| 42 | 37 |
| 43 | 26 |
| 44 | 96 |
| 45 | 38 |
| 46 | 67 |
| 47 | 41 |
| 48 | 144 |
| 49 | 28 |
| 50 | 69 |
| 51 | 42 |
| 52 | 49 |
| 53 | 70 |
| 54 | 160 |
| 55 | 44 |
| 56 | 131 |
| 57 | 73 |
| 58 | 192 |
| 59 | 50 |
| 60 | 74 |
| 61 | 52 |
| 62 | 15 |
| 63 | 133 |
| 64 | 81 |
| 65 | 23 |
| 66 | 134 |
| 67 | 76 |
| 68 | 56 |
| 69 | 82 |
| 70 | 137 |
| 71 | 27 |
| 72 | 97 |
| 73 | 39 |
| 74 | 84 |
| 75 | 138 |

-continued

Table Q18, having a sequence length of 256:

| Reliability or sequence number of reliability | Polarized channel sequence number |
|---|---|
| 76 | 145 |
| 77 | 29 |
| 78 | 43 |
| 79 | 98 |
| 80 | 88 |
| 81 | 140 |
| 82 | 30 |
| 83 | 146 |
| 84 | 71 |
| 85 | 161 |
| 86 | 45 |
| 87 | 100 |
| 88 | 51 |
| 89 | 148 |
| 90 | 46 |
| 91 | 75 |
| 92 | 104 |
| 93 | 162 |
| 94 | 53 |
| 95 | 193 |
| 96 | 152 |
| 97 | 77 |
| 98 | 164 |
| 99 | 54 |
| 100 | 83 |
| 101 | 57 |
| 102 | 112 |
| 103 | 135 |
| 104 | 78 |
| 105 | 194 |
| 106 | 85 |
| 107 | 58 |
| 108 | 168 |
| 109 | 139 |
| 110 | 99 |
| 111 | 86 |
| 112 | 60 |
| 113 | 89 |
| 114 | 196 |
| 115 | 141 |
| 116 | 101 |
| 117 | 147 |
| 118 | 176 |
| 119 | 142 |
| 120 | 90 |
| 121 | 200 |
| 122 | 31 |
| 123 | 149 |
| 124 | 102 |
| 125 | 105 |
| 126 | 163 |
| 127 | 92 |
| 128 | 47 |
| 129 | 150 |
| 130 | 208 |
| 131 | 106 |
| 132 | 153 |
| 133 | 165 |
| 134 | 55 |
| 135 | 113 |
| 136 | 154 |
| 137 | 79 |
| 138 | 108 |
| 139 | 224 |
| 140 | 166 |
| 141 | 195 |
| 142 | 169 |
| 143 | 59 |
| 144 | 114 |
| 145 | 156 |
| 146 | 87 |
| 147 | 197 |
| 148 | 116 |
| 149 | 170 |

Table Q18, having a sequence length of 256:

| Reliability or sequence number of reliability | Polarized channel sequence number |
|---|---|
| 150 | 61 |
| 151 | 177 |
| 152 | 91 |
| 153 | 198 |
| 154 | 172 |
| 155 | 120 |
| 156 | 201 |
| 157 | 62 |
| 158 | 143 |
| 159 | 103 |
| 160 | 178 |
| 161 | 93 |
| 162 | 202 |
| 163 | 107 |
| 164 | 180 |
| 165 | 151 |
| 166 | 209 |
| 167 | 94 |
| 168 | 204 |
| 169 | 155 |
| 170 | 210 |
| 171 | 109 |
| 172 | 184 |
| 173 | 115 |
| 174 | 167 |
| 175 | 225 |
| 176 | 157 |
| 177 | 110 |
| 178 | 117 |
| 179 | 212 |
| 180 | 171 |
| 181 | 226 |
| 182 | 216 |
| 183 | 158 |
| 184 | 118 |
| 185 | 173 |
| 186 | 121 |
| 187 | 199 |
| 188 | 179 |
| 189 | 228 |
| 190 | 122 |
| 191 | 174 |
| 192 | 181 |
| 193 | 203 |
| 194 | 63 |
| 195 | 232 |
| 196 | 124 |
| 197 | 205 |
| 198 | 182 |
| 199 | 211 |
| 200 | 185 |
| 201 | 240 |
| 202 | 206 |
| 203 | 95 |
| 204 | 213 |
| 205 | 186 |
| 206 | 227 |
| 207 | 111 |
| 208 | 214 |
| 209 | 188 |
| 210 | 217 |
| 211 | 229 |
| 212 | 159 |
| 213 | 119 |
| 214 | 218 |
| 215 | 230 |
| 216 | 233 |
| 217 | 175 |
| 218 | 123 |
| 219 | 220 |
| 220 | 183 |
| 221 | 234 |
| 222 | 125 |
| 223 | 241 |

Table Q18, having a sequence length of 256:

| Reliability or sequence number of reliability | Polarized channel sequence number |
|---|---|
| 224 | 207 |
| 225 | 187 |
| 226 | 236 |
| 227 | 126 |
| 228 | 242 |
| 229 | 189 |
| 230 | 215 |
| 231 | 244 |
| 232 | 219 |
| 233 | 190 |
| 234 | 248 |
| 235 | 231 |
| 236 | 221 |
| 237 | 235 |
| 238 | 222 |
| 239 | 237 |
| 240 | 243 |
| 241 | 238 |
| 242 | 245 |
| 243 | 127 |
| 244 | 246 |
| 245 | 249 |
| 246 | 250 |
| 247 | 191 |
| 248 | 252 |
| 249 | 223 |
| 250 | 239 |
| 251 | 247 |
| 252 | 251 |
| 253 | 253 |
| 254 | 254 |
| 255 | 255 |

Sequence Q19, having a sequence length of 128: [0, 1, 2, 4, 8, 16, 32, 3, 5, 64, 9, 6, 17, 10, 18, 12, 33, 65, 20, 34, 24, 36, 7, 66, 11, 40, 68, 19, 13, 48, 14, 72, 21, 35, 22, 80, 25, 37, 26, 96, 38, 67, 41, 28, 69, 42, 49, 70, 44, 73, 50, 74, 52, 15, 81, 23, 76, 56, 82, 27, 97, 39, 84, 29, 43, 98, 88, 30, 71, 45, 100, 51, 46, 75, 104, 53, 77, 54, 83, 57, 112, 78, 85, 58, 99, 86, 60, 89, 101, 90, 31, 102, 105, 92, 47, 106, 55, 113, 79, 108, 59, 114, 87, 116, 61, 91, 120, 62, 103, 93, 107, 94, 109, 115, 110, 117, 118, 121, 122, 63, 124, 95, 111, 119, 123, 125, Table Q19, having a sequence length of 128:

| Reliability or sequence number of reliability | Polarized channel sequence number |
|---|---|
| 0 | 0 |
| 1 | 1 |
| 2 | 2 |
| 3 | 4 |
| 4 | 8 |
| 5 | 16 |
| 6 | 32 |
| 7 | 3 |
| 8 | 5 |
| 9 | 64 |
| 10 | 9 |
| 11 | 6 |
| 12 | 17 |
| 13 | 10 |
| 14 | 18 |
| 15 | 12 |
| 16 | 33 |
| 17 | 65 |
| 18 | 20 |
| 19 | 34 |
| 20 | 24 |

-continued

| Table Q19, having a sequence length of 128: | |
|---|---|
| Reliability or sequence number of reliability | Polarized channel sequence number |
| 21 | 36 |
| 22 | 7 |
| 23 | 66 |
| 24 | 11 |
| 25 | 40 |
| 26 | 68 |
| 27 | 19 |
| 28 | 13 |
| 29 | 48 |
| 30 | 14 |
| 31 | 72 |
| 32 | 21 |
| 33 | 35 |
| 34 | 22 |
| 35 | 80 |
| 36 | 25 |
| 37 | 37 |
| 38 | 26 |
| 39 | 96 |
| 40 | 38 |
| 41 | 67 |
| 42 | 41 |
| 43 | 28 |
| 44 | 69 |
| 45 | 42 |
| 46 | 49 |
| 47 | 70 |
| 48 | 44 |
| 49 | 73 |
| 50 | 50 |
| 51 | 74 |
| 52 | 52 |
| 53 | 15 |
| 54 | 81 |
| 55 | 23 |
| 56 | 76 |
| 57 | 56 |
| 58 | 82 |
| 59 | 27 |
| 60 | 97 |
| 61 | 39 |
| 62 | 84 |
| 63 | 29 |
| 64 | 43 |
| 65 | 98 |
| 66 | 88 |
| 67 | 30 |
| 68 | 71 |
| 69 | 45 |
| 70 | 100 |
| 71 | 51 |
| 72 | 46 |
| 73 | 75 |
| 74 | 104 |
| 75 | 53 |
| 76 | 77 |
| 77 | 54 |
| 78 | 83 |
| 79 | 57 |
| 80 | 112 |
| 81 | 78 |
| 82 | 85 |
| 83 | 58 |
| 84 | 99 |
| 85 | 86 |
| 86 | 60 |
| 87 | 89 |
| 88 | 101 |
| 89 | 90 |
| 90 | 31 |
| 91 | 102 |
| 92 | 105 |
| 93 | 92 |
| 94 | 47 |
| 95 | 106 |
| 96 | 55 |
| 97 | 113 |
| 98 | 79 |
| 99 | 108 |
| 100 | 59 |
| 101 | 114 |
| 102 | 87 |
| 103 | 116 |
| 104 | 61 |
| 105 | 91 |
| 106 | 120 |
| 107 | 62 |
| 108 | 103 |
| 109 | 93 |
| 110 | 107 |
| 111 | 94 |
| 112 | 109 |
| 113 | 115 |
| 114 | 110 |
| 115 | 117 |
| 116 | 118 |
| 117 | 121 |
| 118 | 122 |
| 119 | 63 |
| 120 | 124 |
| 121 | 95 |
| 122 | 111 |
| 123 | 119 |
| 124 | 123 |
| 125 | 125 |
| 126 | 126 |
| 127 | 127 |

Sequence Q20, having a sequence length of 64:

[0, 1, 2, 4, 8, 16, 32, 3, 5, 9, 6, 17, 10, 18, 12, 33, 20, 34, 24, 36, 7, 11, 40, 19, 13, 48, 14, 21, 35, 22, 25, 37, 26, 38, 41, 28, 42, 49, 44, 50, 52, 15, 23, 56, 27, 39, 29, 43, 30, 45, 51, 46, 53, 54, 57, 58, 60, 31, 47, 55, 59, 61, 62, 63]

| Table Q20, having a sequence length of 64: | |
|---|---|
| Reliability or sequence number of reliability | Polarized channel sequence number |
| 0 | 0 |
| 1 | 1 |
| 2 | 2 |
| 3 | 4 |
| 4 | 8 |
| 5 | 16 |
| 6 | 32 |
| 7 | 3 |
| 8 | 5 |
| 9 | 9 |
| 10 | 6 |
| 11 | 17 |
| 12 | 10 |
| 13 | 18 |
| 14 | 12 |
| 15 | 33 |
| 16 | 20 |
| 17 | 34 |
| 18 | 24 |
| 19 | 36 |
| 20 | 7 |
| 21 | 11 |
| 22 | 40 |
| 23 | 19 |
| 24 | 13 |
| 25 | 48 |

-continued

| Table Q20, having a sequence length of 64: | |
|---|---|
| Reliability or sequence number of reliability | Polarized channel sequence number |
| 26 | 14 |
| 27 | 21 |
| 28 | 35 |
| 29 | 22 |
| 30 | 25 |
| 31 | 37 |
| 32 | 26 |
| 33 | 38 |
| 34 | 41 |
| 35 | 28 |
| 36 | 42 |
| 37 | 49 |
| 38 | 44 |
| 39 | 50 |
| 40 | 52 |
| 41 | 15 |
| 42 | 23 |
| 43 | 56 |
| 44 | 27 |
| 45 | 39 |
| 46 | 29 |
| 47 | 43 |
| 48 | 30 |
| 49 | 45 |
| 50 | 51 |
| 51 | 46 |
| 52 | 53 |
| 53 | 54 |
| 54 | 57 |
| 55 | 58 |
| 56 | 60 |
| 57 | 31 |
| 58 | 47 |
| 59 | 55 |
| 60 | 59 |
| 61 | 61 |
| 62 | 62 |
| 63 | 63 |

Sequence Z16, having a sequence length of 1024:

[0, 1, 2, 7, 3, 8, 11, 24, 4, 10, 13, 28, 16, 33, 35, 76, 5, 12, 14, 32, 19, 38, 42, 80, 22, 46, 50, 88, 57, 95, 101, 162, 6, 17, 21, 40, 23, 47, 53, 90, 29, 55, 60, 96, 66, 108, 113, 175, 34, 62, 72, 111, 75, 120, 129, 186, 84, 131, 141, 209, 146, 218, 236, 333, 9, 18, 26, 54, 30, 58, 63, 103, 36, 68, 73, 114, 83, 123, 135, 193, 43, 79, 86, 130, 91, 138, 145, 214, 99, 148, 160, 228, 174, 242, 256, 357, 51, 89, 97, 144, 109, 154, 169, 239, 118, 170, 183, 250, 195, 269, 282, 379, 133, 191, 211, 271, 216, 283, 301, 401, 233, 307, 315, 417, 337, 435, 460, 581, 15, 25, 31, 67, 39, 77, 81, 134, 44, 87, 92, 143, 100, 153, 157, 238, 56, 93, 102, 155, 112, 168, 177, 252, 122, 184, 192, 264, 213, 279, 297, 394, 65, 106, 119, 173, 124, 185, 198, 273, 142, 208, 217, 285, 232, 306, 323, 416, 156, 225, 240, 311, 251, 325, 341, 433, 270, 348, 367, 453, 387, 470, 506, 622, 71, 121, 137, 201, 152, 215, 231, 309, 161, 234, 244, 327, 257, 340, 356, 450, 178, 253, 265, 346, 284, 366, 385, 472, 293, 389, 409, 494, 423, 518, 529, 643, 197, 274, 287, 370, 312, 392, 412, 510, 336, 413, 434, 523, 459, 535, 567, 670, 355, 449, 461, 552, 478, 577, 589, 690, 509, 597, 615, 695, 631, 714, 743, 835, 20, 37, 41, 85, 48, 94, 104, 167, 49, 105, 115, 176, 126, 194, 202, 295, 61, 116, 127, 205, 139, 212, 223, 296, 147, 222, 237, 321, 254, 335, 338, 432, 69, 136, 149, 207, 164, 226, 241, 334, 171, 248, 258, 344, 268, 364, 376, 468, 172, 266, 277, 363, 292, 386, 399, 495, 318, 408, 425, 517, 447, 531, 555, 666, 78, 159, 165, 246, 182, 262, 276, 358, 187, 281, 286, 384, 302, 400, 410, 515, 235, 298, 313, 406, 326, 422, 437, 528, 350, 448, 464, 550, 481, 574, 591, 686, 260, 328, 345, 431, 362, 452, 466, 568, 381, 475, 487, 579, 512, 601, 613, 707, 405, 505, 521, 609, 532, 623, 633, 721, 560, 660, 671, 750, 677, 779, 794, 850, 82, 179, 181, 291, 227, 305, 314, 407, 247, 320, 324, 428, 349, 444, 462, 570, 259, 347, 361, 451, 369, 467, 483, 583, 391, 489, 511, 598, 527, 616, 630, 726, 294, 365, 374, 482, 395, 500, 520, 610, 427, 522, 533, 626, 561, 639, 667, 751, 446, 546, 573, 662, 585, 673, 688, 770, 605, 692, 693, 790, 722, 801, 813, 880, 317, 388, 420, 524, 442, 534, 554, 642, 465, 569, 575, 672, 593, 679, 691, 777, 484, 586, 606, 687, 617, 694, 723, 802, 648, 729, 740, 816, 760, 834, 846, 904, 516, 619, 638, 724, 663, 727, 756, 821, 676, 754, 772, 841, 786, 852, 865, 924, 680, 780, 798, 858, 808, 870, 879, 930, 828, 885, 892, 946, 914, 954, 963, 984, 27, 45, 52, 98, 59, 117, 128, 199, 64, 132, 140, 204, 151, 220, 224, 330, 70, 150, 158, 219, 166, 263, 272, 354, 188, 275, 290, 368, 304, 393, 411, 525, 74, 163, 180, 267, 190, 288, 299, 378, 200, 308, 316, 424, 332, 426, 441, 536, 210, 329, 339, 438, 359, 455, 473, 564, 372, 469, 488, 588, 493, 600, 608, 745, 107, 189, 196, 303, 206, 319, 331, 421, 229, 343, 351, 454, 382, 477, 486, 580, 245, 353, 371, 471, 396, 491, 497, 594, 419, 498, 504, 612, 545, 629, 656, 753, 261, 383, 404, 503, 415, 519, 526, 624, 436, 544, 557, 647, 582, 664, 674, 773, 457, 566, 587, 675, 614, 685, 709, 787, 636, 712, 730, 803, 741, 819, 832, 916, 110, 203, 221, 342, 243, 352, 390, 480, 255, 375, 397, 499, 418, 508, 513, 618, 280, 402, 403, 514, 440, 541, 553, 644, 456, 562, 578, 669, 595, 681, 700, 774, 300, 430, 443, 556, 474, 572, 576, 682, 490, 590, 599, 696, 625, 710, 718, 805, 507, 611, 635, 715, 646, 735, 742, 822, 659, 747, 764, 837, 789, 854, 861, 925, 322, 463, 476, 592, 496, 604, 627, 713, 539, 632, 649, 738, 653, 744, 758, 831, 547, 651, 658, 755, 683, 763, 783, 851, 704, 788, 797, 859, 812, 877, 888, 933, 563, 689, 698, 775, 719, 791, 800, 871, 731, 810, 823, 884, 838, 894, 906, 949, 766, 825, 842, 897, 856, 909, 913, 961, 867, 921, 929, 966, 940, 974, 983, 1003, 125, 230, 249, 373, 278, 398, 414, 530, 289, 429, 439, 543, 458, 559, 584, 701, 310, 445, 479, 571, 492, 596, 603, 706, 501, 607, 628, 728, 650, 736, 749, 829, 360, 485, 502, 602, 538, 621, 637, 739, 542, 641, 655, 746, 665, 759, 769, 849, 548, 661, 678, 768, 703, 782, 795, 860, 716, 807, 811, 876, 824, 889, 900, 944, 377, 537, 540, 645, 549, 652, 668, 762, 565, 684, 697, 778, 711, 792, 809, 874, 634, 702, 720, 796, 732, 817, 826, 886, 761, 827, 844, 898, 857, 908, 915, 960, 654, 734, 748, 818, 767, 839, 848, 902, 785, 853, 864, 912, 873, 922, 932, 969, 799, 869, 878, 928, 891, 935, 943, 976, 903, 947, 953, 981, 958, 989, 991, 1008, 380, 551, 558, 699, 620, 708, 717, 806, 640, 725, 737, 820, 757, 830, 843, 901, 657, 752, 765, 833, 776, 845, 862, 911, 793, 863, 872, 919, 887, 931, 939, 972, 705, 771, 781, 855, 804, 868, 875, 926, 815, 882, 890, 936, 899, 941, 950, 980, 840, 895, 905, 945, 917, 955, 959, 987, 923, 965, 968, 993, 975, 996, 998, 1011, 733, 784, 814, 883, 836, 893, 896, 942, 847, 907, 910, 952, 920, 956, 967, 990, 866, 918, 927, 964, 938, 970, 971, 997, 948, 977, 979, 999, 985, 1004, 1006, 1016, 881, 934, 937, 973, 951, 978, 982, 1001, 957, 986, 988, 1005, 994, 1007, 1012, 1018, 962, 992, 995, 1009, 1000, 1010, 1013, 1019, 1002, 1014, 1015, 1020, 1017, 1021, 1022, 1023]

| Table Z16, having a sequence length of 1024: | |
|---|---|
| Polarized channel sequence number | Reliability or sequence number of reliability |
| 0 | 0 |
| 1 | 1 |
| 2 | 2 |
| 3 | 7 |
| 4 | 3 |

-continued

Table Z16, having a sequence length of 1024:

| Polarized channel sequence number | Reliability or sequence number of reliability |
|---|---|
| 5 | 8 |
| 6 | 11 |
| 7 | 24 |
| 8 | 4 |
| 9 | 10 |
| 10 | 13 |
| 11 | 28 |
| 12 | 16 |
| 13 | 33 |
| 14 | 35 |
| 15 | 76 |
| 16 | 5 |
| 17 | 12 |
| 18 | 14 |
| 19 | 32 |
| 20 | 19 |
| 21 | 38 |
| 22 | 42 |
| 23 | 80 |
| 24 | 22 |
| 25 | 46 |
| 26 | 50 |
| 27 | 88 |
| 28 | 57 |
| 29 | 95 |
| 30 | 101 |
| 31 | 162 |
| 32 | 6 |
| 33 | 17 |
| 34 | 21 |
| 35 | 40 |
| 36 | 23 |
| 37 | 47 |
| 38 | 53 |
| 39 | 90 |
| 40 | 29 |
| 41 | 55 |
| 42 | 60 |
| 43 | 96 |
| 44 | 66 |
| 45 | 108 |
| 46 | 113 |
| 47 | 175 |
| 48 | 34 |
| 49 | 62 |
| 50 | 72 |
| 51 | 111 |
| 52 | 75 |
| 53 | 120 |
| 54 | 129 |
| 55 | 186 |
| 56 | 84 |
| 57 | 131 |
| 58 | 141 |
| 59 | 209 |
| 60 | 146 |
| 61 | 218 |
| 62 | 236 |
| 63 | 333 |
| 64 | 9 |
| 65 | 18 |
| 66 | 26 |
| 67 | 54 |
| 68 | 30 |
| 69 | 58 |
| 70 | 63 |
| 71 | 103 |
| 72 | 36 |
| 73 | 68 |
| 74 | 73 |
| 75 | 114 |
| 76 | 83 |
| 77 | 123 |
| 78 | 135 |

-continued

Table Z16, having a sequence length of 1024:

| Polarized channel sequence number | Reliability or sequence number of reliability |
|---|---|
| 79 | 193 |
| 80 | 43 |
| 81 | 79 |
| 82 | 86 |
| 83 | 130 |
| 84 | 91 |
| 85 | 138 |
| 86 | 145 |
| 87 | 214 |
| 88 | 99 |
| 89 | 148 |
| 90 | 160 |
| 91 | 228 |
| 92 | 174 |
| 93 | 242 |
| 94 | 256 |
| 95 | 357 |
| 96 | 51 |
| 97 | 89 |
| 98 | 97 |
| 99 | 144 |
| 100 | 109 |
| 101 | 154 |
| 102 | 169 |
| 103 | 239 |
| 104 | 118 |
| 105 | 170 |
| 106 | 183 |
| 107 | 250 |
| 108 | 195 |
| 109 | 269 |
| 110 | 282 |
| 111 | 379 |
| 112 | 133 |
| 113 | 191 |
| 114 | 211 |
| 115 | 271 |
| 116 | 216 |
| 117 | 283 |
| 118 | 301 |
| 119 | 401 |
| 120 | 233 |
| 121 | 307 |
| 122 | 315 |
| 123 | 417 |
| 124 | 337 |
| 125 | 435 |
| 126 | 460 |
| 127 | 581 |
| 128 | 15 |
| 129 | 25 |
| 130 | 31 |
| 131 | 67 |
| 132 | 39 |
| 133 | 77 |
| 134 | 81 |
| 135 | 134 |
| 136 | 44 |
| 137 | 87 |
| 138 | 92 |
| 139 | 143 |
| 140 | 100 |
| 141 | 153 |
| 142 | 157 |
| 143 | 238 |
| 144 | 56 |
| 145 | 93 |
| 146 | 102 |
| 147 | 155 |
| 148 | 112 |
| 149 | 168 |
| 150 | 177 |
| 151 | 252 |
| 152 | 122 |

-continued

Table Z16, having a sequence length of 1024:

| Polarized channel sequence number | Reliability or sequence number of reliability |
|---|---|
| 153 | 184 |
| 154 | 192 |
| 155 | 264 |
| 156 | 213 |
| 157 | 279 |
| 158 | 297 |
| 159 | 394 |
| 160 | 65 |
| 161 | 106 |
| 162 | 119 |
| 163 | 173 |
| 164 | 124 |
| 165 | 185 |
| 166 | 198 |
| 167 | 273 |
| 168 | 142 |
| 169 | 208 |
| 170 | 217 |
| 171 | 285 |
| 172 | 232 |
| 173 | 306 |
| 174 | 323 |
| 175 | 416 |
| 176 | 156 |
| 177 | 225 |
| 178 | 240 |
| 179 | 311 |
| 180 | 251 |
| 181 | 325 |
| 182 | 341 |
| 183 | 433 |
| 184 | 270 |
| 185 | 348 |
| 186 | 367 |
| 187 | 453 |
| 188 | 387 |
| 189 | 470 |
| 190 | 506 |
| 191 | 622 |
| 192 | 71 |
| 193 | 121 |
| 194 | 137 |
| 195 | 201 |
| 196 | 152 |
| 197 | 215 |
| 198 | 231 |
| 199 | 309 |
| 200 | 161 |
| 201 | 234 |
| 202 | 244 |
| 203 | 327 |
| 204 | 257 |
| 205 | 340 |
| 206 | 356 |
| 207 | 450 |
| 208 | 178 |
| 209 | 253 |
| 210 | 265 |
| 211 | 346 |
| 212 | 284 |
| 213 | 366 |
| 214 | 385 |
| 215 | 472 |
| 216 | 293 |
| 217 | 389 |
| 218 | 409 |
| 219 | 494 |
| 220 | 423 |
| 221 | 518 |
| 222 | 529 |
| 223 | 643 |
| 224 | 197 |
| 225 | 274 |
| 226 | 287 |

-continued

Table Z16, having a sequence length of 1024:

| Polarized channel sequence number | Reliability or sequence number of reliability |
|---|---|
| 227 | 370 |
| 228 | 312 |
| 229 | 392 |
| 230 | 412 |
| 231 | 510 |
| 232 | 336 |
| 233 | 413 |
| 234 | 434 |
| 235 | 523 |
| 236 | 459 |
| 237 | 535 |
| 238 | 567 |
| 239 | 670 |
| 240 | 355 |
| 241 | 449 |
| 242 | 461 |
| 243 | 552 |
| 244 | 478 |
| 245 | 577 |
| 246 | 589 |
| 247 | 690 |
| 248 | 509 |
| 249 | 597 |
| 250 | 615 |
| 251 | 695 |
| 252 | 631 |
| 253 | 714 |
| 254 | 743 |
| 255 | 835 |
| 256 | 20 |
| 257 | 37 |
| 258 | 41 |
| 259 | 85 |
| 260 | 48 |
| 261 | 94 |
| 262 | 104 |
| 263 | 167 |
| 264 | 49 |
| 265 | 105 |
| 266 | 115 |
| 267 | 176 |
| 268 | 126 |
| 269 | 194 |
| 270 | 202 |
| 271 | 295 |
| 272 | 61 |
| 273 | 116 |
| 274 | 127 |
| 275 | 205 |
| 276 | 139 |
| 277 | 212 |
| 278 | 223 |
| 279 | 296 |
| 280 | 147 |
| 281 | 222 |
| 282 | 237 |
| 283 | 321 |
| 284 | 254 |
| 285 | 335 |
| 286 | 338 |
| 287 | 432 |
| 288 | 69 |
| 289 | 136 |
| 290 | 149 |
| 291 | 207 |
| 292 | 164 |
| 293 | 226 |
| 294 | 241 |
| 295 | 334 |
| 296 | 171 |
| 297 | 248 |
| 298 | 258 |
| 299 | 344 |
| 300 | 268 |

-continued

Table Z16, having a sequence length of 1024:

| Polarized channel sequence number | Reliability or sequence number of reliability |
|---|---|
| 301 | 364 |
| 302 | 376 |
| 303 | 468 |
| 304 | 172 |
| 305 | 266 |
| 306 | 277 |
| 307 | 363 |
| 308 | 292 |
| 309 | 386 |
| 310 | 399 |
| 311 | 495 |
| 312 | 318 |
| 313 | 408 |
| 314 | 425 |
| 315 | 517 |
| 316 | 447 |
| 317 | 531 |
| 318 | 555 |
| 319 | 666 |
| 320 | 78 |
| 321 | 159 |
| 322 | 165 |
| 323 | 246 |
| 324 | 182 |
| 325 | 262 |
| 326 | 276 |
| 327 | 358 |
| 328 | 187 |
| 329 | 281 |
| 330 | 286 |
| 331 | 384 |
| 332 | 302 |
| 333 | 400 |
| 334 | 410 |
| 335 | 515 |
| 336 | 235 |
| 337 | 298 |
| 338 | 313 |
| 339 | 406 |
| 340 | 326 |
| 341 | 422 |
| 342 | 437 |
| 343 | 528 |
| 344 | 350 |
| 345 | 448 |
| 346 | 464 |
| 347 | 550 |
| 348 | 481 |
| 349 | 574 |
| 350 | 591 |
| 351 | 686 |
| 352 | 260 |
| 353 | 328 |
| 354 | 345 |
| 355 | 431 |
| 356 | 362 |
| 357 | 452 |
| 358 | 466 |
| 359 | 568 |
| 360 | 381 |
| 361 | 475 |
| 362 | 487 |
| 363 | 579 |
| 364 | 512 |
| 365 | 601 |
| 366 | 613 |
| 367 | 707 |
| 368 | 405 |
| 369 | 505 |
| 370 | 521 |
| 371 | 609 |
| 372 | 532 |
| 373 | 623 |
| 374 | 633 |

-continued

Table Z16, having a sequence length of 1024:

| Polarized channel sequence number | Reliability or sequence number of reliability |
|---|---|
| 375 | 721 |
| 376 | 560 |
| 377 | 660 |
| 378 | 671 |
| 379 | 750 |
| 380 | 677 |
| 381 | 779 |
| 382 | 794 |
| 383 | 850 |
| 384 | 82 |
| 385 | 179 |
| 386 | 181 |
| 387 | 291 |
| 388 | 227 |
| 389 | 305 |
| 390 | 314 |
| 391 | 407 |
| 392 | 247 |
| 393 | 320 |
| 394 | 324 |
| 395 | 428 |
| 396 | 349 |
| 397 | 444 |
| 398 | 462 |
| 399 | 570 |
| 400 | 259 |
| 401 | 347 |
| 402 | 361 |
| 403 | 451 |
| 404 | 369 |
| 405 | 467 |
| 406 | 483 |
| 407 | 583 |
| 408 | 391 |
| 409 | 489 |
| 410 | 511 |
| 411 | 598 |
| 412 | 527 |
| 413 | 616 |
| 414 | 630 |
| 415 | 726 |
| 416 | 294 |
| 417 | 365 |
| 418 | 374 |
| 419 | 482 |
| 420 | 395 |
| 421 | 500 |
| 422 | 520 |
| 423 | 610 |
| 424 | 427 |
| 425 | 522 |
| 426 | 533 |
| 427 | 626 |
| 428 | 561 |
| 429 | 639 |
| 430 | 667 |
| 431 | 751 |
| 432 | 446 |
| 433 | 546 |
| 434 | 573 |
| 435 | 662 |
| 436 | 585 |
| 437 | 673 |
| 438 | 688 |
| 439 | 770 |
| 440 | 605 |
| 441 | 692 |
| 442 | 693 |
| 443 | 790 |
| 444 | 722 |
| 445 | 801 |
| 446 | 813 |
| 447 | 880 |
| 448 | 317 |

-continued

Table Z16, having a sequence length of 1024:

| Polarized channel sequence number | Reliability or sequence number of reliability |
|---|---|
| 449 | 388 |
| 450 | 420 |
| 451 | 524 |
| 452 | 442 |
| 453 | 534 |
| 454 | 554 |
| 455 | 642 |
| 456 | 465 |
| 457 | 569 |
| 458 | 575 |
| 459 | 672 |
| 460 | 593 |
| 461 | 679 |
| 462 | 691 |
| 463 | 777 |
| 464 | 484 |
| 465 | 586 |
| 466 | 606 |
| 467 | 687 |
| 468 | 617 |
| 469 | 694 |
| 470 | 723 |
| 471 | 802 |
| 472 | 648 |
| 473 | 729 |
| 474 | 740 |
| 475 | 816 |
| 476 | 760 |
| 477 | 834 |
| 478 | 846 |
| 479 | 904 |
| 480 | 516 |
| 481 | 619 |
| 482 | 638 |
| 483 | 724 |
| 484 | 663 |
| 485 | 727 |
| 486 | 756 |
| 487 | 821 |
| 488 | 676 |
| 489 | 754 |
| 490 | 772 |
| 491 | 841 |
| 492 | 786 |
| 493 | 852 |
| 494 | 865 |
| 495 | 924 |
| 496 | 680 |
| 497 | 780 |
| 498 | 798 |
| 499 | 858 |
| 500 | 808 |
| 501 | 870 |
| 502 | 879 |
| 503 | 930 |
| 504 | 828 |
| 505 | 885 |
| 506 | 892 |
| 507 | 946 |
| 508 | 914 |
| 509 | 954 |
| 510 | 963 |
| 511 | 984 |
| 512 | 27 |
| 513 | 45 |
| 514 | 52 |
| 515 | 98 |
| 516 | 59 |
| 517 | 117 |
| 518 | 128 |
| 519 | 199 |
| 520 | 64 |
| 521 | 132 |
| 522 | 140 |

-continued

Table Z16, having a sequence length of 1024:

| Polarized channel sequence number | Reliability or sequence number of reliability |
|---|---|
| 523 | 204 |
| 524 | 151 |
| 525 | 220 |
| 526 | 224 |
| 527 | 330 |
| 528 | 70 |
| 529 | 150 |
| 530 | 158 |
| 531 | 219 |
| 532 | 166 |
| 533 | 263 |
| 534 | 272 |
| 535 | 354 |
| 536 | 188 |
| 537 | 275 |
| 538 | 290 |
| 539 | 368 |
| 540 | 304 |
| 541 | 393 |
| 542 | 411 |
| 543 | 525 |
| 544 | 74 |
| 545 | 163 |
| 546 | 180 |
| 547 | 267 |
| 548 | 190 |
| 549 | 288 |
| 550 | 299 |
| 551 | 378 |
| 552 | 200 |
| 553 | 308 |
| 554 | 316 |
| 555 | 424 |
| 556 | 332 |
| 557 | 426 |
| 558 | 441 |
| 559 | 536 |
| 560 | 210 |
| 561 | 329 |
| 562 | 339 |
| 563 | 438 |
| 564 | 359 |
| 565 | 455 |
| 566 | 473 |
| 567 | 564 |
| 568 | 372 |
| 569 | 469 |
| 570 | 488 |
| 571 | 588 |
| 572 | 493 |
| 573 | 600 |
| 574 | 608 |
| 575 | 745 |
| 576 | 107 |
| 577 | 189 |
| 578 | 196 |
| 579 | 303 |
| 580 | 206 |
| 581 | 319 |
| 582 | 331 |
| 583 | 421 |
| 584 | 229 |
| 585 | 343 |
| 586 | 351 |
| 587 | 454 |
| 588 | 382 |
| 589 | 477 |
| 590 | 486 |
| 591 | 580 |
| 592 | 245 |
| 593 | 353 |
| 594 | 371 |
| 595 | 471 |
| 596 | 396 |

Table Z16, having a sequence length of 1024:

| Polarized channel sequence number | Reliability or sequence number of reliability |
|---|---|
| 597 | 491 |
| 598 | 497 |
| 599 | 594 |
| 600 | 419 |
| 601 | 498 |
| 602 | 504 |
| 603 | 612 |
| 604 | 545 |
| 605 | 629 |
| 606 | 656 |
| 607 | 753 |
| 608 | 261 |
| 609 | 383 |
| 610 | 404 |
| 611 | 503 |
| 612 | 415 |
| 613 | 519 |
| 614 | 526 |
| 615 | 624 |
| 616 | 436 |
| 617 | 544 |
| 618 | 557 |
| 619 | 647 |
| 620 | 582 |
| 621 | 664 |
| 622 | 674 |
| 623 | 773 |
| 624 | 457 |
| 625 | 566 |
| 626 | 587 |
| 627 | 675 |
| 628 | 614 |
| 629 | 685 |
| 630 | 709 |
| 631 | 787 |
| 632 | 636 |
| 633 | 712 |
| 634 | 730 |
| 635 | 803 |
| 636 | 741 |
| 637 | 819 |
| 638 | 832 |
| 639 | 916 |
| 640 | 110 |
| 641 | 203 |
| 642 | 221 |
| 643 | 342 |
| 644 | 243 |
| 645 | 352 |
| 646 | 390 |
| 647 | 480 |
| 648 | 255 |
| 649 | 375 |
| 650 | 397 |
| 651 | 499 |
| 652 | 418 |
| 653 | 508 |
| 654 | 513 |
| 655 | 618 |
| 656 | 280 |
| 657 | 402 |
| 658 | 403 |
| 659 | 514 |
| 660 | 440 |
| 661 | 541 |
| 662 | 553 |
| 663 | 644 |
| 664 | 456 |
| 665 | 562 |
| 666 | 578 |
| 667 | 669 |
| 668 | 595 |
| 669 | 681 |
| 670 | 700 |

Table Z16, having a sequence length of 1024:

| Polarized channel sequence number | Reliability or sequence number of reliability |
|---|---|
| 671 | 774 |
| 672 | 300 |
| 673 | 430 |
| 674 | 443 |
| 675 | 556 |
| 676 | 474 |
| 677 | 572 |
| 678 | 576 |
| 679 | 682 |
| 680 | 490 |
| 681 | 590 |
| 682 | 599 |
| 683 | 696 |
| 684 | 625 |
| 685 | 710 |
| 686 | 718 |
| 687 | 805 |
| 688 | 507 |
| 689 | 611 |
| 690 | 635 |
| 691 | 715 |
| 692 | 646 |
| 693 | 735 |
| 694 | 742 |
| 695 | 822 |
| 696 | 659 |
| 697 | 747 |
| 698 | 764 |
| 699 | 837 |
| 700 | 789 |
| 701 | 854 |
| 702 | 861 |
| 703 | 925 |
| 704 | 322 |
| 705 | 463 |
| 706 | 476 |
| 707 | 592 |
| 708 | 496 |
| 709 | 604 |
| 710 | 627 |
| 711 | 713 |
| 712 | 539 |
| 713 | 632 |
| 714 | 649 |
| 715 | 738 |
| 716 | 653 |
| 717 | 744 |
| 718 | 758 |
| 719 | 831 |
| 720 | 547 |
| 721 | 651 |
| 722 | 658 |
| 723 | 755 |
| 724 | 683 |
| 725 | 763 |
| 726 | 783 |
| 727 | 851 |
| 728 | 704 |
| 729 | 788 |
| 730 | 797 |
| 731 | 859 |
| 732 | 812 |
| 733 | 877 |
| 734 | 888 |
| 735 | 933 |
| 736 | 563 |
| 737 | 689 |
| 738 | 698 |
| 739 | 775 |
| 740 | 719 |
| 741 | 791 |
| 742 | 800 |
| 743 | 871 |
| 744 | 731 |

-continued

Table Z16, having a sequence length of 1024:

| Polarized channel sequence number | Reliability or sequence number of reliability |
|---|---|
| 745 | 810 |
| 746 | 823 |
| 747 | 884 |
| 748 | 838 |
| 749 | 894 |
| 750 | 906 |
| 751 | 949 |
| 752 | 766 |
| 753 | 825 |
| 754 | 842 |
| 755 | 897 |
| 756 | 856 |
| 757 | 909 |
| 758 | 913 |
| 759 | 961 |
| 760 | 867 |
| 761 | 921 |
| 762 | 929 |
| 763 | 966 |
| 764 | 940 |
| 765 | 974 |
| 766 | 983 |
| 767 | 1003 |
| 768 | 125 |
| 769 | 230 |
| 770 | 249 |
| 771 | 373 |
| 772 | 278 |
| 773 | 398 |
| 774 | 414 |
| 775 | 530 |
| 776 | 289 |
| 777 | 429 |
| 778 | 439 |
| 779 | 543 |
| 780 | 458 |
| 781 | 559 |
| 782 | 584 |
| 783 | 701 |
| 784 | 310 |
| 785 | 445 |
| 786 | 479 |
| 787 | 571 |
| 788 | 492 |
| 789 | 596 |
| 790 | 603 |
| 791 | 706 |
| 792 | 501 |
| 793 | 607 |
| 794 | 628 |
| 795 | 728 |
| 796 | 650 |
| 797 | 736 |
| 798 | 749 |
| 799 | 829 |
| 800 | 360 |
| 801 | 485 |
| 802 | 502 |
| 803 | 602 |
| 804 | 538 |
| 805 | 621 |
| 806 | 637 |
| 807 | 739 |
| 808 | 542 |
| 809 | 641 |
| 810 | 655 |
| 811 | 746 |
| 812 | 665 |
| 813 | 759 |
| 814 | 769 |
| 815 | 849 |
| 816 | 548 |
| 817 | 661 |
| 818 | 678 |

-continued

Table Z16, having a sequence length of 1024:

| Polarized channel sequence number | Reliability or sequence number of reliability |
|---|---|
| 819 | 768 |
| 820 | 703 |
| 821 | 782 |
| 822 | 795 |
| 823 | 860 |
| 824 | 716 |
| 825 | 807 |
| 826 | 811 |
| 827 | 876 |
| 828 | 824 |
| 829 | 889 |
| 830 | 900 |
| 831 | 944 |
| 832 | 377 |
| 833 | 537 |
| 834 | 540 |
| 835 | 645 |
| 836 | 549 |
| 837 | 652 |
| 838 | 668 |
| 839 | 762 |
| 840 | 565 |
| 841 | 684 |
| 842 | 697 |
| 843 | 778 |
| 844 | 711 |
| 845 | 792 |
| 846 | 809 |
| 847 | 874 |
| 848 | 634 |
| 849 | 702 |
| 850 | 720 |
| 851 | 796 |
| 852 | 732 |
| 853 | 817 |
| 854 | 826 |
| 855 | 886 |
| 856 | 761 |
| 857 | 827 |
| 858 | 844 |
| 859 | 898 |
| 860 | 857 |
| 861 | 908 |
| 862 | 915 |
| 863 | 960 |
| 864 | 654 |
| 865 | 734 |
| 866 | 748 |
| 867 | 818 |
| 868 | 767 |
| 869 | 839 |
| 870 | 848 |
| 871 | 902 |
| 872 | 785 |
| 873 | 853 |
| 874 | 864 |
| 875 | 912 |
| 876 | 873 |
| 877 | 922 |
| 878 | 932 |
| 879 | 969 |
| 880 | 799 |
| 881 | 869 |
| 882 | 878 |
| 883 | 928 |
| 884 | 891 |
| 885 | 935 |
| 886 | 943 |
| 887 | 976 |
| 888 | 903 |
| 889 | 947 |
| 890 | 953 |
| 891 | 981 |
| 892 | 958 |

-continued

Table Z16, having a sequence length of 1024:

| Polarized channel sequence number | Reliability or sequence number of reliability |
|---|---|
| 893 | 989 |
| 894 | 991 |
| 895 | 1008 |
| 896 | 380 |
| 897 | 551 |
| 898 | 558 |
| 899 | 699 |
| 900 | 620 |
| 901 | 708 |
| 902 | 717 |
| 903 | 806 |
| 904 | 640 |
| 905 | 725 |
| 906 | 737 |
| 907 | 820 |
| 908 | 757 |
| 909 | 830 |
| 910 | 843 |
| 911 | 901 |
| 912 | 657 |
| 913 | 752 |
| 914 | 765 |
| 915 | 833 |
| 916 | 776 |
| 917 | 845 |
| 918 | 862 |
| 919 | 911 |
| 920 | 793 |
| 921 | 863 |
| 922 | 872 |
| 923 | 919 |
| 924 | 887 |
| 925 | 931 |
| 926 | 939 |
| 927 | 972 |
| 928 | 705 |
| 929 | 771 |
| 930 | 781 |
| 931 | 855 |
| 932 | 804 |
| 933 | 868 |
| 934 | 875 |
| 935 | 926 |
| 936 | 815 |
| 937 | 882 |
| 938 | 890 |
| 939 | 936 |
| 940 | 899 |
| 941 | 941 |
| 942 | 950 |
| 943 | 980 |
| 944 | 840 |
| 945 | 895 |
| 946 | 905 |
| 947 | 945 |
| 948 | 917 |
| 949 | 955 |
| 950 | 959 |
| 951 | 987 |
| 952 | 923 |
| 953 | 965 |
| 954 | 968 |
| 955 | 993 |
| 956 | 975 |
| 957 | 996 |
| 958 | 998 |
| 959 | 1011 |
| 960 | 733 |
| 961 | 784 |
| 962 | 814 |
| 963 | 883 |
| 964 | 836 |
| 965 | 893 |
| 966 | 896 |
| 967 | 942 |
| 968 | 847 |
| 969 | 907 |
| 970 | 910 |
| 971 | 952 |
| 972 | 920 |
| 973 | 956 |
| 974 | 967 |
| 975 | 990 |
| 976 | 866 |
| 977 | 918 |
| 978 | 927 |
| 979 | 964 |
| 980 | 938 |
| 981 | 970 |
| 982 | 971 |
| 983 | 997 |
| 984 | 948 |
| 985 | 977 |
| 986 | 979 |
| 987 | 999 |
| 988 | 985 |
| 989 | 1004 |
| 990 | 1006 |
| 991 | 1016 |
| 992 | 881 |
| 993 | 934 |
| 994 | 937 |
| 995 | 973 |
| 996 | 951 |
| 997 | 978 |
| 998 | 982 |
| 999 | 1001 |
| 1000 | 957 |
| 1001 | 986 |
| 1002 | 988 |
| 1003 | 1005 |
| 1004 | 994 |
| 1005 | 1007 |
| 1006 | 1012 |
| 1007 | 1018 |
| 1008 | 962 |
| 1009 | 992 |
| 1010 | 995 |
| 1011 | 1009 |
| 1012 | 1000 |
| 1013 | 1010 |
| 1014 | 1013 |
| 1015 | 1019 |
| 1016 | 1002 |
| 1017 | 1014 |
| 1018 | 1015 |
| 1019 | 1020 |
| 1020 | 1017 |
| 1021 | 1021 |
| 1022 | 1022 |
| 1023 | 1023 |

Sequence Z17, having a sequence length of 512:

[0, 1, 2, 7, 3, 8, 11, 24, 4, 10, 13, 27, 16, 32, 34, 69, 5, 12, 14, 31, 19, 37, 41, 73, 22, 44, 48, 81, 54, 88, 93, 144, 6, 17, 21, 39, 23, 45, 50, 83, 28, 52, 56, 89, 61, 99, 103, 155, 33, 58, 66, 101, 68, 109, 116, 165, 77, 118, 126, 179, 131, 187, 199, 269, 9, 18, 26, 51, 29, 55, 59, 95, 35, 63, 67, 104, 76, 112, 121, 169, 42, 72, 79, 117, 84, 124, 130, 183, 91, 133, 142, 193, 154, 205, 215, 286, 49, 82, 90, 129, 100, 137, 149, 202, 107, 150, 162, 210, 171, 225, 234, 299, 119, 167, 180, 227, 185, 235, 248, 313, 196, 252, 258, 323, 273, 334, 347, 407, 15, 25, 30, 62, 38, 70, 74, 120, 43, 80, 85, 128, 92, 136, 140, 201, 53, 86, 94, 138, 102, 148, 157, 212, 111, 163, 168, 221, 182, 232, 246, 309, 60, 98, 108, 153, 113, 164, 173, 228, 127, 178, 186, 237, 195, 251, 263, 322, 139, 190, 203, 254, 211, 265, 276, 332, 226, 281, 294, 345, 304, 355, 369, 426, 65, 110, 123, 174, 135, 184, 194, 253, 143, 197, 206, 267, 216, 275, 285, 342, 158, 213, 222, 279, 236, 293, 302, 356, 242, 306, 318, 365, 326, 377, 385, 435, 172, 229, 239, 296, 255, 308, 320, 371, 272, 321, 333, 381, 346, 390, 398, 442, 284, 341, 348, 393, 358, 405, 411, 453, 370, 414, 422, 458, 430, 460, 469, 492, 20, 36, 40, 78, 46, 87, 96, 147, 47, 97, 105, 156, 114, 170, 175, 244, 57, 106, 115, 176, 125, 181, 189, 245, 132, 188, 200, 262, 214, 271, 274, 331, 64, 122, 134, 177, 145, 191, 204, 270, 151, 209, 217, 277, 224, 291, 298, 354, 152, 223, 231, 290, 241, 303, 311, 366, 260, 317, 327, 376, 339, 386, 395, 440, 71, 141, 146, 207, 161, 220, 230, 287, 166, 233, 238, 301, 249, 312, 319, 374, 198, 247, 256, 315, 266, 325, 335, 384, 283, 340, 350, 392, 359, 403, 412, 450, 219, 268, 278, 330, 289, 344, 352, 399, 300, 357, 363, 406, 373, 416, 421, 459, 314, 368, 379, 419, 387, 427, 431, 461, 396, 437, 443, 470, 447, 478, 482, 495, 75, 159, 160, 240, 192, 250, 257, 316, 208, 261, 264, 329, 282, 337, 349, 401, 218, 280, 288, 343, 295, 353, 361, 408, 307, 364, 372, 415, 383, 423, 429, 465, 243, 292, 297, 360, 310, 367, 378, 420, 328, 380, 388, 428, 397, 433, 441, 471, 338, 391, 402, 438, 409, 445, 452, 475, 417, 455, 456, 481, 462, 484, 487, 501, 259, 305, 324, 382, 336, 389, 394, 434, 351, 400, 404, 444, 413, 448, 454, 477, 362, 410, 418, 451, 424, 457, 463, 485, 436, 467, 468, 488, 474, 491, 494, 504, 375, 425, 432, 464, 439, 466, 473, 489, 446, 472, 476, 493, 480, 496, 498, 506, 449, 479, 483, 497, 486, 499, 500, 507, 490, 502, 503, 508, 505, 509, 510, 511]

Table Z17, having a sequence length of 512:

| Polarized channel sequence number | Reliability or sequence number of reliability |
|---|---|
| 0 | 0 |
| 1 | 1 |
| 2 | 2 |
| 3 | 7 |
| 4 | 3 |
| 5 | 8 |
| 6 | 11 |
| 7 | 24 |
| 8 | 4 |
| 9 | 10 |
| 10 | 13 |
| 11 | 27 |
| 12 | 16 |
| 13 | 32 |
| 14 | 34 |
| 15 | 69 |
| 16 | 5 |
| 17 | 12 |
| 18 | 14 |
| 19 | 31 |
| 20 | 19 |
| 21 | 37 |
| 22 | 41 |
| 23 | 73 |
| 24 | 22 |
| 25 | 44 |
| 26 | 48 |
| 27 | 81 |
| 28 | 54 |
| 29 | 88 |
| 30 | 93 |
| 31 | 144 |
| 32 | 6 |
| 33 | 17 |
| 34 | 21 |
| 35 | 39 |
| 36 | 23 |
| 37 | 45 |
| 38 | 50 |
| 39 | 83 |

-continued

Table Z17, having a sequence length of 512:

| Polarized channel sequence number | Reliability or sequence number of reliability |
|---|---|
| 40 | 28 |
| 41 | 52 |
| 42 | 56 |
| 43 | 89 |
| 44 | 61 |
| 45 | 99 |
| 46 | 103 |
| 47 | 155 |
| 48 | 33 |
| 49 | 58 |
| 50 | 66 |
| 51 | 101 |
| 52 | 68 |
| 53 | 109 |
| 54 | 116 |
| 55 | 165 |
| 56 | 77 |
| 57 | 118 |
| 58 | 126 |
| 59 | 179 |
| 60 | 131 |
| 61 | 187 |
| 62 | 199 |
| 63 | 269 |
| 64 | 9 |
| 65 | 18 |
| 66 | 26 |
| 67 | 51 |
| 68 | 29 |
| 69 | 55 |
| 70 | 59 |
| 71 | 95 |
| 72 | 35 |
| 73 | 63 |
| 74 | 67 |
| 75 | 104 |
| 76 | 76 |
| 77 | 112 |
| 78 | 121 |
| 79 | 169 |
| 80 | 42 |
| 81 | 72 |
| 82 | 79 |
| 83 | 117 |
| 84 | 84 |
| 85 | 124 |
| 86 | 130 |
| 87 | 183 |
| 88 | 91 |
| 89 | 133 |
| 90 | 142 |
| 91 | 193 |
| 92 | 154 |
| 93 | 205 |
| 94 | 215 |
| 95 | 286 |
| 96 | 49 |
| 97 | 82 |
| 98 | 90 |
| 99 | 129 |
| 100 | 100 |
| 101 | 137 |
| 102 | 149 |
| 103 | 202 |
| 104 | 107 |
| 105 | 150 |
| 106 | 162 |
| 107 | 210 |
| 108 | 171 |
| 109 | 225 |
| 110 | 234 |
| 111 | 299 |
| 112 | 119 |
| 113 | 167 |

-continued

Table Z17, having a sequence length of 512:

| Polarized channel sequence number | Reliability or sequence number of reliability |
|---|---|
| 114 | 180 |
| 115 | 227 |
| 116 | 185 |
| 117 | 235 |
| 118 | 248 |
| 119 | 313 |
| 120 | 196 |
| 121 | 252 |
| 122 | 258 |
| 123 | 323 |
| 124 | 273 |
| 125 | 334 |
| 126 | 347 |
| 127 | 407 |
| 128 | 15 |
| 129 | 25 |
| 130 | 30 |
| 131 | 62 |
| 132 | 38 |
| 133 | 70 |
| 134 | 74 |
| 135 | 120 |
| 136 | 43 |
| 137 | 80 |
| 138 | 85 |
| 139 | 128 |
| 140 | 92 |
| 141 | 136 |
| 142 | 140 |
| 143 | 201 |
| 144 | 53 |
| 145 | 86 |
| 146 | 94 |
| 147 | 138 |
| 148 | 102 |
| 149 | 148 |
| 150 | 157 |
| 151 | 212 |
| 152 | 111 |
| 153 | 163 |
| 154 | 168 |
| 155 | 221 |
| 156 | 182 |
| 157 | 232 |
| 158 | 246 |
| 159 | 309 |
| 160 | 60 |
| 161 | 98 |
| 162 | 108 |
| 163 | 153 |
| 164 | 113 |
| 165 | 164 |
| 166 | 173 |
| 167 | 228 |
| 168 | 127 |
| 169 | 178 |
| 170 | 186 |
| 171 | 237 |
| 172 | 195 |
| 173 | 251 |
| 174 | 263 |
| 175 | 322 |
| 176 | 139 |
| 177 | 190 |
| 178 | 203 |
| 179 | 254 |
| 180 | 211 |
| 181 | 265 |
| 182 | 276 |
| 183 | 332 |
| 184 | 226 |
| 185 | 281 |
| 186 | 294 |
| 187 | 345 |

-continued

Table Z17, having a sequence length of 512:

| Polarized channel sequence number | Reliability or sequence number of reliability |
|---|---|
| 188 | 304 |
| 189 | 355 |
| 190 | 369 |
| 191 | 426 |
| 192 | 65 |
| 193 | 110 |
| 194 | 123 |
| 195 | 174 |
| 196 | 135 |
| 197 | 184 |
| 198 | 194 |
| 199 | 253 |
| 200 | 143 |
| 201 | 197 |
| 202 | 206 |
| 203 | 267 |
| 204 | 216 |
| 205 | 275 |
| 206 | 285 |
| 207 | 342 |
| 208 | 158 |
| 209 | 213 |
| 210 | 222 |
| 211 | 279 |
| 212 | 236 |
| 213 | 293 |
| 214 | 302 |
| 215 | 356 |
| 216 | 242 |
| 217 | 306 |
| 218 | 318 |
| 219 | 365 |
| 220 | 326 |
| 221 | 377 |
| 222 | 385 |
| 223 | 435 |
| 224 | 172 |
| 225 | 229 |
| 226 | 239 |
| 227 | 296 |
| 228 | 255 |
| 229 | 308 |
| 230 | 320 |
| 231 | 371 |
| 232 | 272 |
| 233 | 321 |
| 234 | 333 |
| 235 | 381 |
| 236 | 346 |
| 237 | 390 |
| 238 | 398 |
| 239 | 442 |
| 240 | 284 |
| 241 | 341 |
| 242 | 348 |
| 243 | 393 |
| 244 | 358 |
| 245 | 405 |
| 246 | 411 |
| 247 | 453 |
| 248 | 370 |
| 249 | 414 |
| 250 | 422 |
| 251 | 458 |
| 252 | 430 |
| 253 | 460 |
| 254 | 469 |
| 255 | 492 |
| 256 | 20 |
| 257 | 36 |
| 258 | 40 |
| 259 | 78 |
| 260 | 46 |
| 261 | 87 |

-continued

Table Z17, having a sequence length of 512:

| Polarized channel sequence number | Reliability or sequence number of reliability |
|---|---|
| 262 | 96 |
| 263 | 147 |
| 264 | 47 |
| 265 | 97 |
| 266 | 105 |
| 267 | 156 |
| 268 | 114 |
| 269 | 170 |
| 270 | 175 |
| 271 | 244 |
| 272 | 57 |
| 273 | 106 |
| 274 | 115 |
| 275 | 176 |
| 276 | 125 |
| 277 | 181 |
| 278 | 189 |
| 279 | 245 |
| 280 | 132 |
| 281 | 188 |
| 282 | 200 |
| 283 | 262 |
| 284 | 214 |
| 285 | 271 |
| 286 | 274 |
| 287 | 331 |
| 288 | 64 |
| 289 | 122 |
| 290 | 134 |
| 291 | 177 |
| 292 | 145 |
| 293 | 191 |
| 294 | 204 |
| 295 | 270 |
| 296 | 151 |
| 297 | 209 |
| 298 | 217 |
| 299 | 277 |
| 300 | 224 |
| 301 | 291 |
| 302 | 298 |
| 303 | 354 |
| 304 | 152 |
| 305 | 223 |
| 306 | 231 |
| 307 | 290 |
| 308 | 241 |
| 309 | 303 |
| 310 | 311 |
| 311 | 366 |
| 312 | 260 |
| 313 | 317 |
| 314 | 327 |
| 315 | 376 |
| 316 | 339 |
| 317 | 386 |
| 318 | 395 |
| 319 | 440 |
| 320 | 71 |
| 321 | 141 |
| 322 | 146 |
| 323 | 207 |
| 324 | 161 |
| 325 | 220 |
| 326 | 230 |
| 327 | 287 |
| 328 | 166 |
| 329 | 233 |
| 330 | 238 |
| 331 | 301 |
| 332 | 249 |
| 333 | 312 |
| 334 | 319 |
| 335 | 374 |

-continued

Table Z17, having a sequence length of 512:

| Polarized channel sequence number | Reliability or sequence number of reliability |
|---|---|
| 336 | 198 |
| 337 | 247 |
| 338 | 256 |
| 339 | 315 |
| 340 | 266 |
| 341 | 325 |
| 342 | 335 |
| 343 | 384 |
| 344 | 283 |
| 345 | 340 |
| 346 | 350 |
| 347 | 392 |
| 348 | 359 |
| 349 | 403 |
| 350 | 412 |
| 351 | 450 |
| 352 | 219 |
| 353 | 268 |
| 354 | 278 |
| 355 | 330 |
| 356 | 289 |
| 357 | 344 |
| 358 | 352 |
| 359 | 399 |
| 360 | 300 |
| 361 | 357 |
| 362 | 363 |
| 363 | 406 |
| 364 | 373 |
| 365 | 416 |
| 366 | 421 |
| 367 | 459 |
| 368 | 314 |
| 369 | 368 |
| 370 | 379 |
| 371 | 419 |
| 372 | 387 |
| 373 | 427 |
| 374 | 431 |
| 375 | 461 |
| 376 | 396 |
| 377 | 437 |
| 378 | 443 |
| 379 | 470 |
| 380 | 447 |
| 381 | 478 |
| 382 | 482 |
| 383 | 495 |
| 384 | 75 |
| 385 | 159 |
| 386 | 160 |
| 387 | 240 |
| 388 | 192 |
| 389 | 250 |
| 390 | 257 |
| 391 | 316 |
| 392 | 208 |
| 393 | 261 |
| 394 | 264 |
| 395 | 329 |
| 396 | 282 |
| 397 | 337 |
| 398 | 349 |
| 399 | 401 |
| 400 | 218 |
| 401 | 280 |
| 402 | 288 |
| 403 | 343 |
| 404 | 295 |
| 405 | 353 |
| 406 | 361 |
| 407 | 408 |
| 408 | 307 |
| 409 | 364 |

-continued

| Table Z17, having a sequence length of 512: | |
|---|---|
| Polarized channel sequence number | Reliability or sequence number of reliability |
| 410 | 372 |
| 411 | 415 |
| 412 | 383 |
| 413 | 423 |
| 414 | 429 |
| 415 | 465 |
| 416 | 243 |
| 417 | 292 |
| 418 | 297 |
| 419 | 360 |
| 420 | 310 |
| 421 | 367 |
| 422 | 378 |
| 423 | 420 |
| 424 | 328 |
| 425 | 380 |
| 426 | 388 |
| 427 | 428 |
| 428 | 397 |
| 429 | 433 |
| 430 | 441 |
| 431 | 471 |
| 432 | 338 |
| 433 | 391 |
| 434 | 402 |
| 435 | 438 |
| 436 | 409 |
| 437 | 445 |
| 438 | 452 |
| 439 | 475 |
| 440 | 417 |
| 441 | 455 |
| 442 | 456 |
| 443 | 481 |
| 444 | 462 |
| 445 | 484 |
| 446 | 487 |
| 447 | 501 |
| 448 | 259 |
| 449 | 305 |
| 450 | 324 |
| 451 | 382 |
| 452 | 336 |
| 453 | 389 |
| 454 | 394 |
| 455 | 434 |
| 456 | 351 |
| 457 | 400 |
| 458 | 404 |
| 459 | 444 |
| 460 | 413 |
| 461 | 448 |
| 462 | 454 |
| 463 | 477 |
| 464 | 362 |
| 465 | 410 |
| 466 | 418 |
| 467 | 451 |
| 468 | 424 |
| 469 | 457 |
| 470 | 463 |
| 471 | 485 |
| 472 | 436 |
| 473 | 467 |
| 474 | 468 |
| 475 | 488 |
| 476 | 474 |
| 477 | 491 |
| 478 | 494 |
| 479 | 504 |
| 480 | 375 |
| 481 | 425 |
| 482 | 432 |
| 483 | 464 |
| 484 | 439 |
| 485 | 466 |
| 486 | 473 |
| 487 | 489 |
| 488 | 446 |
| 489 | 472 |
| 490 | 476 |
| 491 | 493 |
| 492 | 480 |
| 493 | 496 |
| 494 | 498 |
| 495 | 506 |
| 496 | 449 |
| 497 | 479 |
| 498 | 483 |
| 499 | 497 |
| 500 | 486 |
| 501 | 499 |
| 502 | 500 |
| 503 | 507 |
| 504 | 490 |
| 505 | 502 |
| 506 | 503 |
| 507 | 508 |
| 508 | 505 |
| 509 | 509 |
| 510 | 510 |
| 511 | 511 |

Sequence Z18, having a sequence length of 256:

[0, 1, 2, 7, 3, 8, 11, 23, 4, 10, 13, 26, 16, 31, 33, 62, 5, 12, 14, 30, 19, 35, 38, 65, 21, 41, 43, 71, 49, 77, 82, 122, 6, 17, 20, 37, 22, 42, 45, 73, 27, 47, 51, 78, 55, 86, 90, 128, 32, 52, 59, 88, 61, 94, 99, 134, 68, 101, 107, 143, 112, 150, 157, 194, 9, 18, 25, 46, 28, 50, 53, 84, 34, 57, 60, 91, 67, 97, 104, 137, 39, 64, 69, 100, 74, 106, 111, 146, 80, 113, 120, 152, 127, 161, 167, 203, 44, 72, 79, 110, 87, 116, 124, 159, 92, 125, 131, 163, 138, 171, 177, 207, 102, 135, 144, 173, 148, 178, 184, 213, 155, 186, 190, 218, 196, 222, 227, 243, 15, 24, 29, 56, 36, 63, 66, 103, 40, 70, 75, 109, 81, 115, 119, 158, 48, 76, 83, 117, 89, 123, 129, 165, 96, 132, 136, 169, 145, 176, 183, 212, 54, 85, 93, 126, 98, 133, 140, 174, 108, 142, 149, 180, 154, 185, 191, 217, 118, 151, 160, 188, 164, 192, 198, 220, 172, 200, 205, 225, 209, 229, 233, 247, 58, 95, 105, 141, 114, 147, 153, 187, 121, 156, 162, 193, 168, 197, 202, 224, 130, 166, 170, 199, 179, 204, 208, 230, 182, 210, 214, 232, 219, 236, 238, 249, 139, 175, 181, 206, 189, 211, 215, 235, 195, 216, 221, 237, 226, 239, 241, 250, 201, 223, 228, 240, 231, 242, 244, 251, 234, 245, 246, 252, 248, 253, 254, 255]

| Table Z18, having a sequence length of 256: | |
|---|---|
| Polarized channel sequence number | Reliability or sequence number of reliability |
| 0 | 0 |
| 1 | 1 |
| 2 | 2 |
| 3 | 7 |
| 4 | 3 |
| 5 | 8 |
| 6 | 11 |
| 7 | 23 |
| 8 | 4 |
| 9 | 10 |
| 10 | 13 |

-continued

| Table Z18, having a sequence length of 256: | |
|---|---|
| Polarized channel sequence number | Reliability or sequence number of reliability |
| 11 | 26 |
| 12 | 16 |
| 13 | 31 |
| 14 | 33 |
| 15 | 62 |
| 16 | 5 |
| 17 | 12 |
| 18 | 14 |
| 19 | 30 |
| 20 | 19 |
| 21 | 35 |
| 22 | 38 |
| 23 | 65 |
| 24 | 21 |
| 25 | 41 |
| 26 | 43 |
| 27 | 71 |
| 28 | 49 |
| 29 | 77 |
| 30 | 82 |
| 31 | 122 |
| 32 | 6 |
| 33 | 17 |
| 34 | 20 |
| 35 | 37 |
| 36 | 22 |
| 37 | 42 |
| 38 | 45 |
| 39 | 73 |
| 40 | 27 |
| 41 | 47 |
| 42 | 51 |
| 43 | 78 |
| 44 | 55 |
| 45 | 86 |
| 46 | 90 |
| 47 | 128 |
| 48 | 32 |
| 49 | 52 |
| 50 | 59 |
| 51 | 88 |
| 52 | 61 |
| 53 | 94 |
| 54 | 99 |
| 55 | 134 |
| 56 | 68 |
| 57 | 101 |
| 58 | 107 |
| 59 | 143 |
| 60 | 112 |
| 61 | 150 |
| 62 | 157 |
| 63 | 194 |
| 64 | 9 |
| 65 | 18 |
| 66 | 25 |
| 67 | 46 |
| 68 | 28 |
| 69 | 50 |
| 70 | 53 |
| 71 | 84 |
| 72 | 34 |
| 73 | 57 |
| 74 | 60 |
| 75 | 91 |
| 76 | 67 |
| 77 | 97 |
| 78 | 104 |
| 79 | 137 |
| 80 | 39 |
| 81 | 64 |
| 82 | 69 |
| 83 | 100 |
| 84 | 74 |

-continued

| Table Z18, having a sequence length of 256: | |
|---|---|
| Polarized channel sequence number | Reliability or sequence number of reliability |
| 85 | 106 |
| 86 | 111 |
| 87 | 146 |
| 88 | 80 |
| 89 | 113 |
| 90 | 120 |
| 91 | 152 |
| 92 | 127 |
| 93 | 161 |
| 94 | 167 |
| 95 | 203 |
| 96 | 44 |
| 97 | 72 |
| 98 | 79 |
| 99 | 110 |
| 100 | 87 |
| 101 | 116 |
| 102 | 124 |
| 103 | 159 |
| 104 | 92 |
| 105 | 125 |
| 106 | 131 |
| 107 | 163 |
| 108 | 138 |
| 109 | 171 |
| 110 | 177 |
| 111 | 207 |
| 112 | 102 |
| 113 | 135 |
| 114 | 144 |
| 115 | 173 |
| 116 | 148 |
| 117 | 178 |
| 118 | 184 |
| 119 | 213 |
| 120 | 155 |
| 121 | 186 |
| 122 | 190 |
| 123 | 218 |
| 124 | 196 |
| 125 | 222 |
| 126 | 227 |
| 127 | 243 |
| 128 | 15 |
| 129 | 24 |
| 130 | 29 |
| 131 | 56 |
| 132 | 36 |
| 133 | 63 |
| 134 | 66 |
| 135 | 103 |
| 136 | 40 |
| 137 | 70 |
| 138 | 75 |
| 139 | 109 |
| 140 | 81 |
| 141 | 115 |
| 142 | 119 |
| 143 | 158 |
| 144 | 48 |
| 145 | 76 |
| 146 | 83 |
| 147 | 117 |
| 148 | 89 |
| 149 | 123 |
| 150 | 129 |
| 151 | 165 |
| 152 | 96 |
| 153 | 132 |
| 154 | 136 |
| 155 | 169 |
| 156 | 145 |
| 157 | 176 |
| 158 | 183 |

-continued

Table Z18, having a sequence length of 256:

| Polarized channel sequence number | Reliability or sequence number of reliability |
|---|---|
| 159 | 212 |
| 160 | 54 |
| 161 | 85 |
| 162 | 93 |
| 163 | 126 |
| 164 | 98 |
| 165 | 133 |
| 166 | 140 |
| 167 | 174 |
| 168 | 108 |
| 169 | 142 |
| 170 | 149 |
| 171 | 180 |
| 172 | 154 |
| 173 | 185 |
| 174 | 191 |
| 175 | 217 |
| 176 | 118 |
| 177 | 151 |
| 178 | 160 |
| 179 | 188 |
| 180 | 164 |
| 181 | 192 |
| 182 | 198 |
| 183 | 220 |
| 184 | 172 |
| 185 | 200 |
| 186 | 205 |
| 187 | 225 |
| 188 | 209 |
| 189 | 229 |
| 190 | 233 |
| 191 | 247 |
| 192 | 58 |
| 193 | 95 |
| 194 | 105 |
| 195 | 141 |
| 196 | 114 |
| 197 | 147 |
| 198 | 153 |
| 199 | 187 |
| 200 | 121 |
| 201 | 156 |
| 202 | 162 |
| 203 | 193 |
| 204 | 168 |
| 205 | 197 |
| 206 | 202 |
| 207 | 224 |
| 208 | 130 |
| 209 | 166 |
| 210 | 170 |
| 211 | 199 |
| 212 | 179 |
| 213 | 204 |
| 214 | 208 |
| 215 | 230 |
| 216 | 182 |
| 217 | 210 |
| 218 | 214 |
| 219 | 232 |
| 220 | 219 |
| 221 | 236 |
| 222 | 238 |
| 223 | 249 |
| 224 | 139 |
| 225 | 175 |
| 226 | 181 |
| 227 | 206 |
| 228 | 189 |
| 229 | 211 |
| 230 | 215 |
| 231 | 235 |
| 232 | 195 |

-continued

Table Z18, having a sequence length of 256:

| Polarized channel sequence number | Reliability or sequence number of reliability |
|---|---|
| 233 | 216 |
| 234 | 221 |
| 235 | 237 |
| 236 | 226 |
| 237 | 239 |
| 238 | 241 |
| 239 | 250 |
| 240 | 201 |
| 241 | 223 |
| 242 | 228 |
| 243 | 240 |
| 244 | 231 |
| 245 | 242 |
| 246 | 244 |
| 247 | 251 |
| 248 | 234 |
| 249 | 245 |
| 250 | 246 |
| 251 | 252 |
| 252 | 248 |
| 253 | 253 |
| 254 | 254 |
| 255 | 255 |

Sequence Z19, having a sequence length of 128:

[0, 1, 2, 7, 3, 8, 11, 22, 4, 10, 13, 24, 15, 28, 30, 53, 5, 12, 14, 27, 18, 32, 34, 55, 20, 36, 38, 59, 43, 63, 67, 90, 6, 16, 19, 33, 21, 37, 40, 61, 25, 42, 45, 64, 48, 69, 72, 94, 29, 46, 50, 71, 52, 75, 77, 96, 57, 79, 83, 100, 86, 104, 107, 119, 9, 17, 23, 41, 26, 44, 47, 68, 31, 49, 51, 73, 56, 76, 81, 98, 35, 54, 58, 78, 62, 82, 85, 102, 66, 87, 89, 105, 93, 109, 111, 121, 39, 60, 65, 84, 70, 88, 91, 108, 74, 92, 95, 110, 99, 112, 114, 122, 80, 97, 101, 113, 103, 115, 116, 123, 106, 117, 118, 124, 120, 125, 126, 127]

Table Z19, having a sequence length of 128:

| Polarized channel sequence number | Reliability or sequence number of reliability |
|---|---|
| 0 | 0 |
| 1 | 1 |
| 2 | 2 |
| 3 | 7 |
| 4 | 3 |
| 5 | 8 |
| 6 | 11 |
| 7 | 22 |
| 8 | 4 |
| 9 | 10 |
| 10 | 13 |
| 11 | 24 |
| 12 | 15 |
| 13 | 28 |
| 14 | 30 |
| 15 | 53 |
| 16 | 5 |
| 17 | 12 |
| 18 | 14 |
| 19 | 27 |
| 20 | 18 |
| 21 | 32 |
| 22 | 34 |
| 23 | 55 |
| 24 | 20 |
| 25 | 36 |
| 26 | 38 |
| 27 | 59 |
| 28 | 43 |
| 29 | 63 |

-continued

| Table Z19, having a sequence length of 128: | |
|---|---|
| Polarized channel sequence number | Reliability or sequence number of reliability |
| 30 | 67 |
| 31 | 90 |
| 32 | 6 |
| 33 | 16 |
| 34 | 19 |
| 35 | 33 |
| 36 | 21 |
| 37 | 37 |
| 38 | 40 |
| 39 | 61 |
| 40 | 25 |
| 41 | 42 |
| 42 | 45 |
| 43 | 64 |
| 44 | 48 |
| 45 | 69 |
| 46 | 72 |
| 47 | 94 |
| 48 | 29 |
| 49 | 46 |
| 50 | 50 |
| 51 | 71 |
| 52 | 52 |
| 53 | 75 |
| 54 | 77 |
| 55 | 96 |
| 56 | 57 |
| 57 | 79 |
| 58 | 83 |
| 59 | 100 |
| 60 | 86 |
| 61 | 104 |
| 62 | 107 |
| 63 | 119 |
| 64 | 9 |
| 65 | 17 |
| 66 | 23 |
| 67 | 41 |
| 68 | 26 |
| 69 | 44 |
| 70 | 47 |
| 71 | 68 |
| 72 | 31 |
| 73 | 49 |
| 74 | 51 |
| 75 | 73 |
| 76 | 56 |
| 77 | 76 |
| 78 | 81 |
| 79 | 98 |
| 80 | 35 |
| 81 | 54 |
| 82 | 58 |
| 83 | 78 |
| 84 | 62 |
| 85 | 82 |
| 86 | 85 |
| 87 | 102 |
| 88 | 66 |
| 89 | 87 |
| 90 | 89 |
| 91 | 105 |
| 92 | 93 |
| 93 | 109 |
| 94 | 111 |
| 95 | 121 |
| 96 | 39 |
| 97 | 60 |
| 98 | 65 |
| 99 | 84 |
| 100 | 70 |
| 101 | 88 |
| 102 | 91 |
| 103 | 108 |
| 104 | 74 |
| 105 | 92 |
| 106 | 95 |
| 107 | 110 |
| 108 | 99 |
| 109 | 112 |
| 110 | 114 |
| 111 | 122 |
| 112 | 80 |
| 113 | 97 |
| 114 | 101 |
| 115 | 113 |
| 116 | 103 |
| 117 | 115 |
| 118 | 116 |
| 119 | 123 |
| 120 | 106 |
| 121 | 117 |
| 122 | 118 |
| 123 | 124 |
| 124 | 120 |
| 125 | 125 |
| 126 | 126 |
| 127 | 127 |

Sequence Z20, having a sequence length of 64:

[0, 1, 2, 7, 3, 8, 10, 20, 4, 9, 12, 21, 14, 24, 26, 41, 5, 11, 13, 23, 16, 27, 29, 42, 18, 30, 32, 44, 35, 46, 48, 57, 6, 15, 17, 28, 19, 31, 33, 45, 22, 34, 36, 47, 38, 49, 51, 58, 25, 37, 39, 50, 40, 52, 53, 59, 43, 54, 55, 60, 56, 61, 62, 63]

| Table Z20, having a sequence length of 64: | |
|---|---|
| Polarized channel sequence number | Reliability or sequence number of reliability |
| 0 | 0 |
| 1 | 1 |
| 2 | 2 |
| 3 | 7 |
| 4 | 3 |
| 5 | 8 |
| 6 | 10 |
| 7 | 20 |
| 8 | 4 |
| 9 | 9 |
| 10 | 12 |
| 11 | 21 |
| 12 | 14 |
| 13 | 24 |
| 14 | 26 |
| 15 | 41 |
| 16 | 5 |
| 17 | 11 |
| 18 | 13 |
| 19 | 23 |
| 20 | 16 |
| 21 | 27 |
| 22 | 29 |
| 23 | 42 |
| 24 | 18 |
| 25 | 30 |
| 26 | 32 |
| 27 | 44 |
| 28 | 35 |
| 29 | 46 |
| 30 | 48 |
| 31 | 57 |
| 32 | 6 |
| 33 | 15 |
| 34 | 17 |

-continued

| Table Z20, having a sequence length of 64: | |
|---|---|
| Polarized channel sequence number | Reliability or sequence number of reliability |
| 35 | 28 |
| 36 | 19 |
| 37 | 31 |
| 38 | 33 |
| 39 | 45 |
| 40 | 22 |
| 41 | 34 |
| 42 | 36 |
| 43 | 47 |
| 44 | 38 |
| 45 | 49 |
| 46 | 51 |
| 47 | 58 |
| 48 | 25 |
| 49 | 37 |
| 50 | 39 |
| 51 | 50 |
| 52 | 40 |
| 53 | 52 |
| 54 | 53 |
| 55 | 59 |
| 56 | 43 |
| 57 | 54 |
| 58 | 55 |
| 59 | 60 |
| 60 | 56 |
| 61 | 61 |
| 62 | 62 |
| 63 | 63 |

Fifth group of sequences (a criterion that preferentially considers a minimum code distance).

Sequence Q21, having a sequence length of 1024:

[0, 1, 2, 4, 8, 16, 32, 3, 5, 64, 6, 9, 17, 10, 18, 128, 12, 33, 256, 20, 34, 24, 65, 36, 7, 129, 66, 512, 11, 40, 68, 19, 13, 130, 48, 14, 72, 257, 21, 132, 35, 258, 26, 513, 80, 37, 25, 22, 136, 96, 260, 38, 514, 264, 67, 41, 144, 28, 69, 42, 516, 49, 160, 272, 70, 520, 288, 528, 131, 44, 544, 73, 192, 50, 74, 52, 15, 133, 320, 81, 23, 134, 76, 137, 82, 384, 56, 27, 97, 39, 259, 84, 138, 145, 261, 29, 43, 98, 515, 88, 140, 30, 146, 71, 262, 265, 517, 161, 45, 576, 518, 100, 51, 148, 521, 46, 75, 640, 266, 273, 522, 104, 162, 53, 193, 152, 77, 164, 268, 274, 54, 83, 530, 57, 112, 529, 524, 135, 78, 289, 194, 85, 276, 58, 168, 139, 99, 86, 60, 89, 768, 196, 290, 141, 101, 280, 545, 546, 532, 147, 176, 142, 90, 536, 292, 200, 263, 31, 149, 321, 322, 577, 102, 105, 296, 163, 92, 47, 150, 548, 208, 324, 385, 304, 267, 578, 106, 153, 386, 165, 55, 328, 113, 519, 552, 641, 154, 79, 108, 224, 269, 166, 523, 560, 580, 195, 277, 169, 275, 291, 59, 270, 114, 156, 87, 197, 116, 170, 61, 525, 531, 177, 278, 281, 526, 642, 293, 388, 91, 584, 769, 198, 172, 120, 201, 62, 143, 336, 282, 103, 178, 294, 93, 533, 644, 534, 547, 770, 392, 297, 592, 323, 202, 284, 151, 209, 180, 107, 325, 94, 537, 400, 298, 204, 352, 305, 155, 300, 210, 608, 648, 109, 184, 115, 167, 225, 326, 157, 110, 772, 549, 656, 538, 117, 212, 330, 171, 550, 329, 306, 226, 387, 308, 271, 579, 416, 216, 337, 158, 776, 118, 540, 553, 279, 332, 389, 173, 121, 199, 179, 228, 283, 122, 393, 174, 312, 672, 390, 554, 556, 203, 561, 181, 295, 448, 353, 338, 63, 581, 340, 285, 394, 232, 124, 354, 582, 784, 704, 527, 286, 182, 562, 643, 585, 205, 299, 211, 401, 185, 396, 240, 586, 645, 593, 535, 301, 402, 344, 206, 564, 800, 327, 356, 307, 95, 417, 213, 186, 404, 111, 539, 568, 594, 649, 771, 302, 832, 588, 646, 227, 360, 214, 188, 551, 609, 896, 331, 309, 418, 449, 217, 408, 229, 541, 159, 420, 596, 650, 773, 310, 333, 119, 368, 339, 391, 657, 313, 218, 542, 610, 334, 230, 233, 774, 658, 612, 175, 123, 450, 652, 341, 220, 557, 314, 555, 600, 583, 424, 395, 777, 673, 355, 287, 183, 234, 125, 342, 563, 674, 616, 558, 660, 778, 452, 397, 432, 316, 345, 241, 207, 785, 403, 357, 187, 587, 565, 664, 624, 780, 236, 126, 242, 398, 705, 346, 456, 358, 405, 303, 569, 595, 189, 786, 215, 676, 589, 566, 647, 361, 706, 244, 348, 419, 406, 311, 708, 219, 598, 601, 651, 611, 409, 680, 788, 362, 570, 597, 572, 464, 801, 590, 421, 802, 369, 792, 190, 602, 653, 248, 688, 231, 410, 364, 335, 422, 613, 659, 654, 315, 221, 370, 425, 235, 451, 480, 775, 412, 614, 343, 222, 317, 372, 543, 426, 453, 237, 559, 833, 804, 712, 834, 661, 808, 779, 617, 604, 433, 720, 816, 836, 347, 897, 243, 662, 454, 318, 675, 376, 428, 625, 238, 359, 567, 618, 665, 736, 898, 457, 399, 781, 591, 666, 678, 349, 434, 677, 840, 782, 626, 571, 620, 787, 363, 245, 458, 127, 407, 436, 465, 350, 246, 681, 460, 249, 599, 411, 365, 668, 707, 573, 789, 803, 790, 682, 440, 709, 466, 628, 371, 423, 366, 250, 413, 574, 468, 603, 481, 689, 793, 191, 373, 655, 900, 805, 427, 615, 710, 414, 252, 848, 684, 713, 605, 690, 632, 482, 794, 806, 472, 223, 663, 835, 904, 809, 714, 619, 796, 374, 429, 455, 692, 721, 837, 716, 864, 810, 606, 912, 722, 696, 377, 817, 435, 812, 484, 319, 430, 621, 838, 667, 239, 378, 459, 437, 627, 622, 488, 380, 461, 679, 841, 818, 724, 669, 496, 629, 928, 737, 899, 783, 738, 901, 842, 438, 467, 247, 820, 849, 683, 351, 791, 441, 728, 670, 462, 469, 442, 251, 367, 630, 740, 902, 711, 844, 850, 905, 685, 691, 824, 633, 483, 795, 744, 470, 852, 686, 444, 473, 253, 634, 485, 415, 375, 960, 865, 575, 807, 906, 715, 913, 693, 797, 866, 811, 717, 474, 254, 694, 723, 636, 486, 798, 607, 697, 489, 431, 379, 908, 752, 914, 856, 868, 839, 929, 813, 718, 819, 476, 916, 725, 698, 490, 739, 814, 843, 623, 497, 439, 381, 671, 463, 726, 930, 872, 821, 920, 700, 729, 492, 932, 961, 741, 903, 845, 498, 880, 382, 822, 851, 631, 443, 825, 730, 471, 445, 687, 635, 742, 846, 500, 745, 826, 732, 446, 962, 936, 255, 853, 504, 637, 907, 475, 746, 867, 487, 695, 799, 854, 828, 753, 857, 964, 909, 719, 477, 915, 869, 699, 748, 944, 638, 754, 491, 910, 858, 478, 815, 727, 917, 870, 493, 873, 701, 968, 383, 860, 756, 918, 931, 976, 499, 921, 874, 702, 823, 494, 731, 760, 881, 933, 501, 743, 922, 876, 847, 934, 827, 733, 502, 992, 882, 447, 963, 937, 747, 505, 855, 924, 734, 829, 884, 938, 506, 965, 749, 945, 966, 940, 969, 911, 946, 755, 888, 830, 859, 639, 871, 970, 750, 508, 948, 977, 757, 479, 919, 861, 875, 972, 978, 758, 862, 952, 761, 993, 923, 703, 495, 935, 877, 883, 980, 762, 925, 994, 878, 503, 885, 939, 984, 764, 996, 926, 735, 967, 886, 941, 507, 947, 889, 831, 1000, 942, 971, 751, 509, 949, 890, 973, 1008, 510, 950, 979, 759, 892, 863, 953, 974, 981, 954, 763, 995, 879, 982, 956, 985, 765, 997, 927, 887, 986, 766, 998, 1001, 943, 891, 988, 1002, 1009, 511, 951, 893, 1004, 975, 1010, 894, 955, 1012, 983, 957, 1016, 958, 987, 767, 999, 989, 1003, 990, 1005, 1011, 895, 1006, 1013, 1014, 1017, 959, 1018, 1020, 991, 1007, 1015, 1019, 1021, 1022, 1023]

| Table Q21, having a sequence length of 1024: | |
|---|---|
| Reliability or sequence number of reliability | Polarized channel sequence number |
| 0 | 0 |
| 1 | 1 |
| 2 | 2 |
| 3 | 4 |
| 4 | 8 |
| 5 | 16 |
| 6 | 32 |
| 7 | 3 |
| 8 | 5 |
| 9 | 64 |

-continued

Table Q21, having a sequence length of 1024:

| Reliability or sequence number of reliability | Polarized channel sequence number |
|---|---|
| 10 | 6 |
| 11 | 9 |
| 12 | 17 |
| 13 | 10 |
| 14 | 18 |
| 15 | 128 |
| 16 | 12 |
| 17 | 33 |
| 18 | 256 |
| 19 | 20 |
| 20 | 34 |
| 21 | 24 |
| 22 | 65 |
| 23 | 36 |
| 24 | 7 |
| 25 | 129 |
| 26 | 66 |
| 27 | 512 |
| 28 | 11 |
| 29 | 40 |
| 30 | 68 |
| 31 | 19 |
| 32 | 13 |
| 33 | 130 |
| 34 | 48 |
| 35 | 14 |
| 36 | 72 |
| 37 | 257 |
| 38 | 21 |
| 39 | 132 |
| 40 | 35 |
| 41 | 258 |
| 42 | 26 |
| 43 | 513 |
| 44 | 80 |
| 45 | 37 |
| 46 | 25 |
| 47 | 22 |
| 48 | 136 |
| 49 | 96 |
| 50 | 260 |
| 51 | 38 |
| 52 | 514 |
| 53 | 264 |
| 54 | 67 |
| 55 | 41 |
| 56 | 144 |
| 57 | 28 |
| 58 | 69 |
| 59 | 42 |
| 60 | 516 |
| 61 | 49 |
| 62 | 160 |
| 63 | 272 |
| 64 | 70 |
| 65 | 520 |
| 66 | 288 |
| 67 | 528 |
| 68 | 131 |
| 69 | 44 |
| 70 | 544 |
| 71 | 73 |
| 72 | 192 |
| 73 | 50 |
| 74 | 74 |
| 75 | 52 |
| 76 | 15 |
| 77 | 133 |
| 78 | 320 |
| 79 | 81 |
| 80 | 23 |
| 81 | 134 |
| 82 | 76 |

-continued

Table Q21, having a sequence length of 1024:

| Reliability or sequence number of reliability | Polarized channel sequence number |
|---|---|
| 83 | 137 |
| 84 | 82 |
| 85 | 384 |
| 86 | 56 |
| 87 | 27 |
| 88 | 97 |
| 89 | 39 |
| 90 | 259 |
| 91 | 84 |
| 92 | 138 |
| 93 | 145 |
| 94 | 261 |
| 95 | 29 |
| 96 | 43 |
| 97 | 98 |
| 98 | 515 |
| 99 | 88 |
| 100 | 140 |
| 101 | 30 |
| 102 | 146 |
| 103 | 71 |
| 104 | 262 |
| 105 | 265 |
| 106 | 517 |
| 107 | 161 |
| 108 | 45 |
| 109 | 576 |
| 110 | 518 |
| 111 | 100 |
| 112 | 51 |
| 113 | 148 |
| 114 | 521 |
| 115 | 46 |
| 116 | 75 |
| 117 | 640 |
| 118 | 266 |
| 119 | 273 |
| 120 | 522 |
| 121 | 104 |
| 122 | 162 |
| 123 | 53 |
| 124 | 193 |
| 125 | 152 |
| 126 | 77 |
| 127 | 164 |
| 128 | 268 |
| 129 | 274 |
| 130 | 54 |
| 131 | 83 |
| 132 | 530 |
| 133 | 57 |
| 134 | 112 |
| 135 | 529 |
| 136 | 524 |
| 137 | 135 |
| 138 | 78 |
| 139 | 289 |
| 140 | 194 |
| 141 | 85 |
| 142 | 276 |
| 143 | 58 |
| 144 | 168 |
| 145 | 139 |
| 146 | 99 |
| 147 | 86 |
| 148 | 60 |
| 149 | 89 |
| 150 | 768 |
| 151 | 196 |
| 152 | 290 |
| 153 | 141 |
| 154 | 101 |
| 155 | 280 |

-continued

Table Q21, having a sequence length of 1024:

| Reliability or sequence number of reliability | Polarized channel sequence number |
|---|---|
| 156 | 545 |
| 157 | 546 |
| 158 | 532 |
| 159 | 147 |
| 160 | 176 |
| 161 | 142 |
| 162 | 90 |
| 163 | 536 |
| 164 | 292 |
| 165 | 200 |
| 166 | 263 |
| 167 | 31 |
| 168 | 149 |
| 169 | 321 |
| 170 | 322 |
| 171 | 577 |
| 172 | 102 |
| 173 | 105 |
| 174 | 296 |
| 175 | 163 |
| 176 | 92 |
| 177 | 47 |
| 178 | 150 |
| 179 | 548 |
| 180 | 208 |
| 181 | 324 |
| 182 | 385 |
| 183 | 304 |
| 184 | 267 |
| 185 | 578 |
| 186 | 106 |
| 187 | 153 |
| 188 | 386 |
| 189 | 165 |
| 190 | 55 |
| 191 | 328 |
| 192 | 113 |
| 193 | 519 |
| 194 | 552 |
| 195 | 641 |
| 196 | 154 |
| 197 | 79 |
| 198 | 108 |
| 199 | 224 |
| 200 | 269 |
| 201 | 166 |
| 202 | 523 |
| 203 | 560 |
| 204 | 580 |
| 205 | 195 |
| 206 | 277 |
| 207 | 169 |
| 208 | 275 |
| 209 | 291 |
| 210 | 59 |
| 211 | 270 |
| 212 | 114 |
| 213 | 156 |
| 214 | 87 |
| 215 | 197 |
| 216 | 116 |
| 217 | 170 |
| 218 | 61 |
| 219 | 525 |
| 220 | 531 |
| 221 | 177 |
| 222 | 278 |
| 223 | 281 |
| 224 | 526 |
| 225 | 642 |
| 226 | 293 |
| 227 | 388 |
| 228 | 91 |

-continued

Table Q21, having a sequence length of 1024:

| Reliability or sequence number of reliability | Polarized channel sequence number |
|---|---|
| 229 | 584 |
| 230 | 769 |
| 231 | 198 |
| 232 | 172 |
| 233 | 120 |
| 234 | 201 |
| 235 | 62 |
| 236 | 143 |
| 237 | 336 |
| 238 | 282 |
| 239 | 103 |
| 240 | 178 |
| 241 | 294 |
| 242 | 93 |
| 243 | 533 |
| 244 | 644 |
| 245 | 534 |
| 246 | 547 |
| 247 | 770 |
| 248 | 392 |
| 249 | 297 |
| 250 | 592 |
| 251 | 323 |
| 252 | 202 |
| 253 | 284 |
| 254 | 151 |
| 255 | 209 |
| 256 | 180 |
| 257 | 107 |
| 258 | 325 |
| 259 | 94 |
| 260 | 537 |
| 261 | 400 |
| 262 | 298 |
| 263 | 204 |
| 264 | 352 |
| 265 | 305 |
| 266 | 155 |
| 267 | 300 |
| 268 | 210 |
| 269 | 608 |
| 270 | 648 |
| 271 | 109 |
| 272 | 184 |
| 273 | 115 |
| 274 | 167 |
| 275 | 225 |
| 276 | 326 |
| 277 | 157 |
| 278 | 110 |
| 279 | 772 |
| 280 | 549 |
| 281 | 656 |
| 282 | 538 |
| 283 | 117 |
| 284 | 212 |
| 285 | 330 |
| 286 | 171 |
| 287 | 550 |
| 288 | 329 |
| 289 | 306 |
| 290 | 226 |
| 291 | 387 |
| 292 | 308 |
| 293 | 271 |
| 294 | 579 |
| 295 | 416 |
| 296 | 216 |
| 297 | 337 |
| 298 | 158 |
| 299 | 776 |
| 300 | 118 |
| 301 | 540 |

-continued

Table Q21, having a sequence length of 1024:

| Reliability or sequence number of reliability | Polarized channel sequence number |
|---|---|
| 302 | 553 |
| 303 | 279 |
| 304 | 332 |
| 305 | 389 |
| 306 | 173 |
| 307 | 121 |
| 308 | 199 |
| 309 | 179 |
| 310 | 228 |
| 311 | 283 |
| 312 | 122 |
| 313 | 393 |
| 314 | 174 |
| 315 | 312 |
| 316 | 672 |
| 317 | 390 |
| 318 | 554 |
| 319 | 556 |
| 320 | 203 |
| 321 | 561 |
| 322 | 181 |
| 323 | 295 |
| 324 | 448 |
| 325 | 353 |
| 326 | 338 |
| 327 | 63 |
| 328 | 581 |
| 329 | 340 |
| 330 | 285 |
| 331 | 394 |
| 332 | 232 |
| 333 | 124 |
| 334 | 354 |
| 335 | 582 |
| 336 | 784 |
| 337 | 704 |
| 338 | 527 |
| 339 | 286 |
| 340 | 182 |
| 341 | 562 |
| 342 | 643 |
| 343 | 585 |
| 344 | 205 |
| 345 | 299 |
| 346 | 211 |
| 347 | 401 |
| 348 | 185 |
| 349 | 396 |
| 350 | 240 |
| 351 | 586 |
| 352 | 645 |
| 353 | 593 |
| 354 | 535 |
| 355 | 301 |
| 356 | 402 |
| 357 | 344 |
| 358 | 206 |
| 359 | 564 |
| 360 | 800 |
| 361 | 327 |
| 362 | 356 |
| 363 | 307 |
| 364 | 95 |
| 365 | 417 |
| 366 | 213 |
| 367 | 186 |
| 368 | 404 |
| 369 | 111 |
| 370 | 539 |
| 371 | 568 |
| 372 | 594 |
| 373 | 649 |
| 374 | 771 |

-continued

Table Q21, having a sequence length of 1024:

| Reliability or sequence number of reliability | Polarized channel sequence number |
|---|---|
| 375 | 302 |
| 376 | 832 |
| 377 | 588 |
| 378 | 646 |
| 379 | 227 |
| 380 | 360 |
| 381 | 214 |
| 382 | 188 |
| 383 | 551 |
| 384 | 609 |
| 385 | 896 |
| 386 | 331 |
| 387 | 309 |
| 388 | 418 |
| 389 | 449 |
| 390 | 217 |
| 391 | 408 |
| 392 | 229 |
| 393 | 541 |
| 394 | 159 |
| 395 | 420 |
| 396 | 596 |
| 397 | 650 |
| 398 | 773 |
| 399 | 310 |
| 400 | 333 |
| 401 | 119 |
| 402 | 368 |
| 403 | 339 |
| 404 | 391 |
| 405 | 657 |
| 406 | 313 |
| 407 | 218 |
| 408 | 542 |
| 409 | 610 |
| 410 | 334 |
| 411 | 230 |
| 412 | 233 |
| 413 | 774 |
| 414 | 658 |
| 415 | 612 |
| 416 | 175 |
| 417 | 123 |
| 418 | 450 |
| 419 | 652 |
| 420 | 341 |
| 421 | 220 |
| 422 | 557 |
| 423 | 314 |
| 424 | 555 |
| 425 | 600 |
| 426 | 583 |
| 427 | 424 |
| 428 | 395 |
| 429 | 777 |
| 430 | 673 |
| 431 | 355 |
| 432 | 287 |
| 433 | 183 |
| 434 | 234 |
| 435 | 125 |
| 436 | 342 |
| 437 | 563 |
| 438 | 674 |
| 439 | 616 |
| 440 | 558 |
| 441 | 660 |
| 442 | 778 |
| 443 | 452 |
| 444 | 397 |
| 445 | 432 |
| 446 | 316 |
| 447 | 345 |

| Table Q21, having a sequence length of 1024: | |
|---|---|
| Reliability or sequence number of reliability | Polarized channel sequence number |
| 448 | 241 |
| 449 | 207 |
| 450 | 785 |
| 451 | 403 |
| 452 | 357 |
| 453 | 187 |
| 454 | 587 |
| 455 | 565 |
| 456 | 664 |
| 457 | 624 |
| 458 | 780 |
| 459 | 236 |
| 460 | 126 |
| 461 | 242 |
| 462 | 398 |
| 463 | 705 |
| 464 | 346 |
| 465 | 456 |
| 466 | 358 |
| 467 | 405 |
| 468 | 303 |
| 469 | 569 |
| 470 | 595 |
| 471 | 189 |
| 472 | 786 |
| 473 | 215 |
| 474 | 676 |
| 475 | 589 |
| 476 | 566 |
| 477 | 647 |
| 478 | 361 |
| 479 | 706 |
| 480 | 244 |
| 481 | 348 |
| 482 | 419 |
| 483 | 406 |
| 484 | 311 |
| 485 | 708 |
| 486 | 219 |
| 487 | 598 |
| 488 | 601 |
| 489 | 651 |
| 490 | 611 |
| 491 | 409 |
| 492 | 680 |
| 493 | 788 |
| 494 | 362 |
| 495 | 570 |
| 496 | 597 |
| 497 | 572 |
| 498 | 464 |
| 499 | 801 |
| 500 | 590 |
| 501 | 421 |
| 502 | 802 |
| 503 | 369 |
| 504 | 792 |
| 505 | 190 |
| 506 | 602 |
| 507 | 653 |
| 508 | 248 |
| 509 | 688 |
| 510 | 231 |
| 511 | 410 |
| 512 | 364 |
| 513 | 335 |
| 514 | 422 |
| 515 | 613 |
| 516 | 659 |
| 517 | 654 |
| 518 | 315 |
| 519 | 221 |
| 520 | 370 |

| Table Q21, having a sequence length of 1024: | |
|---|---|
| Reliability or sequence number of reliability | Polarized channel sequence number |
| 521 | 425 |
| 522 | 235 |
| 523 | 451 |
| 524 | 480 |
| 525 | 775 |
| 526 | 412 |
| 527 | 614 |
| 528 | 343 |
| 529 | 222 |
| 530 | 317 |
| 531 | 372 |
| 532 | 543 |
| 533 | 426 |
| 534 | 453 |
| 535 | 237 |
| 536 | 559 |
| 537 | 833 |
| 538 | 804 |
| 539 | 712 |
| 540 | 834 |
| 541 | 661 |
| 542 | 808 |
| 543 | 779 |
| 544 | 617 |
| 545 | 604 |
| 546 | 433 |
| 547 | 720 |
| 548 | 816 |
| 549 | 836 |
| 550 | 347 |
| 551 | 897 |
| 552 | 243 |
| 553 | 662 |
| 554 | 454 |
| 555 | 318 |
| 556 | 675 |
| 557 | 376 |
| 558 | 428 |
| 559 | 625 |
| 560 | 238 |
| 561 | 359 |
| 562 | 567 |
| 563 | 618 |
| 564 | 665 |
| 565 | 736 |
| 566 | 898 |
| 567 | 457 |
| 568 | 399 |
| 569 | 781 |
| 570 | 591 |
| 571 | 666 |
| 572 | 678 |
| 573 | 349 |
| 574 | 434 |
| 575 | 677 |
| 576 | 840 |
| 577 | 782 |
| 578 | 626 |
| 579 | 571 |
| 580 | 620 |
| 581 | 787 |
| 582 | 363 |
| 583 | 245 |
| 584 | 458 |
| 585 | 127 |
| 586 | 407 |
| 587 | 436 |
| 588 | 465 |
| 589 | 350 |
| 590 | 246 |
| 591 | 681 |
| 592 | 460 |
| 593 | 249 |

-continued

| Table Q21, having a sequence length of 1024: | |
|---|---|
| Reliability or sequence number of reliability | Polarized channel sequence number |
| 594 | 599 |
| 595 | 411 |
| 596 | 365 |
| 597 | 668 |
| 598 | 707 |
| 599 | 573 |
| 600 | 789 |
| 601 | 803 |
| 602 | 790 |
| 603 | 682 |
| 604 | 440 |
| 605 | 709 |
| 606 | 466 |
| 607 | 628 |
| 608 | 371 |
| 609 | 423 |
| 610 | 366 |
| 611 | 250 |
| 612 | 413 |
| 613 | 574 |
| 614 | 468 |
| 615 | 603 |
| 616 | 481 |
| 617 | 689 |
| 618 | 793 |
| 619 | 191 |
| 620 | 373 |
| 621 | 655 |
| 622 | 900 |
| 623 | 805 |
| 624 | 427 |
| 625 | 615 |
| 626 | 710 |
| 627 | 414 |
| 628 | 252 |
| 629 | 848 |
| 630 | 684 |
| 631 | 713 |
| 632 | 605 |
| 633 | 690 |
| 634 | 632 |
| 635 | 482 |
| 636 | 794 |
| 637 | 806 |
| 638 | 472 |
| 639 | 223 |
| 640 | 663 |
| 641 | 835 |
| 642 | 904 |
| 643 | 809 |
| 644 | 714 |
| 645 | 619 |
| 646 | 796 |
| 647 | 374 |
| 648 | 429 |
| 649 | 455 |
| 650 | 692 |
| 651 | 721 |
| 652 | 837 |
| 653 | 716 |
| 654 | 864 |
| 655 | 810 |
| 656 | 606 |
| 657 | 912 |
| 658 | 722 |
| 659 | 696 |
| 660 | 377 |
| 661 | 817 |
| 662 | 435 |
| 663 | 812 |
| 664 | 484 |
| 665 | 319 |
| 666 | 430 |

-continued

| Table Q21, having a sequence length of 1024: | |
|---|---|
| Reliability or sequence number of reliability | Polarized channel sequence number |
| 667 | 621 |
| 668 | 838 |
| 669 | 667 |
| 670 | 239 |
| 671 | 378 |
| 672 | 459 |
| 673 | 437 |
| 674 | 627 |
| 675 | 622 |
| 676 | 488 |
| 677 | 380 |
| 678 | 461 |
| 679 | 679 |
| 680 | 841 |
| 681 | 818 |
| 682 | 724 |
| 683 | 669 |
| 684 | 496 |
| 685 | 629 |
| 686 | 928 |
| 687 | 737 |
| 688 | 899 |
| 689 | 783 |
| 690 | 738 |
| 691 | 901 |
| 692 | 842 |
| 693 | 438 |
| 694 | 467 |
| 695 | 247 |
| 696 | 820 |
| 697 | 849 |
| 698 | 683 |
| 699 | 351 |
| 700 | 791 |
| 701 | 441 |
| 702 | 728 |
| 703 | 670 |
| 704 | 462 |
| 705 | 469 |
| 706 | 442 |
| 707 | 251 |
| 708 | 367 |
| 709 | 630 |
| 710 | 740 |
| 711 | 902 |
| 712 | 711 |
| 713 | 844 |
| 714 | 850 |
| 715 | 905 |
| 716 | 685 |
| 717 | 691 |
| 718 | 824 |
| 719 | 633 |
| 720 | 483 |
| 721 | 795 |
| 722 | 744 |
| 723 | 470 |
| 724 | 852 |
| 725 | 686 |
| 726 | 444 |
| 727 | 473 |
| 728 | 253 |
| 729 | 634 |
| 730 | 485 |
| 731 | 415 |
| 732 | 375 |
| 733 | 960 |
| 734 | 865 |
| 735 | 575 |
| 736 | 807 |
| 737 | 906 |
| 738 | 715 |
| 739 | 913 |

-continued

Table Q21, having a sequence length of 1024:

| Reliability or sequence number of reliability | Polarized channel sequence number |
|---|---|
| 740 | 693 |
| 741 | 797 |
| 742 | 866 |
| 743 | 811 |
| 744 | 717 |
| 745 | 474 |
| 746 | 254 |
| 747 | 694 |
| 748 | 723 |
| 749 | 636 |
| 750 | 486 |
| 751 | 798 |
| 752 | 607 |
| 753 | 697 |
| 754 | 489 |
| 755 | 431 |
| 756 | 379 |
| 757 | 908 |
| 758 | 752 |
| 759 | 914 |
| 760 | 856 |
| 761 | 868 |
| 762 | 839 |
| 763 | 929 |
| 764 | 813 |
| 765 | 718 |
| 766 | 819 |
| 767 | 476 |
| 768 | 916 |
| 769 | 725 |
| 770 | 698 |
| 771 | 490 |
| 772 | 739 |
| 773 | 814 |
| 774 | 843 |
| 775 | 623 |
| 776 | 497 |
| 777 | 439 |
| 778 | 381 |
| 779 | 671 |
| 780 | 463 |
| 781 | 726 |
| 782 | 930 |
| 783 | 872 |
| 784 | 821 |
| 785 | 920 |
| 786 | 700 |
| 787 | 729 |
| 788 | 492 |
| 789 | 932 |
| 790 | 961 |
| 791 | 741 |
| 792 | 903 |
| 793 | 845 |
| 794 | 498 |
| 795 | 880 |
| 796 | 382 |
| 797 | 822 |
| 798 | 851 |
| 799 | 631 |
| 800 | 443 |
| 801 | 825 |
| 802 | 730 |
| 803 | 471 |
| 804 | 445 |
| 805 | 687 |
| 806 | 635 |
| 807 | 742 |
| 808 | 846 |
| 809 | 500 |
| 810 | 745 |
| 811 | 826 |
| 812 | 732 |

-continued

Table Q21, having a sequence length of 1024:

| Reliability or sequence number of reliability | Polarized channel sequence number |
|---|---|
| 813 | 446 |
| 814 | 962 |
| 815 | 936 |
| 816 | 255 |
| 817 | 853 |
| 818 | 504 |
| 819 | 637 |
| 820 | 907 |
| 821 | 475 |
| 822 | 746 |
| 823 | 867 |
| 824 | 487 |
| 825 | 695 |
| 826 | 799 |
| 827 | 854 |
| 828 | 828 |
| 829 | 753 |
| 830 | 857 |
| 831 | 964 |
| 832 | 909 |
| 833 | 719 |
| 834 | 477 |
| 835 | 915 |
| 836 | 869 |
| 837 | 699 |
| 838 | 748 |
| 839 | 944 |
| 840 | 638 |
| 841 | 754 |
| 842 | 491 |
| 843 | 910 |
| 844 | 858 |
| 845 | 478 |
| 846 | 815 |
| 847 | 727 |
| 848 | 917 |
| 849 | 870 |
| 850 | 493 |
| 851 | 873 |
| 852 | 701 |
| 853 | 968 |
| 854 | 383 |
| 855 | 860 |
| 856 | 756 |
| 857 | 918 |
| 858 | 931 |
| 859 | 976 |
| 860 | 499 |
| 861 | 921 |
| 862 | 874 |
| 863 | 702 |
| 864 | 823 |
| 865 | 494 |
| 866 | 731 |
| 867 | 760 |
| 868 | 881 |
| 869 | 933 |
| 870 | 501 |
| 871 | 743 |
| 872 | 922 |
| 873 | 876 |
| 874 | 847 |
| 875 | 934 |
| 876 | 827 |
| 877 | 733 |
| 878 | 502 |
| 879 | 992 |
| 880 | 882 |
| 881 | 447 |
| 882 | 963 |
| 883 | 937 |
| 884 | 747 |
| 885 | 505 |

-continued

Table Q21, having a sequence length of 1024:

| Reliability or sequence number of reliability | Polarized channel sequence number |
|---|---|
| 886 | 855 |
| 887 | 924 |
| 888 | 734 |
| 889 | 829 |
| 890 | 884 |
| 891 | 938 |
| 892 | 506 |
| 893 | 965 |
| 894 | 749 |
| 895 | 945 |
| 896 | 966 |
| 897 | 940 |
| 898 | 969 |
| 899 | 911 |
| 900 | 946 |
| 901 | 755 |
| 902 | 888 |
| 903 | 830 |
| 904 | 859 |
| 905 | 639 |
| 906 | 871 |
| 907 | 970 |
| 908 | 750 |
| 909 | 508 |
| 910 | 948 |
| 911 | 977 |
| 912 | 757 |
| 913 | 479 |
| 914 | 919 |
| 915 | 861 |
| 916 | 875 |
| 917 | 972 |
| 918 | 978 |
| 919 | 758 |
| 920 | 862 |
| 921 | 952 |
| 922 | 761 |
| 923 | 993 |
| 924 | 923 |
| 925 | 703 |
| 926 | 495 |
| 927 | 935 |
| 928 | 877 |
| 929 | 883 |
| 930 | 980 |
| 931 | 762 |
| 932 | 925 |
| 933 | 994 |
| 934 | 878 |
| 935 | 503 |
| 936 | 885 |
| 937 | 939 |
| 938 | 984 |
| 939 | 764 |
| 940 | 996 |
| 941 | 926 |
| 942 | 735 |
| 943 | 967 |
| 944 | 886 |
| 945 | 941 |
| 946 | 507 |
| 947 | 947 |
| 948 | 889 |
| 949 | 831 |
| 950 | 1000 |
| 951 | 942 |
| 952 | 971 |
| 953 | 751 |
| 954 | 509 |
| 955 | 949 |
| 956 | 890 |
| 957 | 973 |
| 958 | 1008 |

-continued

Table Q21, having a sequence length of 1024:

| Reliability or sequence number of reliability | Polarized channel sequence number |
|---|---|
| 959 | 510 |
| 960 | 950 |
| 961 | 979 |
| 962 | 759 |
| 963 | 892 |
| 964 | 863 |
| 965 | 953 |
| 966 | 974 |
| 967 | 981 |
| 968 | 954 |
| 969 | 763 |
| 970 | 995 |
| 971 | 879 |
| 972 | 982 |
| 973 | 956 |
| 974 | 985 |
| 975 | 765 |
| 976 | 997 |
| 977 | 927 |
| 978 | 887 |
| 979 | 986 |
| 980 | 766 |
| 981 | 998 |
| 982 | 1001 |
| 983 | 943 |
| 984 | 891 |
| 985 | 988 |
| 986 | 1002 |
| 987 | 1009 |
| 988 | 511 |
| 989 | 951 |
| 990 | 893 |
| 991 | 1004 |
| 992 | 975 |
| 993 | 1010 |
| 994 | 894 |
| 995 | 955 |
| 996 | 1012 |
| 997 | 983 |
| 998 | 957 |
| 999 | 1016 |
| 1000 | 958 |
| 1001 | 987 |
| 1002 | 767 |
| 1003 | 999 |
| 1004 | 989 |
| 1005 | 1003 |
| 1006 | 990 |
| 1007 | 1005 |
| 1008 | 1011 |
| 1009 | 895 |
| 1010 | 1006 |
| 1011 | 1013 |
| 1012 | 1014 |
| 1013 | 1017 |
| 1014 | 959 |
| 1015 | 1018 |
| 1016 | 1020 |
| 1017 | 991 |
| 1018 | 1007 |
| 1019 | 1015 |
| 1020 | 1019 |
| 1021 | 1021 |
| 1022 | 1022 |
| 1023 | 1023 |

Sequence Q22, having a sequence length of 512:

[0, 1, 2, 4, 8, 16, 32, 3, 5, 64, 6, 9, 17, 10, 18, 128, 12, 33, 256, 20, 34, 24, 65, 36, 7, 129, 66, 11, 40, 68, 19, 13, 130, 48, 14, 72, 257, 21, 132, 35, 258, 26, 80, 37, 25, 22, 136, 96, 260, 38, 264, 67, 41, 144, 28, 69, 42, 49, 160, 272, 70, 288, 131, 44, 73, 192, 50, 74, 52, 15, 133, 320, 81, 23, 134, 76, 137, 82, 384, 56, 27, 97, 39, 259, 84, 138, 145, 261, 29, 43, 98, 88, 140, 30, 146, 71, 262, 265, 161, 45, 100, 51, 148, 46, 75, 266, 273, 104, 162, 53, 193, 152, 77, 164, 268, 274, 54, 83, 57, 112, 135, 78, 289, 194, 85, 276, 58, 168, 139, 99, 86, 60, 89, 196, 290, 141, 101, 280, 147, 176, 142, 90, 292, 200, 263, 31, 149, 321, 322, 102, 105, 296, 163, 92, 47, 150, 208, 324, 385, 304, 267, 106, 153, 386, 165, 55, 328, 113, 154, 79, 108, 224, 269, 166, 195, 277, 169, 275, 291, 59, 270, 114, 156, 87, 197, 116, 170, 61, 177, 278, 281, 293, 388, 91, 198, 172, 120, 201, 62, 143, 336, 282, 103, 178, 294, 93, 392, 297, 323, 202, 284, 151, 209, 180, 107, 325, 94, 400, 298, 204, 352, 305, 155, 300, 210, 109, 184, 115, 167, 225, 326, 157, 110, 117, 212, 330, 171, 329, 306, 226, 387, 308, 271, 416, 216, 337, 158, 118, 279, 332, 389, 173, 121, 199, 179, 228, 283, 122, 393, 174, 312, 390, 203, 181, 295, 448, 353, 338, 63, 340, 285, 394, 232, 124, 354, 286, 182, 205, 299, 211, 401, 185, 396, 240, 301, 402, 344, 206, 327, 356, 307, 95, 417, 213, 186, 404, 111, 302, 227, 360, 214, 188, 331, 309, 418, 449, 217, 408, 229, 159, 420, 310, 333, 119, 368, 339, 391, 313, 218, 334, 230, 233, 175, 123, 450, 341, 220, 314, 424, 395, 355, 287, 183, 234, 125, 342, 452, 397, 432, 316, 345, 241, 207, 403, 357, 187, 236, 126, 242, 398, 346, 456, 358, 405, 303, 189, 215, 361, 244, 348, 419, 406, 311, 219, 409, 362, 464, 421, 369, 190, 248, 231, 410, 364, 335, 422, 315, 221, 370, 425, 235, 451, 480, 412, 343, 222, 317, 372, 426, 453, 237, 433, 347, 243, 454, 318, 376, 428, 238, 359, 457, 399, 349, 434, 363, 245, 458, 127, 407, 436, 465, 350, 246, 460, 249, 411, 365, 440, 466, 371, 423, 366, 250, 413, 468, 481, 191, 373, 427, 414, 252, 482, 472, 223, 374, 429, 455, 377, 435, 484, 319, 430, 239, 378, 459, 437, 488, 380, 461, 496, 438, 467, 247, 351, 441, 462, 469, 442, 251, 367, 483, 470, 444, 473, 253, 485, 415, 375, 474, 254, 486, 489, 431, 379, 476, 490, 497, 439, 381, 463, 492, 498, 382, 443, 471, 445, 500, 446, 255, 504, 475, 487, 477, 491, 478, 493, 383, 499, 494, 501, 502, 447, 505, 506, 508, 479, 495, 503, 507, 509, 510, 511]

Table Q22, having a sequence length of 512:

| Reliability or sequence number of reliability | Polarized channel sequence number |
|---|---|
| 0 | 0 |
| 1 | 1 |
| 2 | 2 |
| 3 | 4 |
| 4 | 8 |
| 5 | 16 |
| 6 | 32 |
| 7 | 3 |
| 8 | 5 |
| 9 | 64 |
| 10 | 6 |
| 11 | 9 |
| 12 | 17 |
| 13 | 10 |
| 14 | 18 |
| 15 | 128 |
| 16 | 12 |
| 17 | 33 |
| 18 | 256 |
| 19 | 20 |
| 20 | 34 |
| 21 | 24 |
| 22 | 65 |
| 23 | 36 |
| 24 | 7 |
| 25 | 129 |
| 26 | 66 |
| 27 | 11 |
| 28 | 40 |
| 29 | 68 |
| 30 | 19 |
| 31 | 13 |
| 32 | 130 |
| 33 | 48 |
| 34 | 14 |
| 35 | 72 |
| 36 | 257 |
| 37 | 21 |
| 38 | 132 |
| 39 | 35 |
| 40 | 258 |
| 41 | 26 |
| 42 | 80 |
| 43 | 37 |
| 44 | 25 |
| 45 | 22 |
| 46 | 136 |
| 47 | 96 |
| 48 | 260 |
| 49 | 38 |
| 50 | 264 |
| 51 | 67 |
| 52 | 41 |
| 53 | 144 |
| 54 | 28 |
| 55 | 69 |
| 56 | 42 |
| 57 | 49 |
| 58 | 160 |
| 59 | 272 |
| 60 | 70 |
| 61 | 288 |
| 62 | 131 |
| 63 | 44 |
| 64 | 73 |
| 65 | 192 |
| 66 | 50 |
| 67 | 74 |
| 68 | 52 |
| 69 | 15 |
| 70 | 133 |
| 71 | 320 |
| 72 | 81 |
| 73 | 23 |
| 74 | 134 |
| 75 | 76 |
| 76 | 137 |
| 77 | 82 |
| 78 | 384 |
| 79 | 56 |
| 80 | 27 |
| 81 | 97 |
| 82 | 39 |
| 83 | 259 |
| 84 | 84 |
| 85 | 138 |
| 86 | 145 |
| 87 | 261 |
| 88 | 29 |
| 89 | 43 |
| 90 | 98 |
| 91 | 88 |
| 92 | 140 |
| 93 | 30 |
| 94 | 146 |
| 95 | 71 |
| 96 | 262 |
| 97 | 265 |
| 98 | 161 |
| 99 | 45 |
| 100 | 100 |
| 101 | 51 |
| 102 | 148 |
| 103 | 46 |
| 104 | 75 |

-continued

| Table Q22, having a sequence length of 512: | |
|---|---|
| Reliability or sequence number of reliability | Polarized channel sequence number |
| 105 | 266 |
| 106 | 273 |
| 107 | 104 |
| 108 | 162 |
| 109 | 53 |
| 110 | 193 |
| 111 | 152 |
| 112 | 77 |
| 113 | 164 |
| 114 | 268 |
| 115 | 274 |
| 116 | 54 |
| 117 | 83 |
| 118 | 57 |
| 119 | 112 |
| 120 | 135 |
| 121 | 78 |
| 122 | 289 |
| 123 | 194 |
| 124 | 85 |
| 125 | 276 |
| 126 | 58 |
| 127 | 168 |
| 128 | 139 |
| 129 | 99 |
| 130 | 86 |
| 131 | 60 |
| 132 | 89 |
| 133 | 196 |
| 134 | 290 |
| 135 | 141 |
| 136 | 101 |
| 137 | 280 |
| 138 | 147 |
| 139 | 176 |
| 140 | 142 |
| 141 | 90 |
| 142 | 292 |
| 143 | 200 |
| 144 | 263 |
| 145 | 31 |
| 146 | 149 |
| 147 | 321 |
| 148 | 322 |
| 149 | 102 |
| 150 | 105 |
| 151 | 296 |
| 152 | 163 |
| 153 | 92 |
| 154 | 47 |
| 155 | 150 |
| 156 | 208 |
| 157 | 324 |
| 158 | 385 |
| 159 | 304 |
| 160 | 267 |
| 161 | 106 |
| 162 | 153 |
| 163 | 386 |
| 164 | 165 |
| 165 | 55 |
| 166 | 328 |
| 167 | 113 |
| 168 | 154 |
| 169 | 79 |
| 170 | 108 |
| 171 | 224 |
| 172 | 269 |
| 173 | 166 |
| 174 | 195 |
| 175 | 277 |
| 176 | 169 |
| 177 | 275 |
| 178 | 291 |

-continued

| Table Q22, having a sequence length of 512: | |
|---|---|
| Reliability or sequence number of reliability | Polarized channel sequence number |
| 179 | 59 |
| 180 | 270 |
| 181 | 114 |
| 182 | 156 |
| 183 | 87 |
| 184 | 197 |
| 185 | 116 |
| 186 | 170 |
| 187 | 61 |
| 188 | 177 |
| 189 | 278 |
| 190 | 281 |
| 191 | 293 |
| 192 | 388 |
| 193 | 91 |
| 194 | 198 |
| 195 | 172 |
| 196 | 120 |
| 197 | 201 |
| 198 | 62 |
| 199 | 143 |
| 200 | 336 |
| 201 | 282 |
| 202 | 103 |
| 203 | 178 |
| 204 | 294 |
| 205 | 93 |
| 206 | 392 |
| 207 | 297 |
| 208 | 323 |
| 209 | 202 |
| 210 | 284 |
| 211 | 151 |
| 212 | 209 |
| 213 | 180 |
| 214 | 107 |
| 215 | 325 |
| 216 | 94 |
| 217 | 400 |
| 218 | 298 |
| 219 | 204 |
| 220 | 352 |
| 221 | 305 |
| 222 | 155 |
| 223 | 300 |
| 224 | 210 |
| 225 | 109 |
| 226 | 184 |
| 227 | 115 |
| 228 | 167 |
| 229 | 225 |
| 230 | 326 |
| 231 | 157 |
| 232 | 110 |
| 233 | 117 |
| 234 | 212 |
| 235 | 330 |
| 236 | 171 |
| 237 | 329 |
| 238 | 306 |
| 239 | 226 |
| 240 | 387 |
| 241 | 308 |
| 242 | 271 |
| 243 | 416 |
| 244 | 216 |
| 245 | 337 |
| 246 | 158 |
| 247 | 118 |
| 248 | 279 |
| 249 | 332 |
| 250 | 389 |
| 251 | 173 |
| 252 | 121 |

-continued

| Table Q22, having a sequence length of 512: | |
|---|---|
| Reliability or sequence number of reliability | Polarized channel sequence number |
| 253 | 199 |
| 254 | 179 |
| 255 | 228 |
| 256 | 283 |
| 257 | 122 |
| 258 | 393 |
| 259 | 174 |
| 260 | 312 |
| 261 | 390 |
| 262 | 203 |
| 263 | 181 |
| 264 | 295 |
| 265 | 448 |
| 266 | 353 |
| 267 | 338 |
| 268 | 63 |
| 269 | 340 |
| 270 | 285 |
| 271 | 394 |
| 272 | 232 |
| 273 | 124 |
| 274 | 354 |
| 275 | 286 |
| 276 | 182 |
| 277 | 205 |
| 278 | 299 |
| 279 | 211 |
| 280 | 401 |
| 281 | 185 |
| 282 | 396 |
| 283 | 240 |
| 284 | 301 |
| 285 | 402 |
| 286 | 344 |
| 287 | 206 |
| 288 | 327 |
| 289 | 356 |
| 290 | 307 |
| 291 | 95 |
| 292 | 417 |
| 293 | 213 |
| 294 | 186 |
| 295 | 404 |
| 296 | 111 |
| 297 | 302 |
| 298 | 227 |
| 299 | 360 |
| 300 | 214 |
| 301 | 188 |
| 302 | 331 |
| 303 | 309 |
| 304 | 418 |
| 305 | 449 |
| 306 | 217 |
| 307 | 408 |
| 308 | 229 |
| 309 | 159 |
| 310 | 420 |
| 311 | 310 |
| 312 | 333 |
| 313 | 119 |
| 314 | 368 |
| 315 | 339 |
| 316 | 391 |
| 317 | 313 |
| 318 | 218 |
| 319 | 334 |
| 320 | 230 |
| 321 | 233 |
| 322 | 175 |
| 323 | 123 |
| 324 | 450 |
| 325 | 341 |
| 326 | 220 |

-continued

| Table Q22, having a sequence length of 512: | |
|---|---|
| Reliability or sequence number of reliability | Polarized channel sequence number |
| 327 | 314 |
| 328 | 424 |
| 329 | 395 |
| 330 | 355 |
| 331 | 287 |
| 332 | 183 |
| 333 | 234 |
| 334 | 125 |
| 335 | 342 |
| 336 | 452 |
| 337 | 397 |
| 338 | 432 |
| 339 | 316 |
| 340 | 345 |
| 341 | 241 |
| 342 | 207 |
| 343 | 403 |
| 344 | 357 |
| 345 | 187 |
| 346 | 236 |
| 347 | 126 |
| 348 | 242 |
| 349 | 398 |
| 350 | 346 |
| 351 | 456 |
| 352 | 358 |
| 353 | 405 |
| 354 | 303 |
| 355 | 189 |
| 356 | 215 |
| 357 | 361 |
| 358 | 244 |
| 359 | 348 |
| 360 | 419 |
| 361 | 406 |
| 362 | 311 |
| 363 | 219 |
| 364 | 409 |
| 365 | 362 |
| 366 | 464 |
| 367 | 421 |
| 368 | 369 |
| 369 | 190 |
| 370 | 248 |
| 371 | 231 |
| 372 | 410 |
| 373 | 364 |
| 374 | 335 |
| 375 | 422 |
| 376 | 315 |
| 377 | 221 |
| 378 | 370 |
| 379 | 425 |
| 380 | 235 |
| 381 | 451 |
| 382 | 480 |
| 383 | 412 |
| 384 | 343 |
| 385 | 222 |
| 386 | 317 |
| 387 | 372 |
| 388 | 426 |
| 389 | 453 |
| 390 | 237 |
| 391 | 433 |
| 392 | 347 |
| 393 | 243 |
| 394 | 454 |
| 395 | 318 |
| 396 | 376 |
| 397 | 428 |
| 398 | 238 |
| 399 | 359 |
| 400 | 457 |

-continued

| Table Q22, having a sequence length of 512: | |
|---|---|
| Reliability or sequence number of reliability | Polarized channel sequence number |
| 401 | 399 |
| 402 | 349 |
| 403 | 434 |
| 404 | 363 |
| 405 | 245 |
| 406 | 458 |
| 407 | 127 |
| 408 | 407 |
| 409 | 436 |
| 410 | 465 |
| 411 | 350 |
| 412 | 246 |
| 413 | 460 |
| 414 | 249 |
| 415 | 411 |
| 416 | 365 |
| 417 | 440 |
| 418 | 466 |
| 419 | 371 |
| 420 | 423 |
| 421 | 366 |
| 422 | 250 |
| 423 | 413 |
| 424 | 468 |
| 425 | 481 |
| 426 | 191 |
| 427 | 373 |
| 428 | 427 |
| 429 | 414 |
| 430 | 252 |
| 431 | 482 |
| 432 | 472 |
| 433 | 223 |
| 434 | 374 |
| 435 | 429 |
| 436 | 455 |
| 437 | 377 |
| 438 | 435 |
| 439 | 484 |
| 440 | 319 |
| 441 | 430 |
| 442 | 239 |
| 443 | 378 |
| 444 | 459 |
| 445 | 437 |
| 446 | 488 |
| 447 | 380 |
| 448 | 461 |
| 449 | 496 |
| 450 | 438 |
| 451 | 467 |
| 452 | 247 |
| 453 | 351 |
| 454 | 441 |
| 455 | 462 |
| 456 | 469 |
| 457 | 442 |
| 458 | 251 |
| 459 | 367 |
| 460 | 483 |
| 461 | 470 |
| 462 | 444 |
| 463 | 473 |
| 464 | 253 |
| 465 | 485 |
| 466 | 415 |
| 467 | 375 |
| 468 | 474 |
| 469 | 254 |
| 470 | 486 |
| 471 | 489 |
| 472 | 431 |
| 473 | 379 |
| 474 | 476 |

-continued

| Table Q22, having a sequence length of 512: | |
|---|---|
| Reliability or sequence number of reliability | Polarized channel sequence number |
| 475 | 490 |
| 476 | 497 |
| 477 | 439 |
| 478 | 381 |
| 479 | 463 |
| 480 | 492 |
| 481 | 498 |
| 482 | 382 |
| 483 | 443 |
| 484 | 471 |
| 485 | 445 |
| 486 | 500 |
| 487 | 446 |
| 488 | 255 |
| 489 | 504 |
| 490 | 475 |
| 491 | 487 |
| 492 | 477 |
| 493 | 491 |
| 494 | 478 |
| 495 | 493 |
| 496 | 383 |
| 497 | 499 |
| 498 | 494 |
| 499 | 501 |
| 500 | 502 |
| 501 | 447 |
| 502 | 505 |
| 503 | 506 |
| 504 | 508 |
| 505 | 479 |
| 506 | 495 |
| 507 | 503 |
| 508 | 507 |
| 509 | 509 |
| 510 | 510 |
| 511 | 511 |

Sequence Q23, having a sequence length of 256: [0, 1, 2, 4, 8, 16, 32, 3, 5, 64, 6, 9, 17, 10, 18, 128, 12, 33, 20, 34, 24, 65, 36, 7, 129, 66, 11, 40, 68, 19, 13, 130, 48, 14, 72, 21, 132, 35, 26, 80, 37, 25, 22, 136, 96, 38, 67, 41, 144, 28, 69, 42, 49, 160, 70, 131, 44, 73, 192, 50, 74, 52, 15, 133, 81, 23, 134, 76, 137, 82, 56, 27, 97, 39, 84, 138, 145, 29, 43, 98, 88, 140, 30, 146, 71, 161, 45, 100, 51, 148, 46, 75, 104, 162, 53, 193, 152, 77, 164, 54, 83, 57, 112, 135, 78, 194, 85, 58, 168, 139, 99, 86, 60, 89, 196, 141, 101, 147, 176, 142, 90, 200, 31, 149, 102, 105, 163, 92, 47, 150, 208, 106, 153, 165, 55, 113, 154, 79, 108, 224, 166, 195, 169, 59, 114, 156, 87, 197, 116, 170, 61, 177, 91, 198, 172, 120, 201, 62, 143, 103, 178, 93, 202, 151, 209, 180, 107, 94, 204, 155, 210, 109, 184, 115, 167, 225, 157, 110, 117, 212, 171, 226, 216, 158, 118, 173, 121, 199, 179, 228, 122, 174, 203, 181, 63, 232, 124, 182, 205, 211, 185, 240, 206, 95, 213, 186, 111, 227, 214, 188, 217, 229, 159, 119, 218, 230, 233, 175, 123, 220, 183, 234, 125, 241, 207, 187, 236, 126, 242, 189, 215, 244, 219, 190, 248, 231, 221, 235, 222, 237, 243, 238, 245, 127, 246, 249, 250, 191, 252, 223, 239, 247, 251, 253, 254, 255]

| Table Q23, having a sequence length of 256: | |
|---|---|
| Reliability or sequence number of reliability | Polarized channel sequence number |
| 0 | 0 |
| 1 | 1 |

-continued

Table Q23, having a sequence length of 256:

| Reliability or sequence number of reliability | Polarized channel sequence number |
|---|---|
| 2 | 2 |
| 3 | 4 |
| 4 | 8 |
| 5 | 16 |
| 6 | 32 |
| 7 | 3 |
| 8 | 5 |
| 9 | 64 |
| 10 | 6 |
| 11 | 9 |
| 12 | 17 |
| 13 | 10 |
| 14 | 18 |
| 15 | 128 |
| 16 | 12 |
| 17 | 33 |
| 18 | 20 |
| 19 | 34 |
| 20 | 24 |
| 21 | 65 |
| 22 | 36 |
| 23 | 7 |
| 24 | 129 |
| 25 | 66 |
| 26 | 11 |
| 27 | 40 |
| 28 | 68 |
| 29 | 19 |
| 30 | 13 |
| 31 | 130 |
| 32 | 48 |
| 33 | 14 |
| 34 | 72 |
| 35 | 21 |
| 36 | 132 |
| 37 | 35 |
| 38 | 26 |
| 39 | 80 |
| 40 | 37 |
| 41 | 25 |
| 42 | 22 |
| 43 | 136 |
| 44 | 96 |
| 45 | 38 |
| 46 | 67 |
| 47 | 41 |
| 48 | 144 |
| 49 | 28 |
| 50 | 69 |
| 51 | 42 |
| 52 | 49 |
| 53 | 160 |
| 54 | 70 |
| 55 | 131 |
| 56 | 44 |
| 57 | 73 |
| 58 | 192 |
| 59 | 50 |
| 60 | 74 |
| 61 | 52 |
| 62 | 15 |
| 63 | 133 |
| 64 | 81 |
| 65 | 23 |
| 66 | 134 |
| 67 | 76 |
| 68 | 137 |
| 69 | 82 |
| 70 | 56 |
| 71 | 27 |
| 72 | 97 |
| 73 | 39 |
| 74 | 84 |
| 75 | 138 |

-continued

Table Q23, having a sequence length of 256:

| Reliability or sequence number of reliability | Polarized channel sequence number |
|---|---|
| 76 | 145 |
| 77 | 29 |
| 78 | 43 |
| 79 | 98 |
| 80 | 88 |
| 81 | 140 |
| 82 | 30 |
| 83 | 146 |
| 84 | 71 |
| 85 | 161 |
| 86 | 45 |
| 87 | 100 |
| 88 | 51 |
| 89 | 148 |
| 90 | 46 |
| 91 | 75 |
| 92 | 104 |
| 93 | 162 |
| 94 | 53 |
| 95 | 193 |
| 96 | 152 |
| 97 | 77 |
| 98 | 164 |
| 99 | 54 |
| 100 | 83 |
| 101 | 57 |
| 102 | 112 |
| 103 | 135 |
| 104 | 78 |
| 105 | 194 |
| 106 | 85 |
| 107 | 58 |
| 108 | 168 |
| 109 | 139 |
| 110 | 99 |
| 111 | 86 |
| 112 | 60 |
| 113 | 89 |
| 114 | 196 |
| 115 | 141 |
| 116 | 101 |
| 117 | 147 |
| 118 | 176 |
| 119 | 142 |
| 120 | 90 |
| 121 | 200 |
| 122 | 31 |
| 123 | 149 |
| 124 | 102 |
| 125 | 105 |
| 126 | 163 |
| 127 | 92 |
| 128 | 47 |
| 129 | 150 |
| 130 | 208 |
| 131 | 106 |
| 132 | 153 |
| 133 | 165 |
| 134 | 55 |
| 135 | 113 |
| 136 | 154 |
| 137 | 79 |
| 138 | 108 |
| 139 | 224 |
| 140 | 166 |
| 141 | 195 |
| 142 | 169 |
| 143 | 59 |
| 144 | 114 |
| 145 | 156 |
| 146 | 87 |
| 147 | 197 |
| 148 | 116 |
| 149 | 170 |

-continued

Table Q23, having a sequence length of 256:

| Reliability or sequence number of reliability | Polarized channel sequence number |
|---|---|
| 150 | 61 |
| 151 | 177 |
| 152 | 91 |
| 153 | 198 |
| 154 | 172 |
| 155 | 120 |
| 156 | 201 |
| 157 | 62 |
| 158 | 143 |
| 159 | 103 |
| 160 | 178 |
| 161 | 93 |
| 162 | 202 |
| 163 | 151 |
| 164 | 209 |
| 165 | 180 |
| 166 | 107 |
| 167 | 94 |
| 168 | 204 |
| 169 | 155 |
| 170 | 210 |
| 171 | 109 |
| 172 | 184 |
| 173 | 115 |
| 174 | 167 |
| 175 | 225 |
| 176 | 157 |
| 177 | 110 |
| 178 | 117 |
| 179 | 212 |
| 180 | 171 |
| 181 | 226 |
| 182 | 216 |
| 183 | 158 |
| 184 | 118 |
| 185 | 173 |
| 186 | 121 |
| 187 | 199 |
| 188 | 179 |
| 189 | 228 |
| 190 | 122 |
| 191 | 174 |
| 192 | 203 |
| 193 | 181 |
| 194 | 63 |
| 195 | 232 |
| 196 | 124 |
| 197 | 182 |
| 198 | 205 |
| 199 | 211 |
| 200 | 185 |
| 201 | 240 |
| 202 | 206 |
| 203 | 95 |
| 204 | 213 |
| 205 | 186 |
| 206 | 111 |
| 207 | 227 |
| 208 | 214 |
| 209 | 188 |
| 210 | 217 |
| 211 | 229 |
| 212 | 159 |
| 213 | 119 |
| 214 | 218 |
| 215 | 230 |
| 216 | 233 |
| 217 | 175 |
| 218 | 123 |
| 219 | 220 |
| 220 | 183 |
| 221 | 234 |
| 222 | 125 |
| 223 | 241 |
| 224 | 207 |
| 225 | 187 |
| 226 | 236 |
| 227 | 126 |
| 228 | 242 |
| 229 | 189 |
| 230 | 215 |
| 231 | 244 |
| 232 | 219 |
| 233 | 190 |
| 234 | 248 |
| 235 | 231 |
| 236 | 221 |
| 237 | 235 |
| 238 | 222 |
| 239 | 237 |
| 240 | 243 |
| 241 | 238 |
| 242 | 245 |
| 243 | 127 |
| 244 | 246 |
| 245 | 249 |
| 246 | 250 |
| 247 | 191 |
| 248 | 252 |
| 249 | 223 |
| 250 | 239 |
| 251 | 247 |
| 252 | 251 |
| 253 | 253 |
| 254 | 254 |
| 255 | 255 |

Sequence Q24, having a sequence length of 128:

[0, 1, 2, 4, 8, 16, 32, 3, 5, 64, 6, 9, 17, 10, 18, 12, 33, 20, 34, 24, 65, 36, 7, 66, 11, 40, 68, 19, 13, 48, 14, 72, 21, 35, 26, 80, 37, 25, 22, 96, 38, 67, 41, 28, 69, 42, 49, 70, 44, 73, 50, 74, 52, 15, 81, 23, 76, 82, 56, 27, 97, 39, 84, 29, 43, 98, 88, 30, 71, 45, 100, 51, 46, 75, 104, 53, 77, 54, 83, 57, 112, 78, 85, 58, 99, 86, 60, 89, 101, 90, 31, 102, 105, 92, 47, 106, 55, 113, 79, 108, 59, 114, 87, 116, 61, 91, 120, 62, 103, 93, 107, 94, 109, 115, 110, 117, 118, 121, 122, 63, 124, 95, 111, 119, 123, 125,

Table Q24, having a sequence length of 128:

| Reliability or sequence number of reliability | Polarized channel sequence number |
|---|---|
| 0 | 0 |
| 1 | 1 |
| 2 | 2 |
| 3 | 4 |
| 4 | 8 |
| 5 | 16 |
| 6 | 32 |
| 7 | 3 |
| 8 | 5 |
| 9 | 64 |
| 10 | 6 |
| 11 | 9 |
| 12 | 17 |
| 13 | 10 |
| 14 | 18 |
| 15 | 12 |
| 16 | 33 |
| 17 | 20 |
| 18 | 34 |
| 19 | 24 |
| 20 | 65 |

| Table Q24, having a sequence length of 128: | |
|---|---|
| Reliability or sequence number of reliability | Polarized channel sequence number |
| 21 | 36 |
| 22 | 7 |
| 23 | 66 |
| 24 | 11 |
| 25 | 40 |
| 26 | 68 |
| 27 | 19 |
| 28 | 13 |
| 29 | 48 |
| 30 | 14 |
| 31 | 72 |
| 32 | 21 |
| 33 | 35 |
| 34 | 26 |
| 35 | 80 |
| 36 | 37 |
| 37 | 25 |
| 38 | 22 |
| 39 | 96 |
| 40 | 38 |
| 41 | 67 |
| 42 | 41 |
| 43 | 28 |
| 44 | 69 |
| 45 | 42 |
| 46 | 49 |
| 47 | 70 |
| 48 | 44 |
| 49 | 73 |
| 50 | 50 |
| 51 | 74 |
| 52 | 52 |
| 53 | 15 |
| 54 | 81 |
| 55 | 23 |
| 56 | 76 |
| 57 | 82 |
| 58 | 56 |
| 59 | 27 |
| 60 | 97 |
| 61 | 39 |
| 62 | 84 |
| 63 | 29 |
| 64 | 43 |
| 65 | 98 |
| 66 | 88 |
| 67 | 30 |
| 68 | 71 |
| 69 | 45 |
| 70 | 100 |
| 71 | 51 |
| 72 | 46 |
| 73 | 75 |
| 74 | 104 |
| 75 | 53 |
| 76 | 77 |
| 77 | 54 |
| 78 | 83 |
| 79 | 57 |
| 80 | 112 |
| 81 | 78 |
| 82 | 85 |
| 83 | 58 |
| 84 | 99 |
| 85 | 86 |
| 86 | 60 |
| 87 | 89 |
| 88 | 101 |
| 89 | 90 |
| 90 | 31 |
| 91 | 102 |
| 92 | 105 |
| 93 | 92 |
| 94 | 47 |

| Table Q24, having a sequence length of 128: | |
|---|---|
| Reliability or sequence number of reliability | Polarized channel sequence number |
| 95 | 106 |
| 96 | 55 |
| 97 | 113 |
| 98 | 79 |
| 99 | 108 |
| 100 | 59 |
| 101 | 114 |
| 102 | 87 |
| 103 | 116 |
| 104 | 61 |
| 105 | 91 |
| 106 | 120 |
| 107 | 62 |
| 108 | 103 |
| 109 | 93 |
| 110 | 107 |
| 111 | 94 |
| 112 | 109 |
| 113 | 115 |
| 114 | 110 |
| 115 | 117 |
| 116 | 118 |
| 117 | 121 |
| 118 | 122 |
| 119 | 63 |
| 120 | 124 |
| 121 | 95 |
| 122 | 111 |
| 123 | 119 |
| 124 | 123 |
| 125 | 125 |
| 126 | 126 |
| 127 | 127 |

Sequence Q25, having a sequence length of 64:

[0, 1, 2, 4, 8, 16, 32, 3, 5, 6, 9, 17, 10, 18, 12, 33, 20, 34, 24, 36, 7, 11, 40, 19, 13, 48, 14, 21, 35, 26, 37, 25, 22, 38, 41, 28, 42, 49, 44, 50, 52, 15, 23, 56, 27, 39, 29, 43, 30, 45, 51, 46, 53, 54, 57, 58, 60, 31, 47, 55, 59, 61, 62, 63]

| Table Q25, having a sequence length of 64: | |
|---|---|
| Reliability or sequence number of reliability | Polarized channel sequence number |
| 0 | 0 |
| 1 | 1 |
| 2 | 2 |
| 3 | 4 |
| 4 | 8 |
| 5 | 16 |
| 6 | 32 |
| 7 | 3 |
| 8 | 5 |
| 9 | 6 |
| 10 | 9 |
| 11 | 17 |
| 12 | 10 |
| 13 | 18 |
| 14 | 12 |
| 15 | 33 |
| 16 | 20 |
| 17 | 34 |
| 18 | 24 |
| 19 | 36 |
| 20 | 7 |
| 21 | 11 |
| 22 | 40 |
| 23 | 19 |
| 24 | 13 |
| 25 | 48 |

-continued

| Reliability or sequence number of reliability | Polarized channel sequence number |
|---|---|
| Table Q25, having a sequence length of 64: | |
| 26 | 14 |
| 27 | 21 |
| 28 | 35 |
| 29 | 26 |
| 30 | 37 |
| 31 | 25 |
| 32 | 22 |
| 33 | 38 |
| 34 | 41 |
| 35 | 28 |
| 36 | 42 |
| 37 | 49 |
| 38 | 44 |
| 39 | 50 |
| 40 | 52 |
| 41 | 15 |
| 42 | 23 |
| 43 | 56 |
| 44 | 27 |
| 45 | 39 |
| 46 | 29 |
| 47 | 43 |
| 48 | 30 |
| 49 | 45 |
| 50 | 51 |
| 51 | 46 |
| 52 | 53 |
| 53 | 54 |
| 54 | 57 |
| 55 | 58 |
| 56 | 60 |
| 57 | 31 |
| 58 | 47 |
| 59 | 55 |
| 60 | 59 |
| 61 | 61 |
| 62 | 62 |
| 63 | 63 |

Sequence Z21, having a sequence length of 1024:

[0, 1, 2, 7, 3, 8, 10, 24, 4, 11, 13, 28, 16, 32, 35, 76, 5, 12, 14, 31, 19, 38, 47, 80, 21, 46, 42, 87, 57, 95, 101, 167, 6, 17, 20, 40, 23, 45, 51, 89, 29, 55, 59, 96, 69, 108, 115, 177, 34, 61, 73, 112, 75, 123, 130, 190, 86, 133, 143, 210, 148, 218, 235, 327, 9, 22, 26, 54, 30, 58, 64, 103, 36, 71, 74, 116, 82, 126, 138, 197, 44, 79, 84, 131, 91, 141, 147, 214, 99, 149, 162, 228, 176, 242, 259, 364, 49, 88, 97, 146, 111, 154, 172, 239, 121, 173, 186, 257, 198, 271, 278, 369, 134, 192, 212, 273, 216, 283, 300, 401, 233, 307, 312, 417, 333, 435, 460, 585, 15, 25, 33, 68, 39, 77, 81, 137, 48, 83, 92, 145, 100, 153, 161, 236, 56, 93, 102, 159, 113, 168, 178, 254, 125, 187, 196, 266, 213, 277, 298, 394, 62, 107, 122, 175, 127, 189, 201, 274, 144, 207, 217, 286, 232, 306, 314, 416, 160, 221, 240, 309, 256, 322, 340, 433, 272, 348, 367, 453, 382, 471, 505, 619, 72, 124, 140, 205, 151, 215, 231, 308, 165, 234, 252, 320, 263, 344, 358, 449, 180, 255, 268, 346, 284, 366, 381, 473, 296, 390, 407, 486, 421, 519, 529, 639, 199, 275, 290, 379, 310, 392, 411, 510, 332, 412, 434, 522, 459, 535, 560, 670, 350, 448, 461, 552, 480, 583, 590, 695, 508, 593, 611, 707, 628, 728, 746, 816, 18, 37, 41, 90, 50, 94, 104, 166, 53, 105, 118, 184, 128, 200, 211, 293, 63, 119, 129, 208, 142, 206, 222, 303, 155, 223, 238, 311, 253, 330, 339, 432, 66, 139, 152, 209, 164, 226, 241, 323, 174, 249, 262, 345, 267, 355, 375, 468, 183, 265, 289, 363, 292, 387, 399, 484, 315, 406, 423, 518, 446, 530, 555, 665, 78, 169, 170, 251, 181, 258, 276, 361, 191, 288, 285, 386, 304, 400, 410, 513, 237, 297, 326, 403, 329, 420, 436, 528, 357, 447, 464, 550, 481, 573, 589, 699, 264, 325, 334, 431, 362, 452, 466, 561, 380, 478, 494, 582, 512, 596, 610, 708, 402, 503, 520, 608, 531, 620, 647, 732, 557, 660, 671, 756, 677, 778, 796, 854, 85, 182, 188, 291, 227, 305, 317, 404, 248, 313, 331, 428, 349, 444, 462, 568, 261, 347, 356, 451, 368, 467, 483, 586, 391, 491, 511, 595, 526, 612, 627, 731, 295, 365, 388, 482, 395, 501, 514, 609, 427, 521, 533, 624, 558, 648, 666, 755, 445, 546, 574, 662, 587, 673, 693, 777, 604, 701, 706, 800, 726, 804, 813, 881, 324, 389, 418, 523, 443, 534, 554, 649, 465, 567, 584, 672, 592, 678, 704, 780, 498, 588, 606, 694, 614, 705, 723, 803, 638, 727, 745, 821, 767, 834, 845, 913, 524, 616, 635, 720, 664, 730, 750, 824, 676, 754, 771, 842, 788, 850, 865, 926, 684, 776, 794, 860, 809, 870, 878, 935, 818, 885, 892, 946, 909, 954, 959, 988, 27, 43, 52, 98, 60, 106, 110, 193, 65, 114, 120, 202, 136, 219, 224, 338, 67, 135, 132, 220, 158, 243, 245, 354, 163, 260, 282, 370, 301, 393, 408, 532, 70, 156, 157, 246, 179, 280, 287, 383, 194, 302, 318, 424, 319, 422, 440, 536, 203, 321, 341, 437, 359, 455, 476, 562, 371, 469, 495, 579, 497, 599, 613, 735, 109, 171, 185, 294, 204, 328, 335, 426, 229, 343, 351, 454, 377, 475, 500, 570, 250, 353, 372, 470, 396, 496, 487, 594, 425, 488, 506, 615, 545, 632, 656, 752, 269, 384, 409, 490, 415, 515, 527, 625, 439, 544, 563, 645, 580, 667, 675, 775, 457, 559, 578, 674, 607, 685, 709, 799, 634, 719, 729, 806, 749, 819, 840, 905, 117, 195, 225, 342, 244, 352, 378, 477, 270, 373, 397, 489, 419, 507, 517, 621, 281, 405, 414, 516, 441, 541, 553, 640, 456, 564, 571, 669, 597, 683, 703, 779, 316, 430, 438, 556, 474, 575, 572, 679, 492, 591, 603, 698, 630, 716, 725, 805, 509, 617, 633, 717, 650, 740, 747, 825, 659, 753, 770, 837, 786, 852, 863, 925, 337, 463, 479, 598, 485, 605, 626, 712, 539, 631, 644, 738, 653, 744, 765, 833, 547, 651, 658, 748, 682, 769, 781, 847, 702, 787, 802, 866, 812, 877, 888, 942, 565, 687, 690, 772, 710, 791, 807, 871, 722, 810, 822, 884, 838, 894, 908, 953, 758, 829, 841, 901, 856, 912, 919, 962, 867, 922, 931, 969, 939, 975, 980, 1002, 150, 230, 247, 374, 279, 398, 413, 525, 299, 429, 442, 543, 458, 569, 577, 689, 336, 450, 472, 581, 493, 600, 602, 700, 504, 618, 636, 721, 646, 741, 751, 826, 360, 499, 502, 601, 538, 623, 637, 736, 542, 643, 655, 743, 663, 764, 773, 846, 548, 661, 681, 766, 696, 784, 797, 864, 718, 801, 811, 876, 828, 889, 903, 949, 376, 537, 540, 641, 549, 652, 668, 762, 576, 680, 692, 774, 713, 793, 808, 874, 629, 697, 714, 798, 724, 817, 827, 886, 760, 830, 844, 904, 855, 915, 920, 964, 654, 734, 742, 823, 761, 836, 849, 906, 783, 851, 862, 916, 873, 928, 934, 971, 795, 868, 880, 929, 890, 936, 944, 978, 902, 948, 956, 984, 963, 990, 994, 1009, 385, 551, 566, 688, 622, 691, 711, 792, 642, 715, 737, 820, 757, 832, 843, 899, 657, 739, 759, 835, 768, 848, 857, 914, 785, 861, 872, 924, 887, 932, 941, 977, 686, 763, 782, 858, 789, 869, 875, 927, 815, 883, 891, 937, 897, 945, 951, 983, 839, 895, 900, 947, 910, 955, 960, 989, 921, 965, 968, 995, 973, 998, 1000, 1014, 733, 790, 814, 882, 831, 893, 896, 943, 853, 898, 907, 952, 917, 957, 966, 992, 859, 911, 918, 961, 930, 967, 972, 997, 938, 974, 979, 1001, 985, 1004, 1006, 1017, 879, 923, 933, 970, 940, 976, 981, 1003, 950, 982, 986, 1005, 991, 1007, 1010, 1018, 958, 987, 993, 1008, 996, 1011, 1012, 1019, 999, 1013, 1015, 1020, 1016, 1021, 1022, 1023]

| Polarized channel sequence number | Reliability or sequence number of reliability |
|---|---|
| Table Z21, having a sequence length of 1024: | |
| 0 | 0 |
| 1 | 1 |
| 2 | 2 |
| 3 | 7 |
| 4 | 3 |

| Table Z21, having a sequence length of 1024: | |
|---|---|
| Polarized channel sequence number | Reliability or sequence number of reliability |
| 5 | 8 |
| 6 | 10 |
| 7 | 24 |
| 8 | 4 |
| 9 | 11 |
| 10 | 13 |
| 11 | 28 |
| 12 | 16 |
| 13 | 32 |
| 14 | 35 |
| 15 | 76 |
| 16 | 5 |
| 17 | 12 |
| 18 | 14 |
| 19 | 31 |
| 20 | 19 |
| 21 | 38 |
| 22 | 47 |
| 23 | 80 |
| 24 | 21 |
| 25 | 46 |
| 26 | 42 |
| 27 | 87 |
| 28 | 57 |
| 29 | 95 |
| 30 | 101 |
| 31 | 167 |
| 32 | 6 |
| 33 | 17 |
| 34 | 20 |
| 35 | 40 |
| 36 | 23 |
| 37 | 45 |
| 38 | 51 |
| 39 | 89 |
| 40 | 29 |
| 41 | 55 |
| 42 | 59 |
| 43 | 96 |
| 44 | 69 |
| 45 | 108 |
| 46 | 115 |
| 47 | 177 |
| 48 | 34 |
| 49 | 61 |
| 50 | 73 |
| 54 | 130 |
| 55 | 190 |
| 56 | 86 |
| 57 | 133 |
| 58 | 143 |
| 59 | 210 |
| 60 | 148 |
| 61 | 218 |
| 62 | 235 |
| 63 | 327 |
| 64 | 9 |
| 65 | 22 |
| 66 | 26 |
| 67 | 54 |
| 68 | 30 |
| 69 | 58 |
| 70 | 64 |
| 71 | 103 |
| 72 | 36 |
| 73 | 71 |
| 74 | 74 |
| 75 | 116 |
| 76 | 82 |
| 77 | 126 |
| 78 | 138 |
| 79 | 197 |
| 80 | 44 |
| 81 | 79 |

| Table Z21, having a sequence length of 1024: | |
|---|---|
| Polarized channel sequence number | Reliability or sequence number of reliability |
| 82 | 84 |
| 83 | 131 |
| 84 | 91 |
| 85 | 141 |
| 89 | 149 |
| 90 | 162 |
| 91 | 228 |
| 92 | 176 |
| 93 | 242 |
| 94 | 259 |
| 95 | 364 |
| 96 | 49 |
| 97 | 88 |
| 98 | 97 |
| 99 | 146 |
| 100 | 111 |
| 101 | 154 |
| 102 | 172 |
| 103 | 239 |
| 104 | 121 |
| 105 | 173 |
| 106 | 186 |
| 107 | 257 |
| 108 | 198 |
| 109 | 271 |
| 110 | 278 |
| 111 | 369 |
| 112 | 134 |
| 113 | 192 |
| 114 | 212 |
| 115 | 273 |
| 116 | 216 |
| 117 | 283 |
| 118 | 300 |
| 119 | 401 |
| 120 | 233 |
| 124 | 333 |
| 125 | 435 |
| 126 | 460 |
| 127 | 585 |
| 128 | 15 |
| 129 | 25 |
| 130 | 33 |
| 131 | 68 |
| 132 | 39 |
| 133 | 77 |
| 134 | 81 |
| 135 | 137 |
| 136 | 48 |
| 137 | 83 |
| 138 | 92 |
| 139 | 145 |
| 140 | 100 |
| 141 | 153 |
| 142 | 161 |
| 143 | 236 |
| 144 | 56 |
| 145 | 93 |
| 146 | 102 |
| 147 | 159 |
| 148 | 113 |
| 149 | 168 |
| 150 | 178 |
| 151 | 254 |
| 152 | 125 |
| 153 | 187 |
| 154 | 196 |
| 155 | 266 |
| 156 | 213 |
| 157 | 277 |
| 158 | 298 |
| 159 | 394 |
| 160 | 62 |
| 161 | 107 |

-continued

Table Z21, having a sequence length of 1024:

| Polarized channel sequence number | Reliability or sequence number of reliability |
|---|---|
| 162 | 122 |
| 163 | 175 |
| 164 | 127 |
| 165 | 189 |
| 166 | 201 |
| 167 | 274 |
| 168 | 144 |
| 169 | 207 |
| 170 | 217 |
| 171 | 286 |
| 172 | 232 |
| 173 | 306 |
| 174 | 314 |
| 175 | 416 |
| 176 | 160 |
| 177 | 221 |
| 178 | 240 |
| 182 | 340 |
| 183 | 433 |
| 184 | 272 |
| 185 | 348 |
| 186 | 367 |
| 187 | 453 |
| 188 | 382 |
| 189 | 471 |
| 190 | 505 |
| 191 | 619 |
| 192 | 72 |
| 193 | 124 |
| 194 | 140 |
| 195 | 205 |
| 196 | 151 |
| 197 | 215 |
| 198 | 231 |
| 199 | 308 |
| 200 | 165 |
| 201 | 234 |
| 202 | 252 |
| 203 | 320 |
| 204 | 263 |
| 205 | 344 |
| 206 | 358 |
| 207 | 449 |
| 208 | 180 |
| 209 | 255 |
| 210 | 268 |
| 211 | 346 |
| 212 | 284 |
| 213 | 366 |
| 217 | 390 |
| 218 | 407 |
| 219 | 486 |
| 220 | 421 |
| 221 | 519 |
| 222 | 529 |
| 223 | 639 |
| 224 | 199 |
| 225 | 275 |
| 226 | 290 |
| 227 | 379 |
| 228 | 310 |
| 229 | 392 |
| 230 | 411 |
| 231 | 510 |
| 232 | 332 |
| 233 | 412 |
| 234 | 434 |
| 235 | 522 |
| 236 | 459 |
| 237 | 535 |
| 238 | 560 |
| 239 | 670 |
| 240 | 350 |
| 241 | 448 |

-continued

Table Z21, having a sequence length of 1024:

| Polarized channel sequence number | Reliability or sequence number of reliability |
|---|---|
| 242 | 461 |
| 243 | 552 |
| 244 | 480 |
| 245 | 583 |
| 246 | 590 |
| 247 | 695 |
| 248 | 508 |
| 252 | 628 |
| 253 | 728 |
| 254 | 746 |
| 255 | 816 |
| 256 | 18 |
| 257 | 37 |
| 258 | 41 |
| 259 | 90 |
| 260 | 50 |
| 261 | 94 |
| 262 | 104 |
| 263 | 166 |
| 264 | 53 |
| 265 | 105 |
| 266 | 118 |
| 267 | 184 |
| 268 | 128 |
| 269 | 200 |
| 270 | 211 |
| 271 | 293 |
| 272 | 63 |
| 273 | 119 |
| 274 | 129 |
| 275 | 208 |
| 276 | 142 |
| 277 | 206 |
| 278 | 222 |
| 279 | 303 |
| 280 | 155 |
| 281 | 223 |
| 282 | 238 |
| 283 | 311 |
| 284 | 253 |
| 285 | 330 |
| 286 | 339 |
| 287 | 432 |
| 288 | 66 |
| 289 | 139 |
| 290 | 152 |
| 291 | 209 |
| 292 | 164 |
| 293 | 226 |
| 294 | 241 |
| 295 | 323 |
| 296 | 174 |
| 297 | 249 |
| 298 | 262 |
| 299 | 345 |
| 300 | 267 |
| 301 | 355 |
| 302 | 375 |
| 303 | 468 |
| 304 | 183 |
| 305 | 265 |
| 306 | 289 |
| 310 | 399 |
| 311 | 484 |
| 312 | 315 |
| 313 | 406 |
| 314 | 423 |
| 315 | 518 |
| 316 | 446 |
| 317 | 530 |
| 318 | 555 |
| 319 | 665 |
| 320 | 78 |
| 321 | 169 |

-continued

Table Z21, having a sequence length of 1024:

| Polarized channel sequence number | Reliability or sequence number of reliability |
|---|---|
| 322 | 170 |
| 323 | 251 |
| 324 | 181 |
| 325 | 258 |
| 326 | 276 |
| 327 | 361 |
| 328 | 191 |
| 329 | 288 |
| 330 | 285 |
| 331 | 386 |
| 332 | 304 |
| 333 | 400 |
| 334 | 410 |
| 335 | 513 |
| 336 | 237 |
| 337 | 297 |
| 338 | 326 |
| 339 | 403 |
| 340 | 329 |
| 341 | 420 |
| 345 | 447 |
| 346 | 464 |
| 347 | 550 |
| 348 | 481 |
| 349 | 573 |
| 350 | 589 |
| 351 | 699 |
| 352 | 264 |
| 353 | 325 |
| 354 | 334 |
| 355 | 431 |
| 356 | 362 |
| 357 | 452 |
| 358 | 466 |
| 359 | 561 |
| 360 | 380 |
| 361 | 478 |
| 362 | 494 |
| 363 | 582 |
| 364 | 512 |
| 365 | 596 |
| 366 | 610 |
| 367 | 708 |
| 368 | 402 |
| 369 | 503 |
| 370 | 520 |
| 371 | 608 |
| 372 | 531 |
| 373 | 620 |
| 374 | 647 |
| 375 | 732 |
| 376 | 557 |
| 377 | 660 |
| 378 | 671 |
| 379 | 756 |
| 380 | 677 |
| 381 | 778 |
| 382 | 796 |
| 383 | 854 |
| 384 | 85 |
| 385 | 182 |
| 386 | 188 |
| 387 | 291 |
| 388 | 227 |
| 389 | 305 |
| 390 | 317 |
| 391 | 404 |
| 392 | 248 |
| 393 | 313 |
| 394 | 331 |
| 395 | 428 |
| 396 | 349 |
| 397 | 444 |
| 398 | 462 |

-continued

Table Z21, having a sequence length of 1024:

| Polarized channel sequence number | Reliability or sequence number of reliability |
|---|---|
| 399 | 568 |
| 400 | 261 |
| 401 | 347 |
| 402 | 356 |
| 403 | 451 |
| 404 | 368 |
| 405 | 467 |
| 406 | 483 |
| 407 | 586 |
| 408 | 391 |
| 409 | 491 |
| 410 | 511 |
| 411 | 595 |
| 412 | 526 |
| 413 | 612 |
| 414 | 627 |
| 415 | 731 |
| 416 | 295 |
| 417 | 365 |
| 418 | 388 |
| 419 | 482 |
| 420 | 395 |
| 421 | 501 |
| 422 | 514 |
| 423 | 609 |
| 424 | 427 |
| 425 | 521 |
| 426 | 533 |
| 427 | 624 |
| 428 | 558 |
| 429 | 648 |
| 430 | 666 |
| 431 | 755 |
| 432 | 445 |
| 433 | 546 |
| 434 | 574 |
| 435 | 662 |
| 436 | 587 |
| 437 | 673 |
| 438 | 693 |
| 439 | 777 |
| 440 | 604 |
| 441 | 701 |
| 442 | 706 |
| 443 | 800 |
| 444 | 726 |
| 445 | 804 |
| 446 | 813 |
| 447 | 881 |
| 448 | 324 |
| 449 | 389 |
| 450 | 418 |
| 451 | 523 |
| 452 | 443 |
| 453 | 534 |
| 454 | 554 |
| 455 | 649 |
| 456 | 465 |
| 457 | 567 |
| 458 | 584 |
| 459 | 672 |
| 460 | 592 |
| 461 | 678 |
| 462 | 704 |
| 463 | 780 |
| 464 | 498 |
| 465 | 588 |
| 466 | 606 |
| 467 | 694 |
| 468 | 614 |
| 469 | 705 |
| 473 | 727 |
| 474 | 745 |
| 475 | 821 |

| Table Z21, having a sequence length of 1024: | |
|---|---|
| Polarized channel sequence number | Reliability or sequence number of reliability |
| 476 | 767 |
| 477 | 834 |
| 478 | 845 |
| 479 | 913 |
| 480 | 524 |
| 481 | 616 |
| 482 | 635 |
| 483 | 720 |
| 484 | 664 |
| 485 | 730 |
| 486 | 750 |
| 487 | 824 |
| 488 | 676 |
| 489 | 754 |
| 490 | 771 |
| 491 | 842 |
| 492 | 788 |
| 493 | 850 |
| 494 | 865 |
| 495 | 926 |
| 496 | 684 |
| 497 | 776 |
| 498 | 794 |
| 499 | 860 |
| 500 | 809 |
| 501 | 870 |
| 502 | 878 |
| 503 | 935 |
| 504 | 818 |
| 508 | 909 |
| 509 | 954 |
| 510 | 959 |
| 511 | 988 |
| 512 | 27 |
| 513 | 43 |
| 514 | 52 |
| 515 | 98 |
| 516 | 60 |
| 517 | 106 |
| 518 | 110 |
| 519 | 193 |
| 520 | 65 |
| 521 | 114 |
| 522 | 120 |
| 523 | 202 |
| 524 | 136 |
| 525 | 219 |
| 526 | 224 |
| 527 | 338 |
| 528 | 67 |
| 529 | 135 |
| 530 | 132 |
| 531 | 220 |
| 532 | 158 |
| 533 | 243 |
| 534 | 245 |
| 535 | 354 |
| 536 | 163 |
| 537 | 260 |
| 538 | 282 |
| 539 | 370 |
| 540 | 301 |
| 541 | 393 |
| 542 | 408 |
| 543 | 532 |
| 544 | 70 |
| 545 | 156 |
| 546 | 157 |
| 547 | 246 |
| 548 | 179 |
| 549 | 280 |
| 550 | 287 |
| 551 | 383 |
| 552 | 194 |

| Table Z21, having a sequence length of 1024: | |
|---|---|
| Polarized channel sequence number | Reliability or sequence number of reliability |
| 553 | 302 |
| 554 | 318 |
| 555 | 424 |
| 556 | 319 |
| 557 | 422 |
| 558 | 440 |
| 559 | 536 |
| 560 | 203 |
| 561 | 321 |
| 562 | 341 |
| 566 | 476 |
| 567 | 562 |
| 568 | 371 |
| 569 | 469 |
| 570 | 495 |
| 571 | 579 |
| 572 | 497 |
| 573 | 599 |
| 574 | 613 |
| 575 | 735 |
| 576 | 109 |
| 577 | 171 |
| 578 | 185 |
| 579 | 294 |
| 580 | 204 |
| 581 | 328 |
| 582 | 335 |
| 583 | 426 |
| 584 | 229 |
| 585 | 343 |
| 586 | 351 |
| 587 | 454 |
| 588 | 377 |
| 589 | 475 |
| 590 | 500 |
| 591 | 570 |
| 592 | 250 |
| 593 | 353 |
| 594 | 372 |
| 595 | 470 |
| 596 | 396 |
| 597 | 496 |
| 598 | 487 |
| 599 | 594 |
| 601 | 488 |
| 602 | 506 |
| 603 | 615 |
| 604 | 545 |
| 605 | 632 |
| 606 | 656 |
| 607 | 752 |
| 608 | 269 |
| 609 | 384 |
| 610 | 409 |
| 611 | 490 |
| 612 | 415 |
| 613 | 515 |
| 614 | 527 |
| 615 | 625 |
| 616 | 439 |
| 617 | 544 |
| 618 | 563 |
| 619 | 645 |
| 620 | 580 |
| 621 | 667 |
| 622 | 675 |
| 623 | 775 |
| 624 | 457 |
| 625 | 559 |
| 626 | 578 |
| 627 | 674 |
| 628 | 607 |
| 629 | 685 |
| 630 | 709 |

-continued

Table Z21, having a sequence length of 1024:

| Polarized channel sequence number | Reliability or sequence number of reliability |
|---|---|
| 631 | 799 |
| 632 | 634 |
| 633 | 719 |
| 634 | 729 |
| 635 | 806 |
| 636 | 749 |
| 637 | 819 |
| 638 | 840 |
| 639 | 905 |
| 640 | 117 |
| 641 | 195 |
| 642 | 225 |
| 643 | 342 |
| 644 | 244 |
| 645 | 352 |
| 646 | 378 |
| 647 | 477 |
| 648 | 270 |
| 649 | 373 |
| 650 | 397 |
| 651 | 489 |
| 652 | 419 |
| 653 | 507 |
| 654 | 517 |
| 655 | 621 |
| 656 | 281 |
| 657 | 405 |
| 658 | 414 |
| 659 | 516 |
| 660 | 441 |
| 661 | 541 |
| 662 | 553 |
| 663 | 640 |
| 664 | 456 |
| 665 | 564 |
| 666 | 571 |
| 667 | 669 |
| 668 | 597 |
| 669 | 683 |
| 670 | 703 |
| 671 | 779 |
| 672 | 316 |
| 673 | 430 |
| 674 | 438 |
| 675 | 556 |
| 676 | 474 |
| 677 | 575 |
| 678 | 572 |
| 679 | 679 |
| 680 | 492 |
| 681 | 591 |
| 682 | 603 |
| 683 | 698 |
| 684 | 630 |
| 685 | 716 |
| 686 | 725 |
| 687 | 805 |
| 688 | 509 |
| 689 | 617 |
| 690 | 633 |
| 694 | 747 |
| 695 | 825 |
| 696 | 659 |
| 697 | 753 |
| 698 | 770 |
| 699 | 837 |
| 700 | 786 |
| 701 | 852 |
| 702 | 863 |
| 703 | 925 |
| 704 | 337 |
| 705 | 463 |
| 706 | 479 |
| 707 | 598 |

-continued

Table Z21, having a sequence length of 1024:

| Polarized channel sequence number | Reliability or sequence number of reliability |
|---|---|
| 708 | 485 |
| 709 | 605 |
| 710 | 626 |
| 711 | 712 |
| 712 | 539 |
| 713 | 631 |
| 714 | 644 |
| 715 | 738 |
| 716 | 653 |
| 717 | 744 |
| 718 | 765 |
| 719 | 833 |
| 720 | 547 |
| 721 | 651 |
| 722 | 658 |
| 723 | 748 |
| 724 | 682 |
| 725 | 769 |
| 729 | 787 |
| 730 | 802 |
| 731 | 866 |
| 732 | 812 |
| 733 | 877 |
| 734 | 888 |
| 735 | 942 |
| 736 | 565 |
| 737 | 687 |
| 738 | 690 |
| 739 | 772 |
| 740 | 710 |
| 741 | 791 |
| 742 | 807 |
| 743 | 871 |
| 744 | 722 |
| 745 | 810 |
| 746 | 822 |
| 747 | 884 |
| 748 | 838 |
| 749 | 894 |
| 750 | 908 |
| 751 | 953 |
| 752 | 758 |
| 753 | 829 |
| 754 | 841 |
| 755 | 901 |
| 756 | 856 |
| 757 | 912 |
| 758 | 919 |
| 759 | 962 |
| 760 | 867 |
| 764 | 939 |
| 765 | 975 |
| 766 | 980 |
| 767 | 1002 |
| 768 | 150 |
| 769 | 230 |
| 770 | 247 |
| 771 | 374 |
| 772 | 279 |
| 773 | 398 |
| 774 | 413 |
| 775 | 525 |
| 776 | 299 |
| 777 | 429 |
| 778 | 442 |
| 779 | 543 |
| 780 | 458 |
| 781 | 569 |
| 782 | 577 |
| 783 | 689 |
| 784 | 336 |
| 785 | 450 |
| 786 | 472 |
| 787 | 581 |

-continued

Table Z21, having a sequence length of 1024:

| Polarized channel sequence number | Reliability or sequence number of reliability |
|---|---|
| 788 | 493 |
| 789 | 600 |
| 790 | 602 |
| 791 | 700 |
| 792 | 504 |
| 793 | 618 |
| 794 | 636 |
| 795 | 721 |
| 796 | 646 |
| 797 | 741 |
| 798 | 751 |
| 799 | 826 |
| 800 | 360 |
| 801 | 499 |
| 802 | 502 |
| 803 | 601 |
| 804 | 538 |
| 805 | 623 |
| 806 | 637 |
| 807 | 736 |
| 808 | 542 |
| 809 | 643 |
| 810 | 655 |
| 811 | 743 |
| 812 | 663 |
| 813 | 764 |
| 814 | 773 |
| 815 | 846 |
| 816 | 548 |
| 817 | 661 |
| 818 | 681 |
| 822 | 797 |
| 823 | 864 |
| 824 | 718 |
| 825 | 801 |
| 826 | 811 |
| 827 | 876 |
| 828 | 828 |
| 829 | 889 |
| 830 | 903 |
| 831 | 949 |
| 832 | 376 |
| 833 | 537 |
| 834 | 540 |
| 835 | 641 |
| 836 | 549 |
| 837 | 652 |
| 838 | 668 |
| 839 | 762 |
| 840 | 576 |
| 841 | 680 |
| 842 | 692 |
| 843 | 774 |
| 844 | 713 |
| 845 | 793 |
| 846 | 808 |
| 847 | 874 |
| 848 | 629 |
| 849 | 697 |
| 850 | 714 |
| 851 | 798 |
| 852 | 724 |
| 853 | 817 |
| 854 | 827 |
| 855 | 886 |
| 856 | 760 |
| 857 | 830 |
| 858 | 844 |
| 859 | 904 |
| 860 | 855 |
| 861 | 915 |
| 862 | 920 |
| 863 | 964 |
| 864 | 654 |
| 865 | 734 |
| 866 | 742 |
| 867 | 823 |
| 868 | 761 |
| 869 | 836 |
| 870 | 849 |
| 871 | 906 |
| 872 | 783 |
| 873 | 851 |
| 874 | 862 |
| 875 | 916 |
| 876 | 873 |
| 877 | 928 |
| 878 | 934 |
| 879 | 971 |
| 880 | 795 |
| 881 | 868 |
| 882 | 880 |
| 883 | 929 |
| 884 | 890 |
| 885 | 936 |
| 886 | 944 |
| 887 | 978 |
| 888 | 902 |
| 889 | 948 |
| 890 | 956 |
| 891 | 984 |
| 892 | 963 |
| 893 | 990 |
| 894 | 994 |
| 895 | 1009 |
| 896 | 385 |
| 897 | 551 |
| 898 | 566 |
| 899 | 688 |
| 900 | 622 |
| 901 | 691 |
| 902 | 711 |
| 903 | 792 |
| 904 | 642 |
| 905 | 715 |
| 906 | 737 |
| 907 | 820 |
| 908 | 757 |
| 909 | 832 |
| 910 | 843 |
| 911 | 899 |
| 912 | 657 |
| 913 | 739 |
| 914 | 759 |
| 915 | 835 |
| 916 | 768 |
| 917 | 848 |
| 918 | 857 |
| 919 | 914 |
| 920 | 785 |
| 921 | 861 |
| 922 | 872 |
| 923 | 924 |
| 924 | 887 |
| 925 | 932 |
| 926 | 941 |
| 927 | 977 |
| 928 | 686 |
| 929 | 763 |
| 930 | 782 |
| 931 | 858 |
| 932 | 789 |
| 933 | 869 |
| 934 | 875 |
| 935 | 927 |
| 936 | 815 |
| 937 | 883 |
| 938 | 891 |

-continued

Table Z21, having a sequence length of 1024:

| Polarized channel sequence number | Reliability or sequence number of reliability |
|---|---|
| 939 | 937 |
| 940 | 897 |
| 941 | 945 |
| 942 | 951 |
| 943 | 983 |
| 944 | 839 |
| 945 | 895 |
| 946 | 900 |
| 950 | 960 |
| 951 | 989 |
| 952 | 921 |
| 953 | 965 |
| 954 | 968 |
| 955 | 995 |
| 956 | 973 |
| 957 | 998 |
| 958 | 1000 |
| 959 | 1014 |
| 960 | 733 |
| 961 | 790 |
| 962 | 814 |
| 963 | 882 |
| 964 | 831 |
| 965 | 893 |
| 966 | 896 |
| 967 | 943 |
| 968 | 853 |
| 969 | 898 |
| 970 | 907 |
| 971 | 952 |
| 972 | 917 |
| 973 | 957 |
| 974 | 966 |
| 975 | 992 |
| 976 | 859 |
| 977 | 911 |
| 978 | 918 |
| 979 | 961 |
| 980 | 930 |
| 981 | 967 |
| 982 | 972 |
| 983 | 997 |
| 984 | 938 |
| 985 | 974 |
| 986 | 979 |
| 987 | 1001 |
| 988 | 985 |
| 989 | 1004 |
| 990 | 1006 |
| 991 | 1017 |
| 992 | 879 |
| 993 | 923 |
| 994 | 933 |
| 995 | 970 |
| 996 | 940 |
| 997 | 976 |
| 998 | 981 |
| 999 | 1003 |
| 1000 | 950 |
| 1001 | 982 |
| 1002 | 986 |
| 1003 | 1005 |
| 1004 | 991 |
| 1005 | 1007 |
| 1006 | 1010 |
| 1007 | 1018 |
| 1008 | 958 |
| 1009 | 987 |
| 1010 | 993 |
| 1011 | 1008 |
| 1012 | 996 |
| 1013 | 1011 |
| 1014 | 1012 |
| 1015 | 1019 |
| 1016 | 999 |
| 1020 | 1016 |
| 1021 | 1021 |
| 1022 | 1022 |
| 1023 | 1023 |

Sequence Z22, having a sequence length of 512:

[0, 1, 2, 7, 3, 8, 10, 24, 4, 11, 13, 27, 16, 31, 34, 69, 5, 12, 14, 30, 19, 37, 45, 73, 21, 44, 41, 80, 54, 88, 93, 145, 6, 17, 20, 39, 23, 43, 49, 82, 28, 52, 56, 89, 63, 99, 103, 154, 33, 57, 66, 101, 68, 109, 116, 165, 79, 118, 126, 179, 131, 187, 198, 268, 9, 22, 26, 51, 29, 55, 60, 95, 35, 64, 67, 104, 75, 112, 121, 169, 42, 72, 77, 117, 84, 124, 130, 183, 91, 132, 141, 193, 153, 205, 216, 291, 47, 81, 90, 129, 100, 136, 149, 202, 107, 150, 161, 214, 170, 225, 232, 296, 119, 167, 181, 227, 185, 233, 247, 313, 196, 252, 257, 323, 273, 334, 347, 407, 15, 25, 32, 62, 38, 70, 74, 120, 46, 76, 85, 128, 92, 135, 140, 199, 53, 86, 94, 138, 102, 146, 155, 211, 111, 162, 168, 222, 182, 231, 246, 309, 58, 98, 108, 152, 113, 164, 173, 228, 127, 176, 186, 236, 195, 251, 259, 322, 139, 188, 203, 254, 213, 263, 276, 332, 226, 281, 294, 345, 301, 355, 369, 426, 65, 110, 123, 174, 133, 184, 194, 253, 143, 197, 209, 262, 219, 277, 287, 342, 156, 212, 224, 279, 234, 293, 300, 356, 244, 306, 318, 363, 326, 377, 385, 433, 171, 229, 239, 298, 255, 308, 320, 371, 272, 321, 333, 380, 346, 390, 398, 442, 283, 341, 348, 393, 358, 405, 412, 452, 370, 414, 422, 458, 430, 464, 469, 488, 18, 36, 40, 83, 48, 87, 96, 144, 50, 97, 105, 160, 114, 172, 180, 242, 59, 106, 115, 177, 125, 175, 189, 248, 137, 190, 201, 256, 210, 270, 275, 331, 61, 122, 134, 178, 142, 191, 204, 264, 151, 207, 218, 278, 223, 284, 297, 354, 159, 221, 238, 290, 241, 303, 311, 362, 260, 317, 327, 376, 339, 386, 395, 440, 71, 147, 148, 208, 157, 215, 230, 288, 166, 237, 235, 302, 249, 312, 319, 374, 200, 245, 267, 315, 269, 325, 335, 384, 286, 340, 350, 392, 359, 402, 411, 453, 220, 266, 274, 330, 289, 344, 352, 399, 299, 357, 365, 404, 373, 416, 421, 459, 314, 368, 378, 419, 387, 427, 434, 467, 396, 437, 443, 473, 447, 478, 482, 496, 78, 158, 163, 240, 192, 250, 261, 316, 206, 258, 271, 329, 282, 337, 349, 401, 217, 280, 285, 343, 295, 353, 361, 408, 307, 364, 372, 415, 383, 423, 429, 466, 243, 292, 304, 360, 310, 367, 375, 420, 328, 379, 388, 428, 397, 435, 441, 472, 338, 391, 403, 438, 409, 445, 450, 477, 417, 454, 457, 483, 462, 485, 487, 501, 265, 305, 324, 381, 336, 389, 394, 436, 351, 400, 406, 444, 413, 448, 455, 479, 366, 410, 418, 451, 424, 456, 461, 484, 432, 463, 468, 490, 474, 492, 494, 505, 382, 425, 431, 460, 439, 465, 470, 491, 446, 471, 475, 493, 480, 495, 498, 506, 449, 476, 481, 497, 486, 499, 500, 507, 489, 502, 503, 508, 504, 509, 510, 511]

Table Z22, having a sequence length of 512:

| Polarized channel sequence number | Reliability or sequence number of reliability |
|---|---|
| 0 | 0 |
| 1 | 1 |
| 2 | 2 |
| 3 | 7 |
| 4 | 3 |
| 5 | 8 |
| 6 | 10 |
| 7 | 24 |

-continued

| Table Z22, having a sequence length of 512: | |
|---|---|
| Polarized channel sequence number | Reliability or sequence number of reliability |
| 8 | 4 |
| 9 | 11 |
| 10 | 13 |
| 11 | 27 |
| 12 | 16 |
| 13 | 31 |
| 14 | 34 |
| 15 | 69 |
| 16 | 5 |
| 17 | 12 |
| 18 | 14 |
| 19 | 30 |
| 20 | 19 |
| 21 | 37 |
| 22 | 45 |
| 23 | 73 |
| 24 | 21 |
| 25 | 44 |
| 26 | 41 |
| 27 | 80 |
| 28 | 54 |
| 29 | 88 |
| 30 | 93 |
| 31 | 145 |
| 32 | 6 |
| 33 | 17 |
| 34 | 20 |
| 35 | 39 |
| 36 | 23 |
| 37 | 43 |
| 38 | 49 |
| 39 | 82 |
| 40 | 28 |
| 41 | 52 |
| 42 | 56 |
| 43 | 89 |
| 44 | 63 |
| 45 | 99 |
| 46 | 103 |
| 47 | 154 |
| 48 | 33 |
| 49 | 57 |
| 50 | 66 |
| 51 | 101 |
| 52 | 68 |
| 53 | 109 |
| 54 | 116 |
| 55 | 165 |
| 56 | 79 |
| 57 | 118 |
| 58 | 126 |
| 59 | 179 |
| 60 | 131 |
| 61 | 187 |
| 62 | 198 |
| 63 | 268 |
| 64 | 9 |
| 65 | 22 |
| 66 | 26 |
| 67 | 51 |
| 68 | 29 |
| 69 | 55 |
| 70 | 60 |
| 71 | 95 |
| 72 | 35 |
| 73 | 64 |
| 74 | 67 |
| 75 | 104 |
| 76 | 75 |
| 77 | 112 |
| 78 | 121 |
| 79 | 169 |
| 80 | 42 |
| 81 | 72 |

-continued

| Table Z22, having a sequence length of 512: | |
|---|---|
| Polarized channel sequence number | Reliability or sequence number of reliability |
| 82 | 77 |
| 83 | 117 |
| 84 | 84 |
| 85 | 124 |
| 86 | 130 |
| 87 | 183 |
| 88 | 91 |
| 89 | 132 |
| 90 | 141 |
| 91 | 193 |
| 92 | 153 |
| 93 | 205 |
| 94 | 216 |
| 95 | 291 |
| 96 | 47 |
| 97 | 81 |
| 98 | 90 |
| 99 | 129 |
| 100 | 100 |
| 101 | 136 |
| 102 | 149 |
| 103 | 202 |
| 104 | 107 |
| 105 | 150 |
| 106 | 161 |
| 107 | 214 |
| 108 | 170 |
| 109 | 225 |
| 110 | 232 |
| 111 | 296 |
| 112 | 119 |
| 113 | 167 |
| 114 | 181 |
| 115 | 227 |
| 116 | 185 |
| 117 | 233 |
| 118 | 247 |
| 119 | 313 |
| 120 | 196 |
| 121 | 252 |
| 122 | 257 |
| 123 | 323 |
| 124 | 273 |
| 125 | 334 |
| 126 | 347 |
| 127 | 407 |
| 128 | 15 |
| 129 | 25 |
| 130 | 32 |
| 131 | 62 |
| 132 | 38 |
| 133 | 70 |
| 134 | 74 |
| 135 | 120 |
| 136 | 46 |
| 137 | 76 |
| 138 | 85 |
| 139 | 128 |
| 140 | 92 |
| 141 | 135 |
| 142 | 140 |
| 143 | 199 |
| 144 | 53 |
| 145 | 86 |
| 146 | 94 |
| 147 | 138 |
| 148 | 102 |
| 149 | 146 |
| 150 | 155 |
| 151 | 211 |
| 152 | 111 |
| 153 | 162 |
| 154 | 168 |
| 155 | 222 |

-continued

| Table Z22, having a sequence length of 512: | |
|---|---|
| Polarized channel sequence number | Reliability or sequence number of reliability |
| 156 | 182 |
| 157 | 231 |
| 158 | 246 |
| 159 | 309 |
| 160 | 58 |
| 161 | 98 |
| 162 | 108 |
| 163 | 152 |
| 164 | 113 |
| 165 | 164 |
| 166 | 173 |
| 167 | 228 |
| 168 | 127 |
| 169 | 176 |
| 170 | 186 |
| 171 | 236 |
| 172 | 195 |
| 173 | 251 |
| 174 | 259 |
| 175 | 322 |
| 176 | 139 |
| 177 | 188 |
| 178 | 203 |
| 179 | 254 |
| 180 | 213 |
| 181 | 263 |
| 182 | 276 |
| 183 | 332 |
| 184 | 226 |
| 185 | 281 |
| 186 | 294 |
| 187 | 345 |
| 188 | 301 |
| 189 | 355 |
| 190 | 369 |
| 191 | 426 |
| 192 | 65 |
| 193 | 110 |
| 194 | 123 |
| 195 | 174 |
| 196 | 133 |
| 197 | 184 |
| 198 | 194 |
| 199 | 253 |
| 200 | 143 |
| 201 | 197 |
| 202 | 209 |
| 203 | 262 |
| 204 | 219 |
| 205 | 277 |
| 206 | 287 |
| 207 | 342 |
| 208 | 156 |
| 209 | 212 |
| 210 | 224 |
| 211 | 279 |
| 212 | 234 |
| 213 | 293 |
| 214 | 300 |
| 215 | 356 |
| 216 | 244 |
| 217 | 306 |
| 218 | 318 |
| 219 | 363 |
| 220 | 326 |
| 221 | 377 |
| 222 | 385 |
| 223 | 433 |
| 224 | 171 |
| 225 | 229 |
| 226 | 239 |
| 227 | 298 |
| 228 | 255 |
| 229 | 308 |

-continued

| Table Z22, having a sequence length of 512: | |
|---|---|
| Polarized channel sequence number | Reliability or sequence number of reliability |
| 230 | 320 |
| 231 | 371 |
| 232 | 272 |
| 233 | 321 |
| 234 | 333 |
| 235 | 380 |
| 236 | 346 |
| 237 | 390 |
| 238 | 398 |
| 239 | 442 |
| 240 | 283 |
| 241 | 341 |
| 242 | 348 |
| 243 | 393 |
| 244 | 358 |
| 245 | 405 |
| 246 | 412 |
| 247 | 452 |
| 248 | 370 |
| 249 | 414 |
| 250 | 422 |
| 251 | 458 |
| 252 | 430 |
| 253 | 464 |
| 254 | 469 |
| 255 | 488 |
| 256 | 18 |
| 257 | 36 |
| 258 | 40 |
| 259 | 83 |
| 260 | 48 |
| 261 | 87 |
| 262 | 96 |
| 263 | 144 |
| 264 | 50 |
| 265 | 97 |
| 266 | 105 |
| 267 | 160 |
| 268 | 114 |
| 269 | 172 |
| 270 | 180 |
| 271 | 242 |
| 272 | 59 |
| 273 | 106 |
| 274 | 115 |
| 275 | 177 |
| 276 | 125 |
| 277 | 175 |
| 278 | 189 |
| 279 | 248 |
| 280 | 137 |
| 281 | 190 |
| 282 | 201 |
| 283 | 256 |
| 284 | 210 |
| 285 | 270 |
| 286 | 275 |
| 287 | 331 |
| 288 | 61 |
| 289 | 122 |
| 290 | 134 |
| 291 | 178 |
| 292 | 142 |
| 293 | 191 |
| 294 | 204 |
| 295 | 264 |
| 296 | 151 |
| 297 | 207 |
| 298 | 218 |
| 299 | 278 |
| 300 | 223 |
| 301 | 284 |
| 302 | 297 |
| 303 | 354 |

-continued

Table Z22, having a sequence length of 512:

| Polarized channel sequence number | Reliability or sequence number of reliability |
|---|---|
| 304 | 159 |
| 305 | 221 |
| 306 | 238 |
| 307 | 290 |
| 308 | 241 |
| 309 | 303 |
| 310 | 311 |
| 311 | 362 |
| 312 | 260 |
| 313 | 317 |
| 314 | 327 |
| 315 | 376 |
| 316 | 339 |
| 317 | 386 |
| 318 | 395 |
| 319 | 440 |
| 320 | 71 |
| 321 | 147 |
| 322 | 148 |
| 323 | 208 |
| 324 | 157 |
| 325 | 215 |
| 326 | 230 |
| 327 | 288 |
| 328 | 166 |
| 329 | 237 |
| 330 | 235 |
| 331 | 302 |
| 332 | 249 |
| 333 | 312 |
| 334 | 319 |
| 335 | 374 |
| 336 | 200 |
| 337 | 245 |
| 338 | 267 |
| 339 | 315 |
| 340 | 269 |
| 341 | 325 |
| 342 | 335 |
| 343 | 384 |
| 344 | 286 |
| 345 | 340 |
| 346 | 350 |
| 347 | 392 |
| 348 | 359 |
| 349 | 402 |
| 350 | 411 |
| 351 | 453 |
| 352 | 220 |
| 353 | 266 |
| 354 | 274 |
| 355 | 330 |
| 356 | 289 |
| 357 | 344 |
| 358 | 352 |
| 359 | 399 |
| 360 | 299 |
| 361 | 357 |
| 362 | 365 |
| 363 | 404 |
| 364 | 373 |
| 365 | 416 |
| 366 | 421 |
| 367 | 459 |
| 368 | 314 |
| 369 | 368 |
| 370 | 378 |
| 371 | 419 |
| 372 | 387 |
| 373 | 427 |
| 374 | 434 |
| 375 | 467 |
| 376 | 396 |
| 377 | 437 |

-continued

Table Z22, having a sequence length of 512:

| Polarized channel sequence number | Reliability or sequence number of reliability |
|---|---|
| 378 | 443 |
| 379 | 473 |
| 380 | 447 |
| 381 | 478 |
| 382 | 482 |
| 383 | 496 |
| 384 | 78 |
| 385 | 158 |
| 386 | 163 |
| 387 | 240 |
| 388 | 192 |
| 389 | 250 |
| 390 | 261 |
| 391 | 316 |
| 392 | 206 |
| 393 | 258 |
| 394 | 271 |
| 395 | 329 |
| 396 | 282 |
| 397 | 337 |
| 398 | 349 |
| 399 | 401 |
| 400 | 217 |
| 401 | 280 |
| 402 | 285 |
| 403 | 343 |
| 404 | 295 |
| 405 | 353 |
| 406 | 361 |
| 407 | 408 |
| 408 | 307 |
| 409 | 364 |
| 410 | 372 |
| 411 | 415 |
| 412 | 383 |
| 413 | 423 |
| 414 | 429 |
| 415 | 466 |
| 416 | 243 |
| 417 | 292 |
| 418 | 304 |
| 419 | 360 |
| 420 | 310 |
| 421 | 367 |
| 422 | 375 |
| 423 | 420 |
| 424 | 328 |
| 425 | 379 |
| 426 | 388 |
| 427 | 428 |
| 428 | 397 |
| 429 | 435 |
| 430 | 441 |
| 431 | 472 |
| 432 | 338 |
| 433 | 391 |
| 434 | 403 |
| 435 | 438 |
| 436 | 409 |
| 437 | 445 |
| 438 | 450 |
| 439 | 477 |
| 440 | 417 |
| 441 | 454 |
| 442 | 457 |
| 443 | 483 |
| 444 | 462 |
| 445 | 485 |
| 446 | 487 |
| 447 | 501 |
| 448 | 265 |
| 449 | 305 |
| 450 | 324 |
| 451 | 381 |

-continued

Table Z22, having a sequence length of 512:

| Polarized channel sequence number | Reliability or sequence number of reliability |
|---|---|
| 452 | 336 |
| 453 | 389 |
| 454 | 394 |
| 455 | 436 |
| 456 | 351 |
| 457 | 400 |
| 458 | 406 |
| 459 | 444 |
| 460 | 413 |
| 461 | 448 |
| 462 | 455 |
| 463 | 479 |
| 464 | 366 |
| 465 | 410 |
| 466 | 418 |
| 467 | 451 |
| 468 | 424 |
| 469 | 456 |
| 470 | 461 |
| 471 | 484 |
| 472 | 432 |
| 473 | 463 |
| 474 | 468 |
| 475 | 490 |
| 476 | 474 |
| 477 | 492 |
| 478 | 494 |
| 479 | 505 |
| 480 | 382 |
| 481 | 425 |
| 482 | 431 |
| 483 | 460 |
| 484 | 439 |
| 485 | 465 |
| 486 | 470 |
| 487 | 491 |
| 488 | 446 |
| 489 | 471 |
| 490 | 475 |
| 491 | 493 |
| 492 | 480 |
| 493 | 495 |
| 494 | 498 |
| 495 | 506 |
| 496 | 449 |
| 497 | 476 |
| 498 | 481 |
| 499 | 497 |
| 500 | 486 |
| 501 | 499 |
| 502 | 500 |
| 503 | 507 |
| 504 | 489 |
| 505 | 502 |
| 506 | 503 |
| 507 | 508 |
| 508 | 504 |
| 509 | 509 |
| 510 | 510 |
| 511 | 511 |

Sequence Z23, having a sequence length of 256:

[0, 1, 2, 7, 3, 8, 10, 23, 4, 11, 13, 26, 16, 30, 33, 62, 5, 12, 14, 29, 18, 35, 42, 65, 20, 41, 38, 71, 49, 77, 82, 122, 6, 17, 19, 37, 22, 40, 45, 73, 27, 47, 51, 78, 56, 86, 90, 128, 32, 52, 59, 88, 61, 94, 99, 134, 70, 101, 107, 143, 112, 150, 157, 194, 9, 21, 25, 46, 28, 50, 54, 84, 34, 57, 60, 91, 67, 97, 104, 137, 39, 64, 69, 100, 74, 106, 111, 146, 80, 113, 120, 152, 127, 161, 167, 203, 44, 72, 79, 110, 87, 116, 124, 159, 92, 125, 131, 166, 138, 171, 177, 206, 102, 135, 144, 173, 148, 178, 184, 213, 155, 186, 190, 218, 196, 222, 227, 243, 15, 24, 31, 55, 36, 63, 66, 103, 43, 68, 75, 109, 81, 115, 119, 158, 48, 76, 83, 117, 89, 123, 129, 163, 96, 132, 136, 169, 145, 176, 183, 212, 53, 85, 93, 126, 98, 133, 140, 174, 108, 142, 149, 180, 154, 185, 191, 217, 118, 151, 160, 188, 165, 193, 197, 220, 172, 200, 205, 225, 209, 229, 233, 247, 58, 95, 105, 141, 114, 147, 153, 187, 121, 156, 162, 192, 168, 198, 202, 224, 130, 164, 170, 199, 179, 204, 208, 230, 182, 210, 214, 232, 219, 236, 238, 249, 139, 175, 181, 207, 189, 211, 215, 235, 195, 216, 221, 237, 226, 239, 241, 250, 201, 223, 228, 240, 231, 242, 244, 251, 234, 245, 246, 252, 248, 253, 254, 255]

Table Z23, having a sequence length of 256:

| Polarized channel sequence number | Reliability or sequence number of reliability |
|---|---|
| 0 | 0 |
| 1 | 1 |
| 2 | 2 |
| 3 | 7 |
| 4 | 3 |
| 5 | 8 |
| 6 | 10 |
| 7 | 23 |
| 8 | 4 |
| 9 | 11 |
| 10 | 13 |
| 11 | 26 |
| 12 | 16 |
| 13 | 30 |
| 14 | 33 |
| 15 | 62 |
| 16 | 5 |
| 17 | 12 |
| 18 | 14 |
| 19 | 29 |
| 20 | 18 |
| 21 | 35 |
| 22 | 42 |
| 23 | 65 |
| 24 | 20 |
| 25 | 41 |
| 26 | 38 |
| 27 | 71 |
| 28 | 49 |
| 29 | 77 |
| 30 | 82 |
| 31 | 122 |
| 32 | 6 |
| 33 | 17 |
| 34 | 19 |
| 35 | 37 |
| 36 | 22 |
| 37 | 40 |
| 38 | 45 |
| 39 | 73 |
| 40 | 27 |
| 41 | 47 |
| 42 | 51 |
| 43 | 78 |
| 44 | 56 |
| 45 | 86 |
| 46 | 90 |
| 47 | 128 |
| 48 | 32 |
| 49 | 52 |
| 50 | 59 |
| 51 | 88 |
| 52 | 61 |
| 53 | 94 |
| 54 | 99 |
| 55 | 134 |
| 56 | 70 |
| 57 | 101 |
| 58 | 107 |
| 59 | 143 |
| 60 | 112 |
| 61 | 150 |

-continued

| Table Z23, having a sequence length of 256: | |
|---|---|
| Polarized channel sequence number | Reliability or sequence number of reliability |
| 62 | 157 |
| 63 | 194 |
| 64 | 9 |
| 65 | 21 |
| 66 | 25 |
| 67 | 46 |
| 68 | 28 |
| 69 | 50 |
| 70 | 54 |
| 71 | 84 |
| 72 | 34 |
| 73 | 57 |
| 74 | 60 |
| 75 | 91 |
| 76 | 67 |
| 77 | 97 |
| 78 | 104 |
| 79 | 137 |
| 80 | 39 |
| 81 | 64 |
| 82 | 69 |
| 83 | 100 |
| 84 | 74 |
| 85 | 106 |
| 86 | 111 |
| 87 | 146 |
| 88 | 80 |
| 89 | 113 |
| 90 | 120 |
| 91 | 152 |
| 92 | 127 |
| 93 | 161 |
| 94 | 167 |
| 95 | 203 |
| 96 | 44 |
| 97 | 72 |
| 98 | 79 |
| 99 | 110 |
| 100 | 87 |
| 101 | 116 |
| 102 | 124 |
| 103 | 159 |
| 104 | 92 |
| 105 | 125 |
| 106 | 131 |
| 107 | 166 |
| 108 | 138 |
| 109 | 171 |
| 110 | 177 |
| 111 | 206 |
| 112 | 102 |
| 113 | 135 |
| 114 | 144 |
| 115 | 173 |
| 116 | 148 |
| 117 | 178 |
| 118 | 184 |
| 119 | 213 |
| 120 | 155 |
| 121 | 186 |
| 122 | 190 |
| 123 | 218 |
| 124 | 196 |
| 125 | 222 |
| 126 | 227 |
| 127 | 243 |
| 128 | 15 |
| 129 | 24 |
| 130 | 31 |
| 131 | 55 |
| 132 | 36 |
| 133 | 63 |
| 134 | 66 |
| 135 | 103 |

-continued

| Table Z23, having a sequence length of 256: | |
|---|---|
| Polarized channel sequence number | Reliability or sequence number of reliability |
| 136 | 43 |
| 137 | 68 |
| 138 | 75 |
| 139 | 109 |
| 140 | 81 |
| 141 | 115 |
| 142 | 119 |
| 143 | 158 |
| 144 | 48 |
| 145 | 76 |
| 146 | 83 |
| 147 | 117 |
| 148 | 89 |
| 149 | 123 |
| 150 | 129 |
| 151 | 163 |
| 152 | 96 |
| 153 | 132 |
| 154 | 136 |
| 155 | 169 |
| 156 | 145 |
| 157 | 176 |
| 158 | 183 |
| 159 | 212 |
| 160 | 53 |
| 161 | 85 |
| 162 | 93 |
| 163 | 126 |
| 164 | 98 |
| 165 | 133 |
| 166 | 140 |
| 167 | 174 |
| 168 | 108 |
| 169 | 142 |
| 170 | 149 |
| 171 | 180 |
| 172 | 154 |
| 173 | 185 |
| 174 | 191 |
| 175 | 217 |
| 176 | 118 |
| 177 | 151 |
| 178 | 160 |
| 179 | 188 |
| 180 | 165 |
| 181 | 193 |
| 182 | 197 |
| 183 | 220 |
| 184 | 172 |
| 185 | 200 |
| 186 | 205 |
| 187 | 225 |
| 188 | 209 |
| 189 | 229 |
| 190 | 233 |
| 191 | 247 |
| 192 | 58 |
| 193 | 95 |
| 194 | 105 |
| 195 | 141 |
| 196 | 114 |
| 197 | 147 |
| 198 | 153 |
| 199 | 187 |
| 200 | 121 |
| 201 | 156 |
| 202 | 162 |
| 203 | 192 |
| 204 | 168 |
| 205 | 198 |
| 206 | 202 |
| 207 | 224 |
| 208 | 130 |
| 209 | 164 |

-continued

| Table Z23, having a sequence length of 256: | |
|---|---|
| Polarized channel sequence number | Reliability or sequence number of reliability |
| 210 | 170 |
| 211 | 199 |
| 212 | 179 |
| 213 | 204 |
| 214 | 208 |
| 215 | 230 |
| 216 | 182 |
| 217 | 210 |
| 218 | 214 |
| 219 | 232 |
| 220 | 219 |
| 221 | 236 |
| 222 | 238 |
| 223 | 249 |
| 224 | 139 |
| 225 | 175 |
| 226 | 181 |
| 227 | 207 |
| 228 | 189 |
| 229 | 211 |
| 230 | 215 |
| 231 | 235 |
| 232 | 195 |
| 233 | 216 |
| 234 | 221 |
| 235 | 237 |
| 236 | 226 |
| 237 | 239 |
| 238 | 241 |
| 239 | 250 |
| 240 | 201 |
| 241 | 223 |
| 242 | 228 |
| 243 | 240 |
| 244 | 231 |
| 245 | 242 |
| 246 | 244 |
| 247 | 251 |
| 248 | 234 |
| 249 | 245 |
| 250 | 246 |
| 251 | 252 |
| 252 | 248 |
| 253 | 253 |
| 254 | 254 |
| 255 | 255 |

Sequence Z24, having a sequence length of 128:

[0, 1, 2, 7, 3, 8, 10, 22, 4, 11, 13, 24, 15, 28, 30, 53, 5, 12, 14, 27, 17, 32, 38, 55, 19, 37, 34, 59, 43, 63, 67, 90, 6, 16, 18, 33, 21, 36, 40, 61, 25, 42, 45, 64, 48, 69, 72, 94, 29, 46, 50, 71, 52, 75, 77, 96, 58, 79, 83, 100, 86, 104, 107, 119, 9, 20, 23, 41, 26, 44, 47, 68, 31, 49, 51, 73, 56, 76, 81, 98, 35, 54, 57, 78, 62, 82, 85, 102, 66, 87, 89, 105, 93, 109, 111, 121, 39, 60, 65, 84, 70, 88, 91, 108, 74, 92, 95, 110, 99, 112, 114, 122, 80, 97, 101, 113, 103, 115, 116, 123, 106, 117, 118, 124, 120, 125, 126, 127]

| Table Z24, having a length of 128. | |
|---|---|
| Polarized channel sequence number | Reliability or sequence number of reliability |
| 0 | 0 |
| 1 | 1 |
| 2 | 2 |
| 3 | 7 |
| 4 | 3 |
| 5 | 8 |
| 6 | 10 |
| 7 | 22 |
| 8 | 4 |
| 9 | 11 |
| 10 | 13 |
| 11 | 24 |
| 12 | 15 |
| 13 | 28 |
| 14 | 30 |
| 15 | 53 |
| 16 | 5 |
| 17 | 12 |
| 18 | 14 |
| 19 | 27 |
| 20 | 17 |
| 21 | 32 |
| 22 | 38 |
| 23 | 55 |
| 24 | 19 |
| 25 | 37 |
| 26 | 34 |
| 27 | 59 |
| 28 | 43 |
| 29 | 63 |
| 30 | 67 |
| 31 | 90 |
| 32 | 6 |
| 33 | 16 |
| 34 | 18 |
| 35 | 33 |
| 36 | 21 |
| 37 | 36 |
| 38 | 40 |
| 39 | 61 |
| 40 | 25 |
| 41 | 42 |
| 42 | 45 |
| 43 | 64 |
| 44 | 48 |
| 45 | 69 |
| 46 | 72 |
| 47 | 94 |
| 48 | 29 |
| 49 | 46 |
| 50 | 50 |
| 51 | 71 |
| 52 | 52 |
| 53 | 75 |
| 54 | 77 |
| 55 | 96 |
| 56 | 58 |
| 57 | 79 |
| 58 | 83 |
| 59 | 100 |
| 60 | 86 |
| 61 | 104 |
| 62 | 107 |
| 63 | 119 |
| 64 | 9 |
| 65 | 20 |
| 66 | 23 |
| 67 | 41 |
| 68 | 26 |
| 69 | 44 |
| 70 | 47 |
| 71 | 68 |
| 72 | 31 |
| 73 | 49 |
| 74 | 51 |
| 75 | 73 |
| 76 | 56 |
| 77 | 76 |
| 78 | 81 |
| 79 | 98 |
| 80 | 35 |

-continued

| Table Z24, having a length of 128. | |
|---|---|
| Polarized channel sequence number | Reliability or sequence number of reliability |
| 81 | 54 |
| 82 | 57 |
| 83 | 78 |
| 84 | 62 |
| 85 | 82 |
| 86 | 85 |
| 87 | 102 |
| 88 | 66 |
| 89 | 87 |
| 90 | 89 |
| 91 | 105 |
| 92 | 93 |
| 93 | 109 |
| 94 | 111 |
| 95 | 121 |
| 96 | 39 |
| 97 | 60 |
| 98 | 65 |
| 99 | 84 |
| 100 | 70 |
| 101 | 88 |
| 102 | 91 |
| 103 | 108 |
| 104 | 74 |
| 105 | 92 |
| 106 | 95 |
| 107 | 110 |
| 108 | 99 |
| 109 | 112 |
| 110 | 114 |
| 111 | 122 |
| 112 | 80 |
| 113 | 97 |
| 114 | 101 |
| 115 | 113 |
| 116 | 103 |
| 117 | 115 |
| 118 | 116 |
| 119 | 123 |
| 120 | 106 |
| 121 | 117 |
| 122 | 118 |
| 123 | 124 |
| 124 | 120 |
| 125 | 125 |
| 126 | 126 |
| 127 | 127 |

Sequence Z25, having a sequence length of 64:

[0, 1, 2, 7, 3, 8, 9, 20, 4, 10, 12, 21, 14, 24, 26, 41, 5, 11, 13, 23, 16, 27, 32, 42, 18, 31, 29, 44, 35, 46, 48, 57, 6, 15, 17, 28, 19, 30, 33, 45, 22, 34, 36, 47, 38, 49, 51, 58, 25, 37, 39, 50, 40, 52, 53, 59, 43, 54, 55, 60, 56, 61, 62, 63]

| Table Z25, having a sequence length of 64: | |
|---|---|
| Polarized channel sequence number | Reliability or sequence number of reliability |
| 0 | 0 |
| 1 | 1 |
| 2 | 2 |
| 3 | 7 |
| 4 | 3 |
| 5 | 8 |
| 6 | 9 |
| 7 | 20 |
| 8 | 4 |
| 9 | 10 |
| 10 | 12 |
| 11 | 21 |
| 12 | 14 |
| 13 | 24 |
| 14 | 26 |
| 15 | 41 |
| 16 | 5 |
| 17 | 11 |
| 18 | 13 |
| 19 | 23 |
| 20 | 16 |
| 21 | 27 |
| 22 | 32 |
| 23 | 42 |
| 24 | 18 |
| 25 | 31 |
| 26 | 29 |
| 27 | 44 |
| 28 | 35 |
| 29 | 46 |
| 30 | 48 |
| 31 | 57 |
| 32 | 6 |
| 33 | 15 |
| 34 | 17 |
| 35 | 28 |
| 36 | 19 |
| 37 | 30 |
| 38 | 33 |
| 39 | 45 |
| 40 | 22 |
| 41 | 34 |
| 42 | 36 |
| 43 | 47 |
| 44 | 38 |
| 45 | 49 |
| 46 | 51 |
| 47 | 58 |
| 48 | 25 |
| 49 | 37 |
| 50 | 39 |
| 51 | 50 |
| 52 | 40 |
| 53 | 52 |
| 54 | 53 |
| 55 | 59 |
| 56 | 43 |
| 57 | 54 |
| 58 | 55 |
| 59 | 60 |
| 60 | 56 |
| 61 | 61 |
| 62 | 62 |
| 63 | 63 |

Sixth group of sequences (a criterion that considers optimal performance of List 4).

Sequence Q26, having a sequence length of 1024:

[0, 1, 4, 8, 2, 16, 32, 6, 64, 512, 3, 12, 5, 18, 128, 9, 33, 17, 10, 36, 66, 24, 256, 20, 65, 34, 7, 129, 40, 11, 72, 132, 513, 19, 48, 68, 13, 257, 14, 21, 130, 26, 80, 35, 258, 38, 136, 96, 22, 516, 37, 25, 67, 264, 41, 144, 28, 69, 260, 49, 74, 160, 42, 520, 134, 70, 44, 81, 272, 15, 50, 131, 192, 73, 23, 514, 137, 52, 288, 76, 133, 82, 27, 97, 259, 39, 528, 56, 138, 84, 29, 145, 261, 43, 320, 544, 98, 140, 265, 30, 88, 146, 262, 100, 518, 161, 71, 45, 273, 51, 148, 266, 576, 46, 75, 104, 164, 193, 53, 162, 515, 384, 268, 77, 152, 54, 85, 524, 289, 112, 274, 57, 78, 135, 517, 194, 83, 290, 168, 276, 86, 530, 58, 139, 322, 196, 101, 640, 60, 147, 176, 280, 99, 89, 521, 292, 141, 321, 200, 90, 545, 31, 142, 102, 263, 529, 47, 386, 105, 296, 208, 522, 153, 92, 149, 267, 548, 163, 324, 113, 150, 578, 165, 55, 304, 106, 275, 536, 269, 385, 154, 768, 79, 108, 224, 166, 532, 59, 169, 114, 195, 577, 328, 270, 277, 87, 546, 156, 116, 388, 519, 336, 291, 278, 197, 641, 61, 177, 170, 552, 91, 281, 201, 198, 523, 62, 143, 294, 584, 172, 392, 103, 644, 120, 293, 282, 531, 352, 178, 202, 560, 323, 297, 93, 580, 107, 151, 209, 525, 284, 180, 400, 769, 94, 204, 298, 526, 326, 155, 533, 305, 109, 325, 642, 210, 184, 225, 538, 167, 300, 592, 115, 387, 329, 547, 110, 416, 770, 212, 271, 117, 550, 306, 157, 648, 226, 171, 330, 608, 337, 389, 534, 308, 216, 549, 121, 390, 537, 158, 279, 332, 579, 118, 173, 776, 338, 179, 553, 199, 353, 656, 283, 312, 540, 448, 228, 581, 393, 122, 181, 772, 232, 295, 561, 174, 394, 586, 63, 203, 672, 354, 554, 401, 340, 646, 124, 285, 582, 182, 299, 556, 240, 211, 593, 286, 344, 784, 396, 205, 527, 95, 418, 562, 185, 643, 213, 402, 704, 307, 327, 585, 356, 535, 206, 186, 649, 301, 111, 564, 302, 800, 360, 227, 588, 417, 159, 645, 404, 594, 309, 214, 539, 449, 331, 609, 119, 771, 217, 188, 551, 229, 568, 333, 408, 650, 310, 596, 339, 420, 541, 218, 657, 368, 773, 123, 230, 555, 175, 832, 391, 313, 610, 241, 652, 450, 334, 777, 220, 542, 341, 600, 424, 314, 658, 183, 774, 233, 612, 355, 673, 125, 287, 583, 395, 557, 234, 785, 316, 345, 563, 187, 660, 452, 778, 403, 558, 342, 397, 587, 207, 616, 236, 676, 432, 705, 346, 565, 361, 674, 126, 242, 896, 357, 780, 405, 589, 215, 664, 398, 566, 303, 597, 358, 801, 419, 624, 456, 786, 348, 189, 569, 244, 590, 410, 647, 219, 706, 311, 595, 362, 802, 464, 680, 406, 788, 421, 598, 231, 570, 248, 651, 369, 834, 190, 708, 409, 613, 315, 572, 364, 659, 422, 335, 221, 688, 451, 792, 370, 611, 425, 601, 235, 804, 343, 653, 412, 833, 480, 712, 222, 602, 317, 543, 453, 654, 426, 614, 372, 775, 433, 559, 237, 898, 617, 347, 808, 243, 720, 454, 665, 318, 604, 376, 661, 428, 779, 238, 675, 359, 836, 458, 625, 399, 662, 677, 245, 567, 434, 816, 457, 618, 349, 787, 465, 781, 897, 363, 666, 407, 591, 127, 620, 246, 736, 436, 678, 571, 350, 681, 249, 626, 460, 707, 840, 411, 782, 365, 789, 440, 599, 374, 668, 628, 423, 900, 466, 848, 803, 250, 790, 371, 709, 191, 573, 689, 481, 682, 413, 603, 793, 366, 713, 468, 710, 429, 574, 655, 252, 806, 414, 684, 904, 373, 615, 482, 632, 805, 223, 794, 864, 427, 690, 472, 714, 835, 455, 809, 377, 605, 619, 435, 663, 721, 319, 796, 430, 692, 912, 239, 606, 716, 461, 810, 484, 838, 667, 378, 817, 621, 437, 837, 722, 247, 696, 380, 737, 679, 459, 812, 627, 488, 899, 841, 441, 622, 928, 351, 724, 783, 469, 629, 818, 438, 669, 462, 738, 683, 251, 842, 849, 496, 901, 820, 728, 467, 633, 902, 367, 670, 791, 442, 844, 630, 474, 685, 850, 483, 691, 711, 379, 865, 795, 415, 824, 960, 740, 253, 905, 634, 444, 693, 744, 485, 807, 686, 906, 470, 575, 715, 375, 866, 913, 473, 852, 636, 797, 431, 694, 811, 486, 752, 723, 798, 489, 856, 908, 254, 717, 607, 930, 476, 697, 725, 914, 439, 819, 839, 868, 492, 718, 698, 381, 813, 623, 814, 498, 872, 739, 929, 445, 671, 916, 821, 463, 726, 961, 843, 490, 631, 729, 700, 382, 741, 845, 920, 471, 822, 851, 932, 730, 497, 880, 635, 742, 443, 687, 903, 825, 475, 753, 962, 846, 732, 500, 853, 936, 826, 446, 695, 745, 867, 637, 487, 799, 907, 746, 828, 493, 857, 699, 964, 915, 477, 854, 909, 719, 504, 748, 944, 858, 873, 638, 478, 754, 869, 917, 727, 499, 910, 815, 870, 931, 255, 968, 860, 701, 756, 922, 491, 731, 823, 874, 976, 918, 502, 933, 743, 760, 881, 494, 702, 921, 827, 876, 934, 847, 505, 733, 963, 882, 937, 747, 383, 855, 924, 992, 734, 829, 965, 501, 938, 884, 945, 749, 859, 755, 479, 966, 830, 888, 940, 750, 871, 506, 970, 911, 757, 946, 969, 861, 977, 447, 875, 919, 639, 758, 948, 862, 761, 508, 972, 923, 877, 952, 886, 935, 978, 762, 503, 883, 703, 993, 925, 878, 980, 941, 764, 495, 926, 885, 994, 735, 939, 984, 967, 889, 947, 831, 507, 942, 751, 973, 996, 890, 949, 759, 892, 971, 1000, 953, 509, 863, 981, 950, 974, 763, 1008, 979, 879, 954, 986, 995, 891, 927, 510, 765, 956, 997, 982, 887, 985, 943, 998, 1001, 766, 988, 951, 1004, 893, 1010, 957, 975, 511, 1002, 894, 983, 1009, 955, 987, 1012, 958, 999, 1005, 989, 1016, 990, 1011, 767, 1003, 1014, 1006, 1017, 895, 1013, 991, 1018, 959, 1020, 1015, 1007, 1019, 1021, 1022, 1023]

Table Q26, having a sequence length of 1024:

| Reliability or sequence number of reliability | Polarized channel sequence number |
|---|---|
| 0 | 0 |
| 1 | 1 |
| 2 | 4 |
| 3 | 8 |
| 4 | 2 |
| 5 | 16 |
| 6 | 32 |
| 7 | 6 |
| 8 | 64 |
| 9 | 512 |
| 10 | 3 |
| 11 | 12 |
| 12 | 5 |
| 13 | 18 |
| 14 | 128 |
| 15 | 9 |
| 16 | 33 |
| 17 | 17 |
| 18 | 10 |
| 19 | 36 |
| 20 | 66 |
| 21 | 24 |
| 22 | 256 |
| 23 | 20 |
| 24 | 65 |
| 25 | 34 |
| 26 | 7 |
| 27 | 129 |
| 28 | 40 |
| 29 | 11 |
| 30 | 72 |
| 31 | 132 |
| 32 | 513 |
| 33 | 19 |
| 34 | 48 |
| 35 | 68 |
| 36 | 13 |
| 37 | 257 |
| 38 | 14 |
| 39 | 21 |
| 40 | 130 |
| 44 | 258 |
| 45 | 38 |
| 46 | 136 |
| 47 | 96 |
| 48 | 22 |
| 49 | 516 |
| 50 | 37 |
| 51 | 25 |
| 52 | 67 |
| 53 | 264 |
| 54 | 41 |
| 55 | 144 |
| 56 | 28 |
| 57 | 69 |
| 58 | 260 |
| 59 | 49 |
| 60 | 74 |
| 61 | 160 |
| 62 | 42 |
| 63 | 520 |
| 64 | 134 |
| 65 | 70 |
| 66 | 44 |
| 67 | 81 |
| 68 | 272 |
| 69 | 15 |
| 70 | 50 |
| 71 | 131 |
| 72 | 192 |
| 73 | 73 |
| 74 | 23 |

-continued

Table Q26, having a sequence length of 1024:

| Reliability or sequence number of reliability | Polarized channel sequence number |
|---|---|
| 75 | 514 |
| 76 | 137 |
| 77 | 52 |
| 78 | 288 |
| 79 | 76 |
| 80 | 133 |
| 81 | 82 |
| 82 | 27 |
| 83 | 97 |
| 84 | 259 |
| 85 | 39 |
| 86 | 528 |
| 87 | 56 |
| 88 | 138 |
| 89 | 84 |
| 90 | 29 |
| 91 | 145 |
| 92 | 261 |
| 93 | 43 |
| 94 | 320 |
| 95 | 544 |
| 96 | 98 |
| 97 | 140 |
| 98 | 265 |
| 99 | 30 |
| 100 | 88 |
| 101 | 146 |
| 102 | 262 |
| 103 | 100 |
| 104 | 518 |
| 105 | 161 |
| 106 | 71 |
| 107 | 45 |
| 108 | 273 |
| 109 | 51 |
| 110 | 148 |
| 111 | 266 |
| 112 | 576 |
| 113 | 46 |
| 114 | 75 |
| 115 | 104 |
| 116 | 164 |
| 117 | 193 |
| 118 | 53 |
| 119 | 162 |
| 120 | 515 |
| 121 | 384 |
| 122 | 268 |
| 123 | 77 |
| 124 | 152 |
| 125 | 54 |
| 126 | 85 |
| 127 | 524 |
| 128 | 289 |
| 129 | 112 |
| 130 | 274 |
| 131 | 57 |
| 132 | 78 |
| 133 | 135 |
| 134 | 517 |
| 135 | 194 |
| 136 | 83 |
| 137 | 290 |
| 138 | 168 |
| 139 | 276 |
| 140 | 86 |
| 141 | 530 |
| 142 | 58 |
| 143 | 139 |
| 144 | 322 |
| 145 | 196 |
| 146 | 101 |
| 147 | 640 |
| 148 | 60 |
| 149 | 147 |
| 150 | 176 |
| 151 | 280 |
| 152 | 99 |
| 153 | 89 |
| 154 | 521 |
| 155 | 292 |
| 156 | 141 |
| 157 | 321 |
| 158 | 200 |
| 159 | 90 |
| 160 | 545 |
| 161 | 31 |
| 162 | 142 |
| 163 | 102 |
| 164 | 263 |
| 165 | 529 |
| 166 | 47 |
| 167 | 386 |
| 168 | 105 |
| 172 | 153 |
| 173 | 92 |
| 174 | 149 |
| 175 | 267 |
| 176 | 548 |
| 177 | 163 |
| 178 | 324 |
| 179 | 113 |
| 180 | 150 |
| 181 | 578 |
| 182 | 165 |
| 183 | 55 |
| 184 | 304 |
| 185 | 106 |
| 186 | 275 |
| 187 | 536 |
| 188 | 269 |
| 189 | 385 |
| 190 | 154 |
| 191 | 768 |
| 192 | 79 |
| 193 | 108 |
| 194 | 224 |
| 195 | 166 |
| 196 | 532 |
| 197 | 59 |
| 198 | 169 |
| 199 | 114 |
| 200 | 195 |
| 201 | 577 |
| 202 | 328 |
| 203 | 270 |
| 204 | 277 |
| 205 | 87 |
| 206 | 546 |
| 207 | 156 |
| 208 | 116 |
| 209 | 388 |
| 210 | 519 |
| 211 | 336 |
| 212 | 291 |
| 213 | 278 |
| 214 | 197 |
| 215 | 641 |
| 216 | 61 |
| 217 | 177 |
| 218 | 170 |
| 219 | 552 |
| 220 | 91 |
| 221 | 281 |
| 222 | 201 |
| 223 | 198 |
| 224 | 523 |
| 225 | 62 |

-continued

Table Q26, having a sequence length of 1024:

| Reliability or sequence number of reliability | Polarized channel sequence number |
|---|---|
| 226 | 143 |
| 227 | 294 |
| 228 | 584 |
| 229 | 172 |
| 230 | 392 |
| 231 | 103 |
| 232 | 644 |
| 233 | 120 |
| 234 | 293 |
| 235 | 282 |
| 236 | 531 |
| 237 | 352 |
| 238 | 178 |
| 239 | 202 |
| 240 | 560 |
| 241 | 323 |
| 242 | 297 |
| 243 | 93 |
| 244 | 580 |
| 245 | 107 |
| 246 | 151 |
| 247 | 209 |
| 248 | 525 |
| 249 | 284 |
| 250 | 180 |
| 251 | 400 |
| 252 | 769 |
| 253 | 94 |
| 254 | 204 |
| 255 | 298 |
| 256 | 526 |
| 257 | 326 |
| 258 | 155 |
| 259 | 533 |
| 260 | 305 |
| 261 | 109 |
| 262 | 325 |
| 263 | 642 |
| 264 | 210 |
| 265 | 184 |
| 266 | 225 |
| 267 | 538 |
| 268 | 167 |
| 269 | 300 |
| 270 | 592 |
| 271 | 115 |
| 272 | 387 |
| 273 | 329 |
| 274 | 547 |
| 275 | 110 |
| 276 | 416 |
| 277 | 770 |
| 278 | 212 |
| 279 | 271 |
| 280 | 117 |
| 281 | 550 |
| 282 | 306 |
| 283 | 157 |
| 284 | 648 |
| 285 | 226 |
| 286 | 171 |
| 287 | 330 |
| 288 | 608 |
| 289 | 337 |
| 290 | 389 |
| 291 | 534 |
| 292 | 308 |
| 293 | 216 |
| 294 | 549 |
| 295 | 121 |
| 296 | 390 |
| 297 | 537 |
| 298 | 158 |
| 299 | 279 |

-continued

Table Q26, having a sequence length of 1024:

| Reliability or sequence number of reliability | Polarized channel sequence number |
|---|---|
| 300 | 332 |
| 301 | 579 |
| 302 | 118 |
| 303 | 173 |
| 304 | 776 |
| 305 | 338 |
| 306 | 179 |
| 307 | 553 |
| 308 | 199 |
| 309 | 353 |
| 310 | 656 |
| 311 | 283 |
| 312 | 312 |
| 313 | 540 |
| 314 | 448 |
| 315 | 228 |
| 316 | 581 |
| 317 | 393 |
| 318 | 122 |
| 319 | 181 |
| 320 | 772 |
| 321 | 232 |
| 322 | 295 |
| 323 | 561 |
| 324 | 174 |
| 325 | 394 |
| 326 | 586 |
| 327 | 63 |
| 328 | 203 |
| 329 | 672 |
| 330 | 354 |
| 331 | 554 |
| 332 | 401 |
| 333 | 340 |
| 334 | 646 |
| 335 | 124 |
| 336 | 285 |
| 337 | 582 |
| 338 | 182 |
| 339 | 299 |
| 340 | 556 |
| 341 | 240 |
| 342 | 211 |
| 343 | 593 |
| 344 | 286 |
| 345 | 344 |
| 346 | 784 |
| 347 | 396 |
| 348 | 205 |
| 349 | 527 |
| 350 | 95 |
| 351 | 418 |
| 352 | 562 |
| 353 | 185 |
| 354 | 643 |
| 355 | 213 |
| 356 | 402 |
| 357 | 704 |
| 358 | 307 |
| 359 | 327 |
| 360 | 585 |
| 361 | 356 |
| 362 | 535 |
| 363 | 206 |
| 364 | 186 |
| 365 | 649 |
| 366 | 301 |
| 367 | 111 |
| 368 | 564 |
| 369 | 302 |
| 370 | 800 |
| 371 | 360 |
| 372 | 227 |
| 373 | 588 |

Table Q26, having a sequence length of 1024:

| Reliability or sequence number of reliability | Polarized channel sequence number |
|---|---|
| 374 | 417 |
| 375 | 159 |
| 376 | 645 |
| 377 | 404 |
| 378 | 594 |
| 379 | 309 |
| 380 | 214 |
| 381 | 539 |
| 382 | 449 |
| 383 | 331 |
| 384 | 609 |
| 385 | 119 |
| 386 | 771 |
| 387 | 217 |
| 388 | 188 |
| 389 | 551 |
| 390 | 229 |
| 391 | 568 |
| 392 | 333 |
| 393 | 408 |
| 394 | 650 |
| 395 | 310 |
| 396 | 596 |
| 397 | 339 |
| 398 | 420 |
| 399 | 541 |
| 400 | 218 |
| 401 | 657 |
| 402 | 368 |
| 403 | 773 |
| 404 | 123 |
| 405 | 230 |
| 406 | 555 |
| 407 | 175 |
| 408 | 832 |
| 409 | 391 |
| 410 | 313 |
| 411 | 610 |
| 412 | 241 |
| 413 | 652 |
| 414 | 450 |
| 415 | 334 |
| 416 | 777 |
| 417 | 220 |
| 418 | 542 |
| 419 | 341 |
| 420 | 600 |
| 421 | 424 |
| 422 | 314 |
| 423 | 658 |
| 424 | 183 |
| 425 | 774 |
| 426 | 233 |
| 427 | 612 |
| 428 | 355 |
| 429 | 673 |
| 430 | 125 |
| 431 | 287 |
| 432 | 583 |
| 433 | 395 |
| 434 | 557 |
| 435 | 234 |
| 436 | 785 |
| 437 | 316 |
| 438 | 345 |
| 439 | 563 |
| 440 | 187 |
| 441 | 660 |
| 442 | 452 |
| 443 | 778 |
| 444 | 403 |
| 445 | 558 |
| 446 | 342 |
| 447 | 397 |

Table Q26, having a sequence length of 1024:

| Reliability or sequence number of reliability | Polarized channel sequence number |
|---|---|
| 448 | 587 |
| 449 | 207 |
| 450 | 616 |
| 451 | 236 |
| 452 | 676 |
| 453 | 432 |
| 454 | 705 |
| 455 | 346 |
| 456 | 565 |
| 457 | 361 |
| 458 | 674 |
| 459 | 126 |
| 460 | 242 |
| 461 | 896 |
| 462 | 357 |
| 463 | 780 |
| 464 | 405 |
| 465 | 589 |
| 466 | 215 |
| 467 | 664 |
| 468 | 398 |
| 469 | 566 |
| 470 | 303 |
| 471 | 597 |
| 472 | 358 |
| 473 | 801 |
| 474 | 419 |
| 475 | 624 |
| 476 | 456 |
| 477 | 786 |
| 478 | 348 |
| 479 | 189 |
| 480 | 569 |
| 481 | 244 |
| 482 | 590 |
| 483 | 410 |
| 484 | 647 |
| 485 | 219 |
| 486 | 706 |
| 487 | 311 |
| 488 | 595 |
| 489 | 362 |
| 490 | 802 |
| 491 | 464 |
| 492 | 680 |
| 493 | 406 |
| 494 | 788 |
| 495 | 421 |
| 496 | 598 |
| 497 | 231 |
| 498 | 570 |
| 499 | 248 |
| 500 | 651 |
| 501 | 369 |
| 502 | 834 |
| 503 | 190 |
| 504 | 708 |
| 505 | 409 |
| 506 | 613 |
| 507 | 315 |
| 508 | 572 |
| 509 | 364 |
| 510 | 659 |
| 511 | 422 |
| 512 | 335 |
| 513 | 221 |
| 514 | 688 |
| 515 | 451 |
| 516 | 792 |
| 517 | 370 |
| 518 | 611 |
| 519 | 425 |
| 520 | 601 |
| 521 | 235 |

-continued

Table Q26, having a sequence length of 1024:

| Reliability or sequence number of reliability | Polarized channel sequence number |
|---|---|
| 522 | 804 |
| 523 | 343 |
| 524 | 653 |
| 525 | 412 |
| 526 | 833 |
| 527 | 480 |
| 528 | 712 |
| 529 | 222 |
| 530 | 602 |
| 531 | 317 |
| 532 | 543 |
| 533 | 453 |
| 534 | 654 |
| 535 | 426 |
| 536 | 614 |
| 537 | 372 |
| 538 | 775 |
| 539 | 433 |
| 540 | 559 |
| 541 | 237 |
| 542 | 898 |
| 543 | 617 |
| 544 | 347 |
| 545 | 808 |
| 546 | 243 |
| 547 | 720 |
| 548 | 454 |
| 549 | 665 |
| 550 | 318 |
| 551 | 604 |
| 552 | 376 |
| 553 | 661 |
| 554 | 428 |
| 555 | 779 |
| 556 | 238 |
| 557 | 675 |
| 558 | 359 |
| 559 | 836 |
| 560 | 458 |
| 561 | 625 |
| 562 | 399 |
| 563 | 662 |
| 564 | 677 |
| 565 | 245 |
| 566 | 567 |
| 567 | 434 |
| 568 | 816 |
| 569 | 457 |
| 570 | 618 |
| 571 | 349 |
| 572 | 787 |
| 573 | 465 |
| 574 | 781 |
| 575 | 897 |
| 576 | 363 |
| 577 | 666 |
| 578 | 407 |
| 579 | 591 |
| 580 | 127 |
| 581 | 620 |
| 582 | 246 |
| 583 | 736 |
| 584 | 436 |
| 585 | 678 |
| 586 | 571 |
| 587 | 350 |
| 588 | 681 |
| 589 | 249 |
| 590 | 626 |
| 591 | 460 |
| 592 | 707 |
| 593 | 840 |
| 594 | 411 |
| 595 | 782 |

-continued

Table Q26, having a sequence length of 1024:

| Reliability or sequence number of reliability | Polarized channel sequence number |
|---|---|
| 596 | 365 |
| 597 | 789 |
| 598 | 440 |
| 599 | 599 |
| 600 | 374 |
| 601 | 668 |
| 602 | 628 |
| 603 | 423 |
| 604 | 900 |
| 605 | 466 |
| 606 | 848 |
| 607 | 803 |
| 608 | 250 |
| 609 | 790 |
| 610 | 371 |
| 611 | 709 |
| 612 | 191 |
| 613 | 573 |
| 614 | 689 |
| 615 | 481 |
| 616 | 682 |
| 617 | 413 |
| 618 | 603 |
| 619 | 793 |
| 620 | 366 |
| 621 | 713 |
| 622 | 468 |
| 623 | 710 |
| 624 | 429 |
| 625 | 574 |
| 626 | 655 |
| 627 | 252 |
| 628 | 806 |
| 629 | 414 |
| 630 | 684 |
| 631 | 904 |
| 632 | 373 |
| 633 | 615 |
| 634 | 482 |
| 635 | 632 |
| 636 | 805 |
| 637 | 223 |
| 638 | 794 |
| 639 | 864 |
| 640 | 427 |
| 641 | 690 |
| 642 | 472 |
| 643 | 714 |
| 644 | 835 |
| 645 | 455 |
| 646 | 809 |
| 647 | 377 |
| 648 | 605 |
| 649 | 619 |
| 650 | 435 |
| 651 | 663 |
| 652 | 721 |
| 653 | 319 |
| 654 | 796 |
| 655 | 430 |
| 656 | 692 |
| 657 | 912 |
| 658 | 239 |
| 659 | 606 |
| 660 | 716 |
| 661 | 461 |
| 662 | 810 |
| 663 | 484 |
| 664 | 838 |
| 665 | 667 |
| 666 | 378 |
| 667 | 817 |
| 668 | 621 |
| 669 | 437 |

-continued

| Table Q26, having a sequence length of 1024: | |
|---|---|
| Reliability or sequence number of reliability | Polarized channel sequence number |
| 670 | 837 |
| 671 | 722 |
| 672 | 247 |
| 673 | 696 |
| 674 | 380 |
| 675 | 737 |
| 676 | 679 |
| 677 | 459 |
| 678 | 812 |
| 679 | 627 |
| 680 | 488 |
| 681 | 899 |
| 682 | 841 |
| 683 | 441 |
| 684 | 622 |
| 685 | 928 |
| 686 | 351 |
| 687 | 724 |
| 688 | 783 |
| 689 | 469 |
| 690 | 629 |
| 691 | 818 |
| 692 | 438 |
| 693 | 669 |
| 694 | 462 |
| 695 | 738 |
| 696 | 683 |
| 697 | 251 |
| 698 | 842 |
| 699 | 849 |
| 700 | 496 |
| 701 | 901 |
| 702 | 820 |
| 703 | 728 |
| 704 | 467 |
| 705 | 633 |
| 706 | 902 |
| 707 | 367 |
| 708 | 670 |
| 709 | 791 |
| 710 | 442 |
| 711 | 844 |
| 712 | 630 |
| 713 | 474 |
| 714 | 685 |
| 715 | 850 |
| 719 | 379 |
| 720 | 865 |
| 721 | 795 |
| 722 | 415 |
| 723 | 824 |
| 724 | 960 |
| 725 | 740 |
| 726 | 253 |
| 727 | 905 |
| 728 | 634 |
| 729 | 444 |
| 730 | 693 |
| 731 | 744 |
| 732 | 485 |
| 733 | 807 |
| 734 | 686 |
| 735 | 906 |
| 736 | 470 |
| 737 | 575 |
| 738 | 715 |
| 739 | 375 |
| 740 | 866 |
| 741 | 913 |
| 742 | 473 |
| 743 | 852 |
| 744 | 636 |
| 745 | 797 |
| 746 | 431 |

-continued

| Table Q26, having a sequence length of 1024: | |
|---|---|
| Reliability or sequence number of reliability | Polarized channel sequence number |
| 747 | 694 |
| 748 | 811 |
| 749 | 486 |
| 750 | 752 |
| 751 | 723 |
| 752 | 798 |
| 753 | 489 |
| 754 | 856 |
| 755 | 908 |
| 756 | 254 |
| 757 | 717 |
| 758 | 607 |
| 759 | 930 |
| 760 | 476 |
| 761 | 697 |
| 762 | 725 |
| 763 | 914 |
| 764 | 439 |
| 765 | 819 |
| 766 | 839 |
| 767 | 868 |
| 768 | 492 |
| 769 | 718 |
| 770 | 698 |
| 771 | 381 |
| 772 | 813 |
| 773 | 623 |
| 774 | 814 |
| 775 | 498 |
| 776 | 872 |
| 777 | 739 |
| 778 | 929 |
| 779 | 445 |
| 780 | 671 |
| 781 | 916 |
| 782 | 821 |
| 783 | 463 |
| 784 | 726 |
| 785 | 961 |
| 786 | 843 |
| 787 | 490 |
| 788 | 631 |
| 789 | 729 |
| 790 | 700 |
| 791 | 382 |
| 792 | 741 |
| 793 | 845 |
| 794 | 920 |
| 795 | 471 |
| 796 | 822 |
| 797 | 851 |
| 798 | 932 |
| 799 | 730 |
| 800 | 497 |
| 801 | 880 |
| 802 | 635 |
| 803 | 742 |
| 804 | 443 |
| 805 | 687 |
| 806 | 903 |
| 807 | 825 |
| 808 | 475 |
| 812 | 732 |
| 813 | 500 |
| 814 | 853 |
| 815 | 936 |
| 816 | 826 |
| 817 | 446 |
| 818 | 695 |
| 819 | 745 |
| 820 | 867 |
| 821 | 637 |
| 822 | 487 |
| 823 | 799 |

-continued

Table Q26, having a sequence length of 1024:

| Reliability or sequence number of reliability | Polarized channel sequence number |
|---|---|
| 824 | 907 |
| 825 | 746 |
| 826 | 828 |
| 827 | 493 |
| 828 | 857 |
| 829 | 699 |
| 830 | 964 |
| 831 | 915 |
| 832 | 477 |
| 833 | 854 |
| 834 | 909 |
| 835 | 719 |
| 836 | 504 |
| 837 | 748 |
| 838 | 944 |
| 839 | 858 |
| 840 | 873 |
| 841 | 638 |
| 842 | 478 |
| 843 | 754 |
| 847 | 499 |
| 848 | 910 |
| 849 | 815 |
| 850 | 870 |
| 851 | 931 |
| 852 | 255 |
| 853 | 968 |
| 854 | 860 |
| 855 | 701 |
| 856 | 756 |
| 857 | 922 |
| 858 | 491 |
| 859 | 731 |
| 860 | 823 |
| 861 | 874 |
| 862 | 976 |
| 863 | 918 |
| 864 | 502 |
| 865 | 933 |
| 866 | 743 |
| 867 | 760 |
| 868 | 881 |
| 869 | 494 |
| 870 | 702 |
| 871 | 921 |
| 872 | 827 |
| 873 | 876 |
| 874 | 934 |
| 875 | 847 |
| 876 | 505 |
| 877 | 733 |
| 878 | 963 |
| 879 | 882 |
| 880 | 937 |
| 881 | 747 |
| 882 | 383 |
| 883 | 855 |
| 884 | 924 |
| 885 | 992 |
| 886 | 734 |
| 887 | 829 |
| 888 | 965 |
| 889 | 501 |
| 890 | 938 |
| 891 | 884 |
| 892 | 945 |
| 893 | 749 |
| 894 | 859 |
| 895 | 755 |
| 896 | 479 |
| 897 | 966 |
| 898 | 830 |
| 899 | 888 |
| 900 | 940 |

-continued

Table Q26, having a sequence length of 1024:

| Reliability or sequence number of reliability | Polarized channel sequence number |
|---|---|
| 901 | 750 |
| 902 | 871 |
| 903 | 506 |
| 904 | 970 |
| 905 | 911 |
| 906 | 757 |
| 907 | 946 |
| 908 | 969 |
| 909 | 861 |
| 910 | 977 |
| 911 | 447 |
| 912 | 875 |
| 913 | 919 |
| 914 | 639 |
| 915 | 758 |
| 916 | 948 |
| 917 | 862 |
| 918 | 761 |
| 919 | 508 |
| 920 | 972 |
| 921 | 923 |
| 922 | 877 |
| 923 | 952 |
| 924 | 886 |
| 925 | 935 |
| 926 | 978 |
| 927 | 762 |
| 928 | 503 |
| 929 | 883 |
| 930 | 703 |
| 931 | 993 |
| 932 | 925 |
| 933 | 878 |
| 934 | 980 |
| 935 | 941 |
| 936 | 764 |
| 937 | 495 |
| 938 | 926 |
| 939 | 885 |
| 940 | 994 |
| 941 | 735 |
| 942 | 939 |
| 943 | 984 |
| 944 | 967 |
| 945 | 889 |
| 946 | 947 |
| 947 | 831 |
| 948 | 507 |
| 949 | 942 |
| 950 | 751 |
| 951 | 973 |
| 952 | 996 |
| 953 | 890 |
| 954 | 949 |
| 955 | 759 |
| 956 | 892 |
| 957 | 971 |
| 958 | 1000 |
| 959 | 953 |
| 960 | 509 |
| 961 | 863 |
| 962 | 981 |
| 963 | 950 |
| 964 | 974 |
| 965 | 763 |
| 966 | 1008 |
| 967 | 979 |
| 968 | 879 |
| 969 | 954 |
| 970 | 986 |
| 971 | 995 |
| 972 | 891 |
| 973 | 927 |
| 974 | 510 |

-continued

Table Q26, having a sequence length of 1024:

| Reliability or sequence number of reliability | Polarized channel sequence number |
|---|---|
| 975 | 765 |
| 976 | 956 |
| 977 | 997 |
| 978 | 982 |
| 979 | 887 |
| 980 | 985 |
| 981 | 943 |
| 982 | 998 |
| 983 | 1001 |
| 984 | 766 |
| 985 | 988 |
| 986 | 951 |
| 987 | 1004 |
| 988 | 893 |
| 989 | 1010 |
| 990 | 957 |
| 991 | 975 |
| 992 | 511 |
| 993 | 1002 |
| 994 | 894 |
| 995 | 983 |
| 996 | 1009 |
| 997 | 955 |
| 998 | 987 |
| 999 | 1012 |
| 1000 | 958 |
| 1001 | 999 |
| 1002 | 1005 |
| 1003 | 989 |
| 1004 | 1016 |
| 1005 | 990 |
| 1006 | 1011 |
| 1010 | 1006 |
| 1011 | 1017 |
| 1012 | 895 |
| 1013 | 1013 |
| 1014 | 991 |
| 1015 | 1018 |
| 1016 | 959 |
| 1017 | 1020 |
| 1018 | 1015 |
| 1019 | 1007 |
| 1020 | 1019 |
| 1021 | 1021 |
| 1022 | 1022 |
| 1023 | 1023 |

Sequence Q27, having a sequence length of 512:

[0, 1, 4, 8, 2, 16, 32, 6, 64, 3, 12, 5, 18, 128, 9, 33, 17, 10, 36, 66, 24, 256, 20, 65, 34, 7, 129, 40, 11, 72, 132, 19, 48, 68, 13, 257, 14, 21, 130, 26, 80, 35, 258, 38, 136, 96, 22, 37, 25, 67, 264, 41, 144, 28, 69, 260, 49, 74, 160, 42, 134, 70, 44, 81, 272, 15, 50, 131, 192, 73, 23, 137, 52, 288, 76, 133, 82, 27, 97, 259, 39, 56, 138, 84, 29, 145, 261, 43, 320, 98, 140, 265, 30, 88, 146, 262, 100, 161, 71, 45, 273, 51, 148, 266, 46, 75, 104, 164, 193, 53, 162, 384, 268, 77, 152, 54, 85, 289, 112, 274, 57, 78, 135, 194, 83, 290, 168, 276, 86, 58, 139, 322, 196, 101, 60, 147, 176, 280, 99, 89, 292, 141, 321, 200, 90, 31, 142, 102, 263, 47, 386, 105, 296, 208, 153, 92, 149, 267, 163, 324, 113, 150, 165, 55, 304, 106, 275, 269, 385, 154, 79, 108, 224, 166, 59, 169, 114, 195, 328, 270, 277, 87, 156, 116, 388, 336, 291, 278, 197, 61, 177, 170, 91, 281, 201, 198, 62, 143, 294, 172, 392, 103, 120, 293, 282, 352, 178, 202, 323, 297, 93, 107, 151, 209, 284, 180, 400, 94, 204, 298, 326, 155, 305, 109, 325, 210, 184, 225, 167, 300, 115, 387, 329, 110, 416, 212, 271, 117, 306, 157, 226, 171, 330, 337, 389, 308, 216, 121, 390, 158, 279, 332, 118, 173, 338, 179, 199, 353, 283, 312, 448, 228, 393, 122, 181, 232, 295, 174, 394, 63, 203, 354, 401, 340, 124, 285, 182, 299, 240, 211, 286, 344, 396, 205, 95, 418, 185, 213, 402, 307, 327, 356, 206, 186, 301, 111, 302, 360, 227, 417, 159, 404, 309, 214, 449, 331, 119, 217, 188, 229, 333, 408, 310, 339, 420, 218, 368, 123, 230, 175, 391, 313, 241, 450, 334, 220, 341, 424, 314, 183, 233, 355, 125, 287, 395, 234, 316, 345, 187, 452, 403, 342, 397, 207, 236, 432, 346, 361, 126, 242, 357, 405, 215, 398, 303, 358, 419, 456, 348, 189, 244, 410, 219, 311, 362, 464, 406, 421, 231, 248, 369, 190, 409, 315, 364, 422, 335, 221, 451, 370, 425, 235, 343, 412, 480, 222, 317, 453, 426, 372, 433, 237, 347, 243, 454, 318, 376, 428, 238, 359, 458, 399, 245, 434, 457, 349, 465, 363, 407, 127, 246, 436, 350, 249, 460, 411, 365, 440, 374, 423, 466, 250, 371, 191, 481, 413, 366, 468, 429, 252, 414, 373, 482, 223, 427, 472, 455, 377, 435, 319, 430, 239, 461, 484, 378, 437, 247, 380, 459, 488, 441, 351, 469, 438, 462, 251, 496, 467, 367, 442, 474, 483, 379, 415, 253, 444, 485, 470, 375, 473, 431, 486, 489, 254, 476, 439, 492, 381, 498, 445, 463, 490, 382, 471, 497, 443, 475, 500, 446, 487, 493, 477, 504, 478, 499, 255, 491, 502, 494, 505, 383, 501, 479, 506, 447, 508, 503, 495, 507, 509, 510, 511]

Table Q27, having a sequence length of 512:

| Reliability or sequence number of reliability | Polarized channel sequence number |
|---|---|
| 0 | 0 |
| 1 | 1 |
| 2 | 4 |
| 3 | 8 |
| 4 | 2 |
| 5 | 16 |
| 6 | 32 |
| 7 | 6 |
| 8 | 64 |
| 9 | 3 |
| 10 | 12 |
| 11 | 5 |
| 12 | 18 |
| 13 | 128 |
| 14 | 9 |
| 15 | 33 |
| 16 | 17 |
| 17 | 10 |
| 18 | 36 |
| 19 | 66 |
| 20 | 24 |
| 21 | 256 |
| 22 | 20 |
| 23 | 65 |
| 24 | 34 |
| 25 | 7 |
| 26 | 129 |
| 27 | 40 |
| 28 | 11 |
| 29 | 72 |
| 30 | 132 |
| 31 | 19 |
| 32 | 48 |
| 33 | 68 |
| 34 | 13 |
| 35 | 257 |
| 36 | 14 |
| 37 | 21 |
| 38 | 130 |
| 39 | 26 |
| 40 | 80 |
| 41 | 35 |
| 42 | 258 |
| 43 | 38 |
| 44 | 136 |
| 45 | 96 |
| 46 | 22 |
| 47 | 37 |
| 48 | 25 |
| 49 | 67 |

-continued

Table Q27, having a sequence length of 512:

| Reliability or sequence number of reliability | Polarized channel sequence number |
|---|---|
| 50 | 264 |
| 51 | 41 |
| 52 | 144 |
| 56 | 49 |
| 57 | 74 |
| 58 | 160 |
| 59 | 42 |
| 60 | 134 |
| 61 | 70 |
| 62 | 44 |
| 63 | 81 |
| 64 | 272 |
| 65 | 15 |
| 66 | 50 |
| 67 | 131 |
| 68 | 192 |
| 69 | 73 |
| 70 | 23 |
| 71 | 137 |
| 72 | 52 |
| 73 | 288 |
| 74 | 76 |
| 75 | 133 |
| 76 | 82 |
| 77 | 27 |
| 78 | 97 |
| 79 | 259 |
| 80 | 39 |
| 81 | 56 |
| 82 | 138 |
| 83 | 84 |
| 84 | 29 |
| 85 | 145 |
| 86 | 261 |
| 87 | 43 |
| 88 | 320 |
| 89 | 98 |
| 90 | 140 |
| 91 | 265 |
| 92 | 30 |
| 93 | 88 |
| 94 | 146 |
| 95 | 262 |
| 96 | 100 |
| 97 | 161 |
| 98 | 71 |
| 99 | 45 |
| 100 | 273 |
| 101 | 51 |
| 102 | 148 |
| 103 | 266 |
| 104 | 46 |
| 105 | 75 |
| 106 | 104 |
| 107 | 164 |
| 108 | 193 |
| 109 | 53 |
| 110 | 162 |
| 111 | 384 |
| 112 | 268 |
| 113 | 77 |
| 114 | 152 |
| 115 | 54 |
| 116 | 85 |
| 120 | 57 |
| 121 | 78 |
| 122 | 135 |
| 123 | 194 |
| 124 | 83 |
| 125 | 290 |
| 126 | 168 |
| 127 | 276 |
| 128 | 86 |
| 129 | 58 |

-continued

Table Q27, having a sequence length of 512:

| Reliability or sequence number of reliability | Polarized channel sequence number |
|---|---|
| 130 | 139 |
| 131 | 322 |
| 132 | 196 |
| 133 | 101 |
| 134 | 60 |
| 135 | 147 |
| 136 | 176 |
| 137 | 280 |
| 138 | 99 |
| 139 | 89 |
| 140 | 292 |
| 141 | 141 |
| 142 | 321 |
| 143 | 200 |
| 144 | 90 |
| 145 | 31 |
| 146 | 142 |
| 147 | 102 |
| 148 | 263 |
| 149 | 47 |
| 150 | 386 |
| 151 | 105 |
| 152 | 296 |
| 153 | 208 |
| 154 | 153 |
| 155 | 92 |
| 156 | 149 |
| 157 | 267 |
| 158 | 163 |
| 159 | 324 |
| 160 | 113 |
| 161 | 150 |
| 162 | 165 |
| 163 | 55 |
| 164 | 304 |
| 165 | 106 |
| 166 | 275 |
| 167 | 269 |
| 168 | 385 |
| 169 | 154 |
| 170 | 79 |
| 171 | 108 |
| 172 | 224 |
| 173 | 166 |
| 174 | 59 |
| 175 | 169 |
| 176 | 114 |
| 177 | 195 |
| 178 | 328 |
| 179 | 270 |
| 180 | 277 |
| 184 | 388 |
| 185 | 336 |
| 186 | 291 |
| 187 | 278 |
| 188 | 197 |
| 189 | 61 |
| 190 | 177 |
| 191 | 170 |
| 192 | 91 |
| 193 | 281 |
| 194 | 201 |
| 195 | 198 |
| 196 | 62 |
| 197 | 143 |
| 198 | 294 |
| 199 | 172 |
| 200 | 392 |
| 201 | 103 |
| 202 | 120 |
| 203 | 293 |
| 204 | 282 |
| 205 | 352 |
| 206 | 178 |

-continued

Table Q27, having a sequence length of 512:

| Reliability or sequence number of reliability | Polarized channel sequence number |
|---|---|
| 207 | 202 |
| 208 | 323 |
| 209 | 297 |
| 210 | 93 |
| 211 | 107 |
| 212 | 151 |
| 213 | 209 |
| 214 | 284 |
| 215 | 180 |
| 216 | 400 |
| 217 | 94 |
| 218 | 204 |
| 219 | 298 |
| 220 | 326 |
| 221 | 155 |
| 222 | 305 |
| 223 | 109 |
| 224 | 325 |
| 225 | 210 |
| 226 | 184 |
| 227 | 225 |
| 228 | 167 |
| 229 | 300 |
| 230 | 115 |
| 231 | 387 |
| 232 | 329 |
| 233 | 110 |
| 234 | 416 |
| 235 | 212 |
| 236 | 271 |
| 237 | 117 |
| 238 | 306 |
| 239 | 157 |
| 240 | 226 |
| 241 | 171 |
| 242 | 330 |
| 243 | 337 |
| 244 | 389 |
| 248 | 390 |
| 249 | 158 |
| 250 | 279 |
| 251 | 332 |
| 252 | 118 |
| 253 | 173 |
| 254 | 338 |
| 255 | 179 |
| 256 | 199 |
| 257 | 353 |
| 258 | 283 |
| 259 | 312 |
| 260 | 448 |
| 261 | 228 |
| 262 | 393 |
| 263 | 122 |
| 264 | 181 |
| 265 | 232 |
| 266 | 295 |
| 267 | 174 |
| 268 | 394 |
| 269 | 63 |
| 270 | 203 |
| 271 | 354 |
| 272 | 401 |
| 273 | 340 |
| 274 | 124 |
| 275 | 285 |
| 276 | 182 |
| 277 | 299 |
| 278 | 240 |
| 279 | 211 |
| 280 | 286 |
| 281 | 344 |
| 282 | 396 |
| 283 | 205 |
| 284 | 95 |
| 285 | 418 |
| 286 | 185 |
| 287 | 213 |
| 288 | 402 |
| 289 | 307 |
| 290 | 327 |
| 291 | 356 |
| 292 | 206 |
| 293 | 186 |
| 294 | 301 |
| 295 | 111 |
| 296 | 302 |
| 297 | 360 |
| 298 | 227 |
| 299 | 417 |
| 300 | 159 |
| 301 | 404 |
| 302 | 309 |
| 303 | 214 |
| 304 | 449 |
| 305 | 331 |
| 306 | 119 |
| 307 | 217 |
| 308 | 188 |
| 312 | 310 |
| 313 | 339 |
| 314 | 420 |
| 315 | 218 |
| 316 | 368 |
| 317 | 123 |
| 318 | 230 |
| 319 | 175 |
| 320 | 391 |
| 321 | 313 |
| 322 | 241 |
| 323 | 450 |
| 324 | 334 |
| 325 | 220 |
| 326 | 341 |
| 327 | 424 |
| 328 | 314 |
| 329 | 183 |
| 330 | 233 |
| 331 | 355 |
| 332 | 125 |
| 333 | 287 |
| 334 | 395 |
| 335 | 234 |
| 336 | 316 |
| 337 | 345 |
| 338 | 187 |
| 339 | 452 |
| 340 | 403 |
| 341 | 342 |
| 342 | 397 |
| 343 | 207 |
| 344 | 236 |
| 345 | 432 |
| 346 | 346 |
| 347 | 361 |
| 348 | 126 |
| 349 | 242 |
| 350 | 357 |
| 351 | 405 |
| 352 | 215 |
| 353 | 398 |
| 354 | 303 |
| 355 | 358 |
| 356 | 419 |
| 357 | 456 |
| 358 | 348 |
| 359 | 189 |
| 360 | 244 |

-continued

| Table Q27, having a sequence length of 512: | |
|---|---|
| Reliability or sequence number of reliability | Polarized channel sequence number |
| 361 | 410 |
| 362 | 219 |
| 363 | 311 |
| 364 | 362 |
| 365 | 464 |
| 366 | 406 |
| 367 | 421 |
| 368 | 231 |
| 369 | 248 |
| 370 | 369 |
| 371 | 190 |
| 372 | 409 |
| 376 | 335 |
| 377 | 221 |
| 378 | 451 |
| 379 | 370 |
| 380 | 425 |
| 381 | 235 |
| 382 | 343 |
| 383 | 412 |
| 384 | 480 |
| 385 | 222 |
| 386 | 317 |
| 387 | 453 |
| 388 | 426 |
| 389 | 372 |
| 390 | 433 |
| 391 | 237 |
| 392 | 347 |
| 393 | 243 |
| 394 | 454 |
| 395 | 318 |
| 396 | 376 |
| 397 | 428 |
| 398 | 238 |
| 399 | 359 |
| 400 | 458 |
| 401 | 399 |
| 402 | 245 |
| 403 | 434 |
| 404 | 457 |
| 405 | 349 |
| 406 | 465 |
| 407 | 363 |
| 408 | 407 |
| 409 | 127 |
| 410 | 246 |
| 411 | 436 |
| 412 | 350 |
| 413 | 249 |
| 414 | 460 |
| 415 | 411 |
| 416 | 365 |
| 417 | 440 |
| 418 | 374 |
| 419 | 423 |
| 420 | 466 |
| 421 | 250 |
| 422 | 371 |
| 423 | 191 |
| 424 | 481 |
| 425 | 413 |
| 426 | 366 |
| 427 | 468 |
| 428 | 429 |
| 429 | 252 |
| 430 | 414 |
| 431 | 373 |
| 432 | 482 |
| 433 | 223 |
| 434 | 427 |
| 435 | 472 |
| 436 | 455 |
| 440 | 430 |

-continued

| Table Q27, having a sequence length of 512: | |
|---|---|
| Reliability or sequence number of reliability | Polarized channel sequence number |
| 441 | 239 |
| 442 | 461 |
| 443 | 484 |
| 444 | 378 |
| 445 | 437 |
| 446 | 247 |
| 447 | 380 |
| 448 | 459 |
| 449 | 488 |
| 450 | 441 |
| 451 | 351 |
| 452 | 469 |
| 453 | 438 |
| 454 | 462 |
| 455 | 251 |
| 456 | 496 |
| 457 | 467 |
| 458 | 367 |
| 459 | 442 |
| 460 | 474 |
| 461 | 483 |
| 462 | 379 |
| 463 | 415 |
| 464 | 253 |
| 465 | 444 |
| 466 | 485 |
| 467 | 470 |
| 468 | 375 |
| 469 | 473 |
| 470 | 431 |
| 471 | 486 |
| 472 | 489 |
| 473 | 254 |
| 474 | 476 |
| 475 | 439 |
| 476 | 492 |
| 477 | 381 |
| 478 | 498 |
| 479 | 445 |
| 480 | 463 |
| 481 | 490 |
| 482 | 382 |
| 483 | 471 |
| 484 | 497 |
| 485 | 443 |
| 486 | 475 |
| 487 | 500 |
| 488 | 446 |
| 489 | 487 |
| 490 | 493 |
| 491 | 477 |
| 492 | 504 |
| 493 | 478 |
| 494 | 499 |
| 495 | 255 |
| 496 | 491 |
| 497 | 502 |
| 498 | 494 |
| 499 | 505 |
| 500 | 383 |
| 504 | 447 |
| 505 | 508 |
| 506 | 503 |
| 507 | 495 |
| 508 | 507 |
| 509 | 509 |
| 510 | 510 |
| 511 | 511 |

Sequence Q28, having a sequence length of 256:

[0, 1, 4, 8, 2, 16, 32, 6, 64, 3, 12, 5, 18, 128, 9, 33, 17, 10, 36, 66, 24, 20, 65, 34, 7, 129, 40, 11, 72, 132, 19, 48, 68, 13, 14, 21, 130, 26, 80, 35, 38, 136, 96, 22, 37, 25, 67, 41, 144, 28, 69, 49, 74, 160, 42, 134, 70, 44, 81, 15, 50, 131, 192, 73, 23, 137, 52, 76, 133, 82, 27, 97, 39, 56, 138, 84, 29, 145, 43, 98, 140, 30, 88, 146, 100, 161, 71, 45, 51, 148, 46, 75, 104, 164, 193, 53, 162, 77, 152, 54, 85, 112, 57, 78, 135, 194, 83, 168, 86, 58, 139, 196, 101, 60, 147, 176, 99, 89, 141, 200, 90, 31, 142, 102, 47, 105, 208, 153, 92, 149, 163, 113, 150, 165, 55, 106, 154, 79, 108, 224, 166, 59, 169, 114, 195, 87, 156, 116, 197, 61, 177, 170, 91, 201, 198, 62, 143, 172, 103, 120, 178, 202, 93, 107, 151, 209, 180, 94, 204, 155, 109, 210, 184, 225, 167, 115, 110, 212, 117, 157, 226, 171, 216, 121, 158, 118, 173, 179, 199, 228, 122, 181, 232, 174, 63, 203, 124, 182, 240, 211, 205, 95, 185, 213, 206, 186, 111, 227, 159, 214, 119, 217, 188, 229, 218, 123, 230, 175, 241, 220, 183, 233, 125, 234, 187, 207, 236, 126, 242, 215, 189, 244, 219, 231, 248, 190, 221, 235, 222, 237, 243, 238, 245, 127, 246, 249, 250, 191, 252, 223, 239, 247, 251, 253, 254, 255]

Table Q28, having a sequence length of 256:

| Reliability or sequence number of reliability | Polarized channel sequence number |
|---|---|
| 0 | 0 |
| 1 | 1 |
| 2 | 4 |
| 3 | 8 |
| 4 | 2 |
| 5 | 16 |
| 6 | 32 |
| 7 | 6 |
| 8 | 64 |
| 9 | 3 |
| 10 | 12 |
| 11 | 5 |
| 12 | 18 |
| 13 | 128 |
| 14 | 9 |
| 15 | 33 |
| 16 | 17 |
| 17 | 10 |
| 18 | 36 |
| 19 | 66 |
| 20 | 24 |
| 21 | 20 |
| 22 | 65 |
| 23 | 34 |
| 24 | 7 |
| 25 | 129 |
| 26 | 40 |
| 27 | 11 |
| 28 | 72 |
| 29 | 132 |
| 30 | 19 |
| 31 | 48 |
| 32 | 68 |
| 33 | 13 |
| 34 | 14 |
| 35 | 21 |
| 36 | 130 |
| 37 | 26 |
| 38 | 80 |
| 39 | 35 |
| 40 | 38 |
| 41 | 136 |
| 42 | 96 |
| 43 | 22 |
| 44 | 37 |
| 45 | 25 |
| 46 | 67 |
| 47 | 41 |
| 48 | 144 |
| 49 | 28 |
| 50 | 69 |
| 51 | 49 |
| 52 | 74 |
| 53 | 160 |
| 54 | 42 |

-continued

Table Q28, having a sequence length of 256:

| Reliability or sequence number of reliability | Polarized channel sequence number |
|---|---|
| 55 | 134 |
| 56 | 70 |
| 57 | 44 |
| 58 | 81 |
| 59 | 15 |
| 60 | 50 |
| 61 | 131 |
| 62 | 192 |
| 63 | 73 |
| 64 | 23 |
| 65 | 137 |
| 66 | 52 |
| 67 | 76 |
| 68 | 133 |
| 69 | 82 |
| 70 | 27 |
| 71 | 97 |
| 72 | 39 |
| 73 | 56 |
| 74 | 138 |
| 75 | 84 |
| 76 | 29 |
| 77 | 145 |
| 78 | 43 |
| 79 | 98 |
| 80 | 140 |
| 81 | 30 |
| 82 | 88 |
| 83 | 146 |
| 84 | 100 |
| 85 | 161 |
| 86 | 71 |
| 87 | 45 |
| 88 | 51 |
| 89 | 148 |
| 90 | 46 |
| 91 | 75 |
| 92 | 104 |
| 93 | 164 |
| 94 | 193 |
| 95 | 53 |
| 96 | 162 |
| 97 | 77 |
| 98 | 152 |
| 99 | 54 |
| 100 | 185 |
| 101 | 112 |
| 102 | 57 |
| 103 | 78 |
| 104 | 135 |
| 105 | 194 |
| 106 | 83 |
| 107 | 168 |
| 108 | 86 |
| 109 | 58 |
| 110 | 139 |
| 111 | 196 |
| 112 | 101 |
| 113 | 60 |
| 114 | 147 |
| 115 | 176 |
| 116 | 99 |
| 117 | 89 |
| 118 | 141 |
| 119 | 200 |
| 120 | 90 |
| 121 | 31 |
| 122 | 142 |
| 123 | 102 |
| 124 | 47 |
| 125 | 105 |
| 126 | 208 |
| 127 | 153 |
| 128 | 92 |

-continued

Table Q28, having a sequence length of 256:

| Reliability or sequence number of reliability | Polarized channel sequence number |
|---|---|
| 129 | 149 |
| 130 | 163 |
| 131 | 113 |
| 132 | 150 |
| 133 | 165 |
| 134 | 55 |
| 135 | 106 |
| 136 | 154 |
| 137 | 79 |
| 138 | 108 |
| 139 | 224 |
| 140 | 166 |
| 141 | 59 |
| 142 | 169 |
| 143 | 114 |
| 144 | 195 |
| 145 | 87 |
| 146 | 156 |
| 147 | 116 |
| 148 | 197 |
| 149 | 61 |
| 150 | 177 |
| 151 | 170 |
| 152 | 91 |
| 153 | 201 |
| 154 | 198 |
| 155 | 62 |
| 156 | 143 |
| 157 | 172 |
| 158 | 103 |
| 159 | 120 |
| 160 | 178 |
| 161 | 202 |
| 162 | 93 |
| 163 | 107 |
| 164 | 151 |
| 165 | 209 |
| 166 | 180 |
| 167 | 94 |
| 168 | 204 |
| 169 | 155 |
| 170 | 109 |
| 171 | 210 |
| 172 | 184 |
| 173 | 225 |
| 174 | 167 |
| 175 | 115 |
| 176 | 110 |
| 177 | 212 |
| 178 | 117 |
| 179 | 157 |
| 180 | 226 |
| 181 | 171 |
| 182 | 216 |
| 183 | 121 |
| 184 | 158 |
| 185 | 118 |
| 186 | 173 |
| 187 | 179 |
| 188 | 199 |
| 189 | 228 |
| 190 | 122 |
| 191 | 181 |
| 192 | 232 |
| 193 | 174 |
| 194 | 63 |
| 195 | 203 |
| 196 | 124 |
| 197 | 182 |
| 198 | 240 |
| 199 | 211 |
| 200 | 205 |
| 201 | 95 |
| 202 | 185 |

-continued

Table Q28, having a sequence length of 256:

| Reliability or sequence number of reliability | Polarized channel sequence number |
|---|---|
| 203 | 213 |
| 204 | 206 |
| 205 | 186 |
| 206 | 111 |
| 207 | 227 |
| 208 | 159 |
| 209 | 214 |
| 210 | 119 |
| 211 | 217 |
| 212 | 188 |
| 213 | 229 |
| 214 | 218 |
| 215 | 123 |
| 216 | 230 |
| 217 | 175 |
| 218 | 241 |
| 219 | 220 |
| 220 | 183 |
| 221 | 233 |
| 222 | 125 |
| 223 | 234 |
| 224 | 187 |
| 225 | 207 |
| 226 | 236 |
| 227 | 126 |
| 228 | 242 |
| 229 | 215 |
| 230 | 189 |
| 231 | 244 |
| 232 | 219 |
| 233 | 231 |
| 234 | 248 |
| 235 | 190 |
| 236 | 221 |
| 237 | 235 |
| 238 | 222 |
| 239 | 237 |
| 240 | 243 |
| 241 | 238 |
| 242 | 245 |
| 243 | 127 |
| 244 | 246 |
| 245 | 249 |
| 246 | 250 |
| 247 | 191 |
| 248 | 252 |
| 249 | 223 |
| 250 | 239 |
| 251 | 247 |
| 252 | 251 |
| 253 | 253 |
| 254 | 254 |
| 255 | 255 |

Sequence Q29, having a sequence length of 128:

[0, 1, 4, 8, 2, 16, 32, 6, 64, 3, 12, 5, 18, 9, 33, 17, 10, 36, 66, 24, 20, 65, 34, 7, 40, 11, 72, 19, 48, 68, 13, 14, 21, 26, 80, 35, 38, 96, 22, 37, 25, 67, 41, 28, 69, 49, 74, 42, 70, 44, 81, 15, 50, 73, 23, 52, 76, 82, 27, 97, 39, 56, 84, 29, 43, 98, 30, 88, 100, 71, 45, 51, 46, 75, 104, 53, 77, 54, 85, 112, 57, 78, 83, 86, 58, 101, 60, 99, 89, 90, 31, 102, 47, 105, 92, 113, 55, 106, 79, 108, 59, 114, 87, 116, 61, 91, 62, 103, 120, 93, 107, 94, 109, 115, 110, 117, 121, 118, 122, 63, 124, 95, 111, 119, 123, 125,

| Table Q29, having a sequence length of 128: | |
|---|---|
| Reliability or sequence number of reliability | Polarized channel sequence number |
| 0 | 0 |
| 1 | 1 |
| 2 | 4 |
| 3 | 8 |
| 4 | 2 |
| 5 | 16 |
| 6 | 32 |
| 7 | 6 |
| 8 | 64 |
| 9 | 3 |
| 10 | 12 |
| 11 | 5 |
| 12 | 18 |
| 13 | 9 |
| 14 | 33 |
| 15 | 17 |
| 16 | 10 |
| 17 | 36 |
| 18 | 66 |
| 19 | 24 |
| 20 | 20 |
| 21 | 65 |
| 22 | 34 |
| 23 | 7 |
| 24 | 40 |
| 25 | 11 |
| 26 | 72 |
| 27 | 19 |
| 28 | 48 |
| 29 | 68 |
| 30 | 13 |
| 31 | 14 |
| 32 | 21 |
| 33 | 26 |
| 34 | 80 |
| 35 | 35 |
| 36 | 38 |
| 37 | 96 |
| 38 | 22 |
| 39 | 37 |
| 40 | 25 |
| 41 | 67 |
| 42 | 41 |
| 43 | 28 |
| 44 | 69 |
| 45 | 49 |
| 46 | 74 |
| 47 | 42 |
| 48 | 70 |
| 49 | 44 |
| 50 | 81 |
| 51 | 15 |
| 52 | 50 |
| 53 | 73 |
| 54 | 23 |
| 55 | 52 |
| 56 | 76 |
| 57 | 82 |
| 58 | 27 |
| 59 | 97 |
| 60 | 39 |
| 61 | 56 |
| 62 | 84 |
| 63 | 29 |
| 64 | 43 |
| 65 | 98 |
| 66 | 30 |
| 67 | 88 |
| 68 | 100 |
| 69 | 71 |
| 70 | 45 |
| 71 | 51 |
| 72 | 46 |
| 73 | 75 |
| 74 | 104 |
| 75 | 53 |

-continued

| Table Q29, having a sequence length of 128: | |
|---|---|
| Reliability or sequence number of reliability | Polarized channel sequence number |
| 76 | 77 |
| 77 | 54 |
| 78 | 85 |
| 79 | 112 |
| 80 | 57 |
| 81 | 78 |
| 82 | 83 |
| 83 | 86 |
| 84 | 58 |
| 85 | 101 |
| 86 | 60 |
| 87 | 99 |
| 88 | 89 |
| 89 | 90 |
| 90 | 31 |
| 91 | 102 |
| 92 | 47 |
| 93 | 105 |
| 94 | 92 |
| 95 | 113 |
| 96 | 55 |
| 97 | 106 |
| 98 | 79 |
| 99 | 108 |
| 100 | 59 |
| 101 | 114 |
| 102 | 87 |
| 103 | 116 |
| 104 | 61 |
| 105 | 91 |
| 106 | 62 |
| 107 | 103 |
| 108 | 120 |
| 109 | 93 |
| 110 | 107 |
| 111 | 94 |
| 112 | 109 |
| 113 | 115 |
| 114 | 110 |
| 115 | 117 |
| 116 | 121 |
| 117 | 118 |
| 118 | 122 |
| 119 | 63 |
| 120 | 124 |
| 121 | 95 |
| 122 | 111 |
| 123 | 119 |
| 124 | 123 |
| 125 | 125 |
| 126 | 126 |
| 127 | 127 |

Sequence Q30, having a sequence length of 64:

[0, 1, 4, 8, 2, 16, 32, 6, 3, 12, 5, 18, 9, 33, 17, 10, 36, 24, 20, 34, 7, 40, 11, 19, 48, 13, 14, 21, 26, 35, 38, 22, 37, 25, 41, 28, 49, 42, 44, 15, 50, 23, 52, 27, 39, 56, 29, 43, 30, 45, 51, 46, 53, 54, 57, 58, 60, 31, 47, 55, 59, 61, 62, 63]

| Table Q30, having a sequence length of 64: | |
|---|---|
| Reliability or sequence number of reliability | Polarized channel sequence number |
| 0 | 0 |
| 1 | 1 |
| 2 | 4 |
| 3 | 8 |
| 4 | 2 |

-continued

Table Q30, having a sequence length of 64:

| Reliability or sequence number of reliability | Polarized channel sequence number |
|---|---|
| 5 | 16 |
| 6 | 32 |
| 7 | 6 |
| 8 | 3 |
| 9 | 12 |
| 10 | 5 |
| 11 | 18 |
| 12 | 9 |
| 13 | 33 |
| 14 | 17 |
| 15 | 10 |
| 16 | 36 |
| 17 | 24 |
| 18 | 20 |
| 19 | 34 |
| 20 | 7 |
| 21 | 40 |
| 22 | 11 |
| 23 | 19 |
| 24 | 48 |
| 25 | 13 |
| 26 | 14 |
| 27 | 21 |
| 28 | 26 |
| 29 | 35 |
| 30 | 38 |
| 31 | 22 |
| 32 | 37 |
| 33 | 25 |
| 34 | 41 |
| 35 | 28 |
| 36 | 49 |
| 37 | 42 |
| 38 | 44 |
| 39 | 15 |
| 40 | 50 |
| 41 | 23 |
| 42 | 52 |
| 43 | 27 |
| 44 | 39 |
| 45 | 56 |
| 46 | 29 |
| 47 | 43 |
| 48 | 30 |
| 49 | 45 |
| 50 | 51 |
| 51 | 46 |
| 52 | 53 |
| 53 | 54 |
| 54 | 57 |
| 55 | 58 |
| 56 | 60 |
| 57 | 31 |
| 58 | 47 |
| 59 | 55 |
| 60 | 59 |
| 61 | 61 |
| 62 | 62 |
| 63 | 63 |

Sequence Z26, having a sequence length of 1024:

[0, 1, 4, 10, 2, 12, 7, 26, 3, 15, 18, 29, 11, 36, 38, 69, 5, 17, 13, 33, 23, 39, 48, 74, 21, 51, 41, 82, 56, 90, 99, 161, 6, 16, 25, 43, 19, 50, 45, 85, 28, 54, 62, 93, 66, 107, 113, 166, 34, 59, 70, 109, 77, 118, 125, 183, 87, 131, 142, 197, 148, 216, 225, 327, 8, 24, 20, 52, 35, 57, 65, 106, 30, 73, 60, 114, 79, 123, 132, 192, 42, 67, 81, 136, 89, 126, 140, 205, 100, 153, 159, 220, 173, 243, 253, 350, 47, 83, 96, 152, 103, 146, 163, 231, 115, 168, 185, 245, 193, 261, 275, 367, 129, 179, 199, 271, 208, 280, 302, 385, 233, 295, 318, 404, 335, 430, 459, 580, 14, 27, 40, 71, 31, 80, 64, 133, 46, 76, 88, 143, 97, 156, 162, 226, 55, 91, 101, 149, 110, 174, 180, 246, 124, 172, 190, 258, 207, 283, 298, 375, 61, 105, 119, 177, 116, 182, 195, 268, 138, 198, 218, 286, 229, 303, 324, 407, 150, 217, 238, 306, 250, 319, 338, 424, 265, 353, 364, 440, 388, 479, 503, 612, 72, 117, 135, 200, 145, 214, 223, 308, 158, 222, 239, 328, 254, 348, 363, 449, 170, 247, 264, 342, 278, 355, 380, 466, 293, 387, 400, 485, 417, 513, 529, 637, 194, 266, 285, 372, 315, 390, 405, 497, 321, 426, 435, 521, 451, 541, 556, 658, 341, 412, 460, 546, 481, 565, 582, 672, 499, 589, 608, 697, 627, 726, 756, 852, 22, 37, 44, 84, 58, 92, 102, 164, 53, 98, 111, 175, 122, 188, 203, 279, 68, 108, 130, 186, 139, 204, 213, 299, 151, 221, 235, 311, 249, 336, 344, 431, 78, 128, 137, 212, 155, 234, 227, 322, 169, 242, 255, 339, 269, 366, 369, 470, 184, 260, 282, 358, 292, 379, 395, 487, 312, 410, 422, 507, 437, 531, 550, 653, 94, 157, 144, 241, 178, 262, 257, 359, 202, 273, 287, 383, 300, 392, 415, 512, 211, 289, 305, 397, 333, 419, 446, 523, 345, 438, 455, 544, 478, 571, 587, 686, 237, 309, 330, 428, 361, 462, 472, 558, 371, 457, 489, 576, 509, 596, 620, 707, 402, 501, 517, 610, 537, 632, 600, 739, 552, 647, 666, 719, 674, 771, 791, 882, 121, 189, 167, 272, 209, 290, 296, 409, 230, 317, 325, 433, 347, 447, 468, 562, 251, 332, 356, 444, 377, 464, 493, 578, 393, 505, 483, 594, 525, 617, 629, 722, 276, 374, 351, 474, 398, 495, 511, 603, 421, 519, 535, 640, 554, 624, 655, 746, 453, 539, 567, 650, 584, 669, 692, 764, 598, 683, 710, 804, 729, 779, 817, 911, 314, 382, 414, 515, 442, 533, 548, 645, 476, 569, 560, 677, 591, 661, 694, 783, 491, 573, 605, 704, 622, 689, 736, 795, 642, 742, 713, 808, 760, 832, 842, 896, 527, 615, 634, 716, 663, 732, 749, 822, 680, 753, 787, 858, 768, 827, 869, 937, 700, 800, 775, 847, 813, 889, 864, 928, 836, 876, 903, 948, 919, 960, 974, 992, 9, 32, 75, 120, 49, 134, 104, 210, 63, 154, 171, 224, 127, 248, 256, 349, 86, 165, 141, 236, 196, 259, 291, 362, 187, 297, 267, 381, 313, 399, 418, 532, 95, 160, 206, 274, 176, 294, 281, 389, 219, 307, 331, 406, 340, 434, 445, 540, 240, 323, 352, 439, 368, 456, 469, 566, 391, 480, 498, 586, 508, 613, 625, 737, 112, 201, 181, 301, 244, 316, 337, 432, 228, 360, 326, 448, 373, 465, 482, 579, 270, 343, 378, 488, 396, 471, 496, 599, 420, 520, 530, 618, 551, 648, 659, 758, 288, 384, 411, 518, 427, 506, 536, 633, 450, 543, 570, 649, 581, 668, 684, 773, 475, 561, 590, 679, 602, 690, 712, 788, 635, 705, 728, 802, 744, 821, 841, 914, 147, 215, 263, 354, 232, 376, 334, 484, 284, 365, 394, 500, 413, 524, 534, 626, 310, 401, 423, 510, 441, 553, 563, 651, 467, 549, 577, 665, 601, 693, 708, 780, 329, 429, 458, 557, 452, 564, 585, 676, 492, 588, 616, 696, 630, 714, 734, 805, 514, 614, 641, 717, 656, 730, 747, 818, 673, 761, 770, 829, 790, 855, 870, 930, 357, 454, 486, 592, 504, 611, 623, 718, 528, 621, 643, 738, 660, 757, 769, 835, 547, 652, 671, 751, 687, 762, 784, 846, 703, 789, 799, 859, 812, 877, 886, 941, 583, 675, 695, 777, 725, 792, 803, 866, 731, 819, 825, 881, 837, 893, 901, 950, 750, 809, 843, 895, 856, 906, 915, 955, 867, 918, 927, 965, 936, 975, 984, 1007, 191, 252, 277, 386, 320, 403, 425, 538, 304, 416, 443, 555, 463, 574, 595, 688, 346, 436, 477, 572, 494, 597, 609, 709, 516, 619, 638, 721, 654, 745, 752, 823, 370, 473, 490, 607, 522, 636, 628, 733, 545, 646, 662, 748, 678, 772, 774, 849, 568, 667, 691, 765, 702, 782, 796, 860, 723, 807, 816, 872, 826, 887, 898, 947, 408, 526, 502, 644, 559, 670, 664, 766, 593, 682, 698, 786, 711, 793, 811, 875, 606, 699, 715, 797, 743, 814, 833, 883, 754, 828, 839, 894, 854, 909, 917, 961, 639, 720, 740, 820, 767, 844, 850, 902, 776, 840, 861, 912, 873, 922, 933, 968, 801, 868, 879, 929, 891, 939, 924, 979, 899, 945, 953, 972, 956, 988, 994, 1012, 461, 575, 542, 681, 604, 701, 706, 806, 631, 727, 735, 824, 755, 834, 848, 905, 657, 741, 763, 831, 781, 845, 863, 913, 794, 871, 857, 921, 884, 932, 938, 973, 685, 778, 759, 851, 798, 865, 874, 925, 815, 880, 890, 942, 900, 935, 949, 981, 838, 892, 907, 946, 916, 954, 963, 986, 923, 959, 969, 997, 976, 990, 1000, 1016, 724, 785, 810, 878, 830, 888, 897, 944, 853, 908, 904, 957, 920, 951, 964, 991, 862, 910, 926, 967, 934, 962, 978, 995, 943, 980, 970, 998, 985, 1003, 1005, 1014, 885, 931, 940, 971, 952, 977, 982, 1001, 958, 983, 993, 1008, 987, 1002, 1010, 1019, 966, 996, 989, 1006, 999, 1013, 1009, 1018, 1004, 1011, 1015, 1020, 1017, 1021, 1022,

Table Z26, having a sequence length of 1024:

| Polarized channel sequence number | Reliability or sequence number of reliability |
|---|---|
| 0 | 0 |
| 1 | 1 |
| 2 | 4 |
| 3 | 10 |
| 4 | 2 |
| 5 | 12 |
| 6 | 7 |
| 7 | 26 |
| 8 | 3 |
| 9 | 15 |
| 10 | 18 |
| 11 | 29 |
| 12 | 11 |
| 13 | 36 |
| 14 | 38 |
| 15 | 69 |
| 16 | 5 |
| 17 | 17 |
| 18 | 13 |
| 19 | 33 |
| 20 | 23 |
| 21 | 39 |
| 22 | 48 |
| 23 | 74 |
| 24 | 21 |
| 25 | 51 |
| 26 | 41 |
| 27 | 82 |
| 28 | 56 |
| 29 | 90 |
| 30 | 99 |
| 31 | 161 |
| 32 | 6 |
| 33 | 16 |
| 34 | 25 |
| 35 | 43 |
| 36 | 19 |
| 37 | 50 |
| 38 | 45 |
| 39 | 85 |
| 40 | 28 |
| 41 | 54 |
| 42 | 62 |
| 43 | 93 |
| 44 | 66 |
| 45 | 107 |
| 46 | 113 |
| 47 | 166 |
| 48 | 34 |
| 49 | 59 |
| 50 | 70 |
| 51 | 109 |
| 52 | 77 |
| 53 | 118 |
| 54 | 125 |
| 55 | 183 |
| 56 | 87 |
| 57 | 131 |
| 58 | 142 |
| 59 | 197 |
| 60 | 148 |
| 61 | 216 |
| 62 | 225 |
| 63 | 327 |
| 64 | 8 |
| 65 | 24 |

-continued

Table Z26, having a sequence length of 1024:

| Polarized channel sequence number | Reliability or sequence number of reliability |
|---|---|
| 66 | 20 |
| 67 | 52 |
| 68 | 35 |
| 69 | 57 |
| 70 | 65 |
| 71 | 106 |
| 72 | 30 |
| 73 | 73 |
| 74 | 60 |
| 75 | 114 |
| 76 | 79 |
| 77 | 123 |
| 78 | 132 |
| 79 | 192 |
| 80 | 42 |
| 81 | 67 |
| 82 | 81 |
| 83 | 136 |
| 84 | 89 |
| 85 | 126 |
| 86 | 140 |
| 87 | 205 |
| 88 | 100 |
| 89 | 153 |
| 90 | 159 |
| 91 | 220 |
| 92 | 173 |
| 93 | 243 |
| 94 | 253 |
| 95 | 350 |
| 96 | 47 |
| 97 | 83 |
| 98 | 96 |
| 99 | 152 |
| 100 | 103 |
| 101 | 146 |
| 102 | 163 |
| 103 | 231 |
| 104 | 115 |
| 105 | 168 |
| 106 | 185 |
| 107 | 245 |
| 108 | 193 |
| 109 | 261 |
| 110 | 275 |
| 111 | 367 |
| 112 | 129 |
| 113 | 179 |
| 114 | 199 |
| 115 | 271 |
| 116 | 208 |
| 117 | 280 |
| 118 | 302 |
| 119 | 385 |
| 120 | 233 |
| 121 | 295 |
| 122 | 318 |
| 123 | 404 |
| 124 | 335 |
| 125 | 430 |
| 126 | 459 |
| 127 | 580 |
| 128 | 14 |
| 129 | 27 |
| 130 | 40 |
| 131 | 71 |
| 132 | 31 |
| 133 | 80 |
| 134 | 64 |
| 135 | 133 |
| 136 | 46 |
| 137 | 76 |
| 138 | 88 |
| 139 | 143 |

-continued

Table Z26, having a sequence length of 1024:

| Polarized channel sequence number | Reliability or sequence number of reliability |
|---|---|
| 140 | 97 |
| 141 | 156 |
| 142 | 162 |
| 143 | 226 |
| 144 | 55 |
| 145 | 91 |
| 146 | 101 |
| 147 | 149 |
| 148 | 110 |
| 149 | 174 |
| 150 | 180 |
| 151 | 246 |
| 152 | 124 |
| 153 | 172 |
| 154 | 190 |
| 155 | 258 |
| 156 | 207 |
| 157 | 283 |
| 158 | 298 |
| 159 | 375 |
| 160 | 61 |
| 161 | 105 |
| 162 | 119 |
| 163 | 177 |
| 164 | 116 |
| 165 | 182 |
| 166 | 195 |
| 167 | 268 |
| 168 | 138 |
| 169 | 198 |
| 170 | 218 |
| 171 | 286 |
| 172 | 229 |
| 173 | 303 |
| 174 | 324 |
| 175 | 407 |
| 176 | 150 |
| 177 | 217 |
| 178 | 238 |
| 179 | 306 |
| 180 | 250 |
| 181 | 319 |
| 182 | 338 |
| 183 | 424 |
| 184 | 265 |
| 185 | 353 |
| 186 | 364 |
| 187 | 440 |
| 188 | 388 |
| 189 | 479 |
| 190 | 503 |
| 191 | 612 |
| 192 | 72 |
| 193 | 117 |
| 194 | 135 |
| 195 | 200 |
| 196 | 145 |
| 197 | 214 |
| 198 | 223 |
| 199 | 308 |
| 200 | 158 |
| 201 | 222 |
| 202 | 239 |
| 203 | 328 |
| 204 | 254 |
| 205 | 348 |
| 206 | 363 |
| 207 | 449 |
| 208 | 170 |
| 209 | 247 |
| 210 | 264 |
| 211 | 342 |
| 212 | 278 |
| 213 | 355 |
| 214 | 380 |
| 215 | 466 |
| 216 | 293 |
| 217 | 387 |
| 218 | 400 |
| 219 | 485 |
| 220 | 417 |
| 221 | 513 |
| 222 | 529 |
| 223 | 637 |
| 224 | 194 |
| 225 | 266 |
| 226 | 285 |
| 227 | 372 |
| 228 | 315 |
| 229 | 390 |
| 230 | 405 |
| 231 | 497 |
| 232 | 321 |
| 233 | 426 |
| 234 | 435 |
| 235 | 521 |
| 236 | 451 |
| 237 | 541 |
| 238 | 556 |
| 239 | 658 |
| 240 | 341 |
| 241 | 412 |
| 242 | 460 |
| 243 | 546 |
| 244 | 481 |
| 245 | 565 |
| 246 | 582 |
| 247 | 672 |
| 248 | 499 |
| 249 | 589 |
| 250 | 608 |
| 251 | 697 |
| 252 | 627 |
| 253 | 726 |
| 254 | 756 |
| 255 | 852 |
| 256 | 22 |
| 257 | 37 |
| 258 | 44 |
| 259 | 84 |
| 260 | 58 |
| 261 | 92 |
| 262 | 102 |
| 263 | 164 |
| 264 | 53 |
| 265 | 98 |
| 266 | 111 |
| 267 | 175 |
| 268 | 122 |
| 269 | 188 |
| 270 | 203 |
| 271 | 279 |
| 272 | 68 |
| 273 | 108 |
| 274 | 130 |
| 275 | 186 |
| 276 | 139 |
| 277 | 204 |
| 278 | 213 |
| 279 | 299 |
| 280 | 151 |
| 281 | 221 |
| 282 | 235 |
| 283 | 311 |
| 284 | 249 |
| 285 | 336 |
| 286 | 344 |
| 287 | 431 |

-continued

Table Z26, having a sequence length of 1024:

| Polarized channel sequence number | Reliability or sequence number of reliability |
|---|---|
| 288 | 78 |
| 289 | 128 |
| 290 | 137 |
| 291 | 212 |
| 292 | 155 |
| 293 | 234 |
| 294 | 227 |
| 295 | 322 |
| 296 | 169 |
| 297 | 242 |
| 298 | 255 |
| 299 | 339 |
| 300 | 269 |
| 301 | 366 |
| 302 | 369 |
| 303 | 470 |
| 304 | 184 |
| 305 | 260 |
| 306 | 282 |
| 307 | 358 |
| 308 | 292 |
| 309 | 379 |
| 310 | 395 |
| 311 | 487 |
| 312 | 312 |
| 313 | 410 |
| 314 | 422 |
| 315 | 507 |
| 316 | 437 |
| 317 | 531 |
| 318 | 550 |
| 319 | 653 |
| 320 | 94 |
| 321 | 157 |
| 322 | 144 |
| 323 | 241 |
| 324 | 178 |
| 325 | 262 |
| 326 | 257 |
| 327 | 359 |
| 328 | 202 |
| 329 | 273 |
| 330 | 287 |
| 331 | 383 |
| 332 | 300 |
| 333 | 392 |
| 334 | 415 |
| 335 | 512 |
| 336 | 211 |
| 337 | 289 |
| 338 | 305 |
| 339 | 397 |
| 340 | 333 |
| 341 | 419 |
| 342 | 446 |
| 343 | 523 |
| 344 | 345 |
| 345 | 438 |
| 346 | 455 |
| 347 | 544 |
| 348 | 478 |
| 349 | 571 |
| 350 | 587 |
| 351 | 686 |
| 352 | 237 |
| 353 | 309 |
| 354 | 330 |
| 355 | 428 |
| 356 | 361 |
| 357 | 462 |
| 358 | 472 |
| 359 | 558 |
| 360 | 371 |
| 361 | 457 |

-continued

Table Z26, having a sequence length of 1024:

| Polarized channel sequence number | Reliability or sequence number of reliability |
|---|---|
| 362 | 489 |
| 363 | 576 |
| 364 | 509 |
| 365 | 596 |
| 366 | 620 |
| 367 | 707 |
| 368 | 402 |
| 369 | 501 |
| 370 | 517 |
| 371 | 610 |
| 372 | 537 |
| 373 | 632 |
| 374 | 600 |
| 375 | 739 |
| 376 | 552 |
| 377 | 647 |
| 378 | 666 |
| 379 | 719 |
| 380 | 674 |
| 381 | 771 |
| 382 | 791 |
| 383 | 882 |
| 384 | 121 |
| 385 | 189 |
| 386 | 167 |
| 387 | 272 |
| 388 | 209 |
| 389 | 290 |
| 390 | 296 |
| 391 | 409 |
| 392 | 230 |
| 393 | 317 |
| 394 | 325 |
| 395 | 433 |
| 396 | 347 |
| 397 | 447 |
| 398 | 468 |
| 399 | 562 |
| 400 | 251 |
| 401 | 332 |
| 402 | 356 |
| 403 | 444 |
| 404 | 377 |
| 405 | 464 |
| 406 | 493 |
| 407 | 578 |
| 408 | 393 |
| 409 | 505 |
| 410 | 483 |
| 411 | 594 |
| 412 | 525 |
| 413 | 617 |
| 414 | 629 |
| 415 | 722 |
| 416 | 276 |
| 417 | 374 |
| 418 | 351 |
| 419 | 474 |
| 420 | 398 |
| 421 | 495 |
| 422 | 511 |
| 423 | 603 |
| 424 | 421 |
| 425 | 519 |
| 426 | 535 |
| 427 | 640 |
| 428 | 554 |
| 429 | 624 |
| 430 | 655 |
| 431 | 746 |
| 432 | 453 |
| 433 | 539 |
| 434 | 567 |
| 435 | 650 |

-continued

| Table Z26, having a sequence length of 1024: | |
|---|---|
| Polarized channel sequence number | Reliability or sequence number of reliability |
| 436 | 584 |
| 437 | 669 |
| 438 | 692 |
| 439 | 764 |
| 440 | 598 |
| 441 | 683 |
| 442 | 710 |
| 443 | 804 |
| 444 | 729 |
| 445 | 779 |
| 446 | 817 |
| 447 | 911 |
| 448 | 314 |
| 449 | 382 |
| 450 | 414 |
| 451 | 515 |
| 452 | 442 |
| 453 | 533 |
| 454 | 548 |
| 455 | 645 |
| 456 | 476 |
| 457 | 569 |
| 458 | 560 |
| 459 | 677 |
| 460 | 591 |
| 461 | 661 |
| 462 | 694 |
| 463 | 783 |
| 464 | 491 |
| 465 | 573 |
| 466 | 605 |
| 467 | 704 |
| 468 | 622 |
| 469 | 689 |
| 470 | 736 |
| 471 | 795 |
| 472 | 642 |
| 473 | 742 |
| 474 | 713 |
| 475 | 808 |
| 476 | 760 |
| 477 | 832 |
| 478 | 842 |
| 479 | 896 |
| 480 | 527 |
| 481 | 615 |
| 482 | 634 |
| 483 | 716 |
| 484 | 663 |
| 485 | 732 |
| 486 | 749 |
| 487 | 822 |
| 488 | 680 |
| 489 | 753 |
| 490 | 787 |
| 491 | 858 |
| 492 | 768 |
| 493 | 827 |
| 494 | 869 |
| 495 | 937 |
| 496 | 700 |
| 497 | 800 |
| 498 | 775 |
| 499 | 847 |
| 500 | 813 |
| 501 | 889 |
| 502 | 864 |
| 503 | 928 |
| 504 | 836 |
| 505 | 876 |
| 506 | 903 |
| 507 | 948 |
| 508 | 919 |
| 509 | 960 |

-continued

| Table Z26, having a sequence length of 1024: | |
|---|---|
| Polarized channel sequence number | Reliability or sequence number of reliability |
| 510 | 974 |
| 511 | 992 |
| 512 | 9 |
| 513 | 32 |
| 514 | 75 |
| 515 | 120 |
| 516 | 49 |
| 517 | 134 |
| 518 | 104 |
| 519 | 210 |
| 520 | 63 |
| 521 | 154 |
| 522 | 171 |
| 523 | 224 |
| 524 | 127 |
| 525 | 248 |
| 526 | 256 |
| 527 | 349 |
| 528 | 86 |
| 529 | 165 |
| 530 | 141 |
| 531 | 236 |
| 532 | 196 |
| 533 | 259 |
| 534 | 291 |
| 535 | 362 |
| 536 | 187 |
| 537 | 297 |
| 538 | 267 |
| 539 | 381 |
| 540 | 313 |
| 541 | 399 |
| 542 | 418 |
| 543 | 532 |
| 544 | 95 |
| 545 | 160 |
| 546 | 206 |
| 547 | 274 |
| 548 | 176 |
| 549 | 294 |
| 550 | 281 |
| 551 | 389 |
| 552 | 219 |
| 553 | 307 |
| 554 | 331 |
| 555 | 406 |
| 556 | 340 |
| 557 | 434 |
| 558 | 445 |
| 559 | 540 |
| 560 | 240 |
| 561 | 323 |
| 562 | 352 |
| 563 | 439 |
| 564 | 368 |
| 565 | 456 |
| 566 | 469 |
| 567 | 566 |
| 568 | 391 |
| 569 | 480 |
| 570 | 498 |
| 571 | 586 |
| 572 | 508 |
| 573 | 613 |
| 574 | 625 |
| 575 | 737 |
| 576 | 112 |
| 577 | 201 |
| 578 | 181 |
| 579 | 301 |
| 580 | 244 |
| 581 | 316 |
| 582 | 337 |
| 583 | 432 |

-continued

Table Z26, having a sequence length of 1024:

| Polarized channel sequence number | Reliability or sequence number of reliability |
|---|---|
| 584 | 228 |
| 585 | 360 |
| 586 | 326 |
| 587 | 448 |
| 588 | 373 |
| 589 | 465 |
| 590 | 482 |
| 591 | 579 |
| 592 | 270 |
| 593 | 343 |
| 594 | 378 |
| 595 | 488 |
| 596 | 396 |
| 597 | 471 |
| 598 | 496 |
| 599 | 599 |
| 600 | 420 |
| 601 | 520 |
| 602 | 530 |
| 603 | 618 |
| 604 | 551 |
| 605 | 648 |
| 606 | 659 |
| 607 | 758 |
| 608 | 288 |
| 609 | 384 |
| 610 | 411 |
| 611 | 518 |
| 612 | 427 |
| 613 | 506 |
| 614 | 536 |
| 615 | 633 |
| 616 | 450 |
| 617 | 543 |
| 618 | 570 |
| 619 | 649 |
| 620 | 581 |
| 621 | 668 |
| 622 | 684 |
| 623 | 773 |
| 624 | 475 |
| 625 | 561 |
| 626 | 590 |
| 627 | 679 |
| 628 | 602 |
| 629 | 690 |
| 630 | 712 |
| 631 | 788 |
| 632 | 635 |
| 633 | 705 |
| 634 | 728 |
| 635 | 802 |
| 636 | 744 |
| 637 | 821 |
| 638 | 841 |
| 639 | 914 |
| 640 | 147 |
| 641 | 215 |
| 642 | 263 |
| 643 | 354 |
| 644 | 232 |
| 645 | 376 |
| 646 | 334 |
| 647 | 484 |
| 648 | 284 |
| 649 | 365 |
| 650 | 394 |
| 651 | 500 |
| 652 | 413 |
| 653 | 524 |
| 654 | 534 |
| 655 | 626 |
| 656 | 310 |
| 657 | 401 |
| 658 | 423 |
| 659 | 510 |
| 660 | 441 |
| 661 | 553 |
| 662 | 563 |
| 663 | 651 |
| 664 | 467 |
| 665 | 549 |
| 666 | 577 |
| 667 | 665 |
| 668 | 601 |
| 669 | 693 |
| 670 | 708 |
| 671 | 780 |
| 672 | 329 |
| 673 | 429 |
| 674 | 458 |
| 675 | 557 |
| 676 | 452 |
| 677 | 564 |
| 678 | 585 |
| 679 | 676 |
| 680 | 492 |
| 681 | 588 |
| 682 | 616 |
| 683 | 696 |
| 684 | 630 |
| 685 | 714 |
| 686 | 734 |
| 687 | 805 |
| 688 | 514 |
| 689 | 614 |
| 690 | 641 |
| 691 | 717 |
| 692 | 656 |
| 693 | 730 |
| 694 | 747 |
| 695 | 818 |
| 696 | 673 |
| 697 | 761 |
| 698 | 770 |
| 699 | 829 |
| 700 | 790 |
| 701 | 855 |
| 702 | 870 |
| 703 | 930 |
| 704 | 357 |
| 705 | 454 |
| 706 | 486 |
| 707 | 592 |
| 708 | 504 |
| 709 | 611 |
| 710 | 623 |
| 711 | 718 |
| 712 | 528 |
| 713 | 621 |
| 714 | 643 |
| 715 | 738 |
| 716 | 660 |
| 717 | 757 |
| 718 | 769 |
| 719 | 835 |
| 720 | 547 |
| 721 | 652 |
| 722 | 671 |
| 723 | 751 |
| 724 | 687 |
| 725 | 762 |
| 726 | 784 |
| 727 | 846 |
| 728 | 703 |
| 729 | 789 |
| 730 | 799 |
| 731 | 859 |

-continued

Table Z26, having a sequence length of 1024:

| Polarized channel sequence number | Reliability or sequence number of reliability |
|---|---|
| 732 | 812 |
| 733 | 877 |
| 734 | 886 |
| 735 | 941 |
| 736 | 583 |
| 737 | 675 |
| 738 | 695 |
| 739 | 777 |
| 740 | 725 |
| 741 | 792 |
| 742 | 803 |
| 743 | 866 |
| 744 | 731 |
| 745 | 819 |
| 746 | 825 |
| 747 | 881 |
| 748 | 837 |
| 749 | 893 |
| 750 | 901 |
| 751 | 950 |
| 752 | 750 |
| 753 | 809 |
| 754 | 843 |
| 755 | 895 |
| 756 | 856 |
| 757 | 906 |
| 758 | 915 |
| 759 | 955 |
| 760 | 867 |
| 761 | 918 |
| 762 | 927 |
| 763 | 965 |
| 764 | 936 |
| 765 | 975 |
| 766 | 984 |
| 767 | 1007 |
| 768 | 191 |
| 769 | 252 |
| 770 | 277 |
| 771 | 386 |
| 772 | 320 |
| 773 | 403 |
| 774 | 425 |
| 775 | 538 |
| 776 | 304 |
| 777 | 416 |
| 778 | 443 |
| 779 | 555 |
| 780 | 463 |
| 781 | 574 |
| 782 | 595 |
| 783 | 688 |
| 784 | 346 |
| 785 | 436 |
| 786 | 477 |
| 787 | 572 |
| 788 | 494 |
| 789 | 597 |
| 790 | 609 |
| 791 | 709 |
| 792 | 516 |
| 793 | 619 |
| 794 | 638 |
| 795 | 721 |
| 796 | 654 |
| 797 | 745 |
| 798 | 752 |
| 799 | 823 |
| 800 | 370 |
| 801 | 473 |
| 802 | 490 |
| 803 | 607 |
| 804 | 522 |
| 805 | 636 |

-continued

Table Z26, having a sequence length of 1024:

| Polarized channel sequence number | Reliability or sequence number of reliability |
|---|---|
| 806 | 628 |
| 807 | 733 |
| 808 | 545 |
| 809 | 646 |
| 810 | 662 |
| 811 | 748 |
| 812 | 678 |
| 813 | 772 |
| 814 | 774 |
| 815 | 849 |
| 816 | 568 |
| 817 | 667 |
| 818 | 691 |
| 819 | 765 |
| 820 | 702 |
| 821 | 782 |
| 822 | 796 |
| 823 | 860 |
| 824 | 723 |
| 825 | 807 |
| 826 | 816 |
| 827 | 872 |
| 828 | 826 |
| 829 | 887 |
| 830 | 898 |
| 831 | 947 |
| 832 | 408 |
| 833 | 526 |
| 834 | 502 |
| 835 | 644 |
| 836 | 559 |
| 837 | 670 |
| 838 | 664 |
| 839 | 766 |
| 840 | 593 |
| 841 | 682 |
| 842 | 698 |
| 843 | 786 |
| 844 | 711 |
| 845 | 793 |
| 846 | 811 |
| 847 | 875 |
| 848 | 606 |
| 849 | 699 |
| 850 | 715 |
| 851 | 797 |
| 852 | 743 |
| 853 | 814 |
| 854 | 833 |
| 855 | 883 |
| 856 | 754 |
| 857 | 828 |
| 858 | 839 |
| 859 | 894 |
| 860 | 854 |
| 861 | 909 |
| 862 | 917 |
| 863 | 961 |
| 864 | 639 |
| 865 | 720 |
| 866 | 740 |
| 867 | 820 |
| 868 | 767 |
| 869 | 844 |
| 870 | 850 |
| 871 | 902 |
| 872 | 776 |
| 873 | 840 |
| 874 | 861 |
| 875 | 912 |
| 876 | 873 |
| 877 | 922 |
| 878 | 933 |
| 879 | 968 |

-continued

Table Z26, having a sequence length of 1024:

| Polarized channel sequence number | Reliability or sequence number of reliability |
|---|---|
| 880 | 801 |
| 881 | 868 |
| 882 | 879 |
| 883 | 929 |
| 884 | 891 |
| 885 | 939 |
| 886 | 924 |
| 887 | 979 |
| 888 | 899 |
| 889 | 945 |
| 890 | 953 |
| 891 | 972 |
| 892 | 956 |
| 893 | 988 |
| 894 | 994 |
| 895 | 1012 |
| 896 | 461 |
| 897 | 575 |
| 898 | 542 |
| 899 | 681 |
| 900 | 604 |
| 901 | 701 |
| 902 | 706 |
| 903 | 806 |
| 904 | 631 |
| 905 | 727 |
| 906 | 735 |
| 907 | 824 |
| 908 | 755 |
| 909 | 834 |
| 910 | 848 |
| 911 | 905 |
| 912 | 657 |
| 913 | 741 |
| 914 | 763 |
| 915 | 831 |
| 916 | 781 |
| 917 | 845 |
| 918 | 863 |
| 919 | 913 |
| 920 | 794 |
| 921 | 871 |
| 922 | 857 |
| 923 | 921 |
| 924 | 884 |
| 925 | 932 |
| 926 | 938 |
| 927 | 973 |
| 928 | 685 |
| 929 | 778 |
| 930 | 759 |
| 931 | 851 |
| 932 | 798 |
| 933 | 865 |
| 934 | 874 |
| 935 | 925 |
| 936 | 815 |
| 937 | 880 |
| 938 | 890 |
| 939 | 942 |
| 940 | 900 |
| 941 | 935 |
| 942 | 949 |
| 943 | 981 |
| 944 | 838 |
| 945 | 892 |
| 946 | 907 |
| 947 | 946 |
| 948 | 916 |
| 949 | 954 |
| 950 | 963 |
| 951 | 986 |
| 952 | 923 |
| 953 | 959 |

-continued

Table Z26, having a sequence length of 1024:

| Polarized channel sequence number | Reliability or sequence number of reliability |
|---|---|
| 954 | 969 |
| 955 | 997 |
| 956 | 976 |
| 957 | 990 |
| 958 | 1000 |
| 959 | 1016 |
| 960 | 724 |
| 961 | 785 |
| 962 | 810 |
| 963 | 878 |
| 964 | 830 |
| 965 | 888 |
| 966 | 897 |
| 967 | 944 |
| 968 | 853 |
| 969 | 908 |
| 970 | 904 |
| 971 | 957 |
| 972 | 920 |
| 973 | 951 |
| 974 | 964 |
| 975 | 991 |
| 976 | 862 |
| 977 | 910 |
| 978 | 926 |
| 979 | 967 |
| 980 | 934 |
| 981 | 962 |
| 982 | 978 |
| 983 | 995 |
| 984 | 943 |
| 985 | 980 |
| 986 | 970 |
| 987 | 998 |
| 988 | 985 |
| 989 | 1003 |
| 990 | 1005 |
| 991 | 1014 |
| 992 | 885 |
| 993 | 931 |
| 994 | 940 |
| 995 | 971 |
| 996 | 952 |
| 997 | 977 |
| 998 | 982 |
| 999 | 1001 |
| 1000 | 958 |
| 1001 | 983 |
| 1002 | 993 |
| 1003 | 1008 |
| 1004 | 987 |
| 1005 | 1002 |
| 1006 | 1010 |
| 1007 | 1019 |
| 1008 | 966 |
| 1009 | 996 |
| 1010 | 989 |
| 1011 | 1006 |
| 1012 | 999 |
| 1013 | 1013 |
| 1014 | 1009 |
| 1015 | 1018 |
| 1016 | 1004 |
| 1017 | 1011 |
| 1018 | 1015 |
| 1019 | 1020 |
| 1020 | 1017 |
| 1021 | 1021 |
| 1022 | 1022 |
| 1023 | 1023 |

Sequence Z27, having a sequence length of 512:

[0, 1, 4, 9, 2, 11, 7, 25, 3, 14, 17, 28, 10, 34, 36, 65, 5, 16, 12, 31, 22, 37, 46, 70, 20, 48, 39, 77, 53, 84, 92, 145, 6, 15, 24, 41, 18, 47, 43, 80, 27, 51, 59, 87, 62, 99, 104, 149, 32, 56, 66, 101, 72, 109, 115, 163, 81, 120, 129, 174, 134, 189, 196, 269, 8, 23, 19, 49, 33, 54, 61, 98, 29, 69, 57, 105, 74, 113, 121, 170, 40, 63, 76, 124, 83, 116, 128, 181, 93, 139, 144, 192, 155, 210, 217, 284, 45, 78, 89, 138, 96, 133, 147, 201, 106, 151, 165, 211, 171, 223, 233, 295, 118, 160, 176, 230, 183, 237, 252, 306, 202, 247, 263, 317, 274, 332, 348, 409, 13, 26, 38, 67, 30, 75, 60, 122, 44, 71, 82, 130, 90, 141, 146, 197, 52, 85, 94, 135, 102, 156, 161, 212, 114, 154, 169, 221, 182, 239, 249, 300, 58, 97, 110, 158, 107, 162, 173, 228, 126, 175, 191, 241, 199, 253, 267, 319, 136, 190, 206, 255, 215, 264, 276, 329, 226, 286, 293, 338, 308, 359, 371, 423, 68, 108, 123, 177, 132, 188, 195, 256, 143, 194, 207, 270, 218, 283, 292, 343, 153, 213, 225, 279, 235, 287, 303, 352, 246, 307, 315, 362, 325, 377, 385, 433, 172, 227, 240, 298, 261, 309, 318, 368, 265, 330, 335, 381, 344, 391, 398, 441, 278, 322, 349, 393, 360, 402, 410, 446, 369, 413, 421, 455, 429, 464, 473, 495, 21, 35, 42, 79, 55, 86, 95, 148, 50, 91, 103, 157, 112, 167, 179, 236, 64, 100, 119, 166, 127, 180, 187, 250, 137, 193, 204, 258, 214,275, 280, 333, 73, 117, 125, 186, 140, 203, 198, 266, 152, 209, 219, 277, 229, 294, 296, 354, 164, 222, 238, 289, 245, 302, 312, 363, 259, 321, 328, 373, 336, 386, 395, 439, 88, 142, 131, 208, 159, 224, 220, 290, 178, 232, 242, 305, 251, 310, 324, 376, 185, 243, 254, 313, 273, 326, 341, 382, 281, 337, 346, 392, 358, 405, 412, 451, 205, 257, 271, 331, 291, 350, 355, 399, 297, 347, 364, 407, 374, 416, 426, 458, 316, 370, 379, 422, 389, 431, 418, 468, 396, 437, 444, 462, 447, 477, 482, 500, 111, 168, 150, 231, 184, 244, 248, 320, 200, 262, 268, 334, 282, 342, 353, 401, 216, 272, 288, 340, 301, 351, 366, 408, 311, 372, 361, 415, 383, 425, 430, 463, 234, 299, 285, 356, 314, 367, 375, 419, 327, 380, 388, 434, 397, 428, 440, 470, 345, 390, 403, 438, 411, 445, 453, 475, 417, 450, 459, 485, 465, 479, 488, 504, 260, 304, 323, 378, 339, 387, 394, 436, 357, 404, 400, 448, 414, 442, 454, 480, 365, 406, 420, 457, 427, 452, 467, 483, 435, 469, 460, 486, 474, 491, 493, 502, 384, 424, 432, 461, 443, 466, 471, 489, 449, 472, 481, 496, 476, 490, 498, 507, 456, 484, 478, 494, 487, 501, 497, 506, 492, 499, 503, 508, 505, 509, 510, 511]

Table Z27, having a sequence length of 512:

| Polarized channel sequence number | Reliability or sequence number of reliability |
|---|---|
| 0 | 0 |
| 1 | 1 |
| 2 | 4 |
| 3 | 9 |
| 4 | 2 |
| 5 | 11 |
| 6 | 7 |
| 7 | 25 |
| 8 | 3 |
| 9 | 14 |
| 10 | 17 |
| 11 | 28 |
| 12 | 10 |
| 13 | 34 |
| 14 | 36 |
| 15 | 65 |
| 16 | 5 |
| 17 | 16 |
| 18 | 12 |
| 19 | 31 |
| 20 | 22 |
| 21 | 37 |
| 22 | 46 |
| 23 | 70 |
| 24 | 20 |
| 25 | 48 |
| 26 | 39 |
| 27 | 77 |
| 28 | 53 |
| 29 | 84 |
| 30 | 92 |
| 31 | 145 |
| 32 | 6 |
| 33 | 15 |
| 34 | 24 |
| 35 | 41 |
| 36 | 18 |
| 37 | 47 |
| 38 | 43 |
| 39 | 80 |
| 40 | 27 |
| 41 | 51 |
| 42 | 59 |
| 43 | 87 |
| 44 | 62 |
| 45 | 99 |
| 46 | 104 |
| 47 | 149 |
| 48 | 32 |
| 49 | 56 |
| 50 | 66 |
| 51 | 101 |
| 52 | 72 |
| 53 | 109 |
| 54 | 115 |
| 55 | 163 |
| 56 | 81 |
| 57 | 120 |
| 58 | 129 |
| 59 | 174 |
| 60 | 134 |
| 61 | 189 |
| 62 | 196 |
| 63 | 269 |
| 64 | 8 |
| 65 | 23 |
| 66 | 19 |
| 67 | 49 |
| 68 | 33 |
| 69 | 54 |
| 70 | 61 |
| 71 | 98 |
| 72 | 29 |
| 73 | 69 |
| 74 | 57 |
| 75 | 105 |
| 76 | 74 |
| 77 | 113 |
| 78 | 121 |
| 79 | 170 |
| 80 | 40 |
| 81 | 63 |
| 82 | 76 |
| 83 | 124 |
| 84 | 83 |
| 85 | 116 |
| 86 | 128 |
| 87 | 181 |
| 88 | 93 |
| 89 | 139 |
| 90 | 144 |
| 91 | 192 |
| 92 | 155 |
| 93 | 210 |
| 94 | 217 |
| 95 | 284 |
| 96 | 45 |
| 97 | 78 |
| 98 | 89 |
| 99 | 138 |

-continued

Table Z27, having a sequence length of 512:

| Polarized channel sequence number | Reliability or sequence number of reliability |
|---|---|
| 100 | 96 |
| 101 | 133 |
| 102 | 147 |
| 103 | 201 |
| 104 | 106 |
| 105 | 151 |
| 106 | 165 |
| 107 | 211 |
| 108 | 171 |
| 109 | 223 |
| 110 | 233 |
| 111 | 295 |
| 112 | 118 |
| 113 | 160 |
| 114 | 176 |
| 115 | 230 |
| 116 | 183 |
| 117 | 237 |
| 118 | 252 |
| 119 | 306 |
| 120 | 202 |
| 121 | 247 |
| 122 | 263 |
| 123 | 317 |
| 124 | 274 |
| 125 | 332 |
| 126 | 348 |
| 127 | 409 |
| 128 | 13 |
| 129 | 26 |
| 130 | 38 |
| 131 | 67 |
| 132 | 30 |
| 133 | 75 |
| 134 | 60 |
| 135 | 122 |
| 136 | 44 |
| 137 | 71 |
| 138 | 82 |
| 139 | 130 |
| 140 | 90 |
| 141 | 141 |
| 142 | 146 |
| 143 | 197 |
| 144 | 52 |
| 145 | 85 |
| 146 | 94 |
| 147 | 135 |
| 148 | 102 |
| 149 | 156 |
| 150 | 161 |
| 151 | 212 |
| 152 | 114 |
| 153 | 154 |
| 154 | 169 |
| 155 | 221 |
| 156 | 182 |
| 157 | 239 |
| 158 | 249 |
| 159 | 300 |
| 160 | 58 |
| 161 | 97 |
| 162 | 110 |
| 163 | 158 |
| 164 | 107 |
| 165 | 162 |
| 166 | 173 |
| 167 | 228 |
| 168 | 126 |
| 169 | 175 |
| 170 | 191 |
| 171 | 241 |
| 172 | 199 |
| 173 | 253 |

-continued

Table Z27, having a sequence length of 512:

| Polarized channel sequence number | Reliability or sequence number of reliability |
|---|---|
| 174 | 267 |
| 175 | 319 |
| 176 | 136 |
| 177 | 190 |
| 178 | 206 |
| 179 | 255 |
| 180 | 215 |
| 181 | 264 |
| 182 | 276 |
| 183 | 329 |
| 184 | 226 |
| 185 | 286 |
| 186 | 293 |
| 187 | 338 |
| 188 | 308 |
| 189 | 359 |
| 190 | 371 |
| 191 | 423 |
| 192 | 68 |
| 193 | 108 |
| 194 | 123 |
| 195 | 177 |
| 196 | 132 |
| 197 | 188 |
| 198 | 195 |
| 199 | 256 |
| 200 | 143 |
| 201 | 194 |
| 202 | 207 |
| 203 | 270 |
| 204 | 218 |
| 205 | 283 |
| 206 | 292 |
| 207 | 343 |
| 208 | 153 |
| 209 | 213 |
| 210 | 225 |
| 211 | 279 |
| 212 | 235 |
| 213 | 287 |
| 214 | 303 |
| 215 | 352 |
| 216 | 246 |
| 217 | 307 |
| 218 | 315 |
| 219 | 362 |
| 220 | 325 |
| 221 | 377 |
| 222 | 385 |
| 223 | 433 |
| 224 | 172 |
| 225 | 227 |
| 226 | 240 |
| 227 | 298 |
| 228 | 261 |
| 229 | 309 |
| 230 | 318 |
| 231 | 368 |
| 232 | 265 |
| 233 | 330 |
| 234 | 335 |
| 235 | 381 |
| 236 | 344 |
| 237 | 391 |
| 238 | 398 |
| 239 | 441 |
| 240 | 278 |
| 241 | 322 |
| 242 | 349 |
| 243 | 393 |
| 244 | 360 |
| 245 | 402 |
| 246 | 410 |
| 247 | 446 |

-continued

| Table Z27, having a sequence length of 512: | |
|---|---|
| Polarized channel sequence number | Reliability or sequence number of reliability |
| 248 | 369 |
| 249 | 413 |
| 250 | 421 |
| 251 | 455 |
| 252 | 429 |
| 253 | 464 |
| 254 | 473 |
| 255 | 495 |
| 256 | 21 |
| 257 | 35 |
| 258 | 42 |
| 259 | 79 |
| 260 | 55 |
| 261 | 86 |
| 262 | 95 |
| 263 | 148 |
| 264 | 50 |
| 265 | 91 |
| 266 | 103 |
| 267 | 157 |
| 268 | 112 |
| 269 | 167 |
| 270 | 179 |
| 271 | 236 |
| 272 | 64 |
| 273 | 100 |
| 274 | 119 |
| 275 | 166 |
| 276 | 127 |
| 277 | 180 |
| 278 | 187 |
| 279 | 250 |
| 280 | 137 |
| 281 | 193 |
| 282 | 204 |
| 283 | 258 |
| 284 | 214 |
| 285 | 275 |
| 286 | 280 |
| 287 | 333 |
| 288 | 73 |
| 289 | 117 |
| 290 | 125 |
| 291 | 186 |
| 292 | 140 |
| 293 | 203 |
| 294 | 198 |
| 295 | 266 |
| 296 | 152 |
| 297 | 209 |
| 298 | 219 |
| 299 | 277 |
| 300 | 229 |
| 301 | 294 |
| 302 | 296 |
| 303 | 354 |
| 304 | 164 |
| 305 | 222 |
| 306 | 238 |
| 307 | 289 |
| 308 | 245 |
| 309 | 302 |
| 310 | 312 |
| 311 | 363 |
| 312 | 259 |
| 313 | 321 |
| 314 | 328 |
| 315 | 373 |
| 316 | 336 |
| 317 | 386 |
| 318 | 395 |
| 319 | 439 |
| 320 | 88 |
| 321 | 142 |

-continued

| Table Z27, having a sequence length of 512: | |
|---|---|
| Polarized channel sequence number | Reliability or sequence number of reliability |
| 322 | 131 |
| 323 | 208 |
| 324 | 159 |
| 325 | 224 |
| 326 | 220 |
| 327 | 290 |
| 328 | 178 |
| 329 | 232 |
| 330 | 242 |
| 331 | 305 |
| 332 | 251 |
| 333 | 310 |
| 334 | 324 |
| 335 | 376 |
| 336 | 185 |
| 337 | 243 |
| 338 | 254 |
| 339 | 313 |
| 340 | 273 |
| 341 | 326 |
| 342 | 341 |
| 343 | 382 |
| 344 | 281 |
| 345 | 337 |
| 346 | 346 |
| 347 | 392 |
| 348 | 358 |
| 349 | 405 |
| 350 | 412 |
| 351 | 451 |
| 352 | 205 |
| 353 | 257 |
| 354 | 271 |
| 355 | 331 |
| 356 | 291 |
| 357 | 350 |
| 358 | 355 |
| 359 | 399 |
| 360 | 297 |
| 361 | 347 |
| 362 | 364 |
| 363 | 407 |
| 364 | 374 |
| 365 | 416 |
| 366 | 426 |
| 367 | 458 |
| 368 | 316 |
| 369 | 370 |
| 370 | 379 |
| 371 | 422 |
| 372 | 389 |
| 373 | 431 |
| 374 | 418 |
| 375 | 468 |
| 376 | 396 |
| 377 | 437 |
| 378 | 444 |
| 379 | 462 |
| 380 | 447 |
| 381 | 477 |
| 382 | 482 |
| 383 | 500 |
| 384 | 111 |
| 385 | 168 |
| 386 | 150 |
| 387 | 231 |
| 388 | 184 |
| 389 | 244 |
| 390 | 248 |
| 391 | 320 |
| 392 | 200 |
| 393 | 262 |
| 394 | 268 |
| 395 | 334 |

-continued

Table Z27, having a sequence length of 512:

| Polarized channel sequence number | Reliability or sequence number of reliability |
|---|---|
| 396 | 282 |
| 397 | 342 |
| 398 | 353 |
| 399 | 401 |
| 400 | 216 |
| 401 | 272 |
| 402 | 288 |
| 403 | 340 |
| 404 | 301 |
| 405 | 351 |
| 406 | 366 |
| 407 | 408 |
| 408 | 311 |
| 409 | 372 |
| 410 | 361 |
| 411 | 415 |
| 412 | 383 |
| 413 | 425 |
| 414 | 430 |
| 415 | 463 |
| 416 | 234 |
| 417 | 299 |
| 418 | 285 |
| 419 | 356 |
| 420 | 314 |
| 421 | 367 |
| 422 | 375 |
| 423 | 419 |
| 424 | 327 |
| 425 | 380 |
| 426 | 388 |
| 427 | 434 |
| 428 | 397 |
| 429 | 428 |
| 430 | 440 |
| 431 | 470 |
| 432 | 345 |
| 433 | 390 |
| 434 | 403 |
| 435 | 438 |
| 436 | 411 |
| 437 | 445 |
| 438 | 453 |
| 439 | 475 |
| 440 | 417 |
| 441 | 450 |
| 442 | 459 |
| 443 | 485 |
| 444 | 465 |
| 445 | 479 |
| 446 | 488 |
| 447 | 504 |
| 448 | 260 |
| 449 | 304 |
| 450 | 323 |
| 451 | 378 |
| 452 | 339 |
| 453 | 387 |
| 454 | 394 |
| 455 | 436 |
| 456 | 357 |
| 457 | 404 |
| 458 | 400 |
| 459 | 448 |
| 460 | 414 |
| 461 | 442 |
| 462 | 454 |
| 463 | 480 |
| 464 | 365 |
| 465 | 406 |
| 466 | 420 |
| 467 | 457 |
| 468 | 427 |
| 469 | 452 |

-continued

Table Z27, having a sequence length of 512:

| Polarized channel sequence number | Reliability or sequence number of reliability |
|---|---|
| 470 | 467 |
| 471 | 483 |
| 472 | 435 |
| 473 | 469 |
| 474 | 460 |
| 475 | 486 |
| 476 | 474 |
| 477 | 491 |
| 478 | 493 |
| 479 | 502 |
| 480 | 384 |
| 481 | 424 |
| 482 | 432 |
| 483 | 461 |
| 484 | 443 |
| 485 | 466 |
| 486 | 471 |
| 487 | 489 |
| 488 | 449 |
| 489 | 472 |
| 490 | 481 |
| 491 | 496 |
| 492 | 476 |
| 493 | 490 |
| 494 | 498 |
| 495 | 507 |
| 496 | 456 |
| 497 | 484 |
| 498 | 478 |
| 499 | 494 |
| 500 | 487 |
| 501 | 501 |
| 502 | 497 |
| 503 | 506 |
| 504 | 492 |
| 505 | 499 |
| 506 | 503 |
| 507 | 508 |
| 508 | 505 |
| 509 | 509 |
| 510 | 510 |
| 511 | 511 |

Sequence Z28, having a sequence length of 256:

[0, 1, 4, 9, 2, 11, 7, 24, 3, 14, 17, 27, 10, 33, 34, 59, 5, 16, 12, 30, 21, 35, 43, 64, 20, 45, 37, 70, 49, 76, 81, 121, 6, 15, 23, 39, 18, 44, 40, 72, 26, 47, 54, 78, 57, 87, 90, 124, 31, 51, 60, 88, 66, 95, 99, 134, 73, 102, 109, 141, 113, 149, 155, 194, 8, 22, 19, 46, 32, 50, 56, 86, 28, 63, 52, 91, 67, 97, 103, 137, 38, 58, 69, 106, 75, 100, 108, 145, 82, 117, 120, 152, 128, 162, 167, 201, 42, 71, 79, 116, 84, 112, 123, 158, 92, 125, 135, 163, 138, 170, 176, 206, 101, 131, 143, 175, 147, 178, 185, 210, 159, 183, 190, 215, 196, 222, 227, 243, 13, 25, 36, 61, 29, 68, 55, 104, 41, 65, 74, 110, 80, 118, 122, 156, 48, 77, 83, 114, 89, 129, 132, 164, 98, 127, 136, 169, 146, 179, 184, 208, 53, 85, 96, 130, 93, 133, 140, 174, 107, 142, 151, 181, 157, 186, 193, 217, 115, 150, 160, 187, 166, 191, 197, 220, 172, 202, 205, 224, 212, 230, 235, 247, 62, 94, 105, 144, 111, 148, 154, 188, 119, 153, 161, 195, 168, 200, 204, 225, 126, 165, 171, 199, 177, 203, 209, 229, 182, 211, 214, 232, 219, 236, 238, 249, 139, 173, 180, 207, 189, 213, 216, 233, 192, 221, 223, 237, 226, 239, 241, 250, 198, 218, 228, 240, 231, 242, 244, 251, 234, 245, 246, 252, 248, 253, 254, 255]

Table Z28, having a sequence length of 256:

| Polarized channel sequence number | Reliability or sequence number of reliability |
|---|---|
| 0 | 0 |
| 1 | 1 |
| 2 | 4 |
| 3 | 9 |
| 4 | 2 |
| 5 | 11 |
| 6 | 7 |
| 7 | 24 |
| 8 | 3 |
| 9 | 14 |
| 10 | 17 |
| 11 | 27 |
| 12 | 10 |
| 13 | 33 |
| 14 | 34 |
| 15 | 59 |
| 16 | 5 |
| 17 | 16 |
| 18 | 12 |
| 19 | 30 |
| 20 | 21 |
| 21 | 35 |
| 22 | 43 |
| 23 | 64 |
| 24 | 20 |
| 25 | 45 |
| 26 | 37 |
| 27 | 70 |
| 28 | 49 |
| 29 | 76 |
| 30 | 81 |
| 31 | 121 |
| 32 | 6 |
| 33 | 15 |
| 34 | 23 |
| 35 | 39 |
| 36 | 18 |
| 37 | 44 |
| 38 | 40 |
| 39 | 72 |
| 40 | 26 |
| 41 | 47 |
| 42 | 54 |
| 43 | 78 |
| 44 | 57 |
| 45 | 87 |
| 46 | 90 |
| 47 | 124 |
| 48 | 31 |
| 49 | 51 |
| 50 | 60 |
| 51 | 88 |
| 52 | 66 |
| 53 | 95 |
| 54 | 99 |
| 55 | 134 |
| 56 | 73 |
| 57 | 102 |
| 58 | 109 |
| 59 | 141 |
| 60 | 113 |
| 61 | 149 |
| 62 | 155 |
| 63 | 194 |
| 64 | 8 |
| 65 | 22 |
| 66 | 19 |
| 67 | 46 |
| 68 | 32 |
| 69 | 50 |
| 70 | 56 |
| 71 | 86 |
| 72 | 28 |
| 73 | 63 |
| 74 | 52 |
| 75 | 91 |

-continued

Table Z28, having a sequence length of 256:

| Polarized channel sequence number | Reliability or sequence number of reliability |
|---|---|
| 76 | 67 |
| 77 | 97 |
| 78 | 103 |
| 79 | 137 |
| 80 | 38 |
| 81 | 58 |
| 82 | 69 |
| 83 | 106 |
| 84 | 75 |
| 85 | 100 |
| 86 | 108 |
| 87 | 145 |
| 88 | 82 |
| 89 | 117 |
| 90 | 120 |
| 91 | 152 |
| 92 | 128 |
| 93 | 162 |
| 94 | 167 |
| 95 | 201 |
| 96 | 42 |
| 97 | 71 |
| 98 | 79 |
| 99 | 116 |
| 100 | 84 |
| 101 | 112 |
| 102 | 123 |
| 103 | 158 |
| 104 | 92 |
| 105 | 125 |
| 106 | 135 |
| 107 | 163 |
| 108 | 138 |
| 109 | 170 |
| 110 | 176 |
| 111 | 206 |
| 112 | 101 |
| 113 | 131 |
| 114 | 143 |
| 115 | 175 |
| 116 | 147 |
| 117 | 178 |
| 118 | 185 |
| 119 | 210 |
| 120 | 159 |
| 121 | 183 |
| 122 | 190 |
| 123 | 215 |
| 124 | 196 |
| 125 | 222 |
| 126 | 227 |
| 127 | 243 |
| 128 | 13 |
| 129 | 25 |
| 130 | 36 |
| 131 | 61 |
| 132 | 29 |
| 133 | 68 |
| 134 | 55 |
| 135 | 104 |
| 136 | 41 |
| 137 | 65 |
| 138 | 74 |
| 139 | 110 |
| 140 | 80 |
| 141 | 118 |
| 142 | 122 |
| 143 | 156 |
| 144 | 48 |
| 145 | 77 |
| 146 | 83 |
| 147 | 114 |
| 148 | 89 |
| 149 | 129 |

-continued

| Table Z28, having a sequence length of 256: | |
|---|---|
| Polarized channel sequence number | Reliability or sequence number of reliability |
| 150 | 132 |
| 151 | 164 |
| 152 | 98 |
| 153 | 127 |
| 154 | 136 |
| 155 | 169 |
| 156 | 146 |
| 157 | 179 |
| 158 | 184 |
| 159 | 208 |
| 160 | 53 |
| 161 | 85 |
| 162 | 96 |
| 163 | 130 |
| 164 | 93 |
| 165 | 133 |
| 166 | 140 |
| 167 | 174 |
| 168 | 107 |
| 169 | 142 |
| 170 | 151 |
| 171 | 181 |
| 172 | 157 |
| 173 | 186 |
| 174 | 193 |
| 175 | 217 |
| 176 | 115 |
| 177 | 150 |
| 178 | 160 |
| 179 | 187 |
| 180 | 166 |
| 181 | 191 |
| 182 | 197 |
| 183 | 220 |
| 184 | 172 |
| 185 | 202 |
| 186 | 205 |
| 187 | 224 |
| 188 | 212 |
| 189 | 230 |
| 190 | 235 |
| 191 | 247 |
| 192 | 62 |
| 193 | 94 |
| 194 | 105 |
| 195 | 144 |
| 196 | 111 |
| 197 | 148 |
| 198 | 154 |
| 199 | 188 |
| 200 | 119 |
| 201 | 153 |
| 202 | 161 |
| 203 | 195 |
| 204 | 168 |
| 205 | 200 |
| 206 | 204 |
| 207 | 225 |
| 208 | 126 |
| 209 | 165 |
| 210 | 171 |
| 211 | 199 |
| 212 | 177 |
| 213 | 203 |
| 214 | 209 |
| 215 | 229 |
| 216 | 182 |
| 217 | 211 |
| 218 | 214 |
| 219 | 232 |
| 220 | 219 |
| 221 | 236 |
| 222 | 238 |
| 223 | 249 |

-continued

| Table Z28, having a sequence length of 256: | |
|---|---|
| Polarized channel sequence number | Reliability or sequence number of reliability |
| 224 | 139 |
| 225 | 173 |
| 226 | 180 |
| 227 | 207 |
| 228 | 189 |
| 229 | 213 |
| 230 | 216 |
| 231 | 233 |
| 232 | 192 |
| 233 | 221 |
| 234 | 223 |
| 235 | 237 |
| 236 | 226 |
| 237 | 239 |
| 238 | 241 |
| 239 | 250 |
| 240 | 198 |
| 241 | 218 |
| 242 | 228 |
| 243 | 240 |
| 244 | 231 |
| 245 | 242 |
| 246 | 244 |
| 247 | 251 |
| 248 | 234 |
| 249 | 245 |
| 250 | 246 |
| 251 | 252 |
| 252 | 248 |
| 253 | 253 |
| 254 | 254 |
| 255 | 255 |

Sequence Z29, having a sequence length of 128: [0, 1, 4, 9, 2, 11, 7, 23, 3, 13, 16, 25, 10, 30, 31, 51, 5, 15, 12, 27, 20, 32, 38, 54, 19, 40, 33, 58, 43, 63, 66, 90, 6, 14, 22, 35, 17, 39, 36, 60, 24, 42, 47, 64, 49, 70, 72, 92, 28, 45, 52, 71, 55, 75, 77, 96, 61, 80, 84, 100, 86, 104, 106, 119, 8, 21, 18, 41, 29, 44, 48, 69, 26, 53, 46, 73, 56, 76, 81, 98, 34, 50, 57, 82, 62, 78, 83, 102, 67, 88, 89, 105, 94, 109, 111, 121, 37, 59, 65, 87, 68, 85, 91, 107, 74, 93, 97, 110, 99, 112, 114, 122, 79, 95, 101, 113, 103, 115, 117, 123, 108, 116, 118, 124, 120, 125, 126, 127]

| Table Z29, having a sequence length of 128: | |
|---|---|
| Polarized channel sequence number | Reliability or sequence number of reliability |
| 0 | 0 |
| 1 | 1 |
| 2 | 4 |
| 3 | 9 |
| 4 | 2 |
| 5 | 11 |
| 6 | 7 |
| 7 | 23 |
| 8 | 3 |
| 9 | 13 |
| 10 | 16 |
| 11 | 25 |
| 12 | 10 |
| 13 | 30 |
| 14 | 31 |
| 15 | 51 |
| 16 | 5 |
| 17 | 15 |
| 18 | 12 |
| 19 | 27 |
| 20 | 20 |

-continued

Table Z29, having a sequence length of 128:

| Polarized channel sequence number | Reliability or sequence number of reliability |
|---|---|
| 21 | 32 |
| 22 | 38 |
| 23 | 54 |
| 24 | 19 |
| 25 | 40 |
| 26 | 33 |
| 27 | 58 |
| 28 | 43 |
| 29 | 63 |
| 30 | 66 |
| 31 | 90 |
| 32 | 6 |
| 33 | 14 |
| 34 | 22 |
| 35 | 35 |
| 36 | 17 |
| 37 | 39 |
| 38 | 36 |
| 39 | 60 |
| 40 | 24 |
| 41 | 42 |
| 42 | 47 |
| 43 | 64 |
| 44 | 49 |
| 45 | 70 |
| 46 | 72 |
| 47 | 92 |
| 48 | 28 |
| 49 | 45 |
| 50 | 52 |
| 51 | 71 |
| 52 | 55 |
| 53 | 75 |
| 54 | 77 |
| 55 | 96 |
| 56 | 61 |
| 57 | 80 |
| 58 | 84 |
| 59 | 100 |
| 60 | 86 |
| 61 | 104 |
| 62 | 106 |
| 63 | 119 |
| 64 | 8 |
| 65 | 21 |
| 66 | 18 |
| 67 | 41 |
| 68 | 29 |
| 69 | 44 |
| 70 | 48 |
| 71 | 69 |
| 72 | 26 |
| 73 | 53 |
| 74 | 46 |
| 75 | 73 |
| 76 | 56 |
| 77 | 76 |
| 78 | 81 |
| 79 | 98 |
| 80 | 34 |
| 81 | 50 |
| 82 | 57 |
| 83 | 82 |
| 84 | 62 |
| 85 | 78 |
| 86 | 83 |
| 87 | 102 |
| 88 | 67 |
| 89 | 88 |
| 90 | 89 |
| 91 | 105 |
| 92 | 94 |
| 93 | 109 |
| 94 | 111 |
| 95 | 121 |
| 96 | 37 |
| 97 | 59 |
| 98 | 65 |
| 99 | 87 |
| 100 | 68 |
| 101 | 85 |
| 102 | 91 |
| 103 | 107 |
| 104 | 74 |
| 105 | 93 |
| 106 | 97 |
| 107 | 110 |
| 108 | 99 |
| 109 | 112 |
| 110 | 114 |
| 111 | 122 |
| 112 | 79 |
| 113 | 95 |
| 114 | 101 |
| 115 | 113 |
| 116 | 103 |
| 117 | 115 |
| 118 | 117 |
| 119 | 123 |
| 120 | 108 |
| 121 | 116 |
| 122 | 118 |
| 123 | 124 |
| 124 | 120 |
| 125 | 125 |
| 126 | 126 |
| 127 | 127 |

Sequence Z30, having a sequence length of 64:

[0, 1, 4, 8, 2, 10, 7, 20, 3, 12, 15, 22, 9, 25, 26, 39, 5, 14, 11, 23, 18, 27, 31, 41, 17, 33, 28, 43, 35, 46, 48, 57, 6, 13, 19, 29, 16, 32, 30, 44, 21, 34, 37, 47, 38, 49, 51, 58, 24, 36, 40, 50, 42, 52, 53, 59, 45, 54, 55, 60, 56, 61, 62, 63]

Table Z30, having a sequence length of 64:

| Polarized channel sequence number | Reliability or sequence number of reliability |
|---|---|
| 0 | 0 |
| 1 | 1 |
| 2 | 4 |
| 3 | 8 |
| 4 | 2 |
| 5 | 10 |
| 6 | 7 |
| 7 | 20 |
| 8 | 3 |
| 9 | 12 |
| 10 | 15 |
| 11 | 22 |
| 12 | 9 |
| 13 | 25 |
| 14 | 26 |
| 15 | 39 |
| 16 | 5 |
| 17 | 14 |
| 18 | 11 |
| 19 | 23 |
| 20 | 18 |
| 21 | 27 |
| 22 | 31 |
| 23 | 41 |
| 24 | 17 |
| 25 | 33 |

-continued

| Table Z30, having a sequence length of 64: | |
|---|---|
| Polarized channel sequence number | Reliability or sequence number of reliability |
| 26 | 28 |
| 27 | 43 |
| 28 | 35 |
| 29 | 46 |
| 30 | 48 |
| 31 | 57 |
| 32 | 6 |
| 33 | 13 |
| 34 | 19 |
| 35 | 29 |
| 36 | 16 |
| 37 | 32 |
| 38 | 30 |
| 39 | 44 |
| 40 | 21 |
| 41 | 34 |
| 42 | 37 |
| 43 | 47 |
| 44 | 38 |
| 45 | 49 |
| 46 | 51 |
| 47 | 58 |
| 48 | 24 |
| 49 | 36 |
| 50 | 40 |
| 51 | 50 |
| 52 | 42 |
| 53 | 52 |
| 54 | 53 |
| 55 | 59 |
| 56 | 45 |
| 57 | 54 |
| 58 | 55 |
| 59 | 60 |
| 60 | 56 |
| 61 | 61 |
| 62 | 62 |
| 63 | 63 |

It should be noted that, the foregoing sequences are merely some examples. Use of the foregoing sequences in a polar code encoding process helps improve encoding/decoding performance of a polar code. In any one of the sequences described, adjustments or equivalent replacements in the following aspects may be made without affecting an overall effect.

1. Positions of a small quantity of elements in a sequence are interchanged. For example, a position of a sequence number may be adjusted within a specified range. For example, the specified range is 5, and a position of an element whose sequence number is 10 may be adjusted within five positions to the left or right.
2. Some of the elements in the sequence are adjusted, but channel sets for transmitting T bit information that are selected based on the sequence are consistent or similar.
3. The sequence includes N elements starting from 0 and ending with N−1, and the N elements starting from 0 and ending with N−1 represent sequence numbers of N polarized channels. Actually, the sequence numbers of the N polarized channels may also start from 1 and end with N. This can be achieved by adding 1 to each sequence number in the foregoing sequence, and this is also a sequence number form in the foregoing calculation manners. Certainly, the sequence number or an identifier of the foregoing polarized channel may also be represented by using another manner. The specific representation manner does not affect a specific position of a polarized channel in a sequence;
4. The sequence numbers of the N polarized channels in the foregoing sequence are arranged in ascending order of the reliability of the N polarized channels. In this case, selecting K polarized channels in descending order of reliability is selecting polarized channels that correspond to the last K sequence numbers in any of the foregoing sequences. Actually, the sequence numbers of the N polarized channels may also be arranged in descending order of the reliability of the N polarized channels. This can be achieved by arranging the elements in the foregoing sequence in a reverse or inverted order. In this case, selecting K polarized channels in descending order of reliability is selecting polarized channels that correspond to the first K sequence numbers; and
5. The foregoing sequences may further be represented by using a normalized reliability or an equivalent reliability of each channel. For example, if a sequential position of a channel x in the foregoing sequence is n (a leftmost position is denoted as 1), a reliability of the channel may be represented as n or normalized n/N, where N is a length of the sequence.

Figure 3:
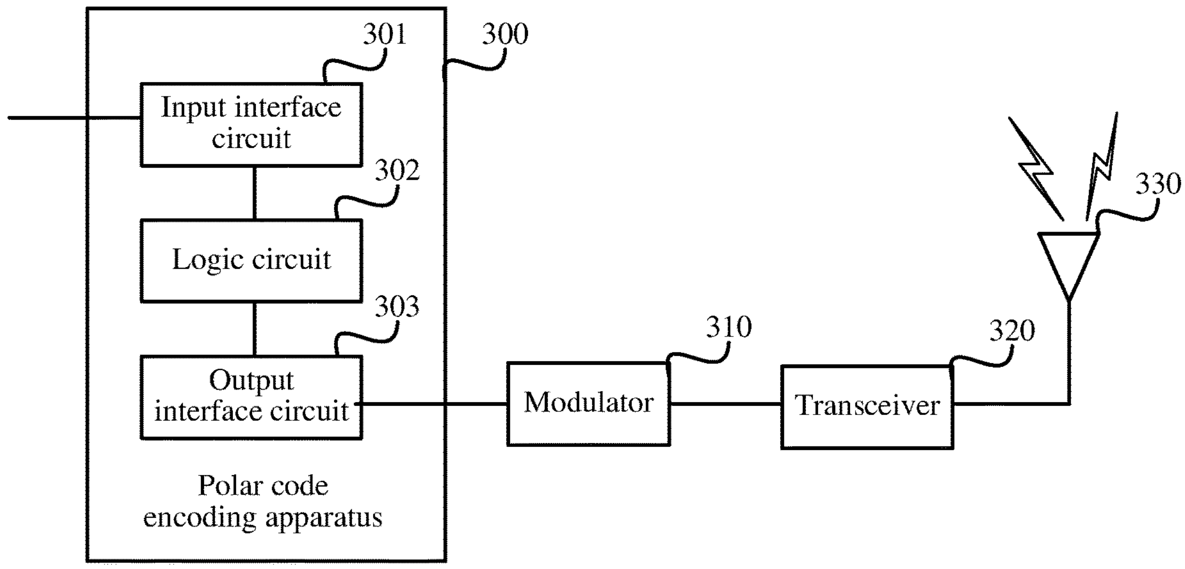
FIG. 3 is a first schematic structural diagram of a polar code encoding apparatus according to an embodiment of this application.

Based on a same invention concept of the polar code encoding method shown in FIG. 2, as shown in FIG. 3, an embodiment of this application further provides a polar code encoding apparatus 300. The polar code encoding apparatus 300 is configured to perform the polar code encoding method shown in FIG. 2. Part or all of the polar code encoding method shown in FIG. 3 may be implemented by using hardware or may be implemented by using software. When part or all of the polar code encoding method is implemented by using hardware, the polar code encoding apparatus 300 includes: an input interface circuit 301, configured to obtain to-be-encoded bits; a logic circuit 302, configured to perform the polar code encoding method shown in FIG. 2, where for details, refer to the descriptions in the foregoing method embodiments, and details are not described herein again; and an output interface circuit 303, configured to output a bit sequence after encoding.

Further, the bit sequence that is obtained after the encoding and that is output by the encoding apparatus 300 is output to a transceiver 320 after being modulated by a modulator 310. The transceiver 320 performs corresponding processing (including but not limited to processing such as digital-to-analog conversion and/or frequency conversion) on the modulated sequence and sends the processed sequence by using an antenna 330.

Optionally, the polar code encoding apparatus 300 may be a chip or an integrated circuit during specific implementation.

Figure 4:
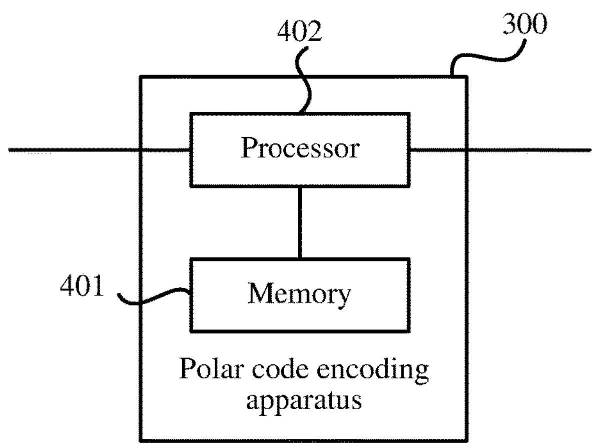
FIG. 4 is a second schematic structural diagram of a polar code encoding apparatus according to an embodiment of this application.

Optionally, when part or all of the polar code encoding method in the foregoing embodiment is implemented by using software, as shown in FIG. 4, the polar code encoding apparatus 300 includes: a memory 401, configured to store a program; a processor 402, configured to execute the program stored in the memory 401. When the program is executed, the polar code encoding apparatus 300 is caused to implement the polar code encoding method provided in the embodiment in FIG. 2.

Figure 5:
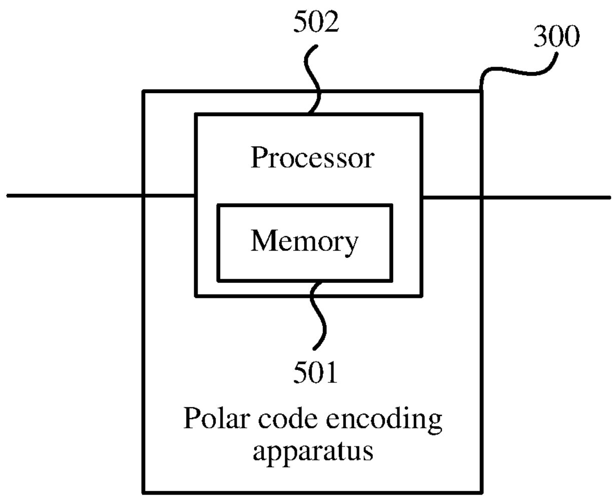
FIG. 5 is a third schematic structural diagram of a polar code encoding apparatus according to an embodiment of this application.

Optionally, the memory 401 may be a physically independent unit. Alternatively, as shown in FIG. 5, a memory 501 is integrated with a processor 502.

Optionally, when part of or all of the encoding method in the embodiment in FIG. 2 is implemented by using software, the polar code encoding apparatus 300 may include only the processor 402. The memory 401 configured to store the program is located outside the polar code encoding apparatus 300. The processor 402 is connected to the memory 401 by using a circuit/wire and is configured to read and execute the program stored in the memory 401.

The processor 402 may be a central processing unit (CPU), a network processor (NP), or a combination of a CPU and an NP.

The processor 402 may further include a hardware chip. The foregoing hardware chip may be an application-specific integrated circuit (ASIC), a programmable logic device (PLD), or a combination of an ASIC and a PLD. The foregoing PLD may be a complex programmable logical device (CPLD), a field-programmable gate array (FPGA), a generic array logic (GAL), or any combination thereof.

The memory in the foregoing embodiment may include a volatile memory, for example, a random-access memory (RAM). Alternatively, the memory may include a non-volatile memory, for example, a flash memory, a hard disk drive (HDD), or a solid-state drive (SSD). Alternatively, the memory may include a combination of the foregoing types of memories.

Figure 6:
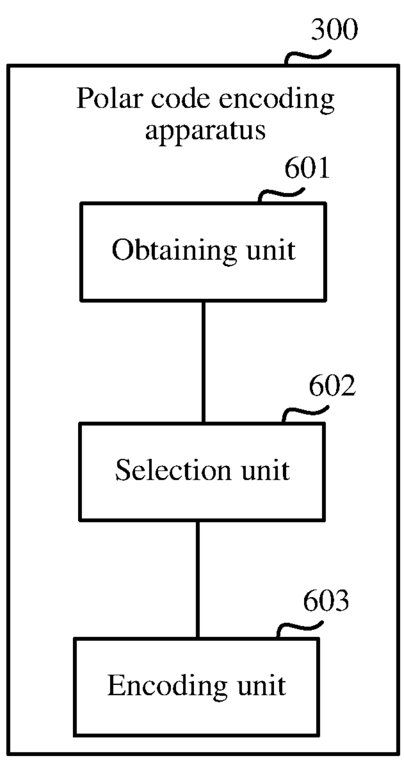
FIG. 6 is a fourth schematic structural diagram of a polar code encoding apparatus according to an embodiment of this application.

Based on the polar code encoding method shown in FIG. 2, as shown in FIG. 6, an embodiment of this application further provides a polar code encoding apparatus 300. The polar code encoding apparatus 300 is configured to perform the polar code encoding method shown in FIG. 2. The polar code encoding apparatus 300 includes:

an obtaining unit 601, configured to obtain a first sequence used to encode K to-be-encoded bits, where the first sequence includes sequence numbers of N polarized channels, the sequence numbers of the N polarized channels are arranged in the first sequence based on reliability of the N polarized channels, K is a positive integer, N is a mother code length of a polar code, N is a positive integer power of 2, and K≤N;

a selection unit 602, configured to select sequence numbers of K polarized channels from the first sequence in ascending order of the reliability; and an encoding unit 603, configured to place the to-be-encoded bits based on the selected sequence numbers of the K polarized channels, and perform polar code encoding on the to-be-encoded bits.

The first sequence may be any one of the sequences described above, or may be a sequence obtained by selecting, from a second sequence having a length of $N_{max}$, sequence numbers (starting from 0) less than N. The second sequence may be any one of the sequences described above. A reliability of an $i^{th}$ polarized channel in the N polarized channels may be determined by using any one of the formulas described above.

An embodiment of this application further provides a computer storage medium storing a computer program. The computer program is configured to perform the polar code encoding method shown in FIG. 2.

An embodiment of this application further provides a computer program product including an instruction. When run on a computer, the instruction causes the computer to perform the polar code encoding method shown in FIG. 2.

Persons skilled in the art should understand that the embodiments of this application may be provided as a method, a system, or a computer program product. Therefore, this application may use a form of hardware only embodiments, software only embodiments, or embodiments with a combination of software and hardware. Moreover, this application may use a form of a computer program product that is implemented on one or more computer-usable storage media (including but not limited to a disk memory, a CD-ROM, an optical memory, and the like) that include computer usable program code.

This application is described with reference to the flowcharts and/or block diagrams of the method, the device (system), and the computer program product according to the embodiments of this application. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, so that the instructions executed by a computer or a processor of any other programmable data processing device generate an apparatus for implementing a specific function in one or more processes in the flowcharts and/or in one or more blocks in the block diagrams.

These computer program instructions may be stored in a computer readable memory that can instruct the computer or any other programmable data processing device to work in a specific manner, so that the instructions stored in the computer readable memory generate an artifact that includes an instruction apparatus. The instruction apparatus implements a specific function in one or more processes in the flowcharts and/or in one or more blocks in the block diagrams.

These computer program instructions may be loaded onto a computer or another programmable data processing device, so that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

Although some preferred embodiments of this application have been described, persons skilled in the art can make changes and modifications to these embodiments once they learn the basic inventive concept. Therefore, the following claims are intended to be construed as to cover the preferred embodiments and all changes and modifications falling within the scope of this application.

Obviously, persons skilled in the art can make various modifications and variations to the embodiments of this application without departing from the spirit and scope of the embodiments of this application. This application is intended to cover these modifications and variations provided that they fall within the scope of protection defined by the following claims and their equivalent technologies.

What is claimed is:

1. An encoding method, comprising:

obtaining, by an encoding apparatus, a first sequence used to encode K to-be-encoded bits, the first sequence comprising reliability sequence numbers of N polarized channels, K is a positive integer, K≤N, N=512;

selecting, by the encoding apparatus, reliability sequence numbers of K polarized channels from the first sequence;

performing, by the encoding apparatus, polar code encoding on the K to-be-encoded bits based on the selected reliability sequence numbers of the K polarized channels, to obtain a bit sequence after encoding; and outputting, by the encoding apparatus, the bit sequence after encoding to a receiving device;

wherein the first sequence is the sequence shown in Sequence Z12 or Table Z12 in the specification.

2. The method according to claim 1, wherein the sequence numbers of the N polarized channels are arranged in the first sequence based on sequence number of the N polarized channels.

3. The method according to claim 1, wherein the reliability sequence numbers of the K polarized channels are selected based on reliability of the N polarized channels.

4. The method according to claim 1, wherein the K to-be-encoded bits comprise a cyclic redundancy check (CRC) bit.

5. The method according to claim 1, wherein the K to-be-encoded bits comprise a parity check (PC) bit.

6. The method according to claim 1, wherein after performing the polar code encoding on the to-be-encoded bits, the encoding apparatus performs, based on a target code length, rate matching on the bit sequence after encoding, wherein the outputting the bit sequence after encoding comprises outputting the bit sequence after rate matching.

7. A polar code encoding apparatus, comprising:

a memory storage comprising instructions; and a processor in communication with the memory, wherein the processor is configured to execute the instructions to perform the steps:

obtaining a first sequence used to encode K to-be-encoded bits, the first sequence comprising reliability sequence numbers of N polarized channels, K is a positive integer, K≤N, N=512;

selecting reliability sequence numbers of K polarized channels from the first sequence;

performing polar code encoding on the K to-be-encoded bits based on the selected reliability sequence numbers of the K polarized channels, to obtain a bit sequence after encoding; and outputting, by the encoding apparatus, the bit sequence after encoding to a receiving device;

wherein the first sequence is the sequence shown in Sequence Z12 or Table Z12 in the specification.

8. The apparatus according to claim 7, wherein the sequence numbers of the N polarized channels are arranged in the second sequence based on sequence number of the N polarized channels.

9. The apparatus according to claim 7, wherein the reliability sequence numbers of the K polarized channels are selected based reliability of the N polarized channels.

10. The apparatus according to claim 7, wherein the K to-be-encoded bits comprise a cyclic redundancy check (CRC) bit.

11. The apparatus according to claim 7, wherein the K to-be-encoded bits comprise a parity check (PC) bit.

12. The apparatus according to claim 7, wherein the processor is further configured to execute the instructions to perform: rate matching on the bit sequence after encoding based on a target code length, and output the bit sequence after rate matching.

13. An apparatus, comprising:

an input interface circuit, configured to obtain K to-be-encoded bits;

a logic circuit, configured to:

obtain, by an encoding apparatus, a first sequence used to encode K to-be-encoded bits, the first sequence comprising reliability sequence numbers of N polarized channels, K is a positive integer, K≤N, N=512;

select, by the encoding apparatus, reliability sequence numbers of K polarized channels from the first sequence;

perform, by the encoding apparatus, polar code encoding on the K to-be-encoded bits based on the selected reliability sequence numbers of the K polarized channels, to obtain a bit sequence after encoding; and an output interface circuit configured to output the bit sequence after encoding to a receiving device;

wherein the first sequence is the sequence shown in Sequence Z12 or Table Z12 in the specification.

14. The apparatus according to claim 13, wherein the sequence numbers of the $N_{max}$ polarized channels are arranged in the second sequence based on sequence number of the $N_{max}$ polarized channels.

15. The apparatus according to claim 13, wherein the reliability sequence numbers of the K polarized channels are selected based on reliability of the N polarized channels.

16. The apparatus according to claim 13, wherein the K to-be-encoded bits comprise a cyclic redundancy check (CRC) bit.

17. The apparatus according to claim 13, wherein the K to-be-encoded bits comprise a parity check (PC) bit.

18. The apparatus according to claim 13, wherein the logic circuit is further configured to rate match on the bit sequence after encoding based on a target code length, and the output interface circuit is configured to output the bit sequence after rate matching.

* * * * *